United States Patent
Harif

(10) Patent No.: US 10,201,856 B2
(45) Date of Patent: Feb. 12, 2019

(54) METHOD FOR DESIGNING A CUTTING EDGE OF A CUTTING TOOL, CUTTING TOOLS COMPRISING THE SAME, AND CUTTING ELEMENTS WITH MULTIPLE SUCH CUTTING PORTIONS

(71) Applicant: GERSHON SYSTEM LTD., Holon (IL)

(72) Inventor: Gershon Harif, Ramat Gan (IL)

(73) Assignee: GERSHON SYSTEM LTD., Holon (IL)

( * ) Notice: Subject to any disclaimer, the term of this patent is extended or adjusted under 35 U.S.C. 154(b) by 638 days.

(21) Appl. No.: 14/403,027

(22) PCT Filed: May 23, 2013

(86) PCT No.: PCT/IL2013/050445
§ 371 (c)(1),
(2) Date: Nov. 21, 2014

(87) PCT Pub. No.: WO2013/175478
PCT Pub. Date: Nov. 28, 2013

(65) Prior Publication Data
US 2015/0139744 A1    May 21, 2015

Related U.S. Application Data

(60) Provisional application No. 61/651,119, filed on May 24, 2012, provisional application No. 61/669,767, (Continued)

(51) Int. Cl.
*B23C 5/20* (2006.01)
*B23B 27/14* (2006.01)
(Continued)

(52) U.S. Cl.
CPC .......... *B23B 27/145* (2013.01); *B23B 27/005* (2013.01); *B23B 27/04* (2013.01); (Continued)

(58) Field of Classification Search
CPC ........ B23C 2200/121; B23C 2200/201; B23C 2200/203; B23C 2210/0414; (Continued)

(56) References Cited

U.S. PATENT DOCUMENTS

| | | |
|---|---|---|
| 4,474,721 A | 10/1984 | Carpenter |
| 4,681,486 A | 7/1987 | Hale |

(Continued)

FOREIGN PATENT DOCUMENTS

| | | |
|---|---|---|
| EP | 0502834 | 9/1992 |
| EP | 0585800 | 3/1994 |

(Continued)

OTHER PUBLICATIONS

International Search Report for International Application No. PCT/IB2008/002742, dated Mar. 9, 2009, 2 pages.

*Primary Examiner* — Sara Addisu
(74) *Attorney, Agent, or Firm* — Dorsey & Whitney LLP

(57) ABSTRACT

A method for designing a cutting edge of a cutting element configured for removing material from a workpiece to leave therein a desired end profile (B22,B24,B26). The method comprises the steps of modeling a desired end profile (B22,B24,B26) of the workpiece, the profile having a longitudinal axis and being defined by a bottom surface (B12), a side surface (B16) and an adjustment surface (B14) extending therebetween; defining a lead profile plane ($RP_L$) and an trail profile plane ($RP_T$) spaced therefrom, each of the planes being oriented perpendicular to the longitudinal axis; determining a profile contour defined by the intersection line between the end profile (B22,B24,B26) and the lead profile (Continued)

plane ($RP_L$). The contour profile includes a bottom contour, an adjoining contour and a side contour defined as the intersection lines between the lead profile plane ($RP_L$) and the bottom surface (B12), the adjustment surface (B14) and the side surface (B16) respectively; designing a rake surface and a relief surface, the intersection line between which defines a cutting edge lying in the adjoining surface (B14) and spanning between the lead profile plane ($RP_L$) and the trail profile plane ($RP_T$). The cutting edge is designed such that in any reference plane (RP; FIG. 6A) oriented perpendicularly to the cutting edge, the intersection between each of the rake surface and the relief surface with the reference plane (RP) defines a respective rake line (RK; FIG. 7) and relief line (RF; FIG. 7), the angle ($\theta_B$) between the lines RK,RF) being equal to or smaller than a similar angle ($\theta_B$) taken along each of a plurality of similar reference planes (RP) disposed between the reference plane ($RP_n$) and the lead profile plane ($RP_L$).

22 Claims, 205 Drawing Sheets

Related U.S. Application Data filed on Jul. 10, 2012, provisional application No. 61/726,808, filed on Nov. 15, 2012, provisional application No. 61/770,016, filed on Feb. 27, 2013.

(51) Int. Cl.

| | | |
|---|---|---|
| *B23B 51/02* | (2006.01) | |
| *B23C 5/06* | (2006.01) | |
| *B23C 5/10* | (2006.01) | |
| *B23B 27/00* | (2006.01) | |
| *B23B 27/04* | (2006.01) | |
| *B23B 27/22* | (2006.01) | |
| *G06F 17/50* | (2006.01) | |
| *B23P 15/34* | (2006.01) | |
| *B29C 33/00* | (2006.01) | |
| *B22F 3/03* | (2006.01) | |
| *B23D 61/04* | (2006.01) | |

(52) U.S. Cl.
CPC .............. *B23B 27/22* (2013.01); *B23B 51/02* (2013.01); *B23C 5/06* (2013.01); *B23C 5/10* (2013.01); *B23C 5/207* (2013.01); *B23P 15/34* (2013.01); *B29C 33/005* (2013.01); *G06F 17/5086* (2013.01); *B22F 3/03* (2013.01); *B23B 2200/121* (2013.01); *B23B 2200/201* (2013.01); *B23B 2200/202* (2013.01); *B23B 2200/3681* (2013.01); *B23B 2251/04* (2013.01); *B23B 2251/082* (2013.01); *B23B 2251/127* (2013.01); *B23C 2200/121* (2013.01); *B23C 2200/201* (2013.01); *B23C 2200/203* (2013.01); *B23C 2210/0414* (2013.01); *B23C 2210/084* (2013.01); *B23D 61/04* (2013.01); *Y10T 407/2206* (2015.01); *Y10T 407/2268* (2015.01); *Y10T 407/24* (2015.01)

(58) Field of Classification Search
CPC ....... B23C 2210/084; B23C 5/06; B23C 5/10; B23C 5/207
See application file for complete search history.

(56) References Cited

U.S. PATENT DOCUMENTS

| | | | |
|---|---|---|---|
| 4,776,733 A | 10/1988 | Pettersson | |
| 4,940,369 A | 7/1990 | Aebi et al. | |
| 4,946,318 A | 8/1990 | David et al. | |
| 5,160,232 A | 11/1992 | Maier | |
| 5,549,425 A | 8/1996 | Bernadic et al. | |
| 5,725,338 A | 3/1998 | Cabaret et al. | |
| 5,779,401 A | 7/1998 | Stallwitz et al. | |
| 5,791,832 A | 8/1998 | Yamayose | |
| 5,964,552 A | 10/1999 | Larsen | |
| 5,975,812 A | 11/1999 | Friedman | |
| 6,053,672 A * | 4/2000 | Satran | B23C 5/00 407/113 |
| 6,065,905 A | 5/2000 | Kinton | |
| 6,099,209 A | 8/2000 | Murray et al. | |
| 6,126,366 A | 10/2000 | Lundblad | |
| 6,138,540 A | 10/2000 | Niemi | |
| 6,164,878 A | 12/2000 | Satran et al. | |
| 6,238,146 B1 | 5/2001 | Satran et al. | |
| 6,666,630 B2 | 12/2003 | Zimmermann et al. | |
| 6,739,808 B1 | 5/2004 | Ghosh | |
| 6,929,427 B2 * | 8/2005 | Satran | B23C 5/109 407/113 |
| 6,957,933 B2 | 10/2005 | Pachao-Morbitzer et al. | |
| 7,014,395 B2 * | 3/2006 | Daiguji | B23C 5/109 407/113 |
| 7,021,871 B2 * | 4/2006 | Arvidsson | B23C 5/109 407/113 |
| 7,037,051 B2 * | 5/2006 | Wermeister | B23B 27/1614 407/103 |
| 7,063,489 B2 * | 6/2006 | Satran | B23C 5/1072 407/113 |
| 7,073,987 B2 * | 7/2006 | Hecht | B23B 27/08 407/103 |
| 7,144,205 B2 * | 12/2006 | Sheffler | B23C 5/2221 407/103 |
| 7,264,425 B1 | 9/2007 | Viol | |
| 7,275,896 B2 | 10/2007 | Nudelman | |
| 7,862,263 B2 | 1/2011 | van Iperen | |
| 7,896,586 B2 | 3/2011 | Morgulis | |
| 7,905,688 B2 * | 3/2011 | Ertl | B23C 5/10 407/113 |
| 8,057,132 B2 * | 11/2011 | Johansson | B23C 5/202 407/113 |
| 8,202,026 B2 * | 6/2012 | Satran | B23C 5/207 407/113 |
| 8,277,151 B2 | 10/2012 | Wandeback | |
| 8,277,153 B2 * | 10/2012 | Kovac | B23C 5/06 407/103 |
| 8,308,399 B2 * | 11/2012 | Yoshida | B23F 21/146 407/20 |
| 8,596,934 B2 | 12/2013 | Lehto et al. | |
| 8,950,984 B2 * | 2/2015 | Choi | B23C 5/202 407/113 |
| 9,050,666 B2 | 6/2015 | Kuroda | |
| 9,227,253 B1 | 1/2016 | Swift et al. | |
| 9,649,693 B2 | 5/2017 | Friedl et al. | |
| 9,656,333 B2 * | 5/2017 | Stark | B23C 5/109 |
| 9,796,028 B2 | 10/2017 | Fang | |
| 2002/0119016 A1 | 8/2002 | Woodward | |
| 2004/0170481 A1 | 9/2004 | Gati | |
| 2004/0265075 A1 | 12/2004 | Kolker | |
| 2005/0186037 A1 | 8/2005 | Svensson | |
| 2006/0045633 A1 | 3/2006 | Morgulis | |
| 2007/0071561 A1 * | 3/2007 | Agic | B23B 27/16 407/34 |
| 2008/0003067 A1 * | 1/2008 | Ejderklint | B23C 5/06 407/40 |
| 2008/0044241 A1 * | 2/2008 | Koskinen | B23C 5/06 407/103 |
| 2008/0298909 A1 | 12/2008 | Gaudreault | |
| 2009/0052997 A1 * | 2/2009 | Shimizu | B23C 3/06 407/34 |

(56) References Cited

U.S. PATENT DOCUMENTS

| | | | |
|---|---|---|---|
| 2009/0155005 A1* | 6/2009 | Jansson | B23C 5/06 407/114 |
| 2009/0220312 A1 | 9/2009 | Shamoto et al. | |
| 2009/0245946 A1 | 10/2009 | Maeda | |
| 2010/0183386 A1 | 7/2010 | Heinloth et al. | |
| 2010/0239378 A1 | 9/2010 | Azegami | |
| 2010/0254775 A1 | 10/2010 | Hecht | |
| 2010/0316452 A1 | 12/2010 | Ishida | |
| 2011/0217132 A1 | 9/2011 | Wells et al. | |
| 2011/0299946 A1* | 12/2011 | Hecht | B23C 5/207 407/42 |
| 2012/0282047 A1 | 11/2012 | Choi et al. | |
| 2014/0227048 A1* | 8/2014 | Heinloth | B23C 5/12 407/51 |
| 2014/0298967 A1* | 10/2014 | Ishi | B23C 5/109 83/13 |
| 2015/0328689 A1* | 11/2015 | Wernh | B23B 27/145 407/103 |
| 2016/0074947 A1 | 3/2016 | Shpigelman | |
| 2016/0250695 A1 | 9/2016 | Baba | |
| 2017/0232532 A1 | 8/2017 | Wells et al. | |
| 2017/0291230 A1 | 10/2017 | Harpaz et al. | |

FOREIGN PATENT DOCUMENTS

| | | |
|---|---|---|
| EP | 1547710 | 6/2005 |
| EP | 2119521 | 11/2009 |
| JP | 05116018 | 5/1993 |
| JP | 2007/69290 | 3/2007 |
| WO | WO98/01253 | 1/1998 |
| WO | WO02/40850 | 5/2002 |
| WO | WO2009/053803 | 4/2009 |
| WO | WO2009/137149 | 11/2009 |
| WO | WO2011/001438 | 1/2011 |

* cited by examiner

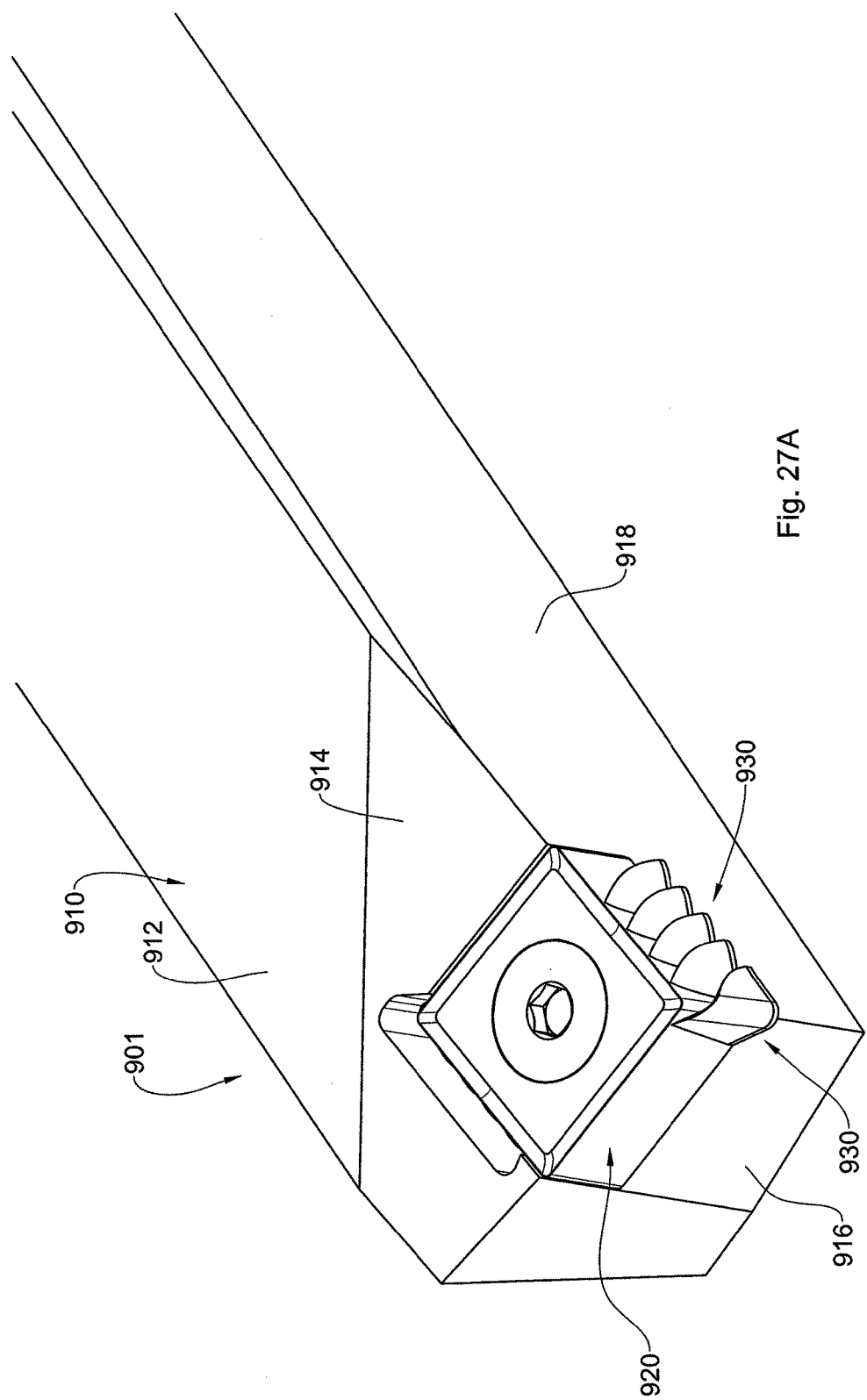

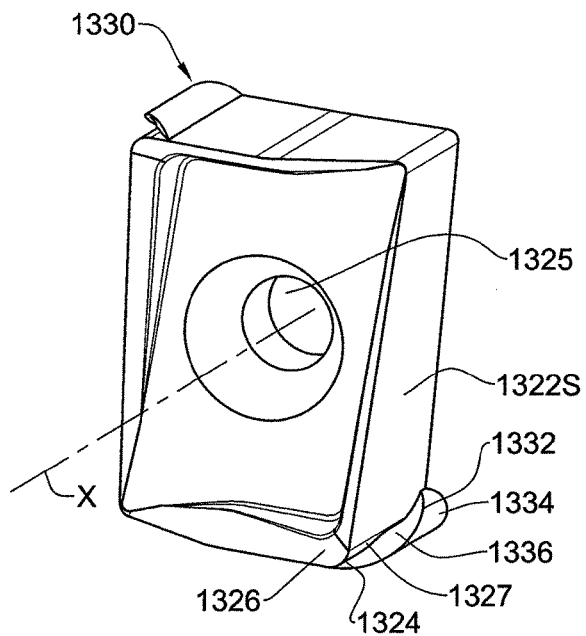
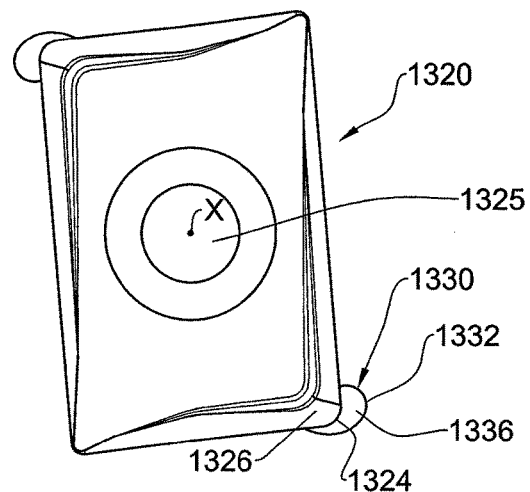
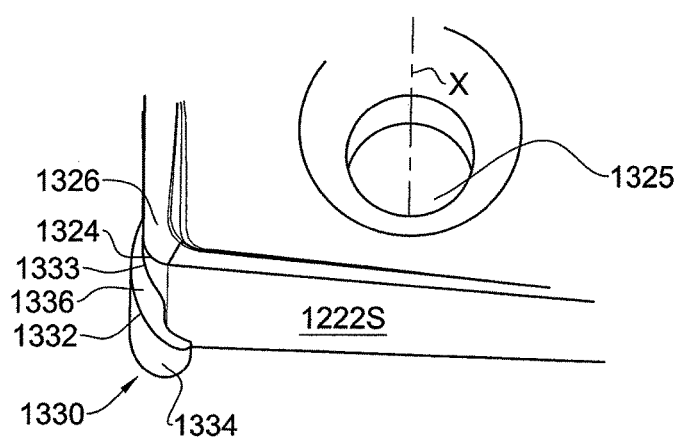
Fig. 33C
Fig. 33D
Fig. 33E

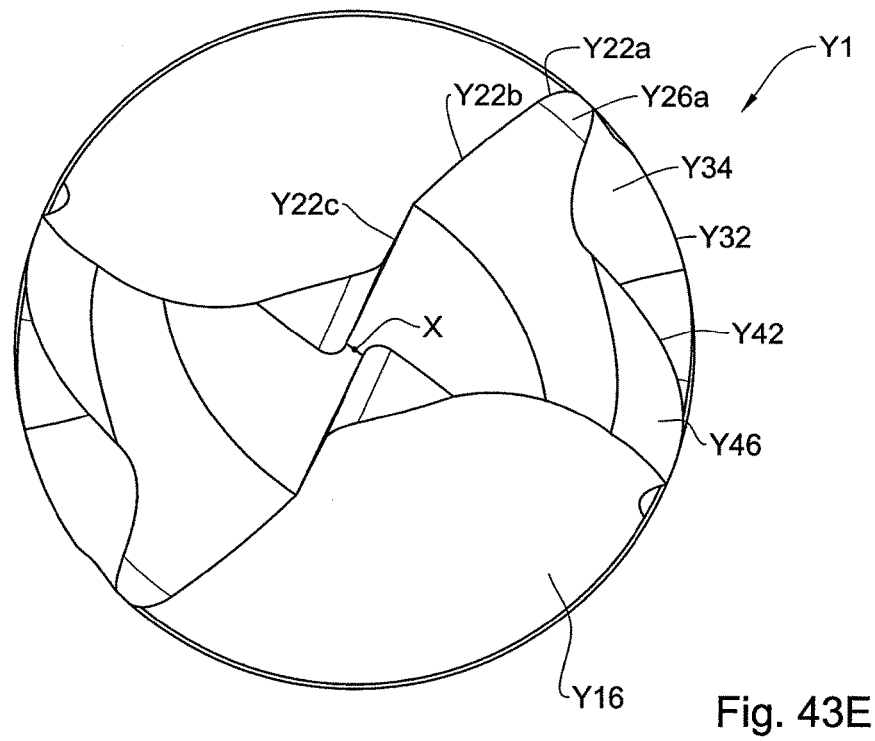
Fig. 43E
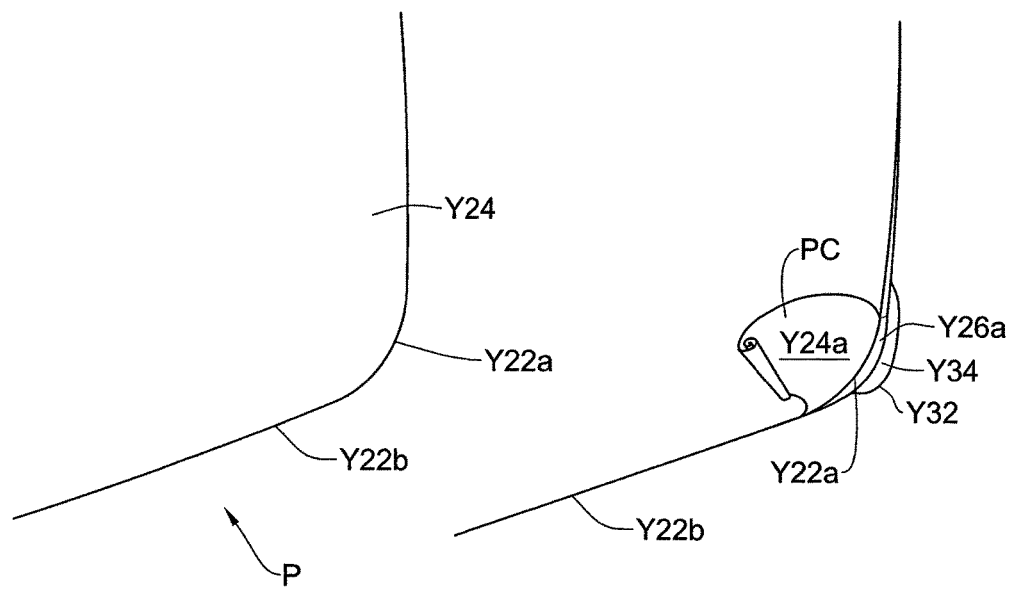
Fig. 44A
Fig. 44B

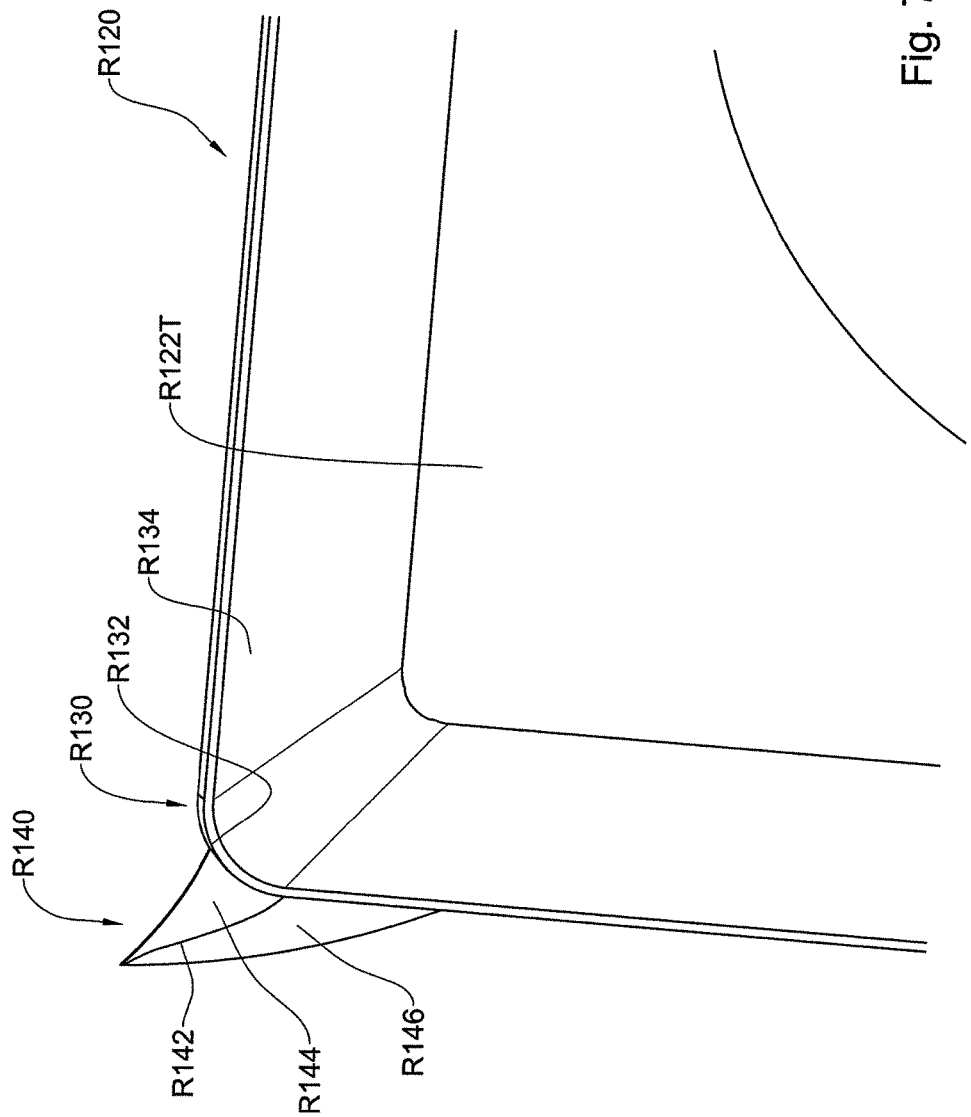

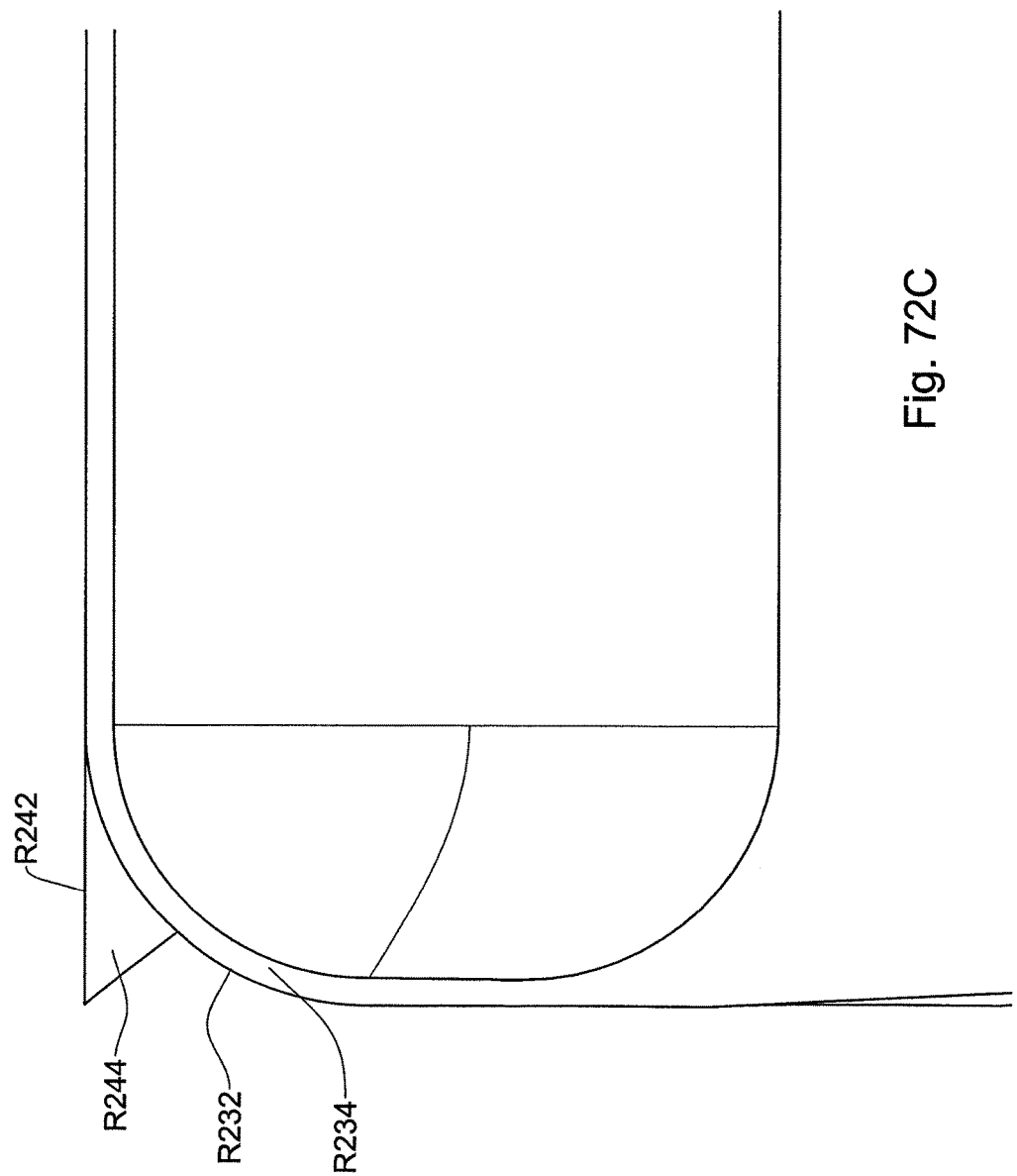

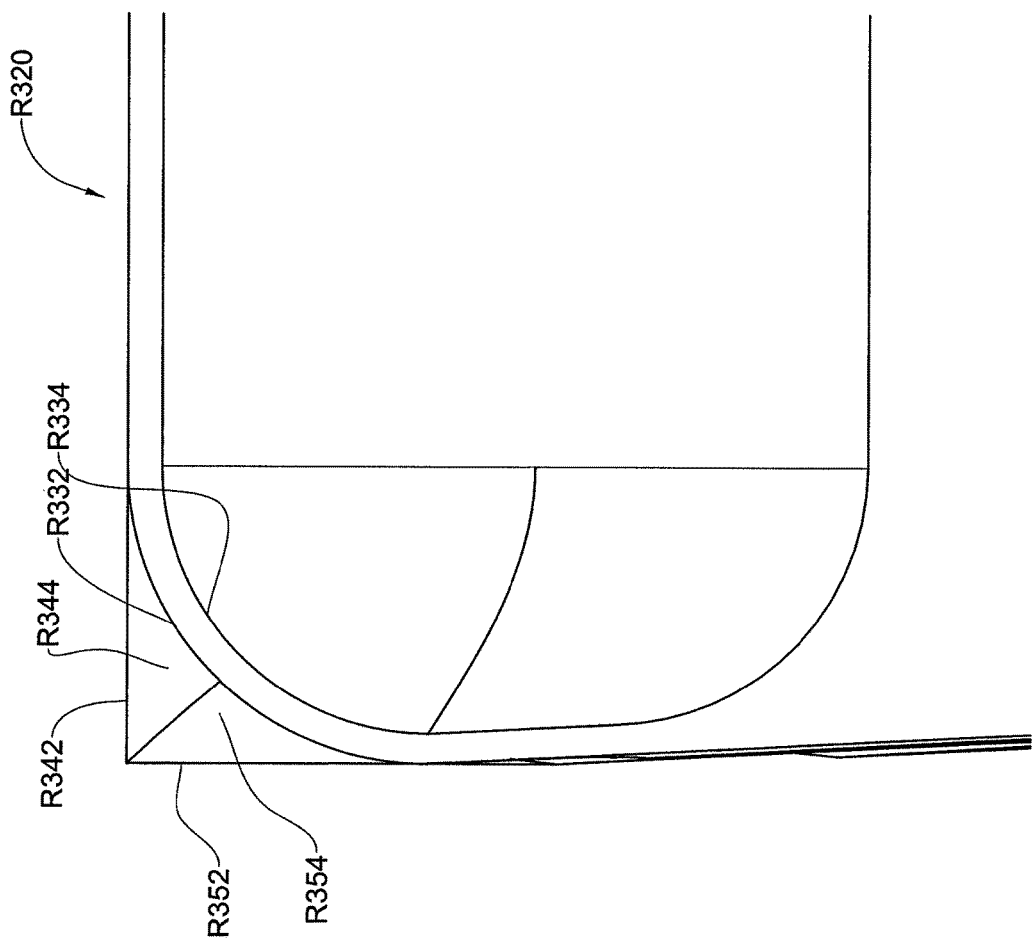

METHOD FOR DESIGNING A CUTTING EDGE OF A CUTTING TOOL, CUTTING TOOLS COMPRISING THE SAME, AND CUTTING ELEMENTS WITH MULTIPLE SUCH CUTTING PORTIONS

TECHNOLOGICAL FIELD

The subject matter of the present application refers to methods of designing cutting tools, in particular, methods for designing the cutting edge, rake and relief surfaces thereof, cutting tools and inserts designed by the method above and comprising additional cutting elements on a relief surface thereof, and/or a plurality of cutting edges.

PRIOR ART

References considered to be relevant as background to the presently disclosed subject matter are listed below:
WO2011/001438
Acknowledgement of the above references herein is not to be inferred as meaning that these are in any way relevant to the patentability of the presently disclosed subject matter.

BACKGROUND

Cutting tools are used for removing material from a workpiece in order to manufacture therefrom a desired final element. There exists in common practice a great variety of operations for the removal of material, for each of which, a specific tool is designed, which may be in the form of a single body or in the form of a tool holder with one or more replaceable cutting inserts mounted thereon. Examples of such operations are drilling, milling, turning, boring etc.

A majority of cutting tools or cutting inserts are formed with a cutting edge adapted to come in contact with the workpiece, within a cutting zone, so as to remove material therefrom during a cutting operation, the removed material being in the form of a chip.

Each cutting edge of a cutting tool or cutting insert is known to have a rake surface extending from the cutting edge in the direction away from the workpiece and a relief surface extending from the cutting edge transversely to the rake surface and generally facing in the direction of the workpiece, the cutting edge being defined at the intersection between its rake and relief surfaces.

The rake surface is adapted to come in contact with the removed chip, while the relief surface is generally designed so as not to come in contact with the workpiece during cutting operation.

Cutting tools are designed so that the angle between the rake and the relief surface allows positioning the cutting tool with respect to the workpiece during a cutting operation in a way preventing the relief surface from coming in contact with the workpiece while providing a sufficient cutting angle and support to the cutting tool to obtain (a) efficient removal of chips from the workpiece and (b) sufficient mechanical integrity to the cutting edge.

Cutting tools are used for removing material from a workpiece to manufacture therefrom of desired final element. There exists in common practice a great variety of operations for the removal of material, for each of which, a specific tool is designed. Examples of such operations are drilling, milling, turning, boring etc.

The majority of cutting tools are formed with a sharp cutting edge adapted to come in contact with the workpiece, within a cutting zone, to remove material therefrom in the form of a chip, in a process referred to as chipping. During such process there is usually provided a linear displacement of the cutting tool relative to the workpiece, referred to as 'feed' and either rotation of the cutting tool with respect to the workpiece, such as e.g. in milling and drilling, or rotation of the workpiece with respect to the cutting tool, such as e.g. in turning.

Chips must be evacuated continuously during chipping and any congestion may rapidly lead to high loads, overheating and consequent break-down and failure of the cutting tool.

The cutting edge of a cutting tool is generally defined as an intersection line between a rake surface and a relief surface.

The rake surface is adapted to come in contact with the removed chip and, as such, its geometry influences the length and geometry of the removed chip, and more importantly, the manner of evacuation of the chip from the cutting zone.

The relief surface is generally designed so as not to come in contact with the portion of the workpiece from which the chip has been removed. Depending on the angle between the relief surface and the rake surface, the cutting tool is positioned such as to avoid contact between the relief surface and the workpiece.

It has been known to provide additional elements on the relief surface, for example, elements configured for deforming the workpiece prior to the cutting operation, for example, as set forth by the applicant himself in WO09053803.

Furthermore, the additional elements are also known to being used as cutting elements, as set forth by the applicant himself in WO11001438.

Cutting tools are used for removing material from a workpiece in order to manufacture therefrom a desired final element. There exists in common practice a great variety of operations for the removal of material, for each of which, a specific tool is designed, which may be in the form of a single body or in the form of a tool holder with one or more replaceable cutting inserts mounted thereon. Examples of such operations are drilling, milling, turning, boring etc.

A majority of cutting tools or cutting inserts are formed with a cutting edge adapted to come in contact with the workpiece, within a cutting zone, so as to remove material therefrom during a cutting operation, the removed material being in the form of a chip, and the process of forming chips being known as chipping.

During a cutting operation there is usually provided a linear displacement of the cutting tool relative to the workpiece, referred to as 'feed' and either rotation of the cutting tool about its central axis with the workpiece being stationary, such as e.g. in milling and drilling operations, or rotation of the workpiece about its central axis with the tool moving only linearly such as e.g. in turning, slotting, parting and the like.

Chips must be evacuated continuously during chipping and any congestion may rapidly lead to high loads, overheating, quick wear and consequent break-down, failure or malfunction of the cutting tool or cutting insert.

Each cutting edge of a cutting tool or cutting insert is known to have a rake surface extending from the cutting edge in the direction away from the workpiece and a relief surface extending from the cutting edge transversely to the rake surface and generally facing in the direction of the workpiece, the cutting edge being defined at the intersection between its rake and relief surfaces.

The rake surface is adapted to come in contact with the removed chip and may have chip deforming/splitting/breaking or the like means whose design is such as to facilitate the evacuation of the chip from the cutting zone.

The relief surface is generally designed so as not to come in contact with the workpiece during cutting operation. With a given angle between the relief and rake surfaces of each cutting edge, this is achieved by the cutting tool/cutting insert being positioned during cutting operation such as to provide a distance between the relief surface and the workpiece, said distance normally increasing in the direction away from the cutting edge.

During a cutting operation, the amount of material to be removed per time unit by a given cutting tool from a given workpiece, and particularly, the thickness of the chip removed, depends on a number of parameters including the speed of rotation $Y_R$ of the cutting tool relative to the workpiece and the feed F.

On the other hand, the above parameters have a drastic influence on loads exerted on the cutting tool during chipping. The loads exerted on the cutting tool may be so high as to cause damage thereto, rendering it useless. On top of this, friction of the cutting tool with the workpiece causes heating of the former and the latter at the cutting zone, due to which extensive cooling, usually by means of a cooling liquid, is normally required. To avoid undesirable cutting conditions, the feed F and rotation speed $Y_R$ are thus limited, and so is, as a consequence, the power used.

General Description

According to one aspect of the subject matter of the present application there is provided a cutting element for removing material from a workpiece and forming therein an end profile extending along a longitudinal axis, said cutting tool being formed with a cutting portion having a rake surface and a relief surface and a cutting edge defined therebetween and comprising a bottom segment and a side segment, the cutting portion being boundable by a bottom reference surface and a side reference surface transverse thereto, so that said bottom segment lies along a maximal length thereof, on said bottom surface and said side segment lies along a maximal length thereof, on said side surface, the cutting edge further comprising an adjoining segment lying outside the bottom and side reference surfaces, said adjoining segment being defined by an intersection between corresponding rake and relief portions of said rake surface and relief surfaces, wherein, for any given normal reference plane oriented perpendicular to said adjoining segment and disposed between the said leading and trailing ends thereof, the intersection between each of the rake portion and the relief portion with said normal reference plane defines a respective rake line and relief line and the angle between these lines is equal to or smaller than a corresponding angle taken along each of a plurality of other normal reference planes disposed between the given normal reference plane and the leading end.

It should be noted that the bridging segment is not limited to extending between a lead point lying on the bottom segment and a trail point lying on the side segment or vise versa. In particular, according to one example, the bridging segment can extend so as to bridge the bottom and side segments, merging therewith via its leading and trailing ends. According to another example, the bridging segment can be disposed behind the bottom and/or side segments.

In addition, the cutting element can comprise one or more bridging segments lying outside the bottom and/or side segments. The arrangement can be such that the one or more bridging segments, cover, in a proper projection, the entire profile between the bottom and the side segments.

According to another aspect of the subject matter of the present application there is provided a method for designing a cutting edge of a cutting element configured for removing material from a workpiece to leave therein a desired end profile, said method comprising:

modeling a desired end profile of the workpiece, said profile having a longitudinal axis and being defined by a bottom surface, a side surface and an adjoining surface extending therebetween;

defining a lead profile plane and an trail profile plane spaced therefrom, each of the planes being oriented perpendicular to said longitudinal axis;

determining a profile contour defined by the intersection line between said end profile and said lead profile plane, including:
   a bottom contour defined as the intersection line between said lead profile plane and said bottom surface;
   an adjoining contour defined as the intersection line between said lead profile plane and said adjoining surface; and
   a side contour defined as the intersection line between said lead profile plane and said side surface;

designing a rake surface and a relief surface, the intersection line between which defines a cutting edge lying in the adjoining surface and spanning between the lead profile plane and the trail profile plane such that in any reference plane oriented perpendicular to said cutting edge, the intersection between each of the rake surface and the relief surface with said reference plane defines a respective rake line and relief line, the angle between said lines being equal to or smaller than a similar angle taken along each of a plurality of similar reference planes disposed between the reference plane and the lead profile plane.

Hereinafter, the following terms will be adhered to:

ruled surface—a surface in which through every point on the surface there is a straight line that lies on the surface. Typical examples are a plane, a cylinder, and, in general, any contour which is swept along a straight line. It is noted here that a cone is also considered a ruled surface which is formed by keeping one point of a straight line fixed whilst moving another point along a circle;

toroid-like surface—in principle, a toroid surface is generated by revolving a plane geometrical figure about an axis external to that figure which is parallel to the plane of the figure and does not intersect the figure (e.g. a torus). A toroid-like surface should be understood as a surface generated by a contour (not necessarily of a regular shape) being revolved about such an axis;

surface—a surface constituting the envelope of a body; and plane—a two-dimensional geometric structure used to provide a required geometric reference.

According to one design, the longitudinal axis which can be a straight line, in which case the adjoining surface obtains the shape of a portion of a ruled surface. In addition, according to a particular example of the above design, the ruled surface can be a portion of a cylinder. In addition, both the bottom surface and the side surface can be planar surfaces.

According to another design, the longitudinal axis can be an arc extending about a rotation axis, in which case the adjoining surface obtains the shape of a portion of a toroid-like surface. In addition, according to a particular example of the above design, the bottom surface can be a planar surface while the side surface can constitute a portion of a cylindrical surface.

The above design, yielding a toroid-like surface, can assume two main configurations:

concave configuration—in this case, the rotation axis is disposed facing the adjoining contour, whereby the resulting adjoining surface faces the rotation axis, i.e. constitutes an internal portion of the toroid-like surface; and convex configuration—in this case, the rotation axis is disposed facing away from the adjoining contour, whereby the resulting adjoining surface faces away from the rotation axis, i.e. constitutes an external portion of the toroid-like surface.

In both of the above examples, since the adjoining segment of the cutting edge is designed to extend between the lead profile plane and the trail profile plane, the length $L_{ADJ-SEG}$ thereof is inevitably greater than the length $L_{ADJ-CON}$ of the adjoining contour. In particular, the ratio $R_{ADJ}$ ($L_{ADJ-SEG}:L_{ADJ-CON}$) can be $R_{ADJ} \geq 1.25$, in particular $R_{ADJ} \geq 1.5$, even more particularly $R_{ADJ} \geq 1.75$, still more particularly $R_{ADJ} \geq 2$ and up to $R_{ADJ} = 10$.

The above designs of the adjoining surface are configured for the design of different cutting tools required for different cutting operations as follows:

ruled surface—configured for shaping, planing and broaching;

toroid-like surface, concave configuration—configured for drilling and milling; and toroid-like surface, convex configuration—configured for turning and hole sawing.

Per the above, two main principles are provided for defining the trajectory/shape of the cutting curve corresponding to the adjoining segment:

Mathematical Method
  defining a helix base axis;
  defining a pierce line extending from and oriented perpendicular to the helix base axis so that an end or the virtual extension thereof pierces the adjoining surface at a pierce point;
  defining a pitch increment p' and an angle increment θ';
  displacing the pierce line along the helix base axis at corresponding pitch and angle increments p' and θ';
  for each such displacement, defining a pierce point of the pierce line;
  obtaining a pierce curve extending along the adjoining surface defined by the plurality of pierce points;
  calculating the ratio $R_{ADJ}$ between the length of the pierce curve and the length of the adjoining contour; and, if $R_{ADJ}$ does not match a desired ratio
  re-defining the pitch increment p' and the angle increment θ' to obtain such a desired ratio $R_{ADJ}$.

The pierce curve yielded by the above steps of the mathematical method constitutes the desired adjoining segment of the cutting edge. In particular, in examples in which the adjoining surface is a torus or a cylinder, the pierce curve (and consequently the adjoining segment) can constitute a portion of a helix.

With reference to the above, according to a particular example, the helix base axis can be constituted by the longitudinal axis or an axis parallel thereto.

As explained above, the overall pitch P of the pierce curve can be chosen based on the desired adjoining ratio $R_{ADJ}$. The pitch P is defined by the number of pitch increments p' at which the sum of angle increments θ' equals 360°.

In this connection, it should be appreciated that the adjoining surface is never a closed contour surface, i.e. the cross-section thereof (the adjoining contour) does not produce a closed contour. As such, on the one hand, if a greater $R_{ADJ}$ is desired, the pitch of the pierce curve should be increased, thereby increasing the length $L_{ADJ-SEG}$ of the adjoining segment. However, on the other hand, since the dimensions of the ajoining surface are finite, it should be understood that a too greater pitch may cause the pierce curve to not fully intersect the adjoining surface. Therefore, during design of the cutting edge, an optimization of the length should be performed based on $L_{ADJ-SEG}$, the dimensions of the adjoining surface and the desired $R_{ADJ}$.

Empiric Method
Variation I
  defining a lead point on the bottom surface or on the adjoining surface, being closer to the lead profile plane that to the trail profile plane;
  defining a trail point on the side surface or on the adjoining surface, being closer to the trail profile plane that to the lead profile plane;
  defining an intermediate point on the adjoining surface disposed between the lead profile plane and the trail profile plane;
  defining an intersecting plane by passing through the lead point, the trail point and the intermediate point;
  defining an intersecting curve which is constituted by the intersection line between the intersecting plane and the adjoining surface;
  calculating the ratio $R_{ADJ}$ between the length of the intersecting curve and the length of the adjoining contour; and, if $R_{ADJ}$ does not match a desired ratio
  re-positioning the lead point, trail point and intermediate point to obtain such a desired ratio $R_{ADJ}$.

The intersecting curve yielded by the above steps of the empiric method constitutes the desired adjoining segment of the cutting edge.

According to one example, the lead point lies on the lead profile plane, at the intersection thereof with the bottom surface and the trail point lies on the trail profile plane, at the intersection thereof with the side surface. According to another example, the lead point lies on the bottom surface and the trail point lies on the side surface.

According to a particular design, it may be beneficial for the intermediate point to be located on the adjoining surface approximately between the bottom surface and the side surface, and for the distance between the intermediate point and each one of the lead profile plane and the trail profile plane to be generally similar.

Thus, during the re-positioning step, the intermediate point may remain in place and only the lead point and the trail point can be re-positioned in terms of the distance between them and the respective lead profile plane and trail profile plane.

Variation II
  defining an elevated reference plane disposed above the end profile and oriented to generally face at least the adjoining surface;
  defining a mimic curve extending along the elevated reference plane, the mimic curve having a start point and an end point;
  obtaining a mimic projection on the end profile in a view normal to the elevated reference plane, the mimic projection having a projection start point and a projection end point; if the mimic projection does not completely intersects the adjoining surface re-orienting the elevated reference plane so that the projection start point and projection end point lie outside the adjoining surface or on the edge thereof;

calculating the ratio $R_{ADJ}$ between the length of the mimic projection and the length of the adjoining contour; and, if $R_{ADJ}$ does not match a desired ratio re-orienting the elevated reference plane to obtain such a desired ratio $R_{ADJ}$.

The mimic projection yielded by the above steps of the empiric method constitutes the desired adjoining segment of the cutting edge.

As explained above, the term 'completely intersects' should be understood as defining that the projection start point and projection end point lie outside the adjoining surface or on the edge thereof.

With reference to the above, according to a particular example, the mimic curve can be constituted by a simple geometric curve, e.g. a straight line, an arc etc.

It should be understood that the above steps of the method can be extended to the design of either or both of the bottom surface and the side surface, in which case the elevated reference plane should be re-oriented so that the mimic projection fully intersects either or both of the bottom surface and the side surface respectively.

In connection with the above two variations of the empiric method, it is appreciated that each provides an approximation method for obtaining an adjoining segment which is generally similar to the adjoining segment yielded by the mathematical method.

Designing the rake and relief surfaces to acquire the features defined in the previous aspects of the subject matter of the present application can be performed as follows:

defining a plurality of reference planes successively disposed along the cutting curve, each being pierced by said curve at a piercing point and being perpendicular to the curve at the piercing point;

obtaining along each of said reference planes the projection of at least the adjoining contour;

defining along each of said reference planes:
  a base line tangent to said projection at said piercing point; and
  a chip line perpendicular to said base line at said piercing point;

defining, on each of said reference planes, a cutting contour constituted by a rake line and a relief line extending from said piercing point to define:
  a desired cutting angle between said rake line and said chip line;
  a desired body angle between said rake line and said relief line; and
  a desired rear angle between said relief line and said base line;

the body angle of the cutting contour on each reference plane being equal to or smaller than the body angle of the cutting contour of each of a plurality of reference planes disposed between the reference plane and the lead profile plane;

designing a cutting tool constituted by a rake surface and a relief surface, each being defined by the rake and relief lines of each of the reference planes respectively.

In addition, it should be appreciated that on each of the reference planes, the rake and relief lines are designed according to the projection of the profile contour on that specific plane. In addition, the length and shape of the rake line and of the relief line are designed according to different requirements of the cutting tool, including dimensions.

Thus, in each of the reference planes the shape and angle of the rake line and of the relief line can be different and individual to that specific reference plane. In particular, the design of the rake line and of the relief line is such that they do not intersect the profile contour at any point other than the pierce point. More specifically, the design is such that the resulting cutting tool and cutting edge do not intersect the end profile at any other point along the reference plane other than the pierce point.

The rake and relief lines on each of the reference planes is not restricted to a straight line. In particular, while either of the rake and relief lines on one reference plane can be a straight line, on another reference plane the rake and/or relief line can be a curved line, a geometric curve, a portion of an arc etc.

Per the above method, a plurality of cutting tools and inserts can be devised as will be further detailed.

According to a another aspect of the disclosed subject matter, there is provided a cutting insert comprising a front surface, a rear surface and at least one side surface extending therebetween having a first portion and a second portion angled to one another to form a corner, the cutting insert being formed with a main cutting edge defined at the intersection between said front surface and the corner of the side surface, said cutting insert further comprising an additional cutting element disposed on the corner of the side surface and protruding therefrom, said additional cutting element having an auxiliary cutting edge extending along said corner between said front surface and said rear surface, between a first intersection point with said first portion of the side surface and a second intersection point with said second portion of the side surface, none of which coincides with the cutting edge of the cutting insert.

It should be noted that the terms 'front face' and 'rear face' designate position of the faces of the cutting insert with respect to the workpiece. Thus, in turning inserts, the front face may be equivalent to the top face while the rear face may be equivalent to the bottom face.

The auxiliary cutting element may also be referred herein as a 'cutting balcony' or a 'cutting porch' due to its projection beyond the main cutting edge.

The main cutting element can have a rake surface constituted by a portion of the front surface and a relief surface constituted by a portion of the side surface. Respectively, the auxiliary cutting edge can be defined at the intersection between an auxiliary rake surface of the additional cutting element outwardly projecting from the side surface and transverse thereto and an auxiliary relief surface extending transverse to the rake surface and away from the main cutting edge.

The auxiliary rake surface can form an intersection line with the side surface of the cutting element so that end points of the intersection line coincide with the first and the second intersection point of the auxiliary cutting edge. Thus, in a top view, perpendicular to the front surface (and along the side surface), both the auxiliary cutting edge and the intersection line are clearly visible, including the first and the second intersection points.

The cutting edge of the additional cutting element can be designed so that any point disposed along the auxiliary cutting edge protrudes from the side surface and is visible in a top view of the cutting insert, perpendicular to the front surface. According to a specific design, in a top view of the cutting insert, perpendicular to the front surface, all the points along the cutting edge are visible. Thus, in the top view, the auxiliary cutting edge fully envelopes the main cutting edge at the corner, from one portion of the side surface to the other.

The first intersection point can be located close to the front surface while the second intersection point can be located closer to the bottom surface. In addition, the auxiliary cutting edge can include a point, maximally distant from the side surface of the cutting insert and located between said first intersection point and said second intersection point.

The auxiliary cutting edge, in a top view perpendicular to the front surface, can have a mid-point defined as the point on the cutting edge intersecting with a bisector of the angle formed at the corner between the portions of the side surface. The auxiliary cutting edge can be divided (virtually) into a lead portion extending from the first intersection point to the mid-point and a tail portion extending from the mid-point to the second intersection point.

In addition, in a side view of the cutting insert, perpendicular to the first portion thereof, the first intersection point will be clearly visible while the second intersection point will be slightly obscured by the second portion of the side surface itself.

In operation, the cutting insert can be mounted onto a cutting tool holder to form a cutting tool. The cutting insert can be oriented on the tool slightly tilted, such that a top view of the cutting tool and a top view of the cutting insert differ from one another. In particular, the arrangement can be such that the cutting insert is tilted forward along a plane which serves as the bisector of the angle formed in the side surface, so that in a top view of the cutting tool, the main cutting edge is disposed between the intersection line and the auxiliary cutting edge.

Furthermore, in connection with the above, the cutting insert is mounted onto the cutting tool and so tilted, that the distance of the mid-point of the auxiliary cutting edge from the main cutting edge is smaller than the same distance in a top view of the cutting insert.

In general, the design of the cutting insert according to the disclosed subject matter, which includes a main cutting edge and an auxiliary cutting edge disposed in front thereof, allows removing a greater chip from the workpiece, i.e. greater penetration into the workpiece. For example, if the main cutting edge alone is configured for removing 0.3 mm, the additional cutting element can even double this the penetration, i.e. removing a chip of 0.6 mm.

It is also important to note that both the main cutting edge and the auxiliary cutting edge operate simultaneously during the same cutting operation to subsequently remove chips from the workpiece. This is in contrast to cutting tools which require several cutting inserts, consecutively located one behind the other in order to achieve the same effect.

Several additional advantages may arise from the design of the additional cutting element and from the location of the first and the second intersection point outside the cutting edge:
- complete separation is provided between chips removed by the main cutting edge and chips removed by the auxiliary cutting edge. If at least the first point is located on the main cutting edge, this proves to be a failure point which may cause congestion of the removed chips, consequently increasing heat generated at the interface between the workpiece and the cutting insert;
- during manufacture or thereafter, the main cutting edge and the auxiliary cutting edge can be independently sharpened; and
- additional spacing is provided between the workpiece and the cutting insert by the additional cutting element, providing more space for removed chips as well as for cooling during a cutting operation.

Several design embodiments of cutting inserts will now be described:
- a cutting insert comprising four side walls, each two adjacent side walls forming the corner. Thus, the cutting insert can be formed with four main cutting edges, maxing the cutting insert indexible. The cutting insert can be provided with four additional cutting elements, one for each of the four corners;
- the cutting insert is also be reversible, wherein each cutting element is formed with an additional auxiliary rake surface and an additional auxiliary cutting edge;
- the additional cutting element is designed such that and so mounted onto the cutting tool that in a top view of the cutting tool, the extension of the cutting edge about the corner is not symmetrical. In particular, a greater portion of the cutting edge is located in front of the first portion of the side surface, thereby allowing using the cutting insert mainly in front cutting;
- the additional cutting element is constituted by several steps, so that the auxiliary cutting edge, as well as the auxiliary rake surface are divided into several portions. Such a design allows removing chips of smaller width but of greater number from the workpiece;
- the auxiliary cutting edge is designed such that when the cutting insert is tilted (when mounted onto the cutting tool holder), the cutting edge extends symmetrically about the corner of the main cutting edge;
- the cutting insert can be formed with more than one additional cutting element on the same corner. For example, the cutting insert can be formed with a first additional cutting element, while that same element can be formed with an additional element of its own, allowing to further increase the penetration of the cutting tool into the workpiece;
- the corner of the cutting insert, and so the main cutting edge can be of an arbitrary shape, while the auxiliary cutting edge can be designed so as to complete the inscribing envelope of the corner. For example, the auxiliary cutting edge can form the envelope of the a right angled corner, while the main cutting edge is curved inwards from that envelope;
- the cutting insert can be formed with several additional cutting elements along the same corner, wherein each of the cutting elements comprises a cutting edge providing a different cutting radii of the angle of the same corner (along a plane parallel to the front surface of the cutting insert). For example, for a right angled corner, the first additional cutting element can have a cutting radius of R1, the second additional cutting element (protruding from the first) can have a cutting radius of R2<R1, the third additional cutting element (protruding from the second) can have a cutting radius of R3<R2 and so forth;
- the cutting insert can be formed with a acute angle (e.g. 60, 45, 30 deg.).

According to another aspect of the disclosed subject matter there is provided a press-mold for the manufacture of the cutting insert of the previous aspect of the present application, said mold comprising a female member with a shaped cavity and a mal member with a corresponding shape.

The arrangement can be such that the auxiliary cutting edge of the cutting insert is not located at the parting line between the male and the female member, when the former is received within the latter.

In addition, the cavity of the female member can be formed with straight surfaces and the male member can have corresponding surfaces, so that the movement of the male member is given a certain degree of freedom (along its movement axis). It is appreciated that since the mold is configured for receiving (usually) particulate material, exact measurement of the amount is not always provided.

Thus, the design of the mold allows the male member to be introduced into the female member until it reaches the particulate material, even if the amount of material is slightly greater/smaller than planned. Furthermore, the above arrangement provides, in case the amount of material is smaller than planned, for the male member to displace further into the female cavity without coming in contact there with, thereby eliminating damage to the mold members.

The cutting insert can be formed, alongside the additional cutting element, with at least one secondary cutting element disposed along the side surface of the cutting insert, at a predetermined distance from the additional cutting element. Moreover, the cutting insert can be formed with a plurality of such secondary cutting elements, disposed sequentially, one after the other, along the side surface.

Each of the secondary cutting elements can have a secondary cutting edge extending between a start point adjacent the front surface (but not located thereon) and an end point located adjacent the bottom surface.

Similar to the auxiliary cutting edge, the secondary cutting edge has a start point located on the side surface, and can also be of spiraling/curved shape, although located on the side surface and not on the corner.

The plurality of such secondary cutting edges can be configured for providing the cutting insert to perform a cutting operation during feed in a direction perpendicular to the side surface on which the secondary cutting elements are disposed, thereby removing a greater amount of material from the workpiece.

According to a particular example, the cutting insert can be provided with secondary cutting elements on both side surfaces forming the corner, thereby allowing the cutting insert to perform both front and side cutting of the workpiece.

The secondary cutting elements can be disposed along the side surfaces such that, in a top view of the cutting insert, when mounted onto a cutting tool, the secondary cutting edges overlap one another. In particular, the start point of one secondary cutting edge can overlap, in the top view, the end point of an adjacent secondary cutting edge (or an end point of the auxiliary cutting edge).

It is appreciated that in the orientation of the cutting insert when mounted onto the cutting tool holder (i.e. in a working position), the start points of the auxiliary cutting edges do not come into contact with the workpiece as they are protected by the front surface of the cutting insert.

Thus, in effect, the chips removed from the workpiece by the cutting insert always have an additional space to flow to, since the effective starting point of the cutting is spaced from the side surface of the cutting insert.

According to still another aspect of the disclosed subject matter there is provided a cutting tool holder configured for mounting thereon a cutting insert according to the previous aspects of the disclosed subject matter, said cutting tool holder having a front surface formed with an insert seat and a front surface extending transverse to the front surface, wherein said cutting tool holder comprises a dynamic chip breaker protruding from the front surface beneath the cutting insert, said dynamic chip breaker being loosely biased to protrude from the front surface and pivotally displaceable about an axis generally parallel to the front surface.

The arrangement is such that during a cutting operation, the dynamic chip breaker is configured for coming in contact with the workpiece, thereby wiping therefrom removed chips. In addition, the dynamic chip breaker can also serve as a chip breaker, causing long chips removed from the workpiece to break and split into smaller pieces.

The dynamic chip breaker is provided with a biasing element configure to provide a loose biasing force, the term 'loose' being defined herein as, on the one hand sufficient for making the breaker come into contact with the workpiece, but on the other hand, loose enough to allow the breaker to pivot about its axis under pressure exerted thereon by removed chips.

When the breaker is pivoted about the axis, it assume a position in which it protrudes to a lesser extent from the front surface of the cutting tool holder, thereby increasing the spacing between the breaker and the workpiece, allowing chips to be expelled downwardly by virtue of the rotation of the workpiece.

The cutting insert can be used in turning, milling and drilling operations. In particular, in case of milling and turning, the front and rear faces are equivalent to the front and rear faces of the cutting insert while in the case of drilling, the front and rear surfaces are angularly first and second surfaces.

In general, the cutting insert of the disclosed subject matter may provide the following, compared with a similar cutting insert formed without an additional cutting element:

Under constant feed F, the revolution speed $V_R$ of the workpiece can be increased by 2-3 times while maintaining the amount of heat generated during the cutting operation as well as the same life span of the cutting insert;

Under the safe feed F and revolution speed $V_R$ of the workpiece, the amount of heat generated during the cutting operation can be lower by about 150°, and the life span can be increased by about 5 times;

Under the same revolution speed $V_R$, the feed F can be increased to about 0.8 mm, while maintaining the amount of heat generated during the cutting operation as well as the same life span of the cutting insert.

According to still another aspect of the subject matter of the present application, there is provided a rotary cutting tool configured for rotation about a central axis thereof for removing material from a workpiece, said cutting tool comprising a cutting portion extending about said central axis and having a rake surface and a relief surface, defining, at the intersection thereof, a cutting edge of the cutting portion having a lead end and a trail end, said lead end being configured for coming in contact with said workpiece prior to said trail end, wherein the angle between said rake surface and said relief surface at said lead end is greater than at said trail end.

The cutting tool can further comprise a standard cutting edge the contour of which extends inward of the cutting corner defined by the first and the second portion.

The at least one of the cutting edges of the first cutting portion and of the second cutting portion can have a straight segment, so that the resulting corner has a partially straight cross-sectional contour.

The cutting edge of the first cutting portion can have a first lead end and a second lead end, and of the cutting edge of the second cutting portion can have a second lead end and a second trail end, and wherein the first lead end is located in front of the lead end of the second lead end so as to come into contact with the workpiece during a cutting operation, before the second lead end. There can also exist an overlap between the cutting edge of the first cutting portion and the cutting edge of the second cutting portion so that the second lead end is disposed in front of the first trail end.

In addition, the standard cutting edge can extend so that in a view perpendicular thereto, at least one of the first lead end and the second lead end is obscured thereby. This can be particularly useful in reducing load and impact effects on the cutting edge. Specifically, it yields that the cutting edge obscured by the standard cutting edge penetrates the workpiece not at its lead end but at a point spaced from the lead end towards the trail end, thereby preventing impact of the workpiece on the lead point.

The second trail end can also comprise an extension configured for breaking off chips removed from the workpiece. In particular, in revolving tools, the extension can have a curve shaped, curving towards the center of the cutting tool (axis of rotation) at a smaller radius that that of the cutting tool, whereby removed chips are urged inwards and are broken off.

The cutting tool can be a rotary tool configured for revolution about a central axis, and wherein the first cutting portion and the second cutting portion extend about the central axis.

According to one example, the cutting edge of the first cutting portion can be configured for removing material from a surface extending parallel to the central axis and the cutting edge of the second cutting portion can be configured for removing material from a surface extending perpendicular to the central axis.

According to another example, the cutting edge of the first cutting portion can be configured for removing material from a surface extending perpendicular to the central axis and the cutting edge of the second cutting portion can be configured for removing material from a surface extending parallel to the central axis.

Regardless of the above configurations, the cutting tool can comprise several cutting segments, each segment comprising at least one of the first and the second cutting portions.

Under one design embodiment, each cutting segment includes both the first and the second cutting portion. Alternatively, the cutting segments of the cutting tool alternate so that one cutting segment is configured according to the first configuration and the other cutting segment is configured according to the other configuration.

Furthermore, according to a specific design, one cutting segment can comprise the first cutting portion and the consecutive cutting segment can comprise the second cutting portion. Thus, the segments become complementary to one another, alternating between side and bottom cutting.

The cutting tool can also be designed such that the segments also comprise a standard cutting edge disposed, in each cutting segment, in front of the first and/or second cutting portion.

Moreover, according to another design embodiment, the cutting tool can also assume the configuration under which each cutting segment comprises only one cutting portion, e.g. bottom cutting or side cutting, whereby the cutting edge of the one cutting portion cuts a slit within the workpiece and the standard cutting edges are configured thereafter for removing material from a slitted workpiece.

The cutting tool can be provided with one or more chip evacuation channels extending about an rotation axis, wherein the circumferential extension of the cutting segment about the central axis is greater than the circumferential extension of the channel about the central axis.

The arrangement can be such that the angle between the rake surface and the relief surface of at least one of the cutting portion at said lead end is greater than at said trail end. In particular, the angle between the rake and relief surfaces can be continuously reduced between the lead end and the trail end.

The first and the second cutting portions of the cutting tool can be constituted by a first cutting insert comprising the first cutting portion and a second cutting insert comprising the second cutting portion, the first and the second cutting insert being configured for mounting one on top of the other to form a combined cutting edge configured for simultaneously removing material from the same corner of the workpiece during the same cutting operation.

The arrangement can be such that the first cutting insert and the second cutting insert are configured for being mounted onto the cutting tool holder using a mutual connecting configuration.

In addition, the first cutting insert and the second cutting insert can form together a construction which cannot be manufactured in a press-mold or in a single-axis injection mold. Thus, each of the cutting inserts can be manufactured separately in a pressing process and thereafter mounted one on top of the other to form the combined arrangement.

According to a further aspect of the subject matter of the present application there is provided a cutting tool configured for removing material from a workpiece, said cutting tool comprising a cutting portion having a rake surface and a relief surface, defining, at the intersection thereof, a cutting edge having a lead end and a trail end, said lead end being configured for coming in contact with said workpiece prior to said trail end, wherein the angle between said rake surface and said relief surface at said lead end is greater than at said trail end.

According to yet another aspect of the present application, there is provided a cutting tool configured for removing material from a workpiece in order to form therein a corner of angle θ, said cutting tool comprising a first cutting portion comprising a first rake surface and a first relief surface and defining therebetween a first cutting edge, and a second cutting portion, spaced from the first cutting portion, and comprising a second rake surface and a second relief surface and defining therebetween a second cutting edge, wherein each of the first cutting edge and the second cutting edge constitute only a portion of the contour defining said angle θ.

According to still a further aspect of the subject matter of the present application there is provided a cutting tool configured for removing material from a workpiece to form a corner therein, said cutting tool comprising a first cutting element having a first cutting portion with a first cutting edge and a second cutting element having a second cutting portion with a second cutting edge, wherein, the contour of the first cutting edge and the contour of the second cutting edge are configured for forming together a combined contour corresponding to the above corner of the workpiece.

The cutting edges of the first and of the second element can be configured for simultaneously cutting respective portions of the same corner of the workpiece during the same cutting operation.

The arrangement can be such that, when combined, the cutting elements form a structure which cannot be produced in a press-mold or a single-axis injection mold.

The cutting elements can also comprise an alignment arrangement configured for preventing lateral movement therebetween. The alignment arrangement can be constituted by a male-female engagement between the cutting elements.

The cutting elements are configured for simultaneously being mounted onto a cutting tool holder using a mutual securing arrangement.

In particular, the cutting elements can be configured for being mounted one on top of the other. Specifically, each of the cutting elements can be formed with a securing bore so that when the cutting elements are aligned, a single fastening bolt can be passed through the bores of the cutting elements to simultaneously secure both cutting elements to the cutting tool holder.

With respect to the above described, in all cutting operations such as milling, turning and drilling, it is appreciated that the features of the cutting tools as mentioned above may provide the cutting tools with at least one of the following advantages:

Feed—under the same loads, the cutting tool may operate at greater feed and rotation speed F and $Y_R$ respectively, than an equivalent cutting tool without the above mentioned features, and, as such, remove a greater amount of material from the workpiece per time unit t;

Loads—under the same feed and rotation speed F and $Y_R$, the cutting tool may be subjected to lower loads than an equivalent cutting tool without the above mentioned features, thereby providing an increased overall lifespan;

Chip—under the same rotation speed $Y_R$, the cutting tool may be allowed a greater feed F than an equivalent cutting tool without the above features, thus allowing to remove a thicker chip per time unit t for one turn of the cutting tool or workpiece; and Speed—under the same feed F, the cutting tool or workpiece may be allowed a greater rotation speed $Y_R$ than an equivalent cutting tool without the above features, removing a greater amount of chips per time unit t.

Lifespan—the cutting inserts/tools may be provided with a longer lifespan under the same conditions as a standard cutting insert/tool.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 13G and 3H are respective schematic isometric assembled and exploded views of a mold for the manufacture of the turning insert shown in FIGS. 13A to 13F;

FIG. 27D is a schematic hidden-line view of the portion of the turning tool shown in FIG. 27C;

FIG. 27E is a schematic hidden-line view of another portion of the cutting tool shown in FIG. 27C;

FIG. 28A is a schematic isometric view of a turning insert according to still another example of the present application;

FIGS. 28B and 28C are schematic enlarged views of details of the turning insert shown in FIG. 28B;

FIGS. 28D to 28H are respective schematic bottom isometric, top, bottom, right-side and left-side views of the turning insert shown in FIGS. 28A to 28C;

FIG. 29A is a schematic exploded isometric view of a mold used in the manufacture of the turning insert shown in FIGS. 28A to 28H;

FIGS. 29B and 29C are respective schematic isometric and top views of a male member of the mold shown in FIG. 26A;

FIGS. 29D and 29E are respective schematic top and isometric views of a female member of the mold shown in FIG. 26A;

FIG. 30A is a schematic isometric view of a turning tool comprising the turning insert shown in FIGS. 28A to 28H;

FIGS. 30B to 30D are schematic front, side and top views of the turning tool shown in FIG. 30A;

FIG. 30E is a schematic hidden-line view of a portion of the turning tool shown in FIG. 30D;

FIG. 31 is a schematic side view of a milling insert according to the present application;

Figure 31:
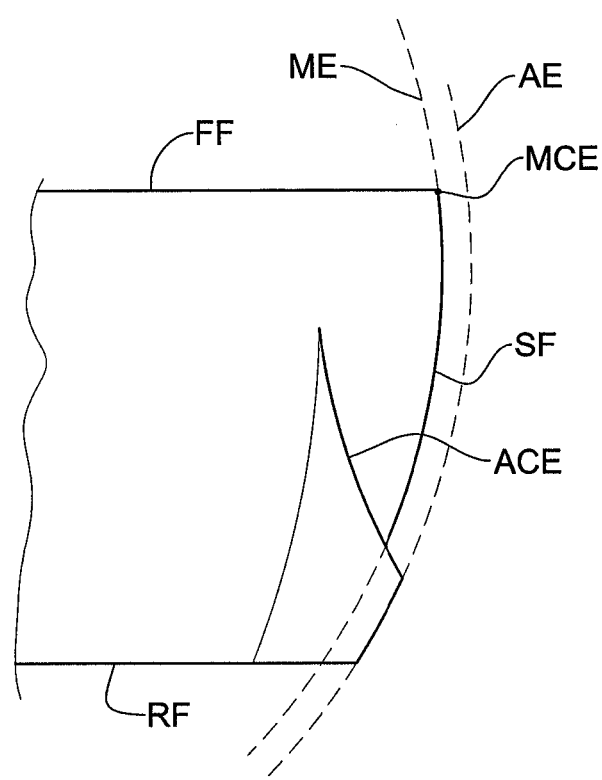
Figure 31A:
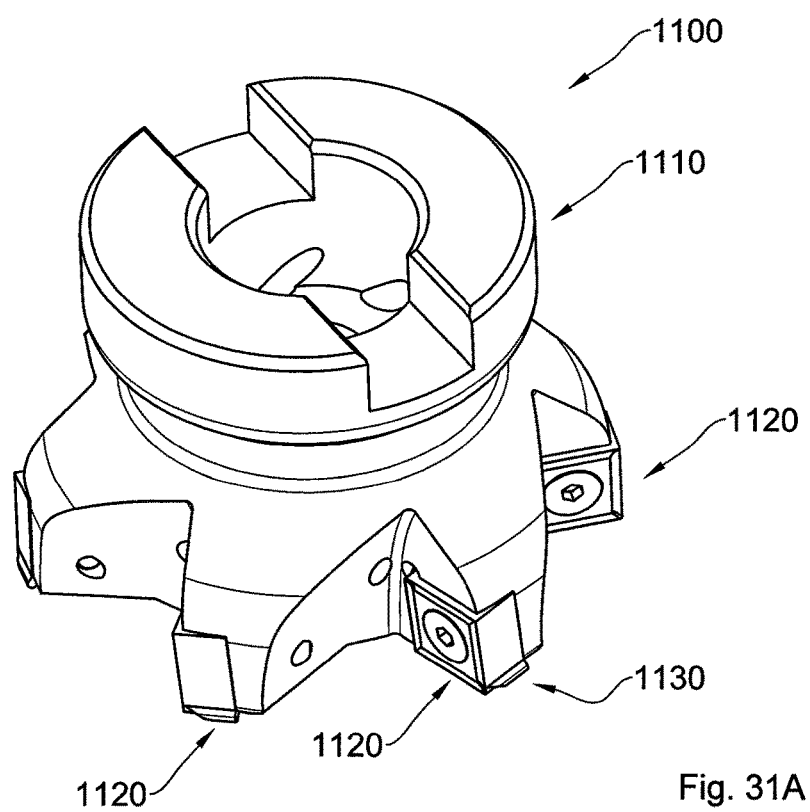
Figure 31B:
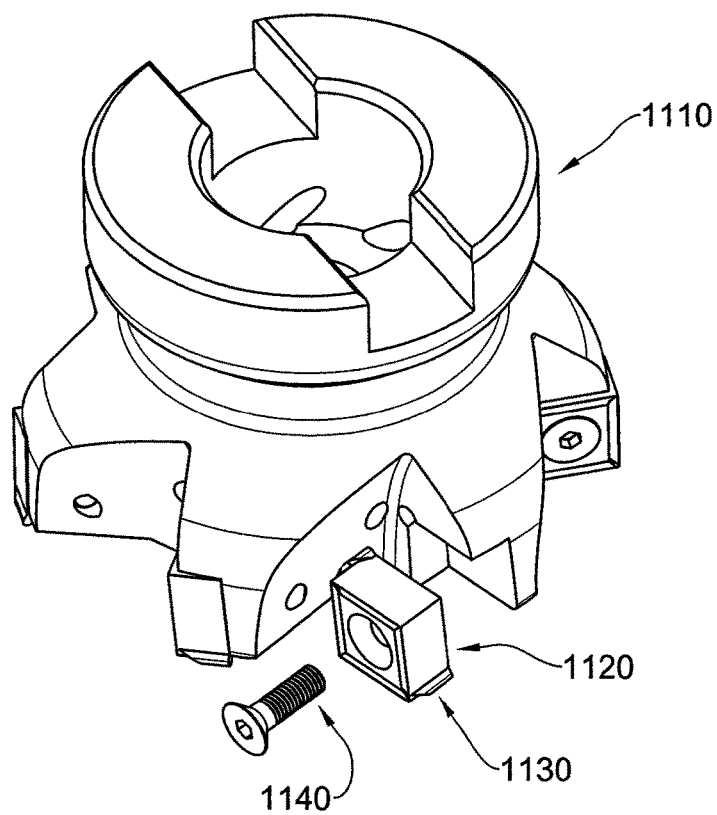
Figure 31C:
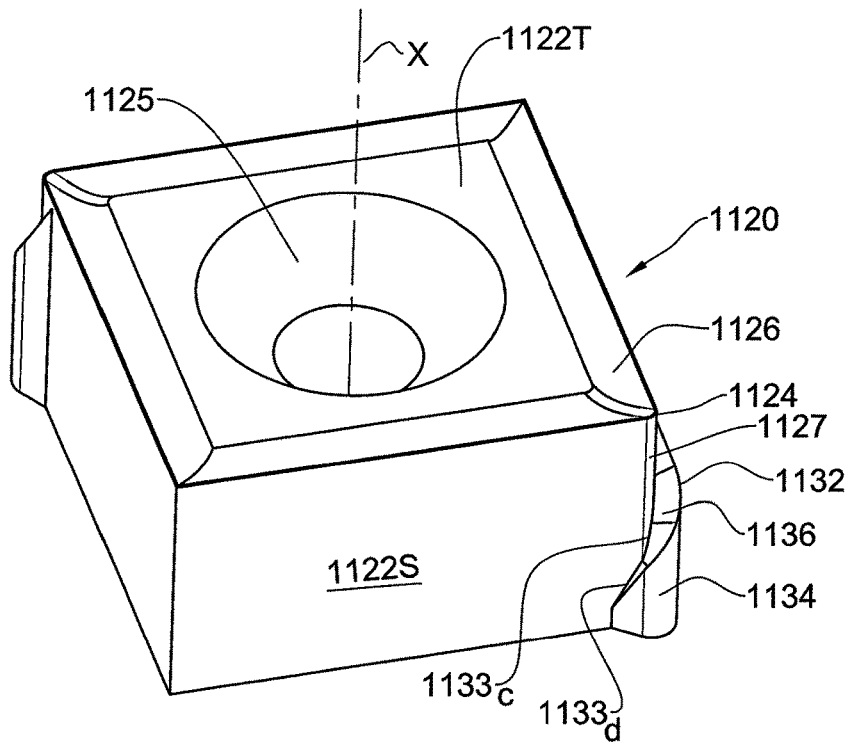
Figure 31D:
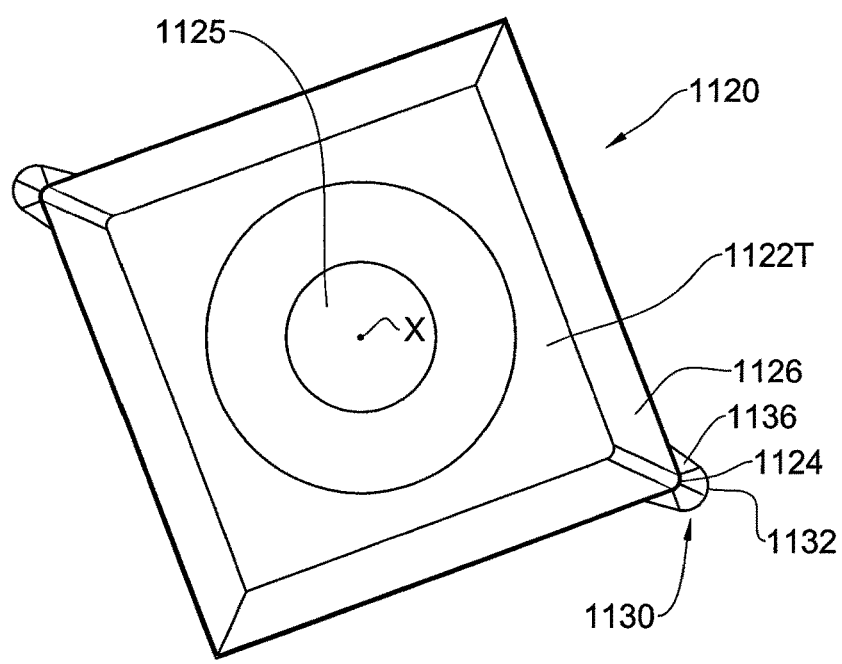
Figure 31E:
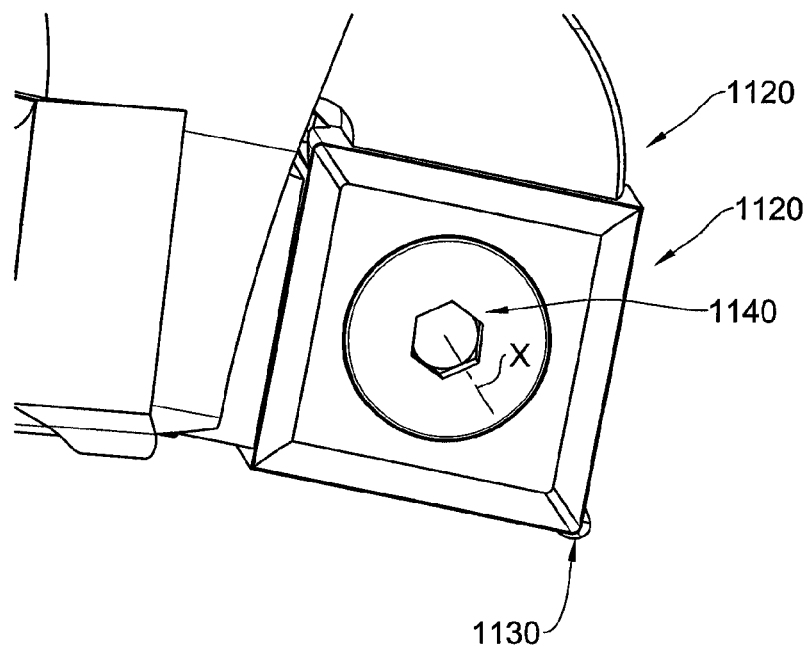
Figure 31F:
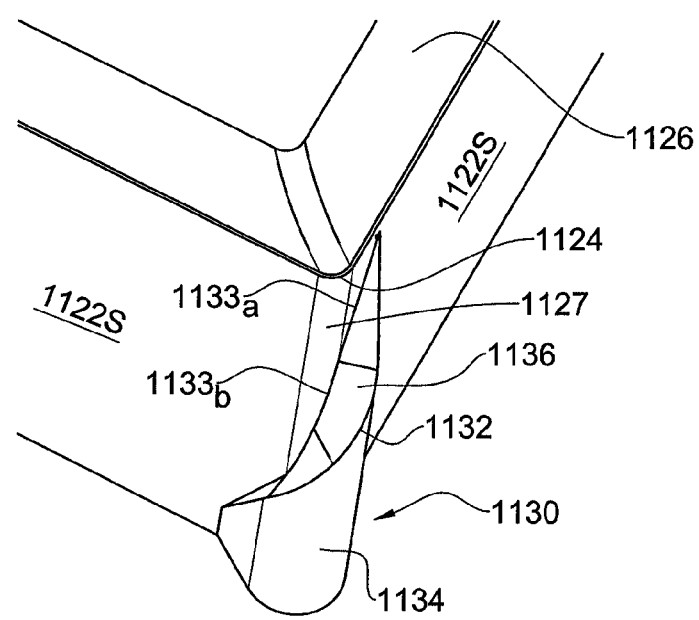
Figure 31G:
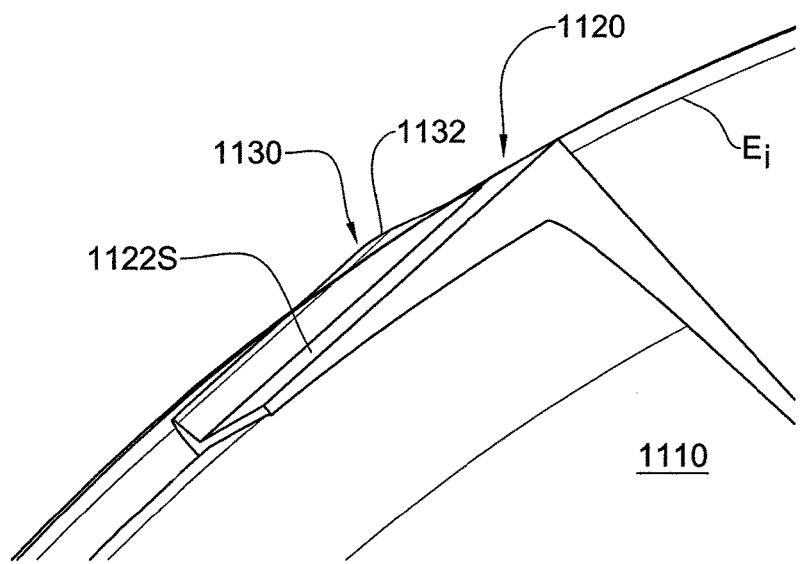
Figure 31H:
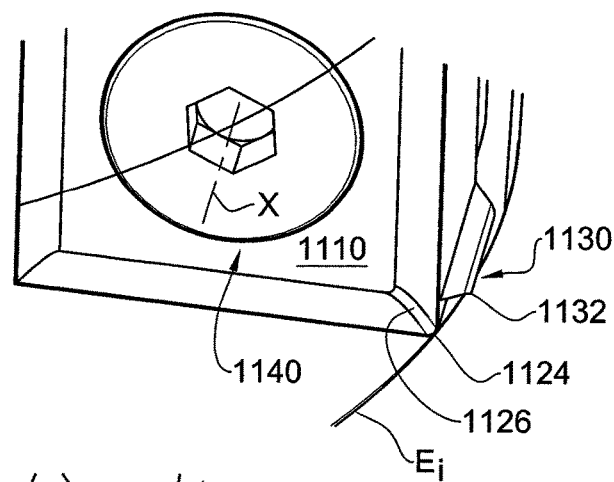
Figure 31I:
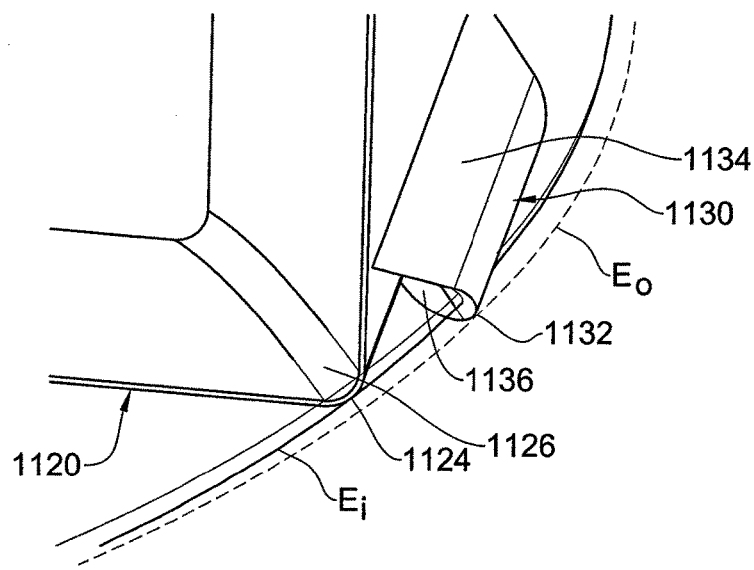
Figure 32A:
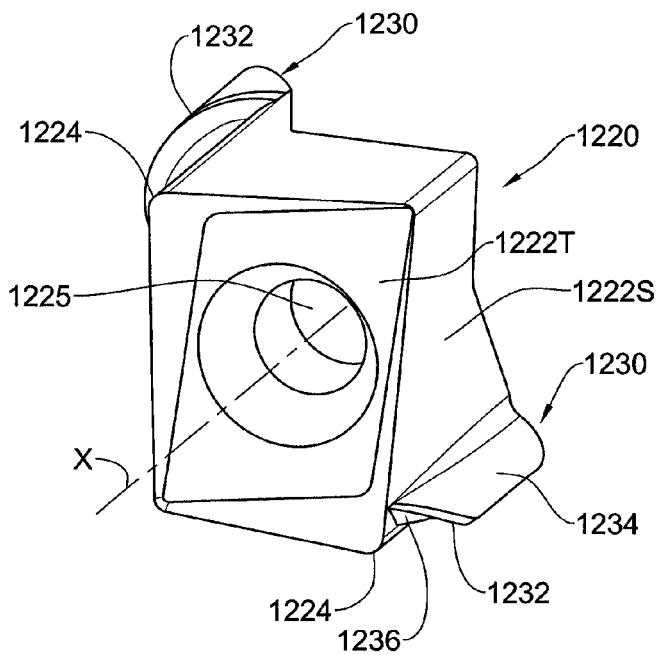
Figure 32B:
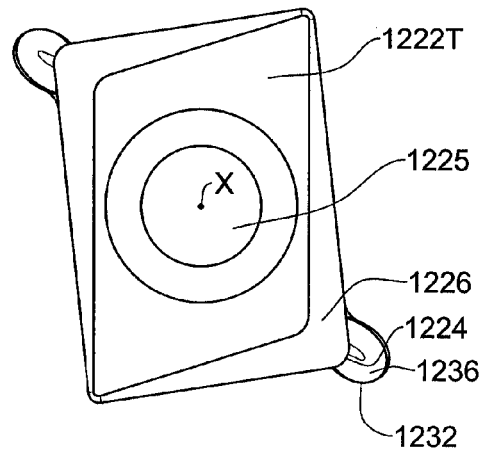
Figure 32C:
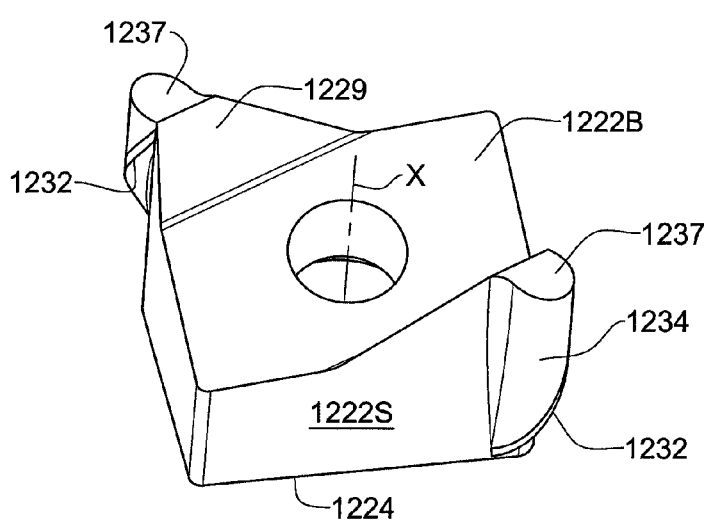
Figure 32D:
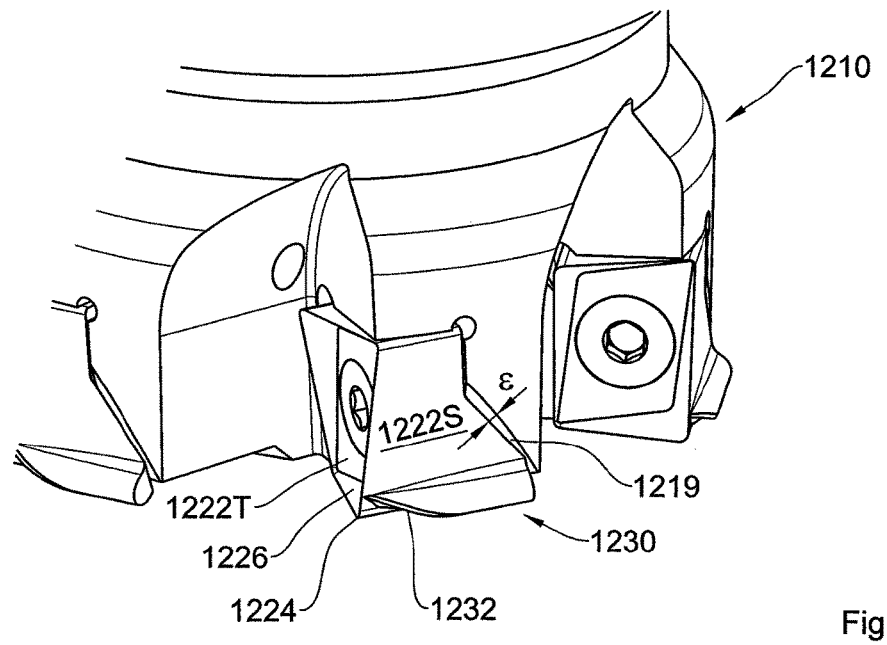
Figure 32E:
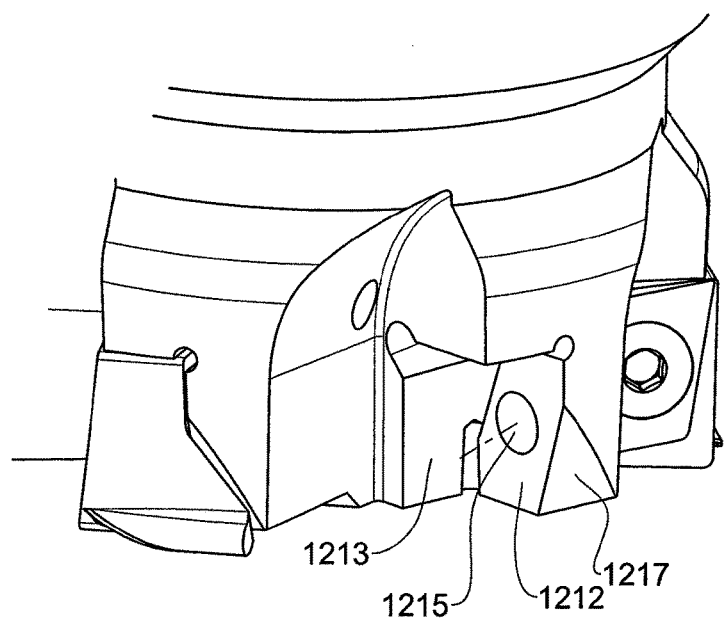
Figure 33A:
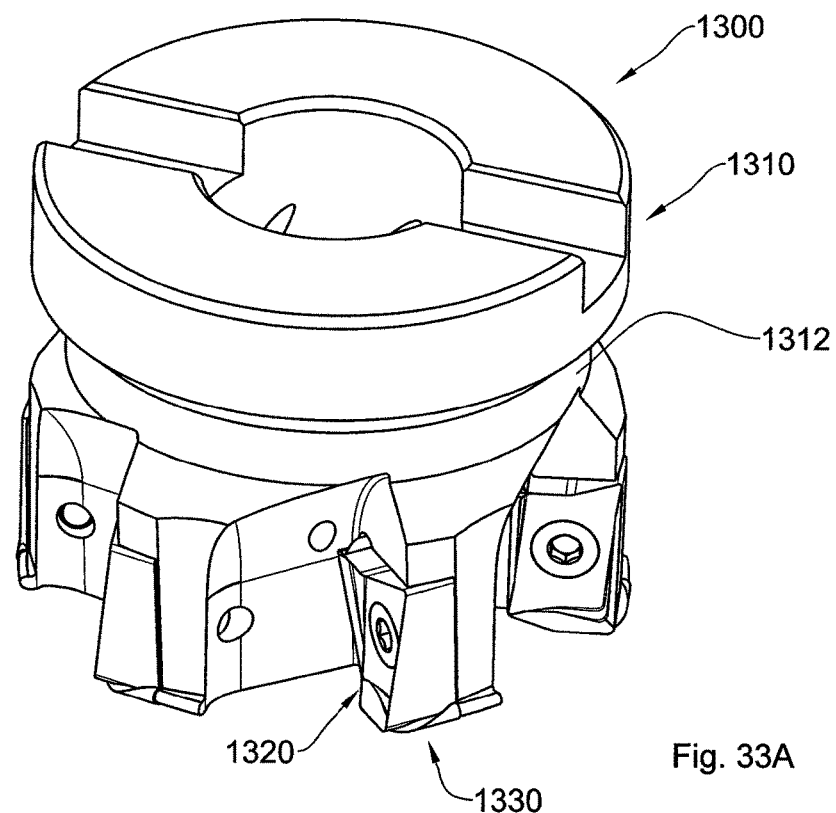
Figure 33B:
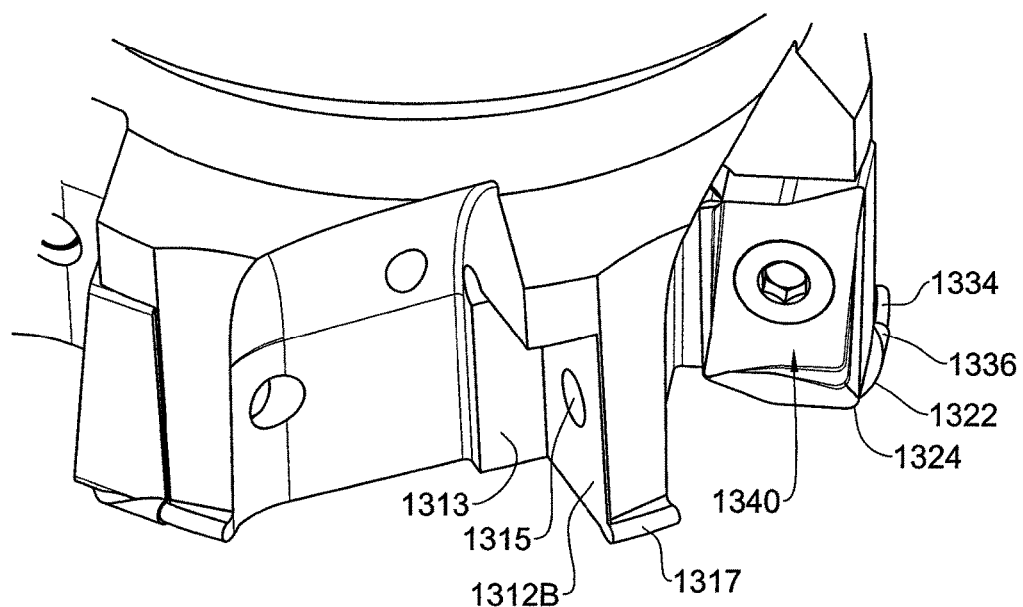
Figure 34A:
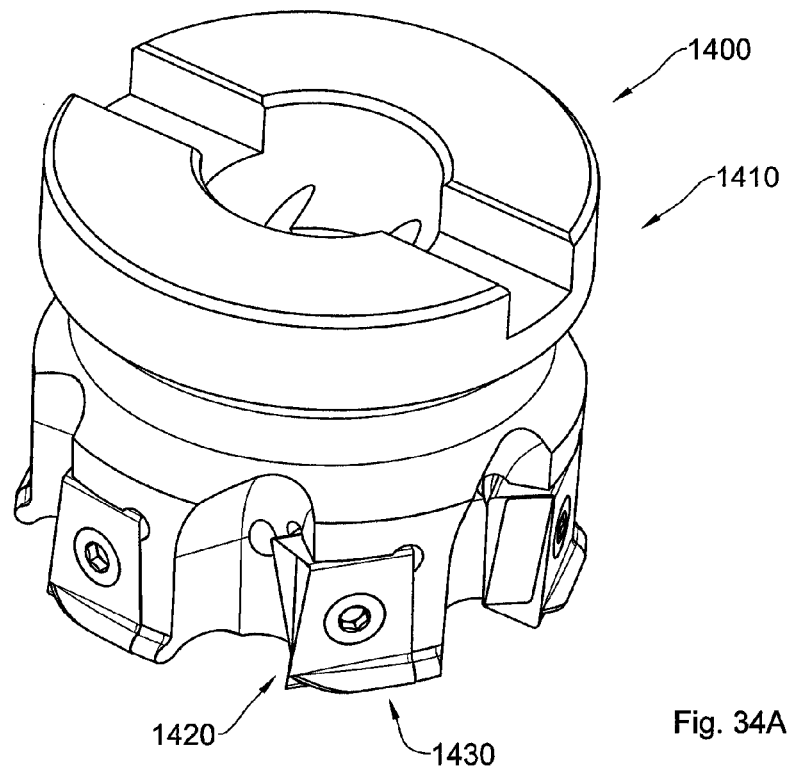
Figure 34B:
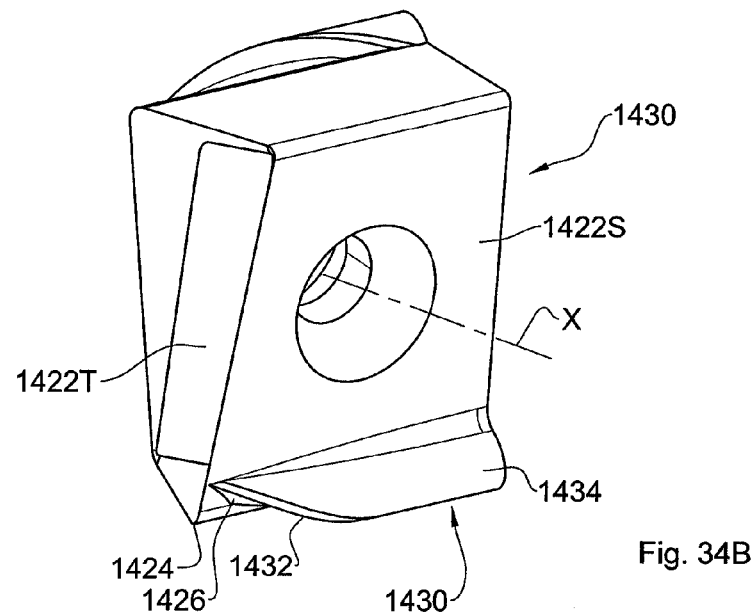
Figure 34C:
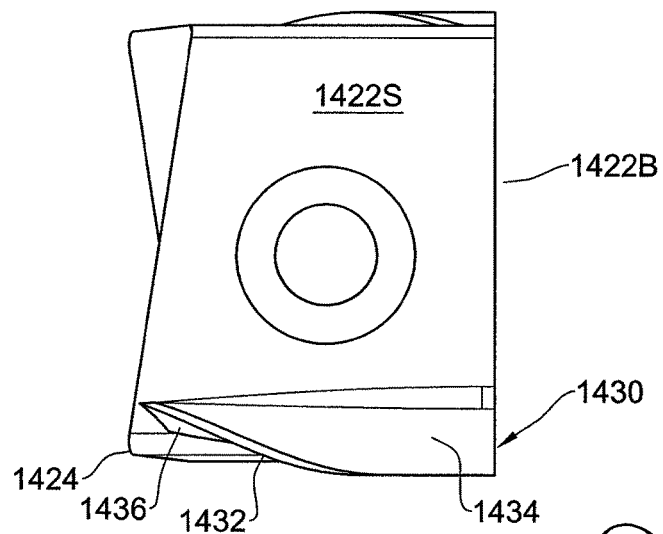
Figure 34D:
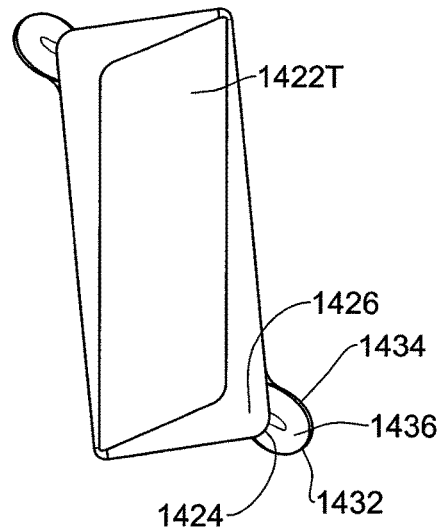
Figure 34E:
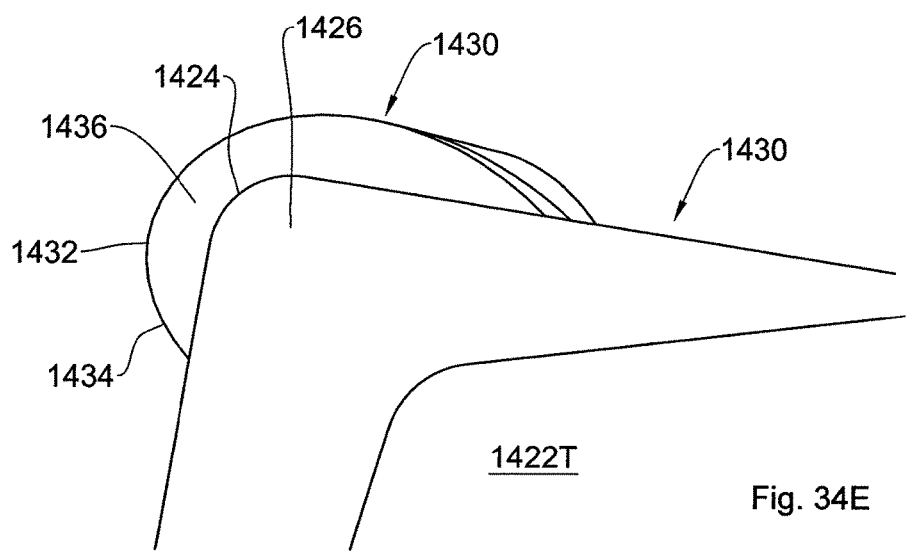
Figure 35A:
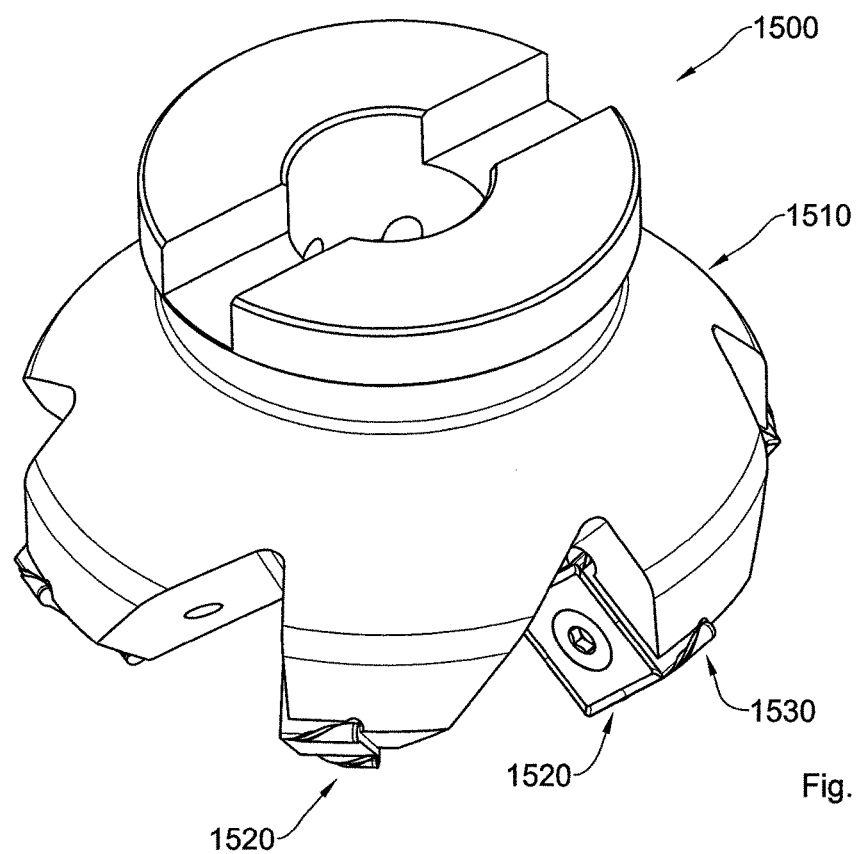
Figure 35B:
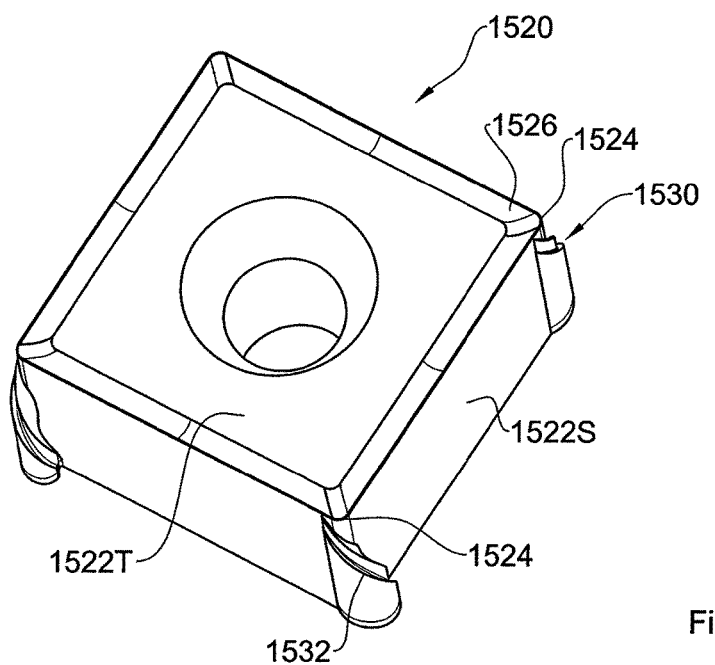
Figure 35C:
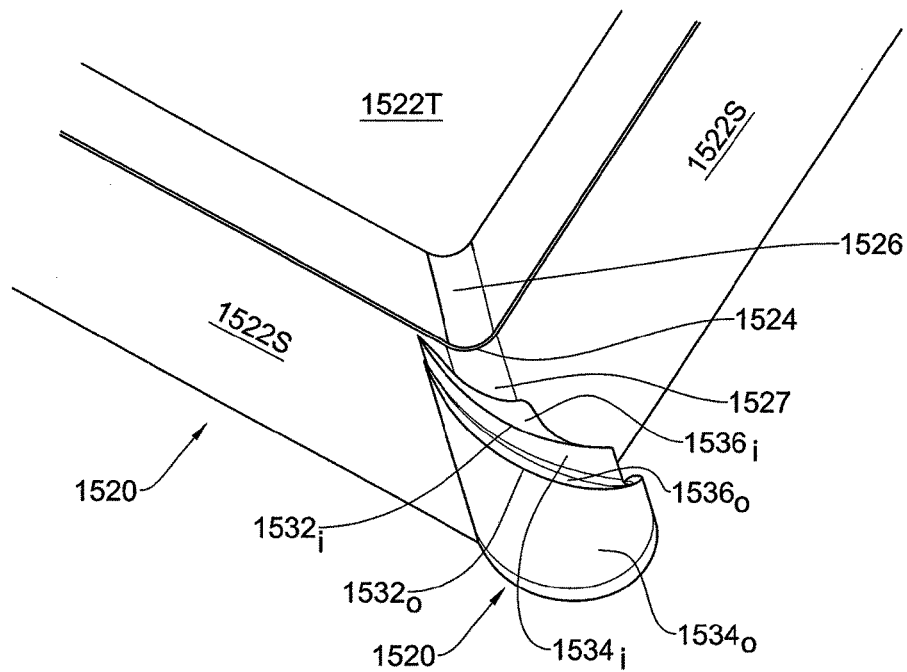
Figure 35D:
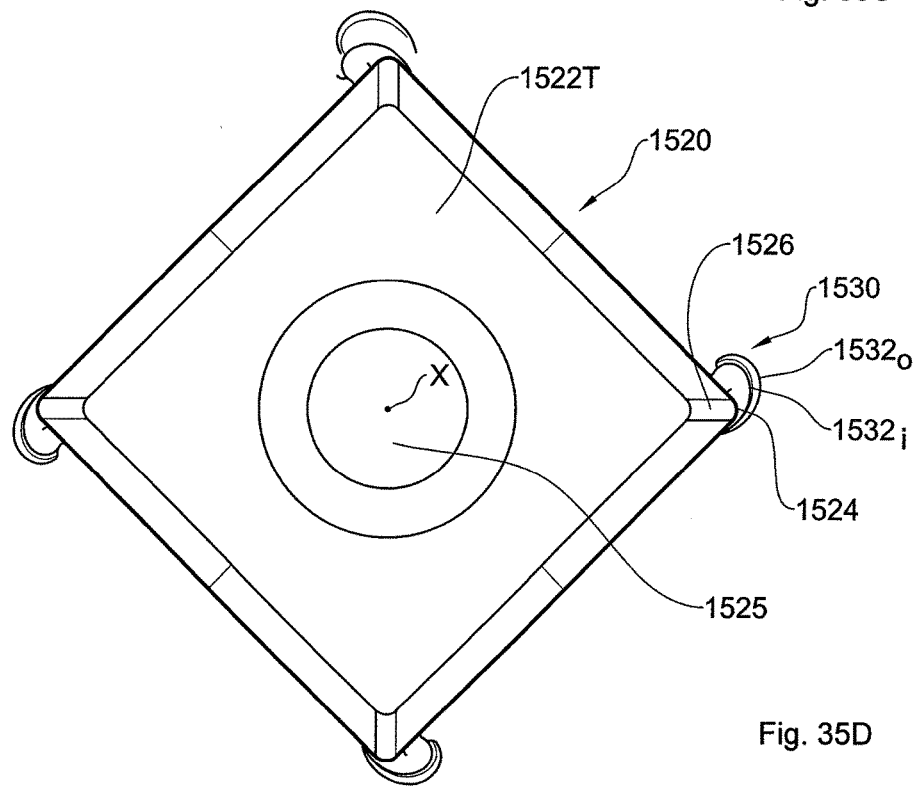
Figure 35E:
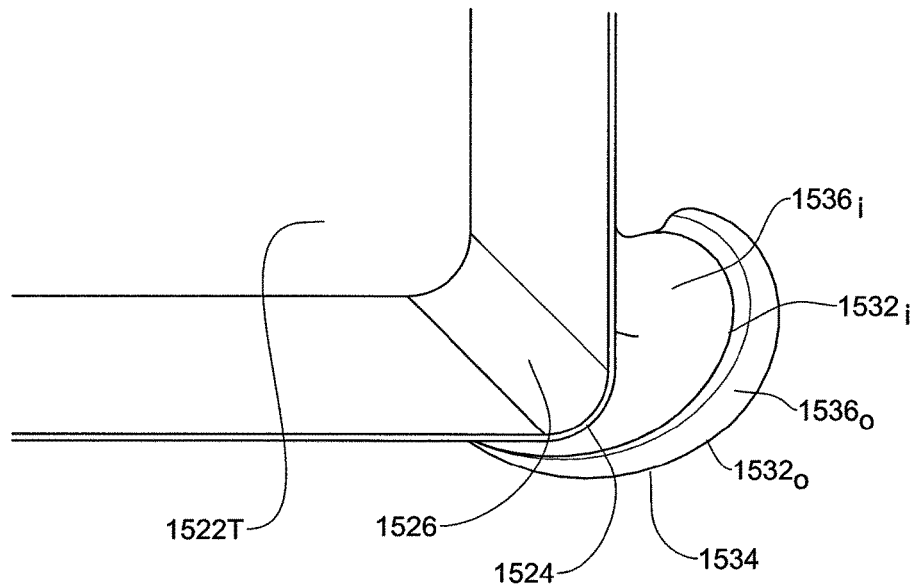
Figure 35F:
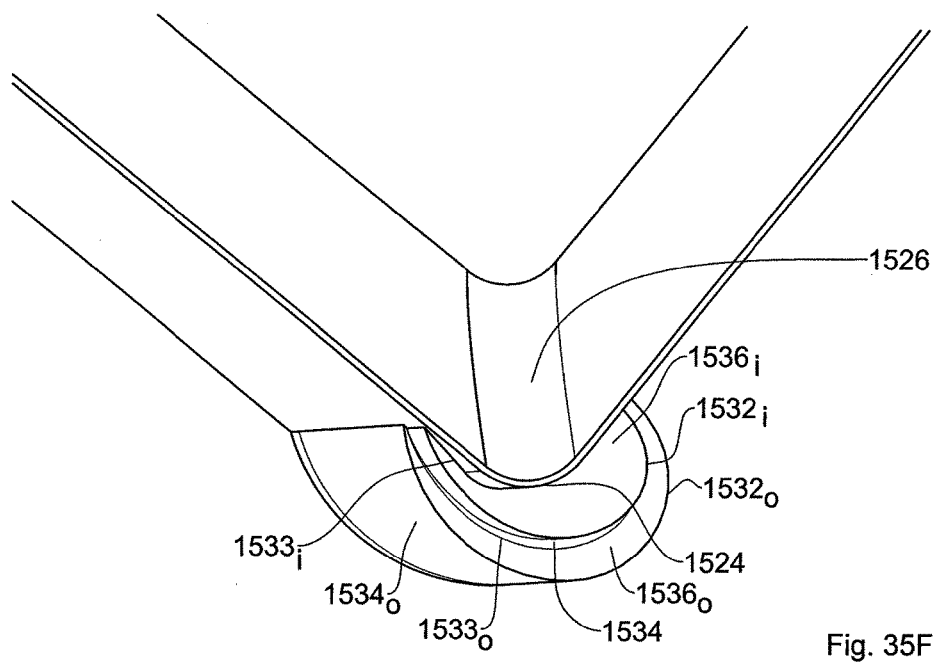
Figure 36A:
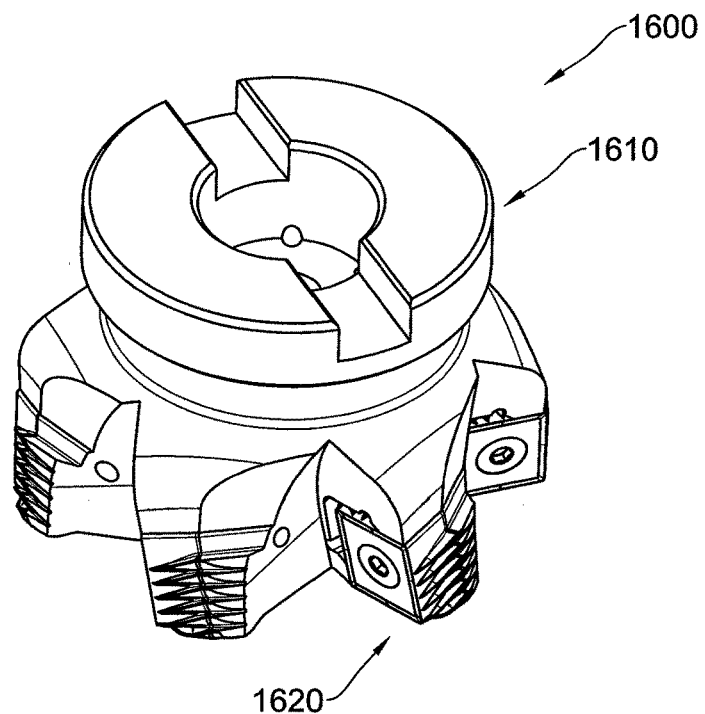
Figure 36B:
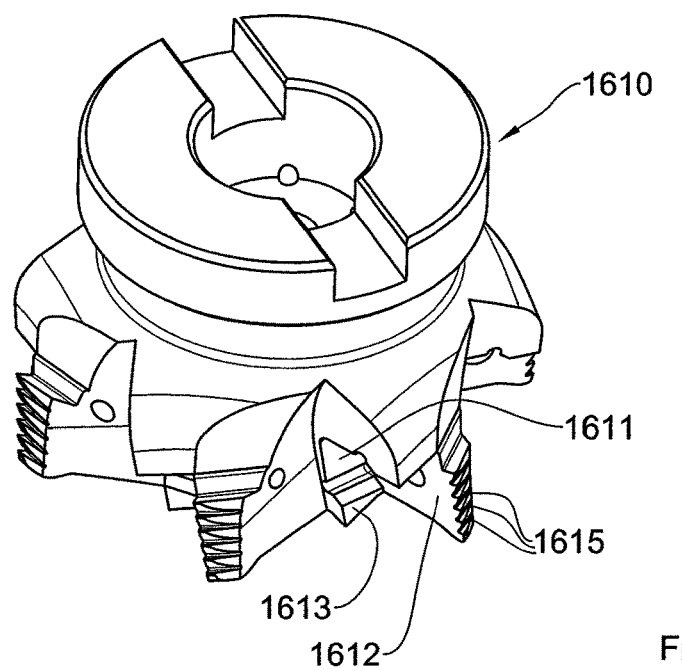
Figure 36C:
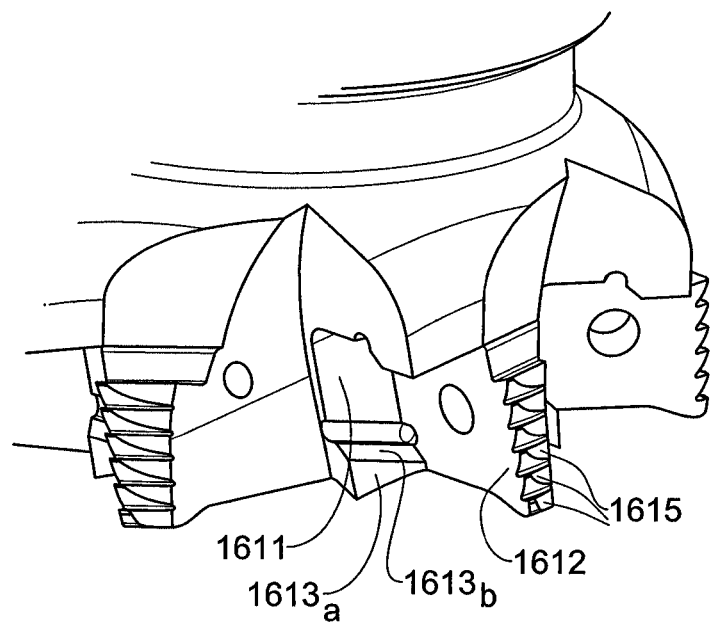
Figure 36D:
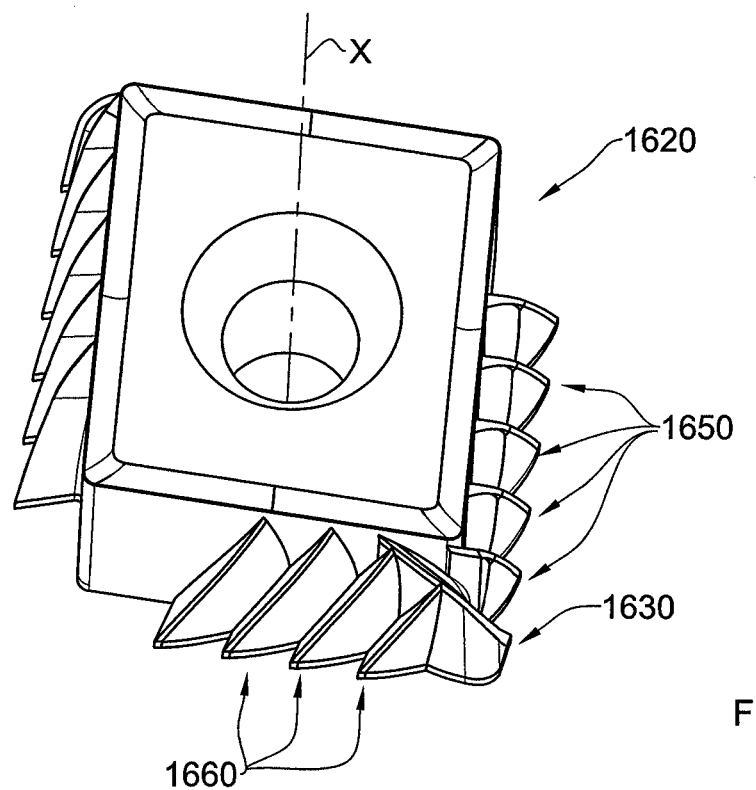
Figure 36E:
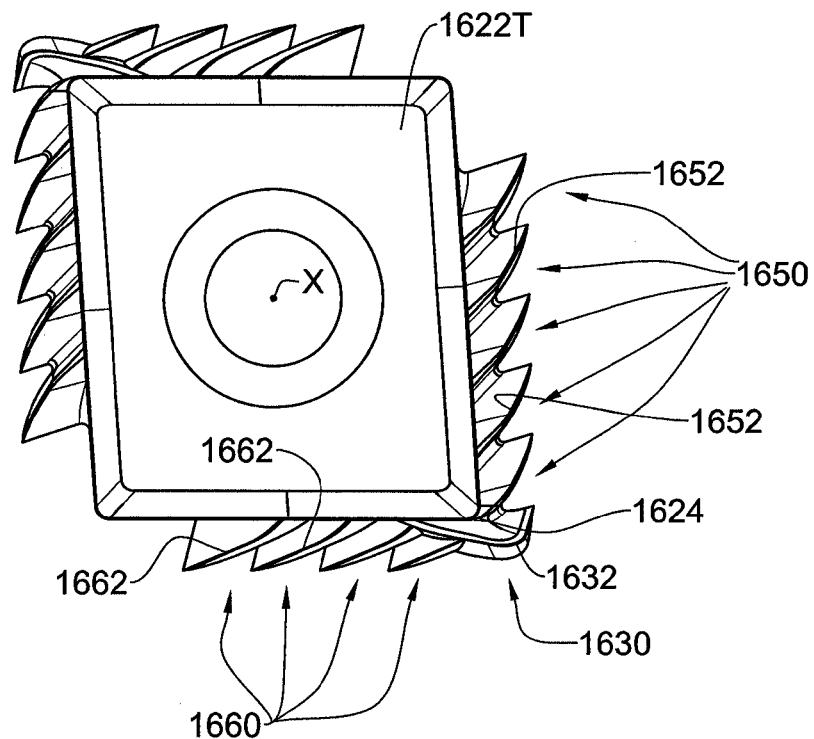
Figure 36F:
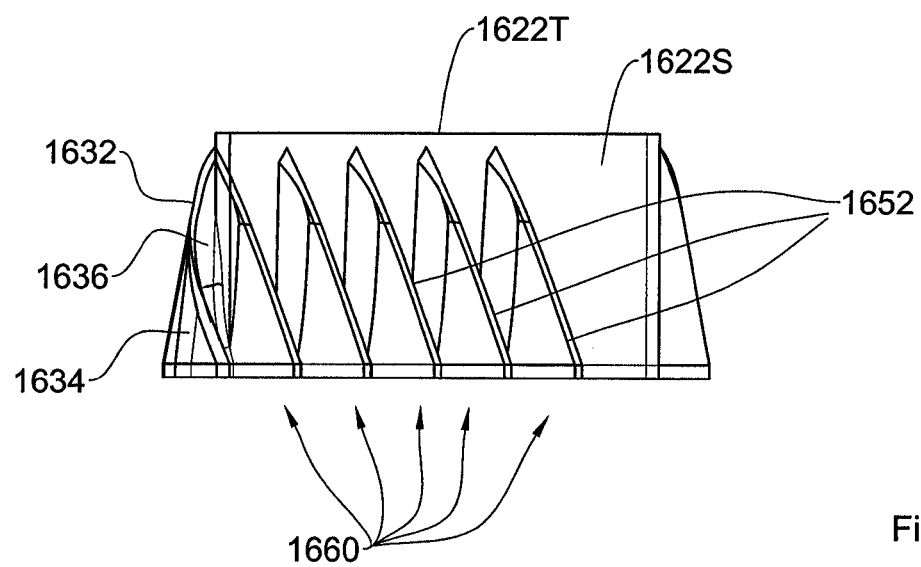
Figure 36G:
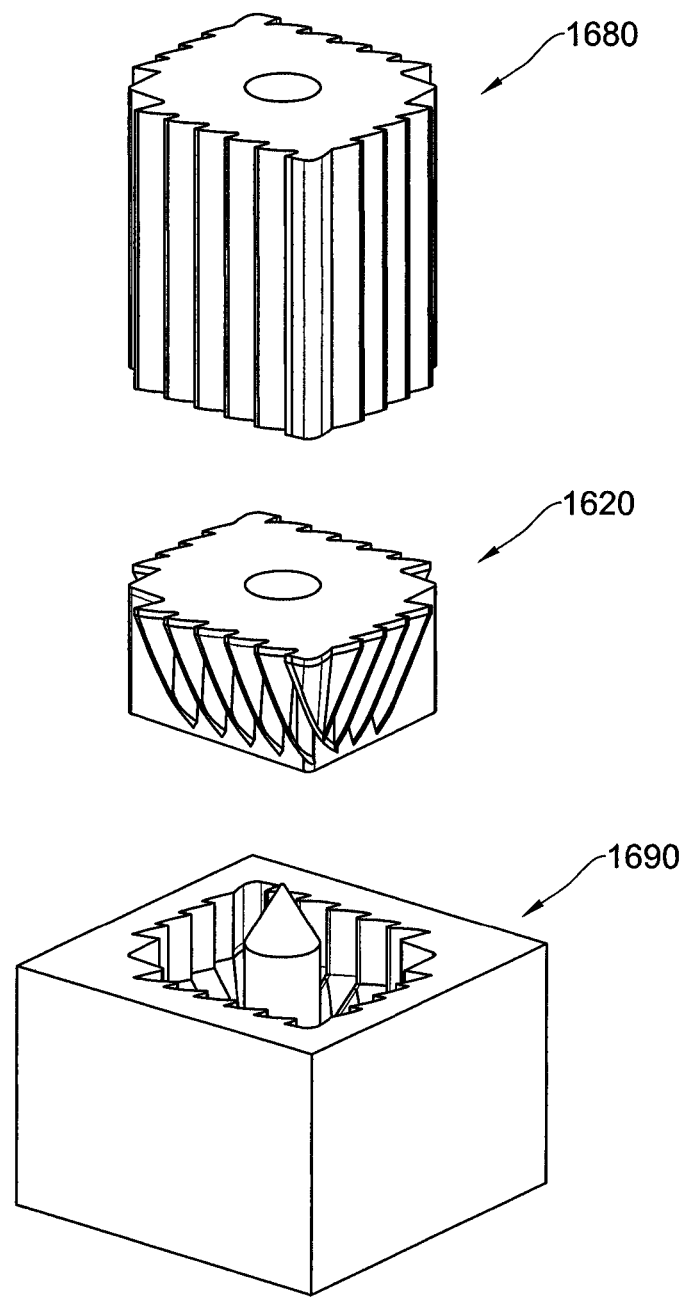
Figure 37A:
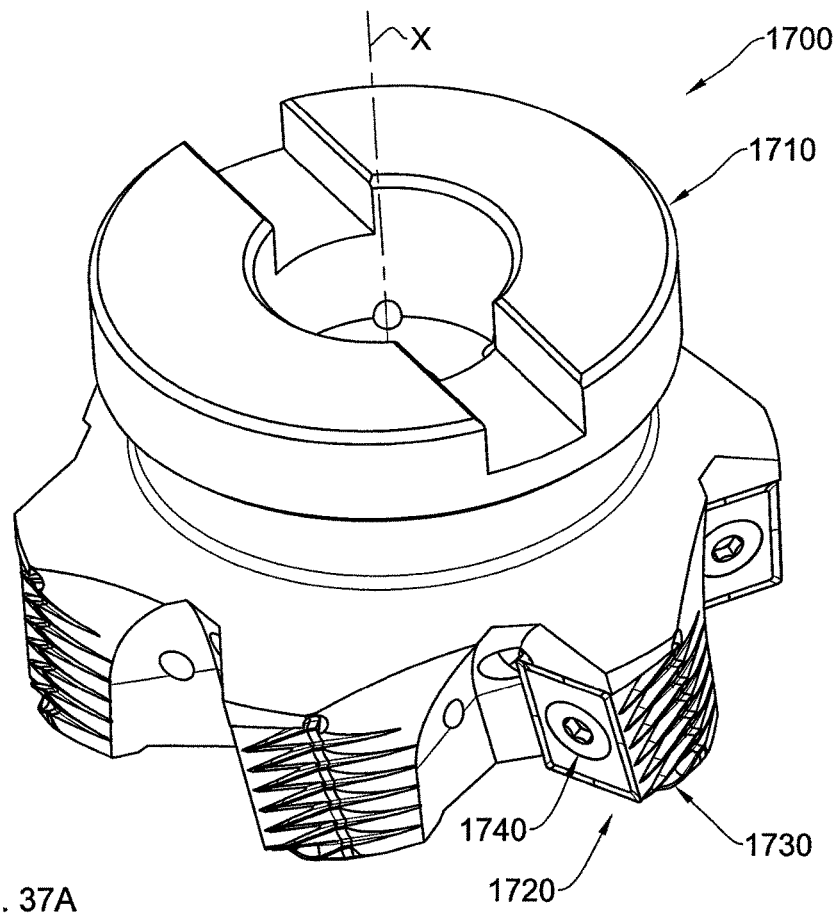
Figure 37B:
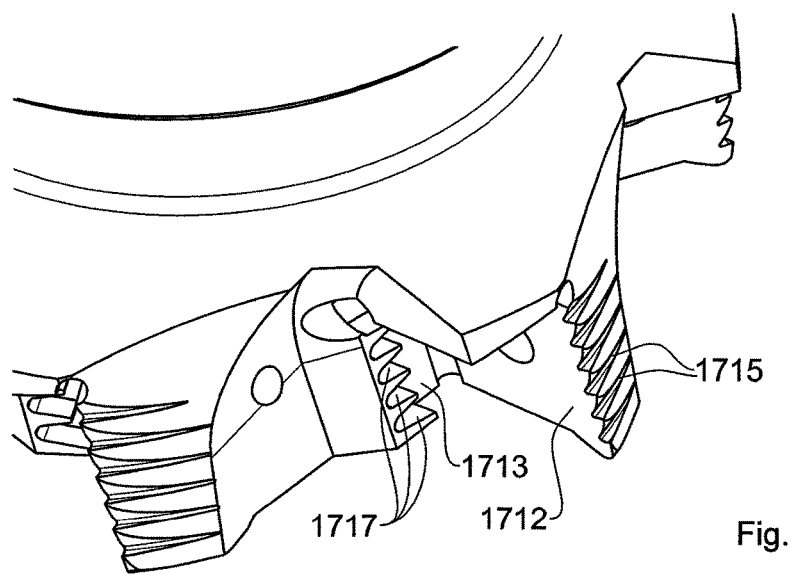
Figure 37C:
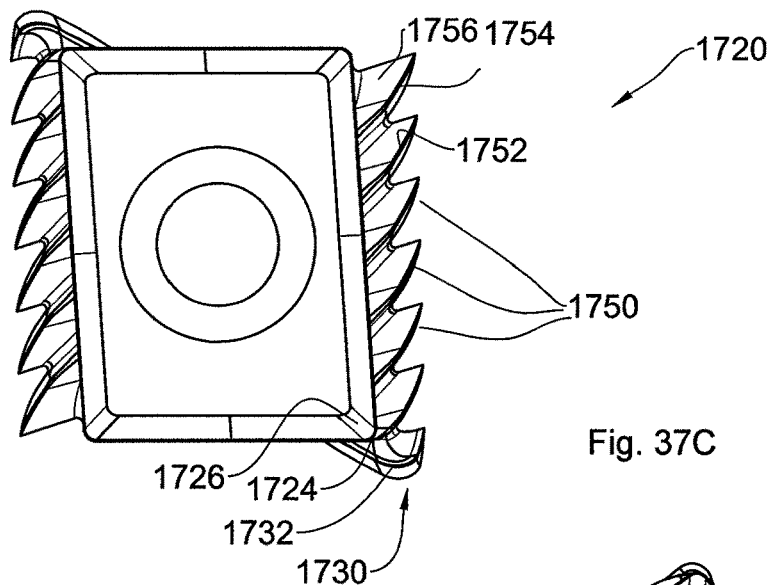
Figure 37D:
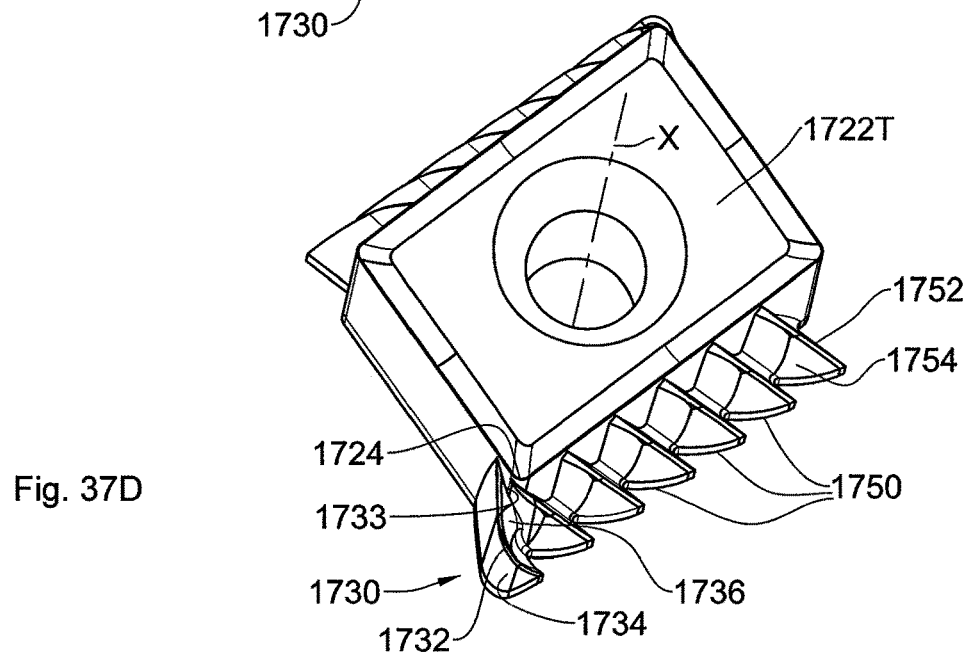
Figure 37E:
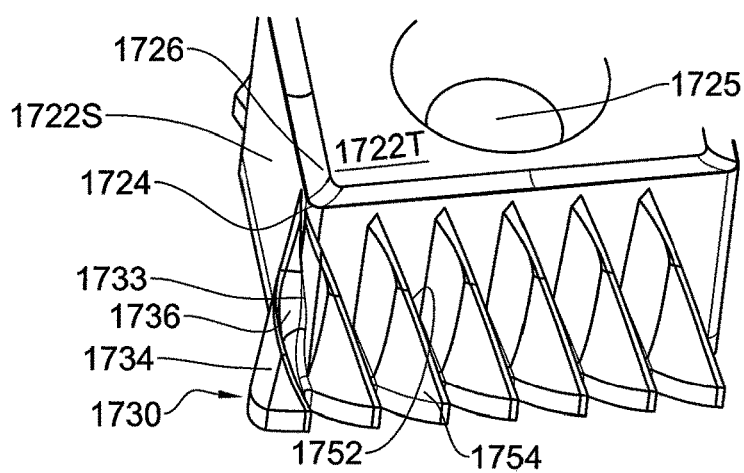
Figure 37F:
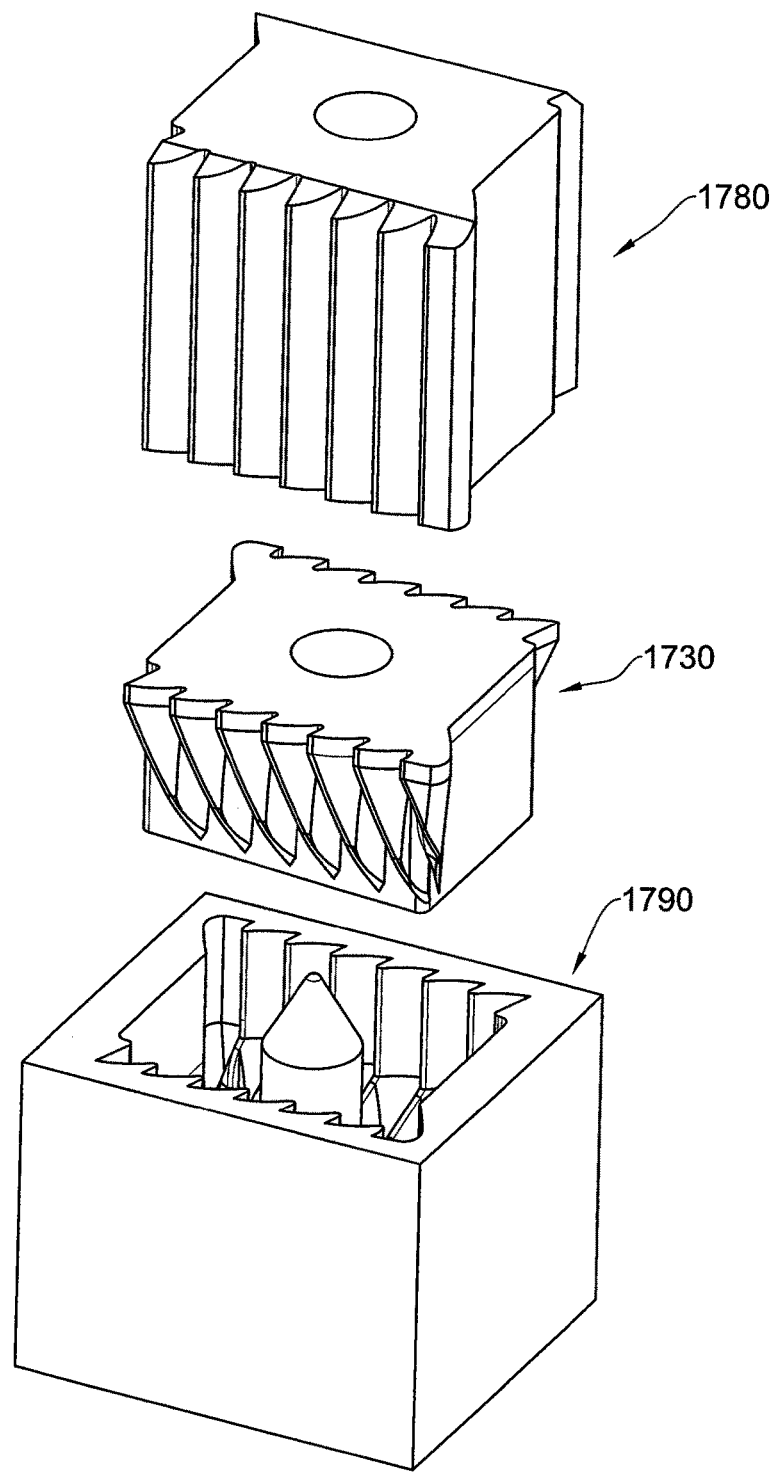
Figure 38A:
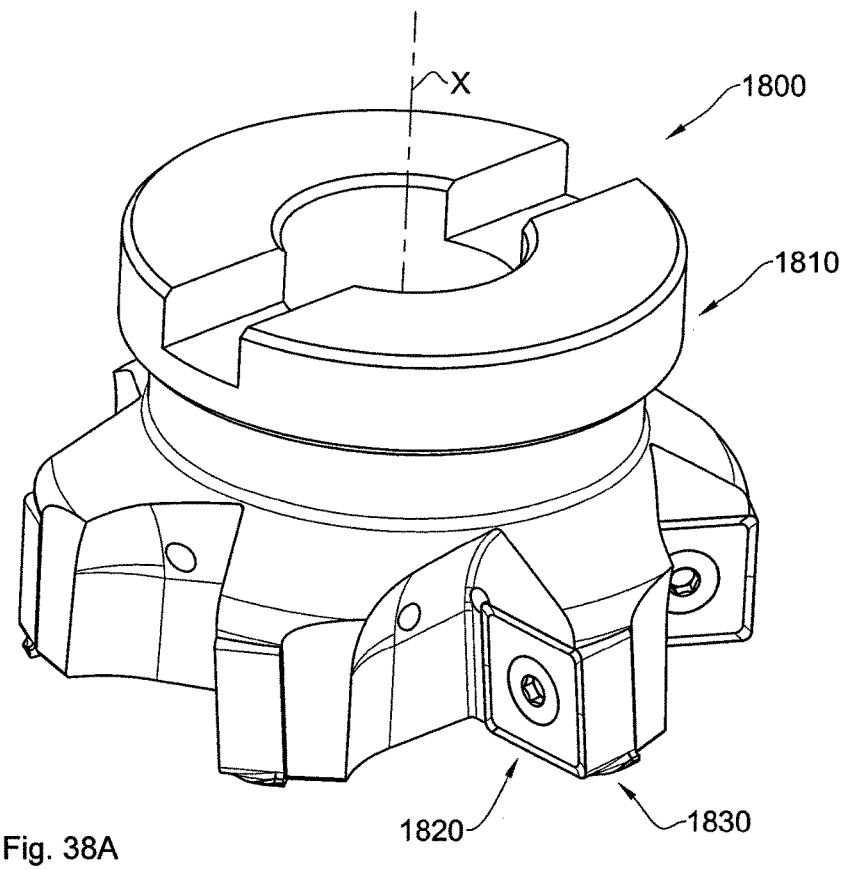
Figure 38B:
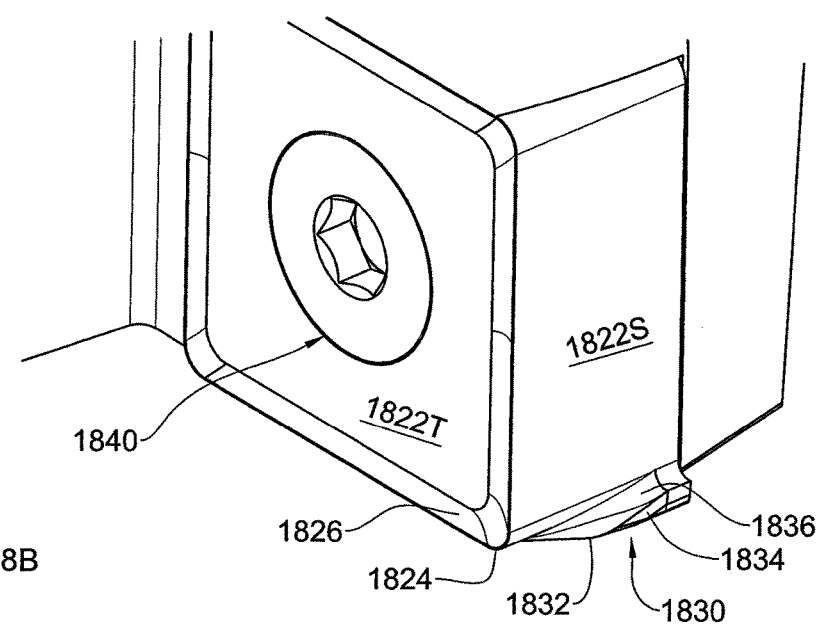
Figure 38C:
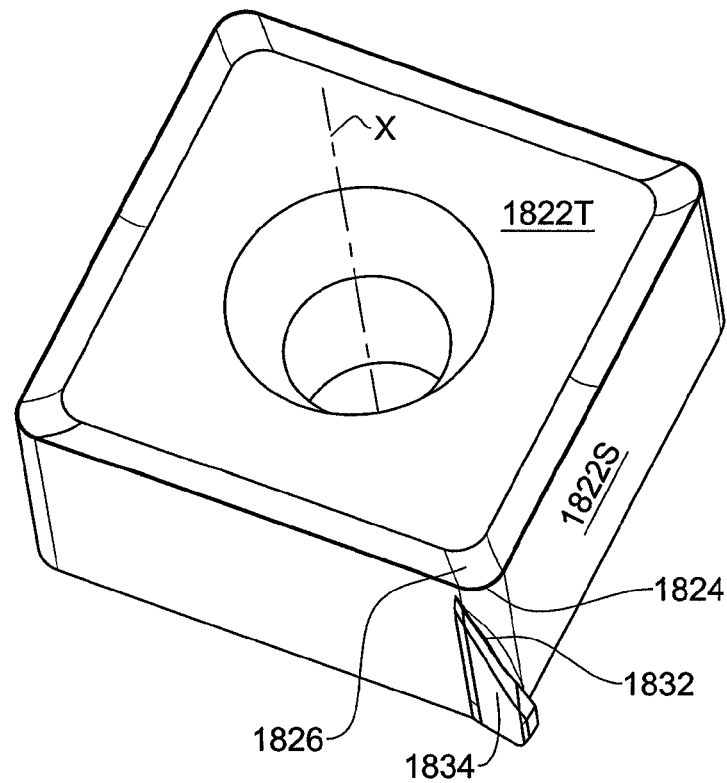
Figure 38D:
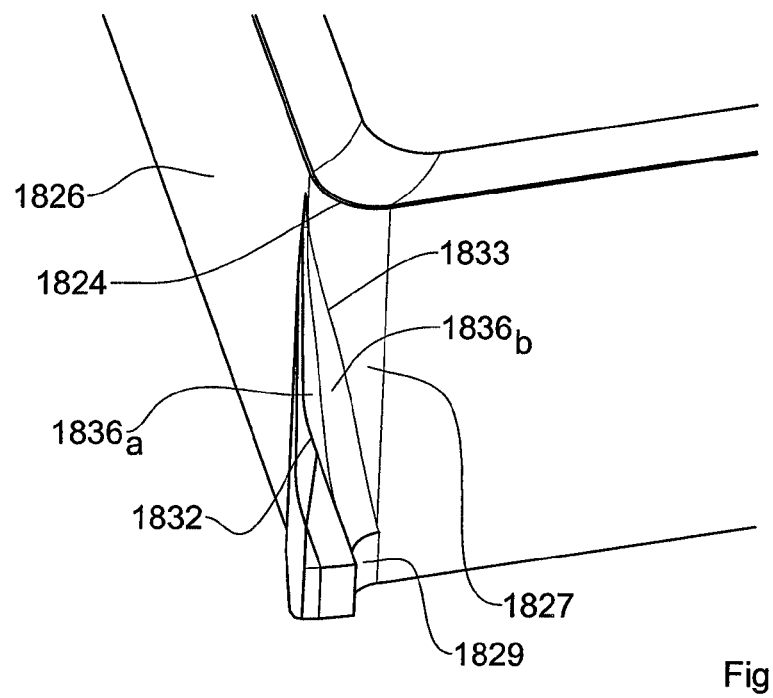
Figure 38E:
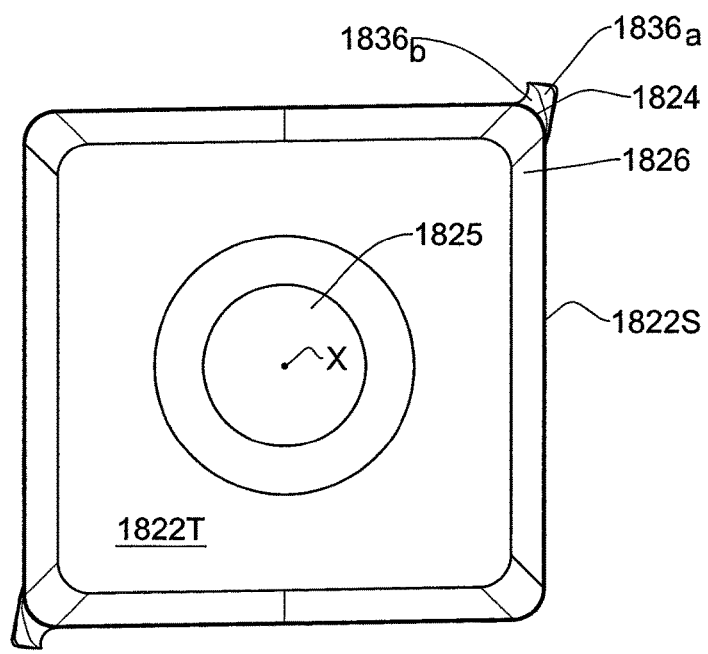
Figure 38F:
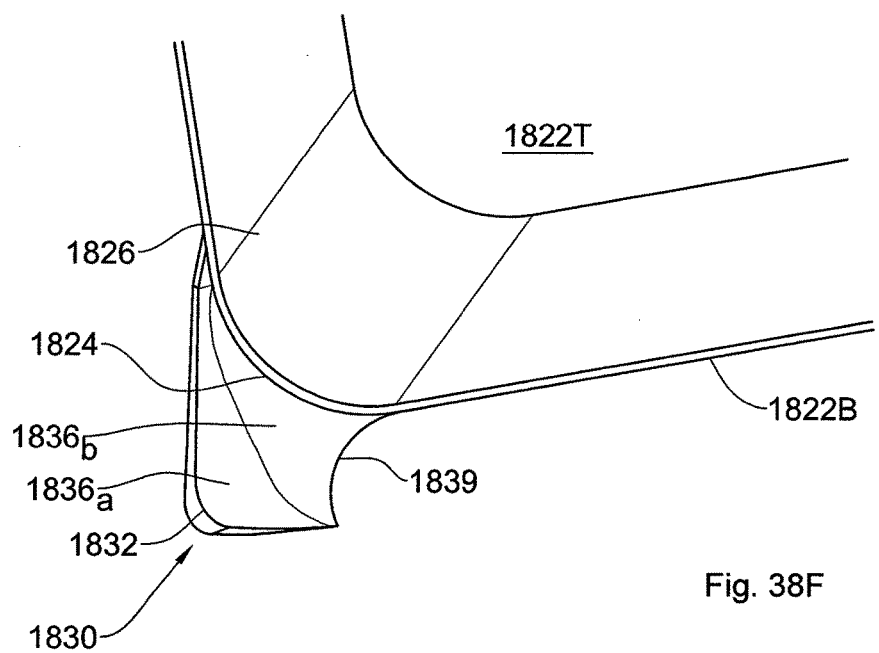
Figure 39:
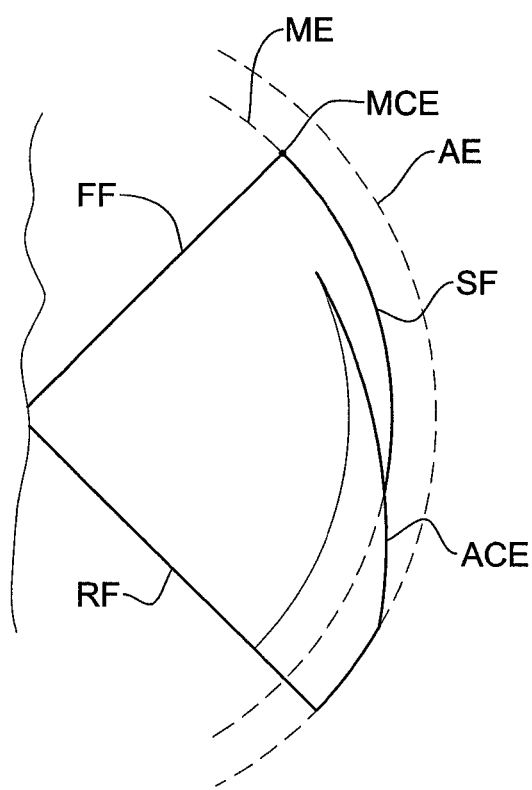
Figures 39A, 39B, 39C, 39D:
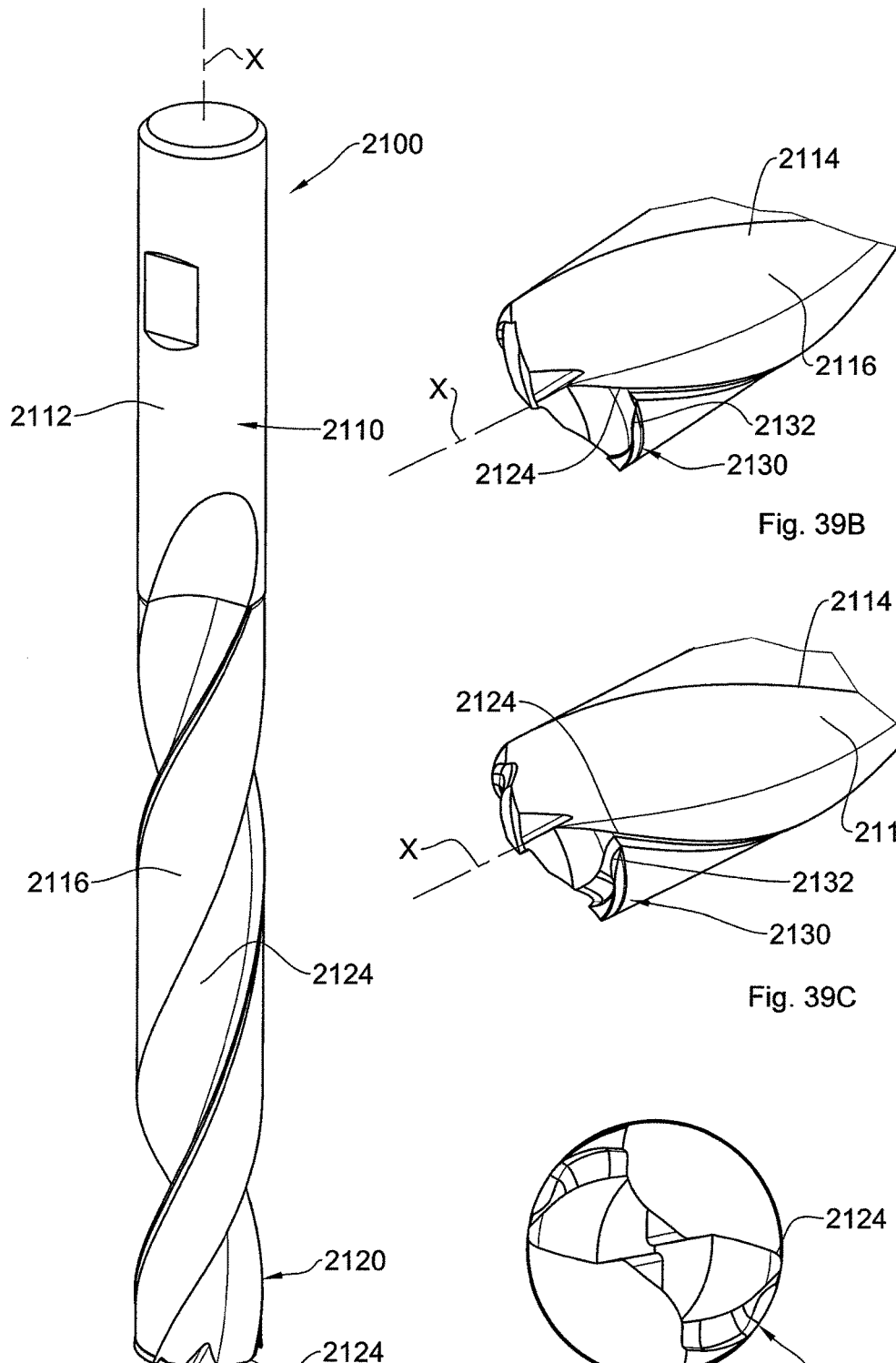
Figure 39E:
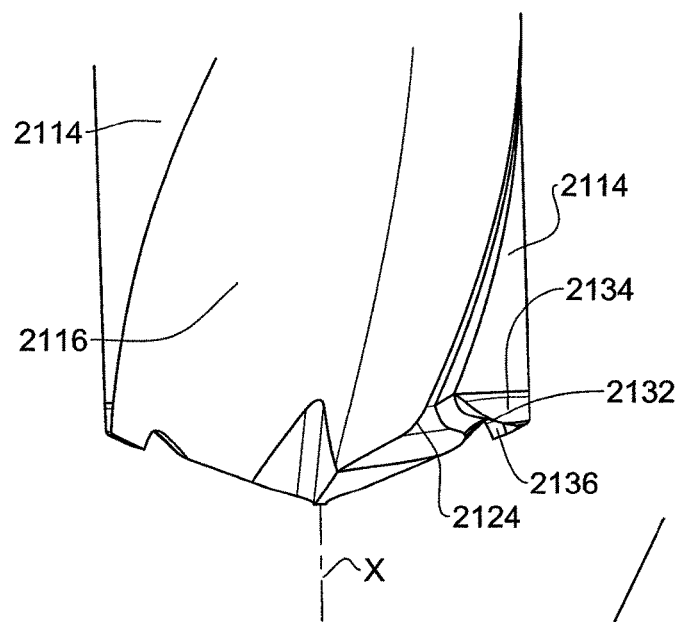
Figure 39F:
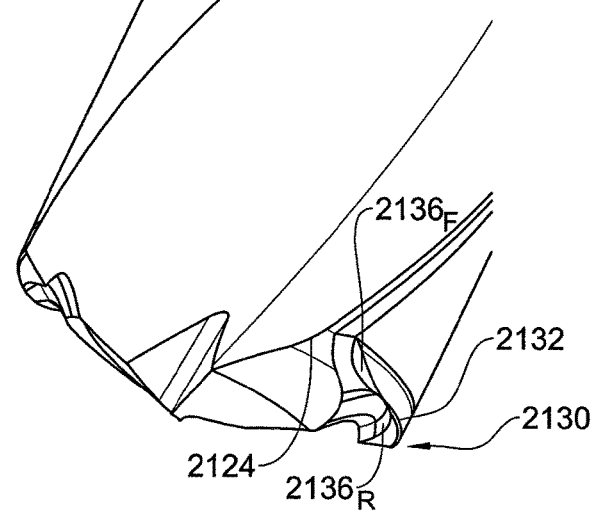
Figure 39G:
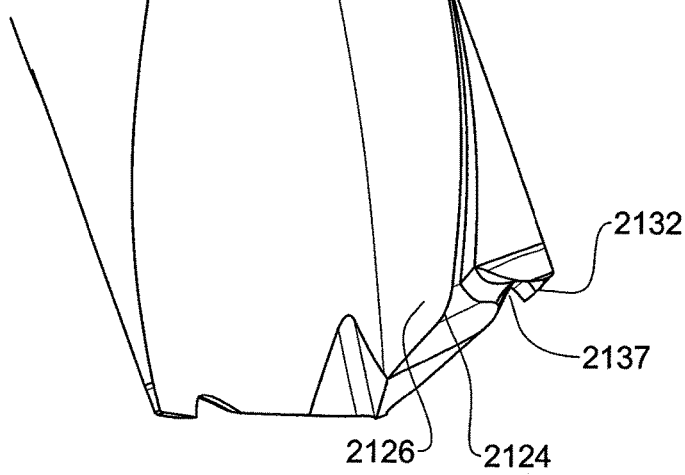
Figure 41A:
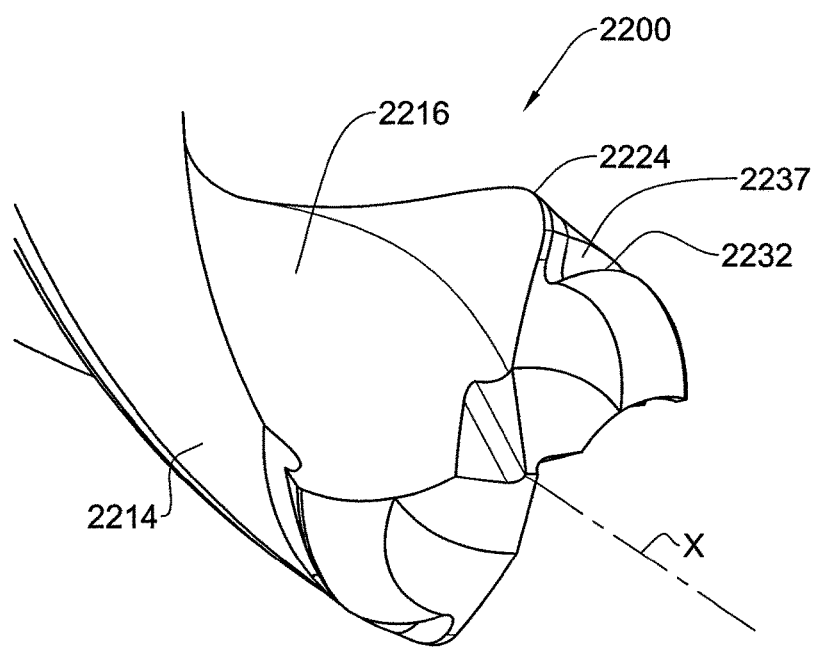
Figure 41B:
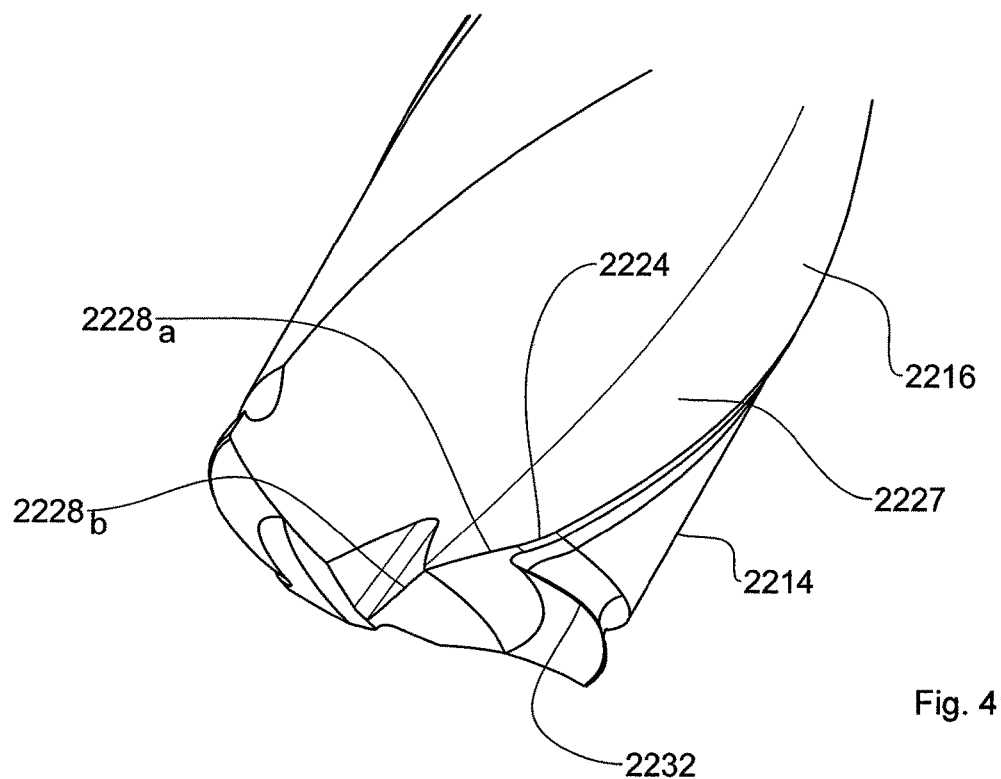
Figure 41C:
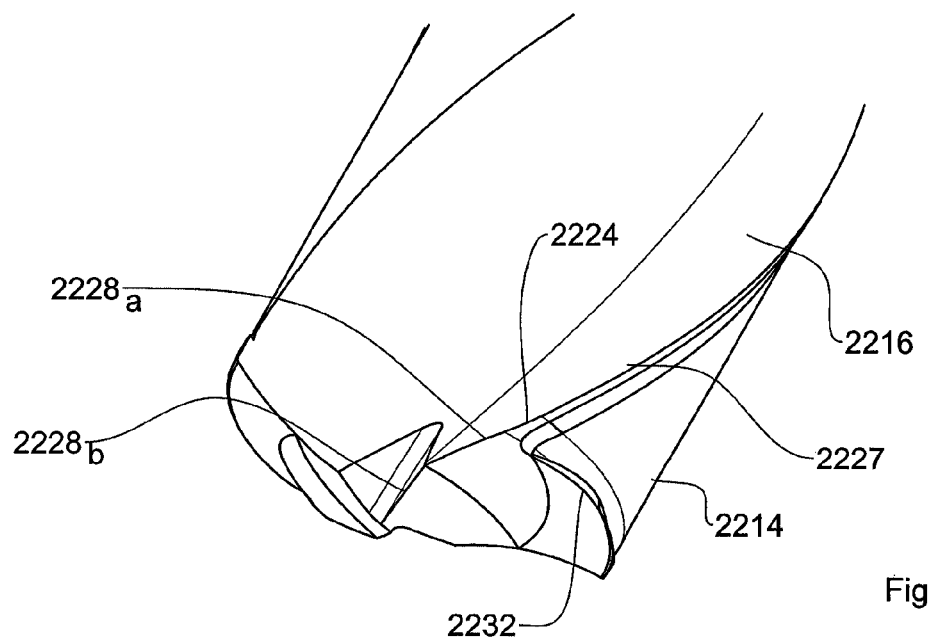
Figure 41D:
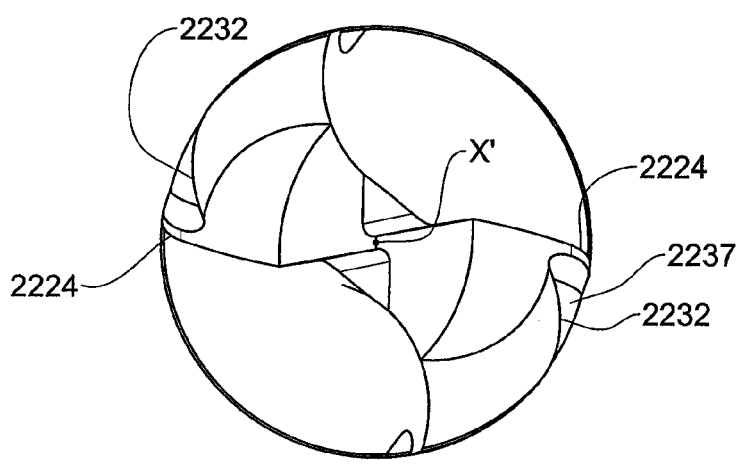
Figure 41E:
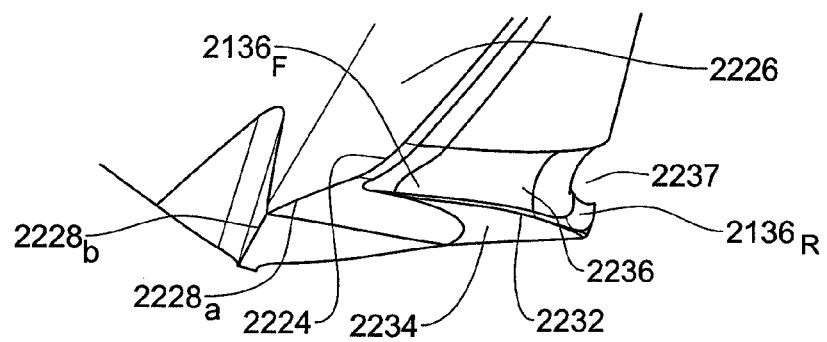

FIGS. 31A and 31B are schematic isometric and exploded isometric views of a milling tool according to the present application;

FIGS. 31C and 31D are schematic isometric and top views of a milling insert used in the milling tool shown in FIGS. 31A and 31B;

FIG. 31E is a schematic front view of the milling insert shown in FIGS. 31C and 31D;

FIG. 31F is a schematic isometric enlarged view of a detail of the milling insert shown in FIGS. 31C and 31D;

FIGS. 31G to 31I are schematic isometric views of the milling insert shown in FIGS. 31C and 31D and its resulting cutting envelope when mounted onto the milling tool of FIGS. 31A and 31B;

FIGS. 32A to 32C are schematic front isometric, front and bottom isometric views of a milling insert according to another example of the present application;

FIG. 32D is a schematic isometric view of a milling tool comprising a plurality of milling inserts as shown in FIGS. 32A to 32C;

FIG. 32E is a schematic isometric view of the milling tool shown in FIG. 32D with one of the milling inserts removed;

FIG. 33A is a schematic isometric view of a milling tool according to another example of the present application;

FIG. 33B is a schematic isometric view of the milling tool shown in FIG. 33A with one of the milling inserts removed;

FIGS. 33C and 33D are schematic front isometric and front views of a milling insert used in the milling tool shown in FIGS. 33A and 33B;

FIG. 33E is a schematic isometric enlarged view of a detail of the milling insert shown in FIGS. 33C and 33D;

FIG. 34A is a schematic isometric view of a milling tool according to still a further example of the present application;

FIGS. 34B to 34D are schematic isometric, front and side views of a milling insert used in the milling tool shown in FIG. 34A;

FIG. 34E is a schematic isometric enlarged view of a detail of the milling insert shown in FIGS. 34B to 34D;

FIG. 35A is a schematic isometric view of a milling tool according to yet another example of the present application;

FIG. 35B is a schematic isometric view of a milling insert used in the milling tool shown in FIG. 35A;

FIG. 35C is a schematic enlarged view of a detail of the milling insert shown in FIG. 35B;

FIG. 35D is a schematic top view of the milling insert shown in FIG. 35B;

FIGS. 35E and 35F are schematic enlarged top and isometric views of details of the milling insert shown in FIG. 35B;

FIG. 36A is a schematic isometric view of a milling tool according to still another example of the present application;

FIG. 36B is a schematic isometric view of the milling insert shown in FIG. 36A with one of the milling inserts being removed;

FIG. 36C is a schematic enlarged view of a detail of the milling tool shown in FIG. 36B;

FIGS. 36D to 36F are schematic isometric, top and side views of a milling insert used in the milling tool shown in FIGS. 36A to 36C;

FIG. 36G is a schematic isometric exploded view of a mold for the manufacture of the milling insert shown in FIGS. 36D to 36F;

FIG. 37A is a schematic isometric view of a milling tool according to yet another example of the present application;

FIG. 37B is a schematic isometric view of the milling insert shown in FIG. 37A with one of the milling inserts being removed;

FIGS. 37C and 37D are schematic top and isometric views of a milling insert used in the milling tool shown in FIGS. 37A and 37B;

FIG. 37E is a schematic enlarged isometric view of a detail of the milling insert shown in FIGS. 37C and 37D;

FIG. 37F is a schematic isometric exploded view of a mold for the manufacture of the milling insert shown in FIGS. 37C to 37E;

FIG. 38A is a schematic isometric view of a milling tool according to another example of the present application;

FIG. 38B is a schematic enlarged isometric view of a milling insert mounted onto the milling tool shown in FIG. 38A;

FIG. 38C is a schematic isometric view of the milling insert shown in FIG. 38B;

FIG. 38D is a schematic enlarged isometric view of a detail of the milling insert shown in FIG. 38C;

FIG. 38E is a schematic top view of the milling insert shown in FIG. 38C;

FIG. 38F is a schematic enlarged view of a detail of the milling insert shown in FIG. 38E;

FIG. 39 is a schematic side view of a drilling insert according to the present application;

FIG. 39A is a schematic isometric view of a drilling tool according to the present application;

FIG. 39B is a schematic front isometric enlarged view of a tip of the drilling tool shown in FIG. 39A prior to its final stage of manufacture;

FIG. 39C is a schematic isometric view of the drilling tool shown in FIG. 39B;

FIGS. 39D and 39E are schematic bottom and side views of the drilling tool shown in FIG. 39C;

FIGS. 39F to 39G are schematic enlarged left and right isometric views of the drilling tool shown in FIGS. 39A to 39E;

FIGS. 40A to 40I are schematic front views of the drilling tool shown in FIGS. 27A to 27G during various stages of a drilling operation within a workpiece;

FIG. 41A is a schematic left isometric view of a portion of a drilling tool according to another example of the present application;

FIG. 41B is a schematic right isometric view of the drilling tool shown in FIG. 41A after a final stage of manufacture thereof;

FIG. 41C is a schematic right isometric view of the drilling tool shown in FIG. 41B prior to its final stage of manufacture;

FIGS. 41D and 41E are schematic bottom and front views of the drilling tool shown in FIGS. 41A to 41C; and FIGS. 42A to 42H are schematic front views of the drilling tool shown in FIGS. 29A to 29E during various stages of a drilling operation within a workpiece.

Figure 1A:
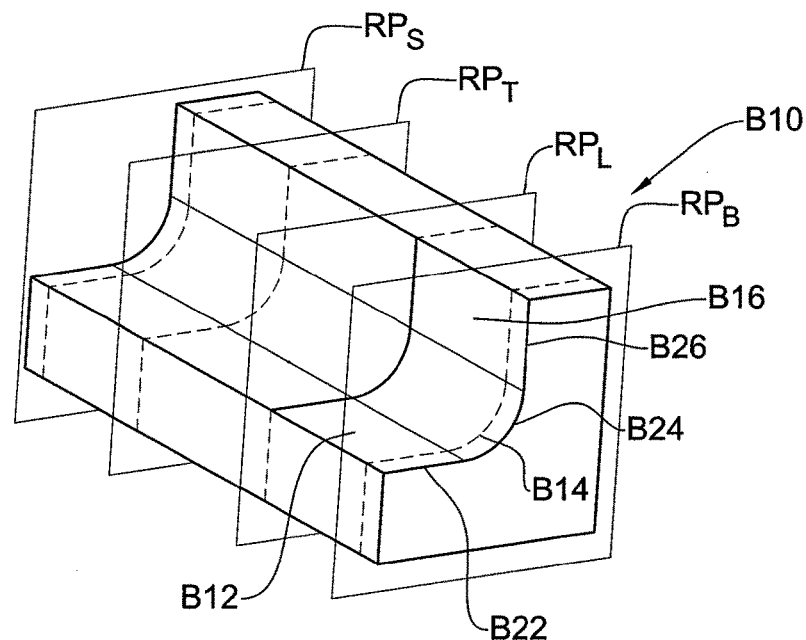
FIGS. 1A to 1F are schematic isometric view of an end profile during consecutive stages of designing the geometry of a cutting curve according to the subject matter of the present application.
Figure 43A:
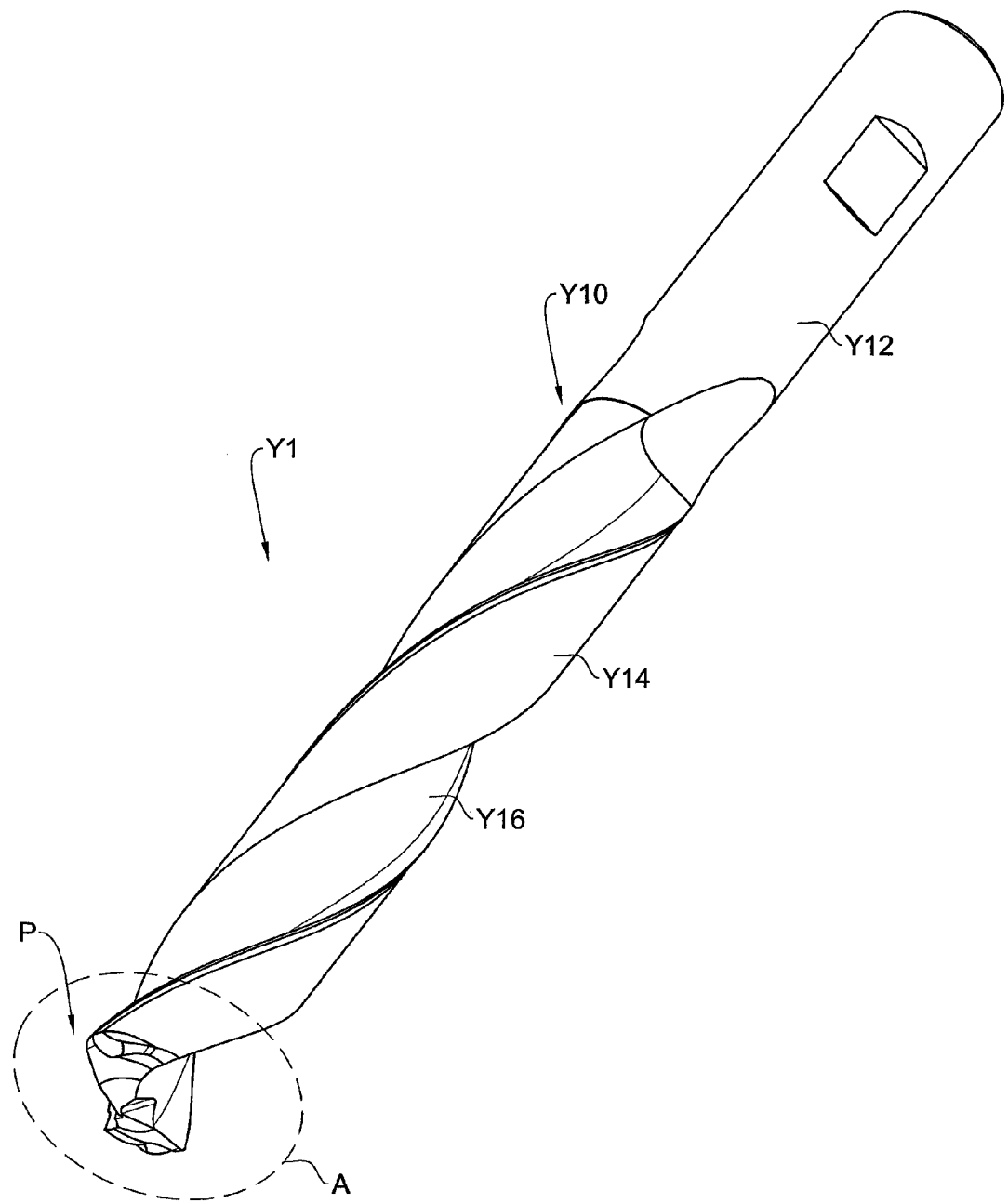
Figure 43B:
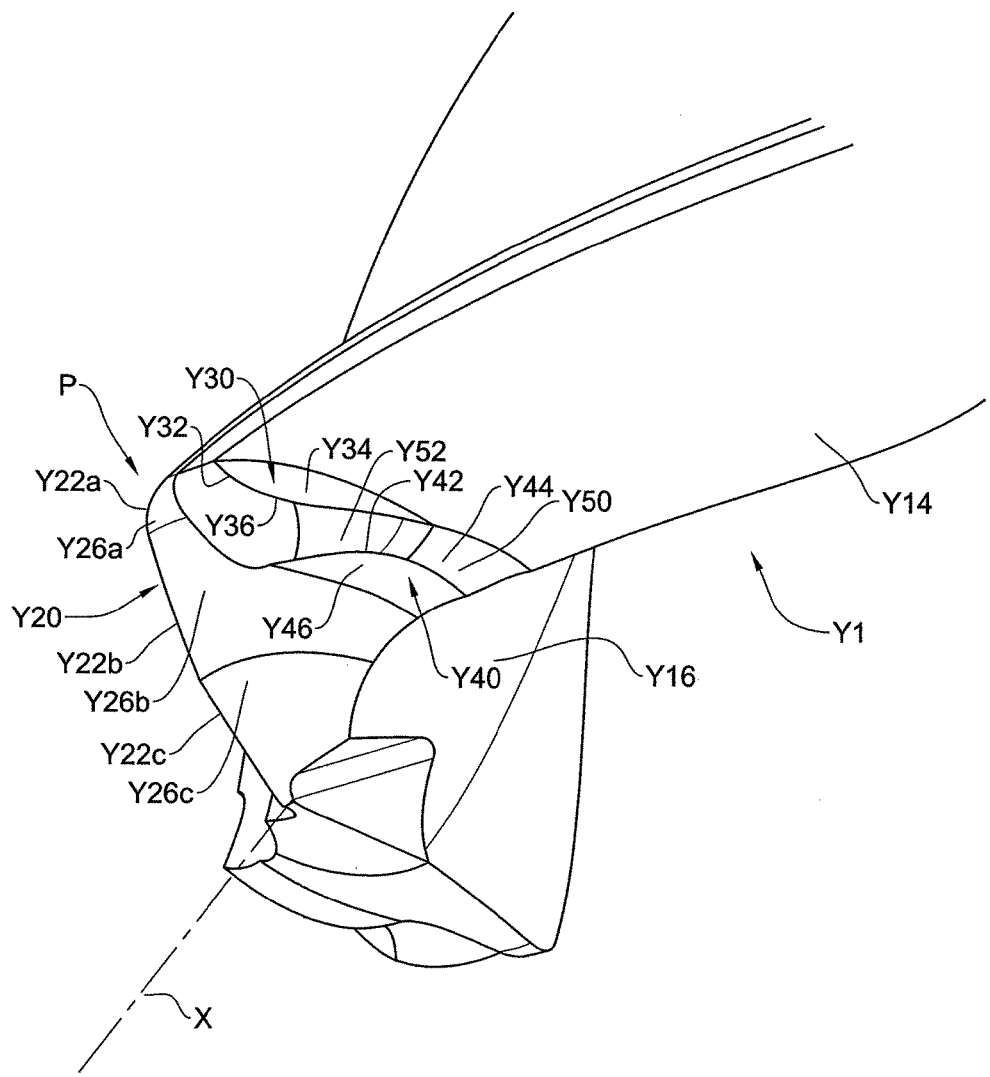
Figure 43C:
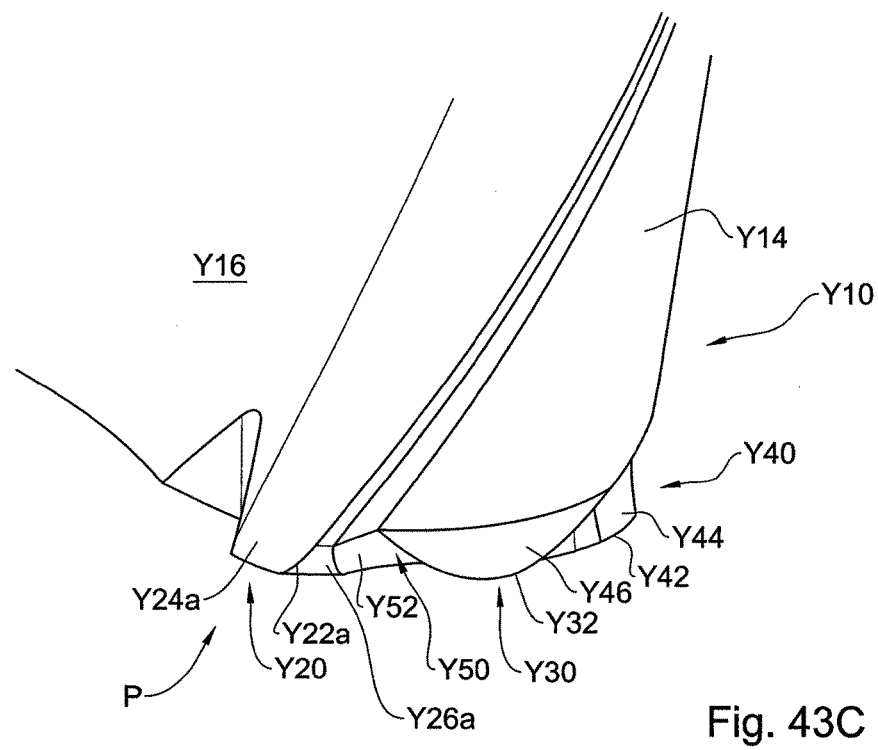
Figure 43D:
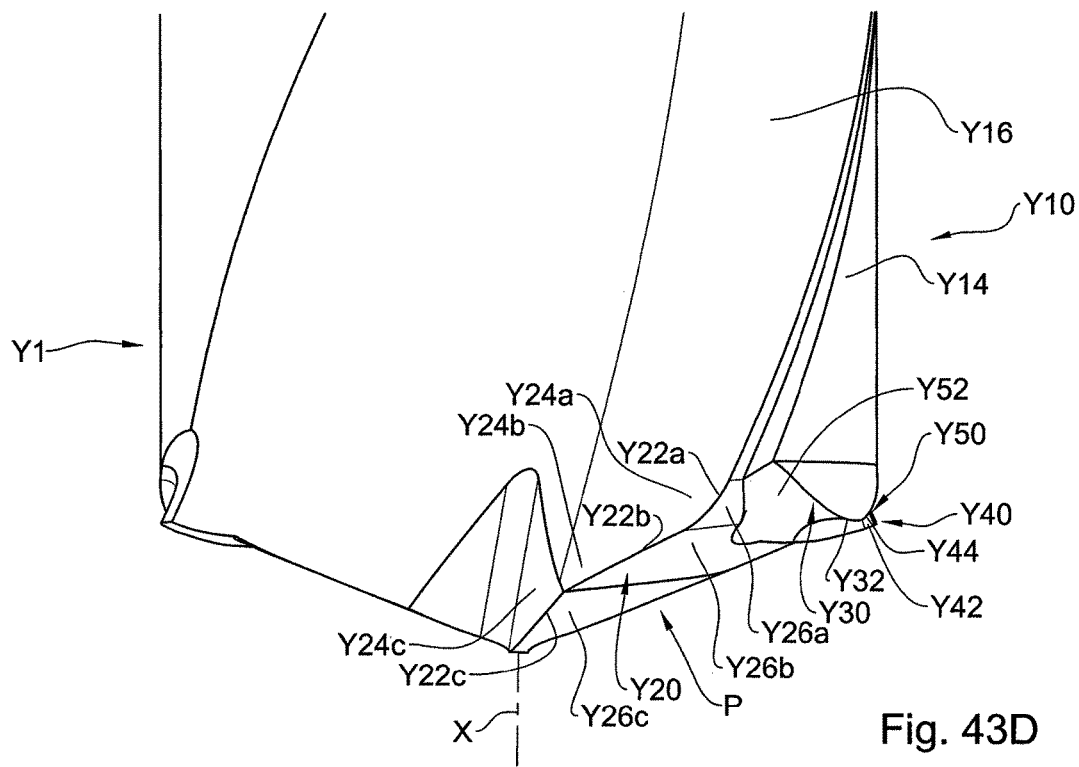
Figure 45A:
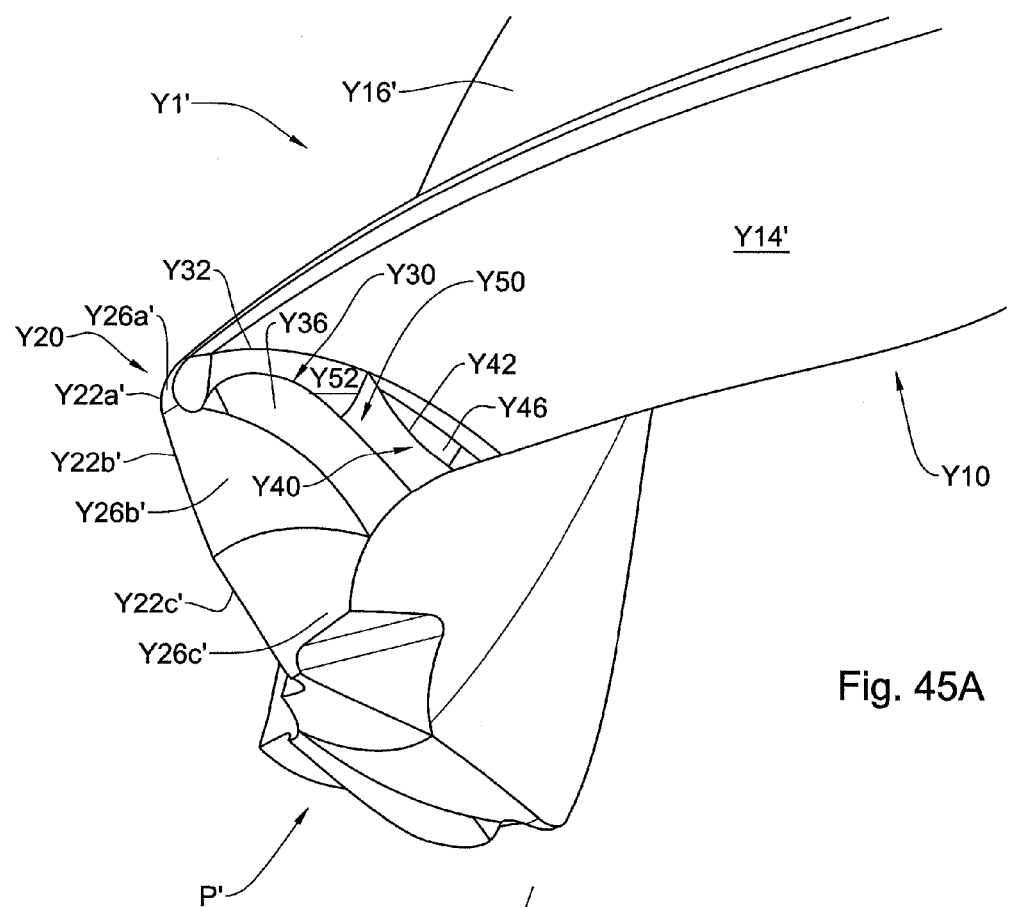
Figure 45B:
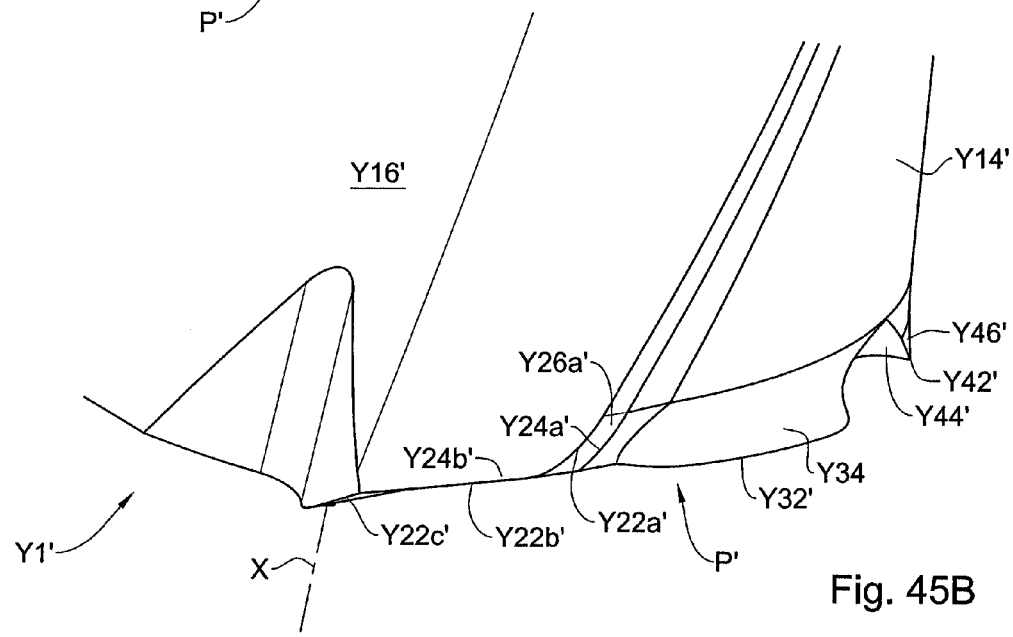
Figure 45C:
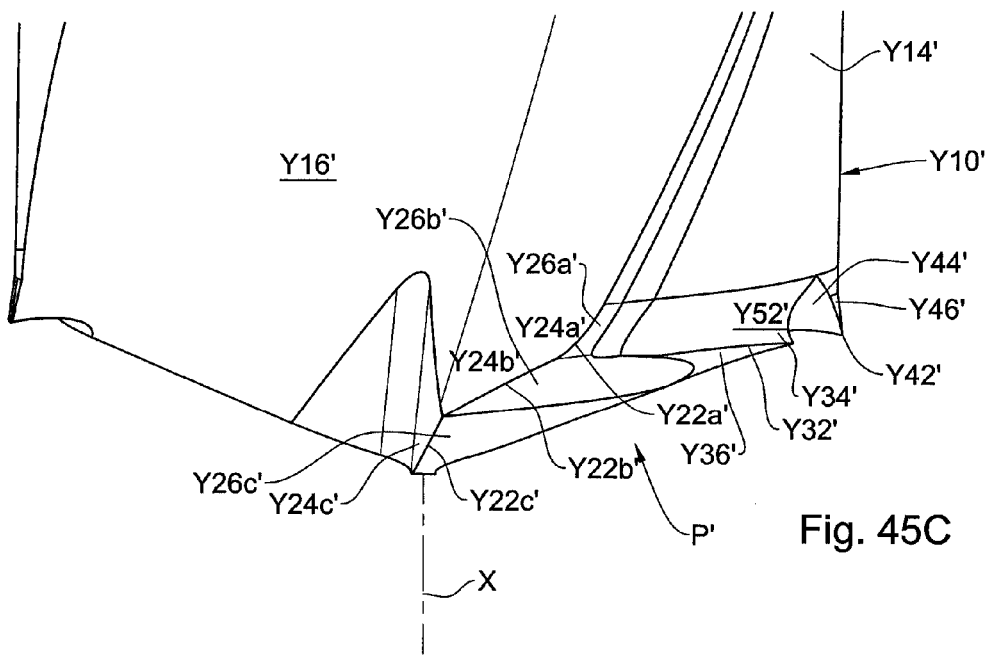
Figure 45D:
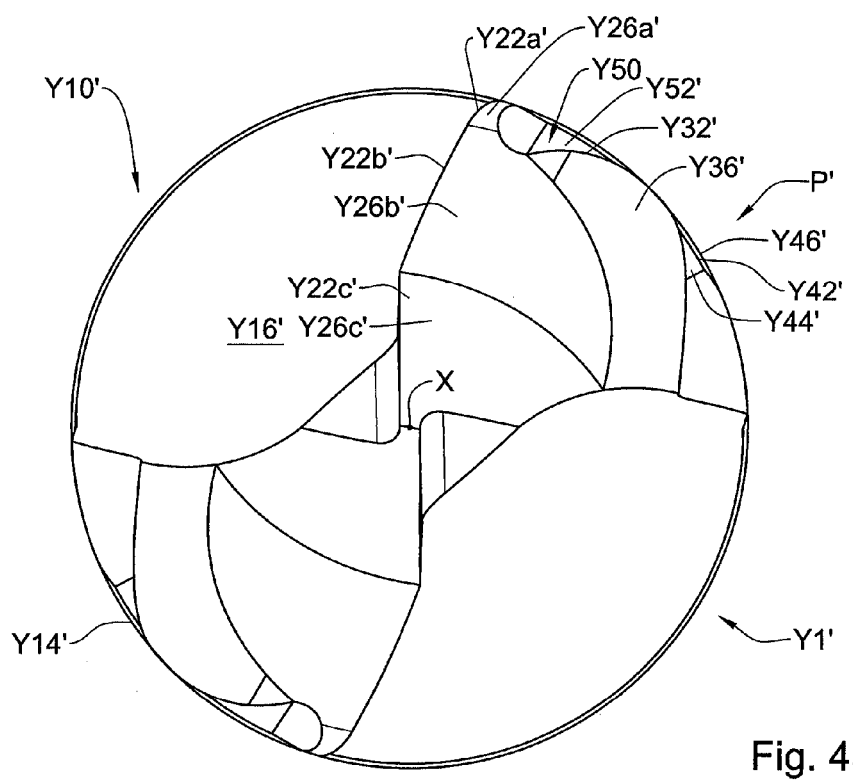
Figure 46A:
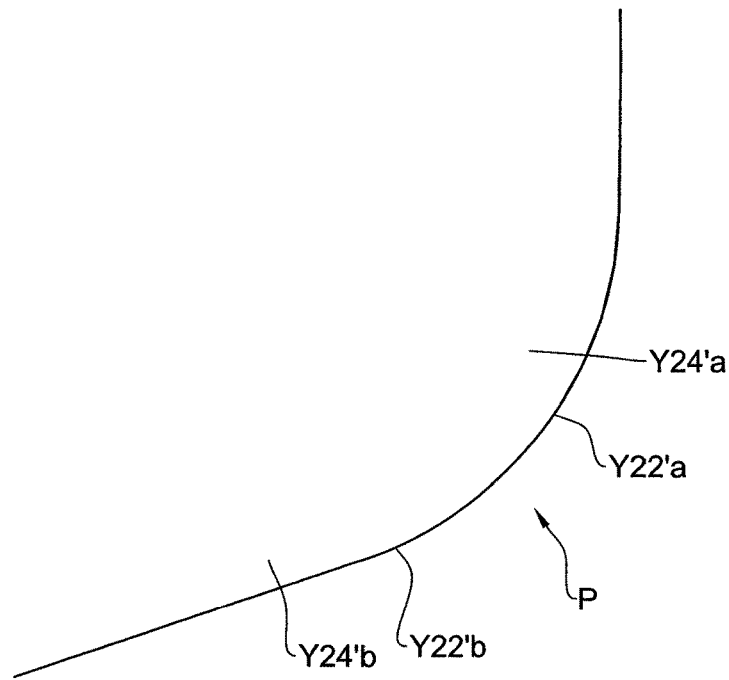
Figure 46B:
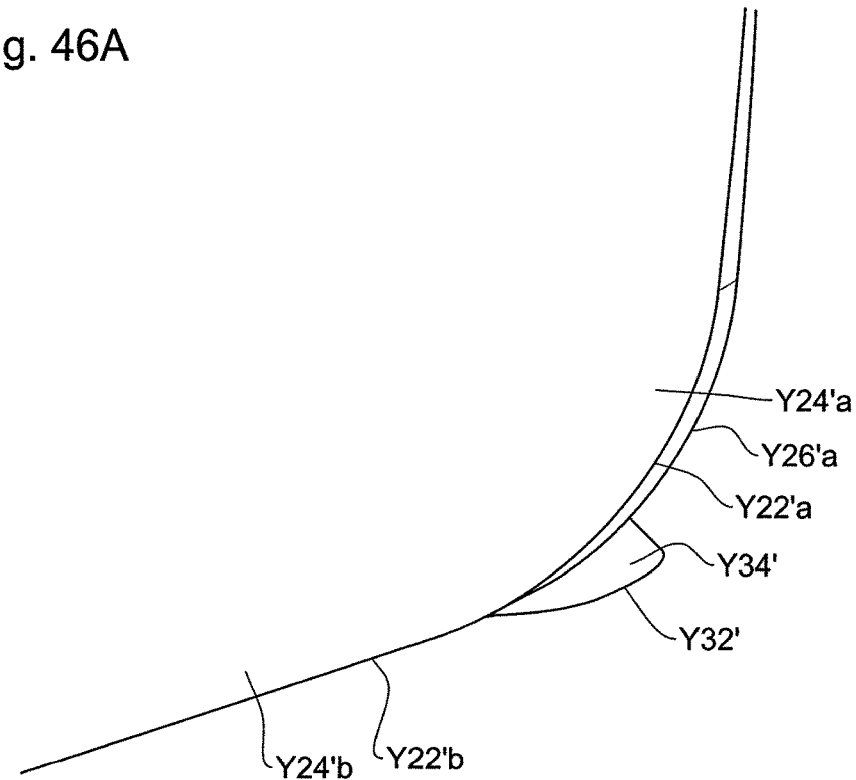
Figure 46C:
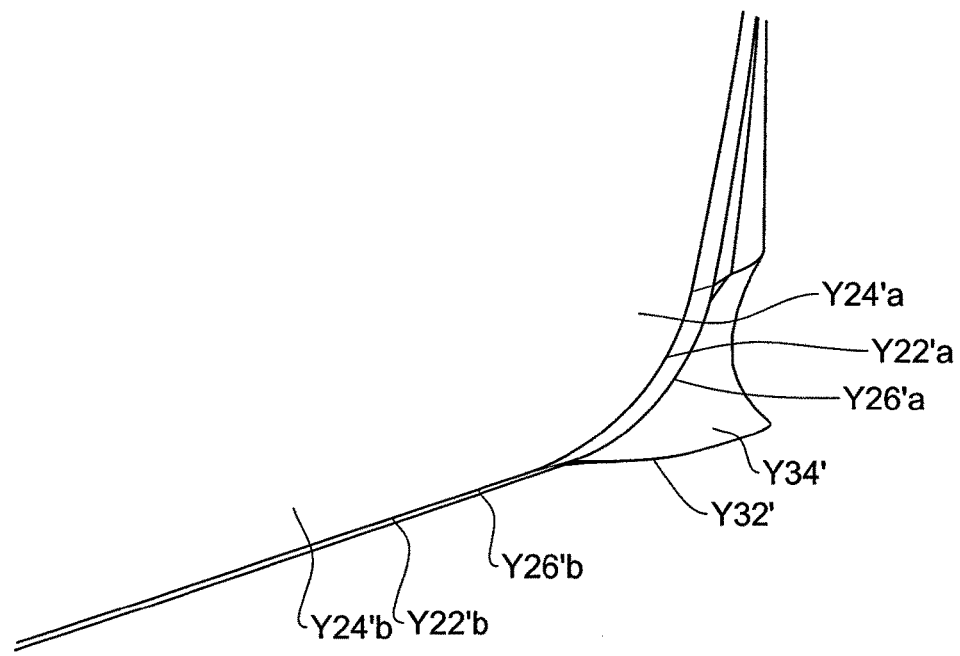
Figure 46D:
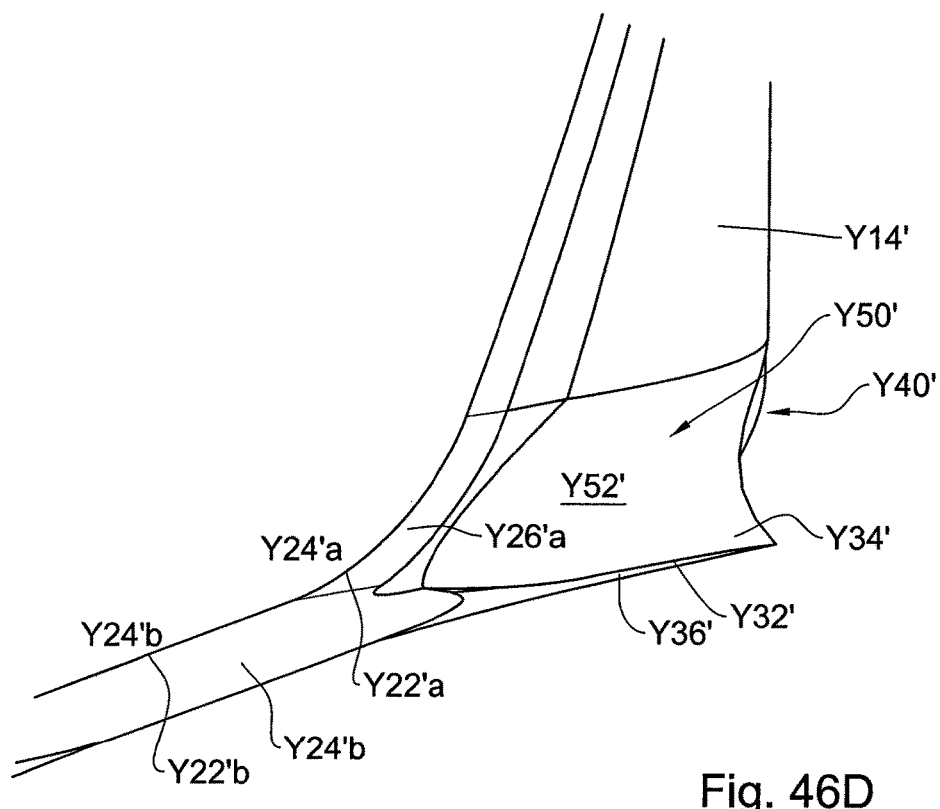
Figure 46E:
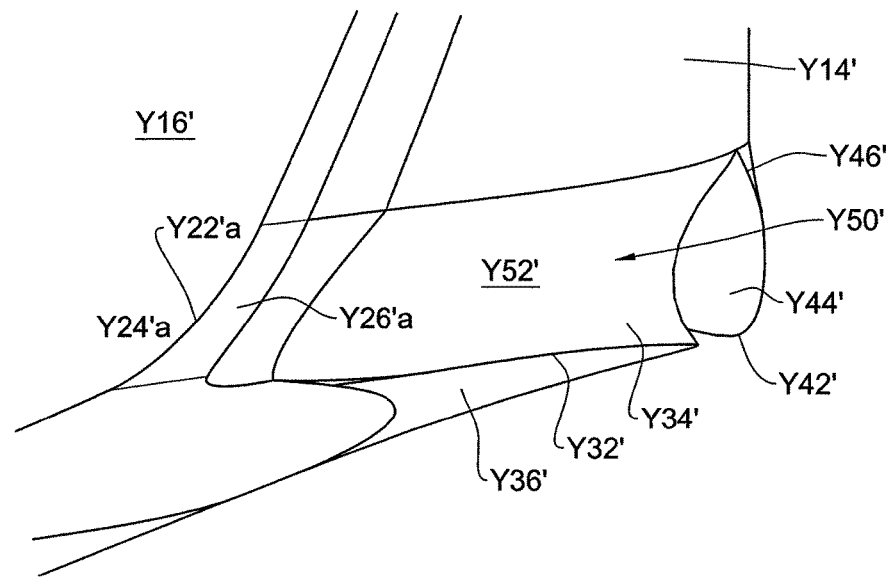
Figure 46F:
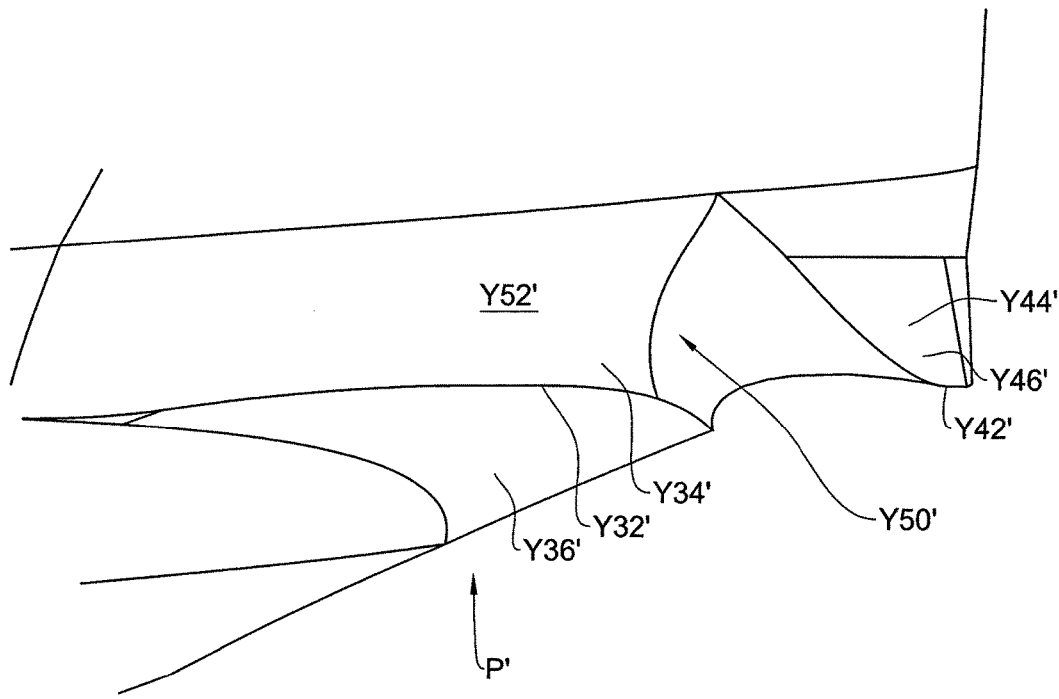
Figure 46G:
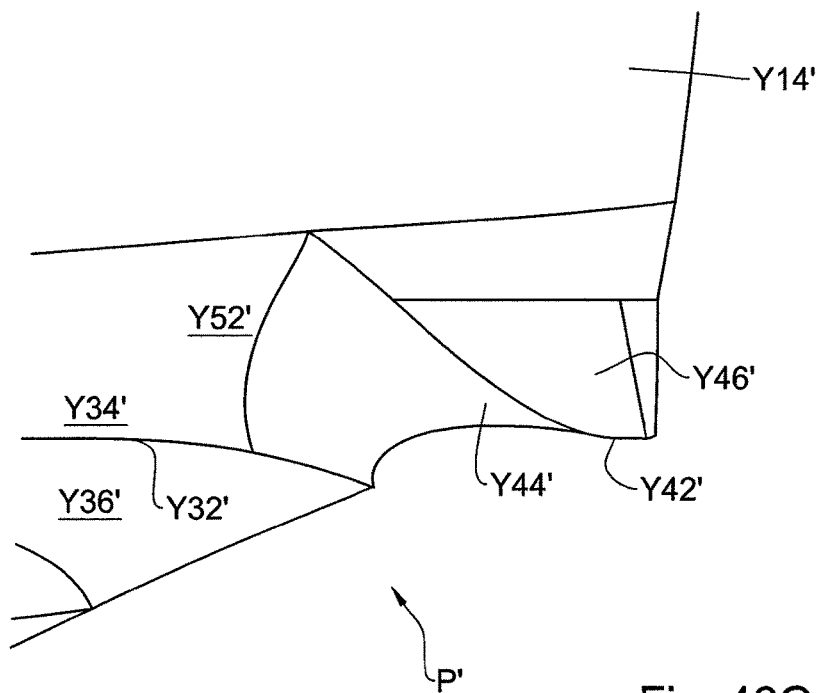
Figure 46H:
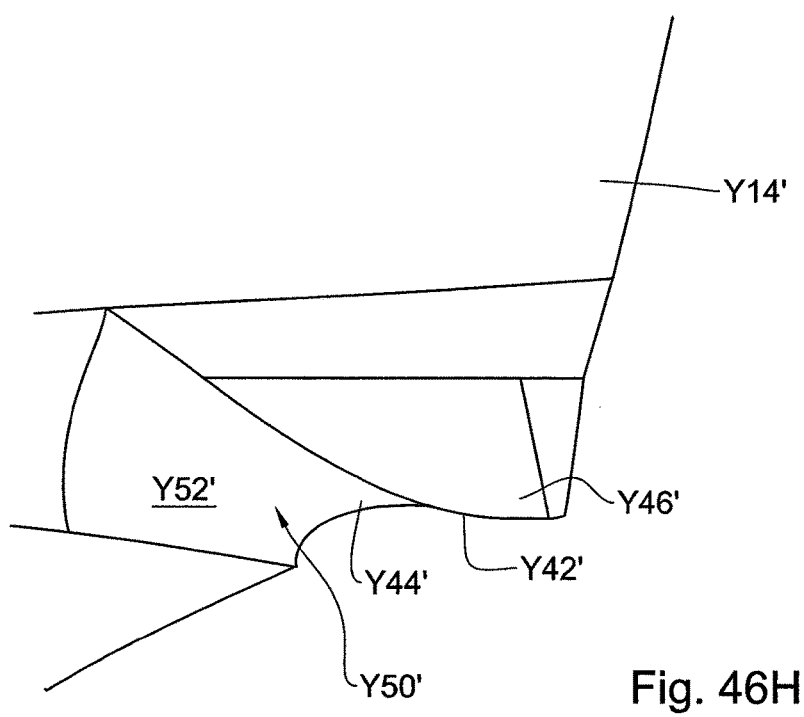
Figure 47:
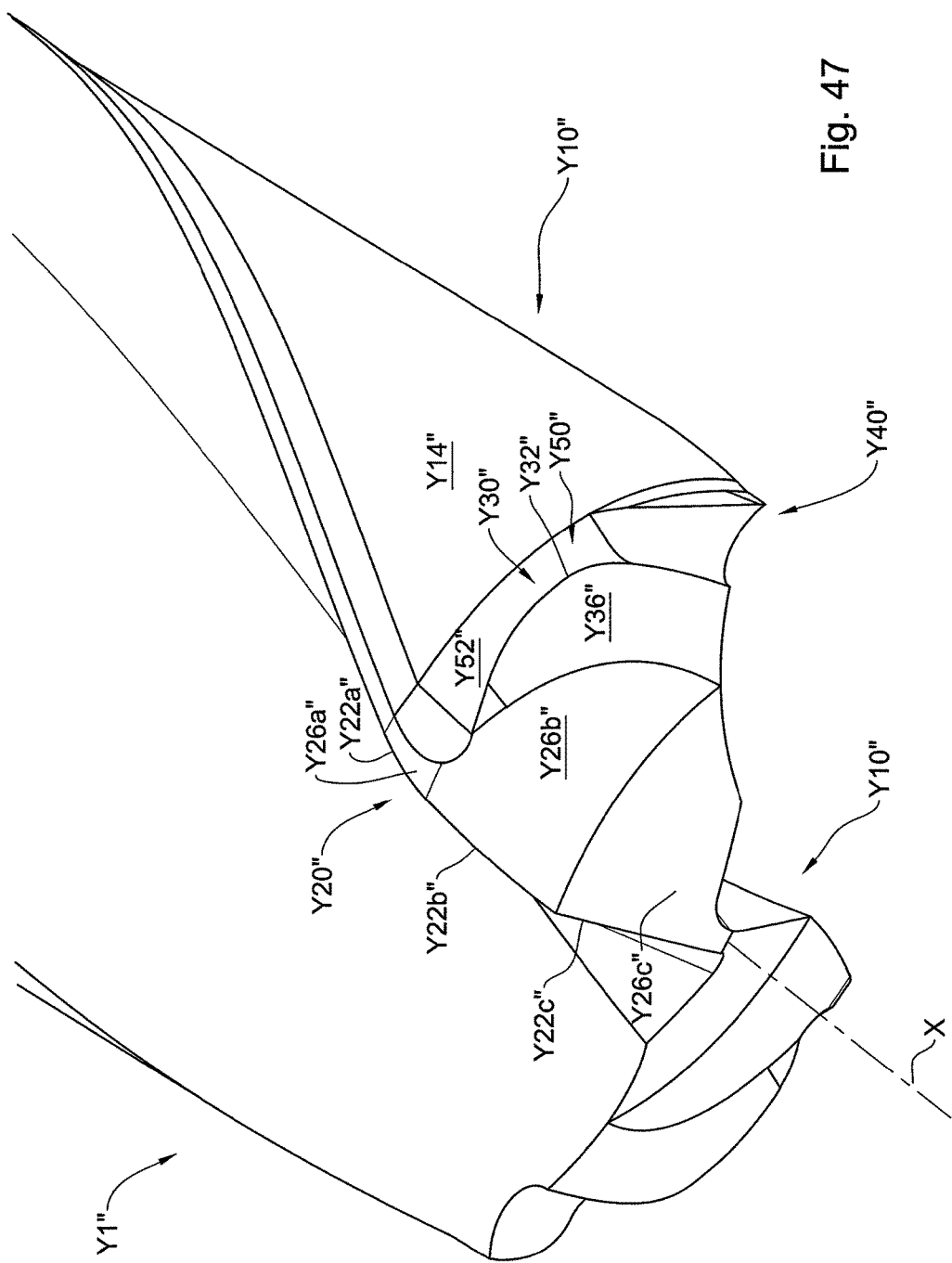
Figure 49A:
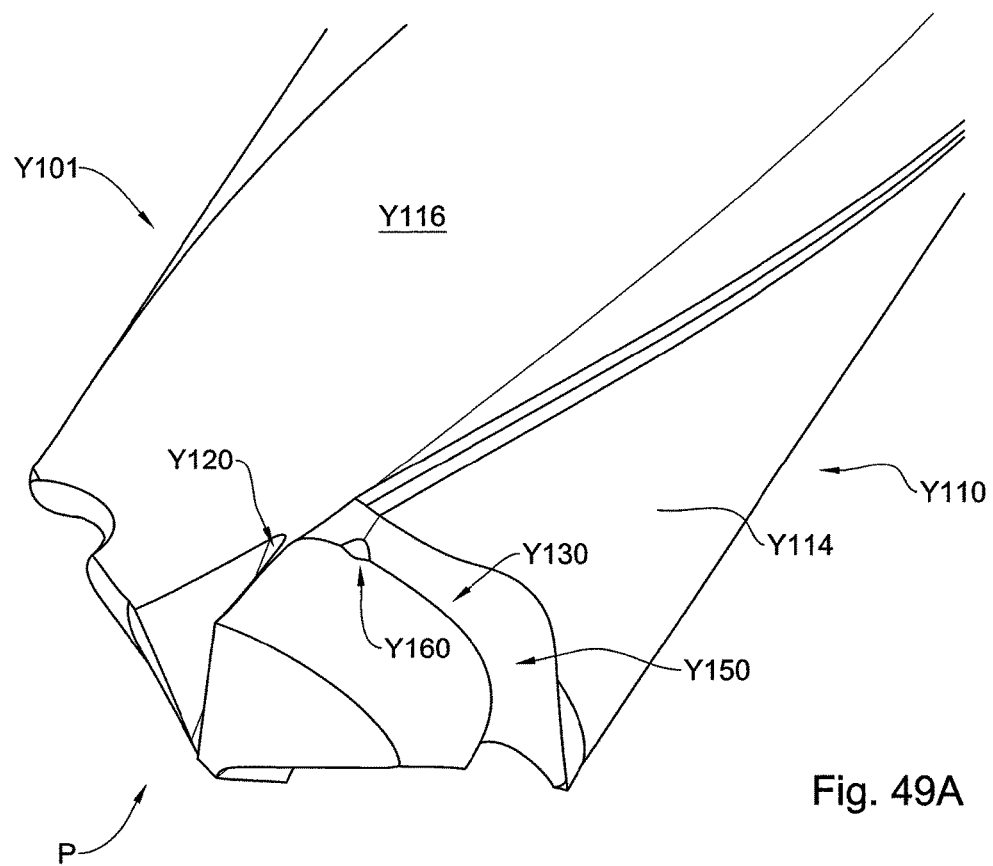
Figure 49B:
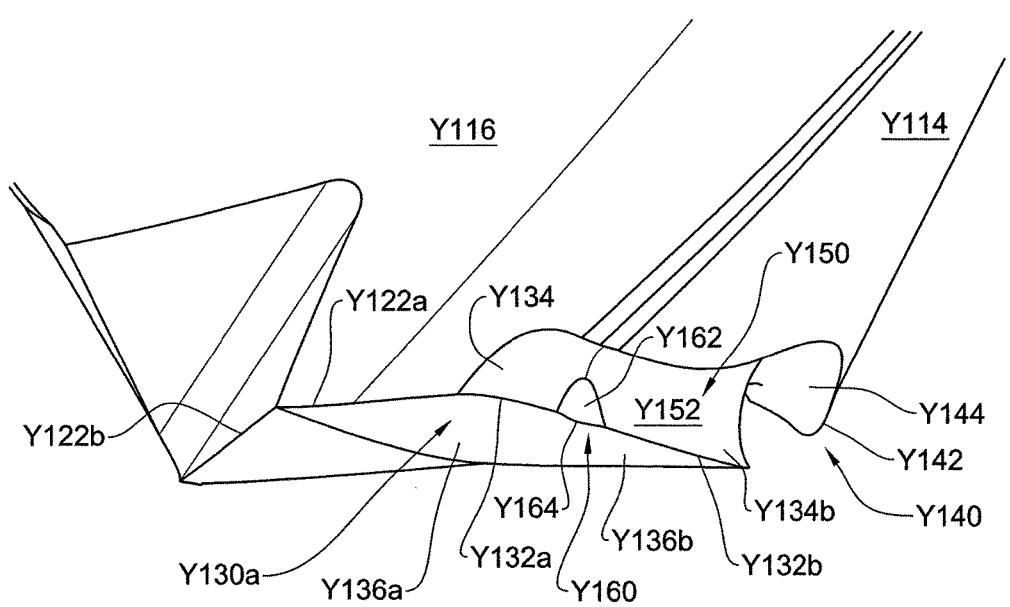
Figure 49C:
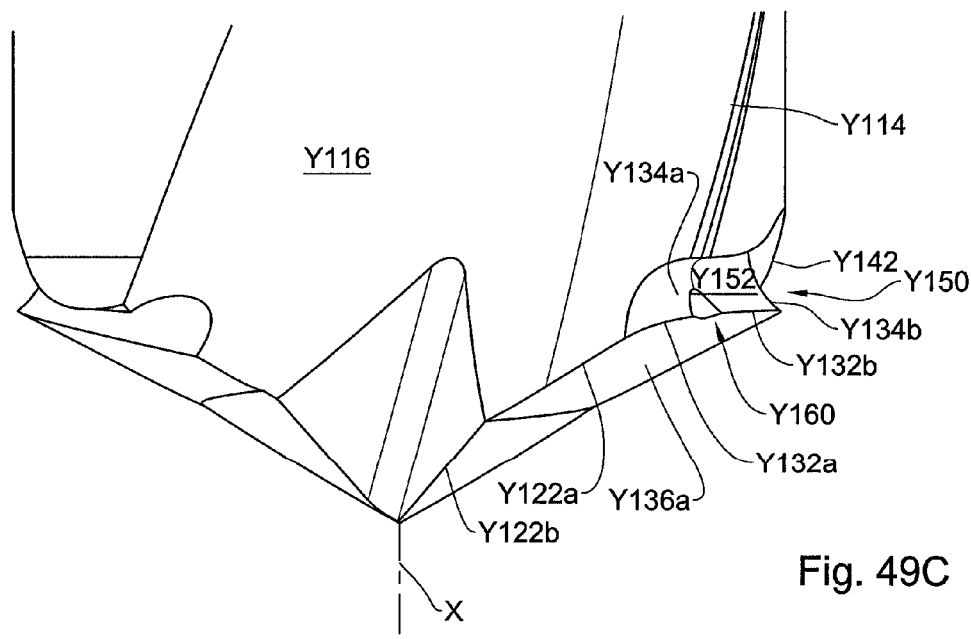
Figure 49D:
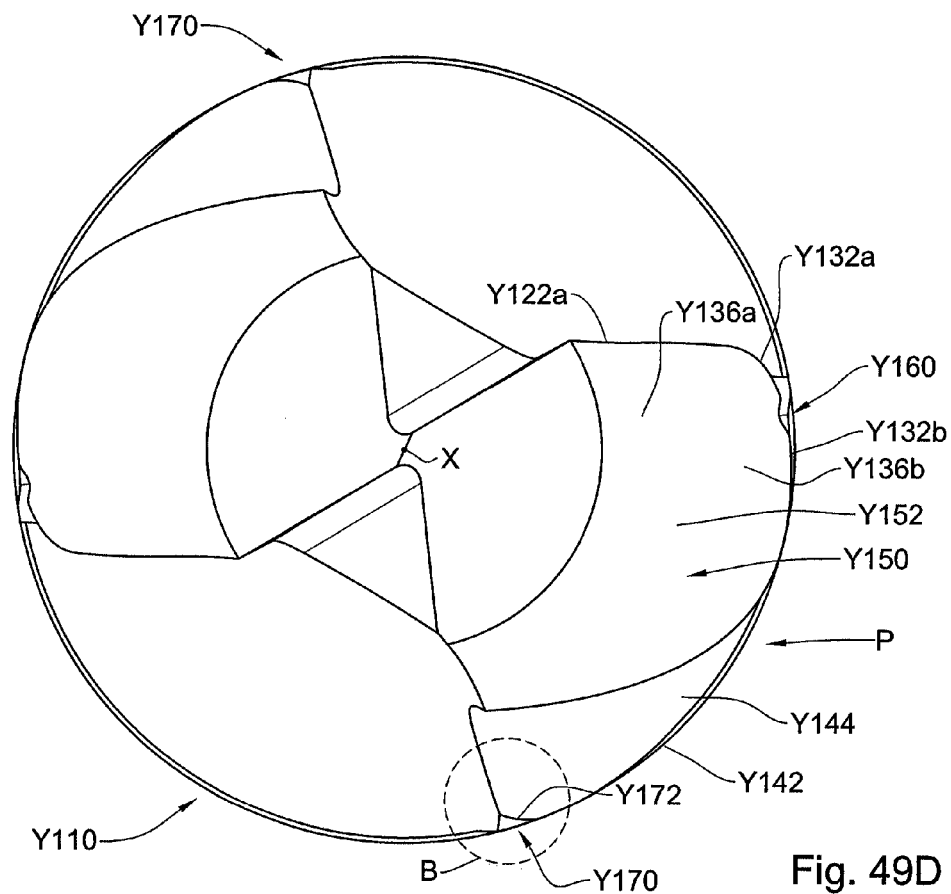
Figure 49E:
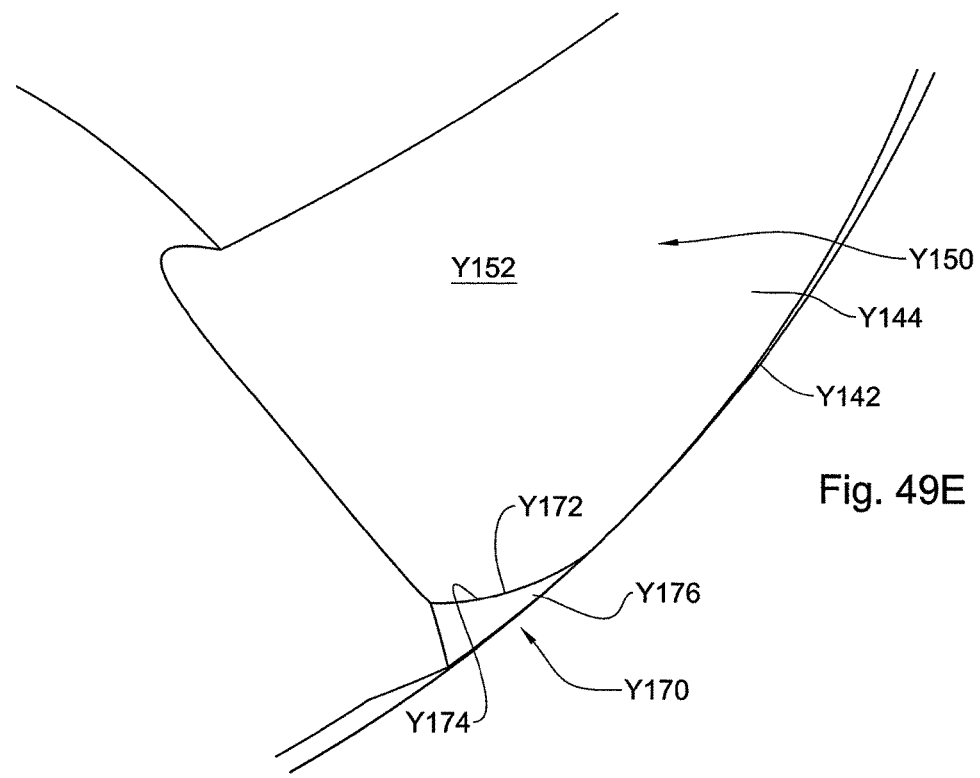
Figure 49F:
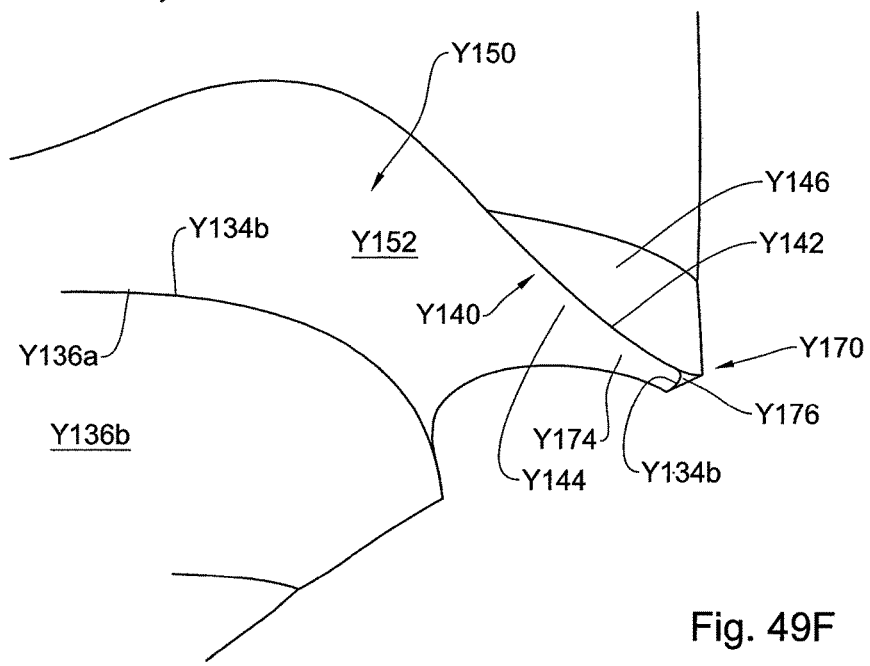
Figure 50A:
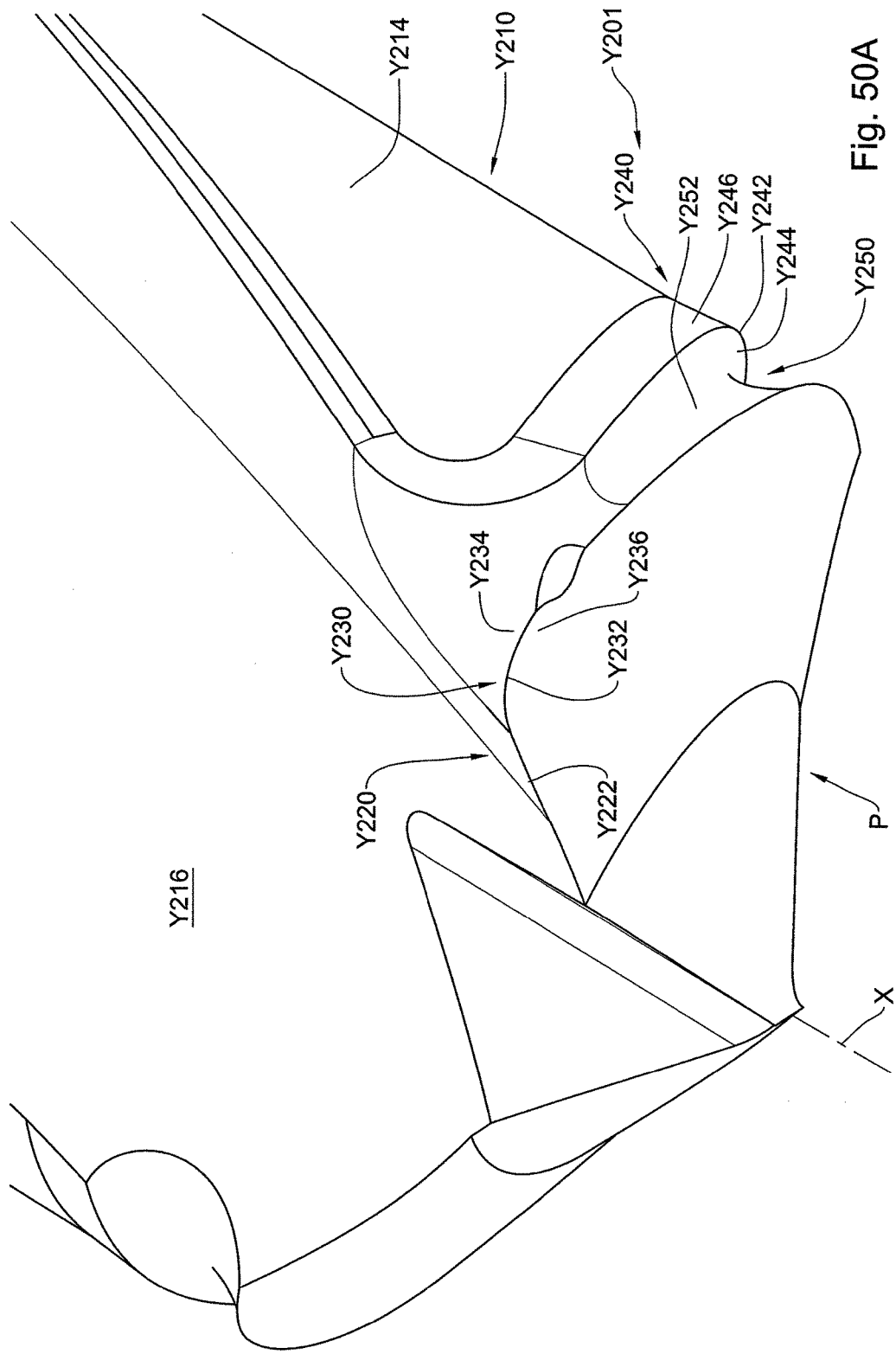
Figure 50B:
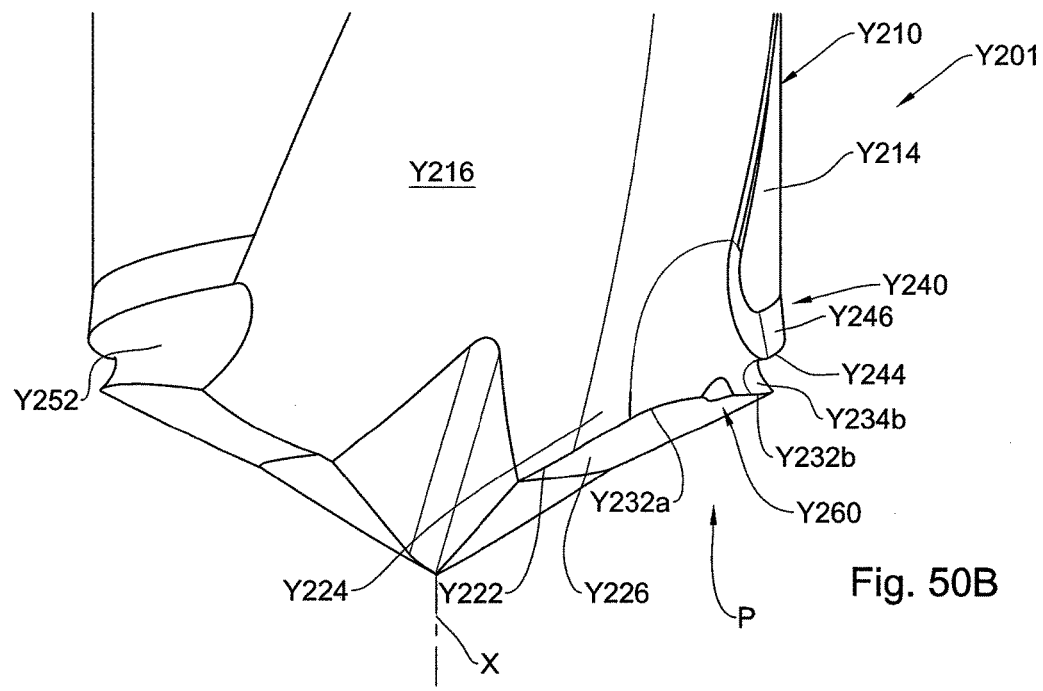
Figure 50C:
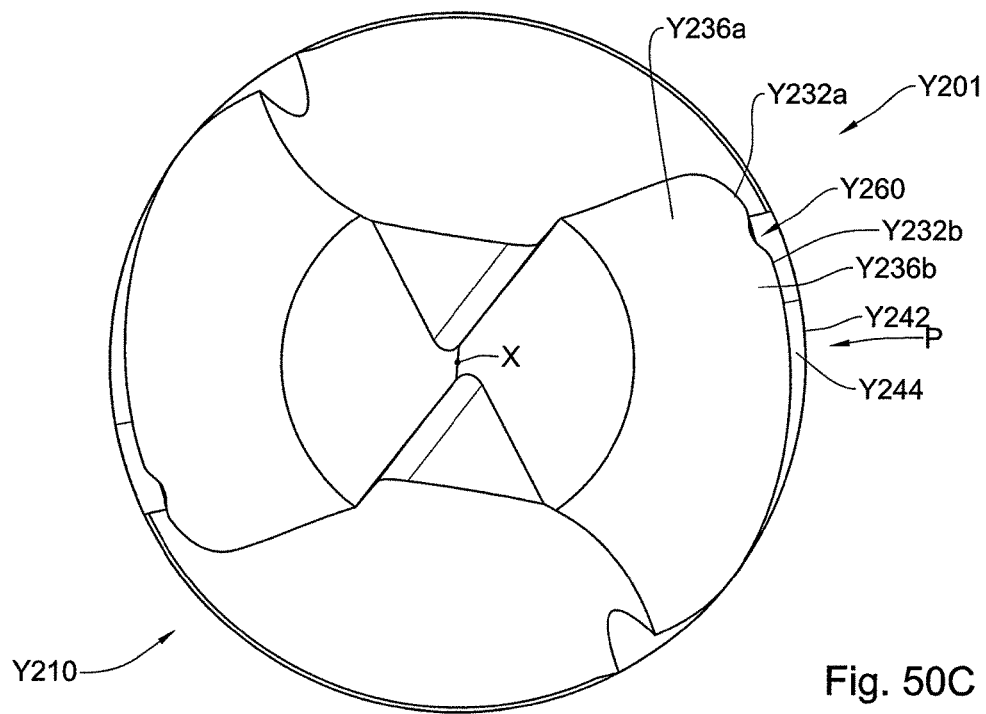
Figure 51A:
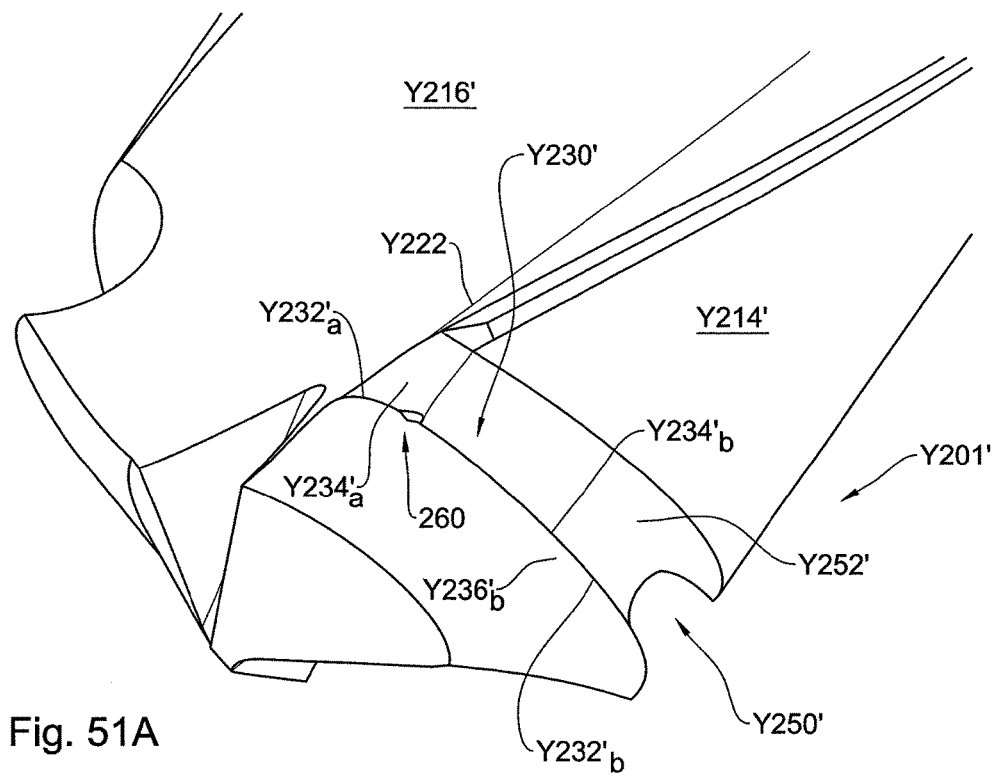
Figure 51B:
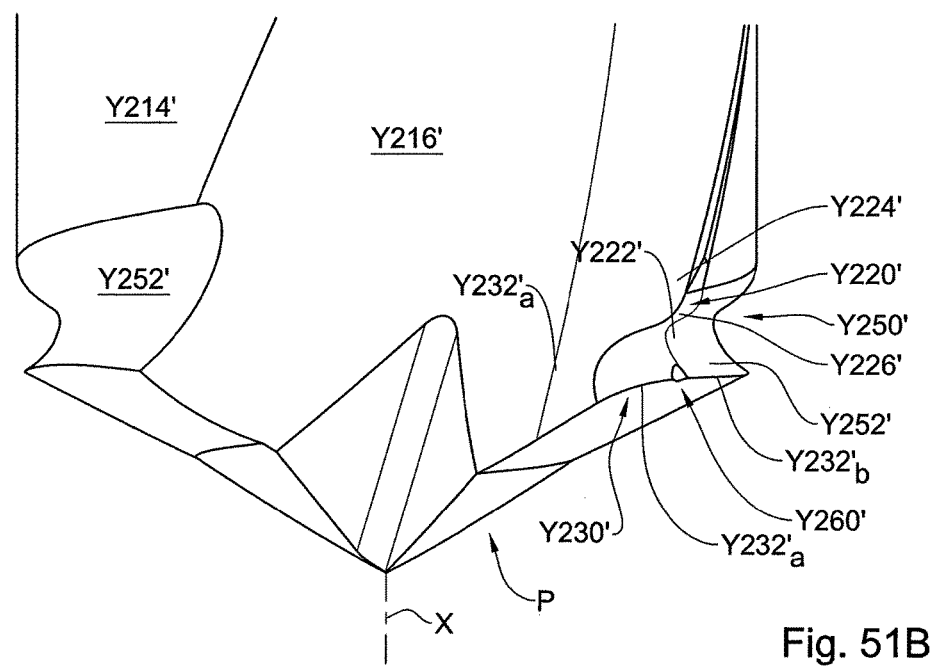
Figure 51C:
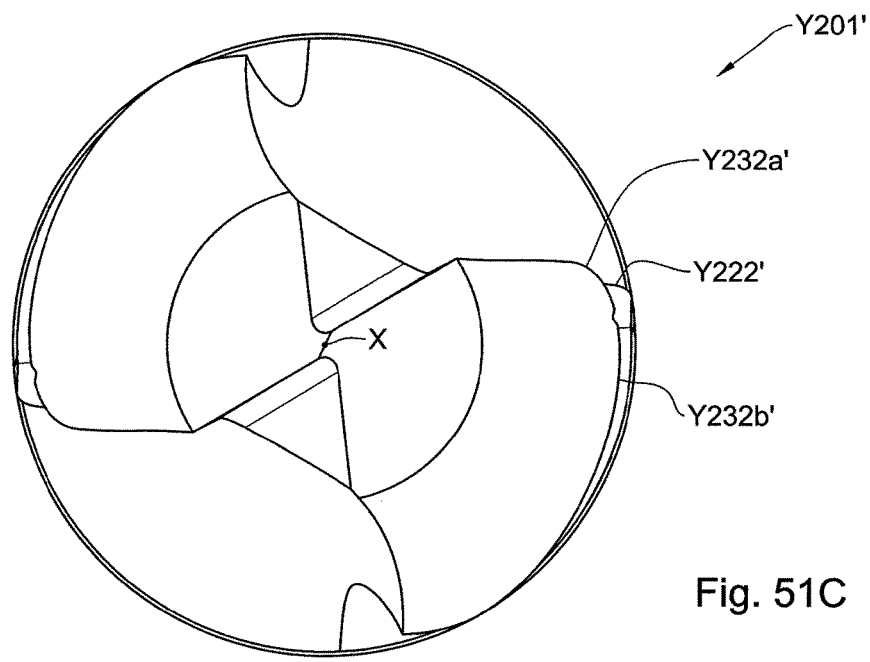
Figure 51D:
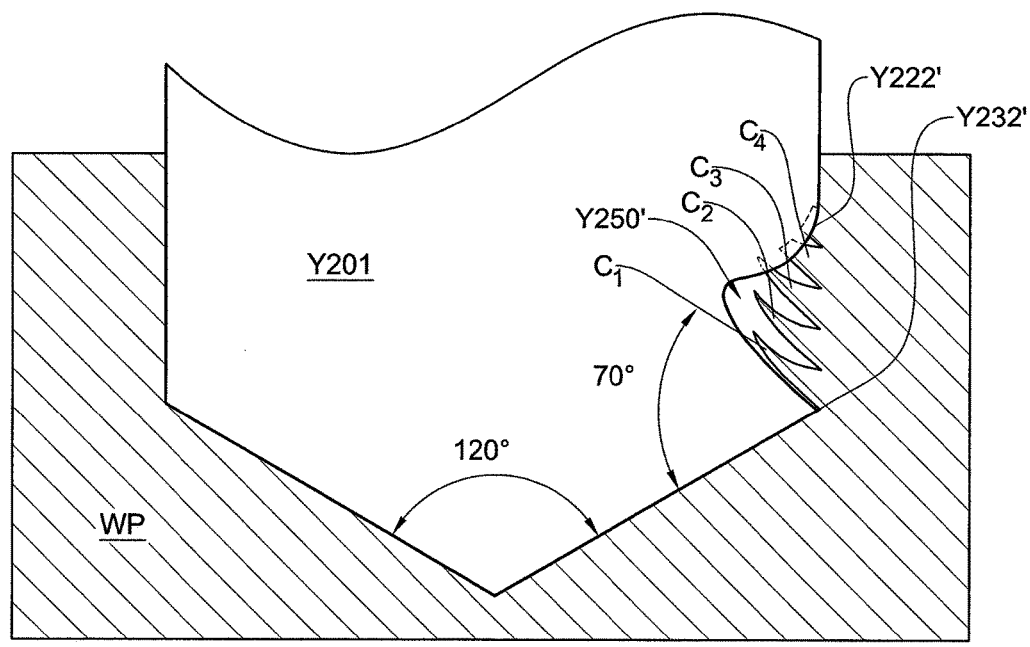
Figure 52A:
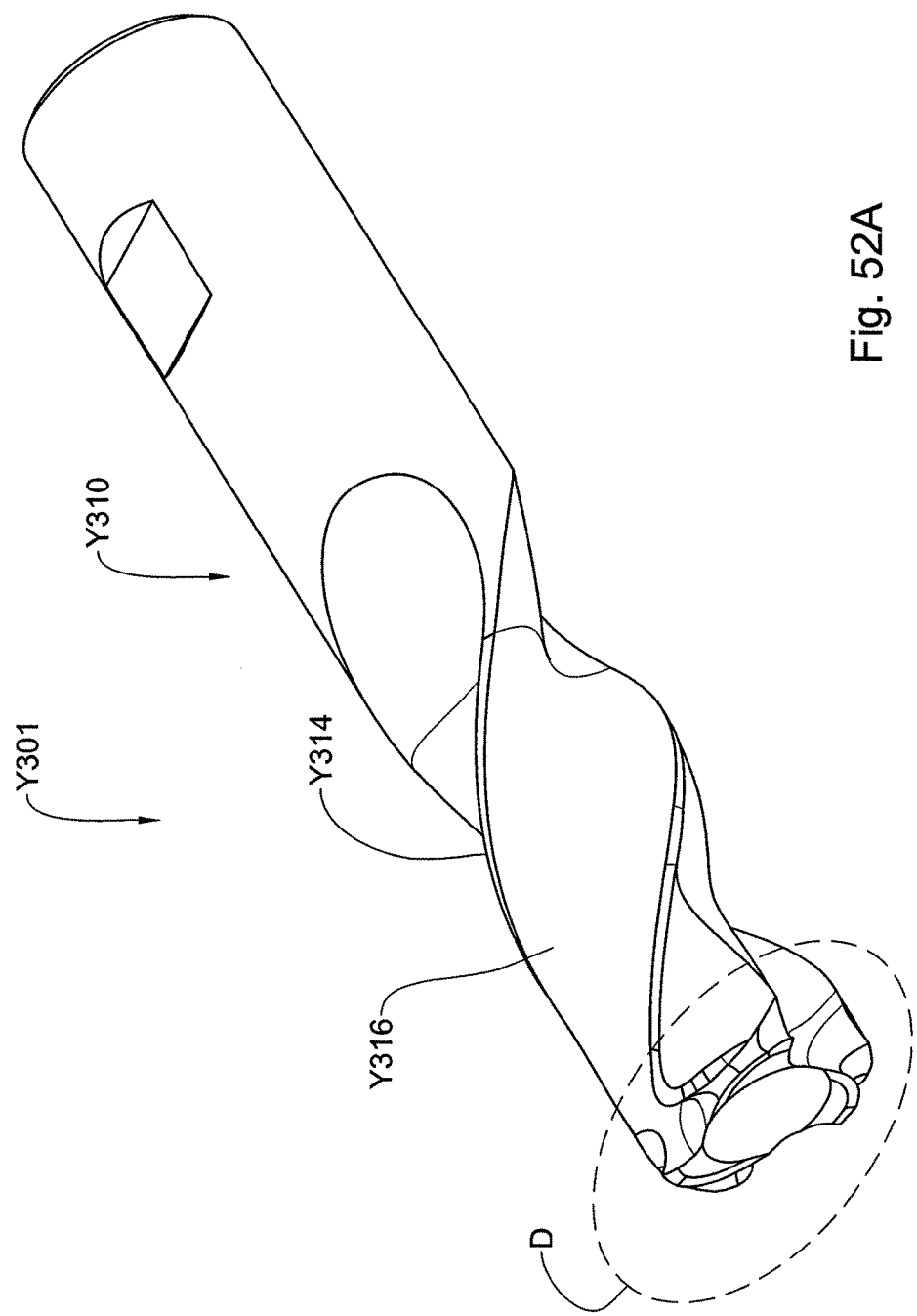
Figure 52B:
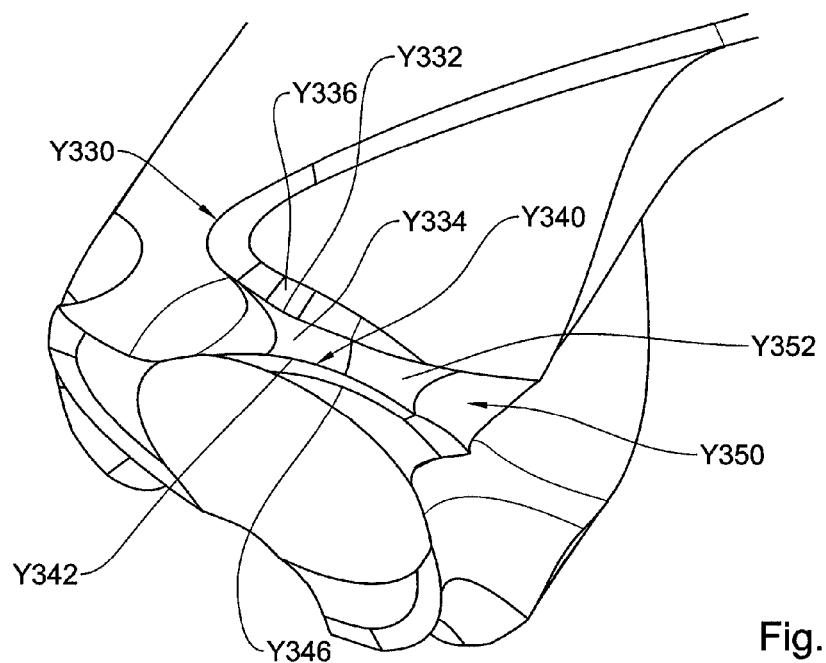
Figure 52C:
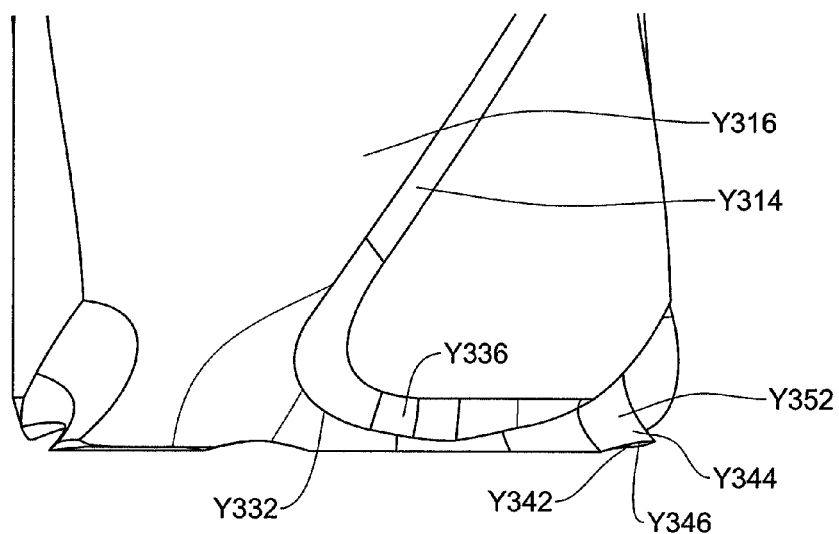
Figure 52D:
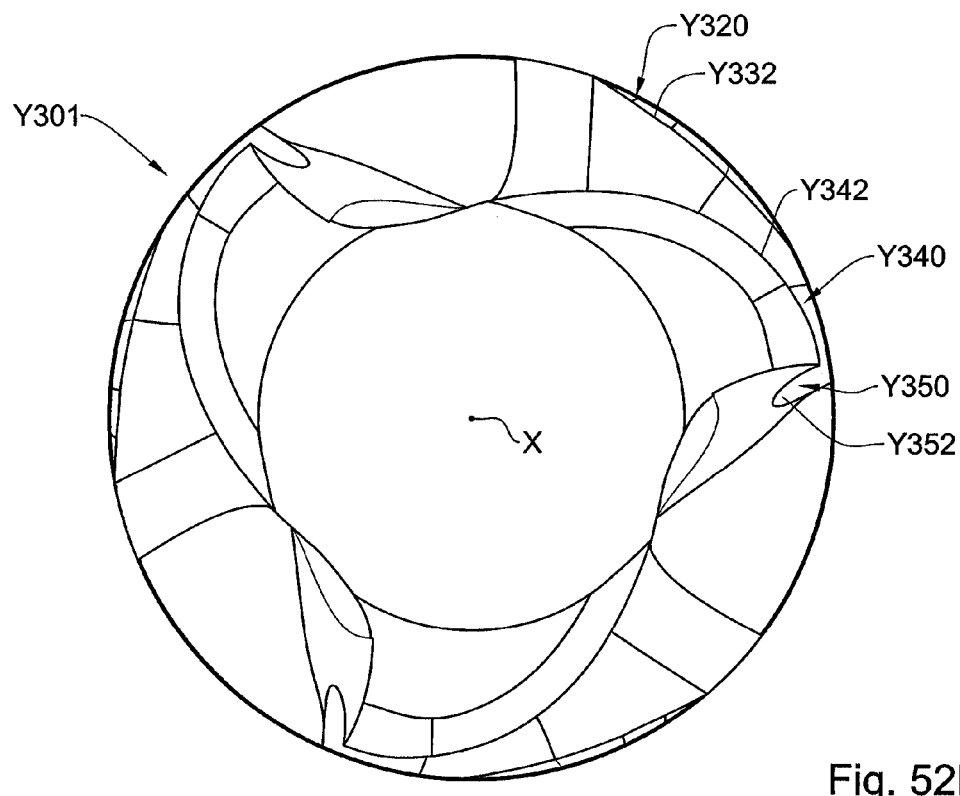
Figure 53A:
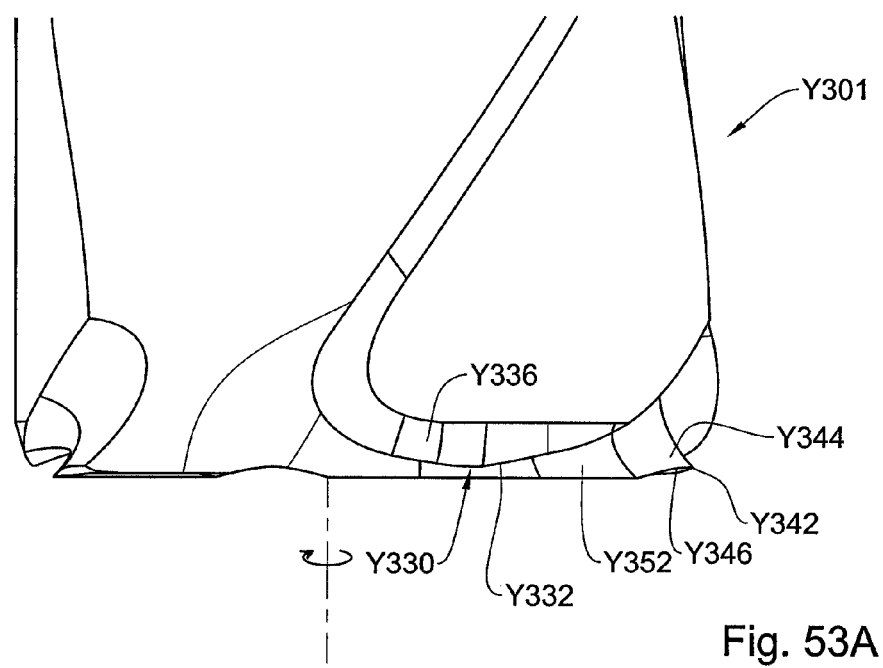
Figure 53B:
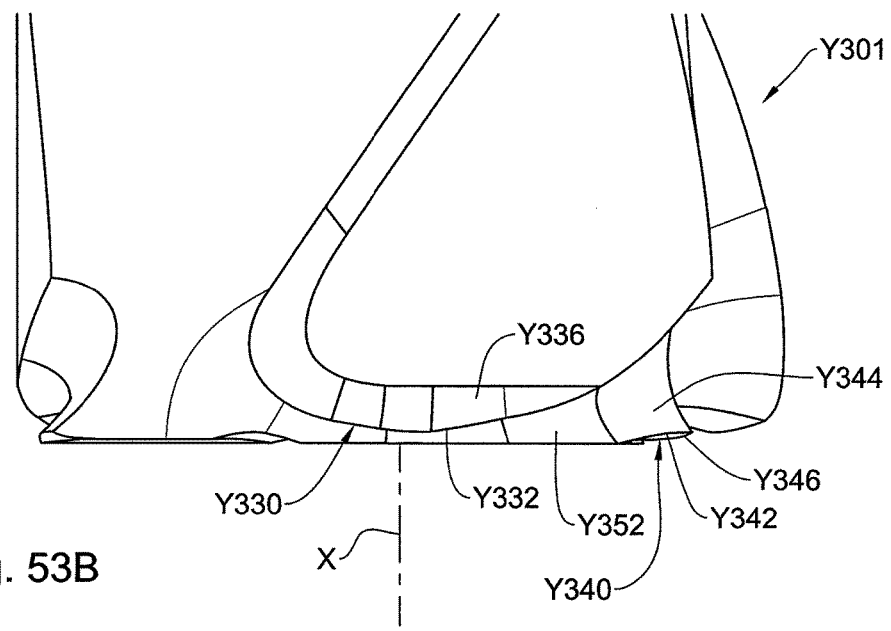
Figure 53C:
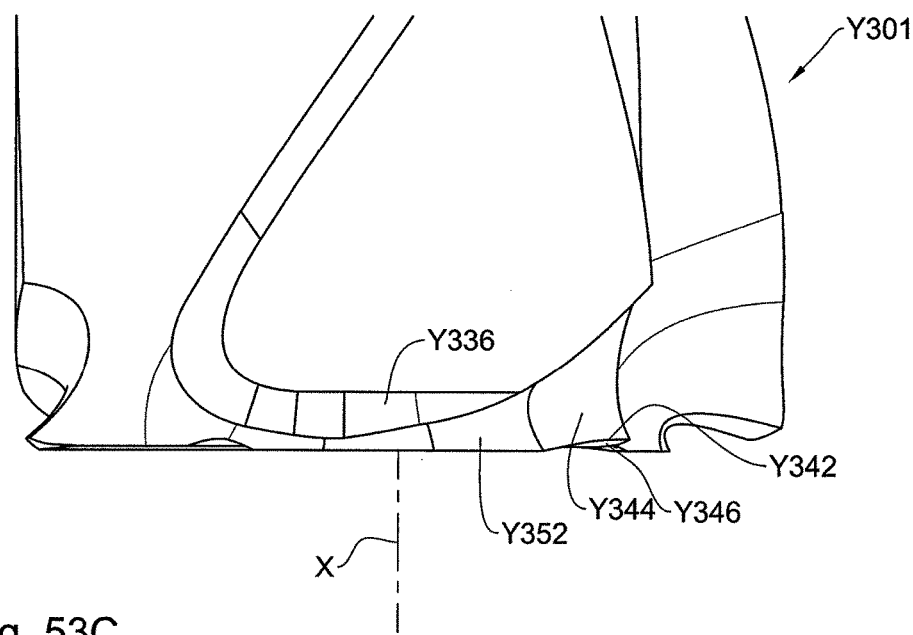
Figure 53D:
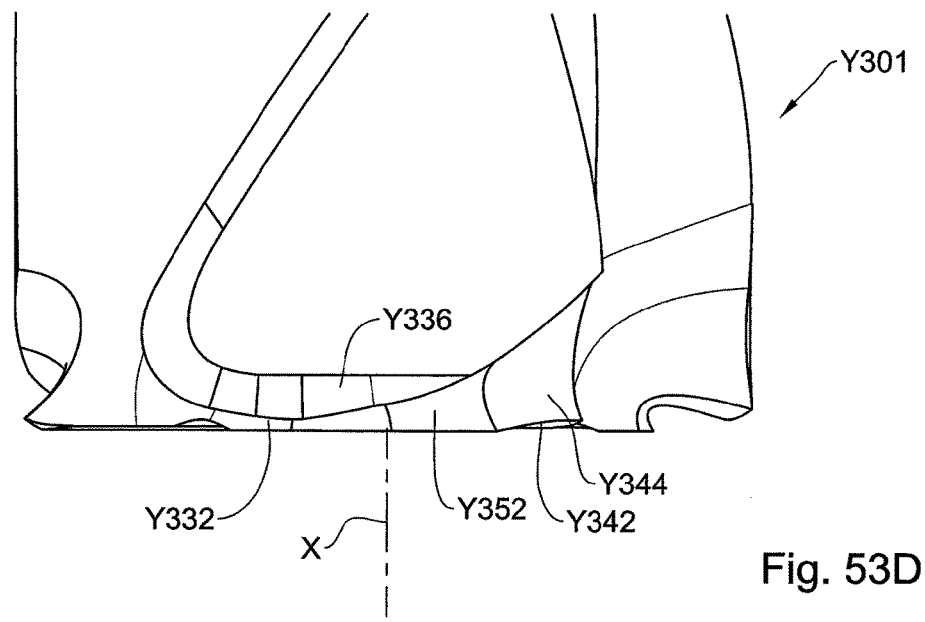
Figure 53E:
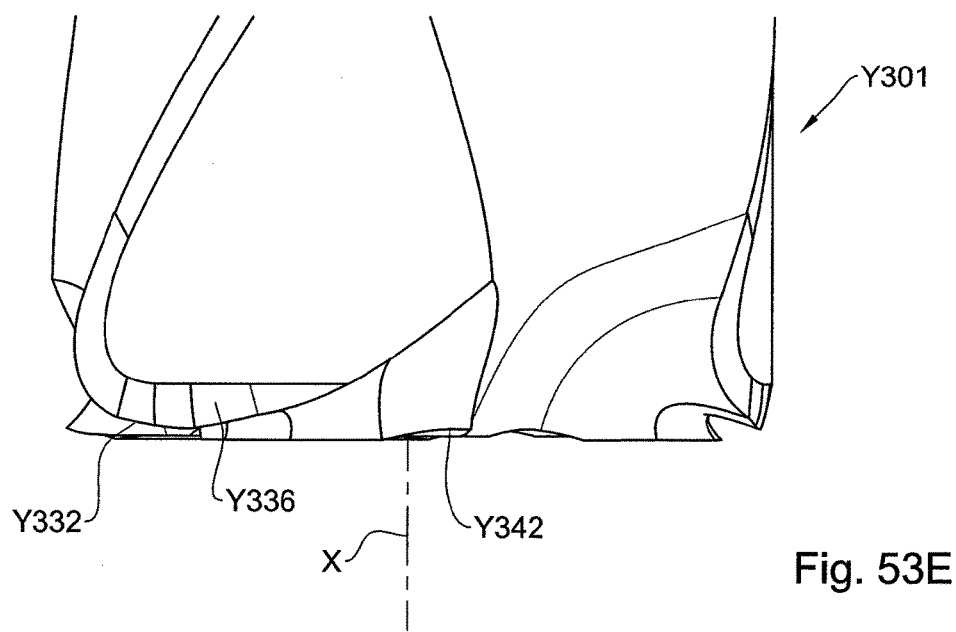
Figure 54A:
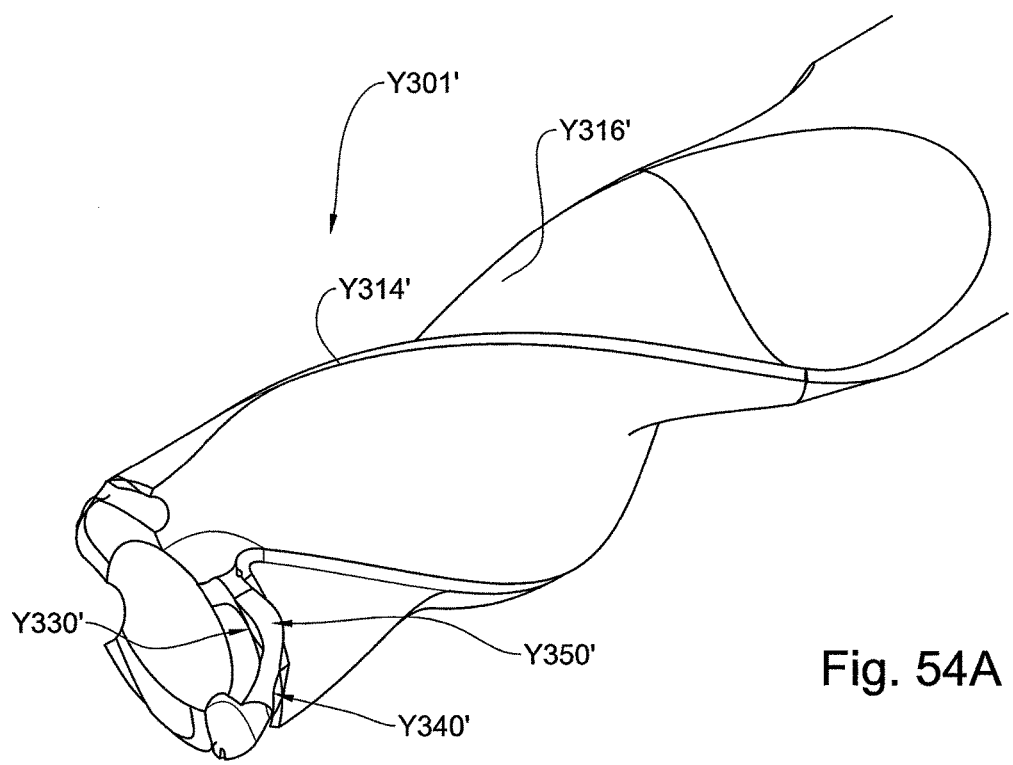
Figure 54B:
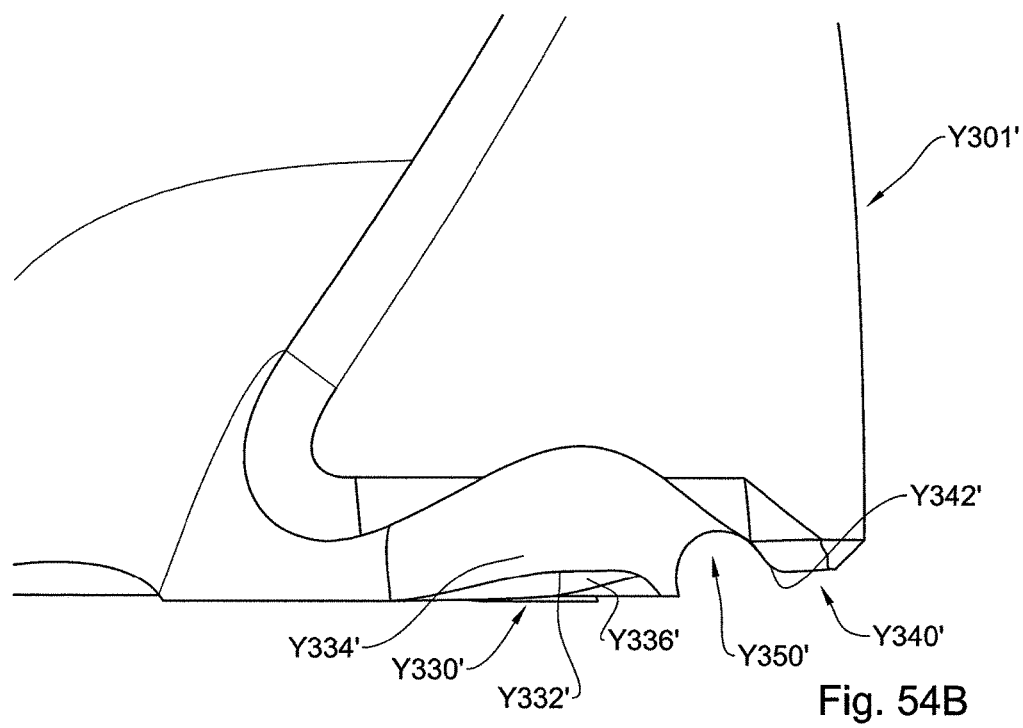
Figure 55A:
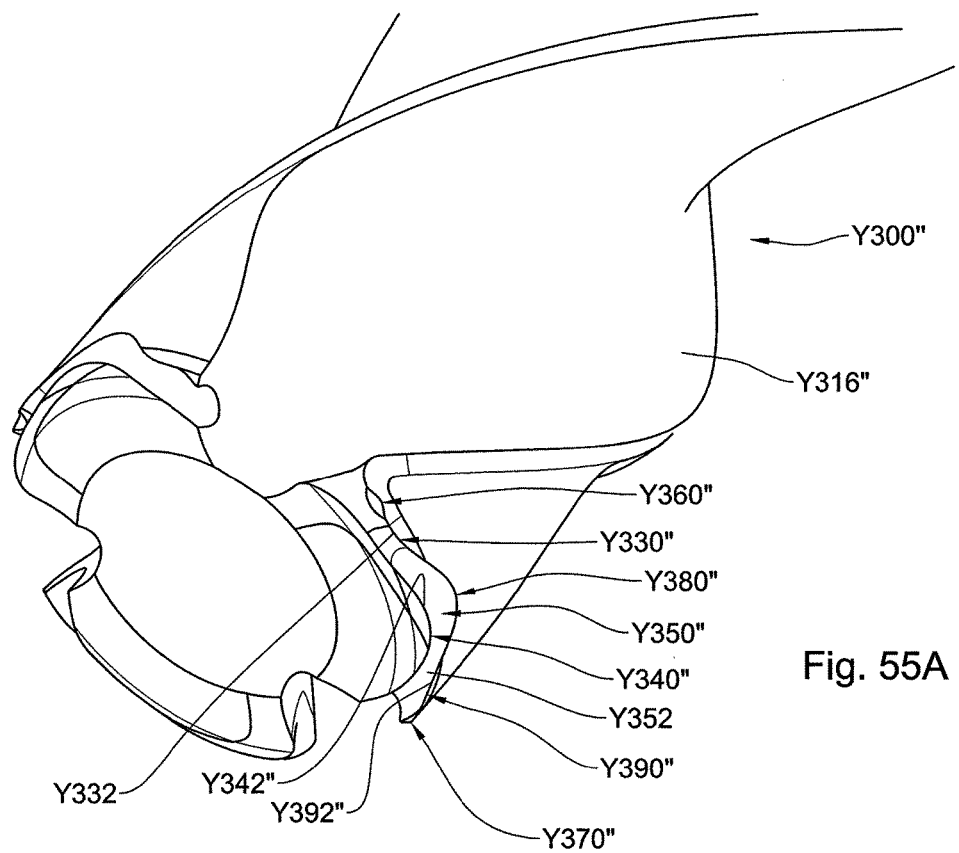
Figure 55B:
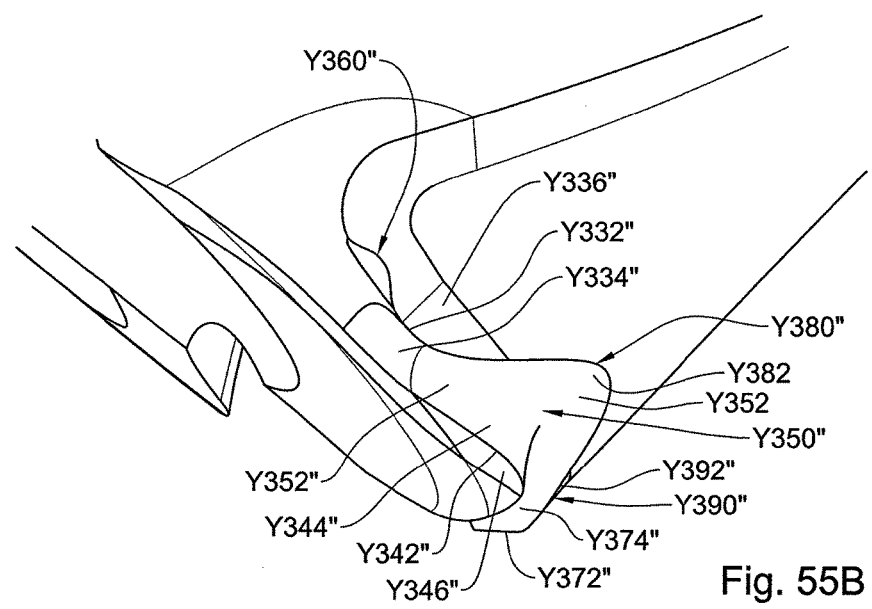
Figure 56:
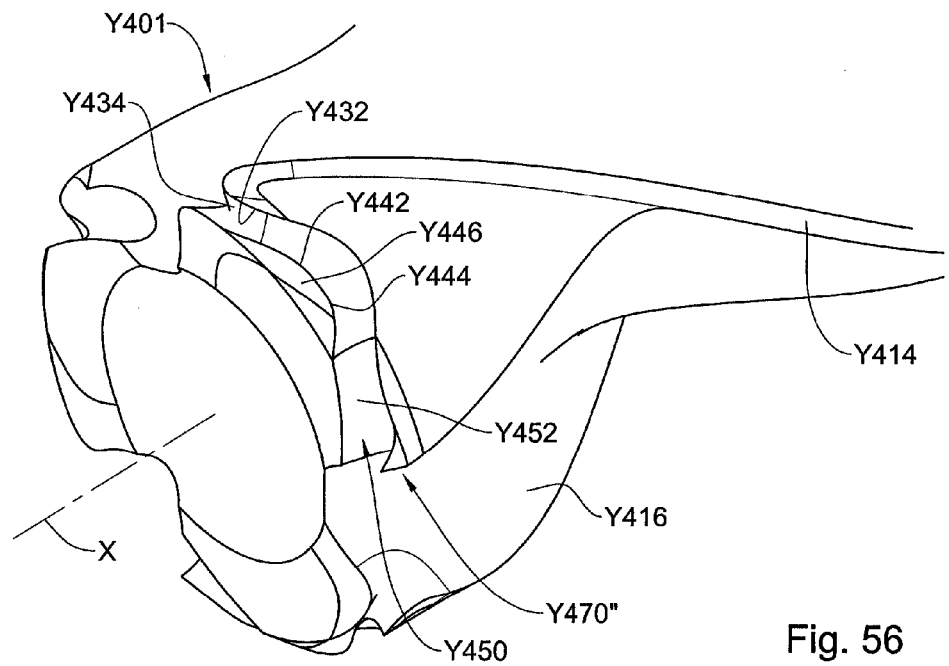
Figure 57:
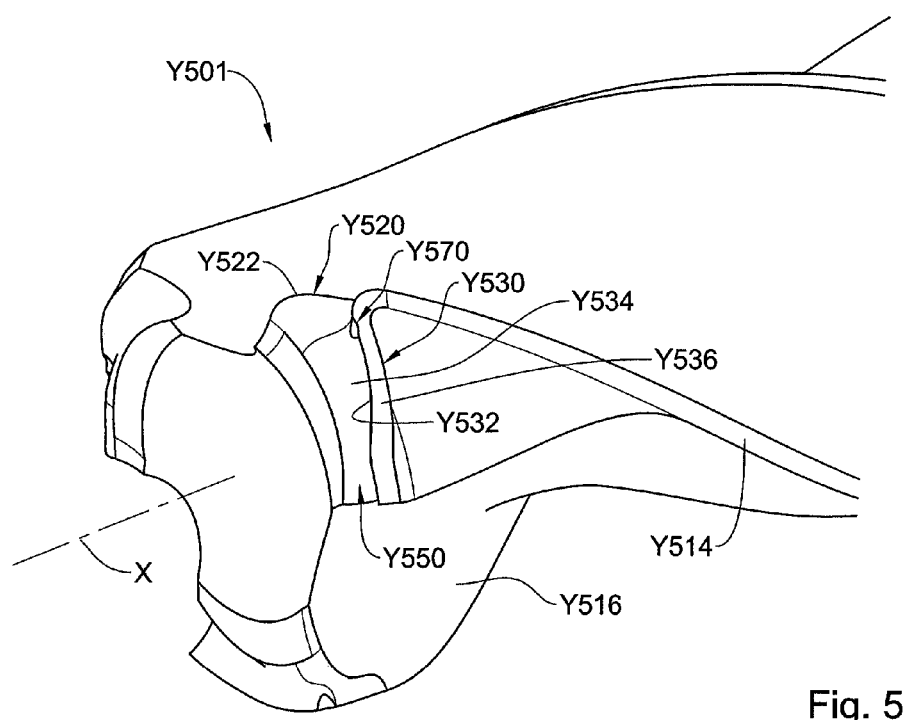
Figure 60A:
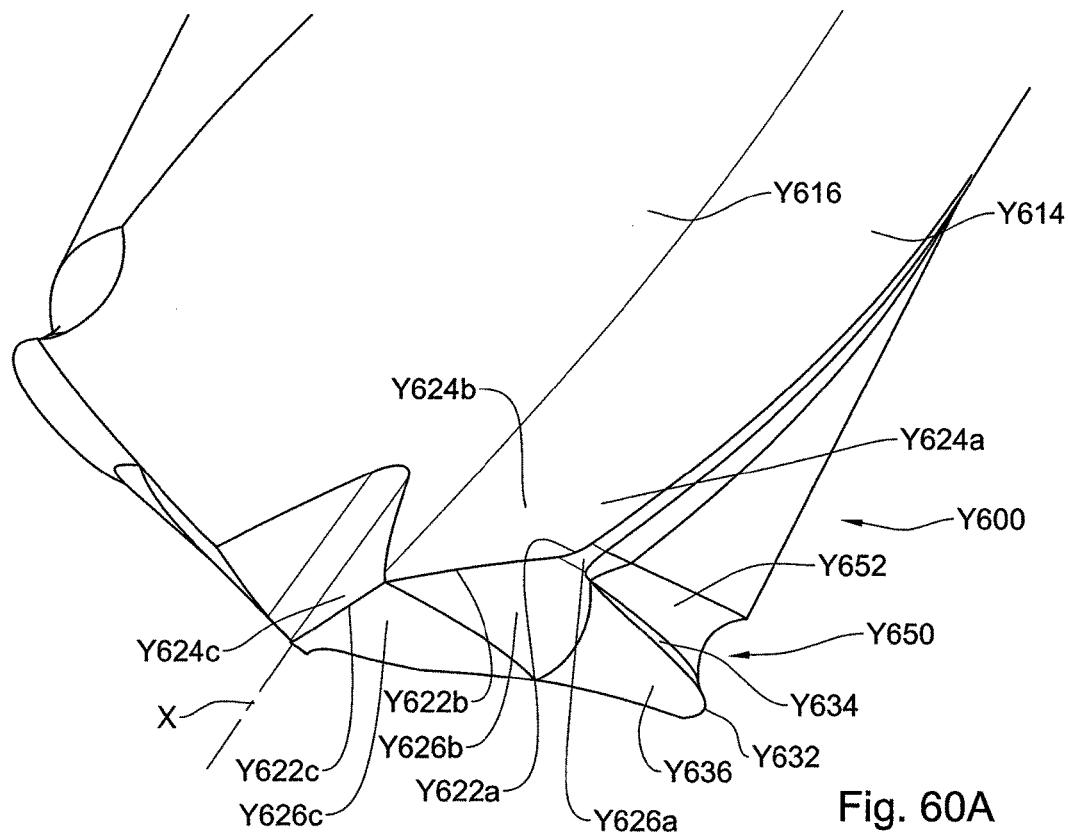
Figure 60B:
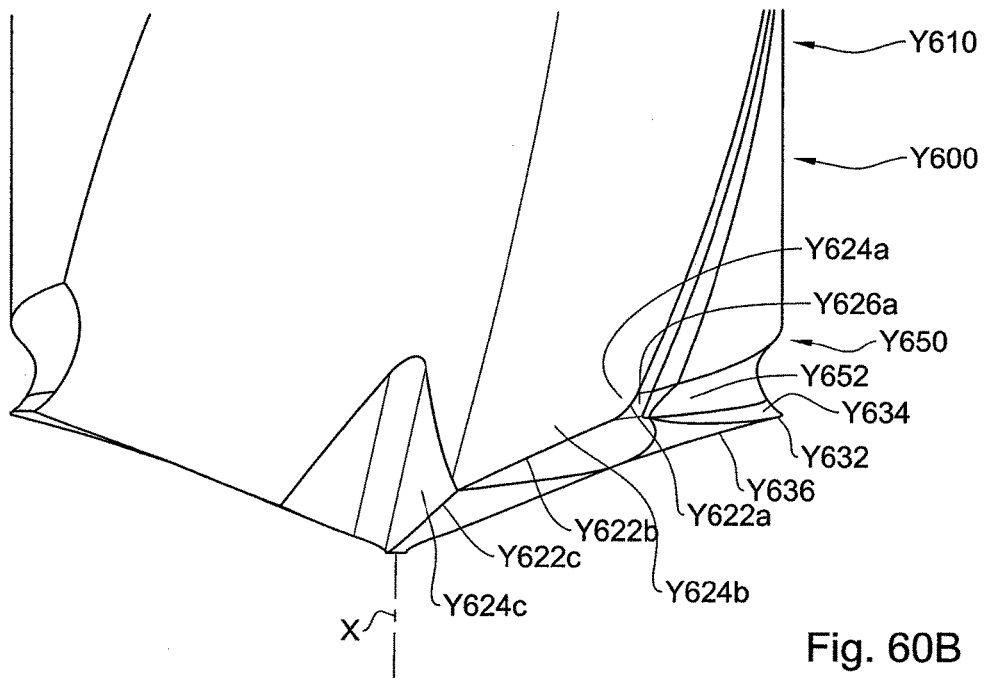
Figure 60C:
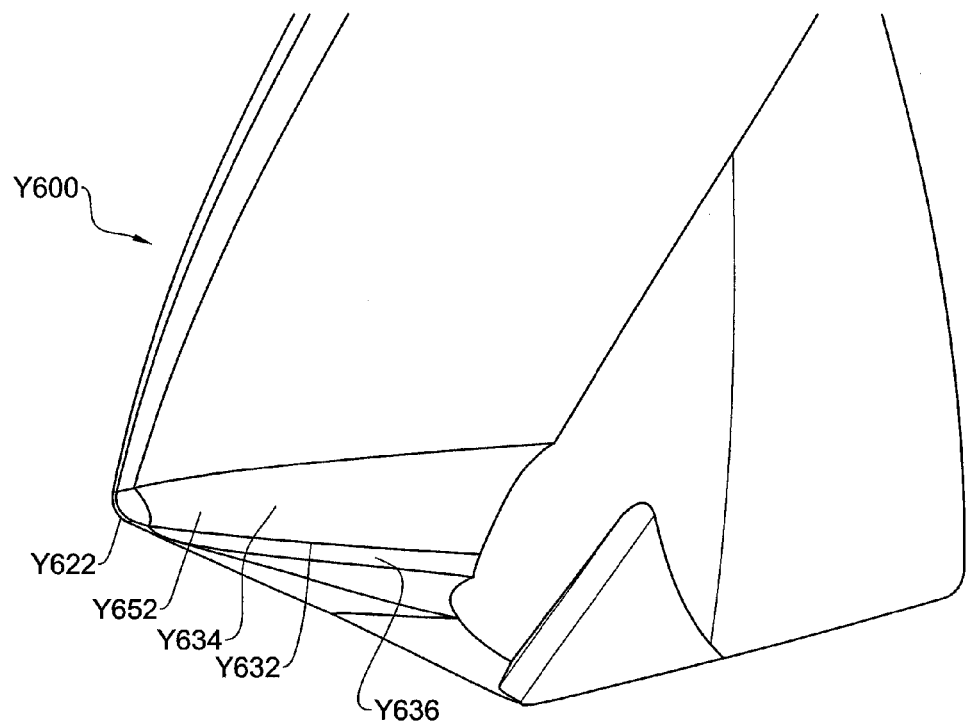
Figure 60D:
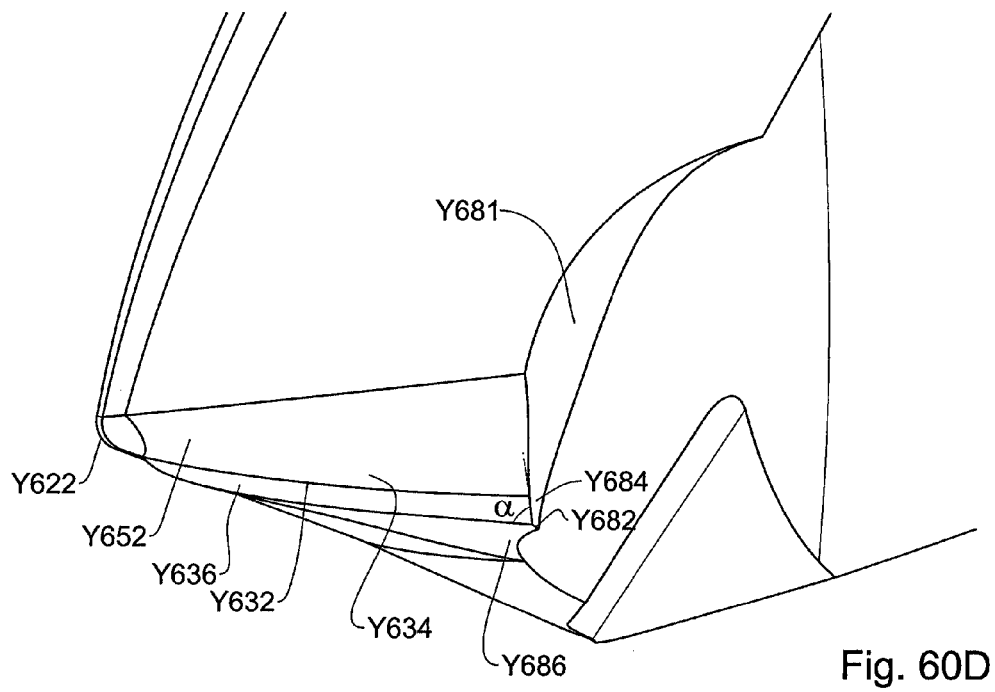
Figure 61A:
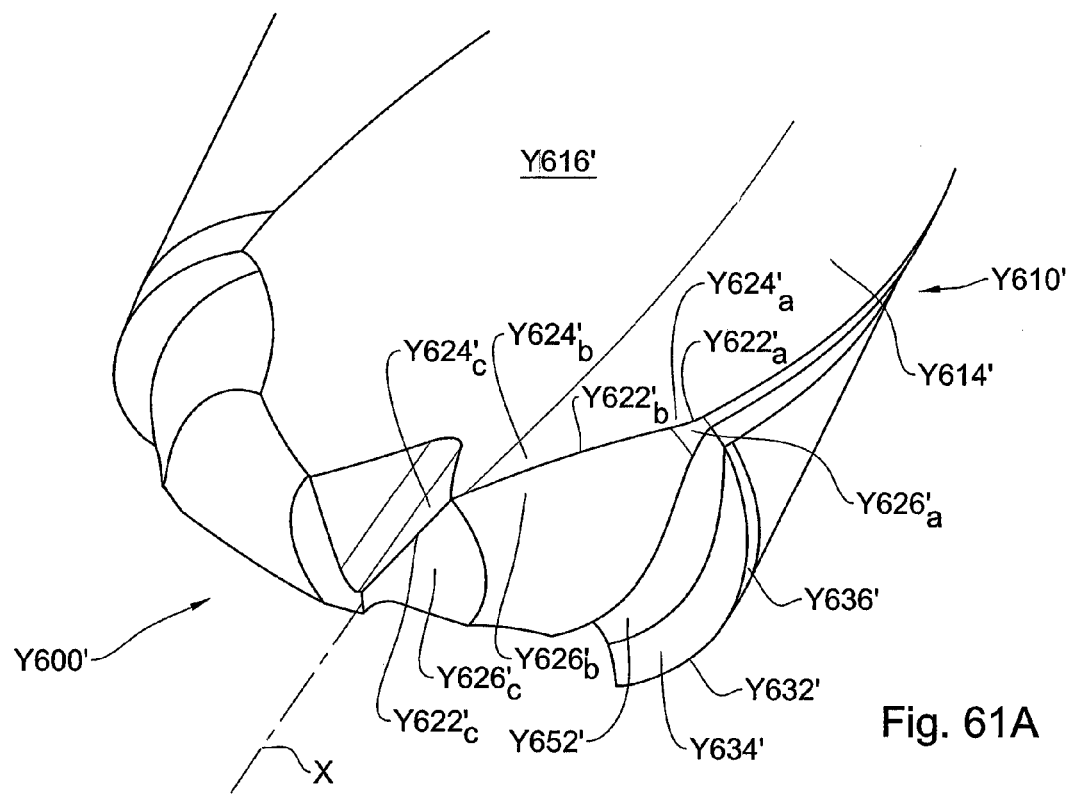
Figure 61B:
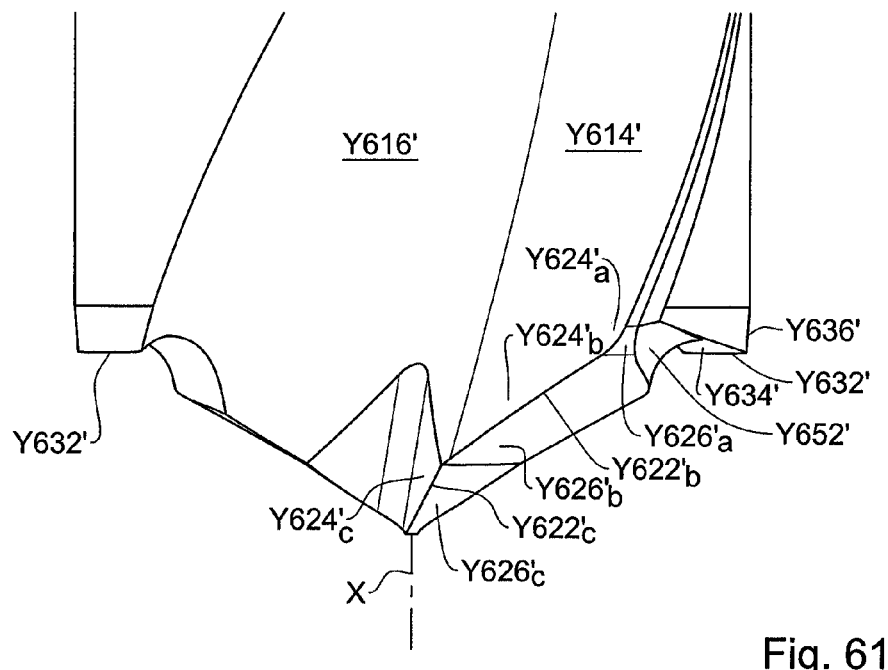
Figure 61C:
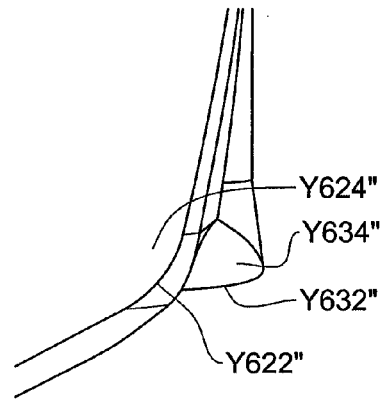
Figure 61D:
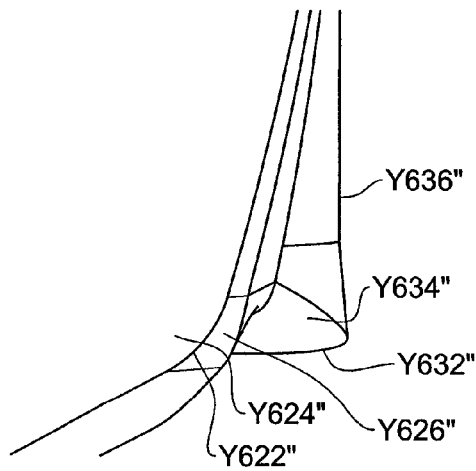
Figure 61E:
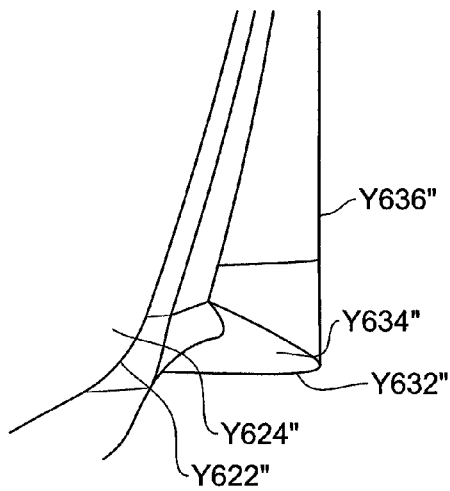
Figure 61F:
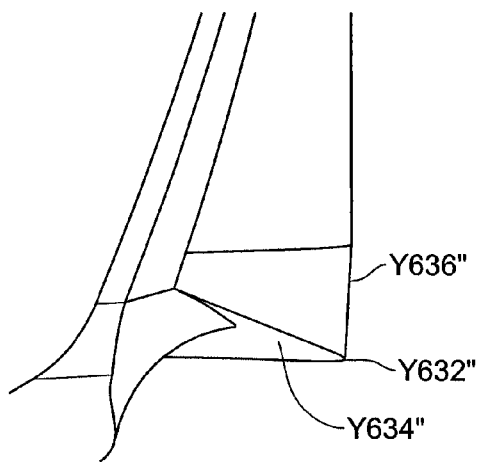
Figure 61G:
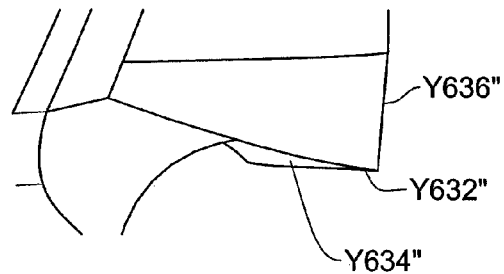
Figure 62A:
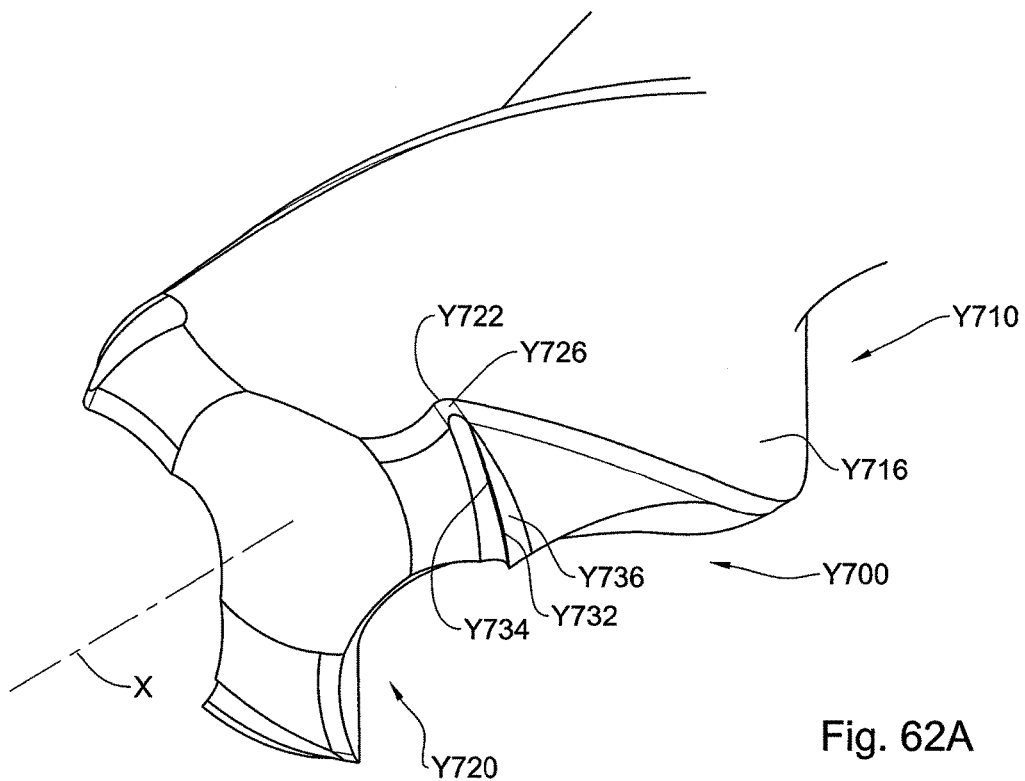
Figure 62B:
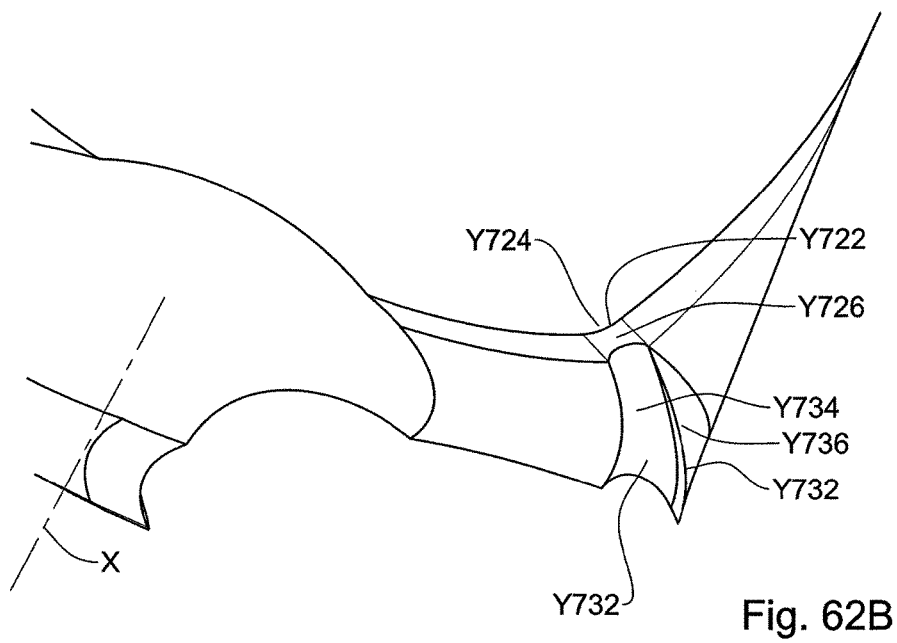
Figure 63A:
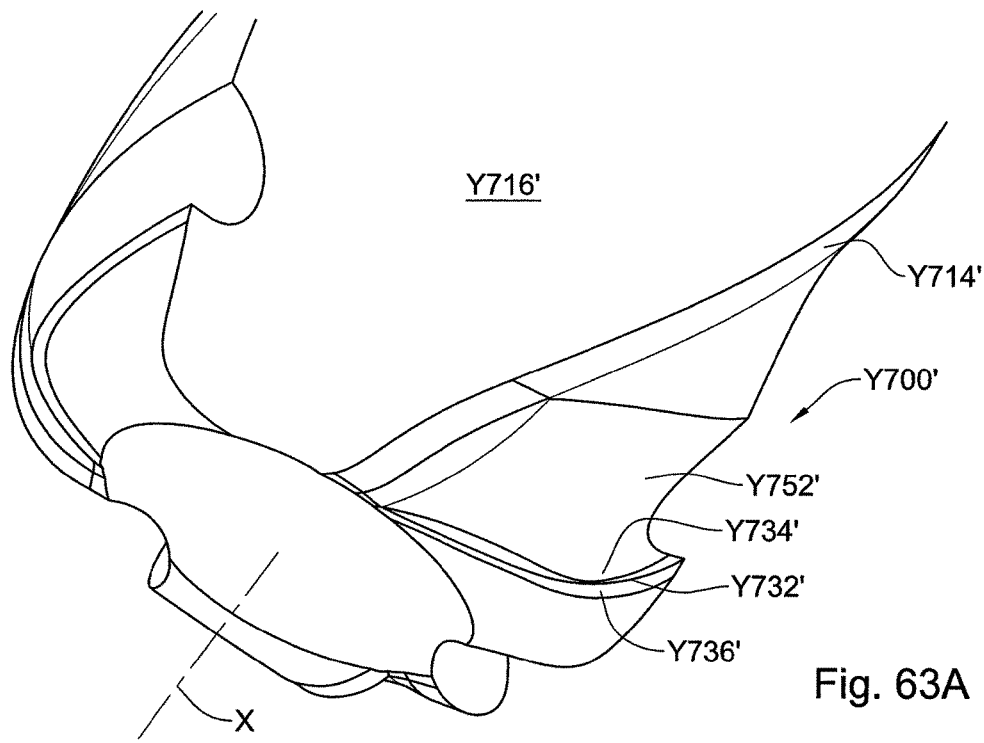
Figure 63B:
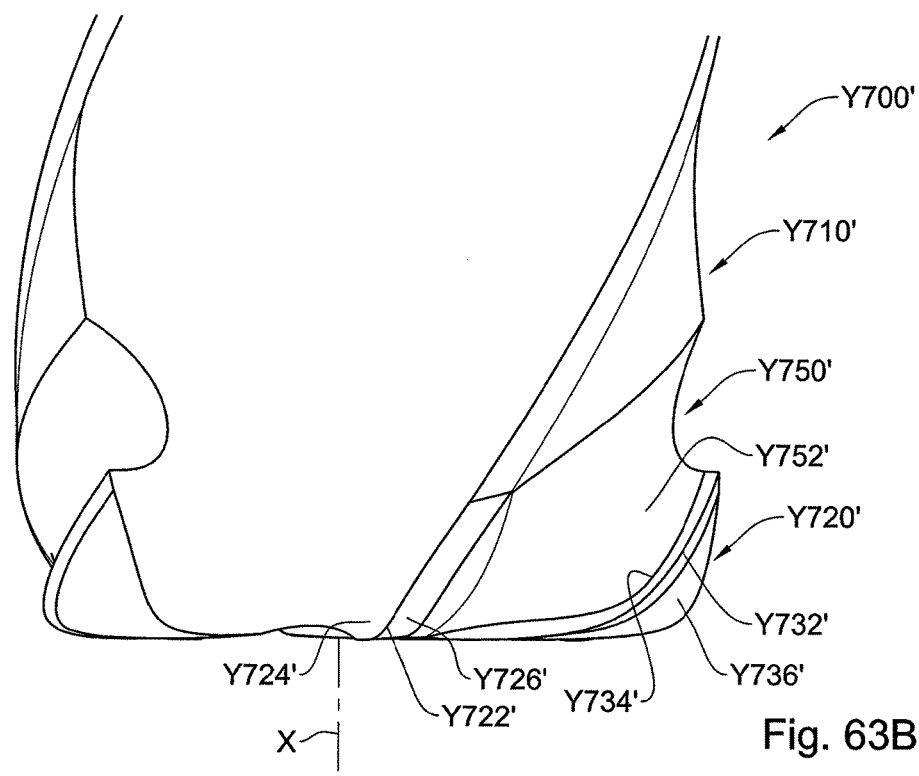
Figure 63C:
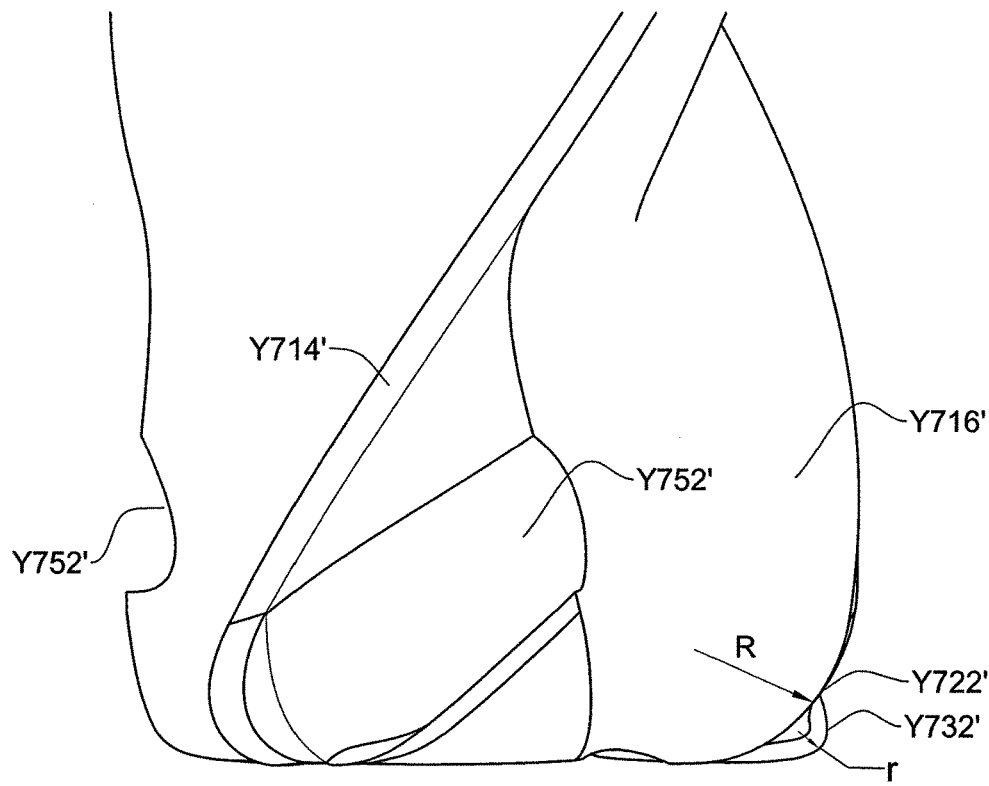
Figure 63D:
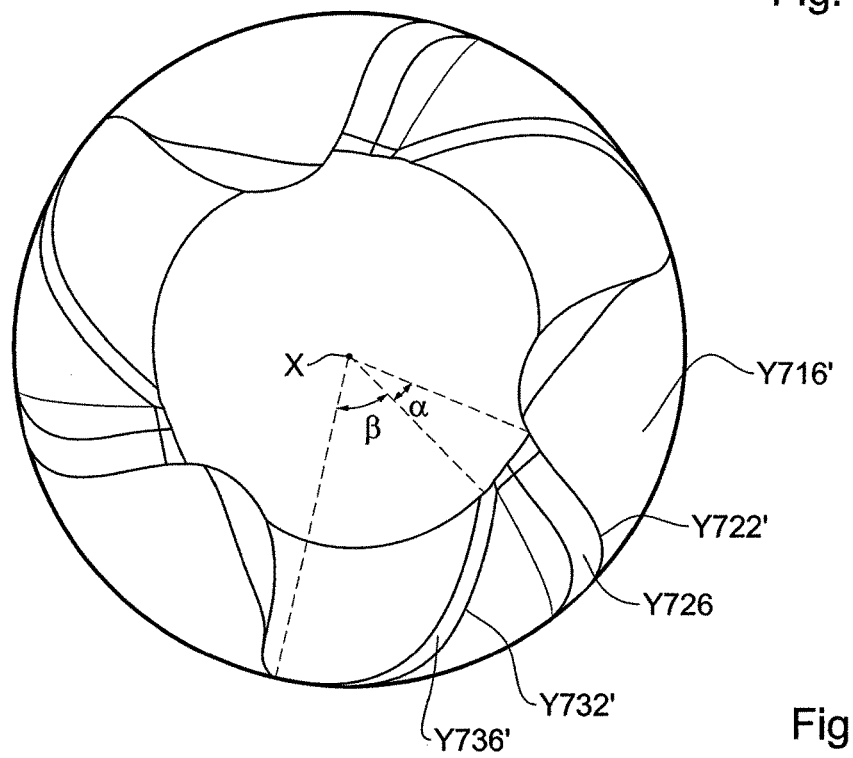
Figure 64A:
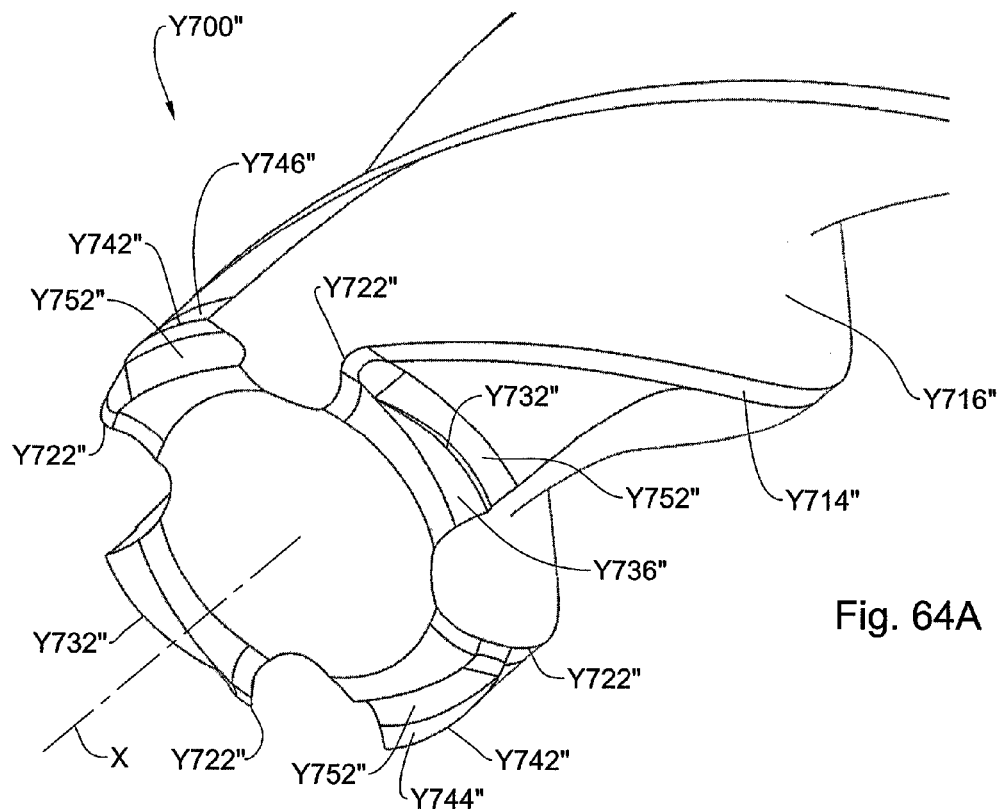
Figure 64B:
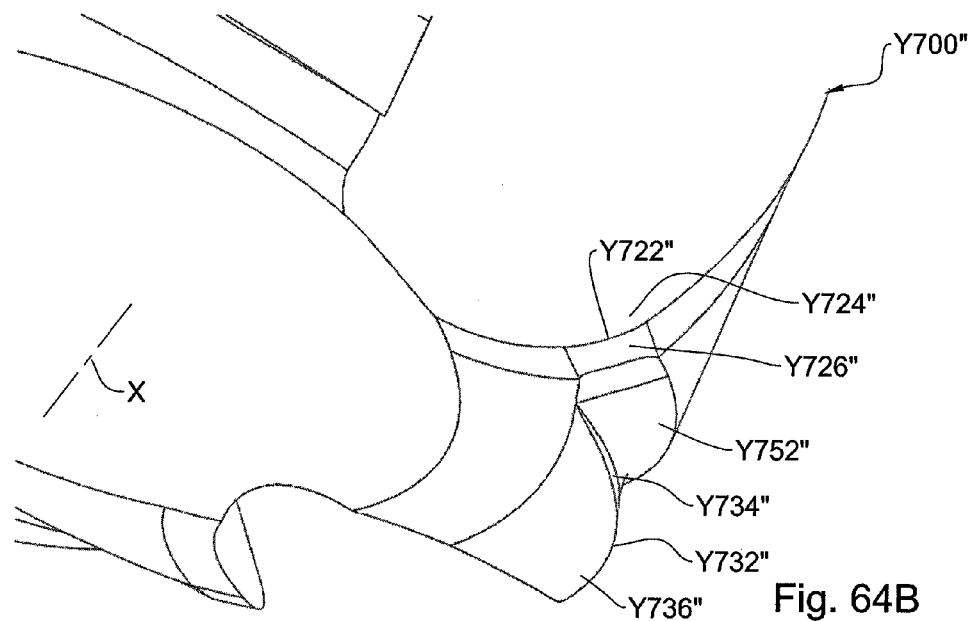
Figure 64C:
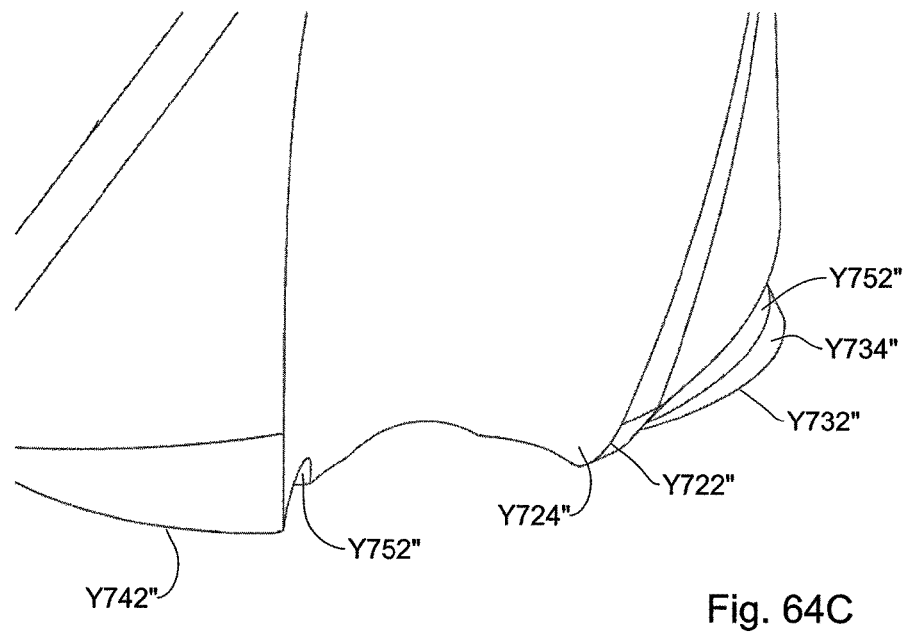
Figure 64D:
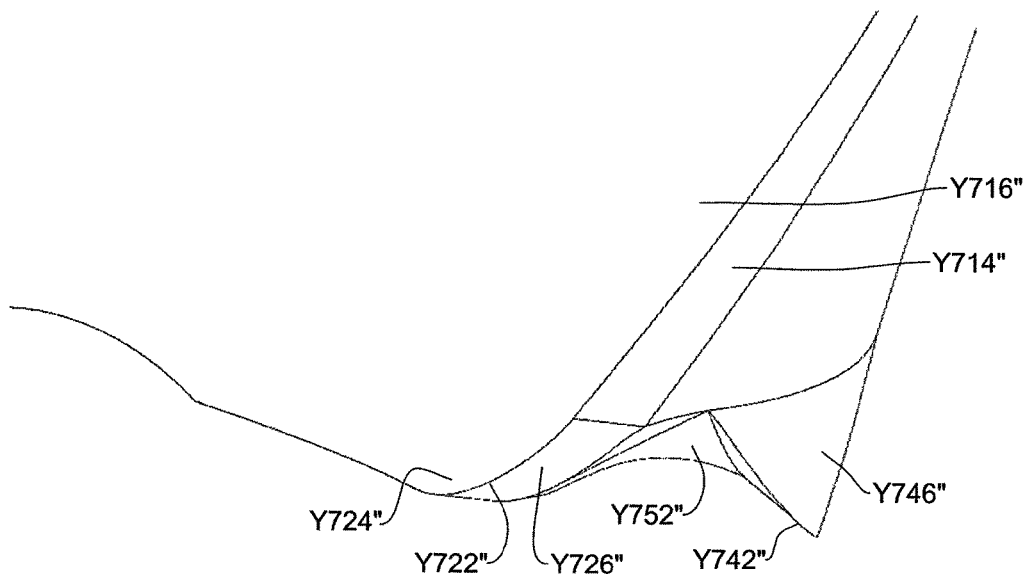
Figure 64E:
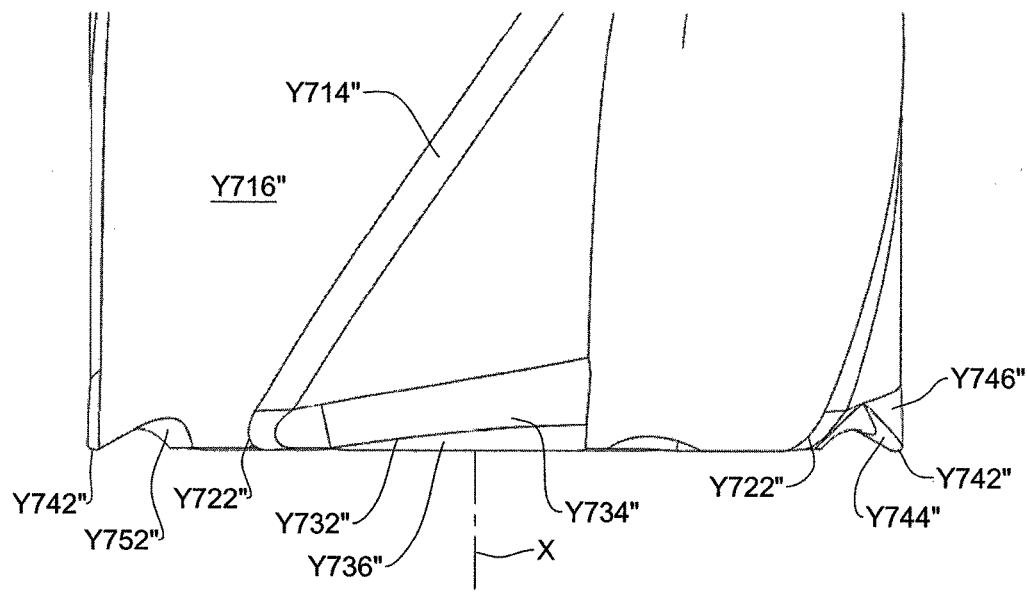
Figure 64F:
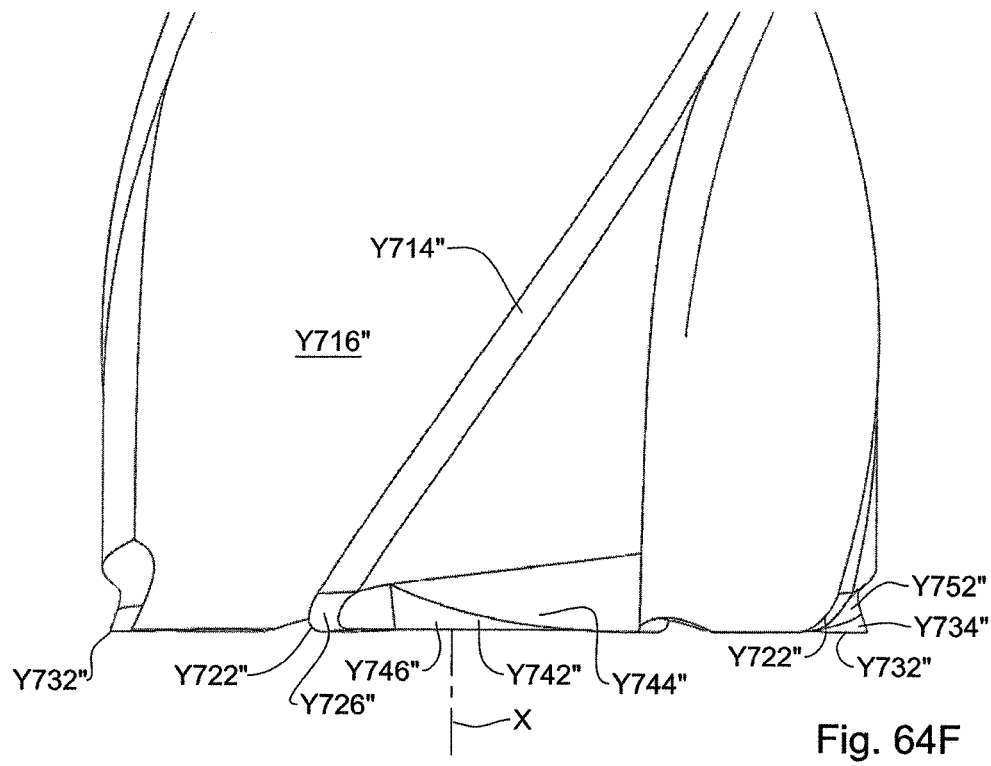

FIG. 43A is a schematic isometric view of a drill according to the subject matter of the present application;

FIG. 43B is a schematic enlarged view of detail A shown in FIG. 43A;

FIG. 43C is a schematic enlarged view of a detail of a cutting portion of the drill shown in FIG. 43A;

FIG. 43D is a schematic front view of detail A shown in FIG. 43B;

FIG. 43E is a schematic bottom view of the drill shown in FIG. 43A;

FIGS. 44A to 44H are schematic front views of the drill shown in FIG. 1A during consecutive stages of a cutting operation;

FIG. 45A is a schematic isometric view of a cutting portion of another example of a drill of the subject matter of the present application;

FIG. 45B is a schematic enlarged view of a part of the cutting portion shown in FIG. 45A;

FIG. 45C is a schematic rotated view of the part shown in FIG. 45B;

FIG. 45D is a schematic bottom view of the drill shown in FIG. 45A;

FIGS. 46A to 46H are schematic front views of the drill shown in FIG. 3A during consecutive stages of a cutting operation;

FIG. 47 is a schematic isometric view of a cutting portion of still another example of a drill of the subject matter of the present application;

FIGS. 48A to 48K are schematic cross-sectional views of the cutting portion of the drill shown in FIG. 47 during consecutive stages of a cutting operation;

FIG. 49A is a schematic isometric view of a cutting portion of yet another example of a drill of the subject matter of the present application;

FIG. 49B is a schematic enlarged view of a part of the cutting portion shown in FIG. 49A;

FIG. 49C is a schematic rotated view of the part shown in FIG. 49B;

FIG. 49D is a schematic bottom view of the drill shown in FIG. 49A;

FIGS. 49E and 49F are schematic perspective views of a rear part of the cutting portion of the drill shown in FIG. 49A;

FIG. 50A is a schematic isometric view of a cutting portion of yet one more example of a drill of the subject matter of the present application;

FIG. 50B is a schematic enlarged view of a part of the cutting portion shown in FIG. 50A;

FIG. 50C is a schematic bottom view of the drill shown in FIG. 50A;

FIG. 51A is a schematic isometric view of a cutting portion of still one more example of a drill of the subject matter of the present application;

FIG. 51B is a schematic enlarged view of a part of the cutting portion shown in FIG. 51A;

FIG. 51C is a schematic bottom view of the drill shown in FIG. 51A;

FIG. 51D is a schematic cross-sectional view of the drill shown in FIG. 51A during a cutting operation within a workpiece;

FIG. 52A is a schematic isometric view of an endmill according to the subject matter of the present application;

FIG. 52B is a schematic enlarged view of a part of the cutting portion of the endmill shown in FIG. 52A;

FIG. 52C is a schematic front view of the enlarged part shown in FIG. 52B;

FIG. 52D is a schematic bottom view of the endmill shown in FIG. 52A;

FIGS. 53A to 53E are schematic front views of the endmill shown in FIG. 52A during consecutive stages of a cutting operation;

FIG. 54A is a schematic isometric view of an endmill according to another example of the subject matter of the present application;

FIG. 54B is a schematic enlarged front view of a cutting portion of the endmill shown in FIG. 54A;

FIG. 55A is a schematic isometric view of an endmill according to still another example of the subject matter of the present application;

FIG. 55B is a schematic enlarged view of a part of the cutting portion of the endmill shown in FIG. 55A;

FIG. 56 is a schematic isometric view of an endmill according to yet another example of the subject matter of the present application;

FIG. 57 is a schematic isometric view of an endmill according to still one more example of the subject matter of the present application;

FIGS. 58A to 58D are schematic cross-sectional comparisons between various designs of cutting portions of the subject matter of the present application;

FIGS. 59A to 59D are schematic cross-sectional views of the cutting portion of FIGS. 58A to 58D during consecutive stages of a cutting operation;

FIG. 60A is a schematic isometric view of a cutting portion of yet one more example of a drill of the subject matter of the present application;

FIG. 60B is a schematic front view of a part of the cutting portion shown in FIG. 60A;

FIG. 60C is a schematic front view of a pre-formed stage of the drill shown in FIG. 60A;

FIG. 60D is a schematic front view of the formed stage of the drill shown in FIG. 60A;

FIG. 61A is a schematic isometric view of a cutting portion of still another example of a drill of the subject matter of the present application;

FIG. 61B is a schematic front view of a part of the cutting portion shown in FIG. 61A;

FIGS. 61C to 61G are schematic enlarged front views of the cutting portion of the drill shown in FIG. 61A during consecutive stages of a cutting operation;

FIG. 62A is a schematic isometric view of an endmill according to another example of the subject matter of the present application;

FIG. 62B is a schematic enlarged view of a part of the cutting portion of the endmill shown in FIG. 62A;

FIG. 63A is a schematic isometric view of an endmill according to still another example of the subject matter of the present application;

FIGS. 63B and 63C are schematic enlarged front and side views of a part of the cutting portion of the endmill shown in FIG. 63A;

FIG. 63D is a schematic bottom view of the endmill shown in FIG. 63A;

FIG. 64A is a schematic isometric view of an endmill according to yet another example of the subject matter of the present application;

FIG. 64B a schematic enlarged view of a part of the cutting portion of the endmill shown in FIG. 64A; and FIGS. 64C to 64F are schematic side views of the endmill shown in FIG. 64A at various rotary positions about a central axis thereof.

Figure 65A:
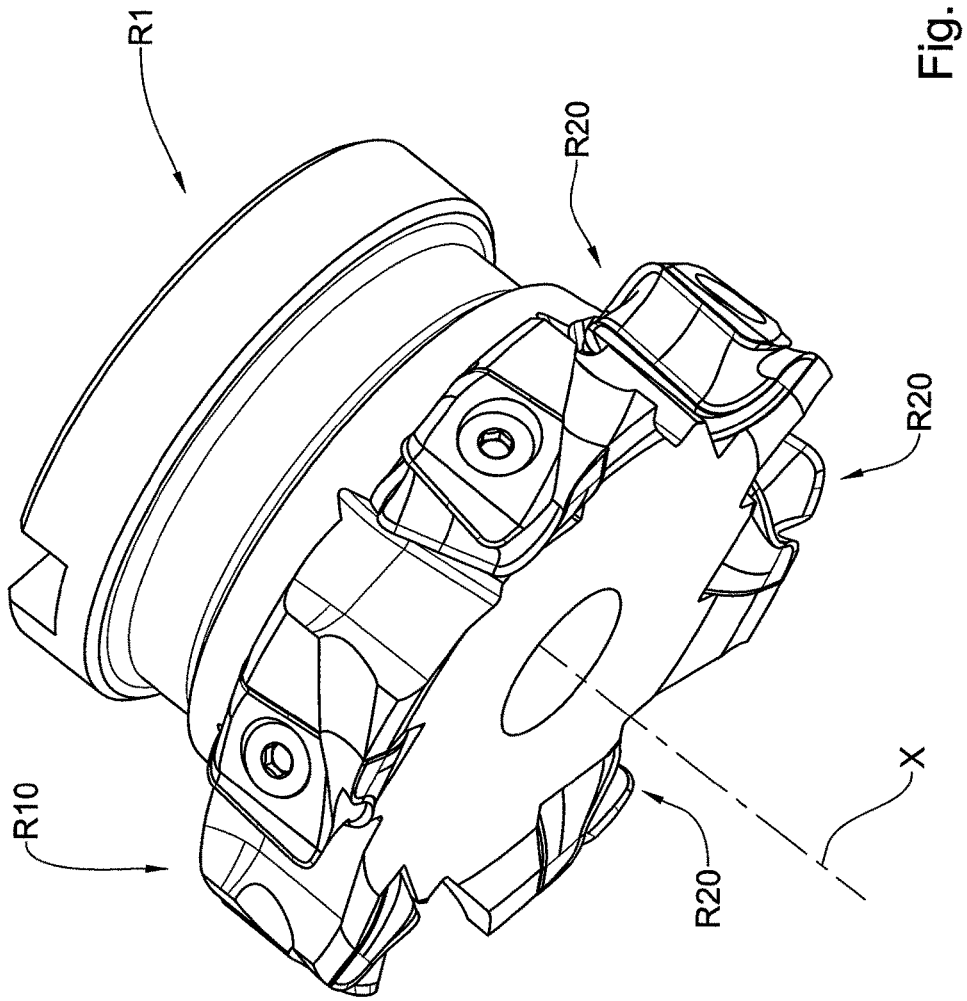
Figure 65B:
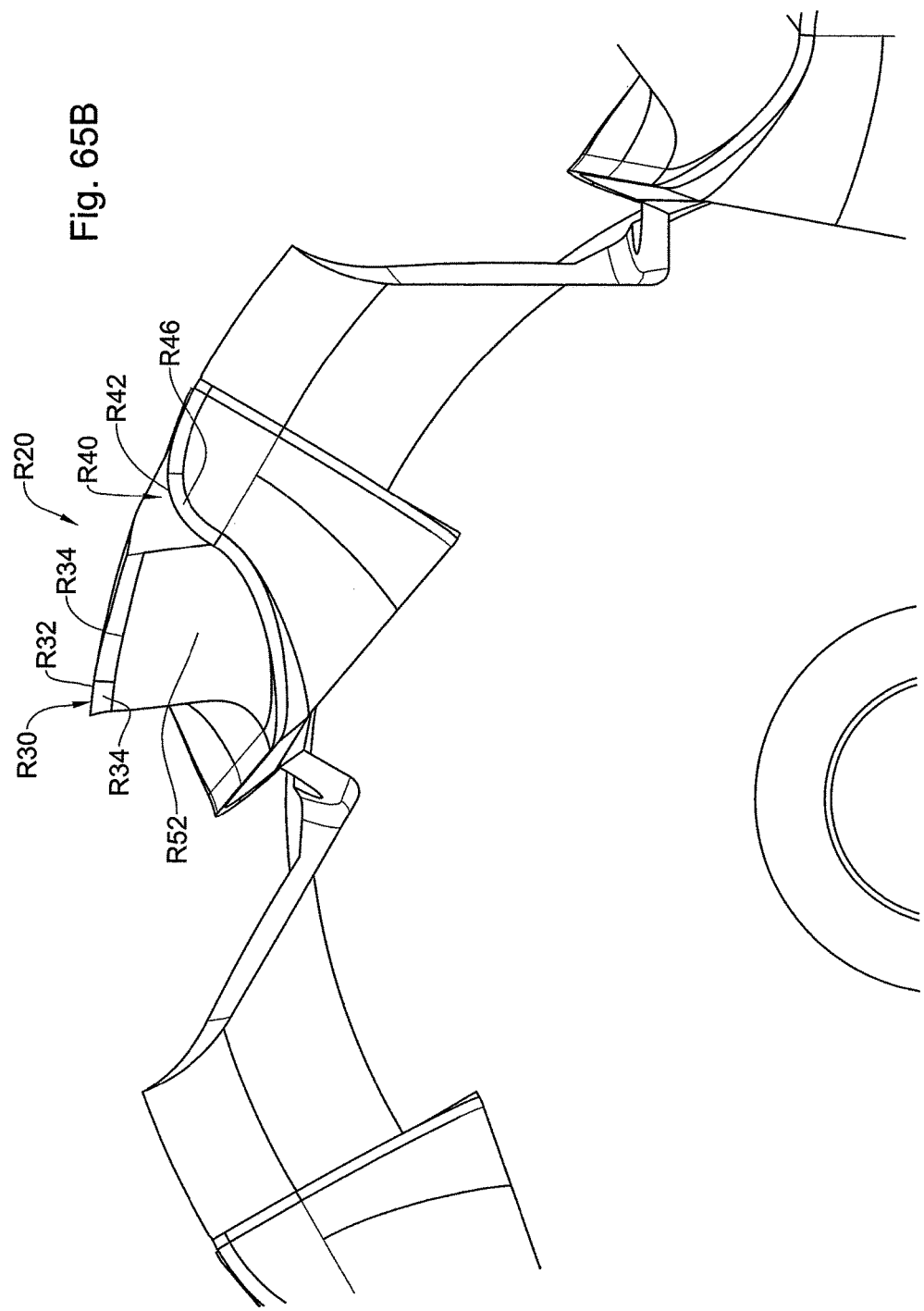
Figure 65C:
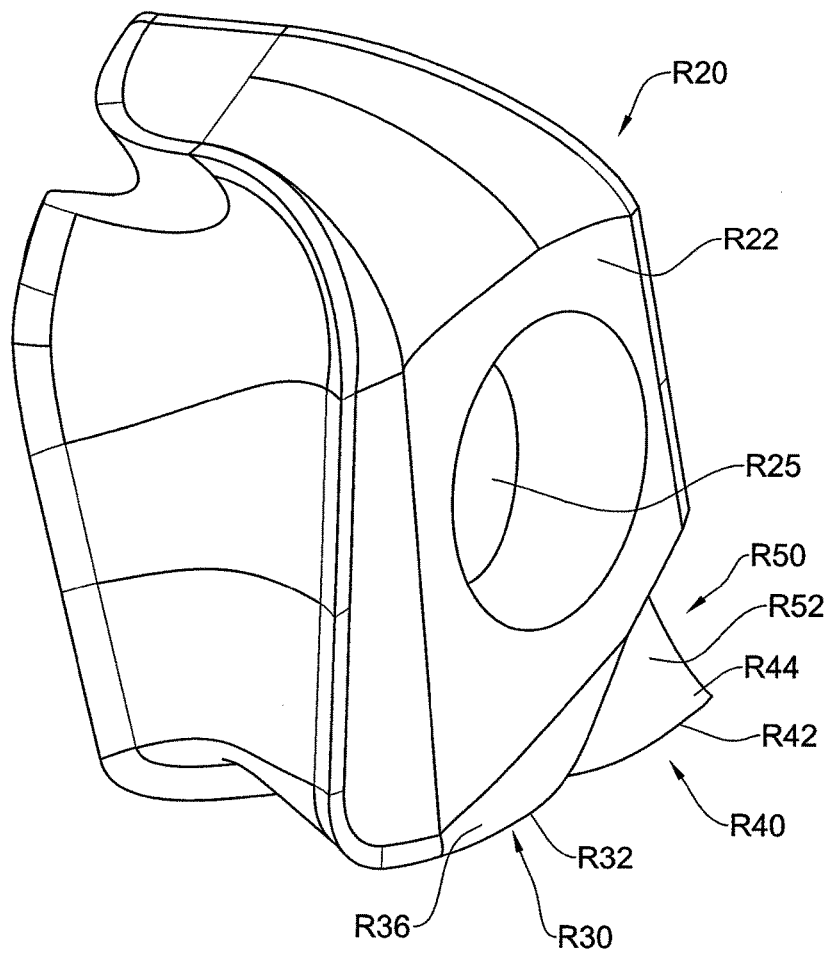
Figure 65D:
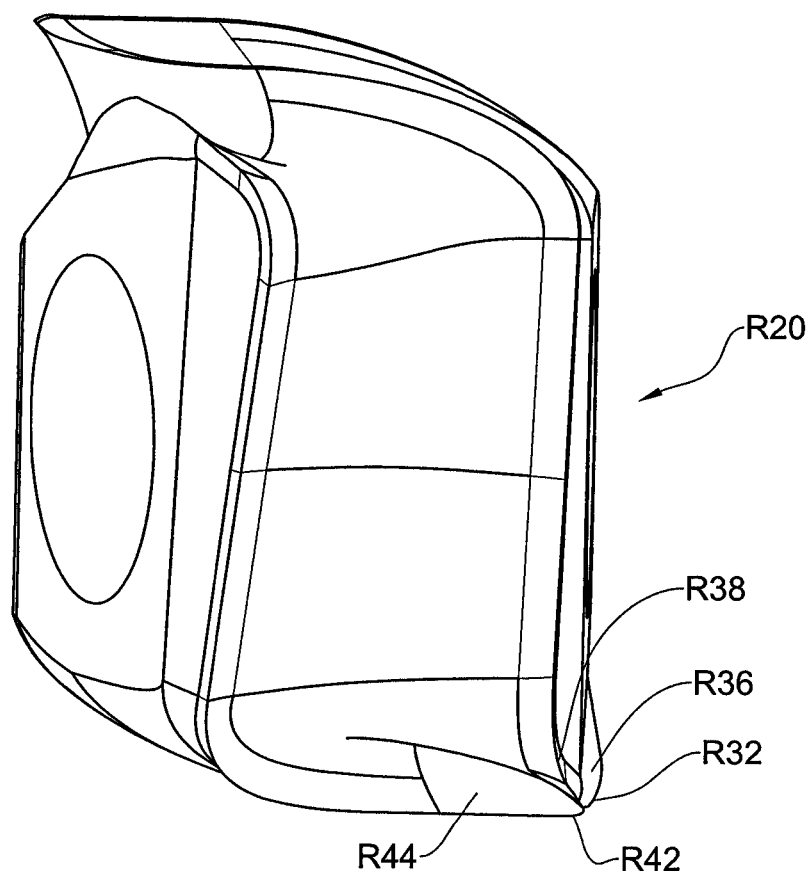
Figure 66A:
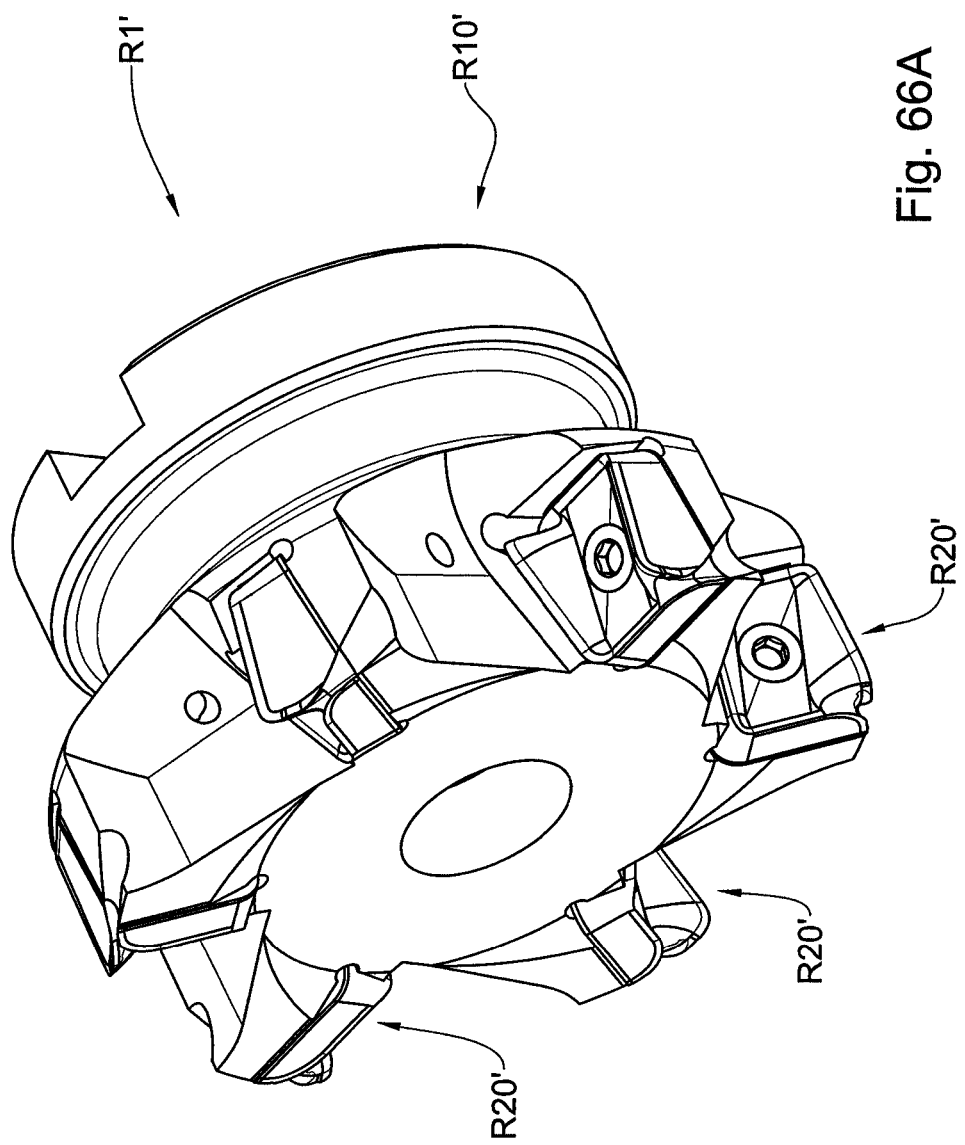
Figure 66B:
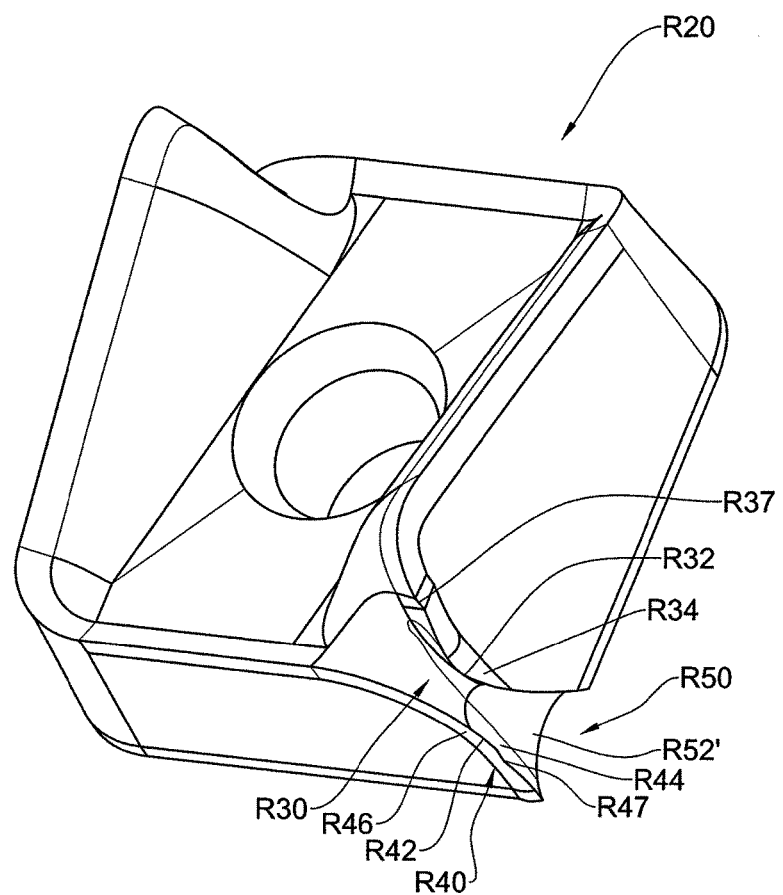
Figure 66C:
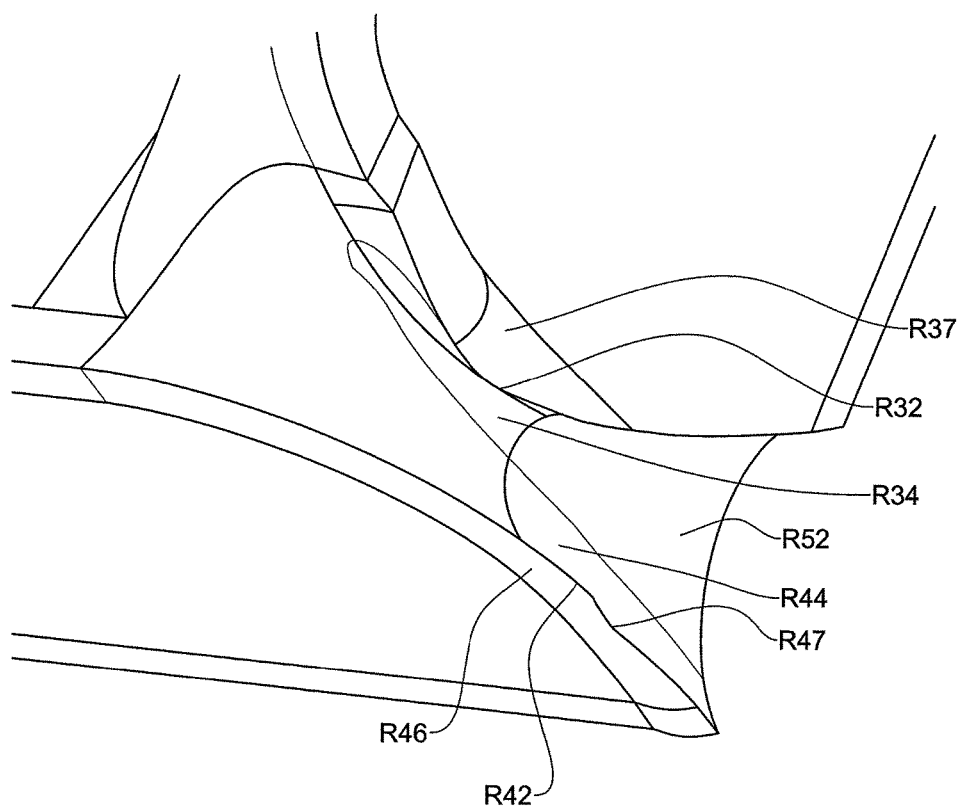
Figure 67A:
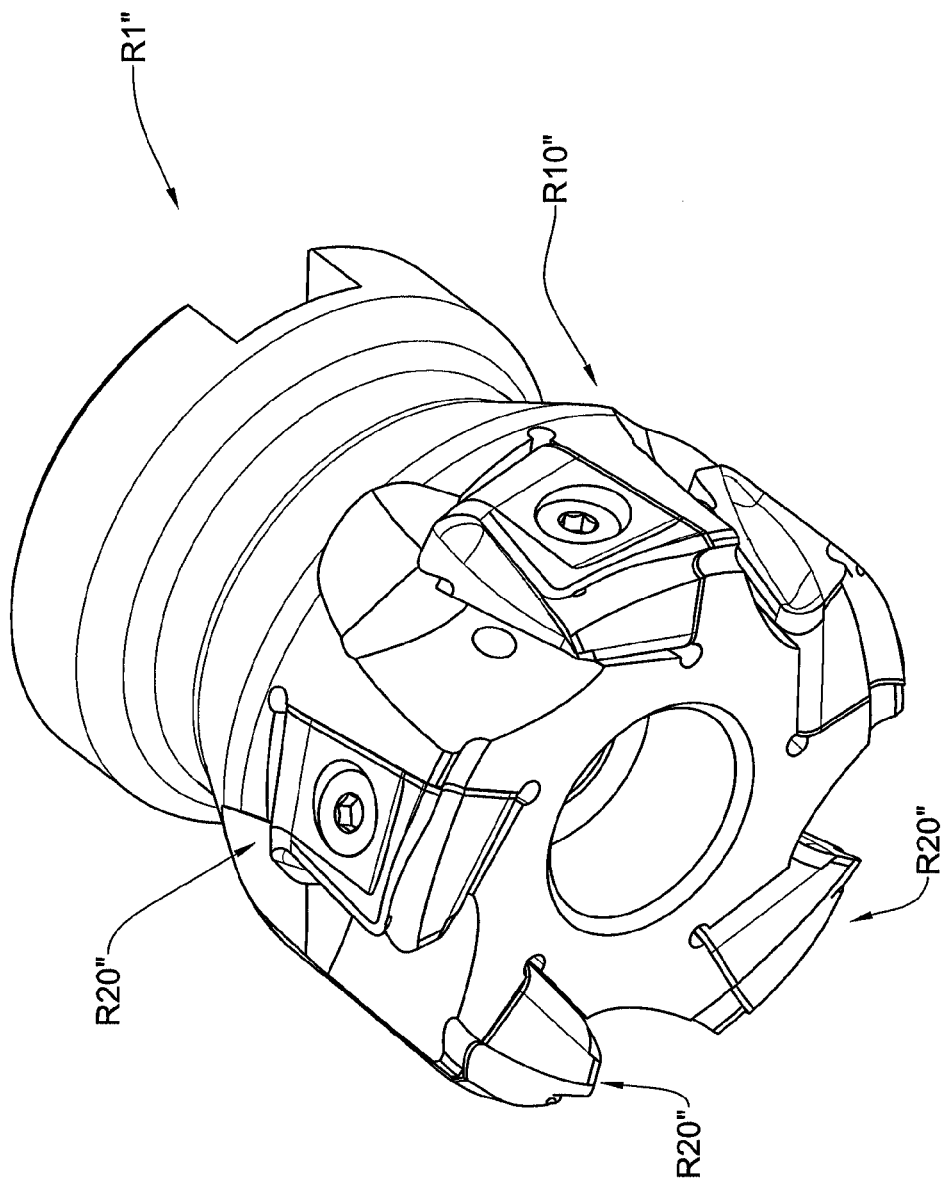
Figure 67B:
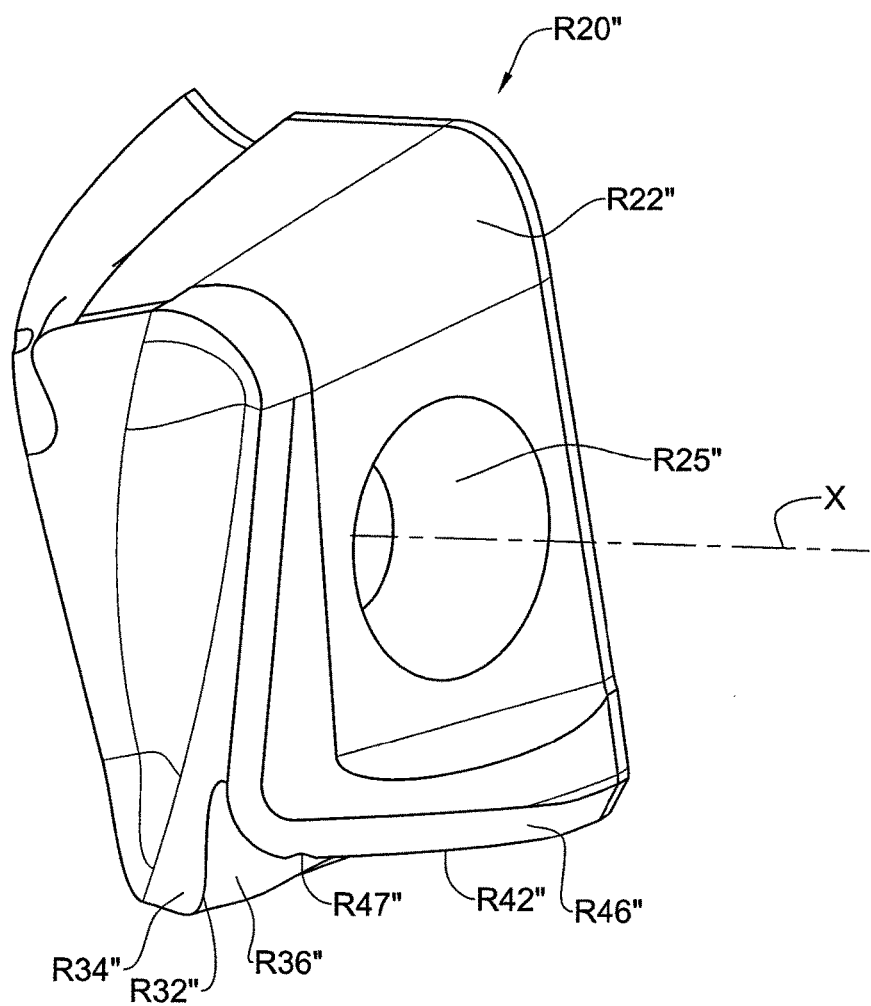
Figure 67C:
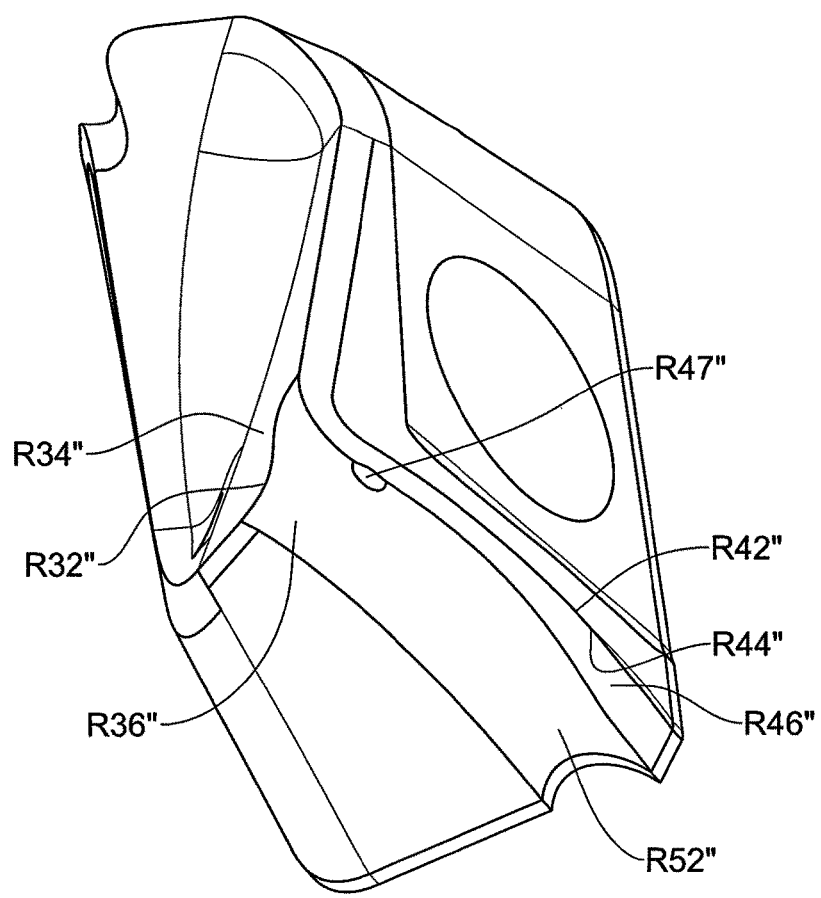
Figure 67D:
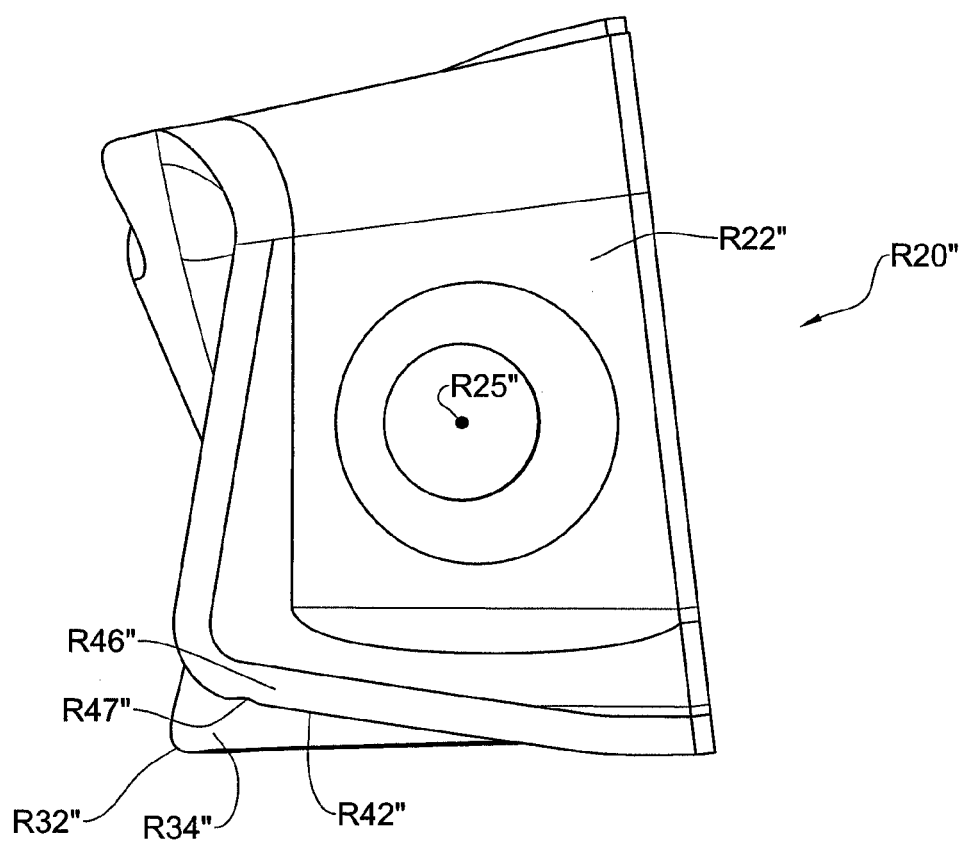
Figure 68A:
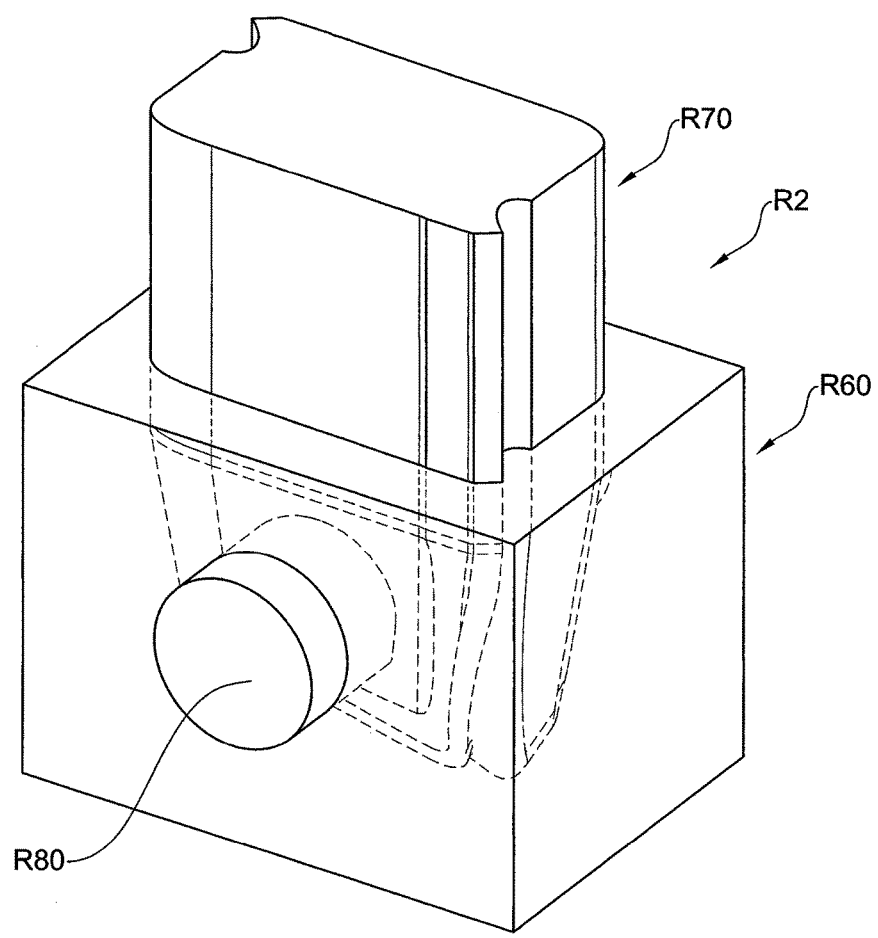
Figure 68B:
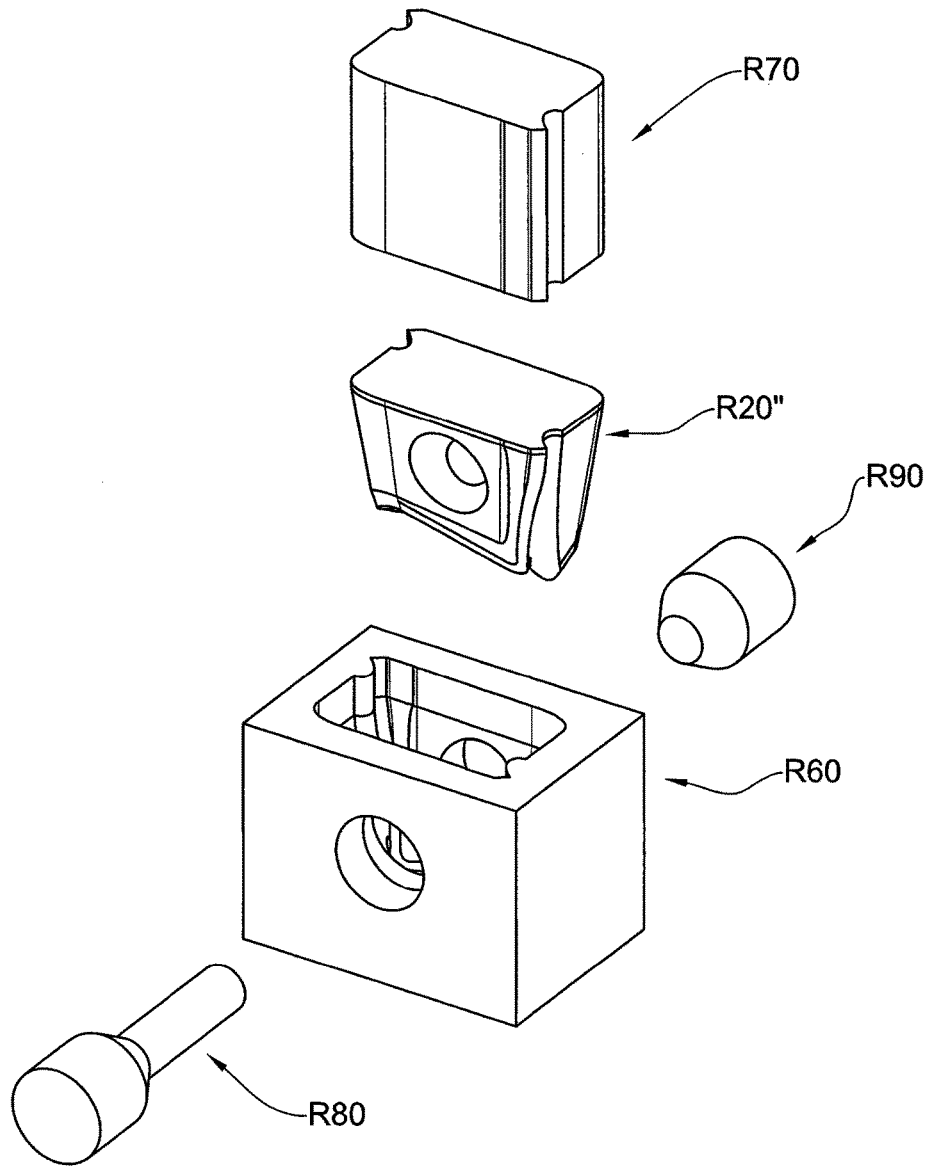
Figure 68C:
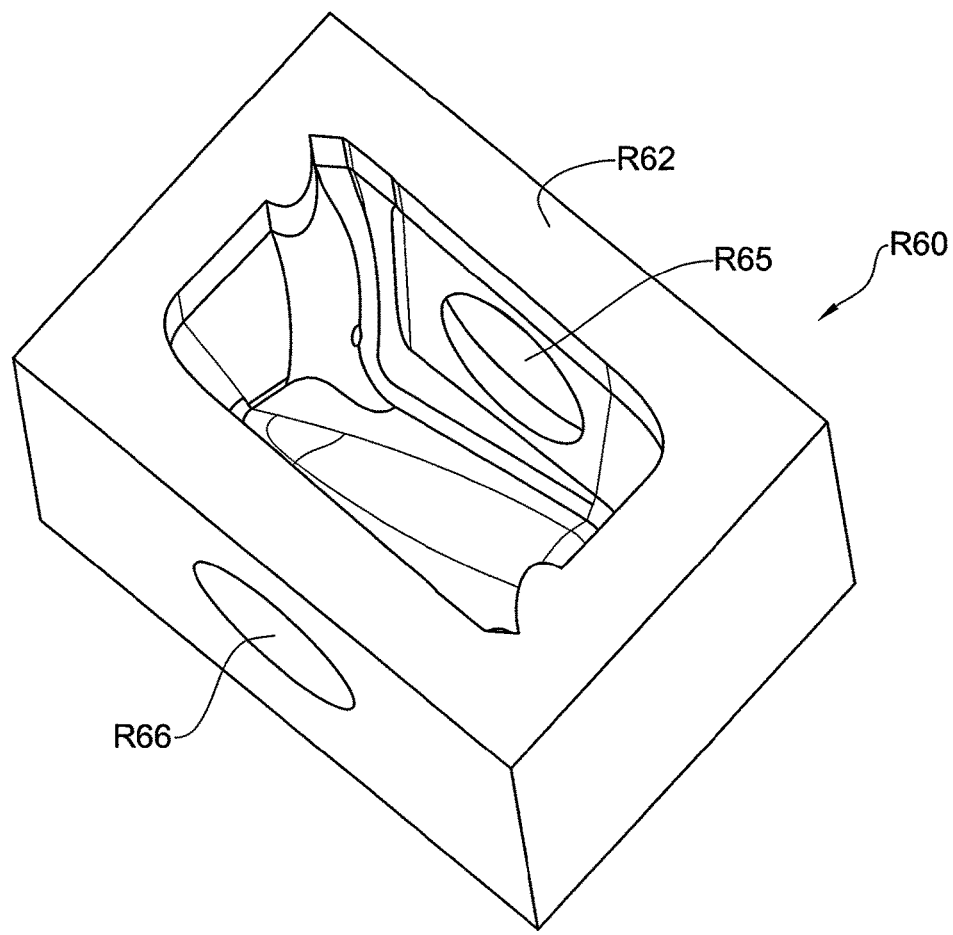
Figure 69A:
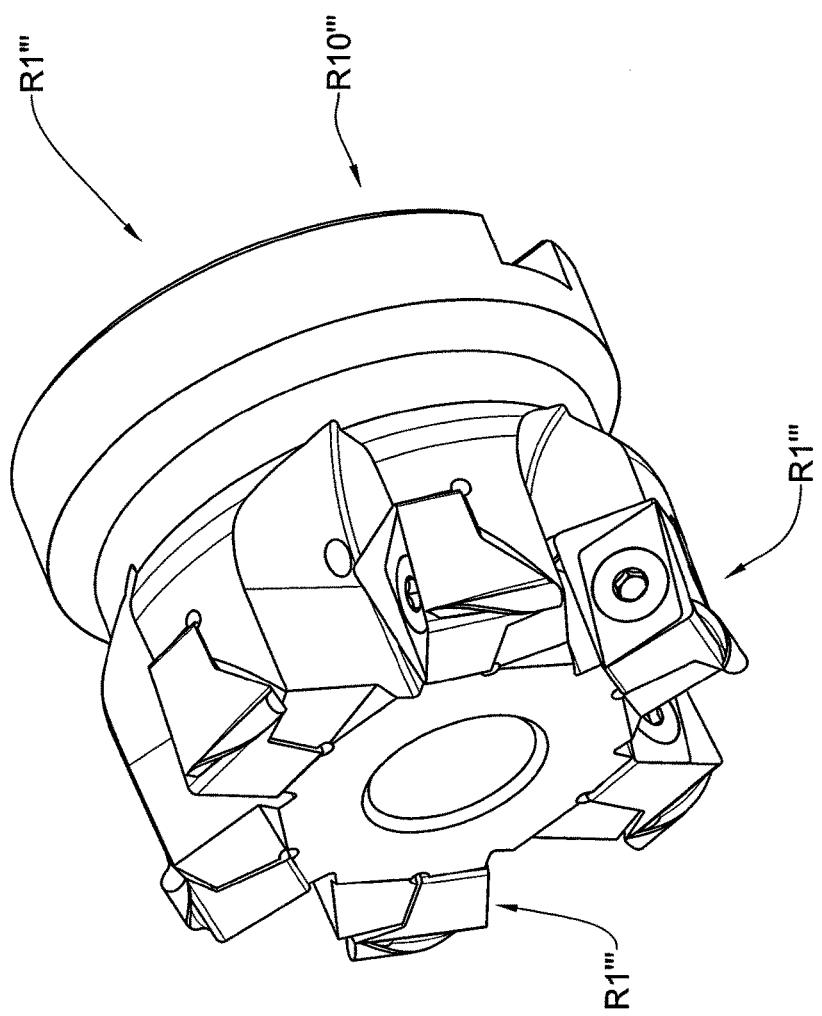
Figure 69B:
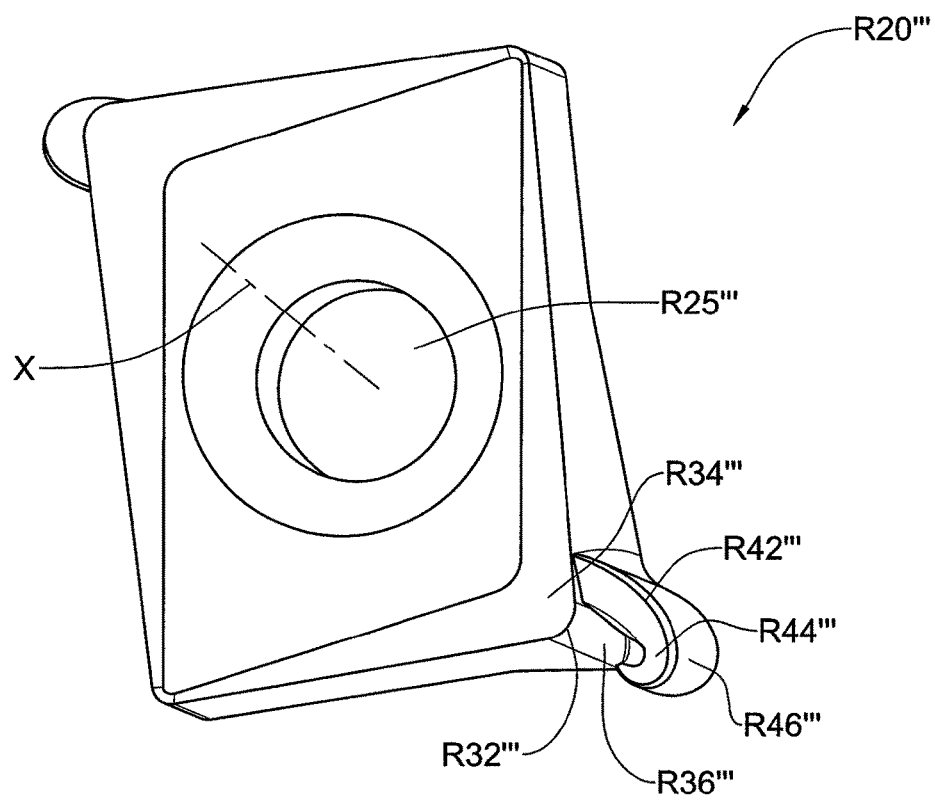
Figure 69C:
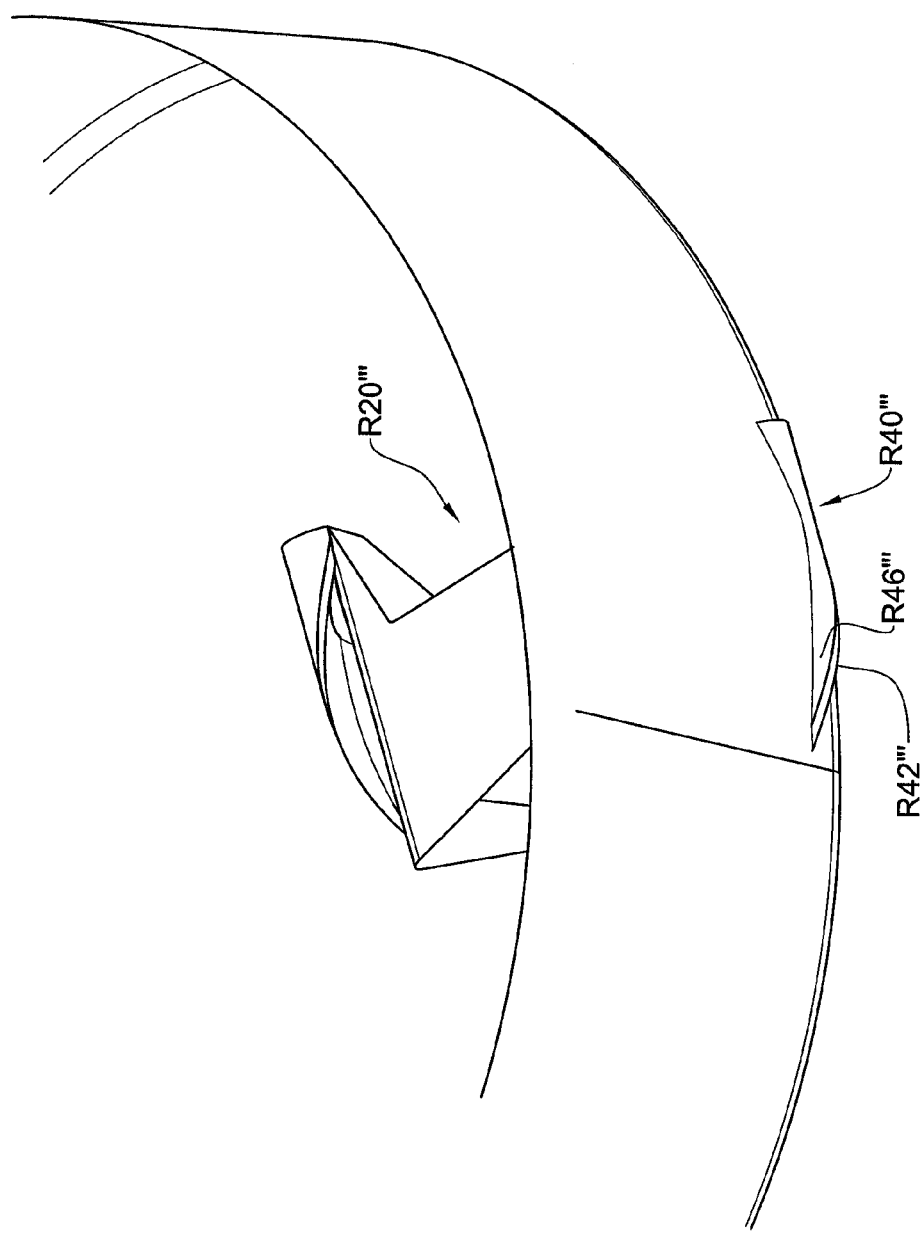
Figure 70A:
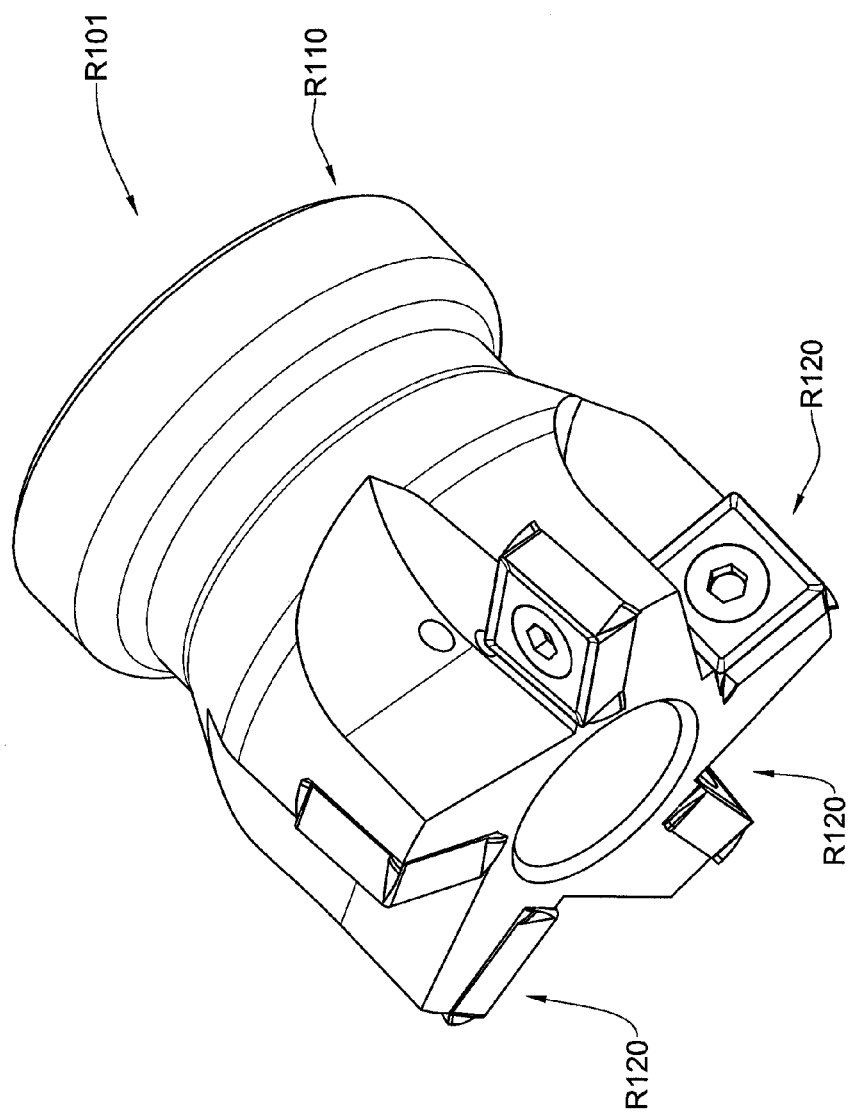
Figure 70B:
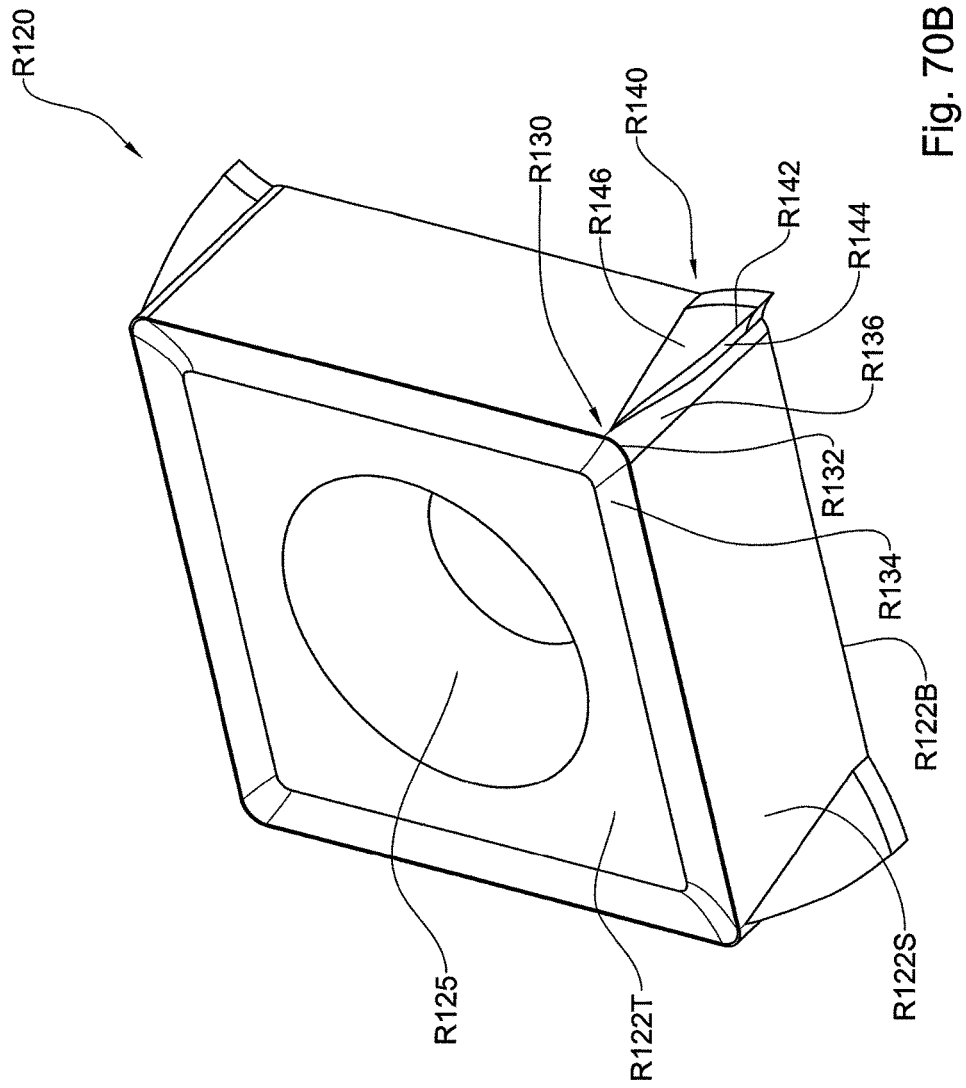
Figure 71:
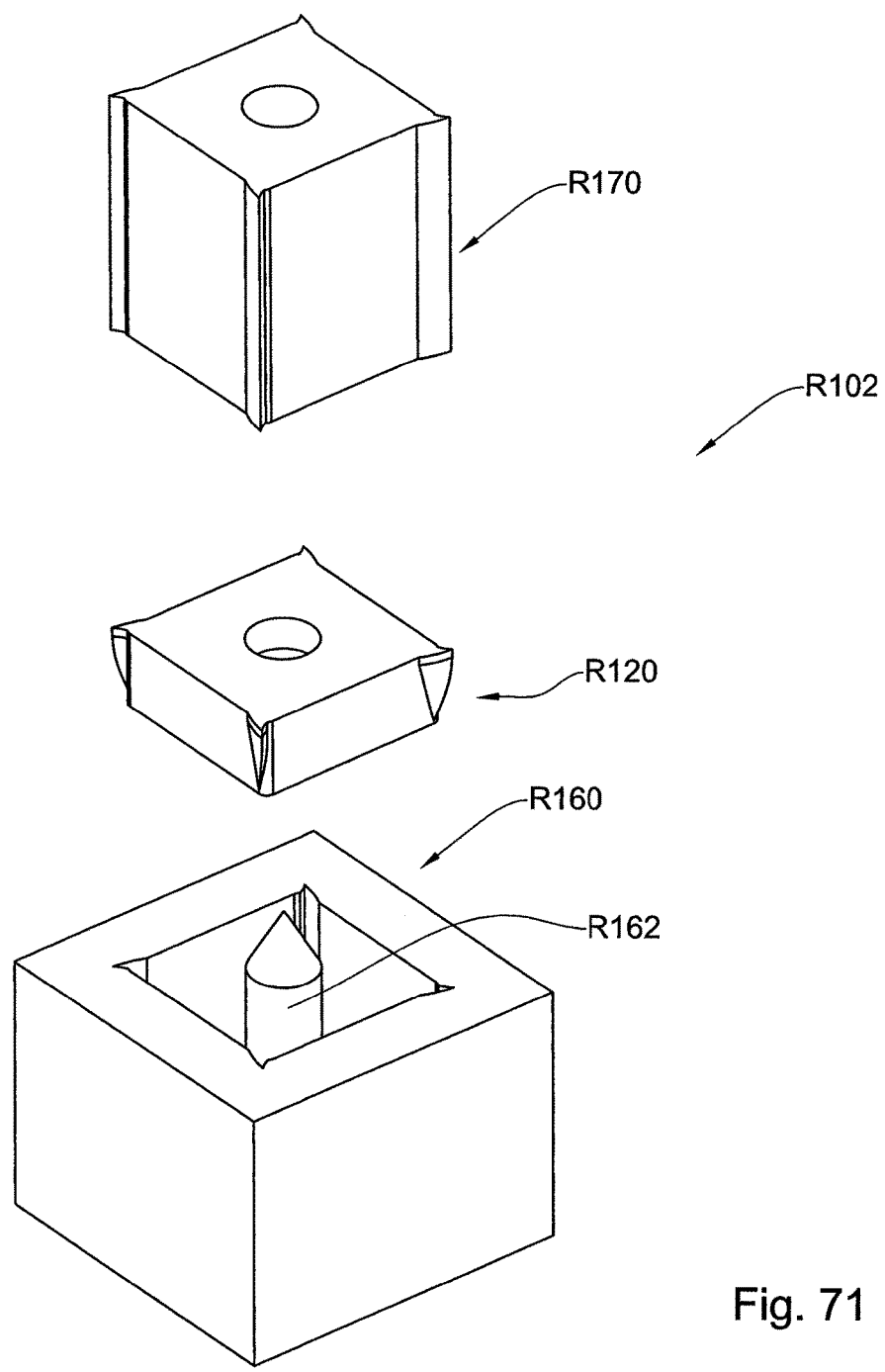
Figure 72A:
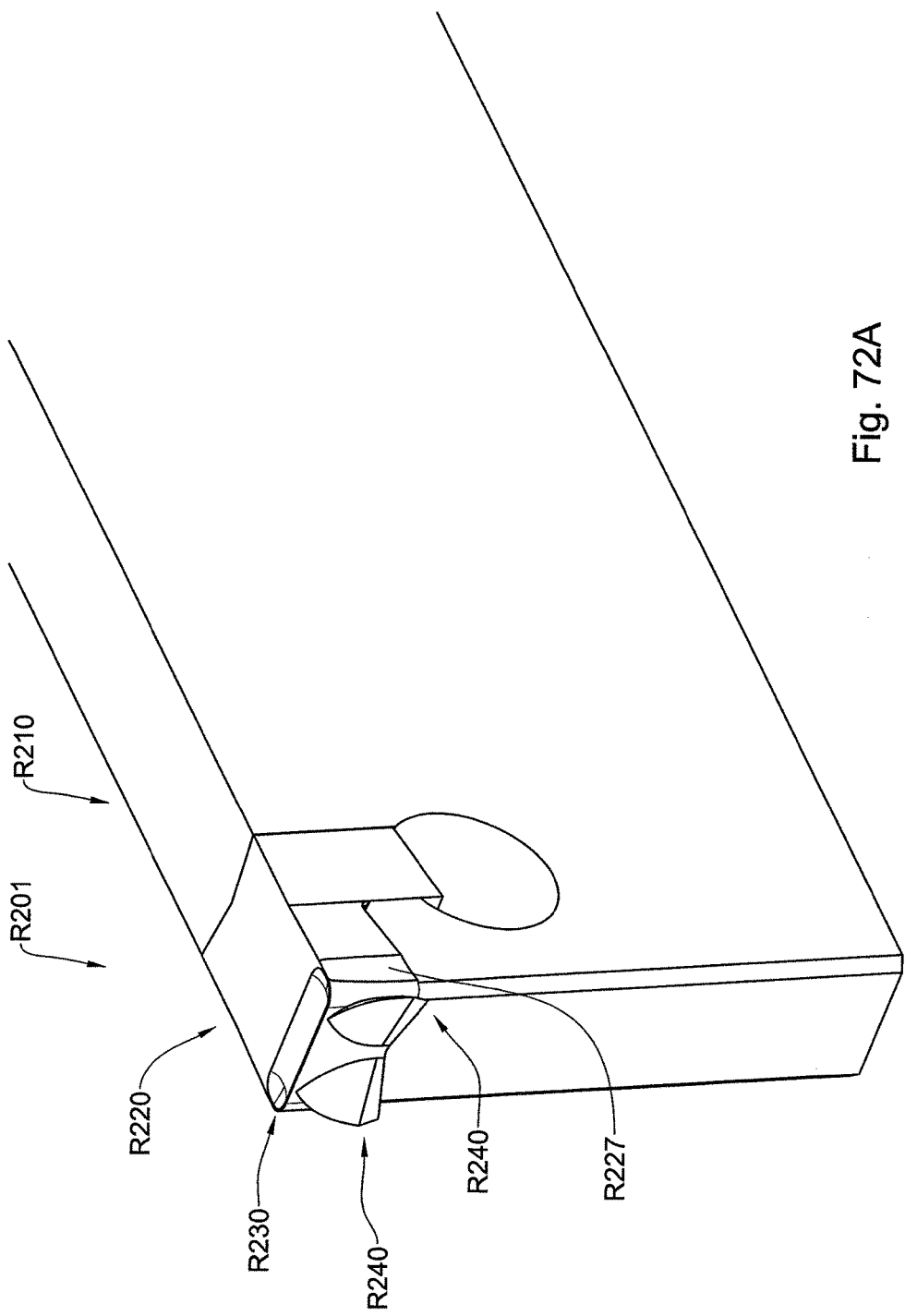
Figure 72B:
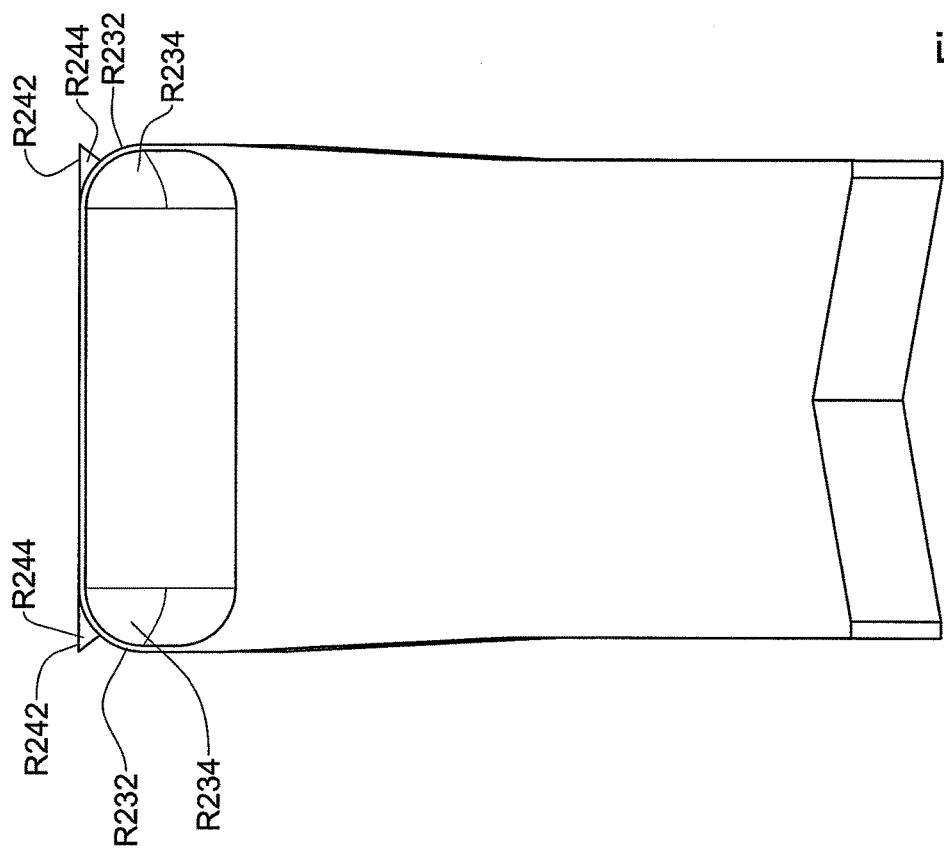
Figure 73A:
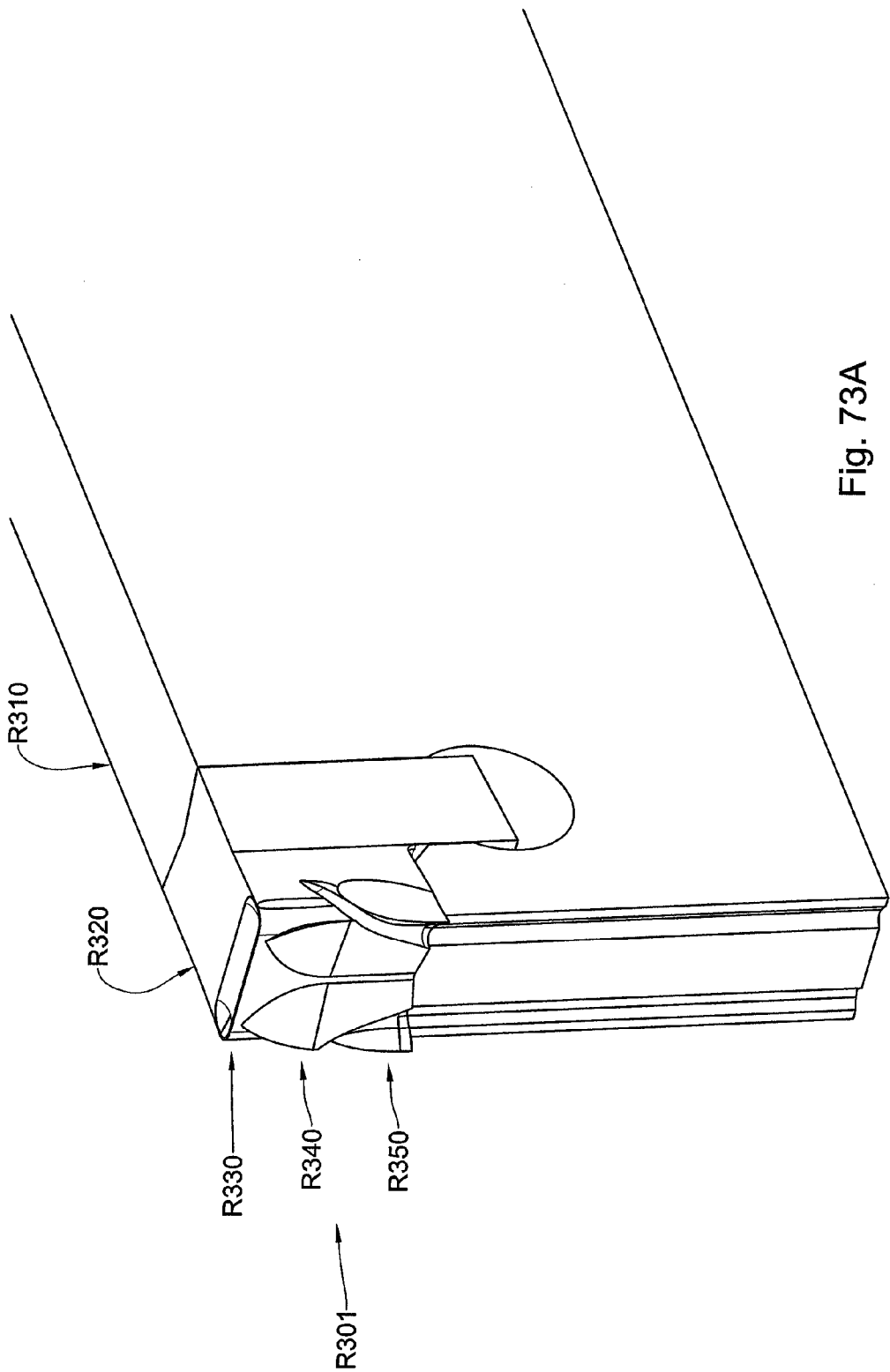
Figure 73B:
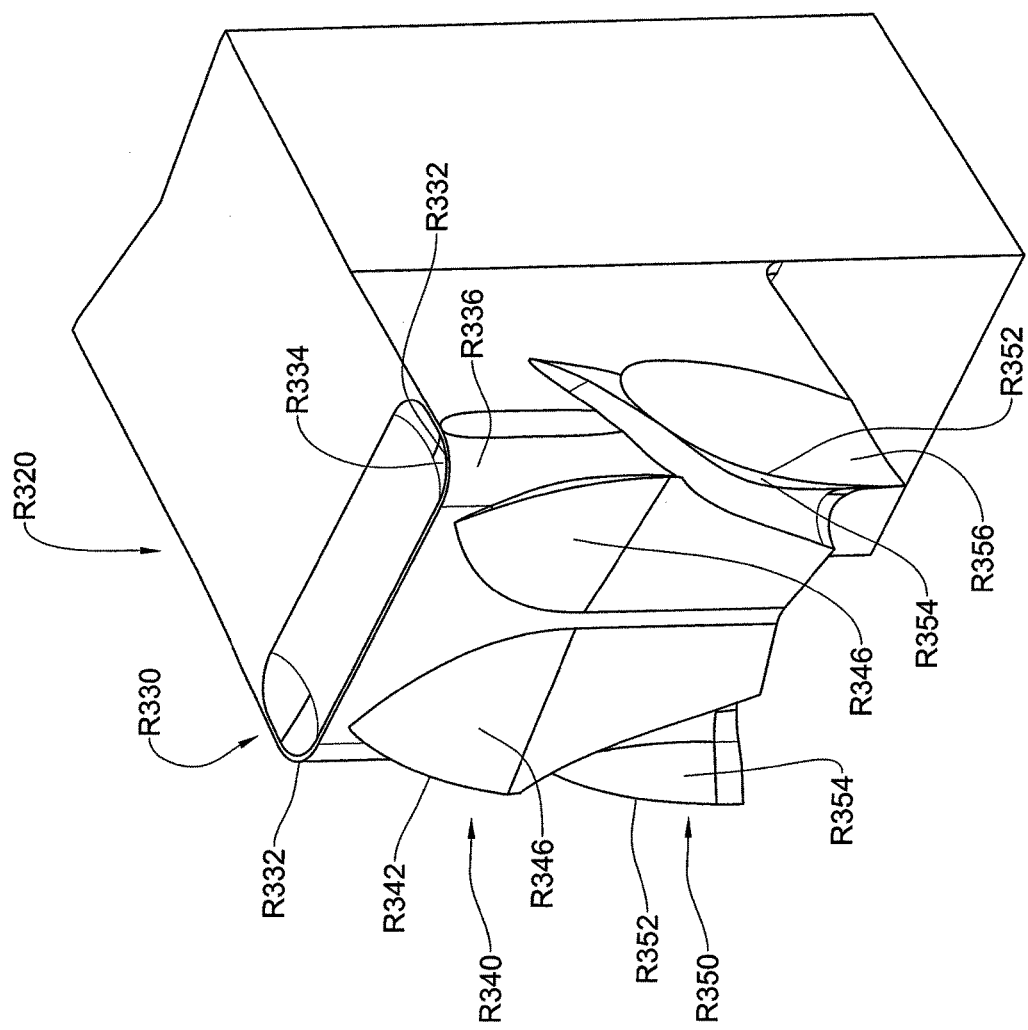
Figure 73D:
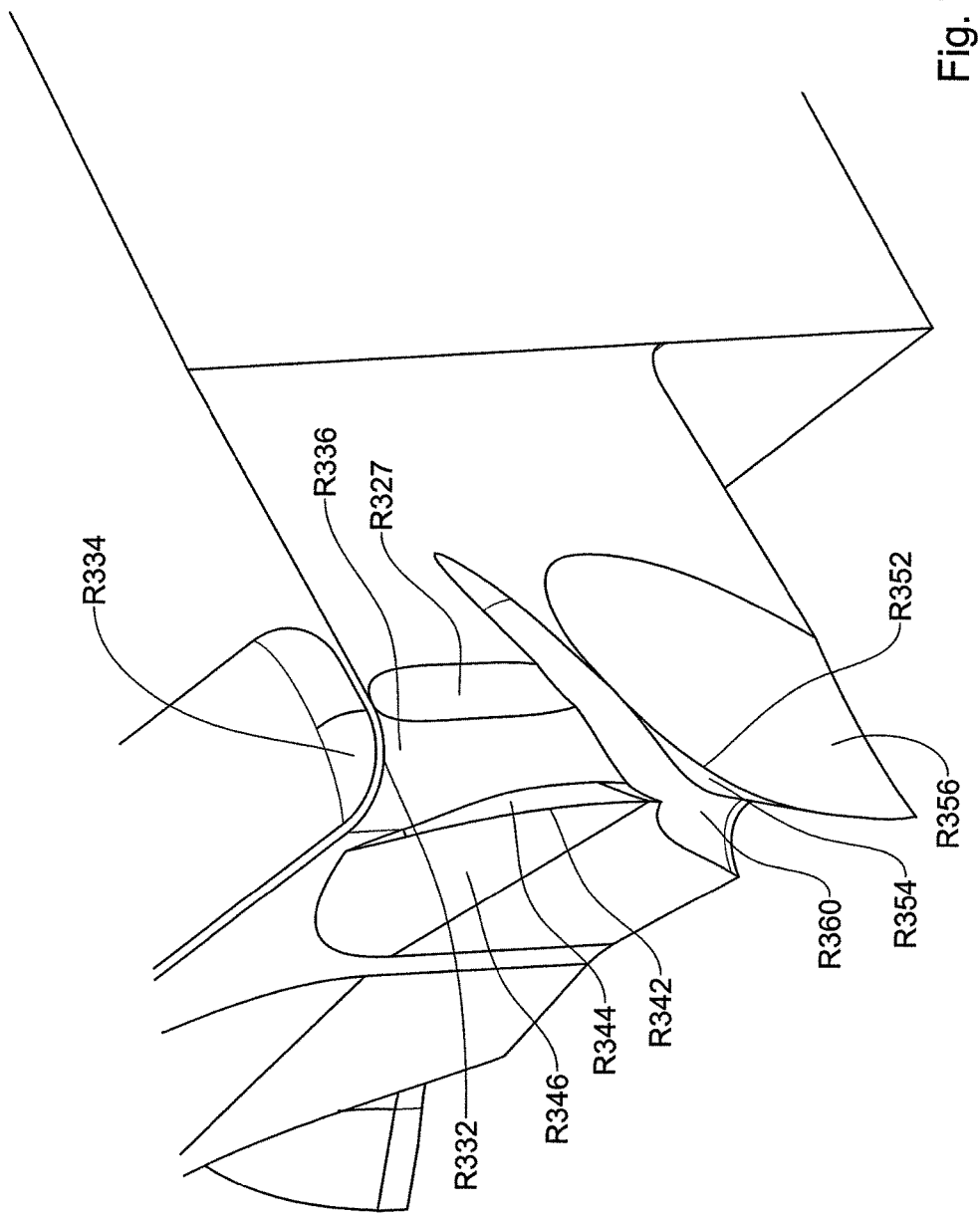
Figure 74A:
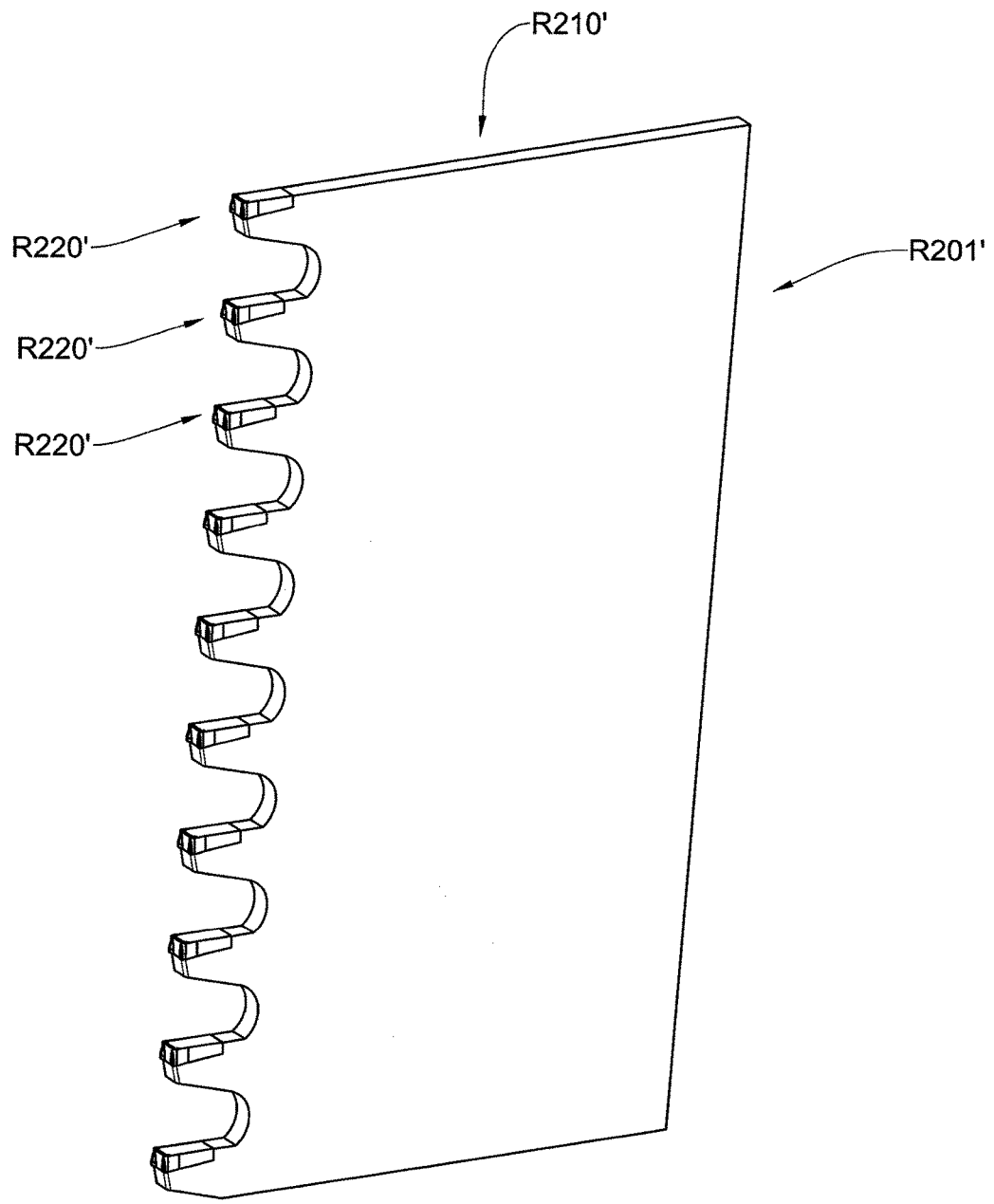
Figure 74B:
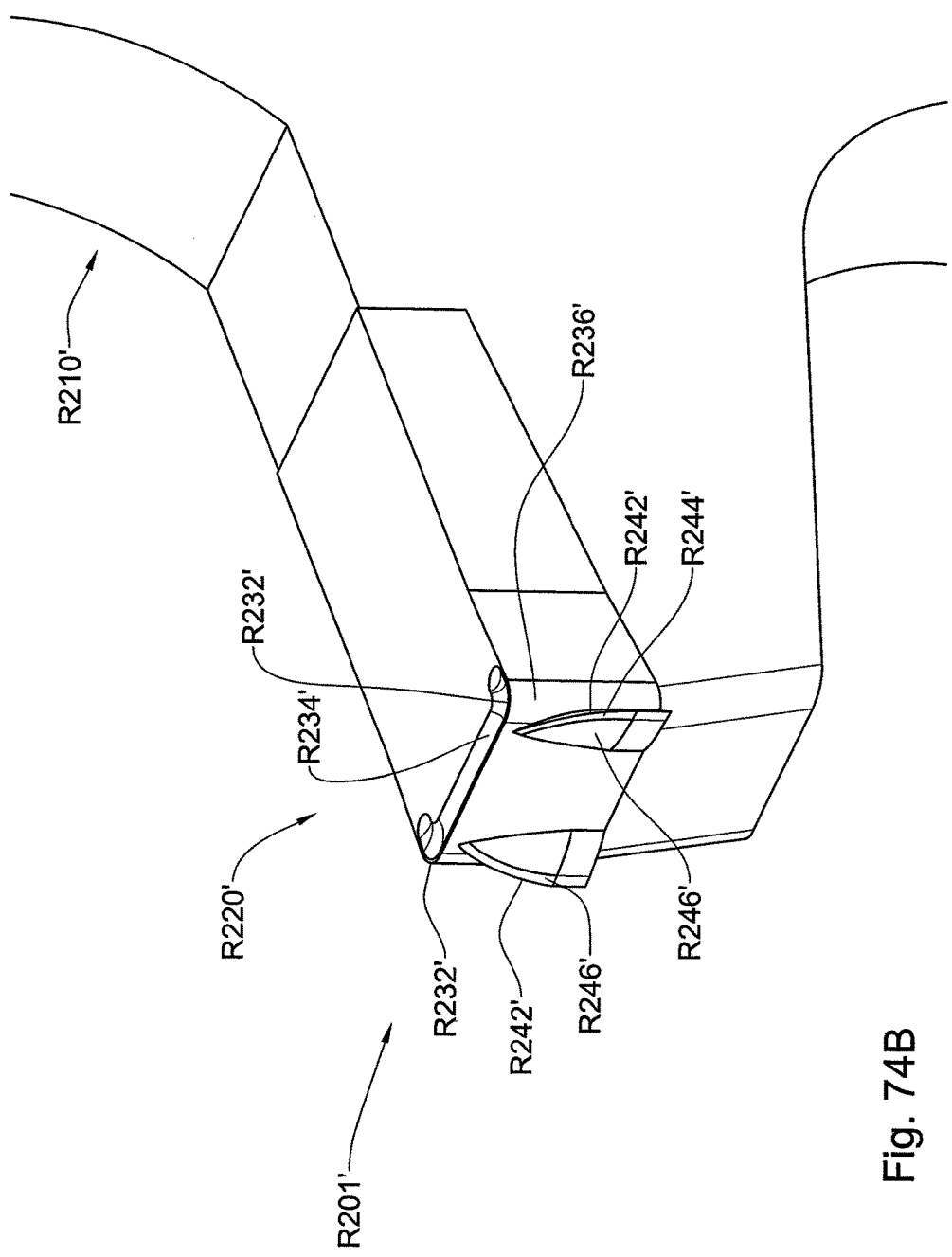
Figure 75A:
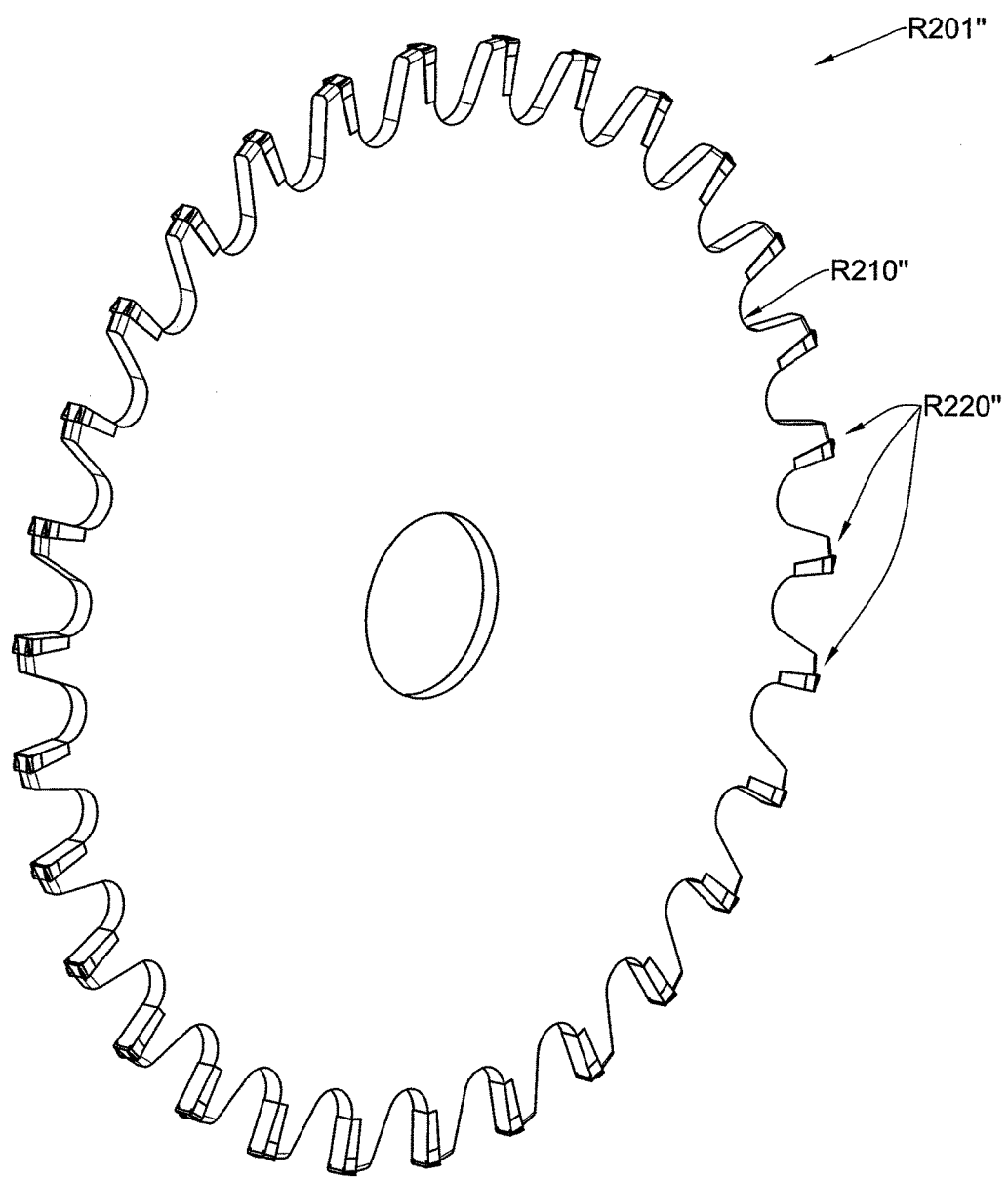
Figure 75B:
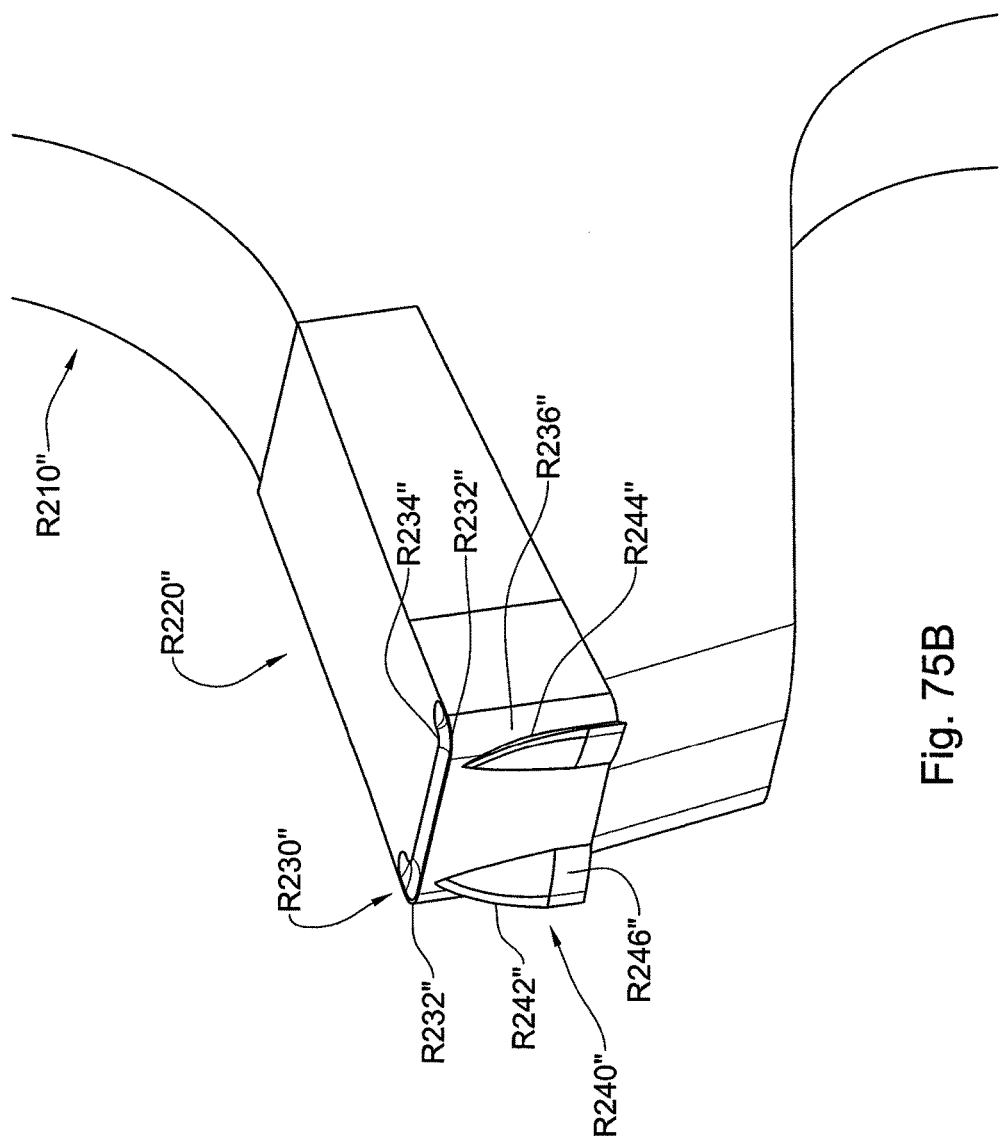
Figure 76A:
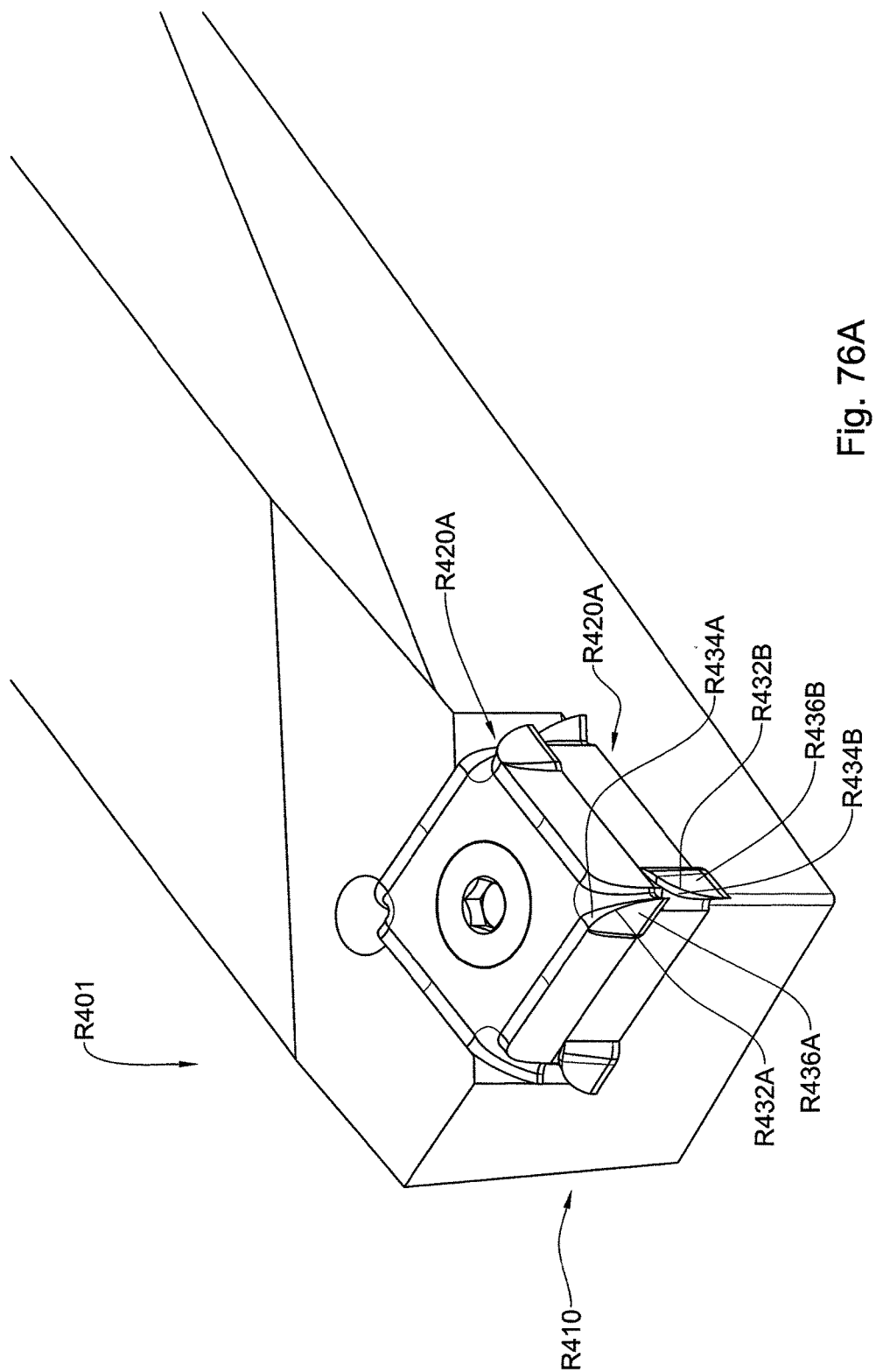
Figure 76B:
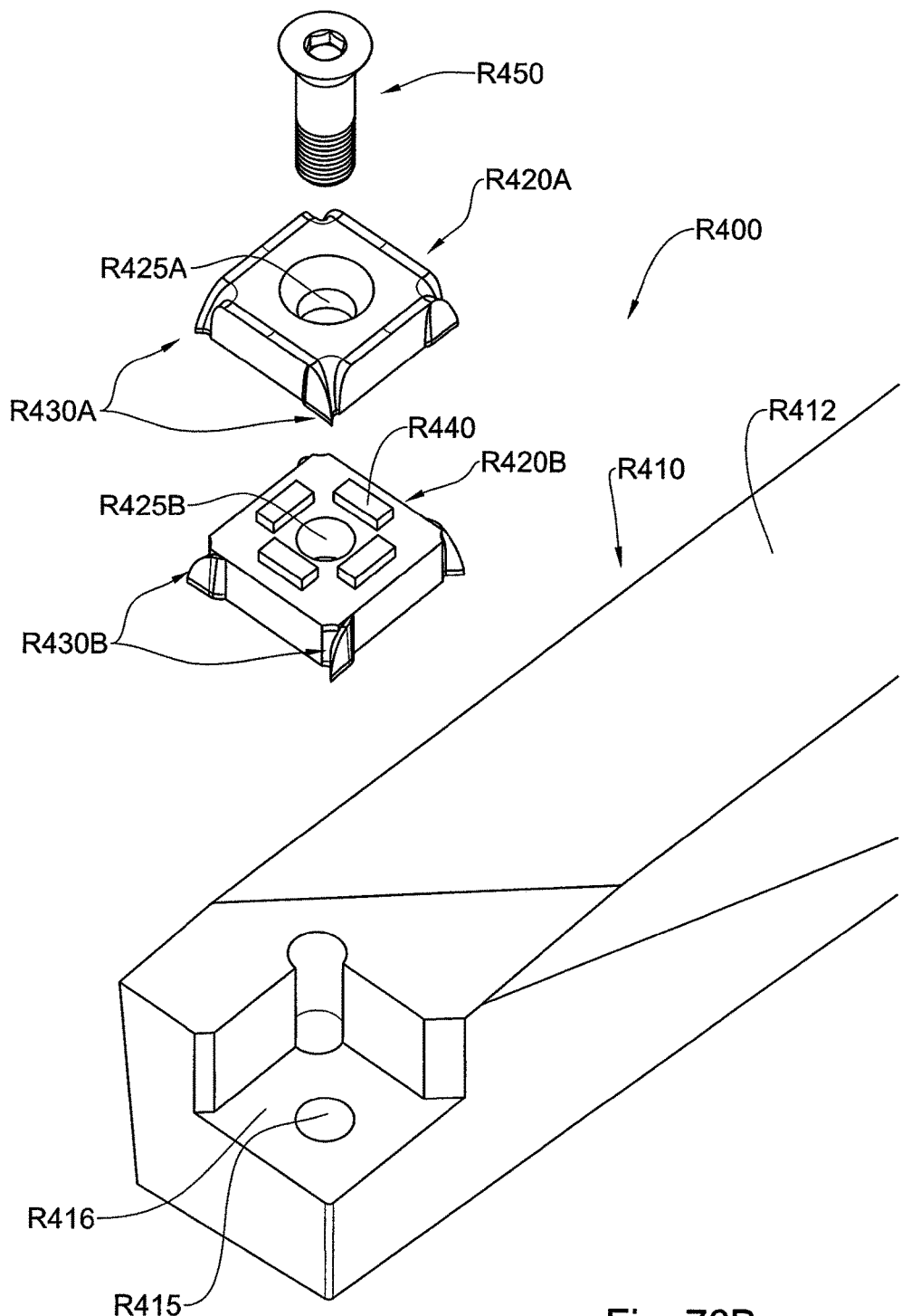
Figure 76C:
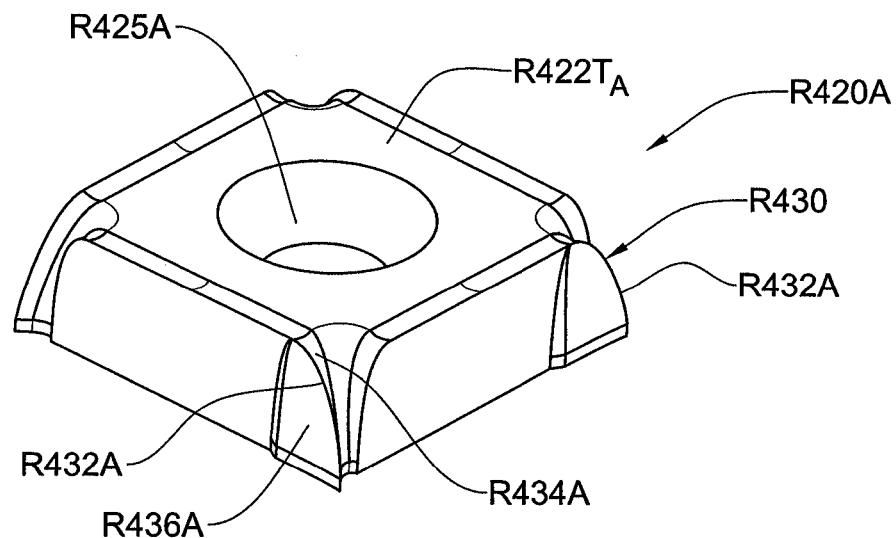
Figure 76C:
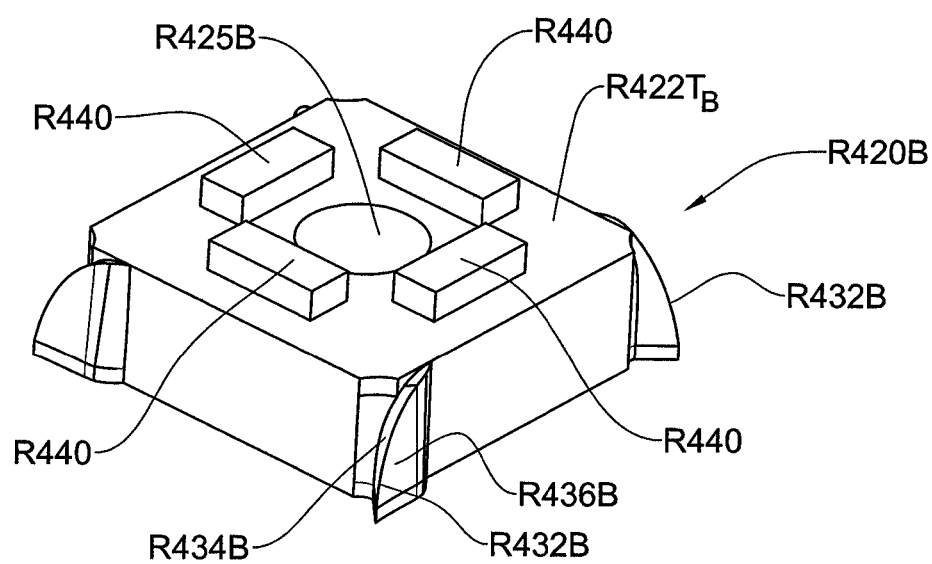

FIG. 65A is a schematic isometric view of a milling tool according to another aspect of the subject matter of the present application;

FIG. 65B is a schematic enlarged bottom view of the milling tool shown in FIG. 65A;

FIG. 65C is a schematic isometric view of a cutting insert used in the milling tool shown in FIGS. 65A and 65B;

FIG. 65D is a schematic front view of the cutting insert shown in FIG. 65C;

FIG. 66A is a schematic isometric view of a milling tool according to another aspect of the subject matter of the present application;

FIG. 66B is a schematic isometric view of a cutting insert used in the milling tool shown in FIG. 66A;

FIG. 66C is a schematic front view of the cutting insert shown in FIG. 66B;

FIG. 67A is a schematic isometric view of a milling tool according to another aspect of the subject matter of the present application;

FIG. 67B is a schematic view of a cutting insert used in the milling tool shown in FIG. 67A;

FIG. 67C is a schematic front perspective view of the cutting insert shown in FIG. 67B;

FIG. 67D is a schematic front view of the cutting insert shown in FIG. 67C;

FIGS. 68A and 68B are schematic isometric and exploded isometric views of a mold configured for the manufacture of the cutting insert shown in FIGS. 3A to 3D;

FIG. 68C is a schematic enlarged isometric view of a mold piece shown in FIGS. 68A and 68B;

FIG. 69A is a schematic isometric view of a milling tool according to another example of the present application;

FIG. 69B is a schematic isometric view of a cutting insert used in the milling tool shown in FIG. 69A;

FIG. 69C is a schematic isometric view of the milling tool shown in FIG. 69A with a schematic cutting envelope thereof;

FIG. 70A is a schematic isometric view of a milling tool according to another example of the present application;

FIG. 70B is a schematic isometric view of a cutting insert used in the milling tool shown in FIG. 70A;

FIG. 70C is a schematic enlarged view of a cutting portion of the cutting insert shown in FIG. 70B;

FIG. 71 is a schematic isometric view of a mold used for the manufacture of the inserts shown in FIG. 70A;

FIG. 72A is a schematic isometric view of a parting tool according to another example of the present application;

FIG. 72B is a schematic top view of the parting tool shown in FIG. 72A;

FIG. 72C is a schematic enlarged view of a detail shown in FIG. 72B;

FIG. 73A is a schematic isometric view of a parting tool according to an example of the subject matter of the present application;

FIG. 73B is a schematic isometric view of a parting insert used in the parting tool shown in FIG. 73A;

FIG. 73C is an enlarged top view of a cutting corner of the parting insert shown in FIG. 73B;

FIG. 73D is a schematic isometric view of the cutting corner shown in FIG. 73C;

FIG. 74A is a schematic isometric view of a straight saw tool according to another example of the subject matter of the present application;

FIG. 74B is an enlarged view of a saw insert used in the parting tool shown in FIG. 74A;

FIG. 75A is a schematic isometric view of a straight saw tool according to another example of the subject matter of the present application;

FIG. 75B is an enlarged view of a saw insert used in the parting tool shown in FIG. 75A;

FIG. 76A is a schematic isometric view of a turning tool according to another aspect of the subject matter of the present application;

FIG. 76B is a schematic isometric exploded view of the cutting tool shown in FIG. 76A; and FIG. 76C is a schematic enlarged view of the cutting inserts used in the cutting tool shown in FIG. 76A.

DETAILED DESCRIPTION OF EMBODIMENTS

Throughout the specification, several indicators are used as follows:

in all FIGS. 1 to 12B, the indicative letter B appears in front of each reference numeral in the following format—B232, B140a etc.;

in all FIGS. 13 to 42H, reference numerals appear without an indicative letter;

in all FIGS. 43A to 64F, the indicative letter Y appears in front of each reference numeral in the following format—Y232, Y140a etc.; and in all FIGS. 65A to 76C, the indicative letter R appears in front of each reference numeral in the following format—R232, R140a etc.

Per the above, it should be understood that elements B232, 232, Y232 and R232 are not equivalents on one another.

Attention is first drawn to FIGS. 2A to 12, in which a milling insert of the present application is shown, generally designated B1. The external surface of the milling insert B1 has a bottom surface B4a and a side surface B4c, between which extends an adjoining surface B4b. In addition, the milling insert B1 comprises a cutting corner with a cutting edge B2 extending along a portion of the bottom surface B4a, adjoining surface B4b and side surface B4c.

The cutting edge B2 is divided into a bottom segment B2a, an adjoining segment B2b and a side segment B2c. The bottom segment B2a is constituted by the intersection between the bottom surface B4a and a bottom rake surface B6a, the adjoining segment B2b is constituted by the intersection between the adjoining surface B4b and an adjoining rake surface B6b, and the side segment B2c is constituted by an intersection between the side surface B4c and a side rake surface B6c. Thus, the bottom surface B4a, adjoining surface B4b and side surface B4c constitute relief surfaces of the respective cutting edge segments B2a, B2b and B2c.

The adjoining cutting edge segment B2b has a start point B3 closer to a front face of the milling insert B1 and an end point B5 closer to a rear surface of the milling insert B2. In other words, the start point B3 and the end point B5 lie on different reference planes, parallel and spaced from one another.

Turning now to FIGS. 1A to 1F, the method of designing a cutting edge will now be described in detail. In principle, the design of the cutting tool includes two main stages:

(a) the design of the geometric outline of the cutting edge, i.e. how the cutting edge extends along the bottom surface, sides surface and adjoining surface of the cutting tool; and (b) the design of the rake and relief surfaces about the cutting edge, i.e. the shape of each of the surfaces and the angle therebetween.

As a preliminary step to the above design stages, the desired operation for which the cutting tool is to be used should be determined, as well as the resulting shape of the workpiece after the cutting operation.

With particular reference to FIG. 1A, when a shaping/planing tool is to be designed, an end profile B10 is first modeled, simulating a desired end profile of a workpiece after such a shaping/planing operation has taken place. As will be observed later with respect to FIGS. 5A and 5B, different cutting operations yield different end profiles (B10, B10', B10").

It is observed that the end profile B10 is formed with a bottom surface B12, a side surface B16 and an adjoining surface B14 extending therebetween. It is also noted that since, in a shaping/planing operation neither the workpiece nor the cutting tool is revolved, the end profile B10 is modeled by an end contour B11 extruded along a straight longitudinal axis X. As a result, the adjoining surface B14 is a geometrically ruled surface in which through every point on the surface it is possible to pass a straight line that lies on the surface. Examples will later be described in which the adjoining surface is not ruled.

It is also observed that the contour B11 has a bottom contour B22 at the intersection with the bottom surface B12, an adjoining contour B24 at the intersection with the adjoining surface B14 and a side contour B26 at the intersection with the side surface B16.

Figure 1B:
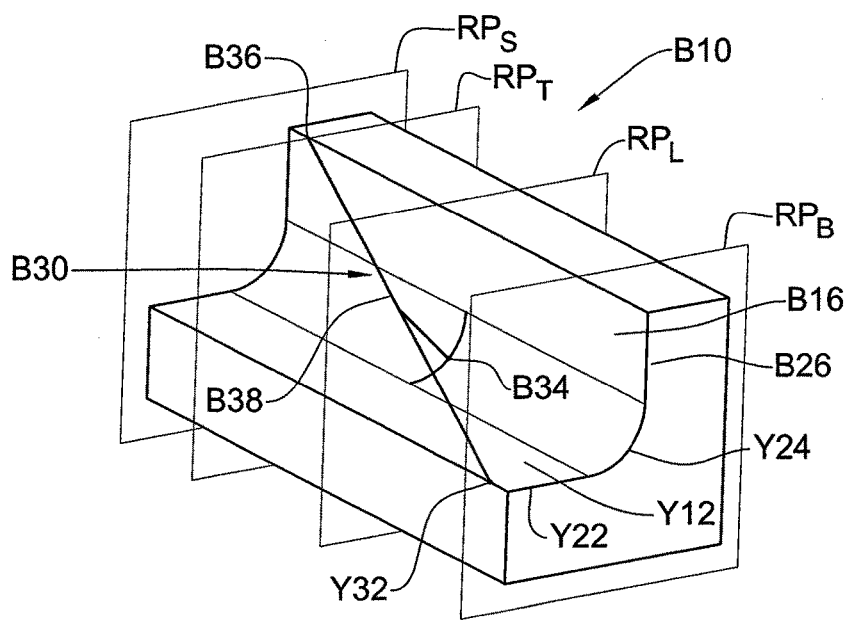
Figure 1C:
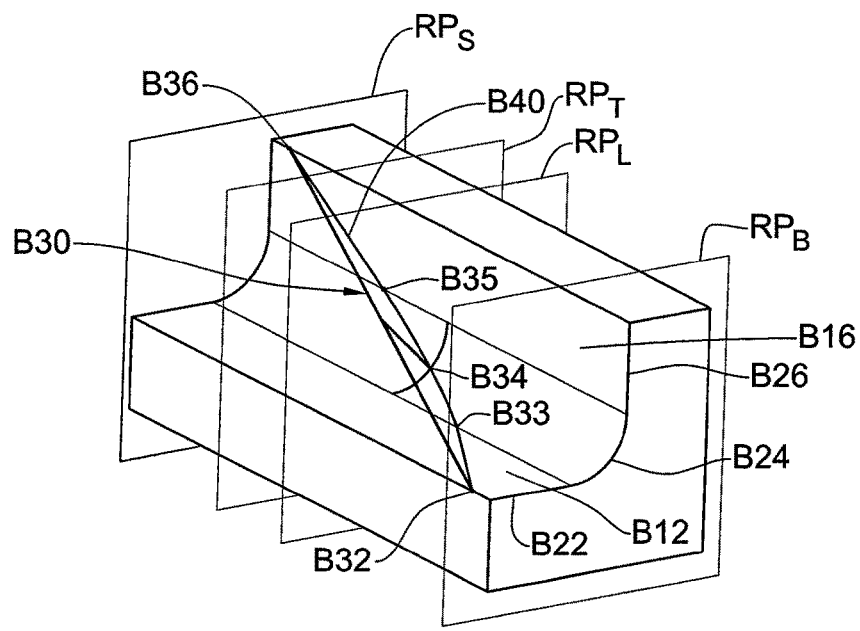

Turning to FIG. 1B, in order to design the geometric outline of the cutting curve, a bottom profile plane $RP_B$ and a side profile plane $RP_S$ are first defined, between which the cutting curve will extend. The bottom profile plane $RP_B$ and the side profile plane $RP_S$ each extend perpendicular to the longitudinal axis X and are spaced apart from one another.

Thereafter, a start point B32 on the bottom surface B12a, lying on the bottom profile plane $RP_B$, an intermediate point B34 located on the adjoining surface B14 between the bottom profile plane $RP_B$ and the side profile plane $RP_S$, and an end point B36 on the side surface, lying on the side profile plane $PR_S$. In particular, the position of the intermediate point B34 on the adjoining surface is chosen at a location approximately between the side surface B16 and the bottom surface B12.

Turning to FIGS. 1C to 1F, once the three points B32, B34 and B36 have been established, an intersecting plane B39 is defined using these points, intersecting the end profile B10 along an intersection curve B40.

Figure 1D:
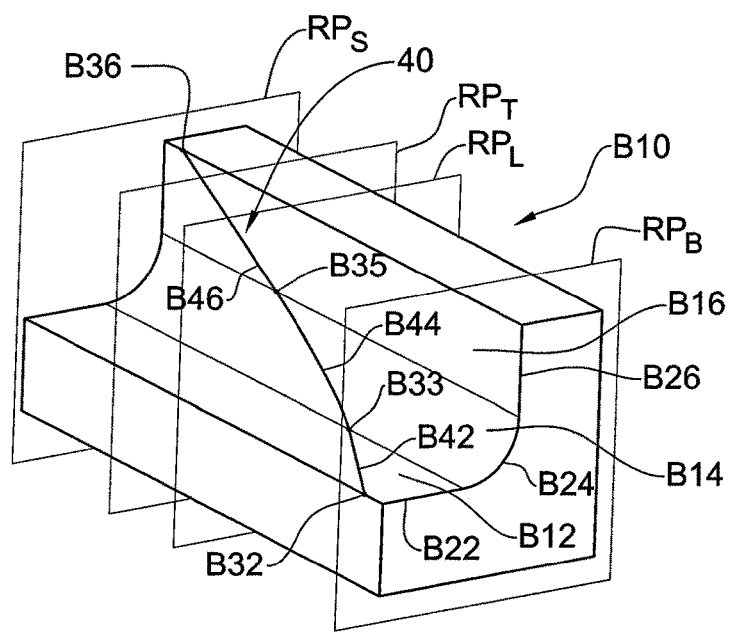
Figure 1E:
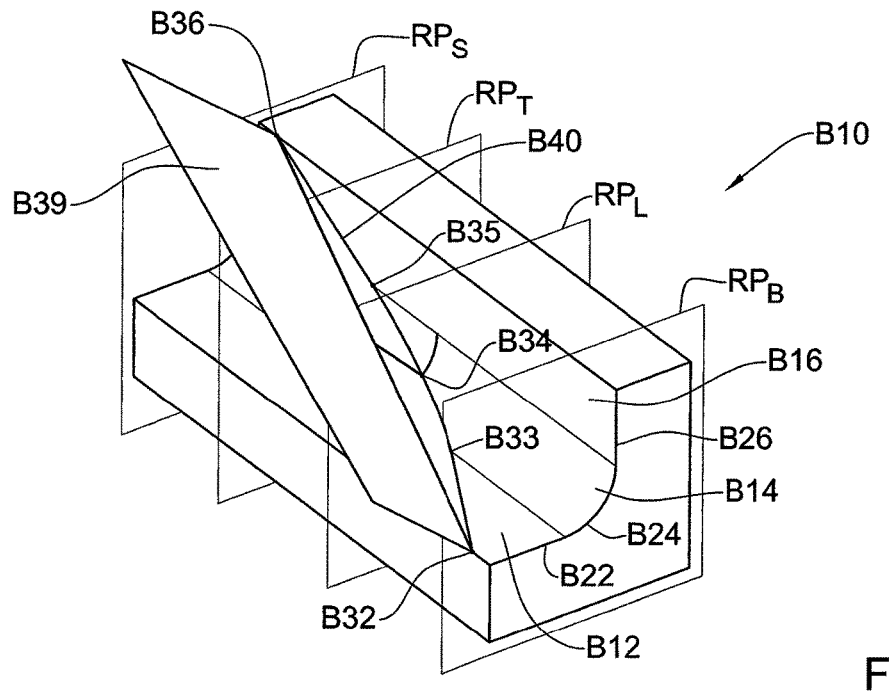
Figure 1F:
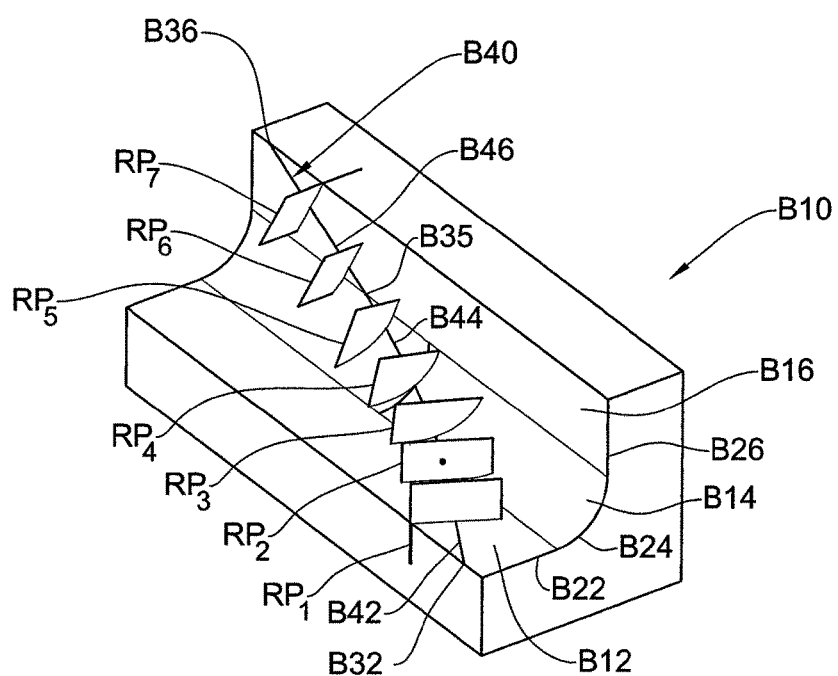
Figure 2A:
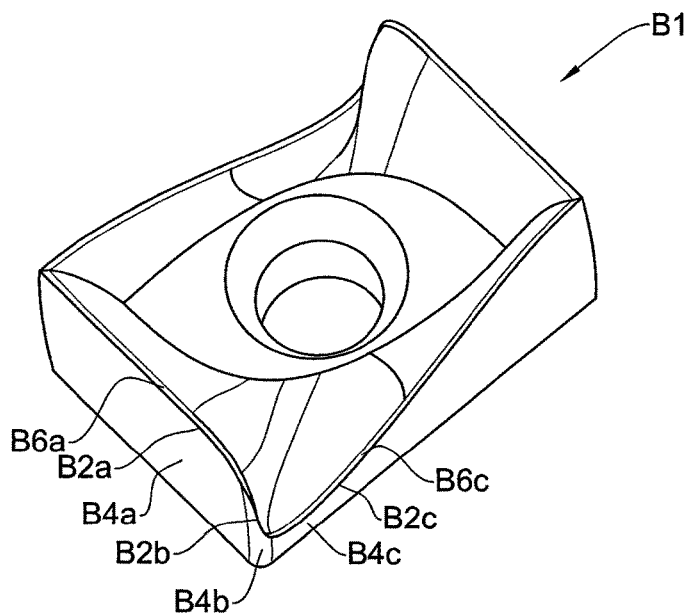
FIG. 2A is a schematic isometric view of a cutting insert designed according to the method of the present application.
Figure 2B:
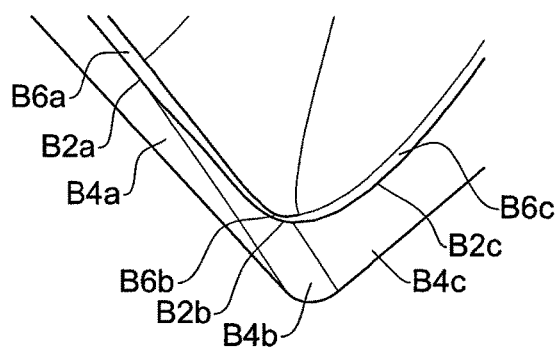
FIG. 2B is a schematic enlarged view of a detail of the insert shown in FIG. 2A.
Figure 2C:
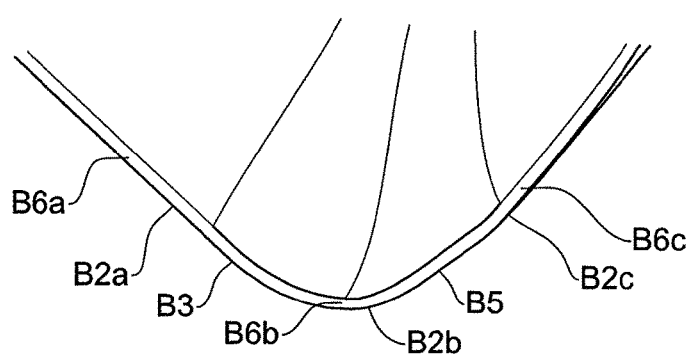
FIG. 2C is a schematic top view of the detail shown in FIG. 2B.

With particular reference to FIGS. 1D and 1F, the intersecting curve B40 has intersects the adjoining surface B14 at a lead point B33, at the edge with the bottom surface B12 and at a trail point B35 at the edge with the side surface B16. For each of these points B33, B35, a corresponding lead profile plane $RP_L$ and a trail profile plane $RP_T$ is defined, each of which is parallel to the bottom profile plane $RP_B$ and the side profile plane $RP_S$, and is also perpendicular to the longitudinal axis X.

Once all four reference planes have been defined, the cutting curve B40 can be divided into a bottom cutting curve segment B42 extending along the bottom surface B12, an adjoining cutting curve segment B44 extending along the adjoining surface B14, and a side cutting curve segment B46 extending along the side surface B16.

Thus, a geometric outline of the cutting edge is provided. However, it should first be verified that the characteristics of the cutting curve meet the requirements of the design. Some of the requirements are:
  the adjoining ratio $R_{ADJ}$ between the length of the adjoining cutting curve segment B44 and the length of the adjoining contour B24; and
  the distribution ratio $R_{DIST}$ between the lengths of the bottom cutting curve segment B42, the adjoining cutting curve segment B44 and the side cutting curve segment B46; and
  the symmetry of the cutting curve.

In particular, if the desired adjoining ratio $R_{ADJ}$ is $R_{ADJ}=2.5$, and the actual ratio is yielded by the given points B32, B34, B36 is smaller, then positions of the bottom profile plane RPB and the side profile plane RPS are amended by spacing them further apart, thereby increasing the distance between the start point B32 and the end point B36. In addition, the position of the intermediate point B34 can also be amended. However, it is appreciated that the variation in the position of the intermediate point is usually more limited due to the distribution ratio $R_{DIST}$ and the symmetry requirements.

Once the correct adjoining ratio $R_{ADJ}$ has been established, the position of the intermediate point B34 can be slightly amended to meet the distribution ratio $R_{DIST}$ and the symmetry requirements. It is appreciated that in order to meet the above two requirements, minor tweaks in the position of the intermediate point may well be sufficient.

Upon amending the position of the points B32, B34, B36, the design of the geometric outline of the cutting curve B40 is complete and can be used for the design of the rake and relief surfaces of the cutting tool thereabout, whereby it will constitute the cutting edge of the designed cutting tool.

Figure 3:
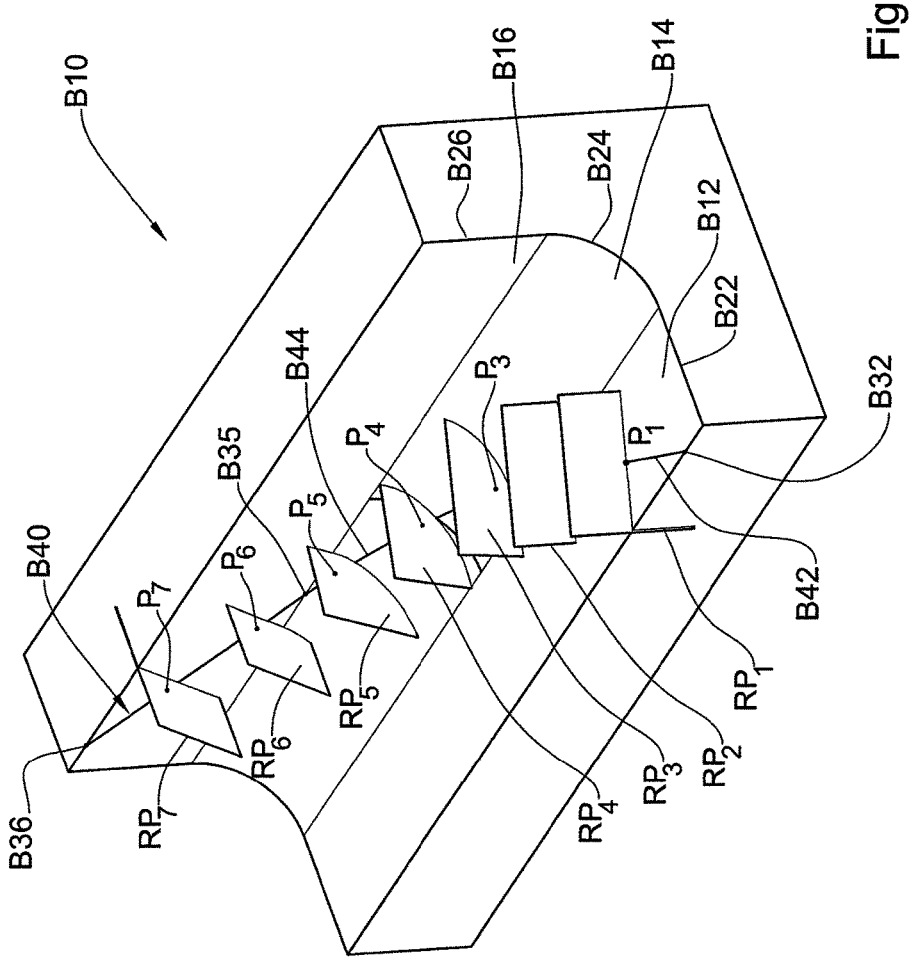
FIG. 3 is a schematic isometric view of the end profile shown in FIGS. 1A to 1F, provided with a plurality of reference planes.
Figure 4A:
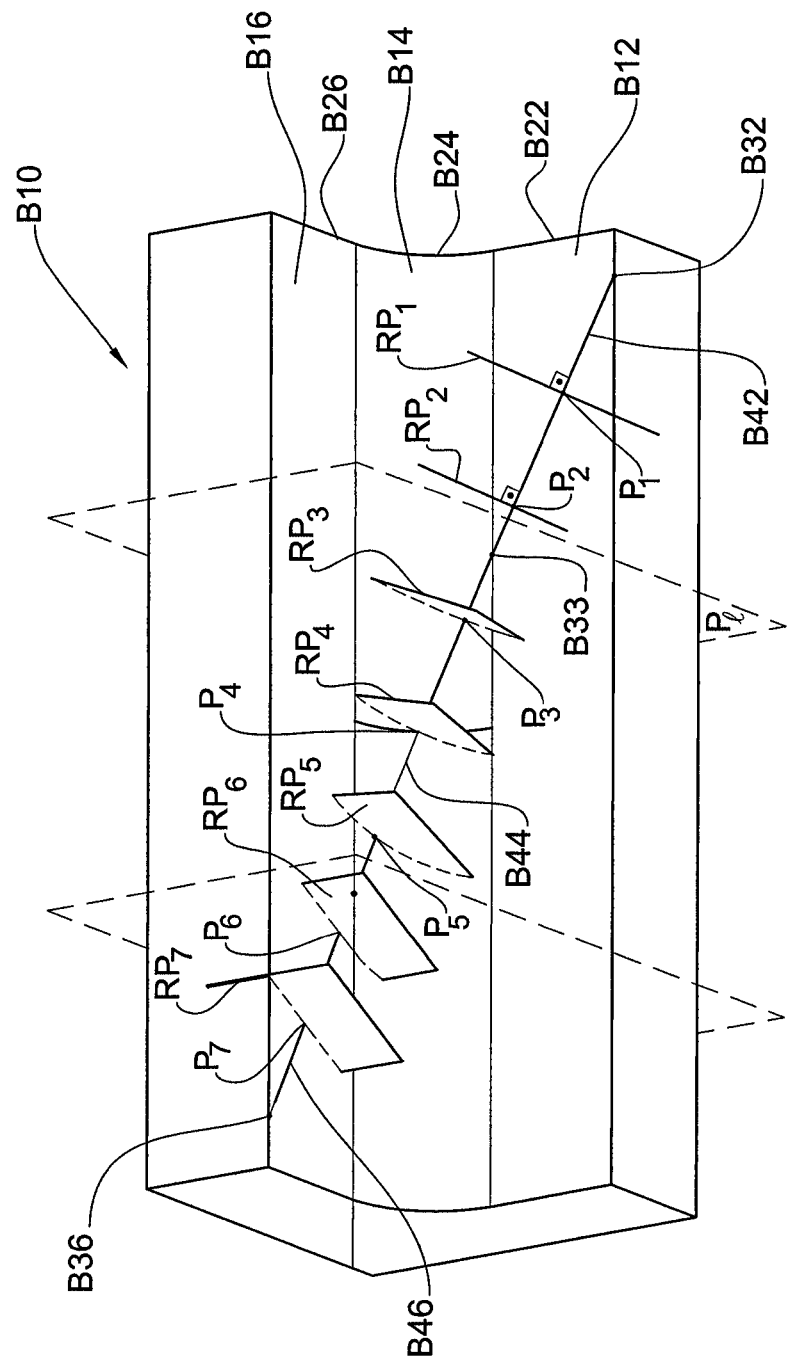
FIGS. 4A to 4E are schematic planar views of the reference planes shown in FIG. 3.
Figure 4B:
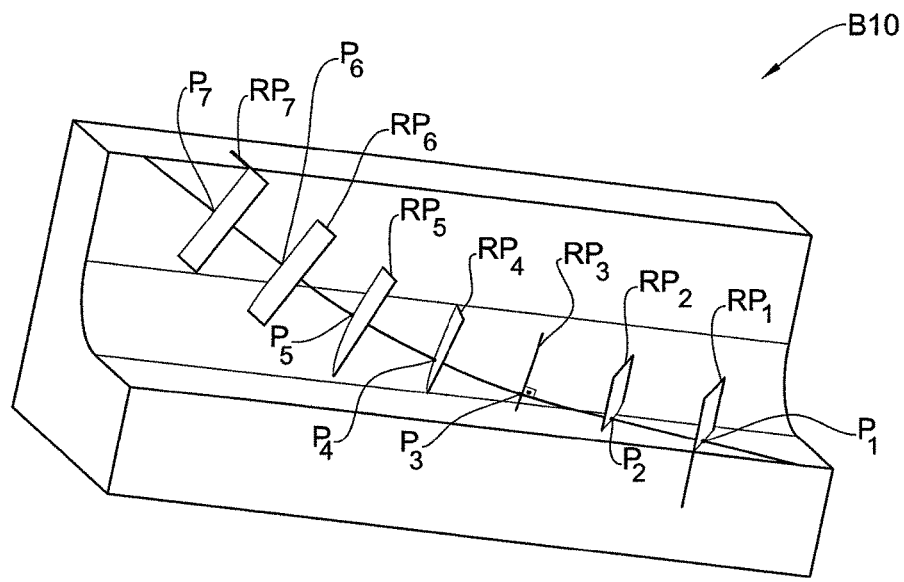
Figure 4C:
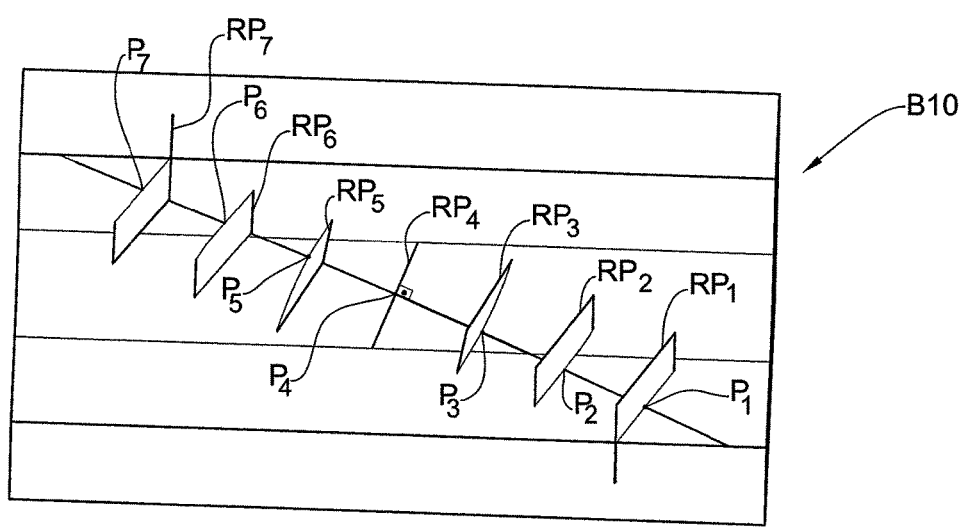
Figure 4D:
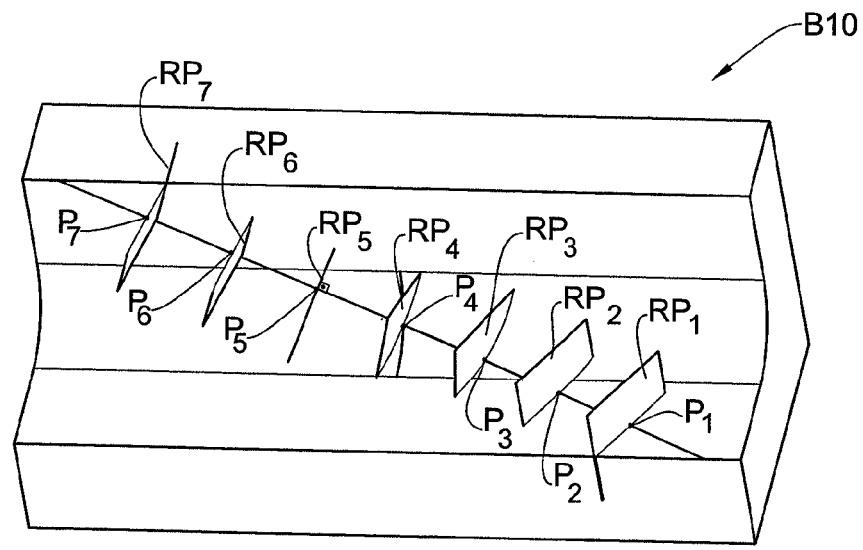
Figure 4E:
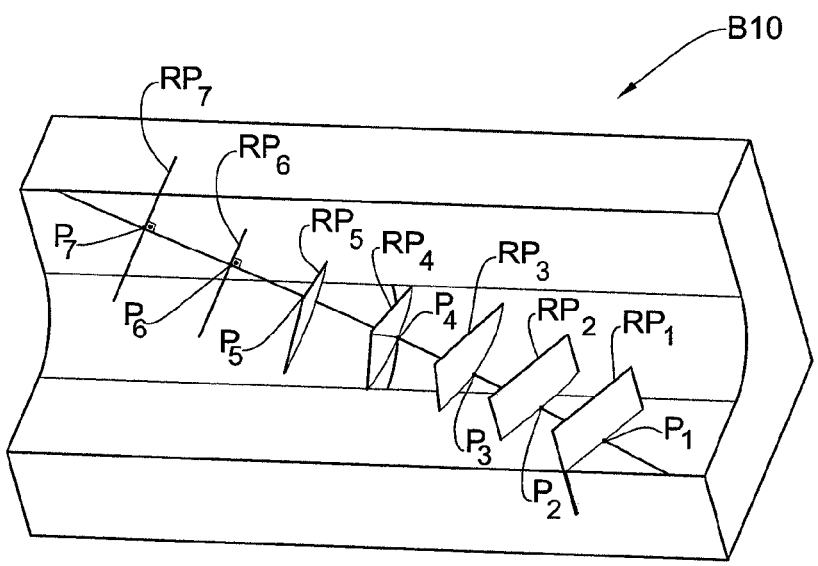

Turning now to FIGS. 3 to 4E, the second stage of designing the cutting tool will be described, in particular, the design of the rake and relief surfaces of the cutting edge.

Firstly, a plurality of reference planes $PR_1$ to $PR_7$ are defined along the cutting curve B40, each being pierced by the cutting curve B40 at a pierce point $P_1$ to $P_7$ respectively. Each of the reference planes $PR_1$ to $PR_7$ is perpendicular to the cutting curve B40 at the respective pierce points $P_1$ to $P_7$.

With reference to the above, the term 'perpendicular to the curve at a point' can be interpreted in the following two equivalent manners:
  geometric—in any view in which the reference plane $PR_N$ is seen in its edge view, the curve is perpendicular thereto; and
  mathematical—given a mathematical formula f(x) of the curve, the reference plane is perpendicular to a directional vector which is the derivative f(x) at the piercing point.

Figure 5A:
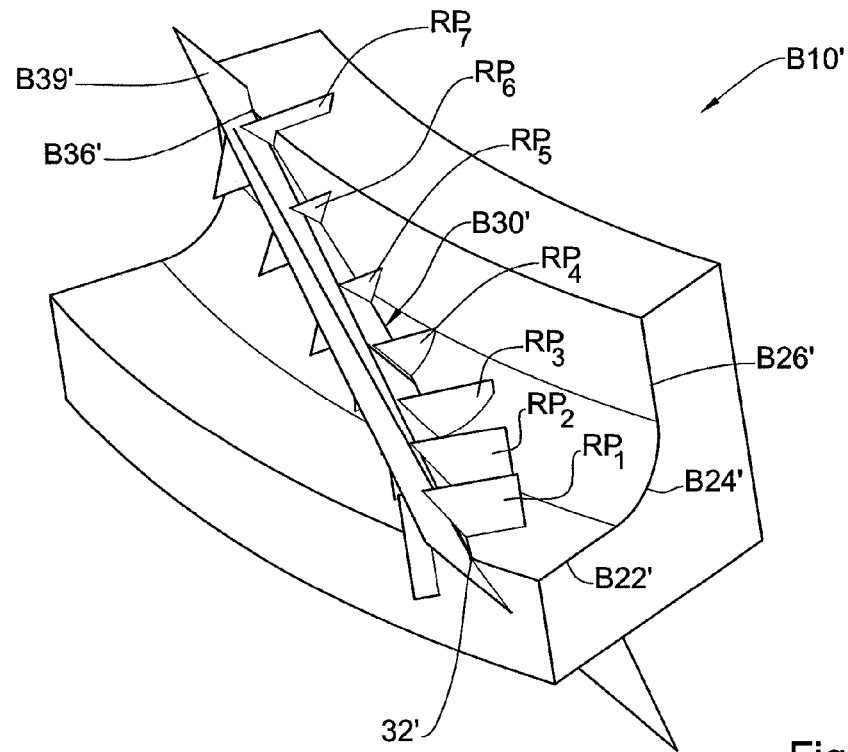
FIGS. 5A and 5B are schematic isometric views of examples of end profiles according to other examples of the present application.
Figure 5B:
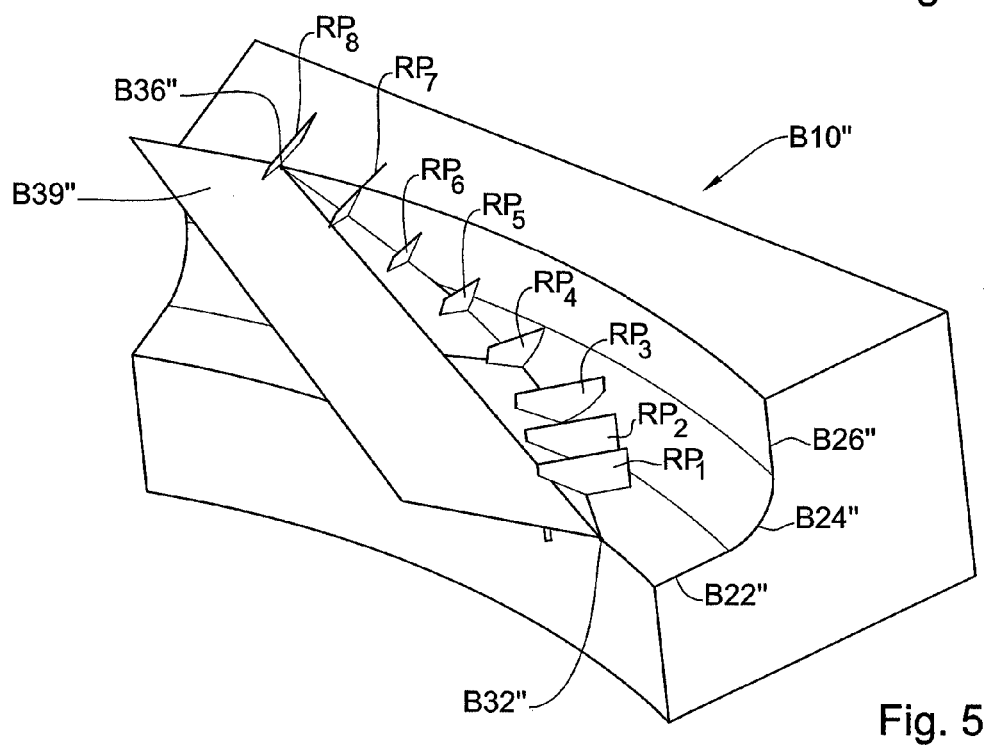

With attention being drawn to FIGS. 5A and 5B, it is appreciated that for any end profile for which a cutting curve has been provided, it is possible to model appropriate reference planes perpendicular to the cutting curve. Specifically, whereas the end profile 10 models a shaping operation, the end profile B10' of FIG. 5A corresponds to a turning operation (a revolving workpiece) and end profile B10" of FIG. 5B corresponds to a milling operation.

Figure 6A:
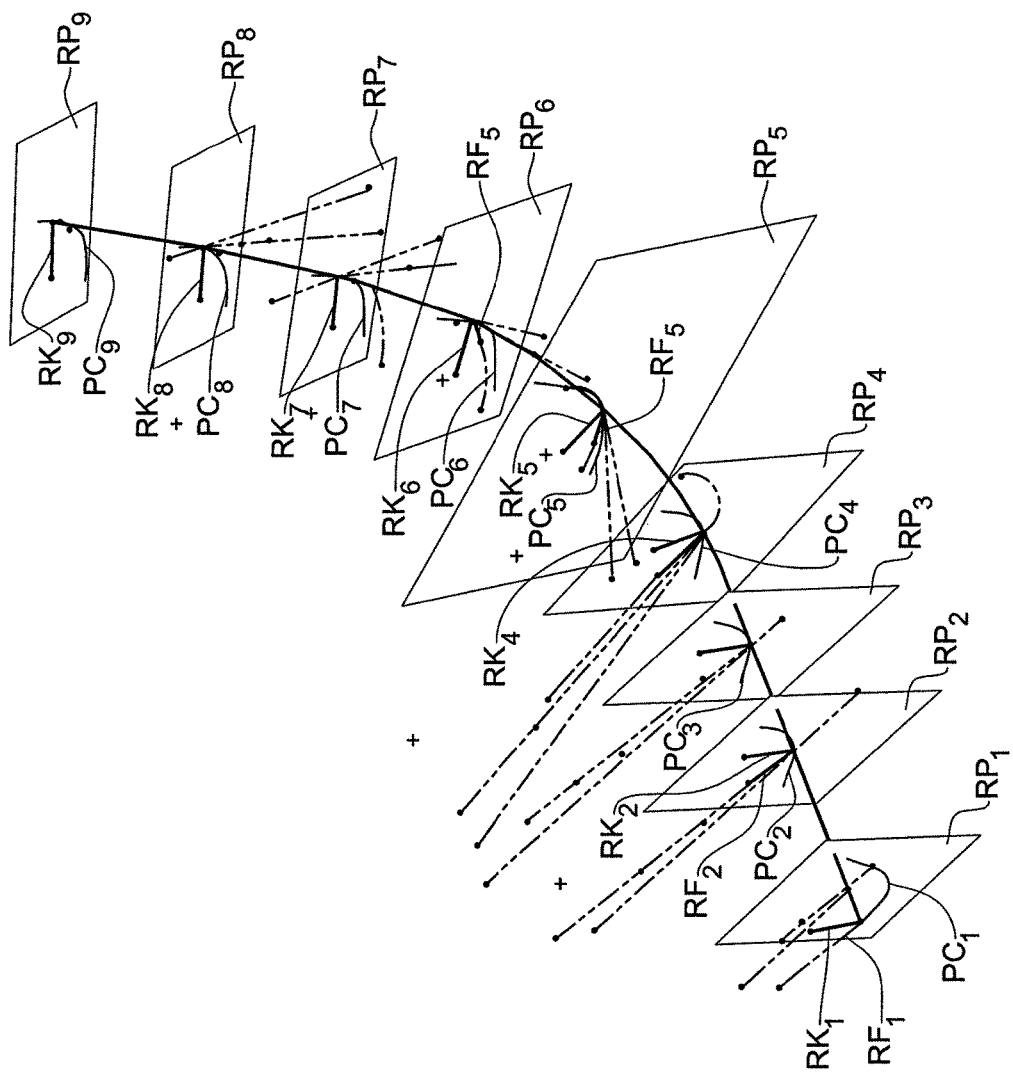
FIG. 6A is a schematic isometric view of a plurality of reference planes and the geometric construction on each, used for designing the cutting edge according to the method of the present application.
Figure 6B:
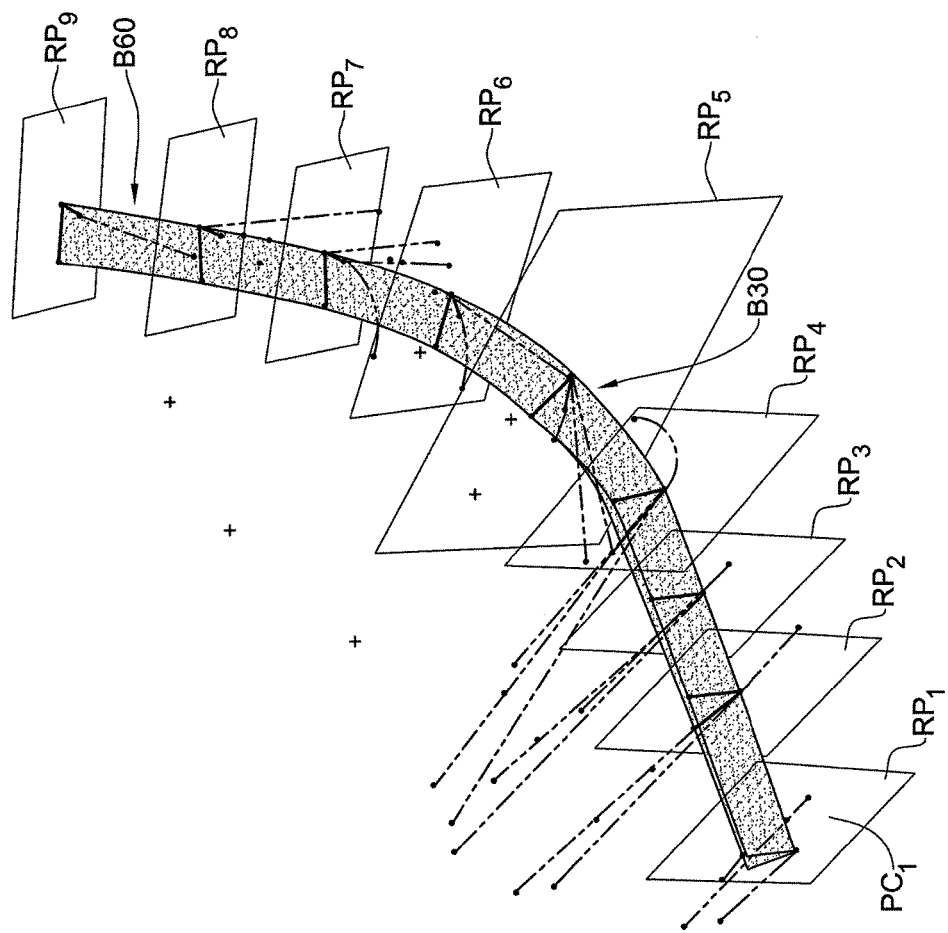
FIG. 6B is a schematic isometric view of a cutting strip designed based on the reference planes shown in FIG. 6A.

Turning now to FIGS. 6A and 6B, a projection of the end contour is provided on each of the planes $PR_1$ to $PR_9$. Thus, each reference plane $PR_1$ to $PR_9$ is provided with a bottom projection contour B52 of the bottom end contour B22, an adjoining projection contour B54 of the adjoining end contour B24 and a side projection contour B56 of the side end contour B26. Inevitably, each of the pierce points $P_1$ to $P_9$, lies on one of the projections contours B52, B54, B56.

With additional reference being made to FIGS. 7A to 7D, once obtained, on each of the reference planes $PR_1$ to $PR_9$, a straight base line $BL_1$ to $BL_9$ is respectively defined tangent to the projection contour at the respective pierce point $P_1$ to $P_9$. In other words, if the pierce point $P_N$ lies on the adjoining projection contour B54, the base line $BL_N$ will be tangent thereto at the pierce point $P_N$, if the pierce point $P_N$ lies on the side projection contour B56, the base line BL will be tangent thereto at the pierce point $P_N$, and so on. It is appreciated that since in the present example the bottom surface B12 and the side surface B16 are planar surfaces, the bottom projection contour B52 and the side projection contour B56 are straight lines and therefore, they themselves constitute the base line BL.

Thereafter, on each of the reference planes $PR_1$ to $PR_9$, a straight chip line $CL_1$ to $CL_9$ is respectively defined perpendicular to the projection contour at the respective pierce point $P_1$ to $P_9$. In other words, if the pierce point $P_N$ lies on the adjoining projection contour B54, the chip line $CL_N$ will be perpendicular thereto at the pierce point $P_N$, if the pierce point $P_N$ lies on the side projection contour B56, the chip line CL will be tangent thereto at the pierce point $P_N$, and so on.

Once the base lines $BL_1$ to $BL_S$ and chip lines $CL_1$ to $CL_9$ have been defined, it is required to define, for each of the reference planes $PR_1$ to $PR_9$ a rake line $RK_1$ to $RK_9$ and a relief line $RF_1$ to $RF_9$ are defined. For each of the reference planes $PR_1$ to $PR_9$, the following angles can be defined:
  a desired cutting angle $\theta_C$ between the rake line $RK_N$ and its respective chip line $CL_N$;
  a desired body angle $\theta_B$ between the rake line $RK_N$ and the relief line $RF_N$; and
  a desired rear angle $\theta_R$ between the relief line $RF_N$ and the base line $BL_N$.

It is observed that in the present example, both the rake line RK and the relief line RF are in the lower quadrant formed by the base line BL and the chip line CL and not in the upper quadrant. However, it is appreciated that in other examples, either or both of the rake line RK and the relief line RF can be in the upper quadrant as well.

The required above angles can be determined according to the desired cutting operation, the material of the workpiece and the material of the designed cutting tool, taken from engineering tables as known per se.

In addition, in the present example, the design is such that while the rear angle $\theta_C$ remains generally the same throughout the different reference planes $PR_1$ to $PR_S$, the cutting angle $\theta_C$ increases while the body angle $\theta_B$ decreases. Though this is not compulsory, in general, the body angle $\theta_B$ either decreases or remains the same throughout the cutting edge. In other words, if the body angle $\theta_B$ of a particular reference plane is designed to be equal or smaller than the body angle $\theta_B$ of any reference plane disposed between the particular reference plane and the start profile plane $RP_S$.

Figure 7A:
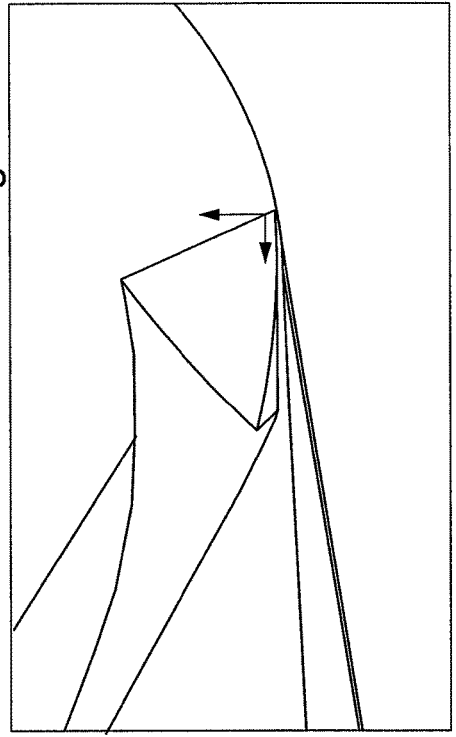
FIGS. 7A to 7D are schematic cross-sectional views of the cutting strip and end profile, taken along various reference planes.
Figure 7B:
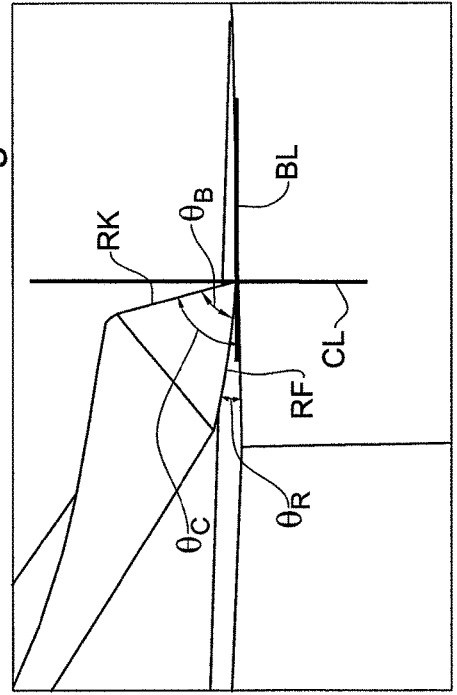
Figure 7C:
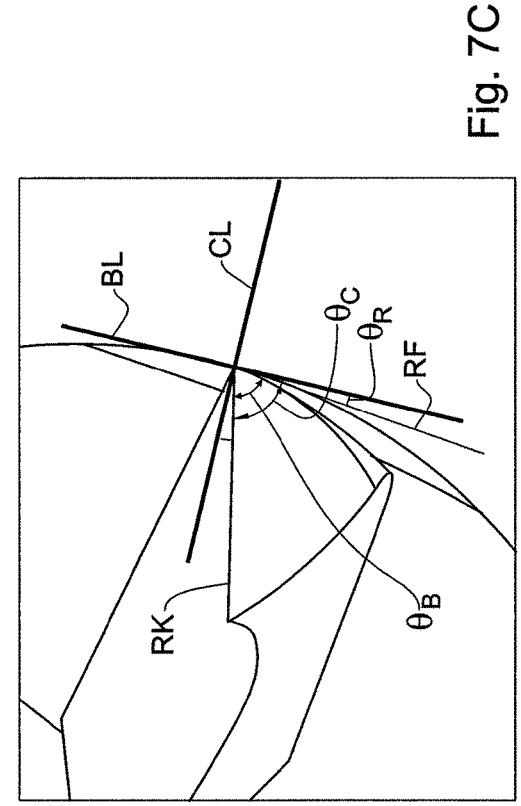
Figure 7D:
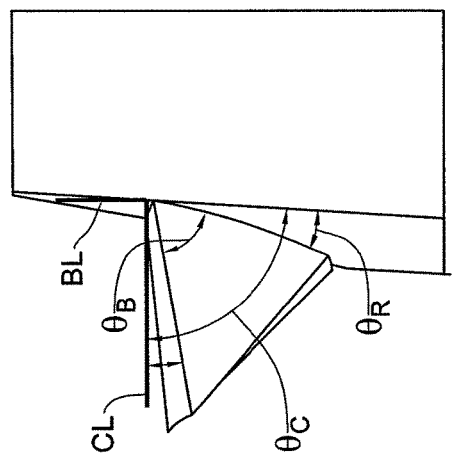

Particular attention is given to FIG. 7B, in which the relief line $RF_3$ is shown. When designing a relief line, care should be taken that the relief line does not intersect the projection contour, which may result in the cutting tool coming in contact with the workpiece during a cutting operation at an area other than the cutting edge thereof. Such contact can cause intense friction between the cutting tool and the workpiece which may result in excessive heat, damage to the mechanical integrity of the cutting tool and/or workpiece and, in general, in an inefficient cutting operation.

Once the rake lines $RK_1$ to $RK_7$ and relief lines $RF_1$ to $RF_7$ have been defined, a rake surface K is generated, extending through all the rake lines $RK_1$ to $RK_9$ and a corresponding relief surface F is generated, extending through all the relief lines $RF_1$ to $RF_9$. The term 'extending through all . . . ' is used herein to define that each of the rake lines $RK_1$ to $RK_7$ lies on the rake surface K and each of the relief lines $RF_1$ to $RF_9$ lies on the relief surface F.

It is appreciated that the rake and relief surfaces K and F respectively are usually required to be continuous surfaces (defined mathematically as a two-dimensional topological manifold). Therefore, the more reference planes are used in the constructions of the rake and relief surfaces K and F respectively, the smoother they will be. A standard computer software can be used to generate a continuous surface based on the above rake and relief lines.

As a result of the above method, the cutting tool designed thereby will be such that for a first reference plane disposed at any point along the cutting edge between a lead point and a trail point thereof and perpendicular to the cutting edge at that point, the angle between the intersection of the rake surface with reference plane and the relief surface with the reference plane will be equal or smaller that a similar angle at any one of a similar reference plane disposed along the cutting edge between the first reference plane and the lead point.

Attention is now drawn to FIGS. 8A to 8D, in which on example of a cutting tool is shown, having a cutting edge designed in accordance with the above described method. The cutting tool, generally designated B70 comprises a cutting insert B80 having four cutting portions B90, one at each corner.

The cutting insert has a top surface B82T, bottom surface B82B and side surfaces B82S extending therebetween. The cutting insert B80 further has a central bore B83 configured for receiving therein a securing bolt.

Figure 8A:
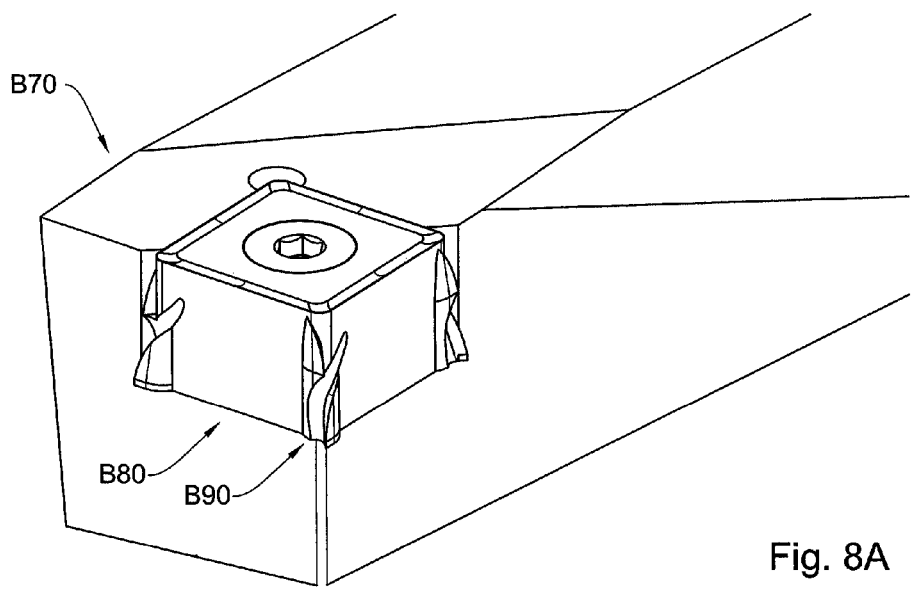
FIG. 8A is a schematic isometric view of a turning tool designed in accordance with the method of the present application.
Figure 8B:
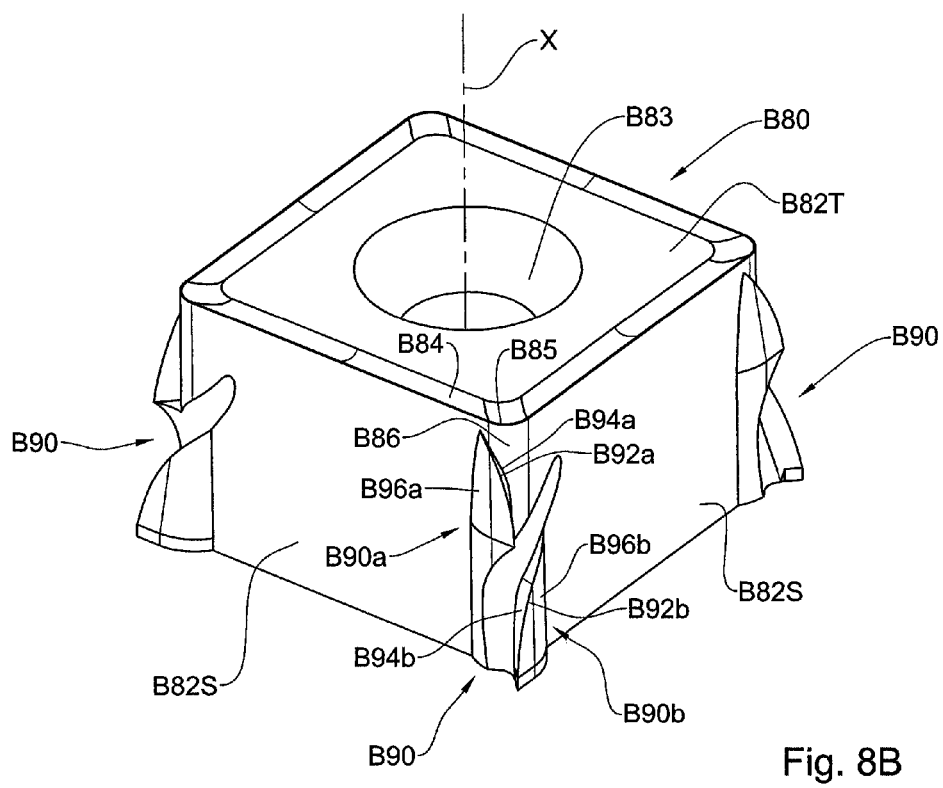
FIG. 8B is a schematic isometric view of a cutting insert used in the cutting tool of FIG. 8A.
Figure 8C:
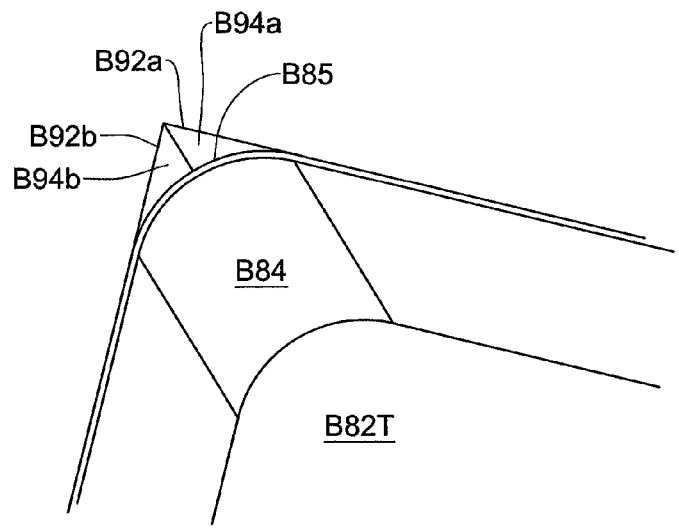
FIG. 8C is a schematic enlarged top view of a portion of the cutting insert shown in FIG. 8B.
Figure 8D:
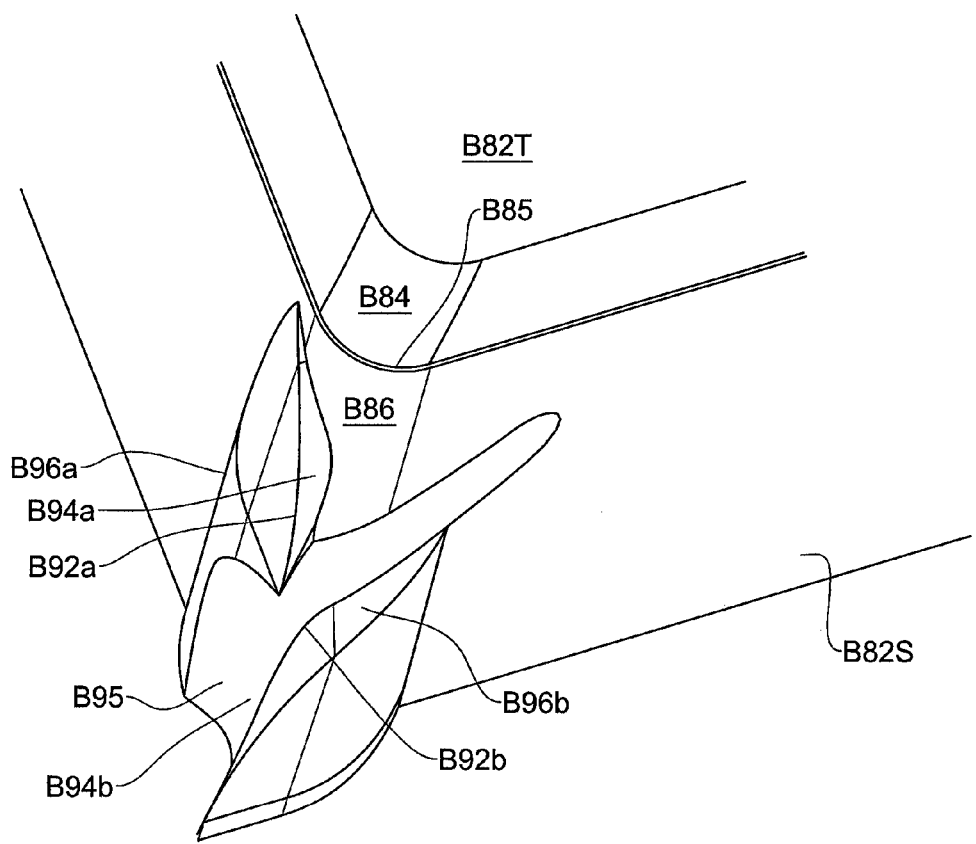
FIG. 8D is a schematic isometric view of the portion shown in FIG. 8C.

With particular reference being made to FIGS. 8B to 8D, the cutting insert comprises a cutting corner with a cutting edge B85 defined at the intersection between a rake surface B84 and a relief surface B86. On each side of the cutting edge B85 there extends a cutting edge extension defined at the intersection between the top surface B82T and the respective side walls B82S. These extensions are equivalent to the bottom and side segments B22, B26 of the end profile.

As observed in the above Figs, the cutting portion B90 comprises a top cutting portion B90a having a cutting edge B92a defined between a rake surface B94a and a relief surface B96a, and a bottom cutting portion B90b having a cutting edge B92b defined between a rake surface B94b and a relief surface B96b.

Each of the cutting edges B92a, B92b extends beyond the side walls B82S, i.e. lying on a virtual bridging surface extending between the side walls B82S. Each of the cutting edges B92a, B92b, constitutes a cutting curve designed in accordance with the above describe method, wherein each cutting edge B92a, B92b, extends only partially along the bridging surface.

As particularly observed in FIG. 8C, when the cutting insert B80 is properly positioned, the partial cutting edges B92a, B92b of the cutting portions B90a, B90b mimic a right angle, extending between the cutting extensions and beyond the cutting edge B85 (which, in operation, may not come in contact with the workpiece at all).

Figure 9A:
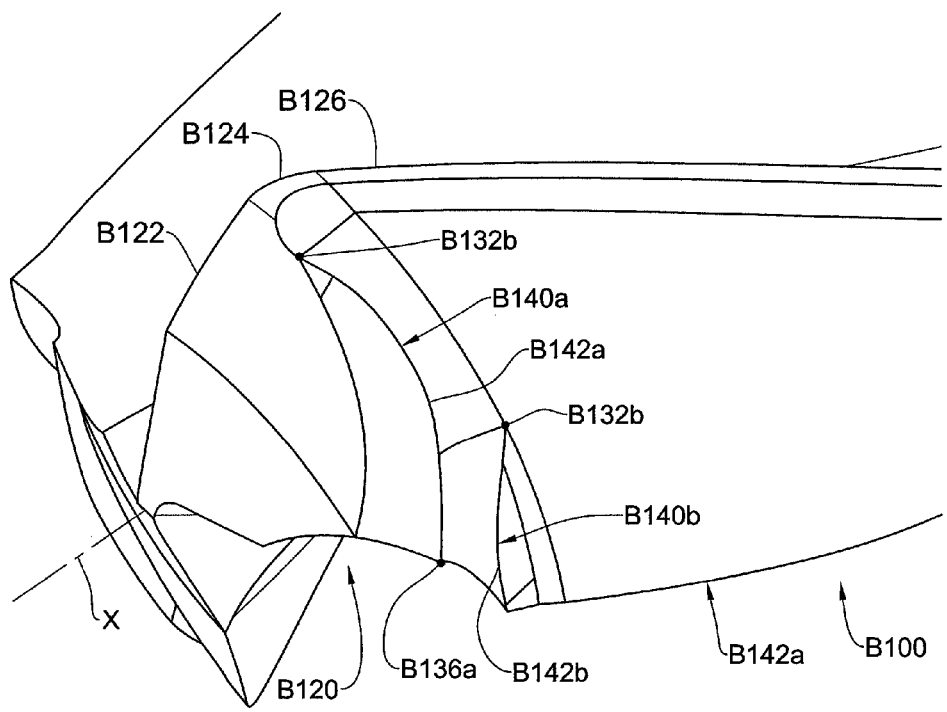
FIG. 9A is a schematic isometric view of a cutting portion of a drill designed in accordance with the method of the present application.
Figure 9B:
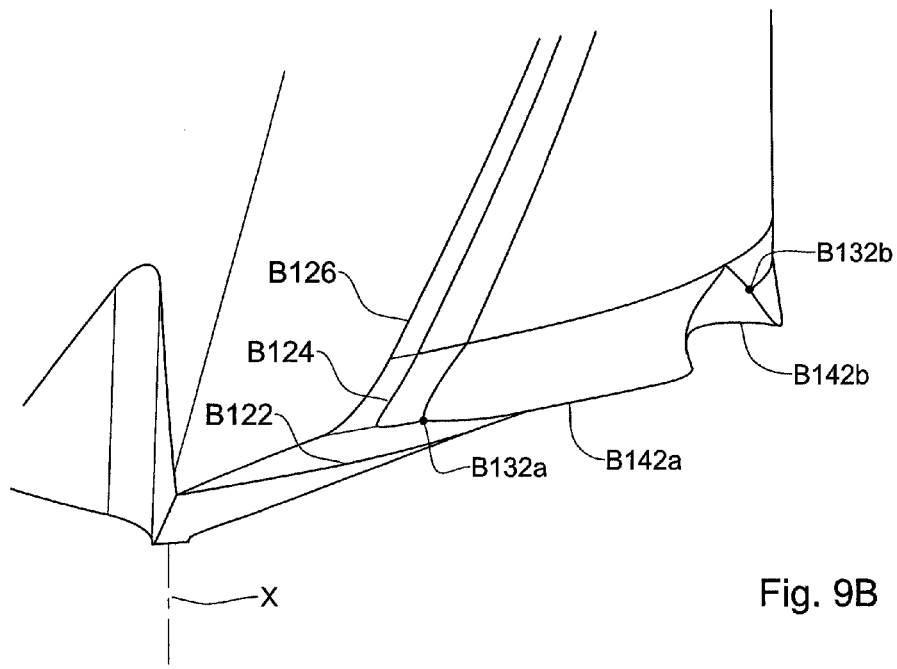
FIG. 9B is a schematic enlarged view of a portion of the drill shown in FIG. 9A.

Attention is now drawn to FIGS. 9A and 9B, in which a drilling too, generally designated B100 is shown, and having a cutting edge designed in accordance with the above described method. Specifically, the drilling tool B100 comprises a regular cutting edge having a central segment B122, a longitudinal segment B126 and a corner segment B124, bridging the segments B122 and B126.

In addition, the drilling tool B100 is formed with two bridging segments B140a, B140b extending along a virtual surface bridging a longitudinal surface (on which the longitudinal section lies) and the central surface (on which the central segment lies). More particularly, when discussing a rotary tool as in the present example, the bridging segments B140a, B140b would lie on a surface which can be mimicked by the revolution of the corner segment B124 about the central axis of the drilling tool B100.

This example is a drilling variation on the previously described turning insert shown in FIGS. 8A to 8D.

It is observed that the bridging segments (each on its own and when combined) are considerably longer than the corner segment B124, thereby allowing for a more efficient cutting operation and for the reduction of loads exerted on the cutting edge during a cutting operation.

As will be shown in other examples, such tools are not restricted to having a corner segment (e.g. B124) and can be formed with only the central segment (e.g. B122), bridging segment (e.g. B140) and longitudinal segment (e.g. B126).

The bridging segments B140a, B140b, though extending between the longitudinal surface and the central surface, extends entirely behind the central segment B122 and the longitudinal segment B126. Nonetheless, due to the drilling tool B100 being a rotary tool, the envelope generated by the bridging segments complete the envelope portions formed by the central segment B122 and the longitudinal segment B126. As a result, during revolution and operation of the drilling tool B100, it is configured for completely removing all the required material from the workpiece to leave a clean corner therein.

Figure 10A:
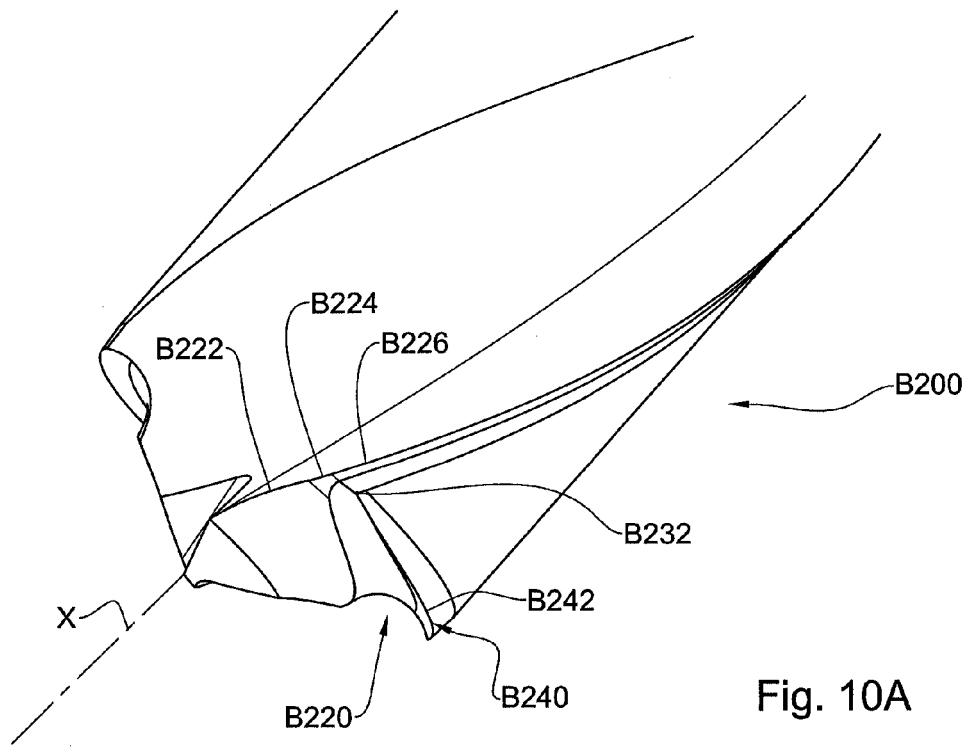
FIG. 10A is a schematic isometric view of a cutting portion of another example of a drill designed in accordance with the method of the present application.
Figure 10B:
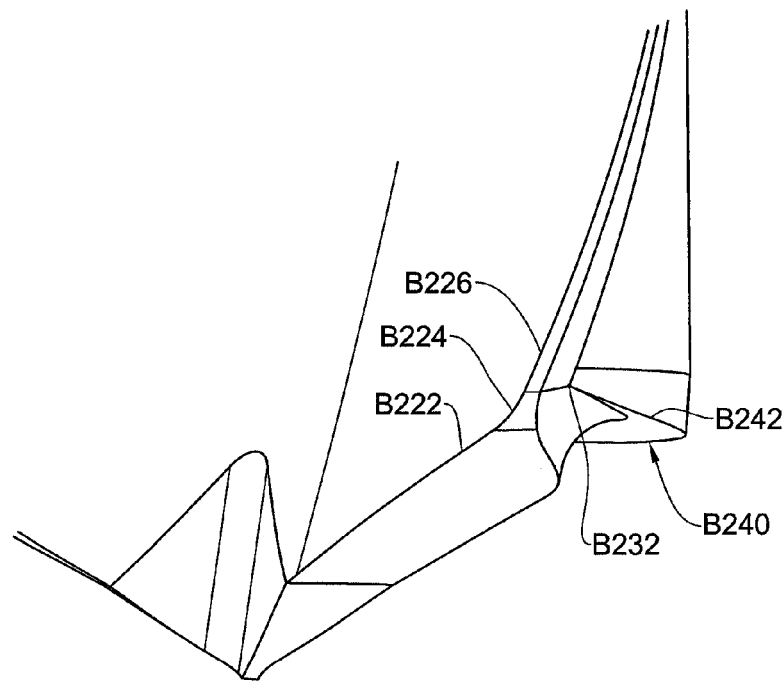
FIG. 10B is a schematic enlarged view of a portion of the drill shown in FIG. 10A.
Figure 11A:
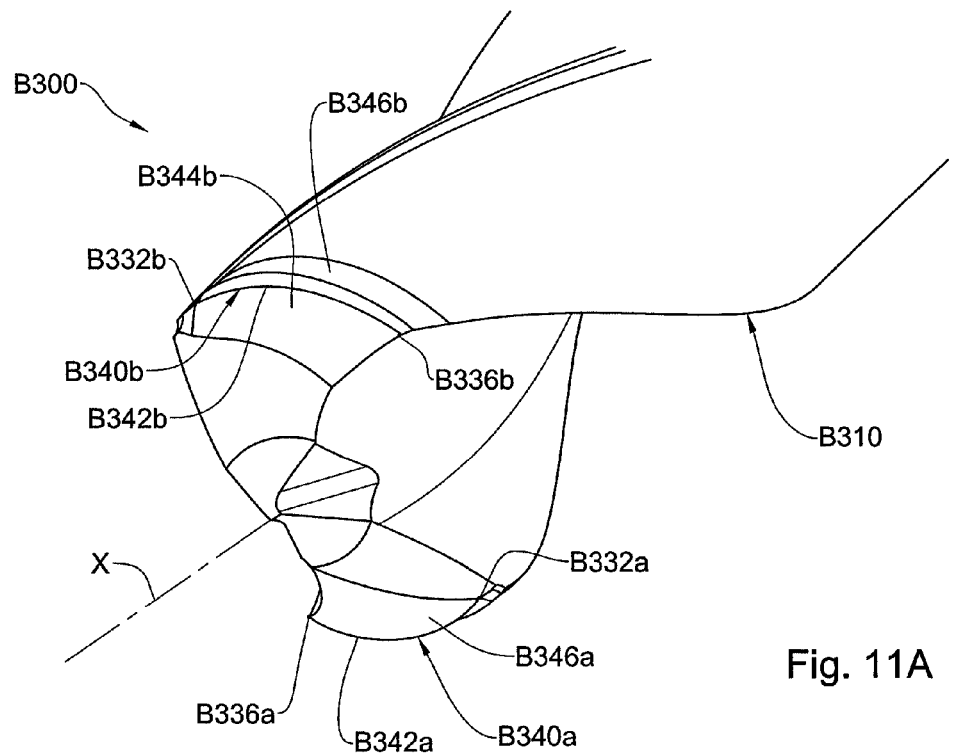
FIG. 11A is a schematic isometric view of a cutting portion of yet another example of a drill designed in accordance with the method of the present application.
Figure 11B:
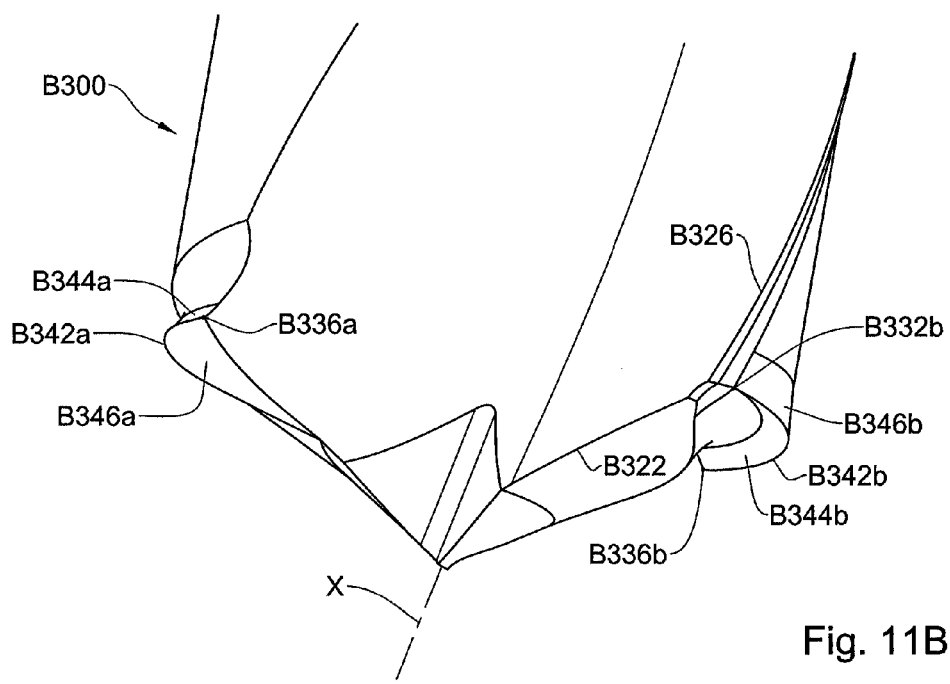
FIG. 11B is a schematic enlarged view of a portion of the drill shown in FIG. 11A.
Figure 11C:
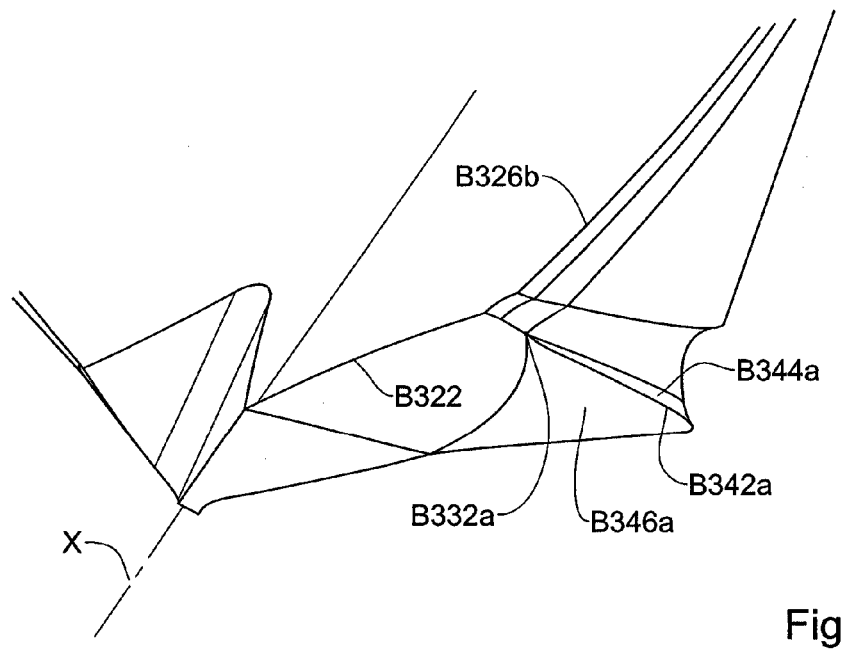
FIGS. 11C and 11D are schematic enlarged views of two sides of the drill shown in FIG. 11A.
Figure 11D:
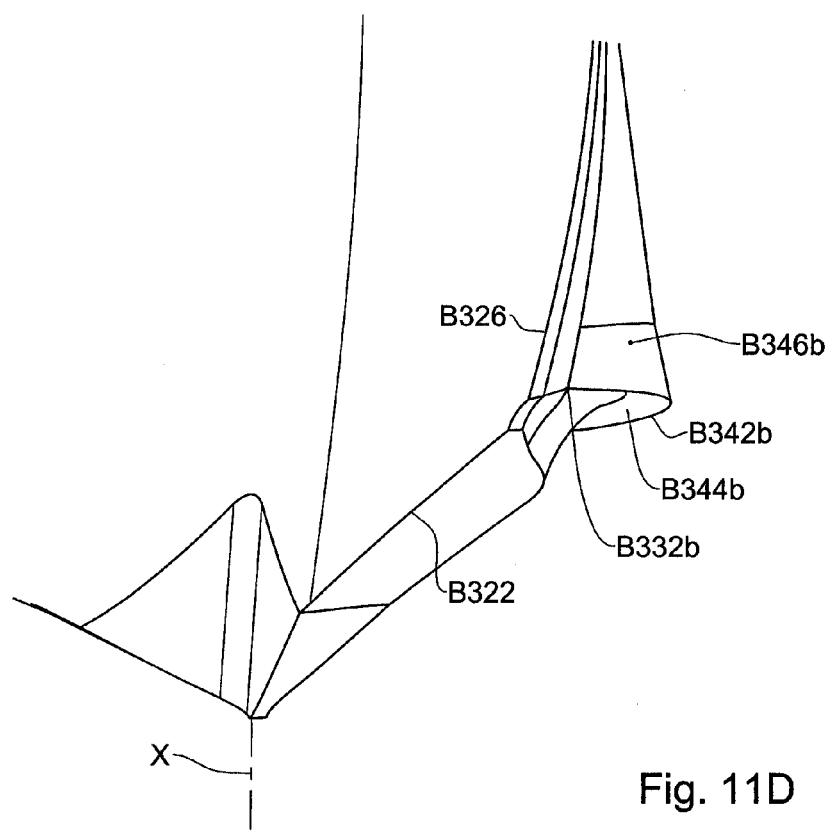

Turning now to FIGS. 10A and 10B, another example of a drilling tool is shown, generally designated as B200. The drilling tool B200 is similar to the previous drilling tool B100 (similar elements were designated with similar reference numbers, upped by B100).

The difference between the drilling tool B100 and the drilling tool B200 lies in the design of the bridging segments. In particular, whereas the drilling tool B100 comprised two bridging segments B140a, B140b covering (in revolution) the entire corner between the central segment B122 and the longitudinal segment B126, in the present example, the bridging segment B240 covers only half of the above mentioned corner.

Specifically, the cutting edge B242 extends between a lead end B232 at a location corresponding (upon revolution) to the intersection between the longitudinal segment B126 and the corner segment B124 and a trailing end B236 (not shown) which does not correspond (upon revolution) to the intersection between the central segment B122 and the corner segment B124.

In operation, the cutting edge B242 is configured for cutting a slit within the bottom portion of the workpiece, only partially detaching chips of material from the workpiece. When the corner segment B124 of the opposite half of the drilling tool B200 passes through the partially removed chips, the resistance to complete removal thereof and the loads exerted on the corner segment are considerably lower than a corresponding drilling tool without a bridging segment B242.

Attention is now drawn to FIGS. 11A to 11D, in which another example of a drilling tool is shown, generally designated B300. The drilling tool B200 is generally similar to the previous drilling tool B200 (similar elements were designated with similar reference numbers, upped by B100).

However, there are several differences between the drilling tool B300 and previously described tools, as detailed below.

The drilling tool B300 is asymmetric, i.e. each of the halves of the drilling tool B300 has a different design. Each of the halves comprises a cutting edge B320 having a central segment B322 and a longitudinal segment B326 but no corner segment.

The first half of the drilling tool B300 comprises a bridging segment B340a of a cutting edge B342a extending along a bridging surface between those of the longitudinal segment B326 and central segment B322, but behind them. In essence, the design of the bridging segment B342a is similar to that of bridging segment B142a described with respect to FIGS. 8A to 8D.

The cutting edge B342a is configured for removing material from a bottom portion of the workpiece. More particularly, it is configured for partially detaching chips of material from the bottom portion.

The second half of the drilling tool B300 comprises a bridging segment B340b of a cutting edge B342b extending along a bridging surface between those of the longitudinal segment B326 and central segment B322, but behind them. In essence, the design of the bridging segment B342b is similar to that of bridging segment B142b described with respect to FIGS. 8A to 8D.

The cutting edge 342b is also configured for removing material from a side portion of the workpiece. More particularly, it is configured for partially detaching chips of material from the side portion.

Together, the cutting edges B342a, B342b mimic an operation similar to that performed by the cutting portion B140 described with respect to FIGS. 8A to 8D, and configured for leaving a sharp corner within the workpiece.

Figure 12A:
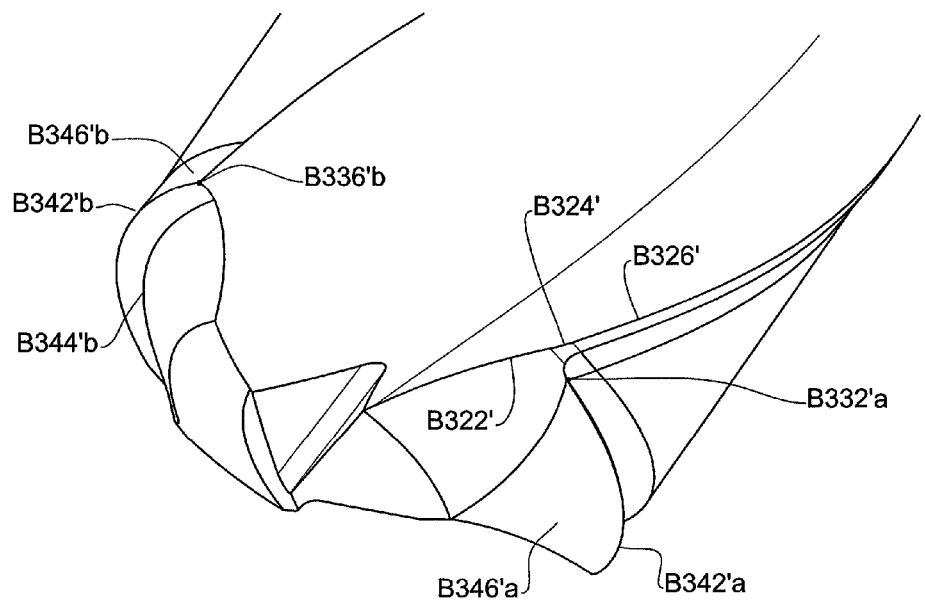
FIG. 12A is a schematic isometric view of a cutting portion of still another example of a drill designed in accordance with the method of the present application.
Figure 12B:
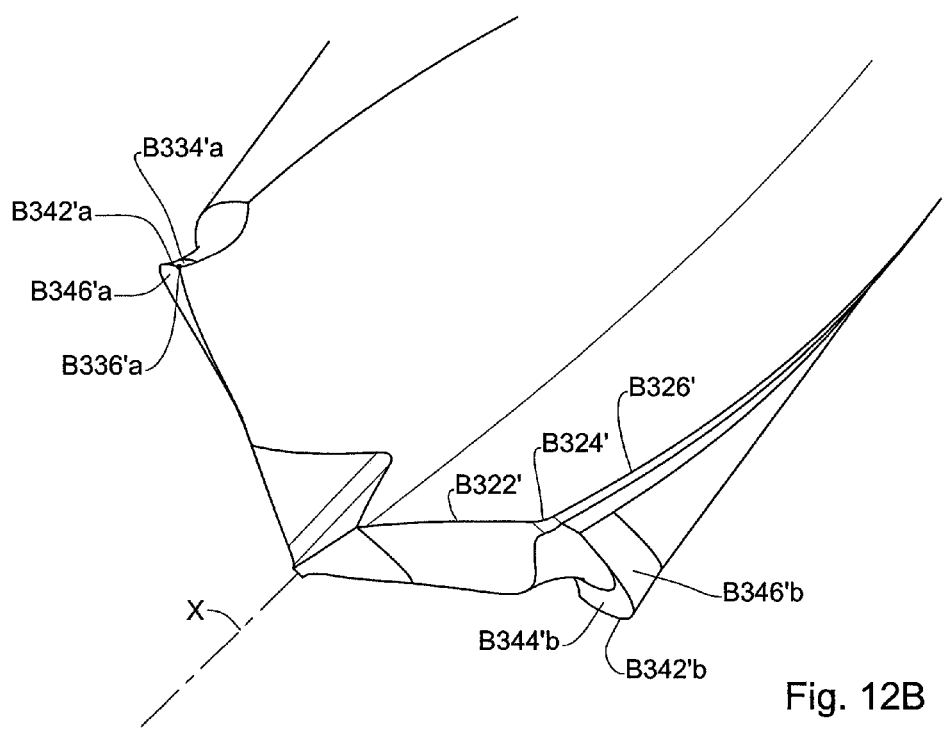
FIG. 12B is a schematic enlarged view of a portion of the drill shown in FIG. 12A.

Attention is now drawn to FIGS. 12A and 12B, in which a similar drilling tool is shown, generally designated as B300'. The main difference between the drilling tool B300' and the previously described drilling tool B300 is that the drilling tool B300' is formed with a corner segment B324' extending between the central segment B322' and the longitudinal segment B326'.

Figure 13:
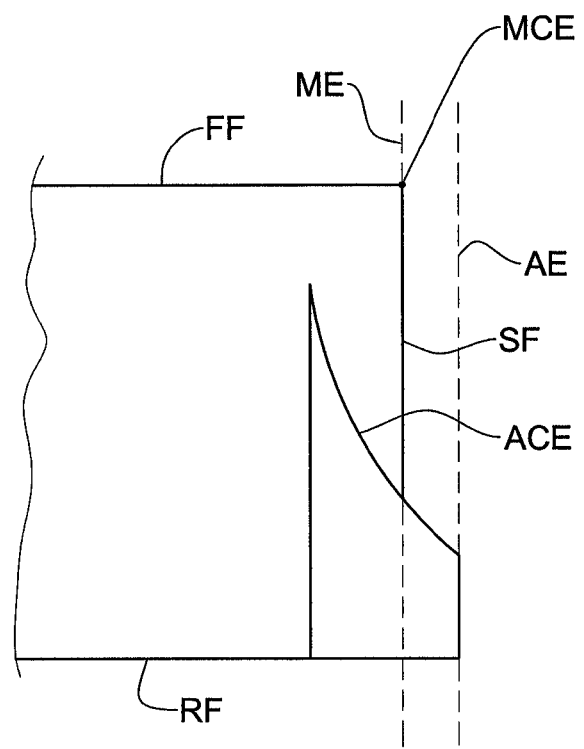
FIG. 13 is a schematic side view of a turning insert according to the present application.
Figure 13A:
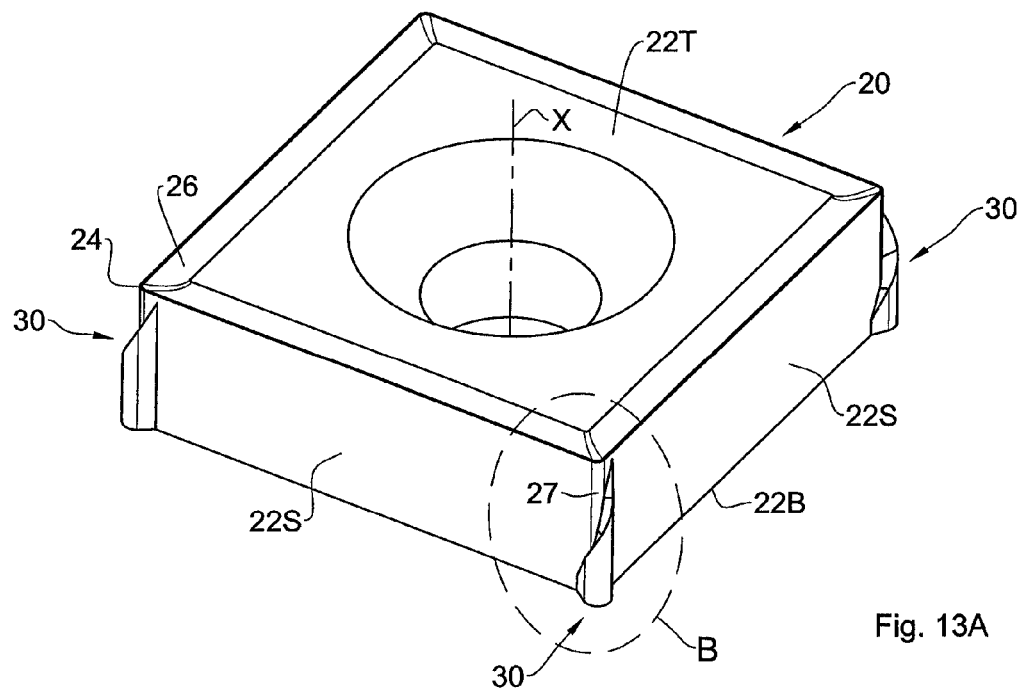
FIGS. 13A and 13B are respective schematic isometric and top views of a turning insert according to the disclosed subject matter.
Figure 13B:
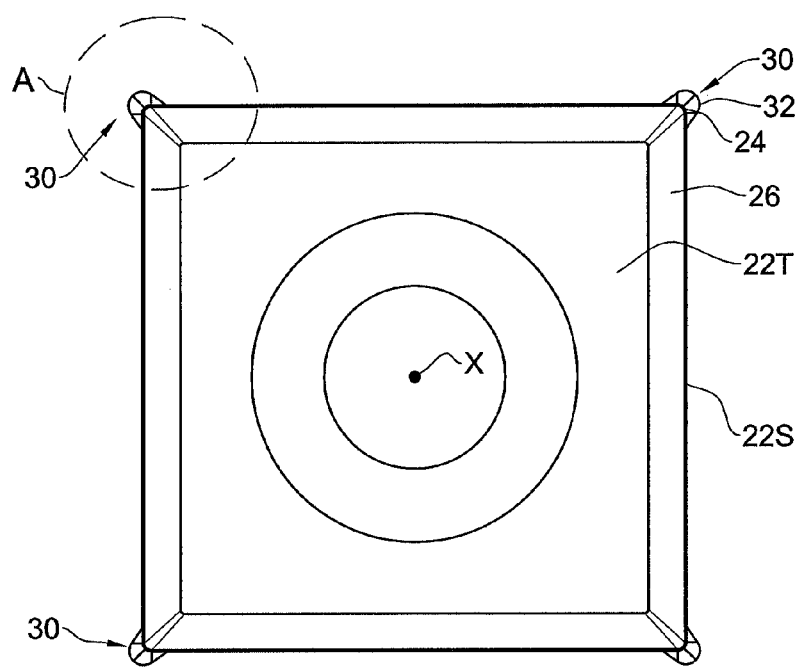

Turning now to FIG. 13, a schematic illustration of a turning insert is provided, demonstrating some of the main concepts of the cutting insert of the present application. In particular, it is observed that the turning insert comprises a front face FF, a rear face RF and a side face SF. The turning insert is formed with a main cutting edge MCE at the intersection between the side face SF and the front face FF.

The turning insert is provided with an auxiliary cutting element having an auxiliary cutting edge ACE having intersection points on the side face (one being visible) and extending between the front face FF and the rear face RF.

It is observed that auxiliary cutting edge ACE extends beyond the main cutting edge MCE so that the auxiliary cutting envelope AE defined by the auxiliary cutting edge ACE extends beyond the main cutting envelope AE.

The turning insert is configured for performing a cutting operation on a revolving workpiece (not shown). In accordance with the above design, the auxiliary cutting edge ACE is configured for coming in contact with the workpiece before the main cutting edge MCE.

As will be explained in detail later and based on the above described method of design of a cutting edge with respect to FIGS. 1 to 12B, it is appreciated that the auxiliary cutting edge ACE is designed based on the above described method.

Several examples of turning inserts will now be described, all sharing the same features of the turning insert described above. Throughout the description, similar elements have been assigned similar reference numbers (e.g. cutting edge 324 of a turning insert 320 is equivalent to cutting edge 224 of turning insert 220 etc.).

Attention is drawn to FIGS. 13A to 13F, in which a cutting insert is shown, generally being designated as 20. The cutting insert comprises a top surface 22T, an opposite bottom surface 22B and four side surfaces 22SS extending therebetween. Each two adjacent side surfaces 22S are angled to one another to form therebetween a corner 27. The cutting insert 20 is further formed with a central bore 25 defining a central axis X of the cutting insert 20.

The cutting insert 20 is formed with four main cutting edges 24, each main cutting edge 24 being defined at the intersection between the top surface 22T and the corner 27 formed by the side surfaces 22S. The main cutting edges 24 are provided with a rake surface 26 constituted by a portion of the top surface 22T, extending along the intersection between the top surface 22T and the side surfaces 22S.

Each corner 27 is formed thereon with an additional cutting element 30, protruding outwardly from the corner 27 so as to extend beyond the main cutting edge 24 along a plane perpendicular to the top surface 22T and bisecting the angle of the corner 27.

The additional cutting element 30 extends about the corner 27, along a direction between the top surface 22T and the bottom surface 22B, beginning from one side surface and ending at another, so as to fully surround the corner 27.

The additional cutting element is formed with an auxiliary cutting edge 32 defined at the intersection between a rake surface 36 and a relief surface 34 of the additional cutting element 30.

The rake surface 36 extends generally transverse to the side surfaces 22S and forming an intersection line 33 therewith. The intersection line has a start point $33_S$ at one side surface 22S adjacent the top surface 22T (but not on the cutting edge 24 or on the intersection between the top surface 22T and the side surface 22S), and an end point $33_E$ at the neighboring side surface, adjacent the bottom surface 22B (but not on the intersection between the bottom surface 22B and the side surface 22S). The start point 33S is located about 0.5 mm from the top surface 22T along the axial direction of the cutting insert 20.

The intersection line 33 is divided into three segments, 33a, 33b and 33c, the first extending along the first side surface 22S, the second extending along the corner 27, and the third extending along the neighboring side surface 22S. It is observed that in the present example, the segments 33a and 33c are straight, while the middle segment 33b is curved.

Due to the curved design of the additional cutting element 30, it is appreciated that the segment 33a is closer to the top surface 22T while the segment 33c is closer to the bottom surface 22B, with the middle segment 33b extending therebetween.

The relief surface 34 extends along the direction between the top surface 22T and the bottom surface 22B, and is curved in order to fully surround the corner 27. It is observed that, similar to the segments 33a, 33b, 33c of the intersection line, the relief surface is formed with three surface portions—two planar portions at the side surfaces 22S, and a curved portion at the corner 27.

The auxiliary cutting edge 32 of the additional cutting element 30 extends, at its broadest sense, between a start and an end point which coincide with the start and end points $33_S$, $33_E$ of the intersection line 33. However, contrary to the intersection line 33 which fully lies on the side surfaces 22S and corner 27, the cutting edge 32 extends beyond these surfaces and projects from the main cutting edge 24 as can be seen in the top view of FIG. 13C.

Figure 13C:
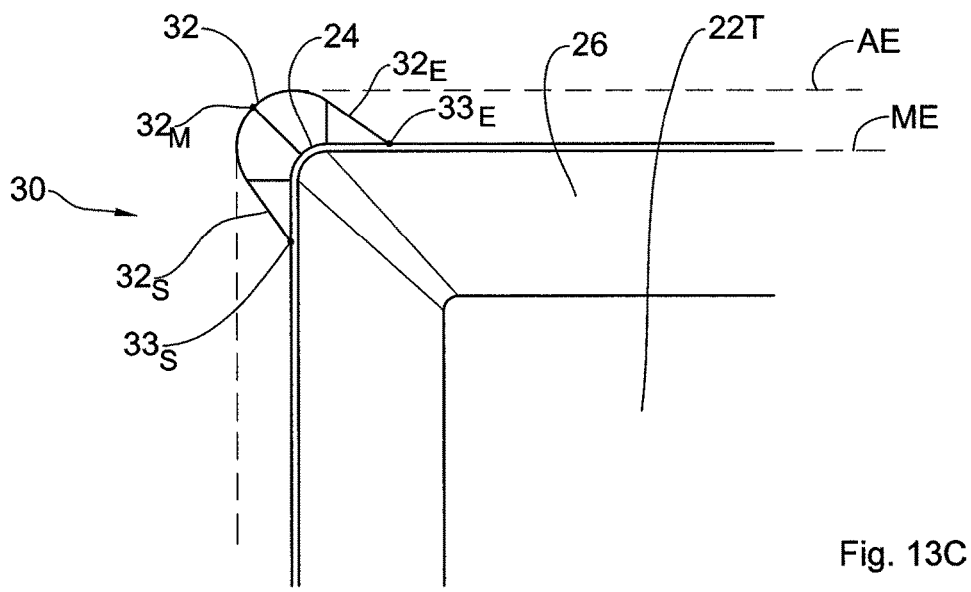
FIG. 13C is a schematic enlarged view of detail A shown in FIG. 13B.
Figure 13D:
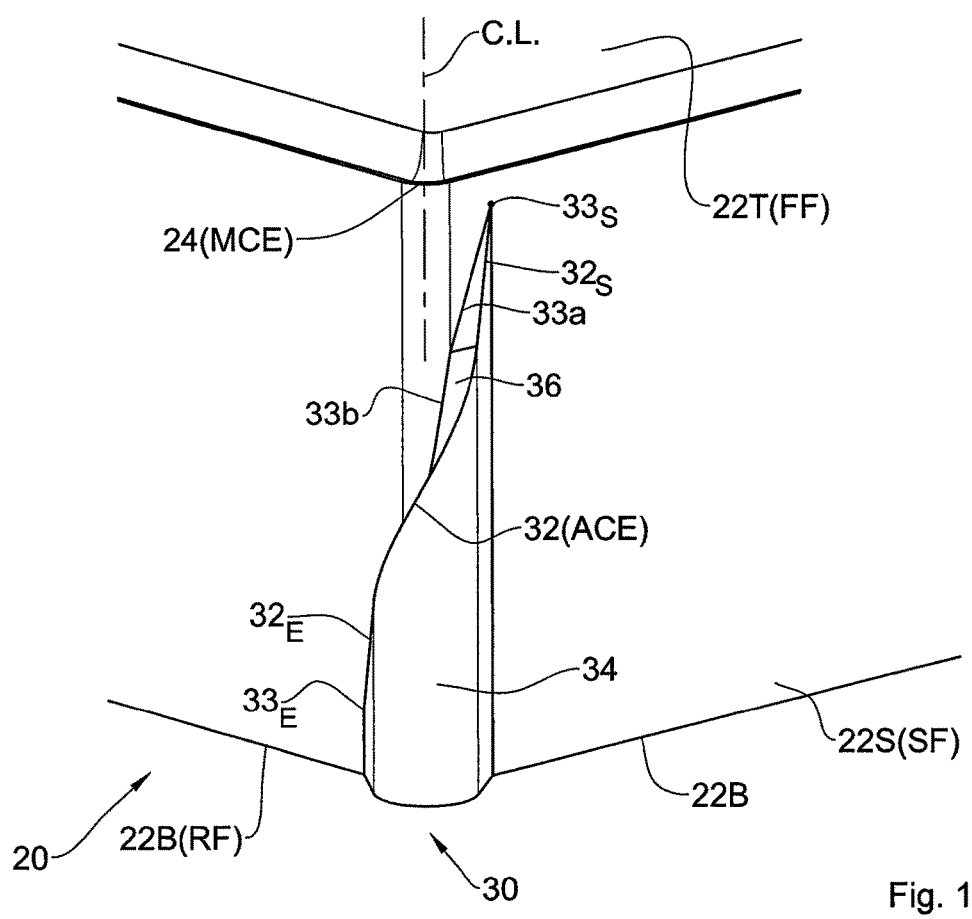
FIG. 13D is a schematic enlarged view of detail B shown in FIG. 13A.
Figure 13E:
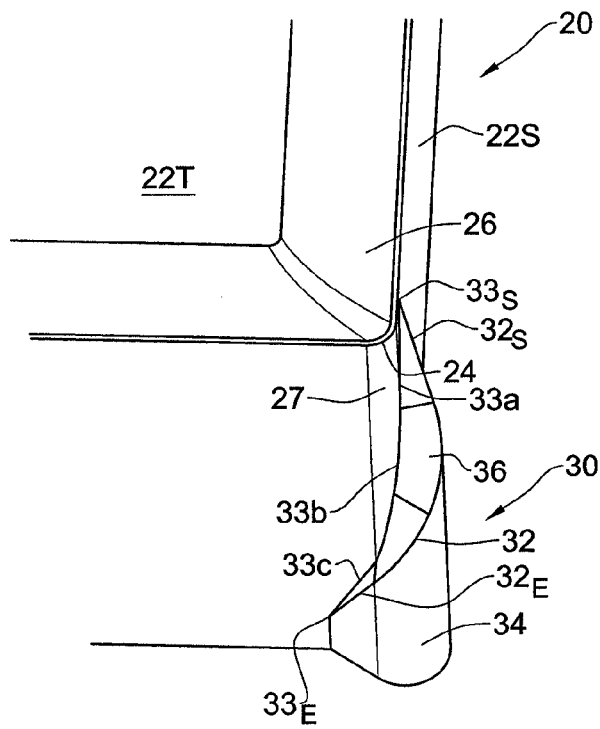
FIGS. 13E and 13F are schematic enlarged perspective views of detail B shown in FIG. 13D.
Figure 13F:
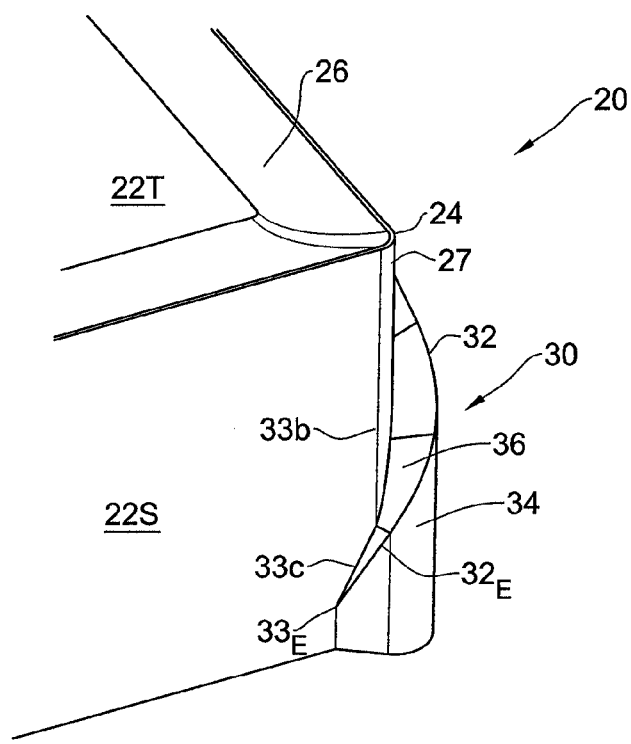
Figure 13G:
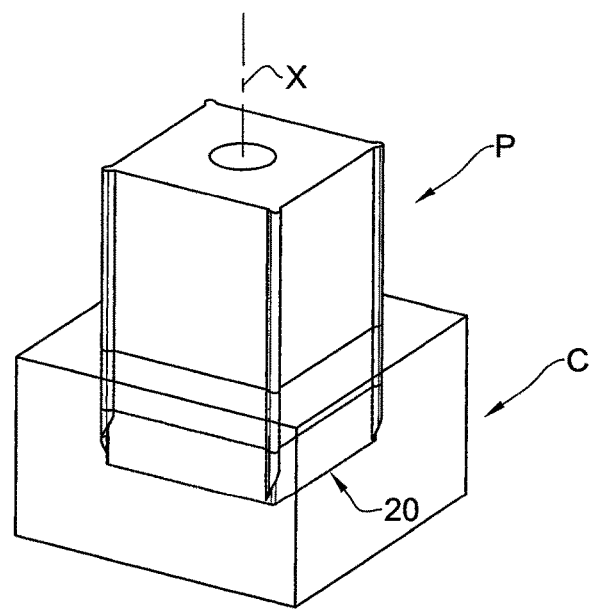
Figure 13H:
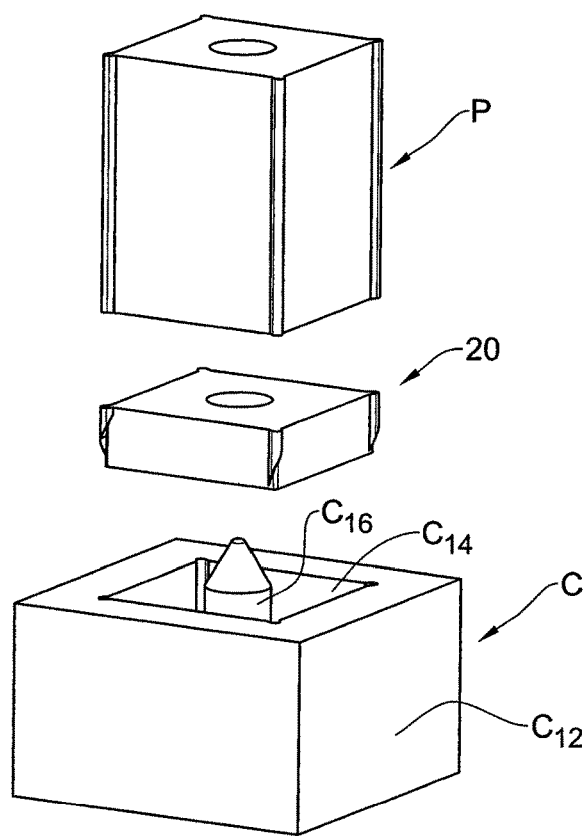
Figure 13I:
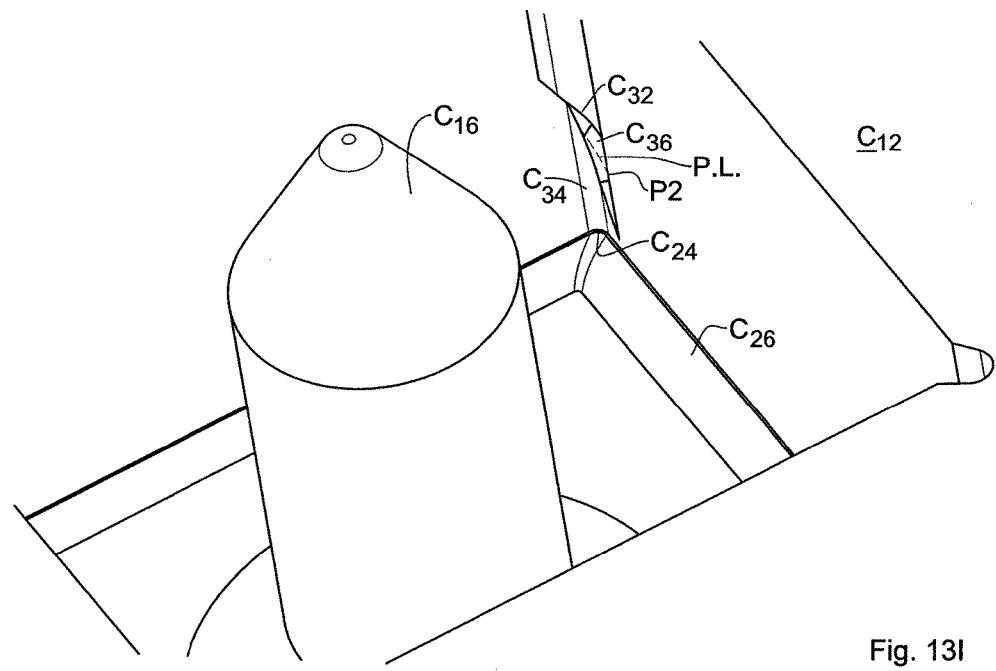
FIG. 13I is a schematic enlarged view of a portion of the mold shown in FIGS. 13G and 13H.
Figure 13J:
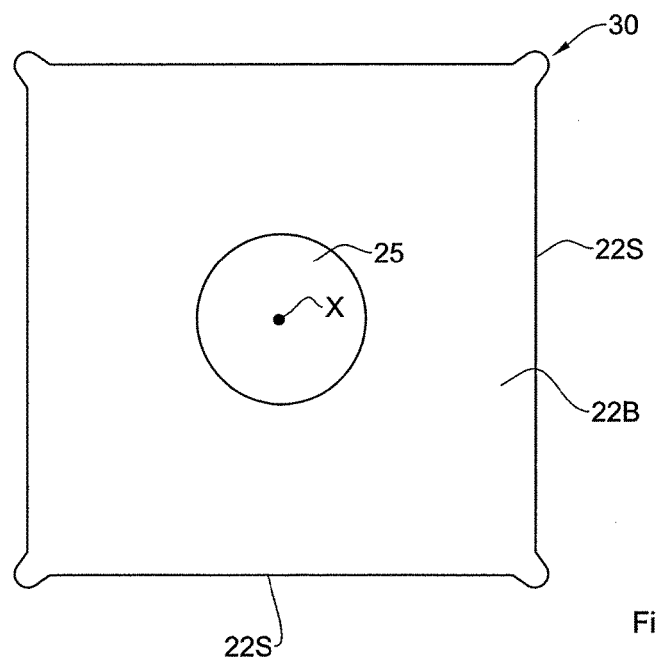
FIG. 13J is a schematic bottom view of a part of the mold shown in FIGS. 13G and 13H.
Figure 13K:
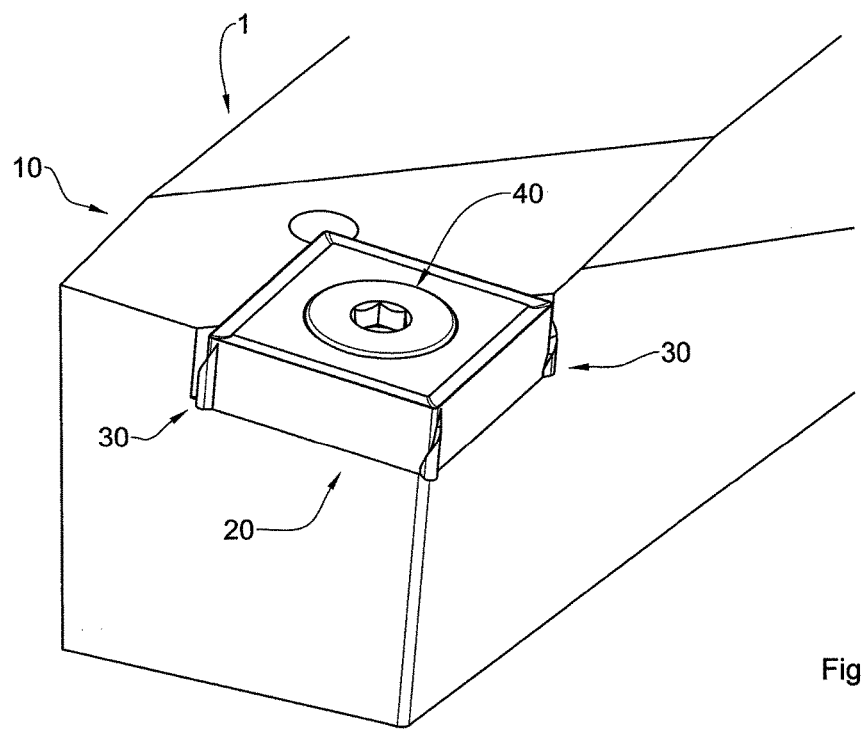
FIG. 13K is a schematic isometric view of a turning tool comprising the insert shown in FIGS. 13A to 13F.
Figure 13L:
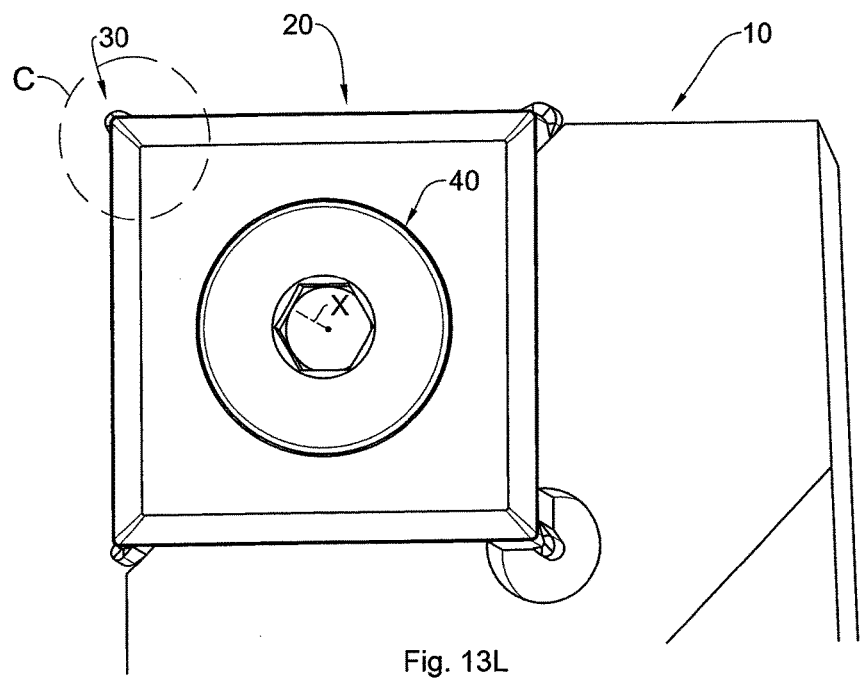
FIG. 13L is a schematic enlarged top view of the turning tool shown in FIG. 13K.

Further, as seen in the top view of FIG. 13C, the auxiliary cutting edge is formed with a max-point $32_M$, which is maximally distant from the main cutting edge 24 in a top view of the cutting insert 20. In the present example, the symmetric design of the additional cutting element 30 entails that the max-point $32_M$ is located on the bisector of the angle of the corner 27.

It is also observed that the auxiliary cutting edge 32 is formed as a single curve extending about the corner and along the direction between the top and the bottom surface 22T, 22B, thereby having a length which highly exceeds the length of the main cutting edge 24.

In addition, the cutting insert 20 shown in the above example is an indexible cutting insert, wherein during each cutting operation, one of the four cutting edges 24 is configured for coming in contact with a workpiece (not shown). However, the cutting insert 20 is not reversible, i.e. the bottom portion of the cutting insert 20 is formed with not cutting edges.

Turning now to FIGS. 13G to 13J, a press-mold is shown for the manufacture of the cutting insert 20 previously described, the mold comprising a female member C and a male member P configured for being received within a cavity $C_{14}$ of the female member C.

First of all, it is noted that the male member P is a simple press member, having straight and planar edges and surfaces respectively, extending along the axial direction of the press-mold.

It is further observed that the cavity $C_{14}$ of the female member C is shaped as the inverse image of the cutting insert 20, and is provided, at the middle thereof with a pole member C16 configured for forming the bore 25 of the cutting insert 20.

In manufacture, the female member C is filled with particulate material and the male member is hard-pressed into the cavity $C_{14}$ under predetermined heat and pressure conditions in order to solidify the particulate material and transform it into a uniform solid block constituting the cutting insert 20.

However, it is appreciated that the amount of particulate material provided into the cavity $C_{14}$ cannot be precisely measured (due to the nature of the particulate material), and so in the majority of case, the cavity contains either more or less material than planned.

In most molds, the male and female members are configured with a conical geometry, allowing easier extraction of the male member from the cavity. However, in the case the cavity contains less particulate material, such a configuration might prove problematic, since the male member may progress until it comes into contact, or even collision with the female member, causing damage to the mold members.

In the present example, this is elegantly prevented since the male member is free to displace along the axial direction of the mold without coming in contact with the female member. Thus, even if the female member contains less particulate material, the male member will still press the material without contacting the female member, and produce a cutting insert which is slightly shorter n height between the top and the bottom surface 22T, 22B.

Turning now to FIGS. 13K to 13N, the cutting insert 20 is shown when mounted onto a cutting tool holder 10 and clamped with a fastening screw 40 to form a turning cutting tool 1. It is observed that the cutting insert 20 is mounted onto the holder 10 slightly tilted forward and sideways (about 5 deg. in each of these directions).

Figure 13M:
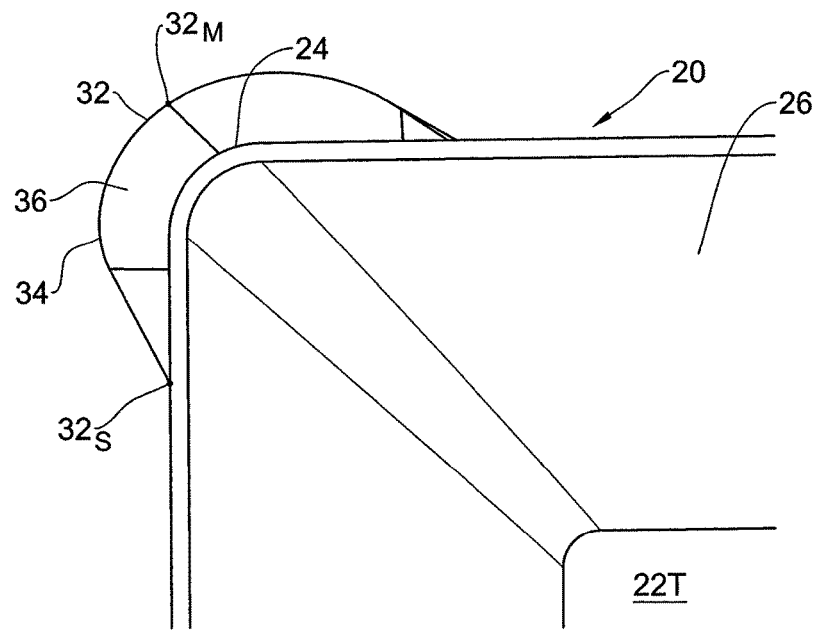
FIG. 13M is a schematic enlarged view of detail C shown in FIG. 13L.
Figure 13N:
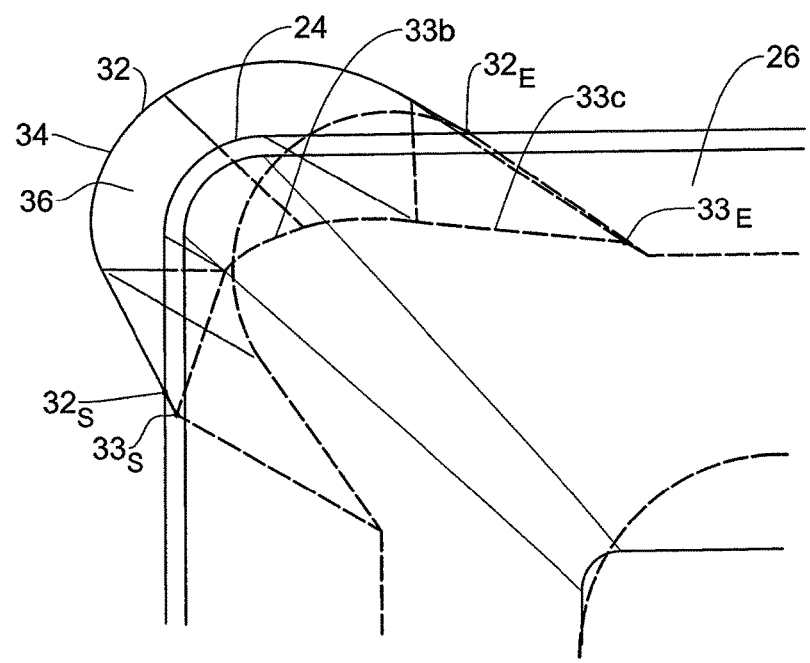
FIG. 13N is a schematic view of FIG. 13M including hidden lines.

With particular reference being made to FIGS. 13M and 13N, it is observed that in the top view of the cutting tool 1 (the plane of which is perpendicular to the workpiece to be cut), the main cutting edge 24 obscured a portion of the additional cutting element 30 and of the auxiliary cutting edge 32. However, the majority of the auxiliary cutting edge 32 is still exposed and extends beyond the main cutting edge 24, so that, in operation, it will come into contact with the workpiece prior to the main cutting edge 24.

It is further observed that due to the tilt of the cutting insert 20, which is configured for allowing the cutting tool 1 to perform side cutting (progressing leftwards with respect to the top view), the max-point $32_M$ is not shifted and is no longer located on the bisector of the angle of the corner 27. In addition, it is also observed that the max-point is now closer to the main cutting edge 24, and the entire auxiliary cutting edge 32 is now more evenly distributed about the corner 27 in comparison with the top view of the cutting insert 20 shown in FIG. 13C.

In addition, with particular reference being made to FIG. 13N, since the start and end points $33_S$, $33_E$ are obscured by the top surface 22T of the cutting insert 20, the effective start and end points of the auxiliary cutting edge 32 are points $32_S$ and $32_E$. These points, in the top view of FIGS. 13M, 13N, lie on the intersection line between the top surface 22T and the side surfaces 22S.

It is also noted that since the cutting tool 1 is designated for side cutting, the additional cutting element 30 projects to a greater extent from the left side surface 22S than from the front side surface 22S.

Attention is now brought to FIGS. 14A to 14E, in which another example of a cutting insert is shown, generally being designated as 20'. The cutting insert 20' is generally similar in construction to the cutting insert 20, with the difference being in that the cutting insert 20' is also reversible.

The cutting insert 20' is similar to the previously described cutting insert 20 and so, similar elements have been allocated similar reference numbers with the addition of a prime ('), e.g. cutting edge 24 of cutting insert 20 is similar to cutting edge 24' of cutting insert 20'.

This difference is reflected in the design of the additional cutting element 30', which, has an additional rake surface 36' and an additional cutting edge 32' which are located closer to the bottom surface 22B of the cutting insert 20.

Thus, the cutting insert 20' comprises eight main cutting edges 24—four at the intersection between the top surface 22T and the corners and four at the intersection between the bottom surface 22B and the corners, as well as eight auxiliary cutting edges 32', two edges for each of the additional cutting elements 30'.

Turning now to FIGS. 14F to 14I, a press-mold is shown configured for the manufacture of the cutting insert 20'. As opposed to the mold members P and C, the mold members P' and C' of the present example differ in their design by that the male member P' is formed with a shaped cavity portion of its own $P_{14}$ configured for forming half of the cutting insert 20'.

Figure 14A:
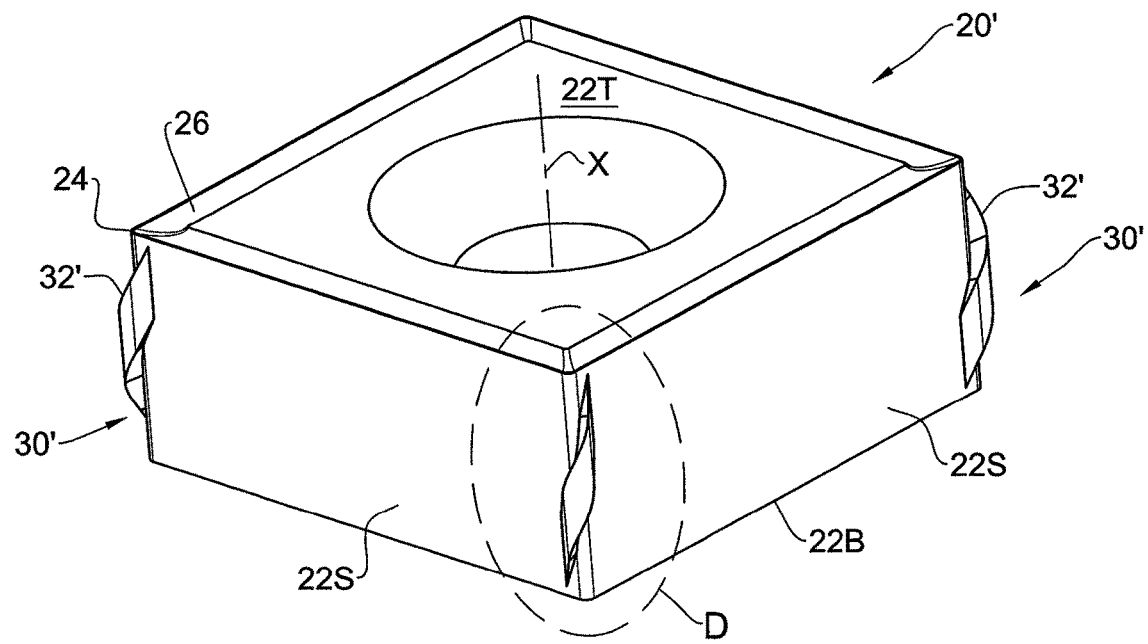
FIG. 14A is a schematic isometric view of a turning insert according to another example of the disclosed subject matter.
Figure 14B:
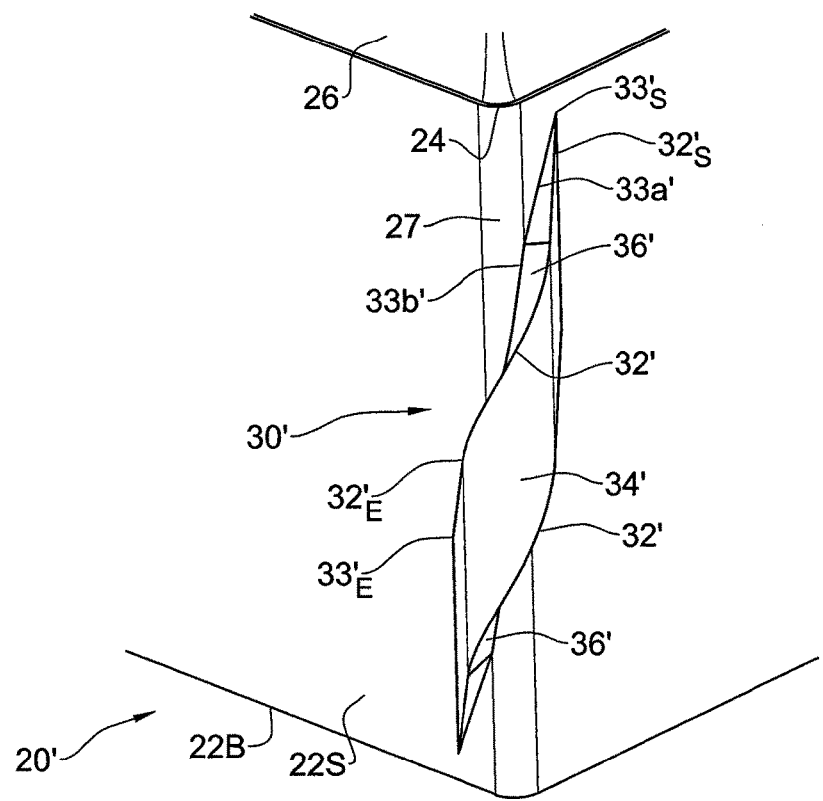
FIG. 14B is a schematic enlarged view of detail D shown in FIG. 14A.
Figure 14C:
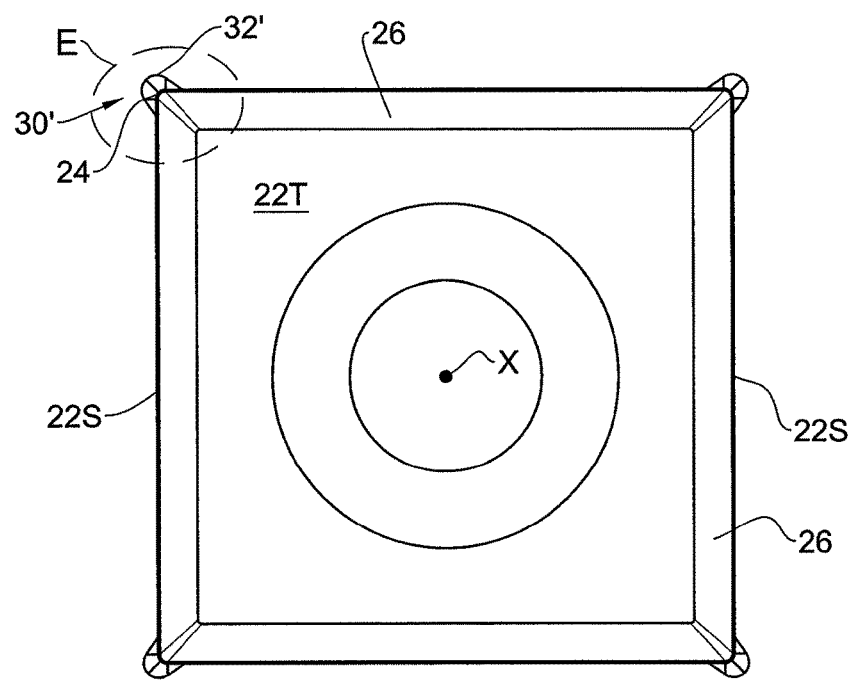
FIG. 14C is a schematic top view of the turning insert shown in FIG. 14A.
Figure 14D:
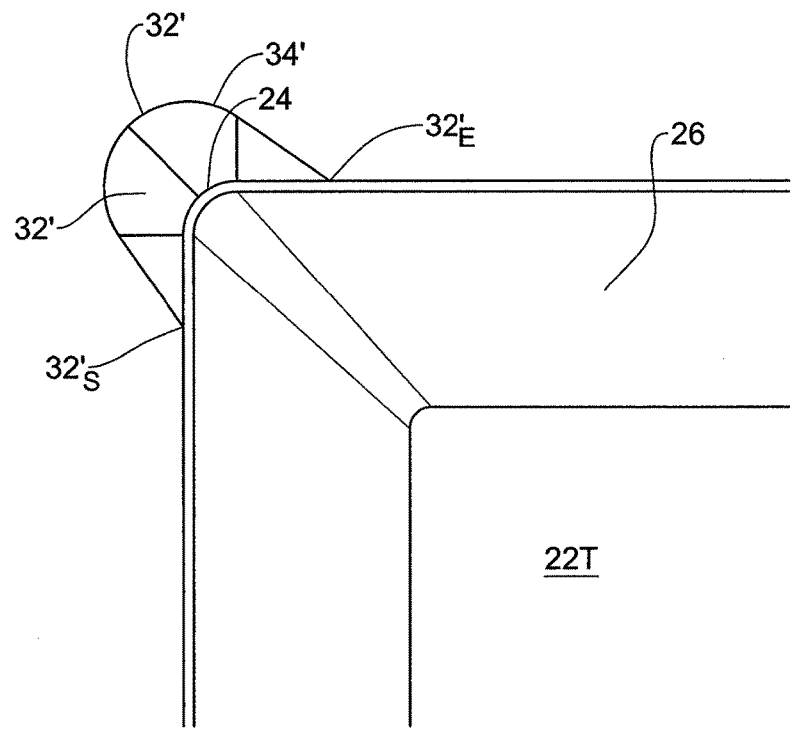
FIG. 14D is a schematic enlarged view of detail E shown in FIG. 14C.
Figure 14E:
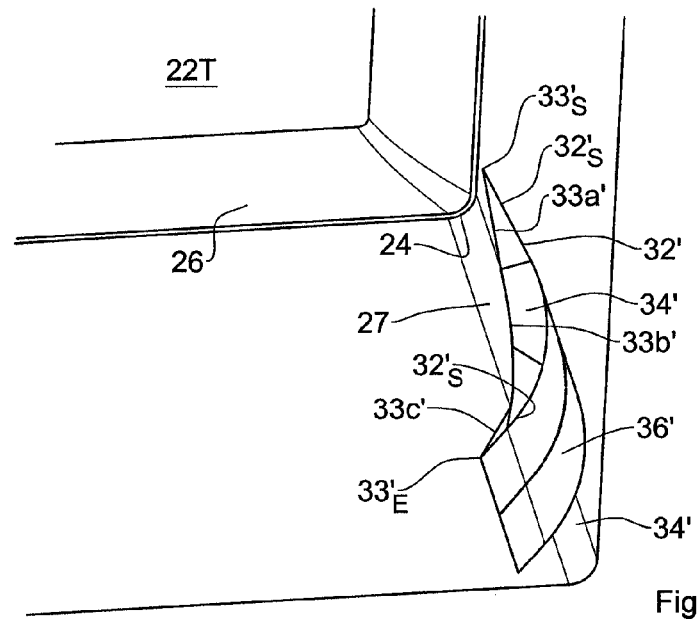
FIG. 14E is a schematic perspective view of detail D shown in FIG. 14B.
Figure 14F:
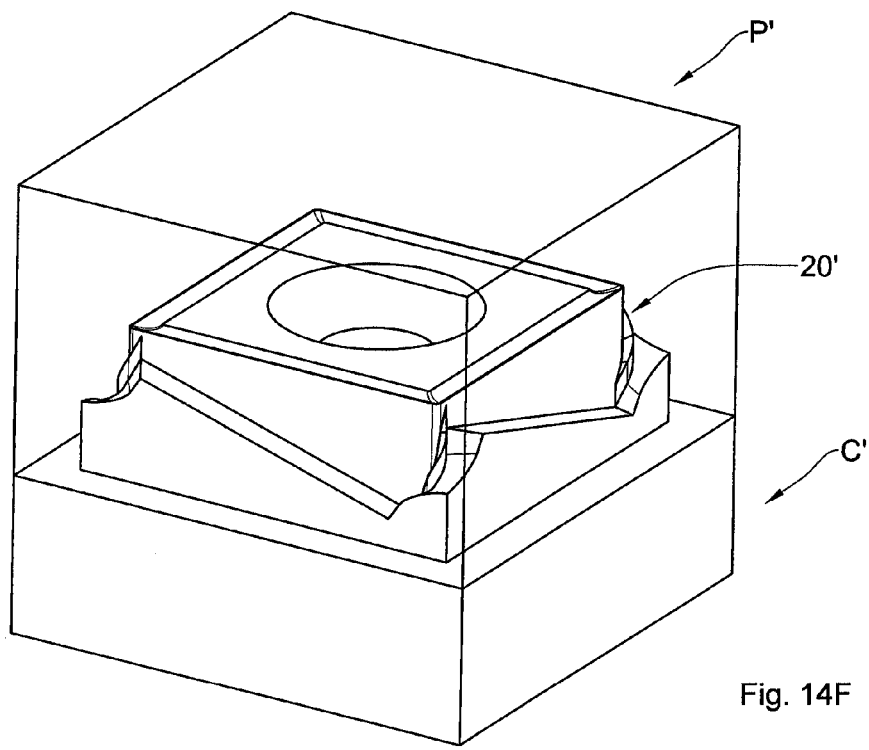
FIGS. 14F and 14G are respective schematic isometric assembled and exploded views of a mold for the manufacture of the turning insert shown in FIGS. 14A to 14E.
Figure 14G:
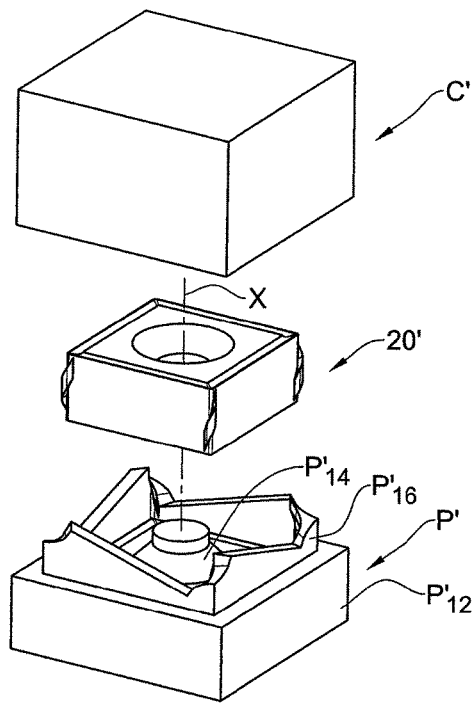
Figure 14H:
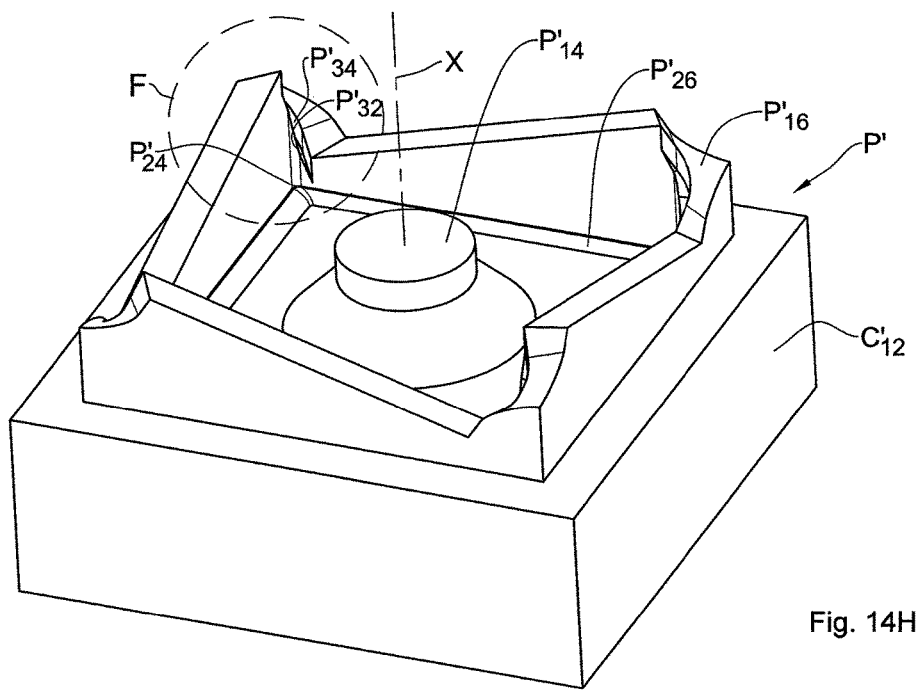
FIG. 14H is a schematic isometric view of a part of the mold shown in FIGS. 14F and 14G.
Figure 14I:
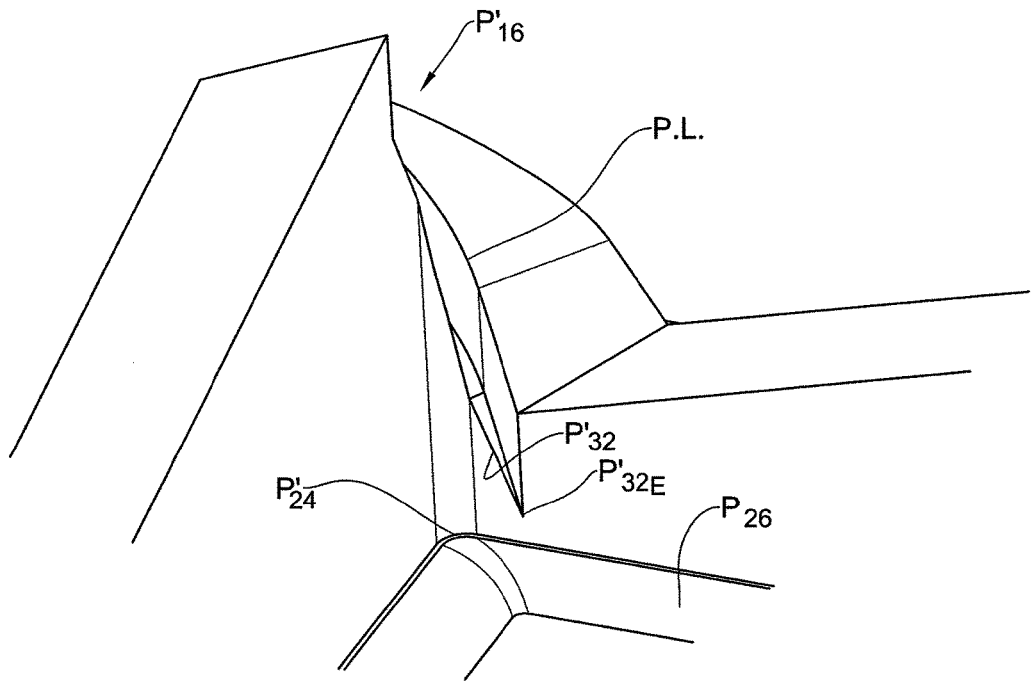
FIG. 14I is a schematic enlarged view of detail F shown in FIG. 14H.

Reverting to FIG. 14E, it is noted that the press-mold is designed such that the parting line between the male and female members P' and C' does not pass along any of the auxiliary cutting edges 32', but rather along the middle of the relief surface 34 of the additional cutting element 30'. This eliminates any unwanted tolerances or defects at the auxiliary cutting edge 32' formed in the additional cutting element 30'.

Figure 14J:
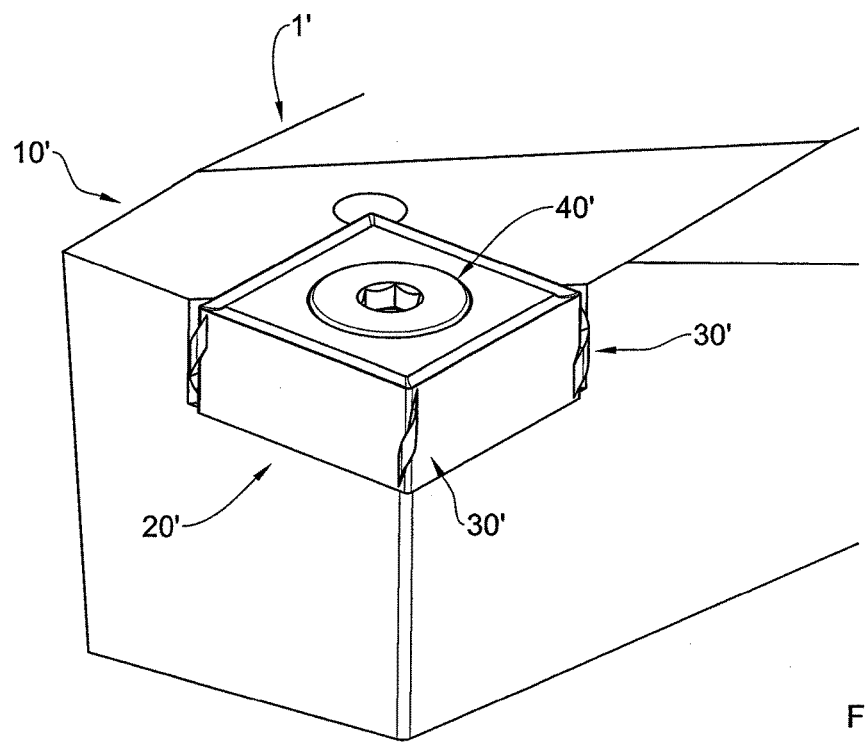
FIG. 14J is a schematic isometric view of a turning tool comprising the insert shown in FIGS. 14A to 14E.
Figure 14K:
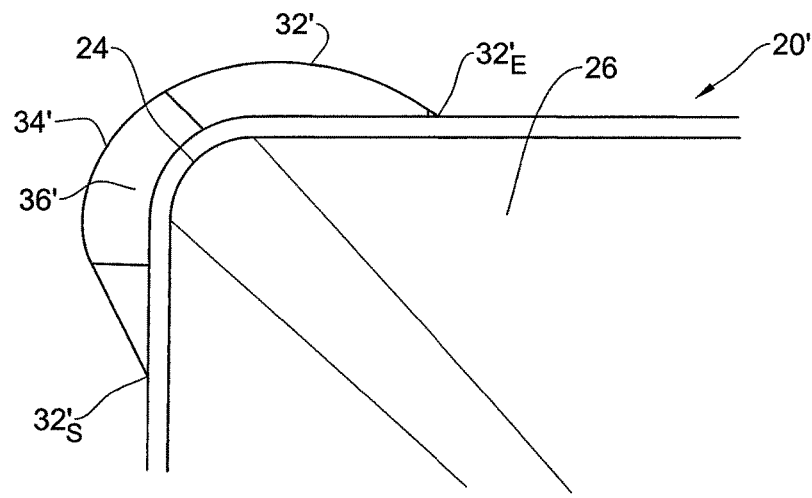
FIG. 14K is a schematic enlarged top view of the turning insert of FIGS. 14A to 14E when mounted onto the tool of FIG. 14J.
Figure 14L:
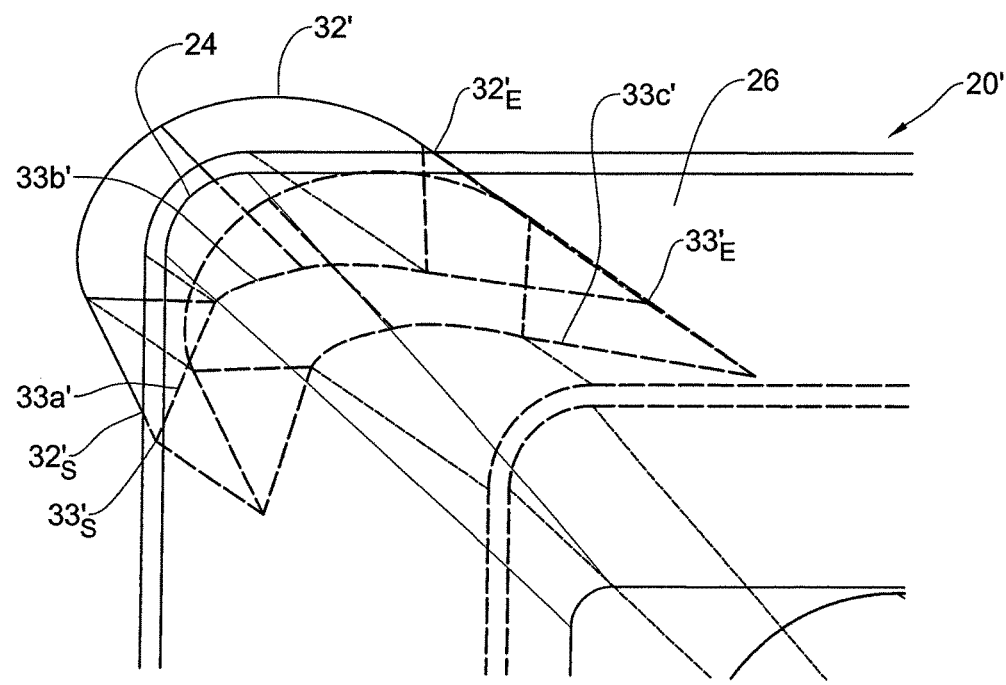
FIG. 14L is a schematic view of FIG. 14K including hidden lines.
Figure 15A:
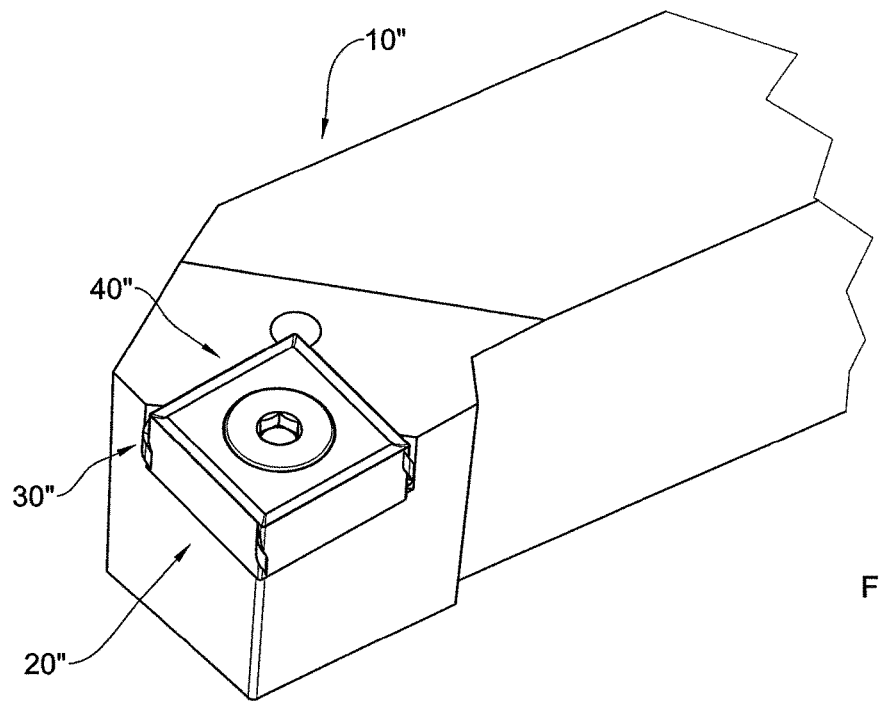
FIGS. 15A and 15B are respective schematic isometric and top views of a turning tool comprising a turning insert according to still another example of the disclosed subject matter.
Figure 15B:
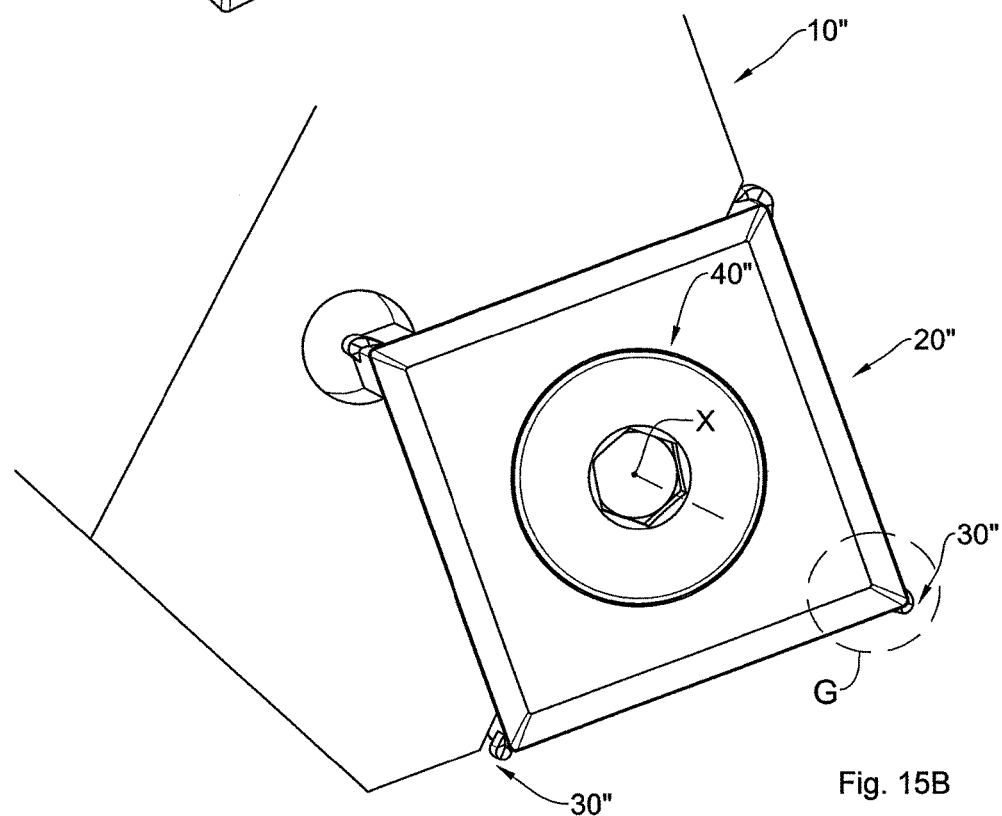
Figure 15C:
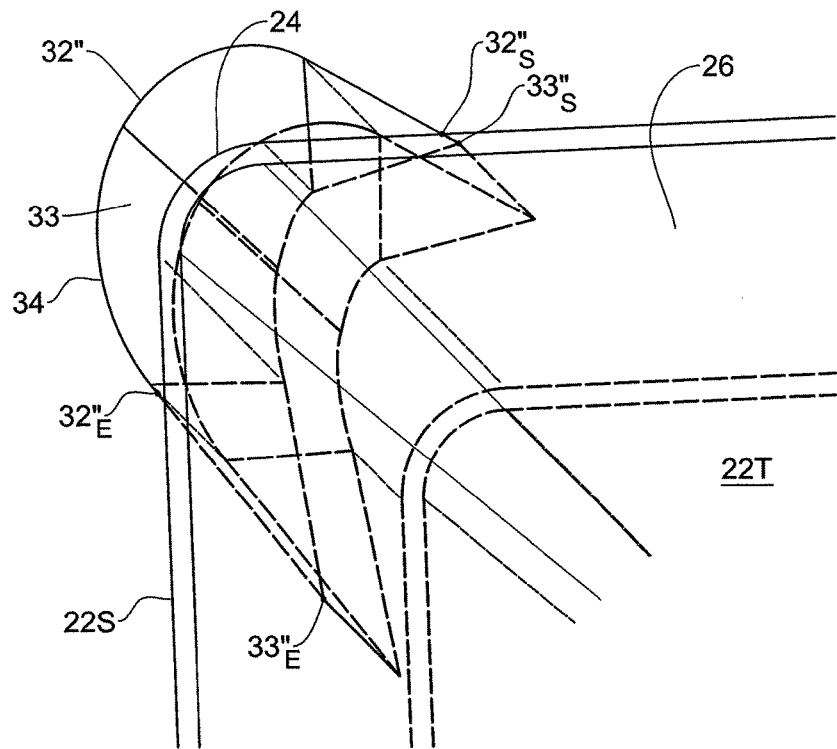
FIG. 15C is a schematic enlarged view of detail G shown in FIG. 15B, including hidden lines.
Figure 15D:
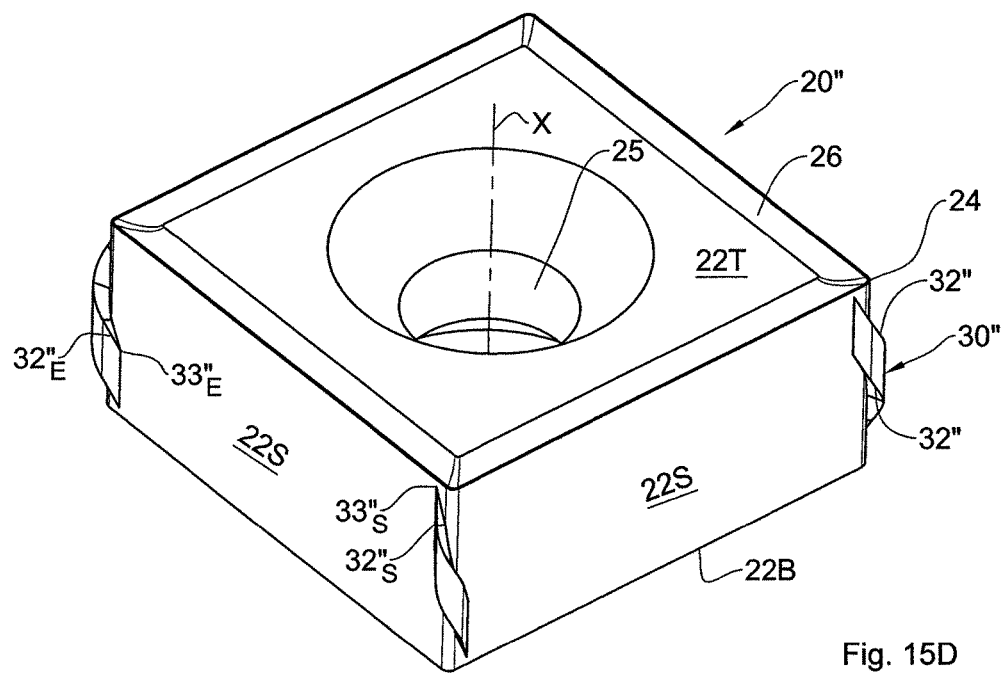
FIG. 15D is a schematic isometric view of the turning insert shown in FIGS. 15A to 15C.

Attention is now drawn to FIGS. 14J to 14L, in which the cutting insert 20' is shown when mounted onto a cutting tool holder 10' to form a turning tool 1', essentially similar to the turning tool 1.

As in the previously described example, the original start and end points 33S, 33E are obscured in the top view, so that the effective cutting edge 32' coming in contact with the workpiece is defined between the start and end points 32S, 32E.

Turning now to FIGS. 15A to 15D, another example of a cutting insert is shown, being generally designated as 20". The cutting insert 20" is generally similar to the previously described cutting inserts 20, 20', with the difference being that the cutting insert 20" is configured for front cutting in a turning operation, rather than for side cutting.

The cutting insert 20" is similar to the previously described cutting inserts 20, 20' and so, similar elements have been allocated similar reference numbers with the addition of a double prime ('), e.g. cutting edge 24 of cutting insert 20 is similar to cutting edge 24" of cutting insert 20".

First of all, it is observed that while the additional cutting elements 30, 30' extended, from top to bottom, in a CW direction, the additional cutting element 30" extends in a CCW direction. In other words, the auxiliary cutting edges 32, 32' had a start point at the left side surface 22S adjacent the top surface 22T and an end point at the front side surface 22S adjacent the bottom surface 22B, whereas the auxiliary cutting edge 32" has a start point at the front side surface 22S adjacent the top surface 22T and an end point at the left side surface 22S adjacent the bottom surface 22B.

As such, it is observed that the cutting insert 20", when similarly tilted when mounted onto the holder 10" (5 deg. in each direction), protrudes more from the front side surface 22S than from the left side surface 22S, making it more suitable for front cutting.

Attention is now drawn to FIGS. 16A to 16E, yet another example of a cutting insert is shown, being generally designated as 20'''. The cutting insert 20''' is generally similar to that described with respect to FIGS. 14A to 14L, with the difference being that the rake surface 36 of the additional cutting element is formed with several steps 36a to 36d, and so the auxiliary cutting edge 32''' itself is split into several corresponding segments.

The cutting insert 20''' is both indexible and reversible and configured for side cutting in a turning operation.

The cutting insert 20''' is similar to the previously described cutting inserts 20, 20', and 20", and so, similar elements have been allocated similar reference numbers with the addition of a tripple prime ('''), e.g. cutting edge 24 of cutting insert 20 is similar to cutting edge 24''' of cutting insert 20".

The separation of the rake surface 36 causes the cutting insert 20''' to remove four chips from the workpiece, each chip having a width smaller than that of the chip removed by the cutting insert 20.

It is noted that since the cutting insert 20''' is produced in a pressing process, the surfaces 35 bridging between the steps of the cutting portion 30''' are of straight vertical orientation. However, since the cutting insert 20''' is mounted onto the cutting tool holder 10 at a tilt angle (about 7° to each of the side surfaces), the surfaces 35 each obtain a different angle with respect to the workpiece.

Figure 16A:
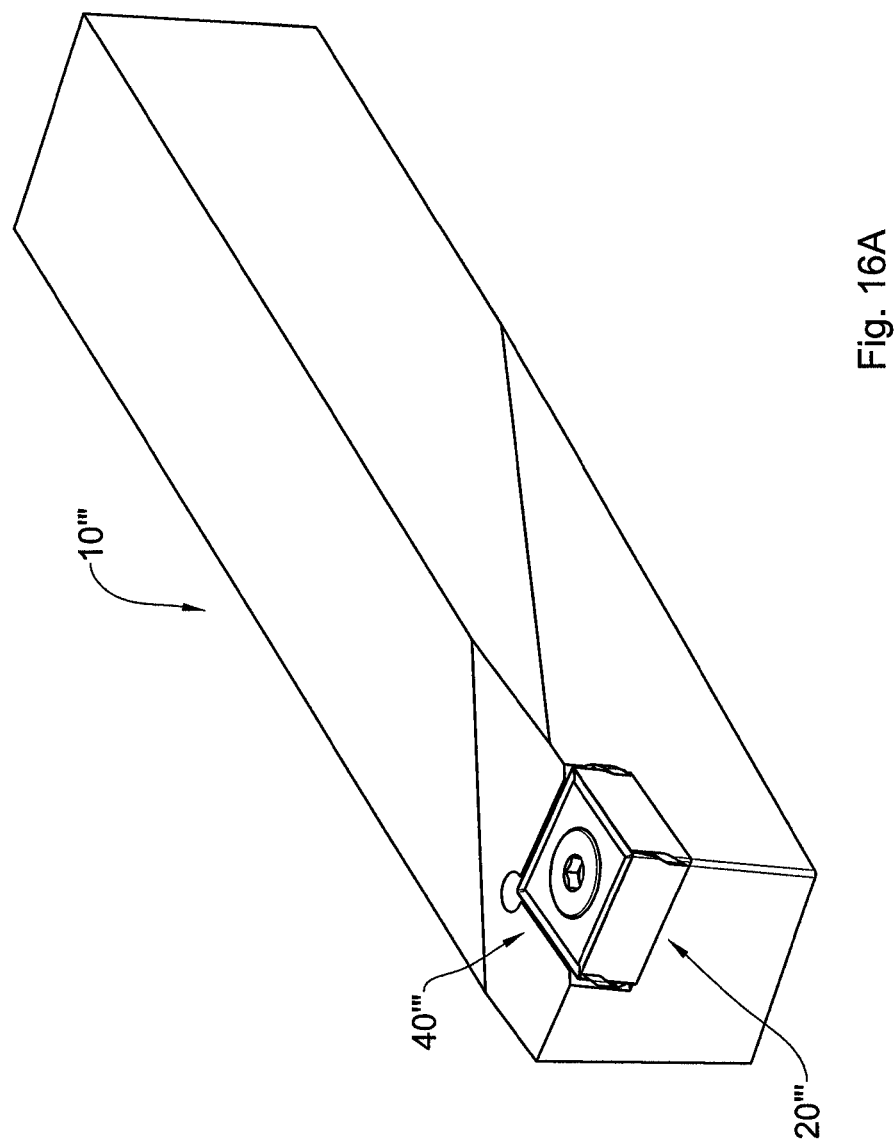
FIG. 16A is a schematic isometric view of a turning tool comprising a turning insert according to another example of the disclosed subject matter.
Figure 16B:
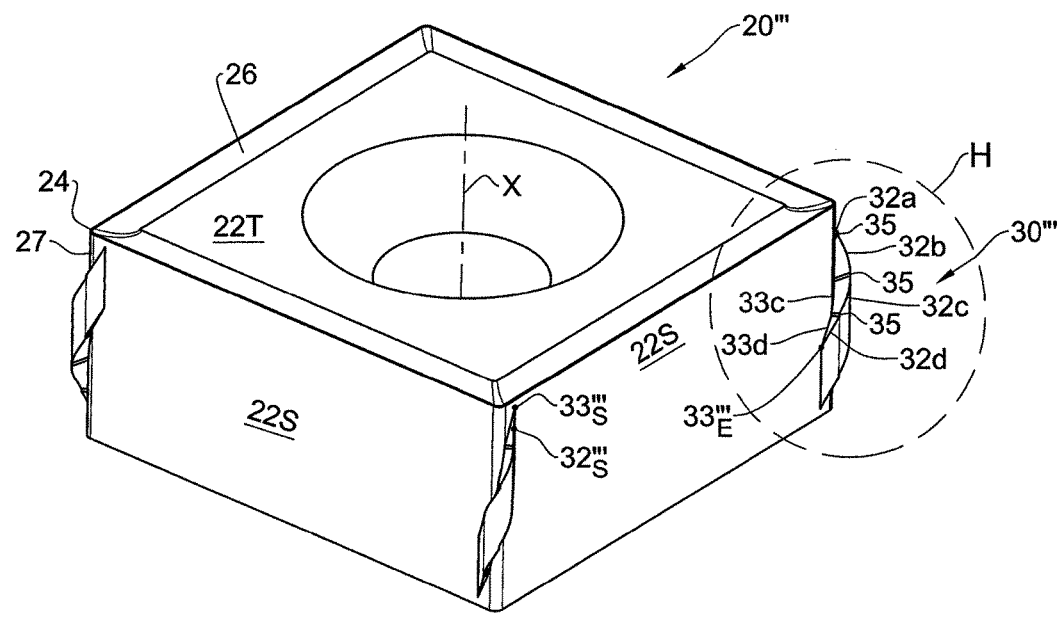
FIG. 16B is a schematic isometric view of the turning insert shown in FIG. 16A.
Figure 16C:
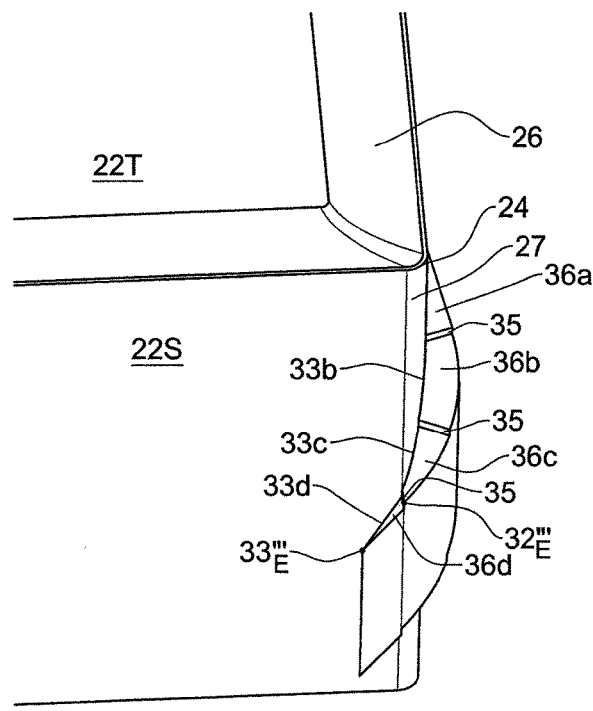
FIG. 16C is a schematic enlarged view of detail H shown in FIG. 16B.
Figure 16D:
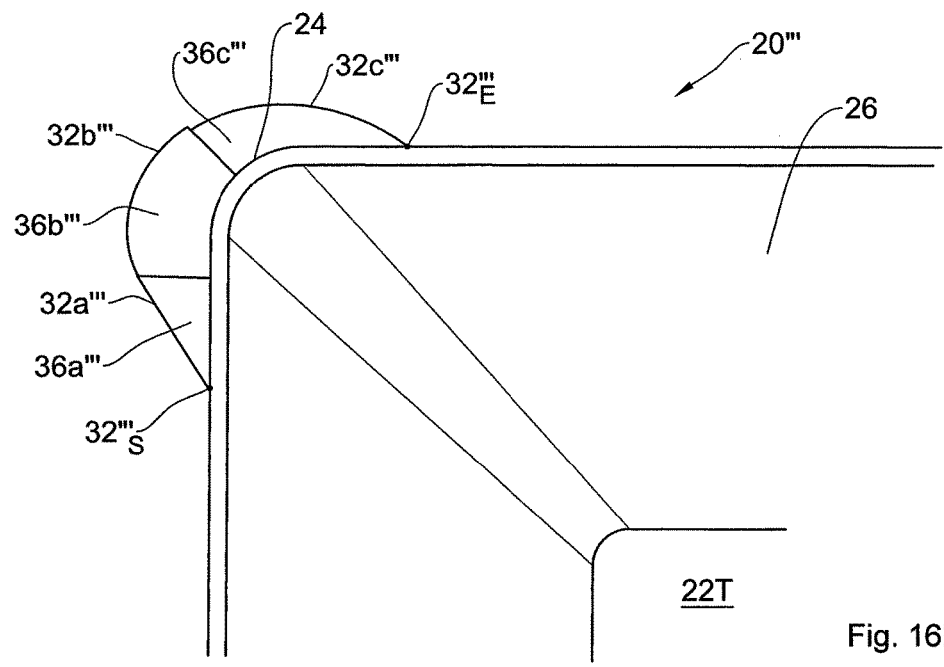
FIG. 16D is a schematic enlarged top view of a portion of the turning insert when mounted onto the turning tool of FIG. 16A.
Figure 16E:
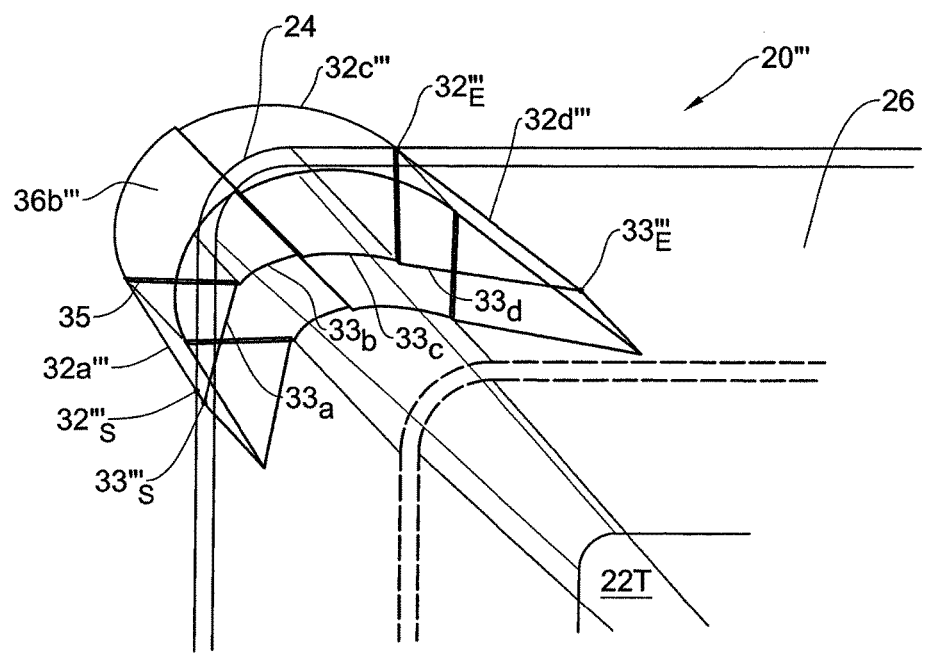
FIG. 16E is a schematic view of FIG. 16D including hidden lines.

In particular, while the top most surface 35 is angled so that the surface 36a overlaps surface 36b in a top view of the cutting insert shown in FIG. 16D, the neighboring surface 35 remains at the same angle (i.e. no overlapping between 36b and 36c) and the following neighboring surface 35 is angled such that there exist no overlap between the surface 36c and 36d.

Therefore, it may be required to grind the tow bottom-most surfaces 35 so as to create and overlap between the surfaces 36b, 36c, 36d, such that 36b overlaps 36c and 36c overlaps 36d. It is appreciated that this cannot be performed during manufacture of the cutting insert in the pressing process.

Turning now to FIGS. 17A to 17H, yet another cutting insert is shown, generally designated as 100. The cutting insert 100 is similar to the previously described cutting inserts, with the difference being that in the working top view of the cutting insert (shown in FIG. 17G), the additional cutting element 130 extends symmetrically about the cutting corner 127 of the cutting insert 120.

The cutting insert 120 is similar to the previously described cutting inserts 20 and so, similar elements have been allocated similar reference numbers with the addition of 100, e.g. cutting edge 24 of cutting insert 20 is similar to cutting edge 124 of cutting insert 120.

The cutting insert 120 is formed, similar to previous described cutting inserts, with a top surface 122T, a bottom surface 122B and side surfaces 122S. In addition, it is formed with a cutting edge 124 disposed along a corner 127 and having a rake surface 126 along the top surface 122T.

Figure 17A:
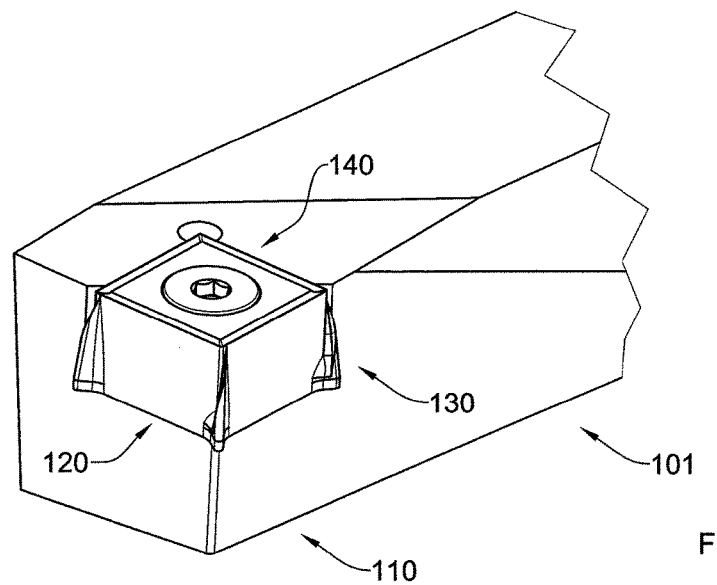
FIGS. 17A and 17B are respective schematic isometric and top views of a turning tool comprising a turning insert according to still another example of the disclosed subject matter.
Figure 17B:
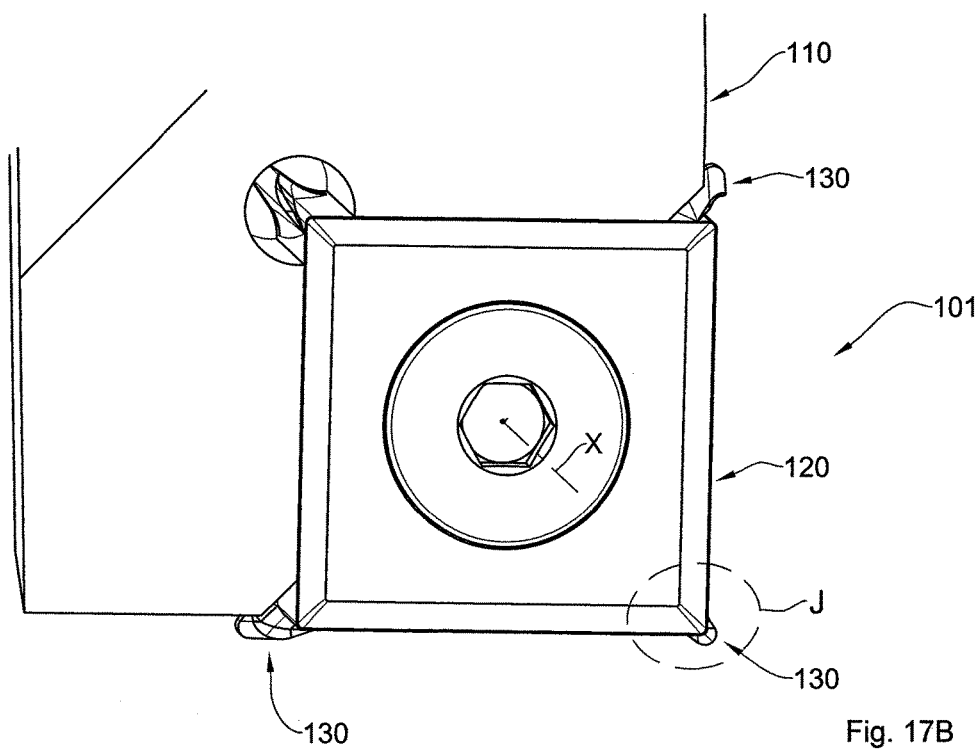
Figure 17C:
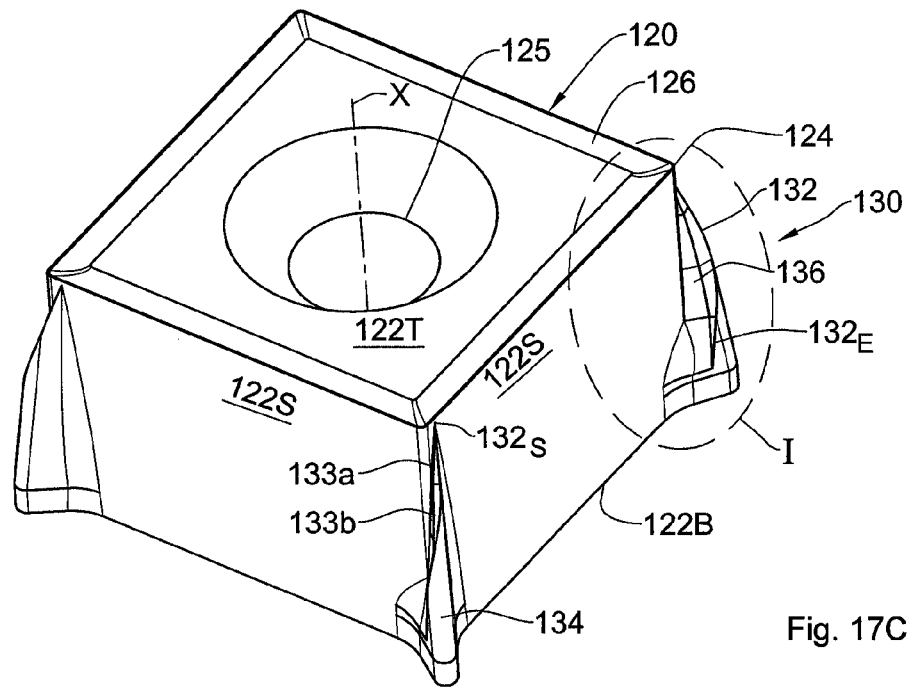
FIG. 17C is a schematic isometric view of the turning insert shown in FIGS. 17A and 17B.
Figure 17D:
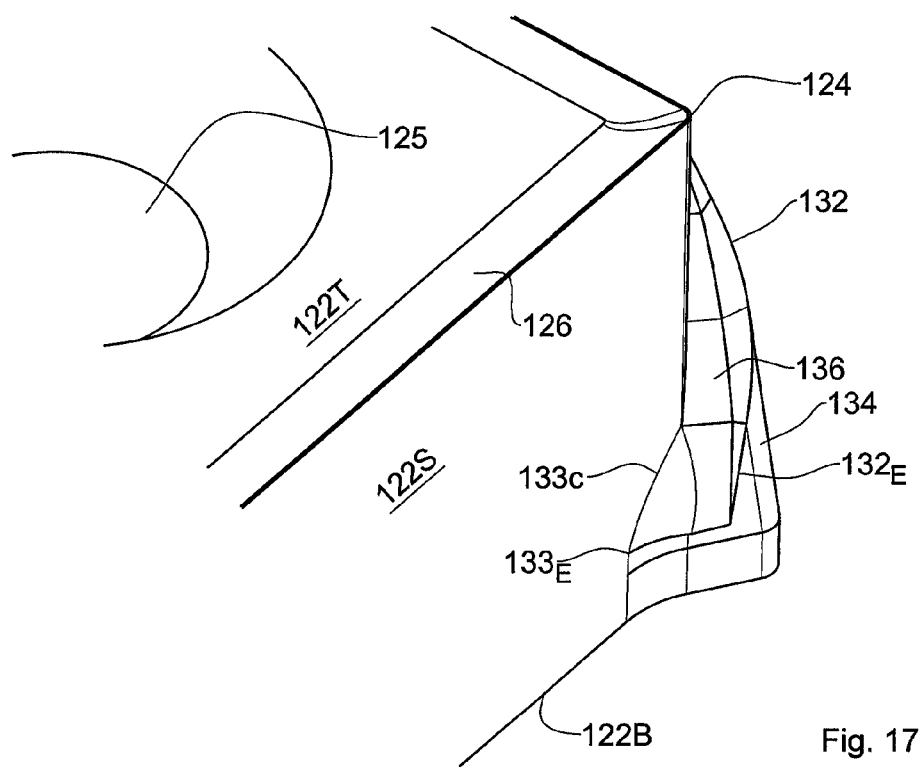
FIG. 17D is a schematic enlarged view of detail I shown in FIG. 17C.
Figure 17E:
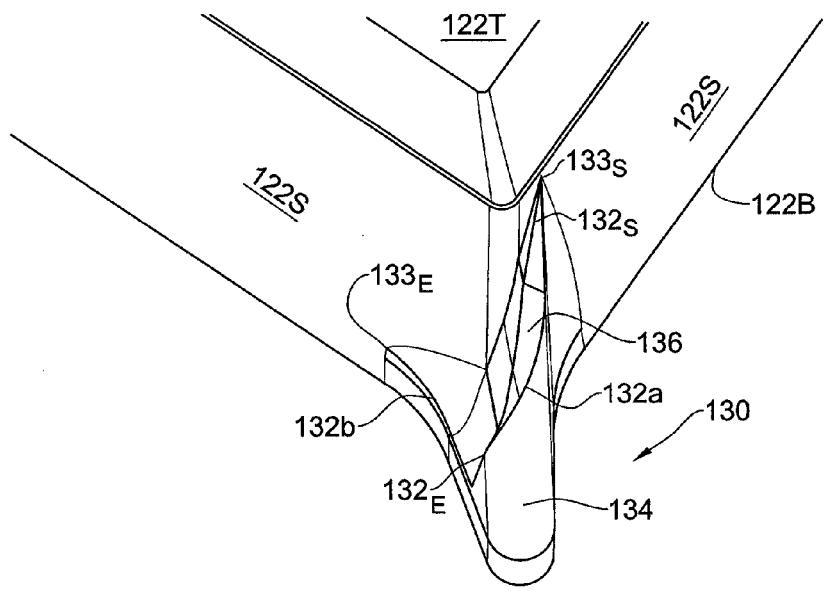
FIG. 17E is a schematic perspective view of detail I shown in FIG. 17D.
Figure 17F:
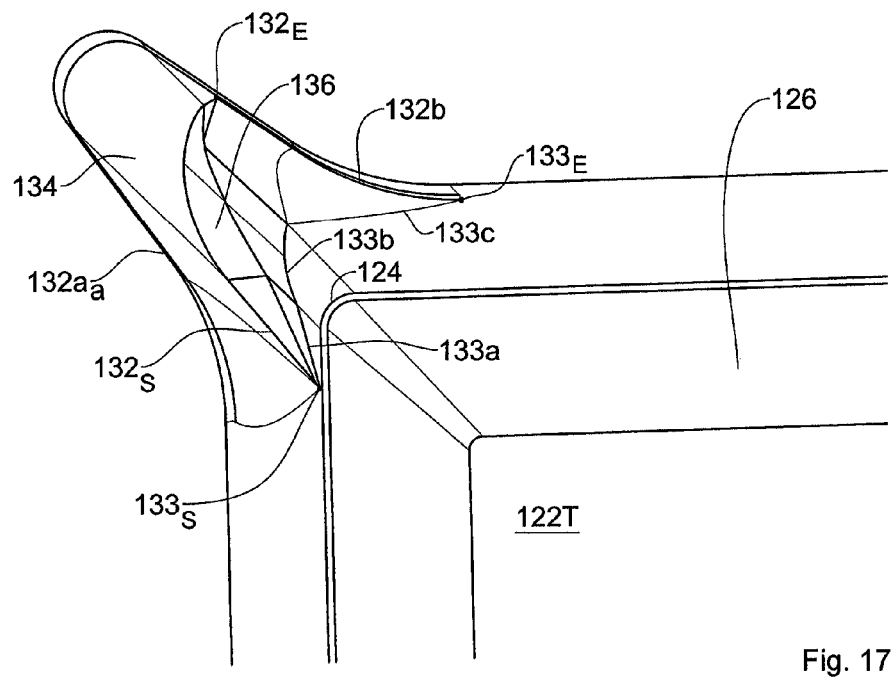
FIG. 17F is a schematic top view of an enlarged portion of the turning insert shown in FIGS. 17D and 17E.
Figure 17G:
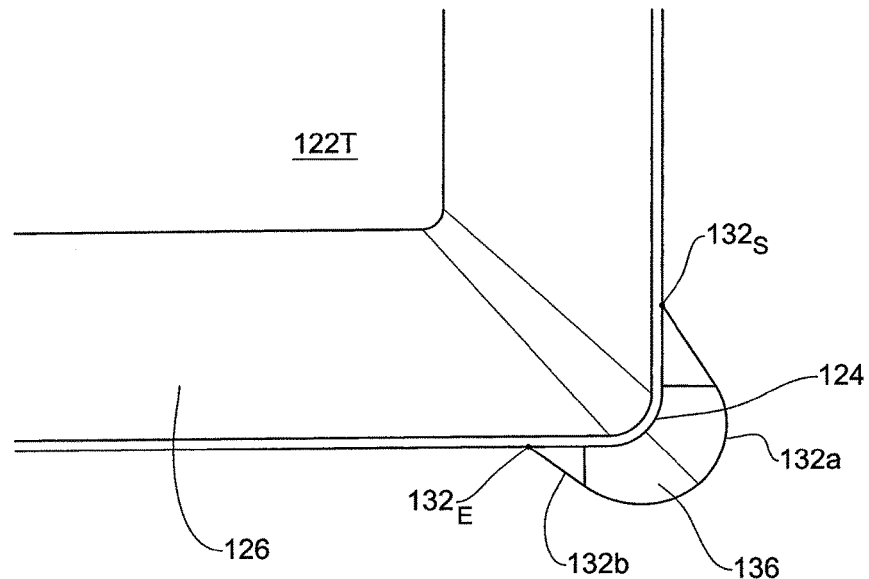
FIG. 17G is a schematic enlarged view of detail J shown in FIG. 17B.
Figure 17H:
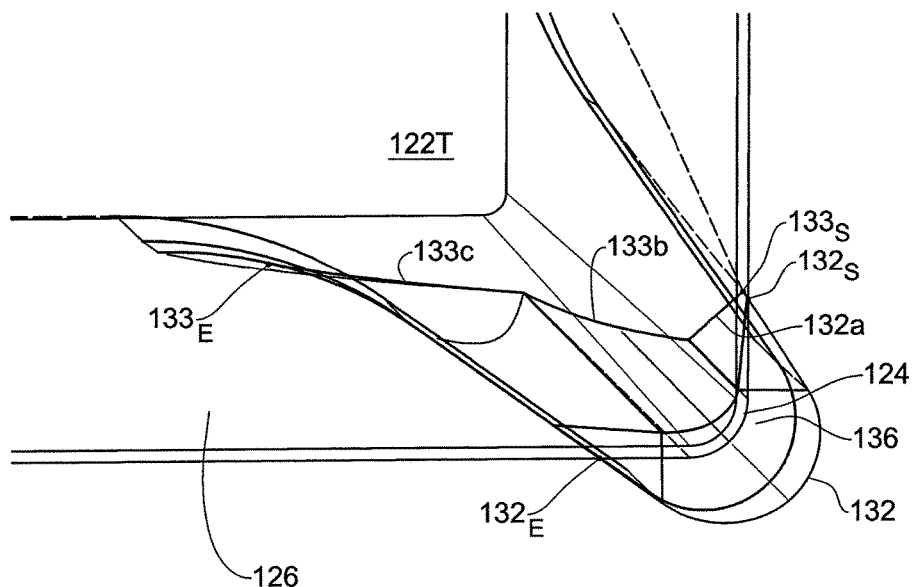
FIG. 17H is a schematic view of FIG. 17G including hidden lines.
Figure 18A:
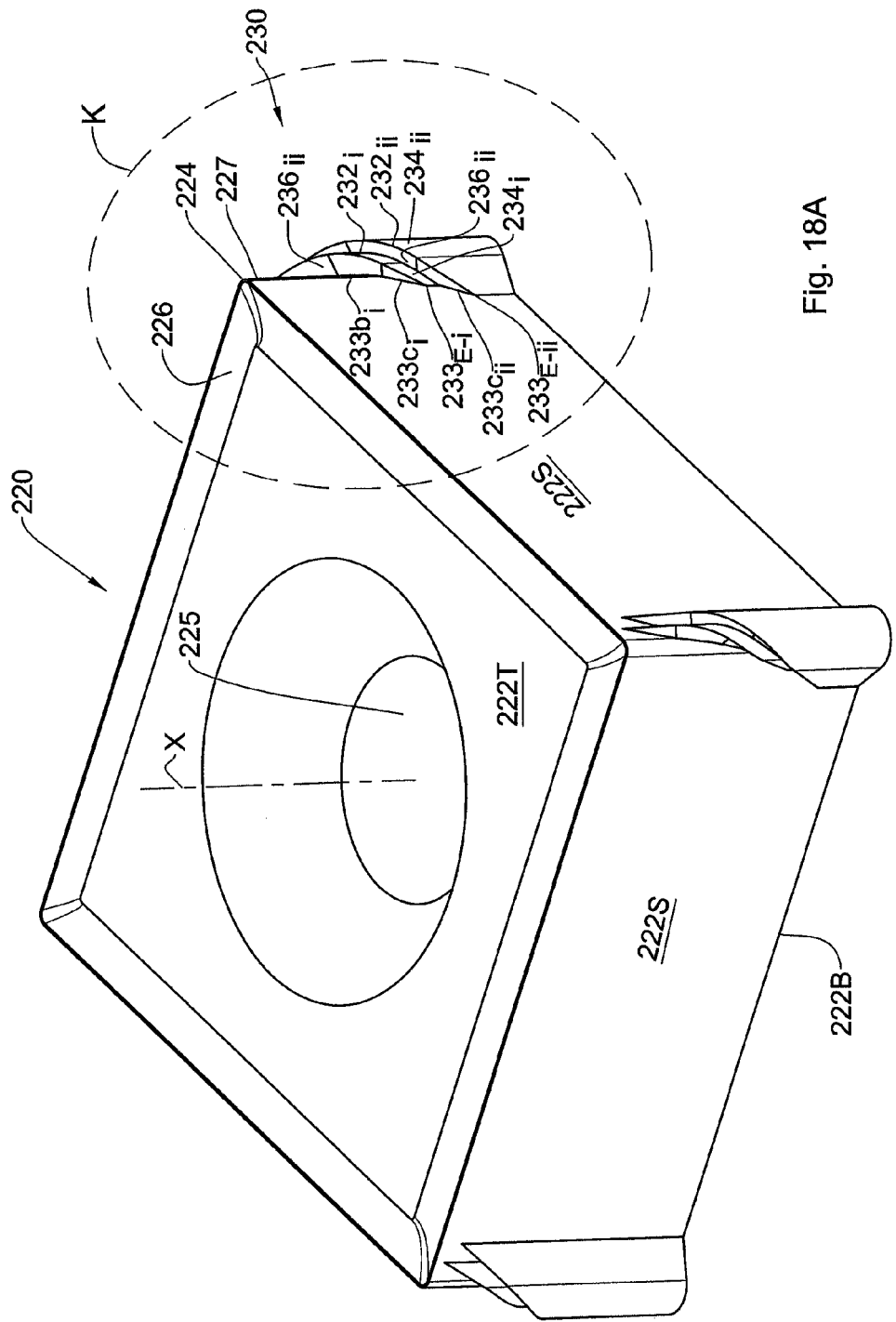
FIG. 18A is a schematic isometric view of a turning insert according to still another example of the disclosed subject matter.
Figure 18B:
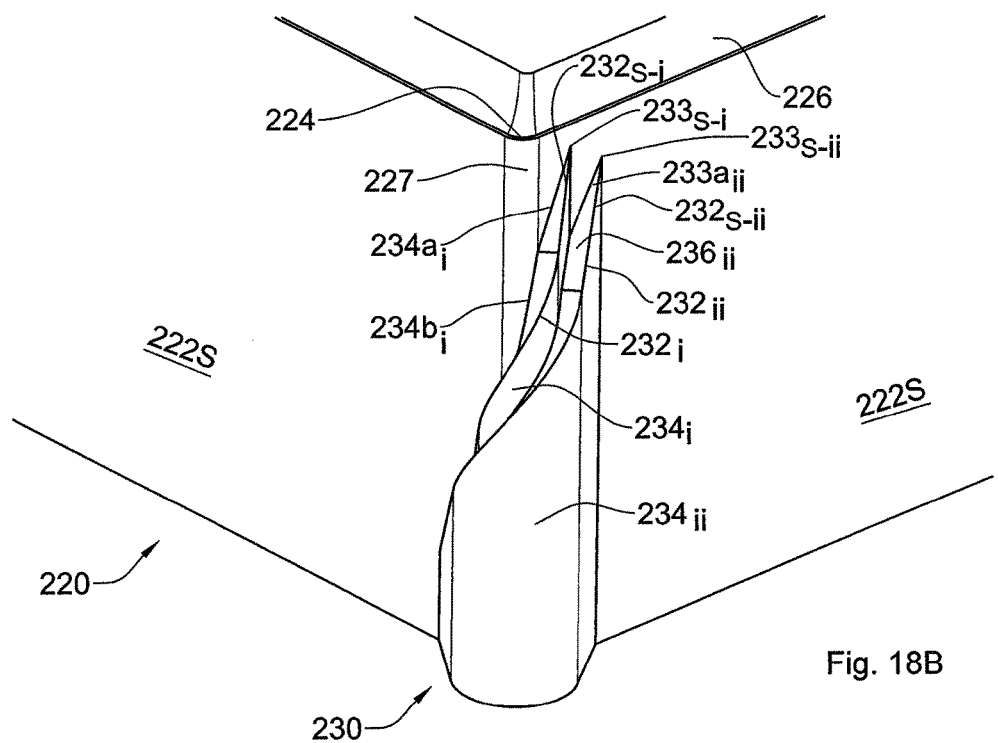
FIG. 18B is a schematic enlarged view of detail K shown in FIG. 18A.
Figure 18C:
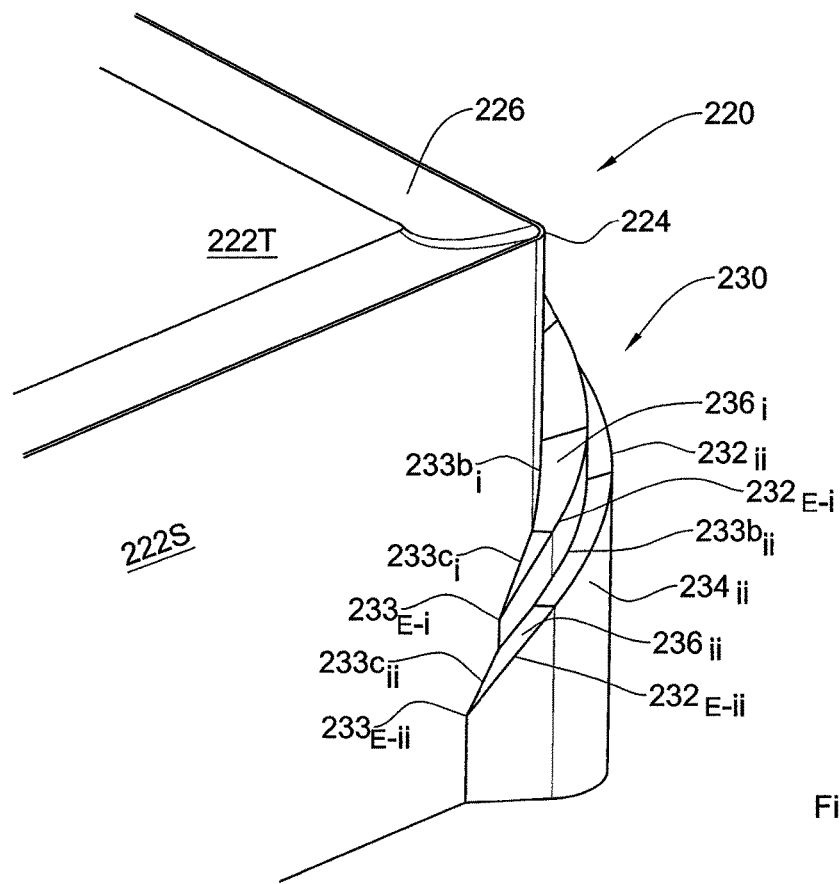
FIG. 18C is a schematic perspective view of detail K shown in FIG. 18B.
Figure 18D:
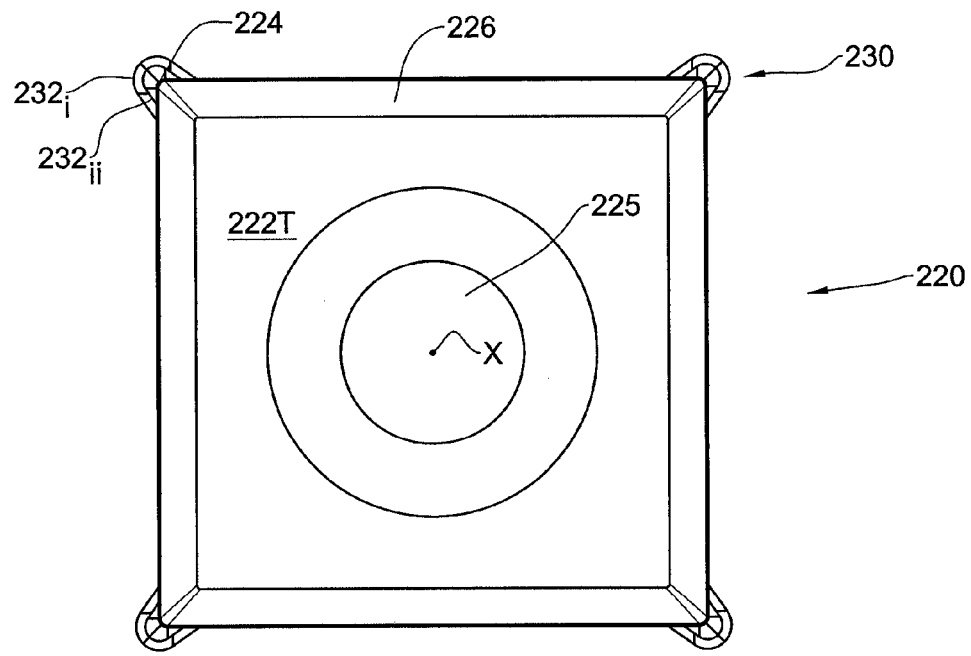
FIG. 18D is a schematic top view of the turning insert shown in FIGS. 18A to 18C.
Figure 18E:
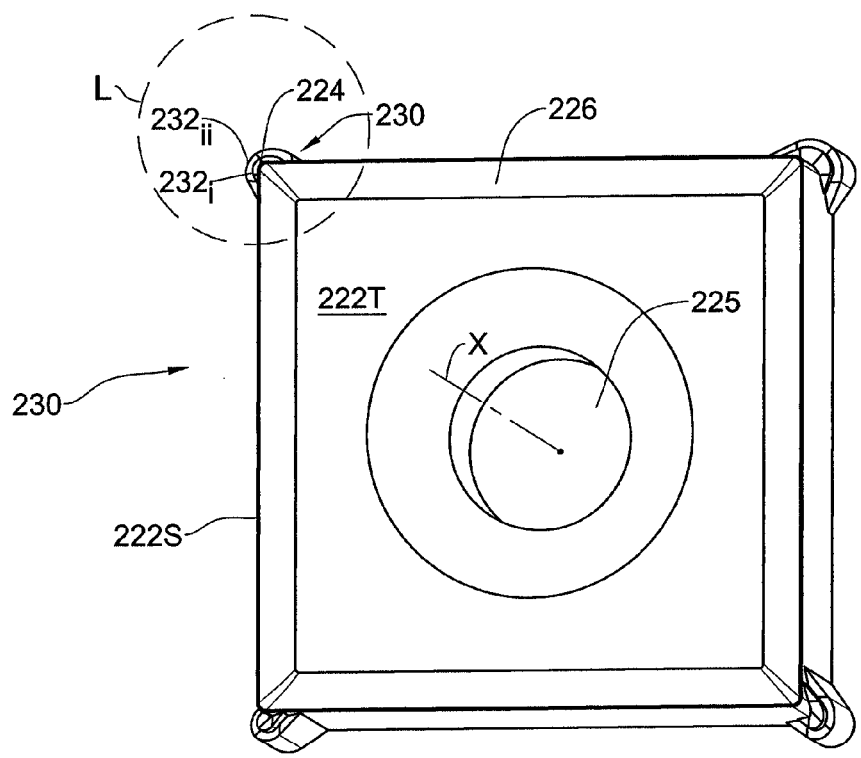
FIG. 18E is a schematic top view of the turning insert shown in FIG. 18D when mounted onto a turning tool (not shown)
Figure 18F:
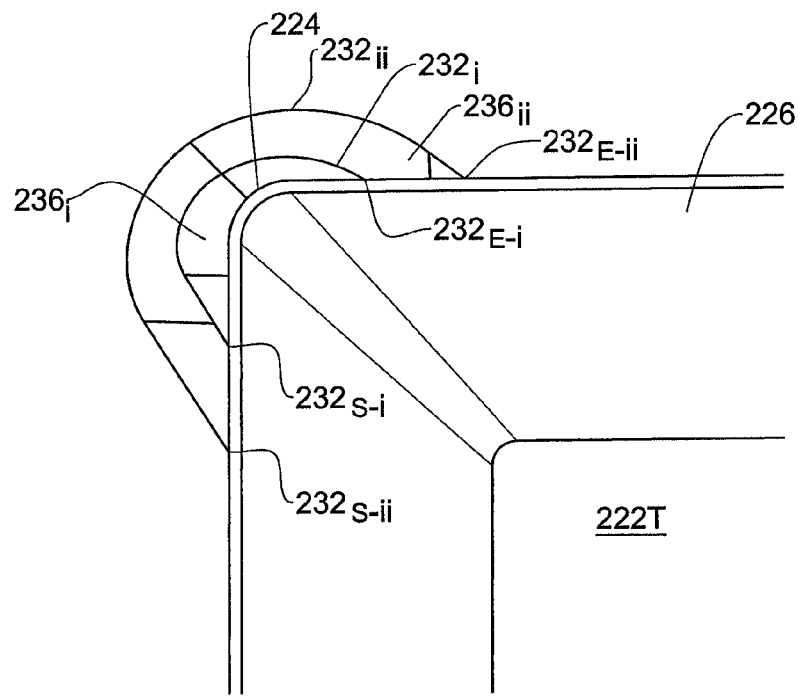
FIG. 18F is a schematic enlarged view of detail L shown in FIG. 18E.
Figure 18G:
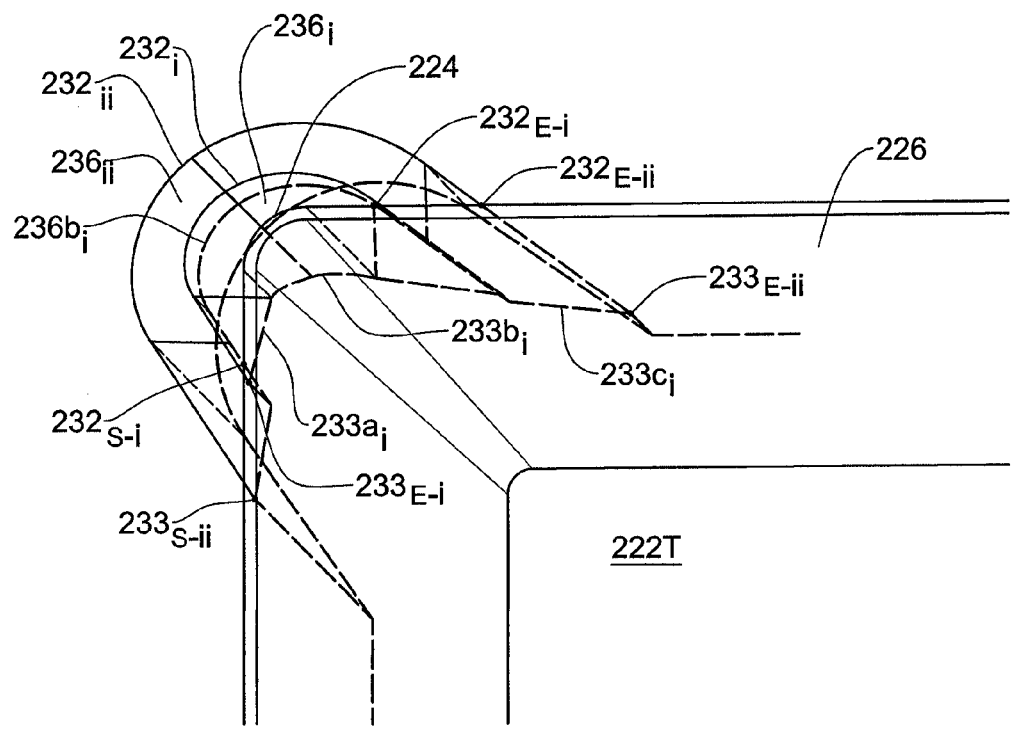
FIG. 18G is a schematic view of detail L shown in FIG. 18F including hidden lines.
Figure 19A:
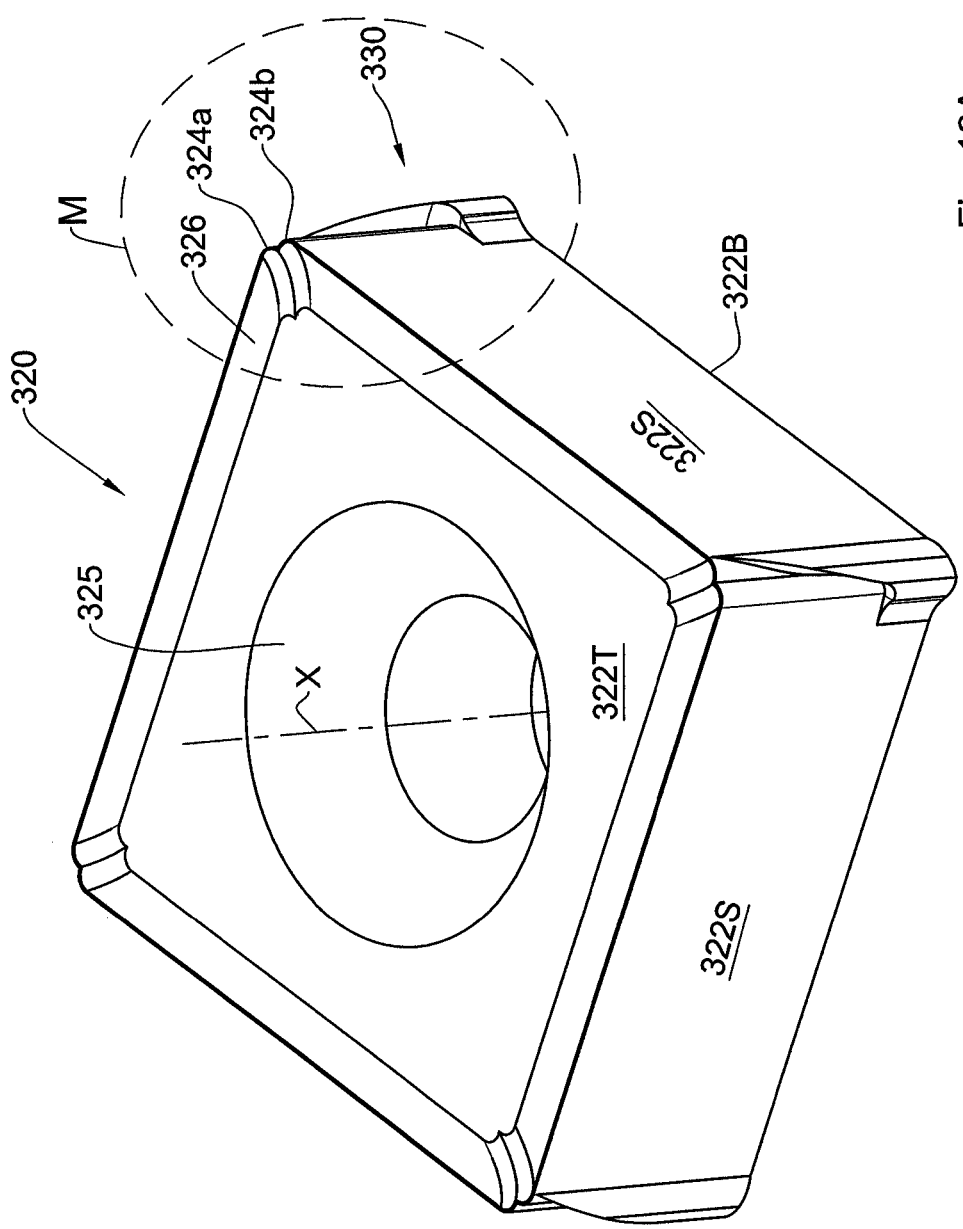
FIG. 19A is a schematic isometric view of a turning insert according to still another example of the disclosed subject matter.
Figure 19B:
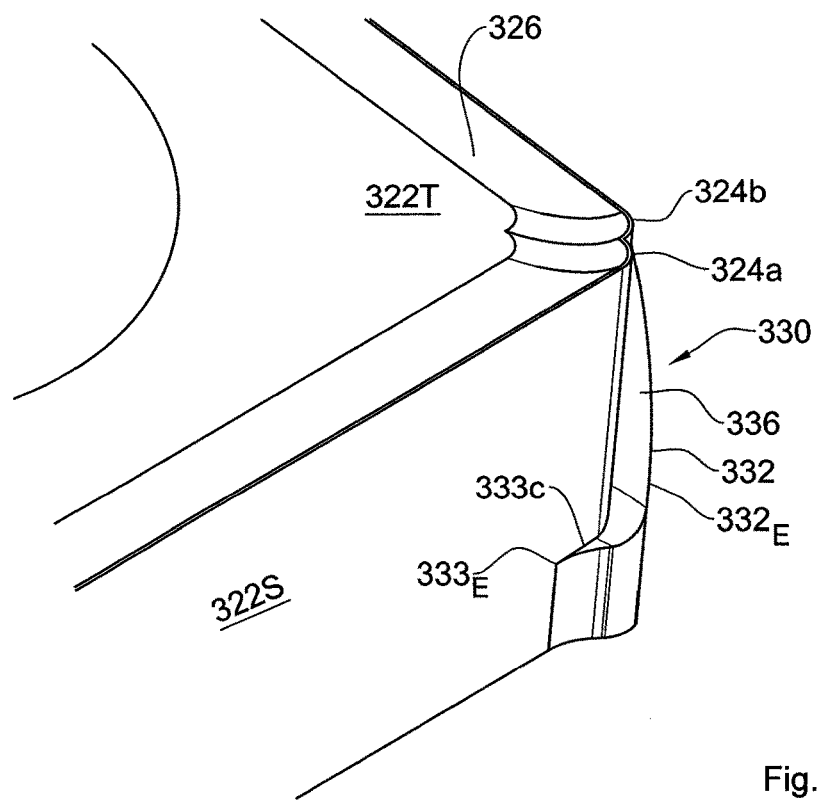
FIG. 19B is a schematic enlarged view of detail M shown in FIG. 19A.
Figure 19C:
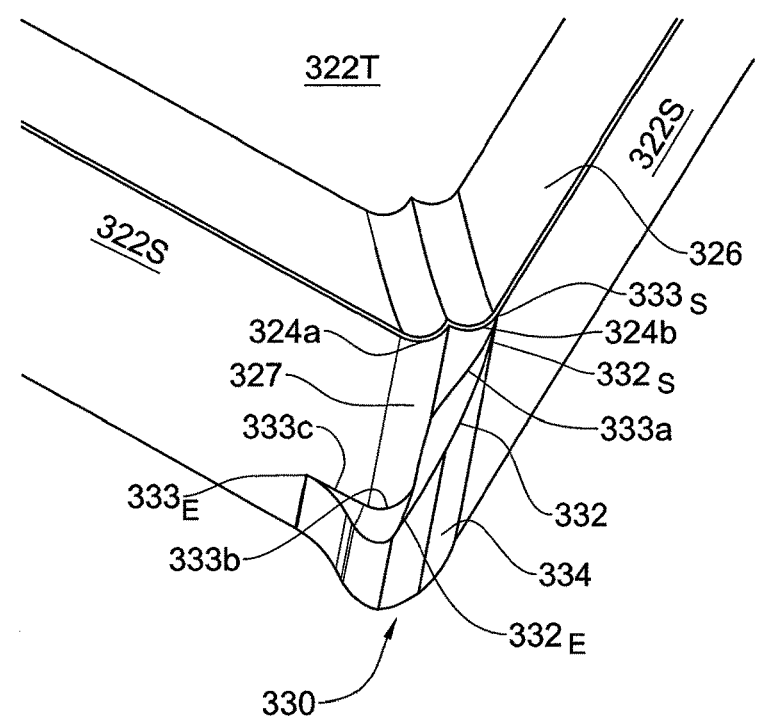
FIG. 19C is a schematic perspective view of detail M shown in FIG. 19B.
Figure 19D:
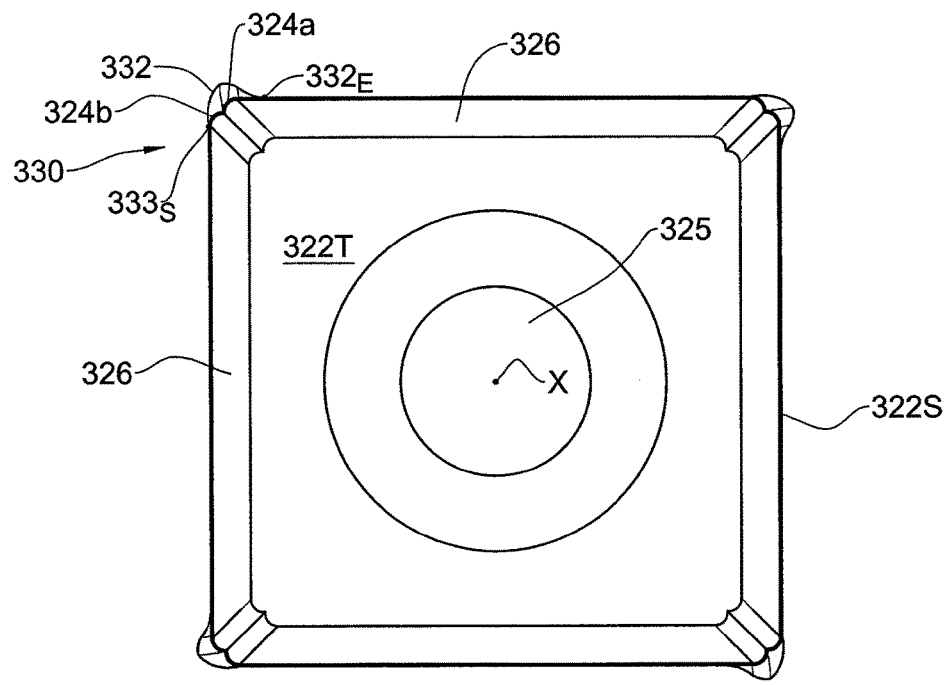
FIG. 19D is a schematic top view of the turning insert shown in FIGS. 19A to 19C.
Figure 19E:
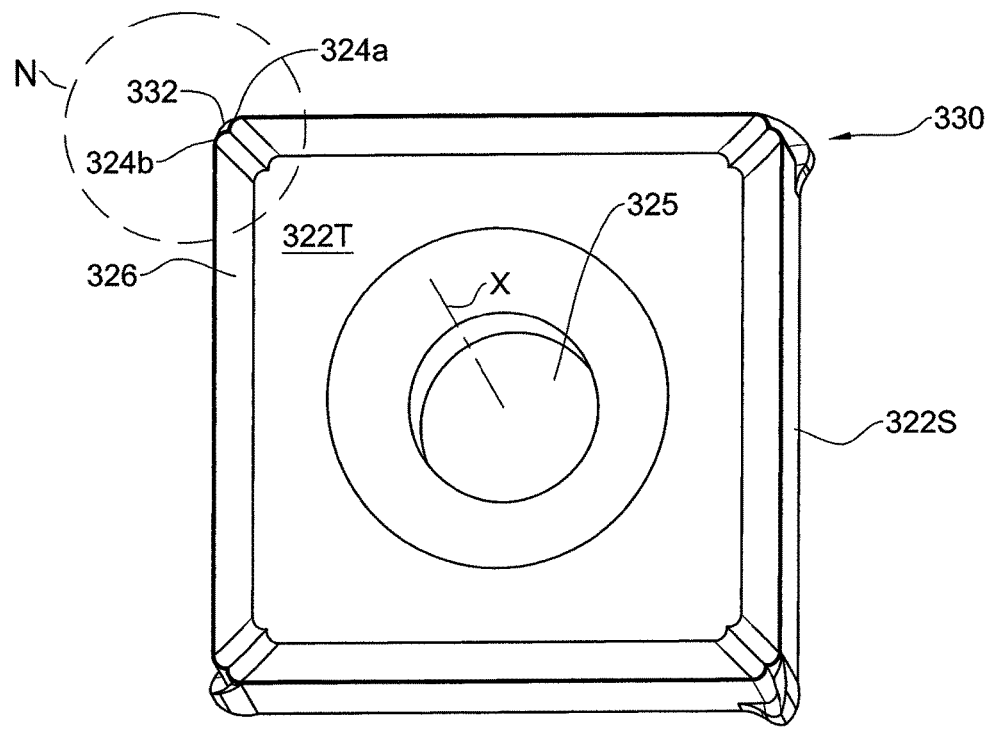
FIG. 19E is a schematic top view of the turning insert shown in FIG. 19D when mounted onto a turning tool (not shown)
Figure 19F:
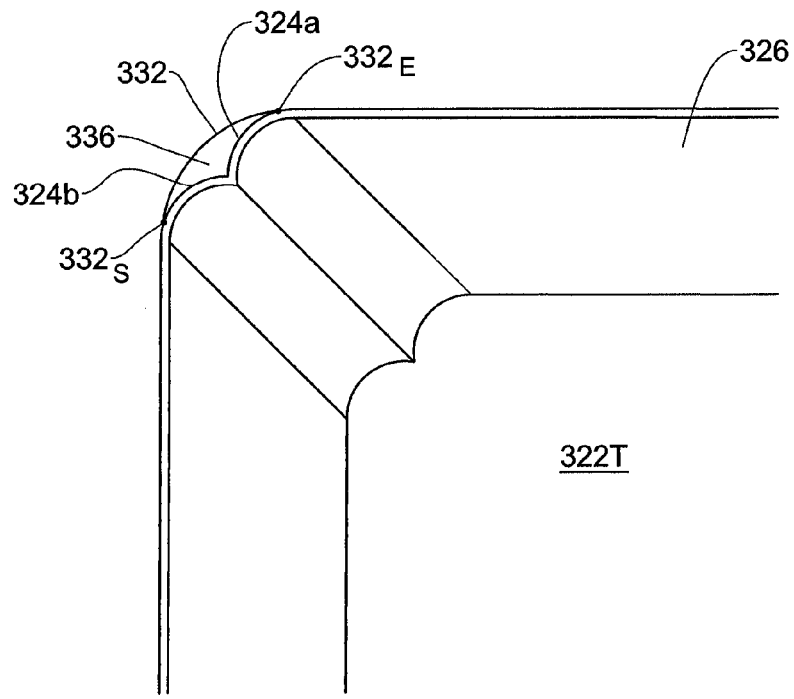
FIG. 19F is a schematic enlarged view of detail N shown in FIG. 19E.
Figure 19G:
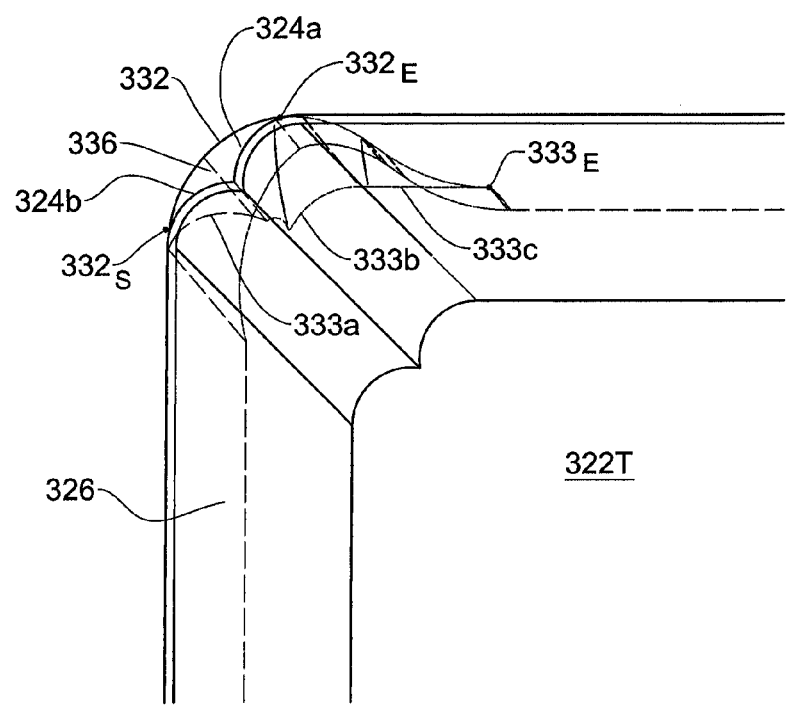
FIG. 19G is a schematic view of detail N shown in FIG. 19F including hidden lines.

In other words, when the cutting insert 120 is mounted onto a cutting tool holder 110 and tilted both forward and sideways to the position shown in FIG. 17G, the extension of the cutting edge 132 is symmetric about the bisector of the angle of the corner 127.

In order to achieve such symmetry in the tilted position of the cutting insert 130, the additional cutting element as seen in FIGS. 17A to 17C, is not symmetric about the corner in its normal top view.

In addition, it is observed that the cutting edge 132 of the cutting insert 120 has a first portion 132a and a second portion 132b, which are angled to one another, i.e. not tangent to one another.

Turning now to FIGS. 18A to 18G, still another cutting insert is shown, generally designated as 220. The cutting insert 220 is similar to the previously described cutting inserts 20, 20', 20" and 120, and so, similar elements have been allocated similar reference numbers with the addition of 200, e.g. cutting edge 24 of cutting insert 20 is similar to cutting edge 224 of cutting insert 220.

The cutting insert 220 comprises two additional cutting elements 230i and 230ii, the cutting element 230ii constituting the additional cutting element of the first cutting element 230i. The cutting element 230ii extends beyond the cutting element 230i, allowing removing even more material from the workpiece.

Thus, each of the additional cutting elements is formed with a respective cutting edge 232i, 232ii, rake surfaces 236i, 236ii and relief surfaces 234i, 234ii. Consequently, each of the cutting edges has a start point $232_{S-i}$, $232_{S-ii}$ and an end point $232_{E-i}$, $232_{E-ii}$.

In the above described example, both the first additional cutting element 230i and the second additional cutting element 230ii extend in a CW direction about the corner 227. However, it is appreciated that a design can be provided in which the second additional cutting element 230*ii* extends in a CCW direction about the first additional cutting element 230*i*.

Attention is now drawn to FIGS. 19A to 19G, in which another example of a cutting insert is shown, generally being designated as 320, which demonstrates a slightly different design of the main cutting edge 324.

The cutting insert 320 is similar to the previously described cutting inserts 20, 20', 20", 120 and 220, and so, similar elements have been allocated similar reference numbers with the addition of 300, e.g. cutting edge 24 of cutting insert 20 is similar to cutting edge 324 of cutting insert 320.

The entire corner 327 of the cutting insert 320 is slightly clefted, so that the main cutting edge 324 comprises two portions. Respectively, the design of the additional cutting element 330 is such that covers for the clefted nature of the main cutting edge 324, completing the cutting corner 327 to a regular, right angled corner.

The cutting insert 320 is indexible but not reversible.

Turning now to FIGS. 20A to 20G, in which still another example of a cutting insert is shown, generally designated as 420. The cutting insert 420 also comprises four main cutting edges 424 and four additional cutting elements 430, but differs from the previous examples by the fact that the start points $432_S$ of the auxiliary cutting edges 432 do not coincide with the start point $433_S$ of the intersection line.

The cutting insert 420 is similar to the previously described cutting inserts 20, 20', 20", 120, 220 and 320, and so, similar elements have been allocated similar reference numbers with the addition of 400, e.g. cutting edge 24 of cutting insert 20 is similar to cutting edge 424 of cutting insert 420.

In particular, the cutting insert 420 comprises four side walls 422S, each having a first portion 422Sa and 422Sb, parallel to one another, with the first portion 422Sa being more remote from the central axis X than the second portion 422Sb.

Thus, it is observed that the corner 427 is formed by curving of the second side portion 422Sb, while the curving of the first side portion 422Sa serves as the additional cutting element 430.

Figure 20A:
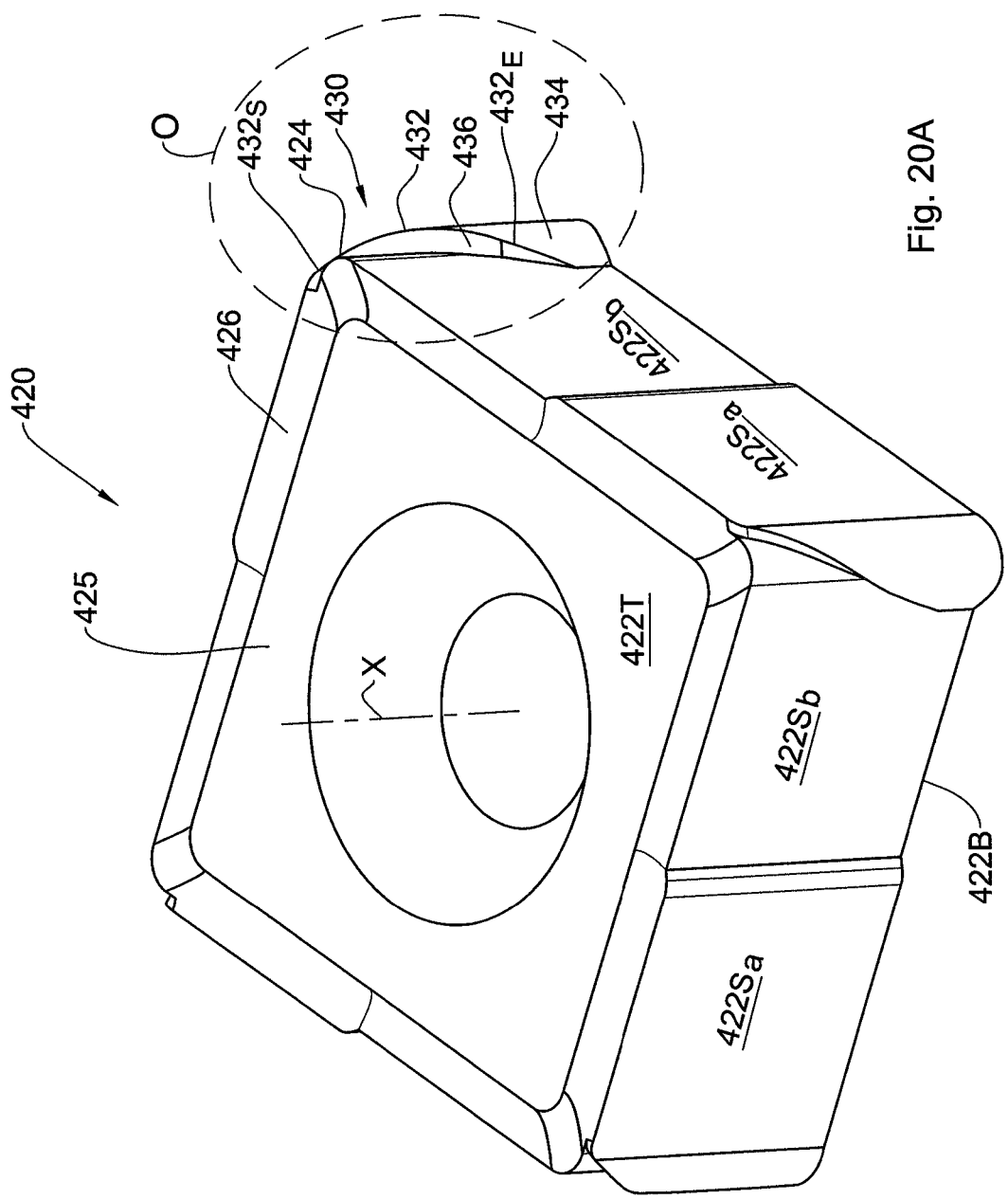
FIG. 20A is a schematic isometric view of a turning insert according to still another example of the disclosed subject matter.
Figure 20B:
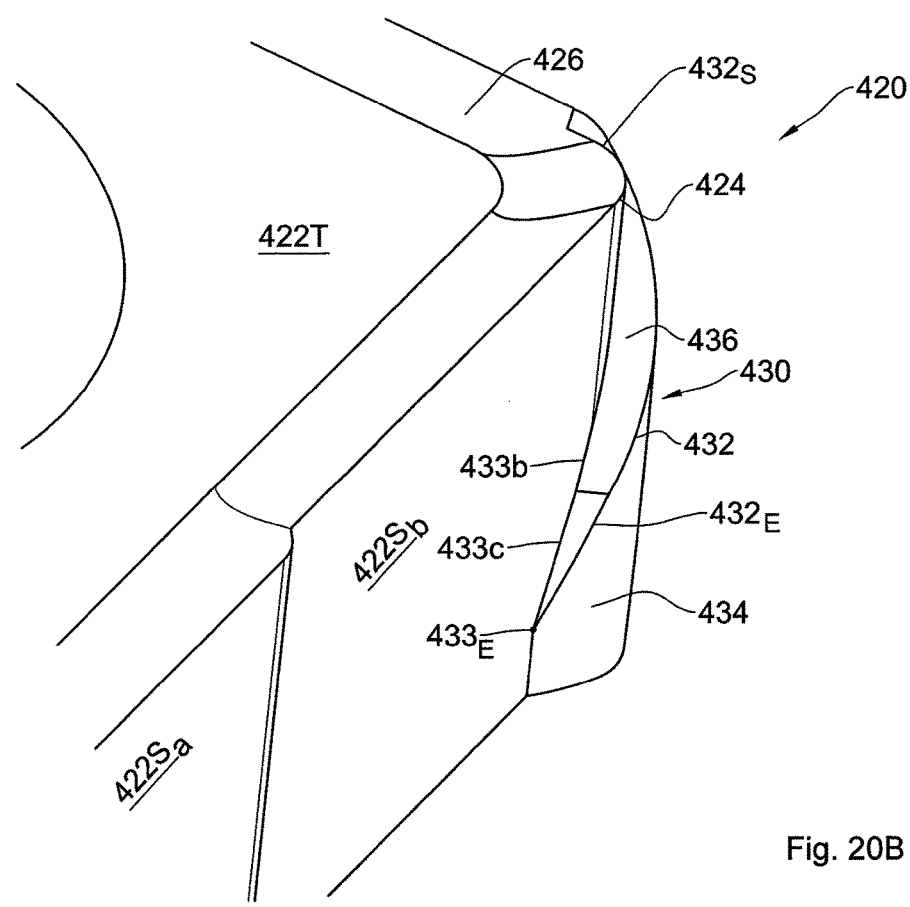
FIG. 20B is a schematic enlarged view of detail O shown in FIG. 20A.
Figure 20C:
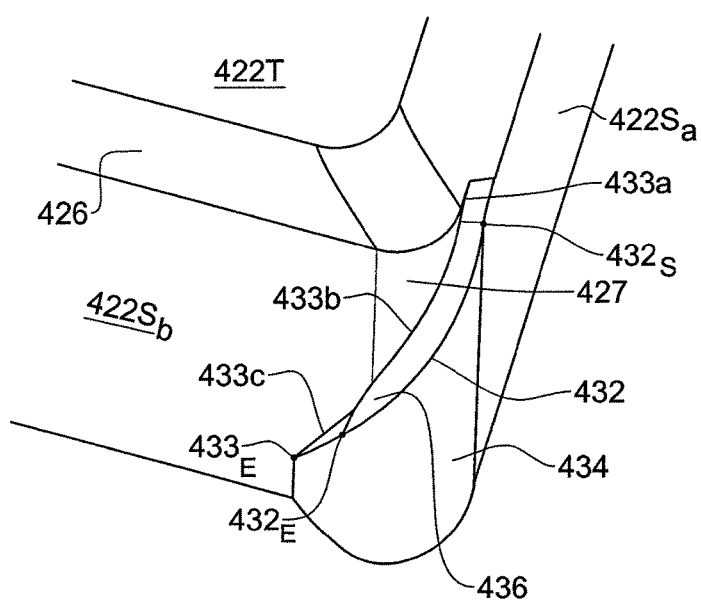
FIG. 20C is a schematic perspective view of detail O shown in FIG. 20B.
Figure 20D:
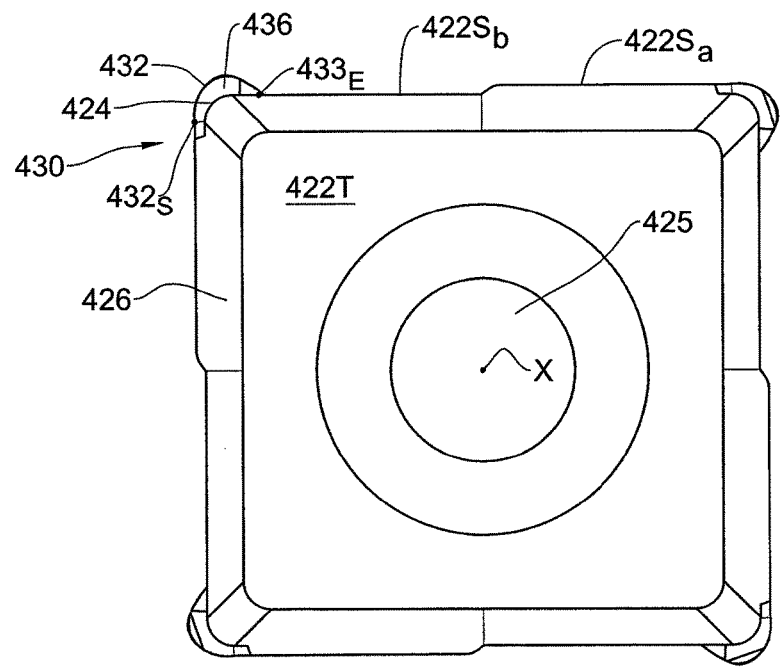
FIG. 20D is a schematic top view of the turning insert shown in FIGS. 20A to 20C.
Figure 20E:
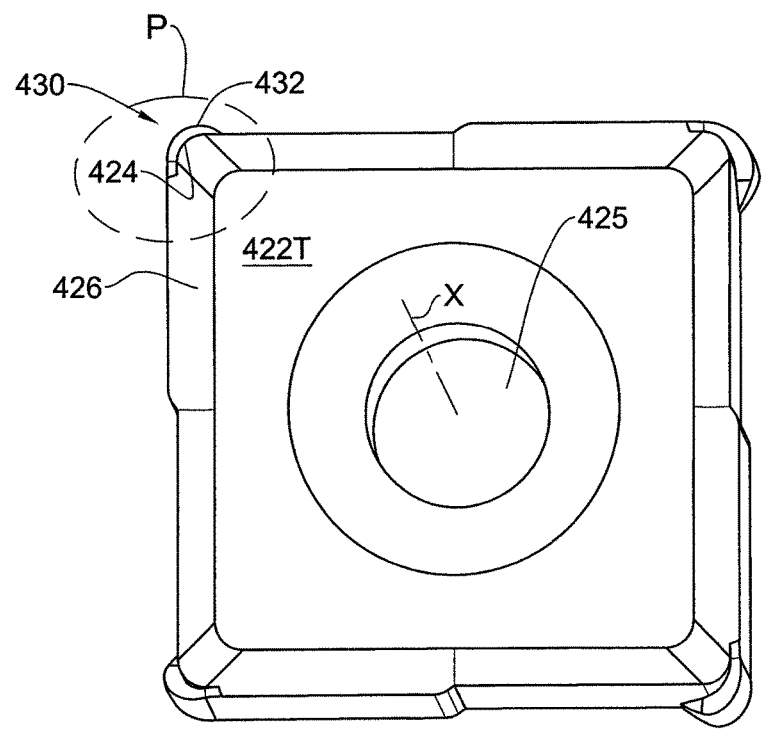
FIG. 20E is a schematic top view of the turning insert shown in FIG. 20D when mounted onto a turning tool (not shown)
Figure 20F:
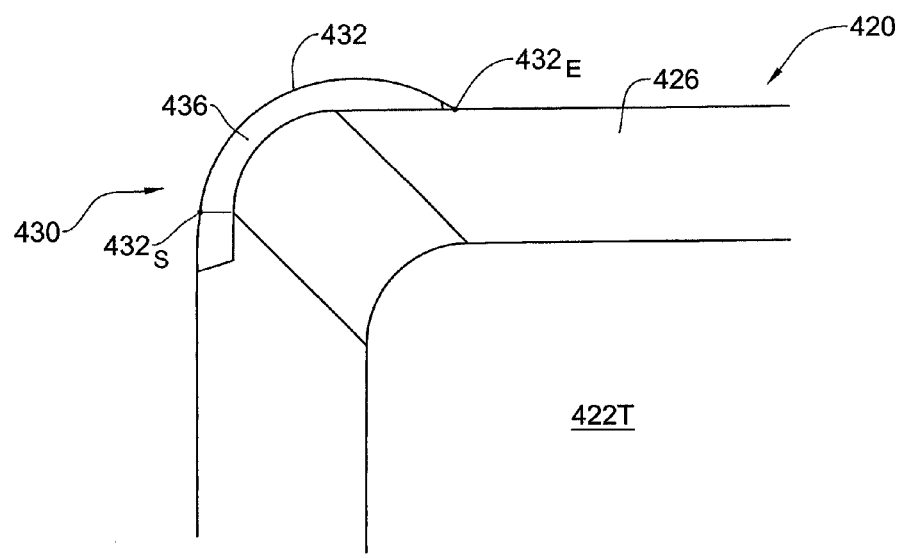
FIG. 20F is a schematic enlarged view of detail P shown in FIG. 20E.
Figure 20G:
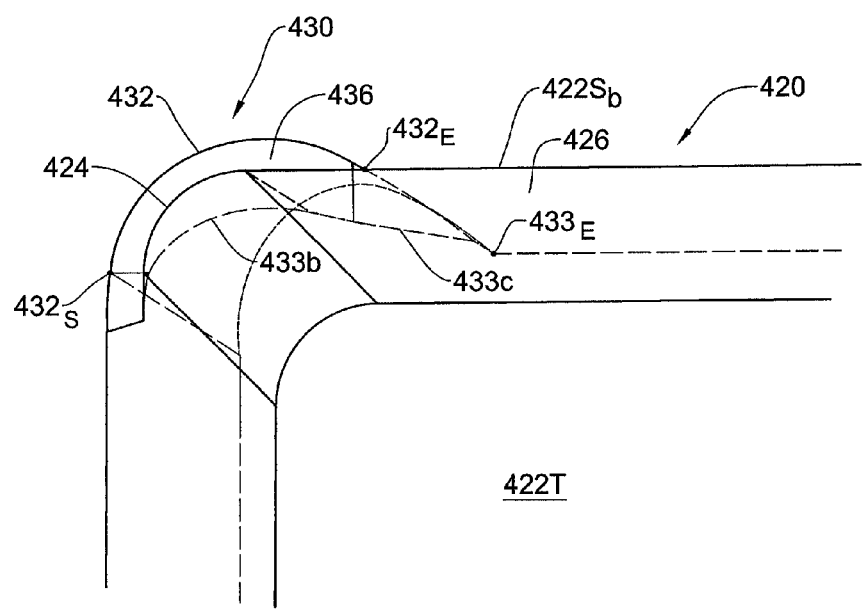
FIG. 20G is a schematic view of detail P shown in FIG. 20F including hidden lines.

With particular reference being drawn to FIG. 20E, when the cutting insert 420 is mounted onto a cutting tool, the cutting edge 432 of the additional cutting element 430 is tangent to the intersection line between the top surface 422T and the side surface 422Sa.

Turning now to FIGS. 21A to 21H, still another example of a cutting insert is shown, generally designated as 520, and shown mounted onto a cutting tool holder 510 to form a turning tool 501. The cutting insert 520 is used as a tangential cutting insert 520.

The cutting insert 520 is similar to the previously described cutting inserts 20, 20', 20", 120, 220, 320 and 420, and so, similar elements have been allocated similar reference numbers with the addition of 500, e.g. cutting edge 24 of cutting insert 20 is similar to cutting edge 524 of cutting insert 520.

The cutting tool holder 510 is formed with two insert seats, each being configured for receiving the cutting insert in a different orientation.

As opposite to all previously described cutting inserts, the cutting insert 520 comprises a a first narrow side surface 522Sa and second, wide side surface 522Sb which is formed with a bore 525 (as opposed to previous cutting inserts in which the bore was formed in the top surface).

Another difference between the cutting insert of the present example and previously described cutting inserts, is that the addition elements 530 face in different directions, i.e. alternating between CW direction and CCW direction. This gives rise to a unique configuration in which, along the first side surface 522Sa, the cutting edges 532 converge towards one another.

Figure 21A:
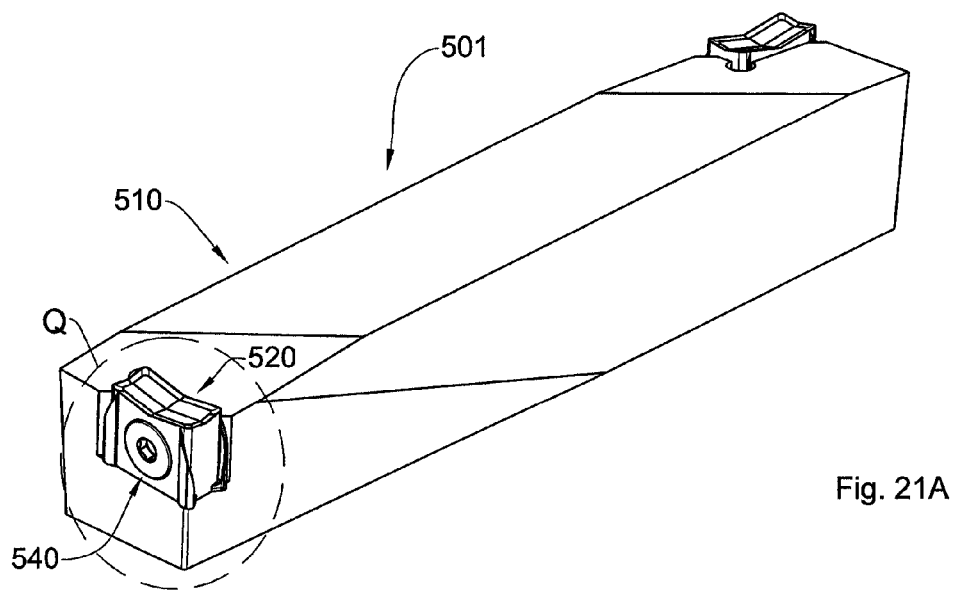
FIG. 21A is a schematic isometric view of a turning tool comprising two turning inserts according to yet another example of the disclosed subject matter, one mounted for being used as a front turning inserts and the other mounted for being used as a side turning insert.
Figure 21B:
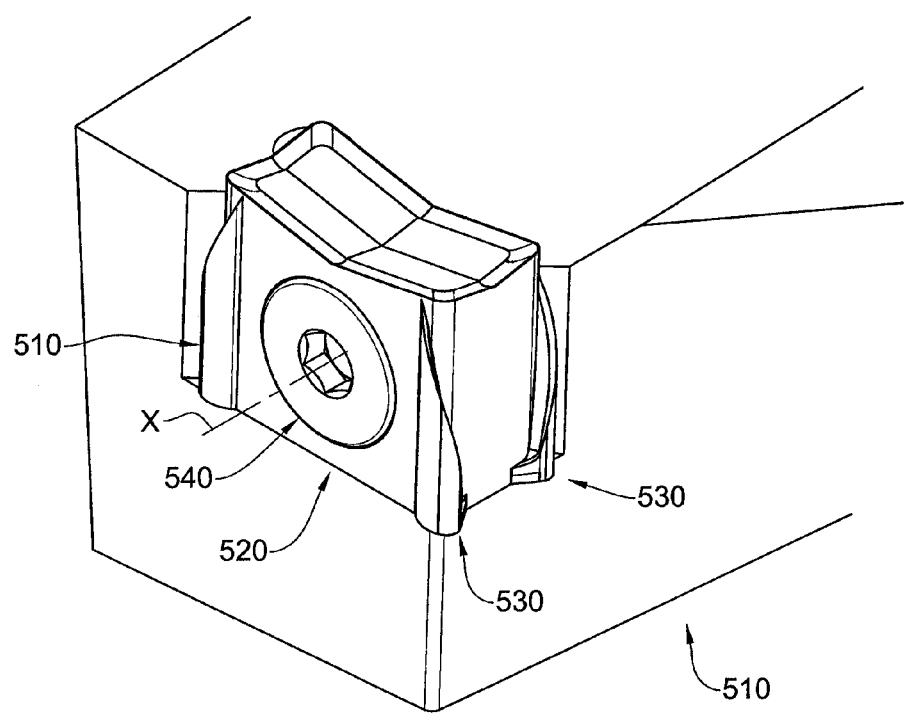
FIG. 21B is a schematic enlarged view of detail Q shown in FIG. 21A.
Figure 21C:
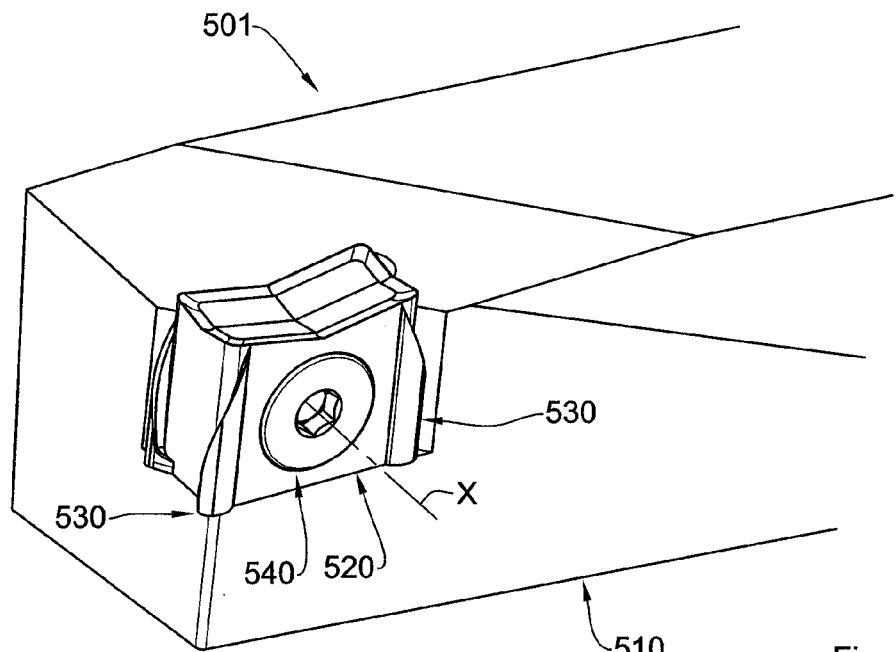
FIG. 21C is a schematic isometric view of a turning insert mounted onto the turning tool for being used as a front turning insert.
Figure 21D:
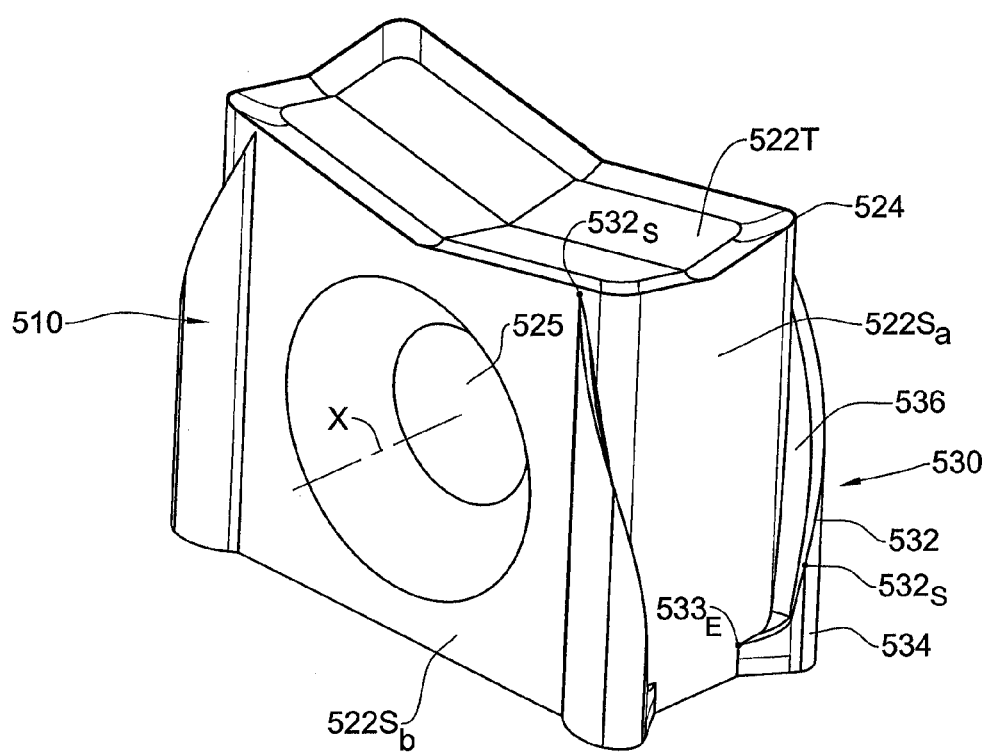
FIG. 21D is a schematic isometric view of the turning insert shown in FIGS. 21A to 21C.
Figure 21E:
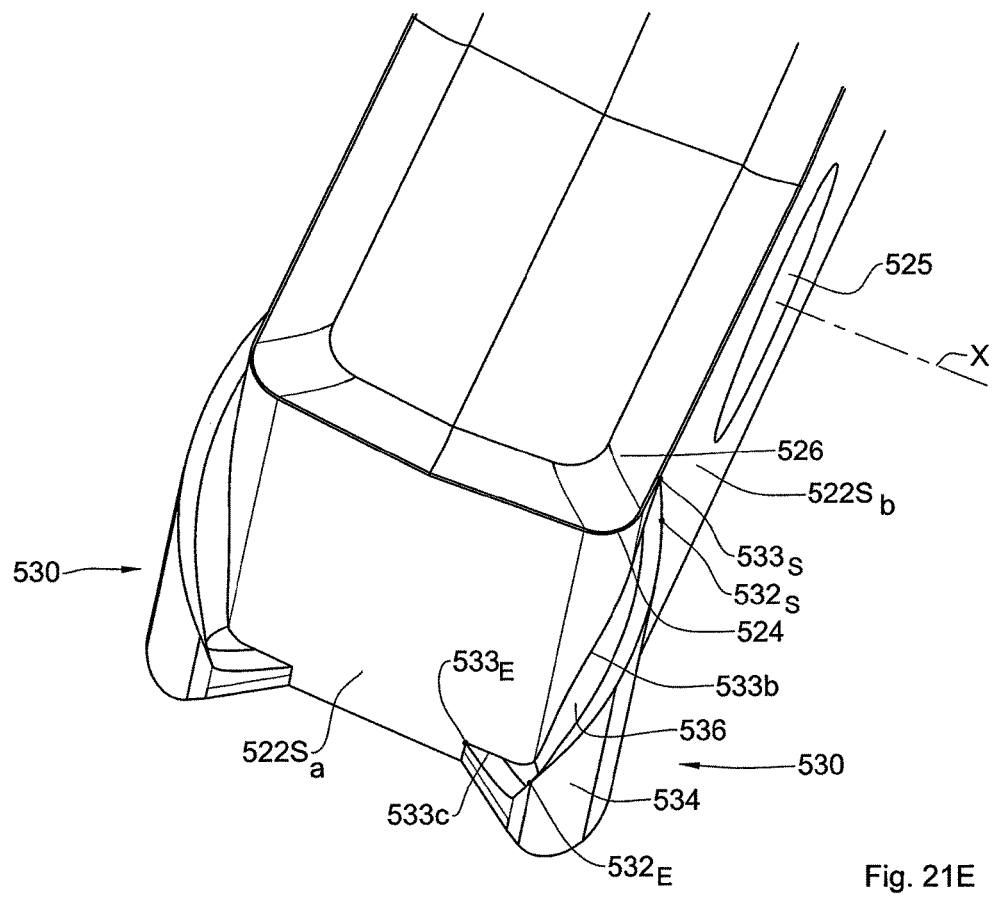
FIG. 21E is a schematic top perspective view of a portion of the turning insert shown in FIG. 21D.
Figure 21F:
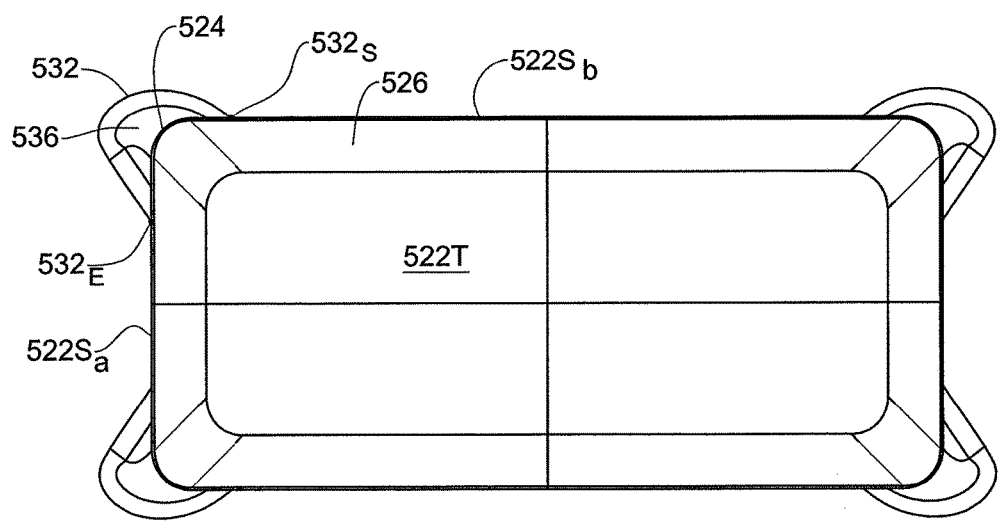
FIG. 21F is a schematic top view of the turning insert shown in FIGS. 21A to 21E.
Figure 21G:
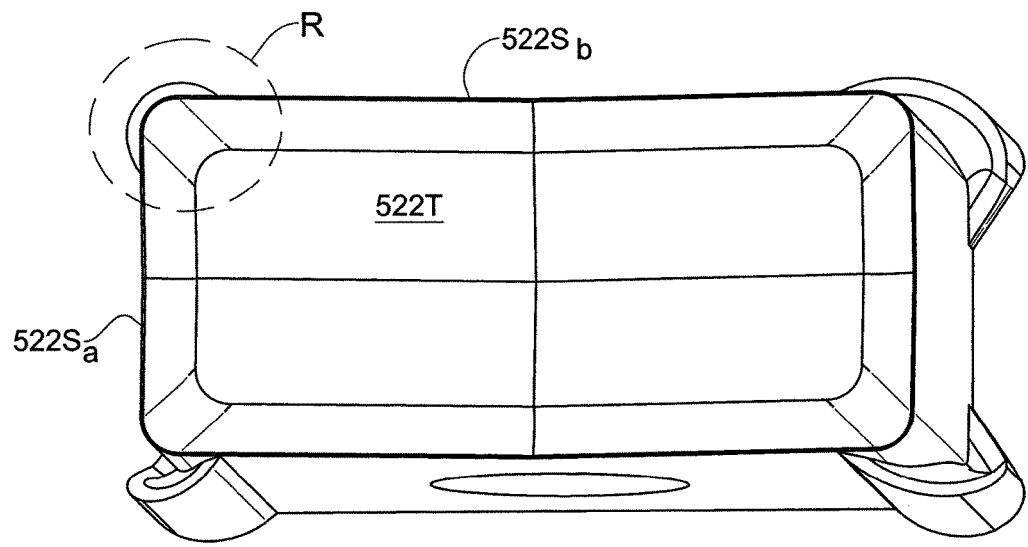
FIG. 21G is a schematic top view of the turning insert shown in FIGS. 21A to 21F when mounted onto the turning tool.
Figure 21H:
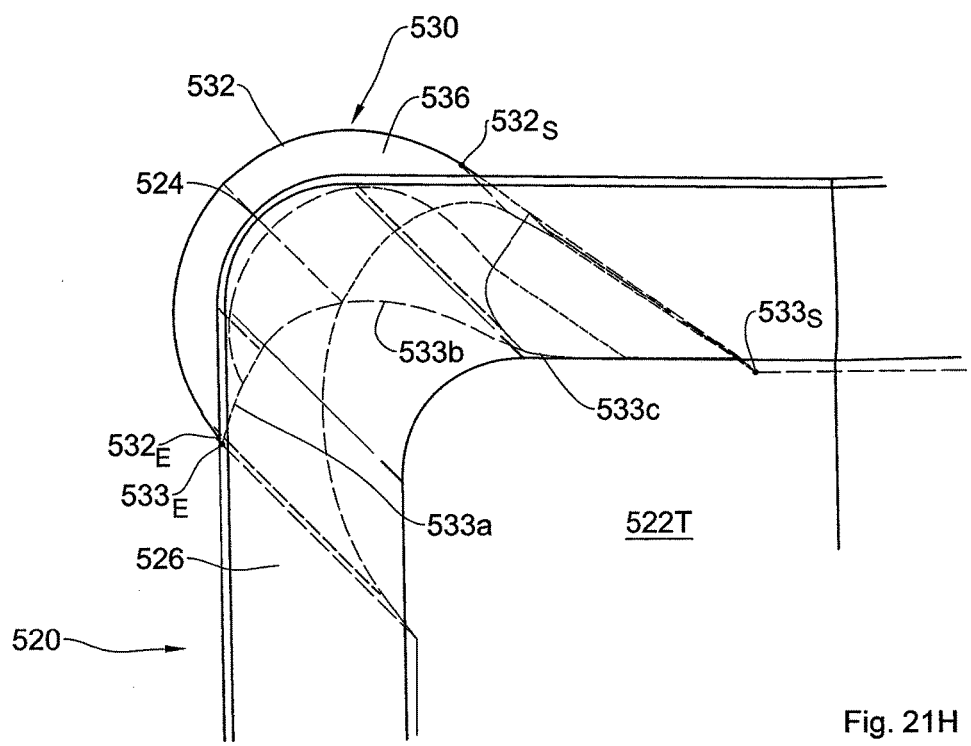
FIG. 21H is a schematic enlarged view of detail R shown in FIG. 21G, including hidden lines.

In addition, observing FIGS. 21F and 21H, when the cutting insert 530 is mounted onto the cutting tool holder 510, the cutting edge of the additional cutting element 530 extends almost symmetrically about the corner 527 of the cutting insert 520.

Attentions is now drawn to FIGS. 22A to 22G, in which another example of a cutting insert is shown, generally designated as 620, and having a cutting corner 627 which is not right angled, but rather of an acute angle, approx. 35 deg.

The cutting insert 620 is similar to the previously described cutting inserts 20, 20', 20", 120, 220, 320, 420 and 520, and so, similar elements have been allocated similar reference numbers with the addition of 600, e.g. cutting edge 24 of cutting insert 20 is similar to cutting edge 624 of cutting insert 620.

Thus, the cutting insert 620 has only two main cutting edges 624 at the acute corners (the other corners are not cutting corners), and two additional cutting elements 630.

The cutting insert 620 is indexible (too cutting corners) but not reversible.

Figure 22A:
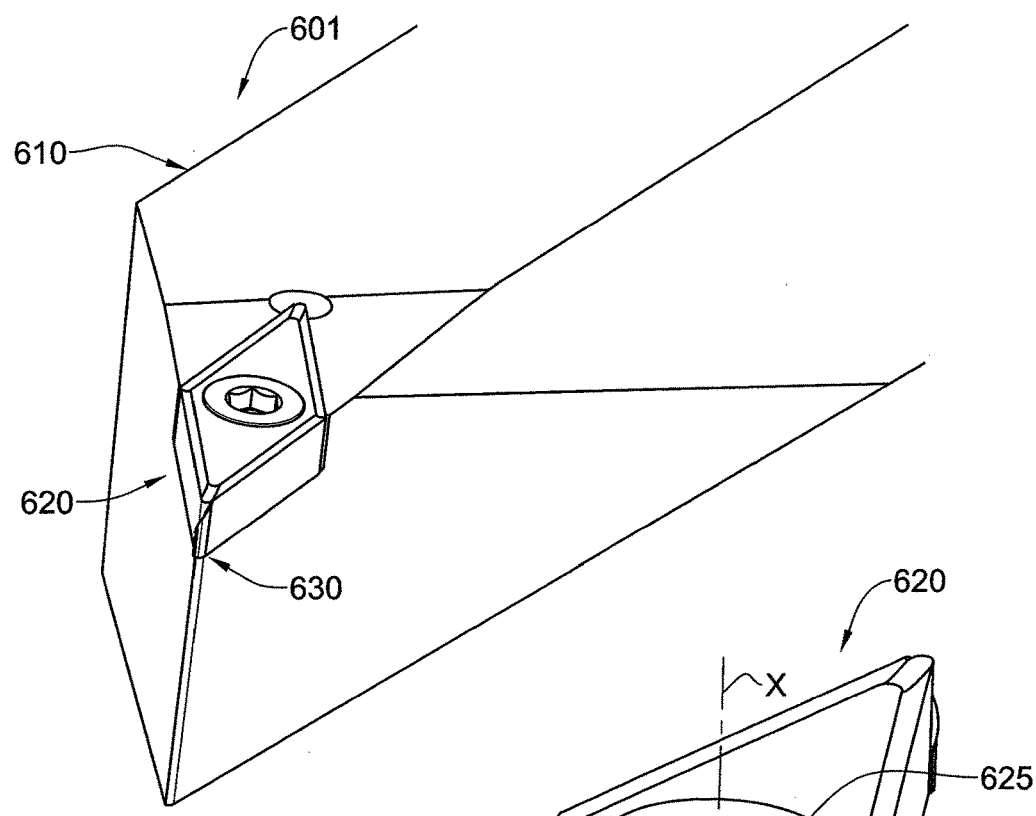
FIG. 22A is a schematic isometric view of a turning tool comprising a turning insert according to yet another example of the disclosed subject matter.
Figure 22B:
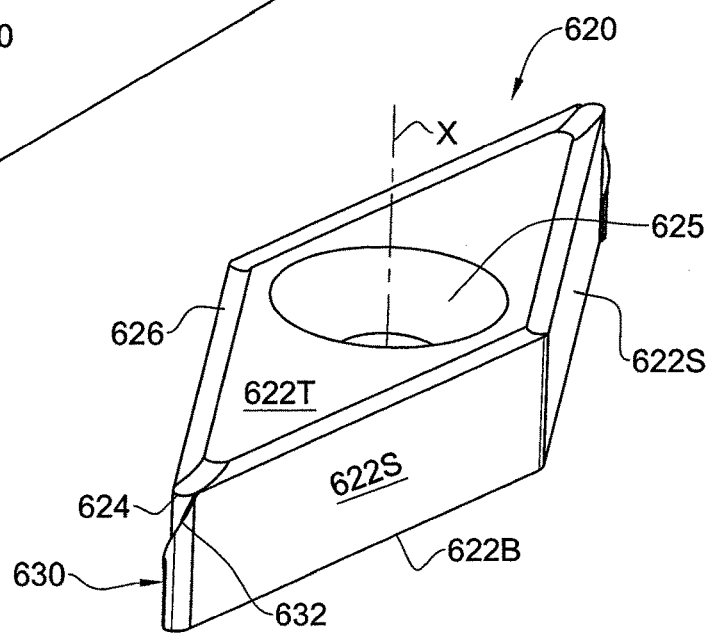
FIG. 22B is a schematic isometric view of the turning insert shown in FIG. 22A.
Figure 22C:
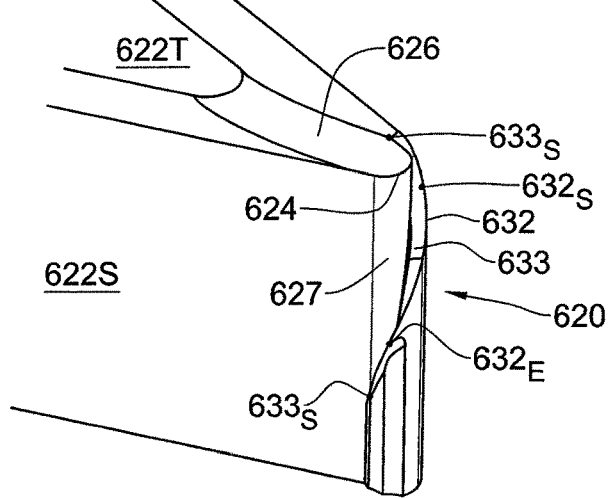
FIG. 22C is a schematic enlarged view of a portion of the turning insert shown in FIGS. 22A and 22B.
Figure 22D:
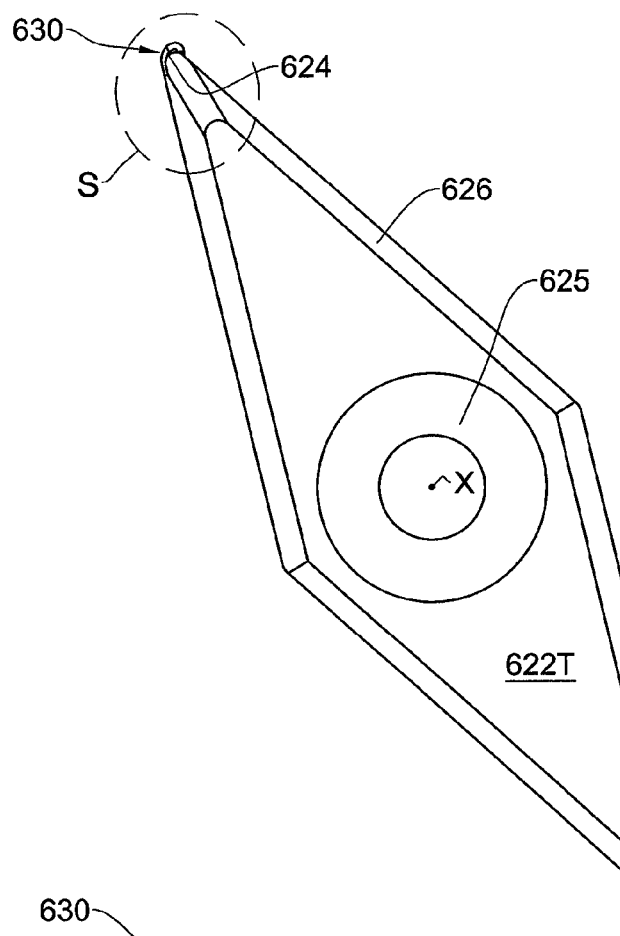
FIG. 22D is a schematic top view of the turning insert shown in FIGS. 22A to 22C.
Figure 22E:
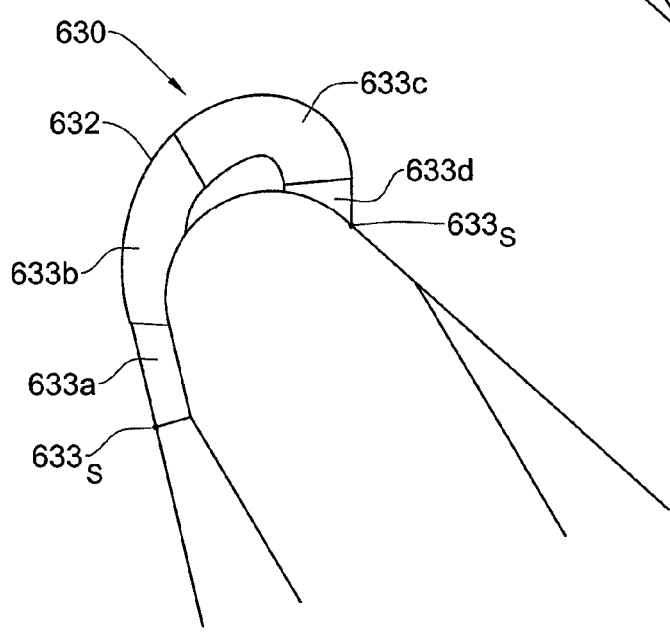
FIG. 22E is a schematic enlarged view of detail S shown in FIG. 22D.

With specific attention being drawn to FIG. 22C, it is observed that a portion of the additional element can be performed by sharpening/grinding after the manufacture of the cutting insert in a press-mold.

Figure 22F:
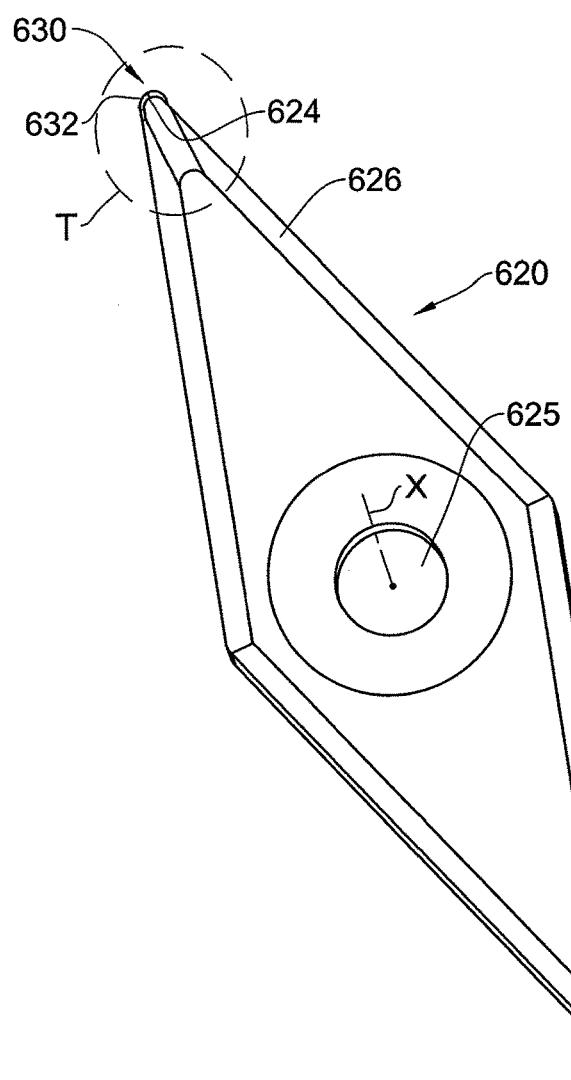
FIG. 22F is a schematic top view of the turning insert shown in FIGS. 22A to 22E when mounted onto the turning tool.
Figure 22G:
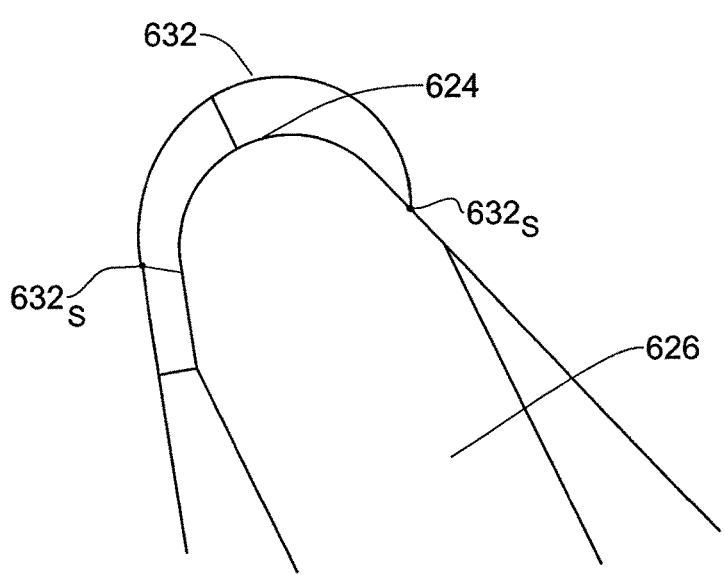
FIG. 22G is a schematic enlarged view of detail T shown in FIG. 22F.

As in previous examples, it is observed that there is a difference between the top view of the cutting insert 620 perpendicular to the top surface (FIG. 22D) and a top view of the cutting insert when mounted onto the cutting tool holder (FIG. 22F). The arrangement is such that when properly tilted (when mounted onto the cutting tool holder), the auxiliary cutting edge 632 uniformly surrounds the corner 627.

Turning now to FIGS. 23A to 23F, yet another example of a cutting insert is shown, generally being designated as 720. The cutting insert 720, similar to the cutting insert 220, comprises two additional cutting elements 730*i*, 730*ii*, which are consecutively arranged.

The cutting insert 720 is similar to the previously described cutting inserts 20, 20', 20", 120, 220, 320, 420, 520 and 620, and so, similar elements have been allocated similar reference numbers with the addition of 700, e.g. cutting edge 24 of cutting insert 20 is similar to cutting edge 724 of cutting insert 720.

Figure 23A:
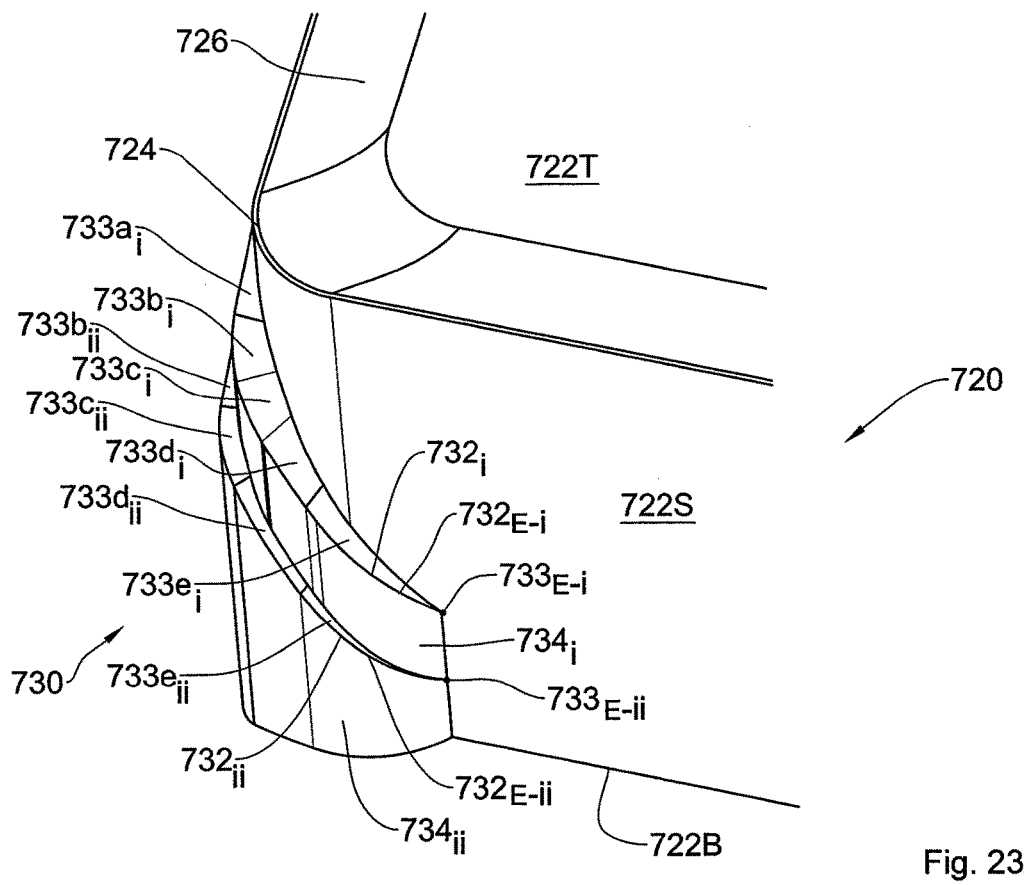
FIG. 23A is a schematic enlarged isometric view of a portion of a turning insert according to another example of the disclosed subject matter.
Figure 23B:
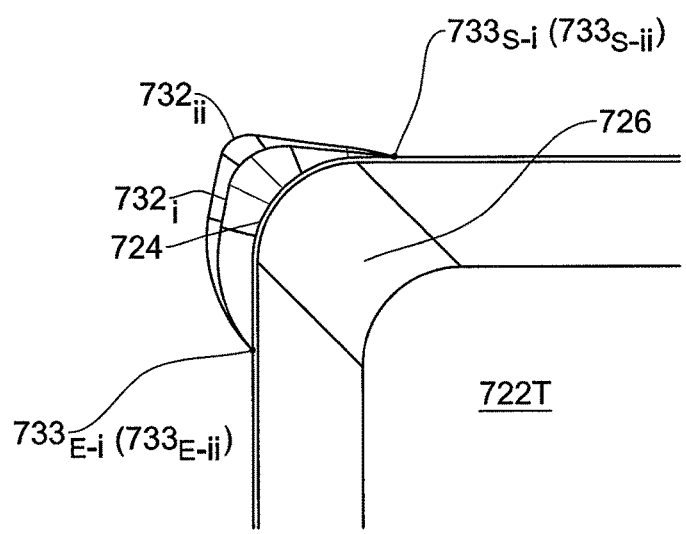
FIG. 23B is a schematic enlarged top view of the portion of the turning insert shown in FIG. 23A.
Figure 23C:
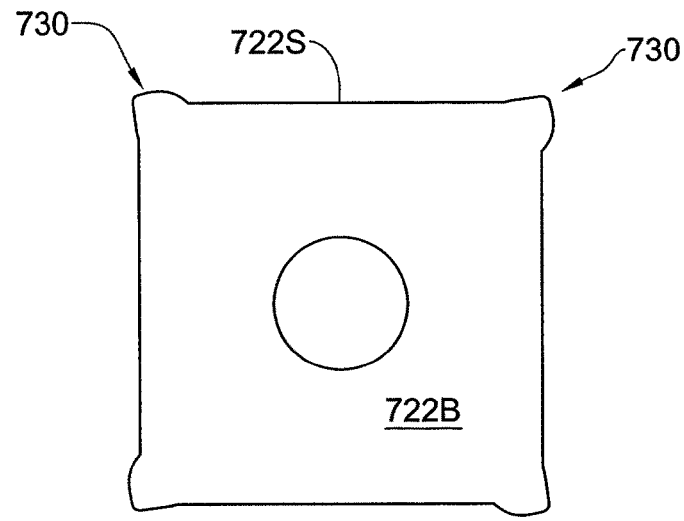
FIG. 23C is a schematic bottom view of the turning insert shown in FIGS. 23A and 23B.
Figure 23D:
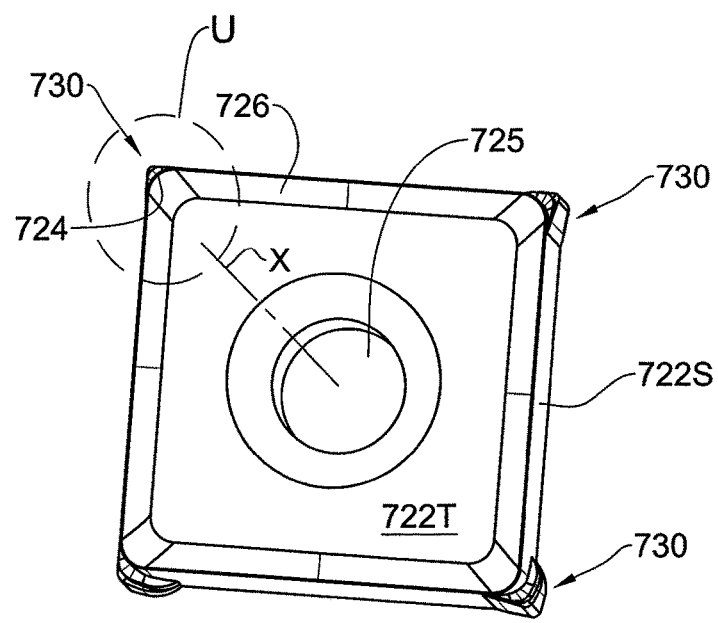
FIG. 23D is a schematic top view of the turning insert shown in FIGS. 23A to 23C, when mounted onto a turning tool (not shown)
Figure 23E:
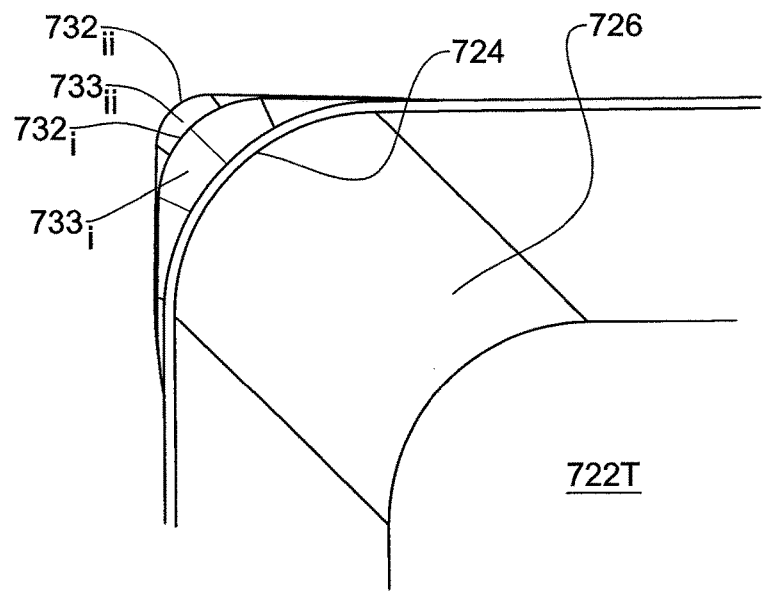
FIG. 23E is a schematic enlarged view of detail U shown in FIG. 23D.
Figure 23F:
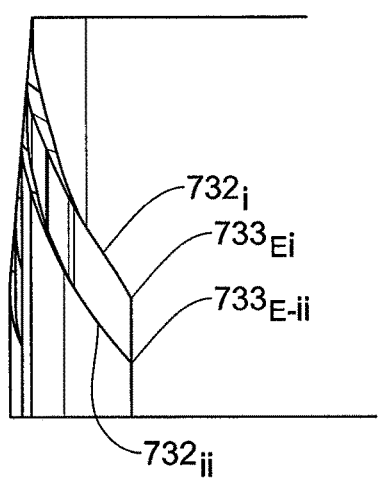
FIG. 23F is a schematic enlarged side view of the turning portion shown in FIG. 23B.

However, contrary to the cutting insert 220, in the present example, each of the cutting elements 730*i*, 730*ii* is formed with a different cutting radius as seen in the top view of the cutting insert (FIG. 23E). Furthermore, it is observed that the main cutting edge 724 has a first radius R1, the first cutting element 730*i* has a second cutting radius R2<R1, and the second cutting element 730*ii* has a third cutting radius R3<R2.

Thus, the cutting insert 720 allows gradually removing material from the workpiece to create a corner therein of radius R3, while gradually distributing the loads on the cutting insert 720.

Under the above design, the main cutting edge 724 can be of a very large radius more suitable for rough removal of material from the workpiece, while the additional cutting elements 730*i*, 730*ii*, are formed with smaller radii configured for more fine removal of material from the workpiece.

Such a design allows performing both rough and fine cutting of the workpiece using the same corner of the cutting insert at the same orientation with respect to the workpiece. In other words, there is no need to use an additional tool for fine cutting, and there is also no need for tilting/changing the orientation of the cutting insert with respect to the workpiece to distinguish between rough and fine cutting.

With respect to all previously described examples of cutting inserts, the chips removed from the workpiece by the main cutting edge are evacuated from the cutting insert via the top surface thereof, while chips removed by the auxiliary cutting edge proceed downwards to be evacuated via the bottom surface of the cutting insert. In other words, when the auxiliary cutting edge encounters the workpiece, the removed chip spirals downwards along the direction of the auxiliary cutting edge, whereas when the main cutting edge encounters the workpiece, the chips are broken off and curled upwards by virtue of the rake surface (a portion of the top surface);

Turning now to FIGS. 24A to 24G, a turning tool is shown generally designated as 801, and comprising a cutting tool holder 810 on which a cutting insert 20 is mounted, and also a chip breaking mechanism 850 disposed beneath the cutting insert 20 and biased by a biasing mechanism 860.

The arrangement is such that the chip breaker 850 is outwardly biased by the biasing mechanism 860, so as to protrude from a front surface 814 of the cutting tool holder 810, beneath the cutting insert 20.

The chip breaker 850 is in the form of an oval shaped member, having a sloped front surface 852 configured for coming in contact with the workpiece and breaking chips removed from the workpiece by the auxiliary cutting edge 32.

The chip breaker 850 is formed with a pivot bore 857 configured for receiving therein a pivot member 862 of the biasing mechanism 860. The biasing mechanism 860 further comprises a biasing spring 866 which is configured for urging the pivot member 862 to rotate in a CW direction, consequently urging the chip breaker 850 to protrude from the cutting tool holder 810 towards the workpiece.

Figure 24A:
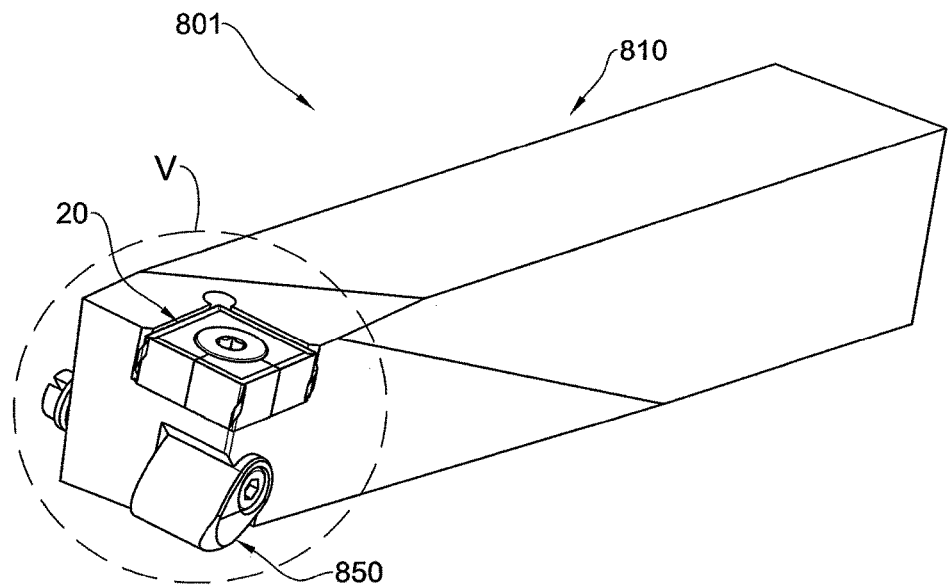
FIG. 24A is a schematic isometric view of a turning tool according to an example of the disclosed subject matter.
Figure 24B:
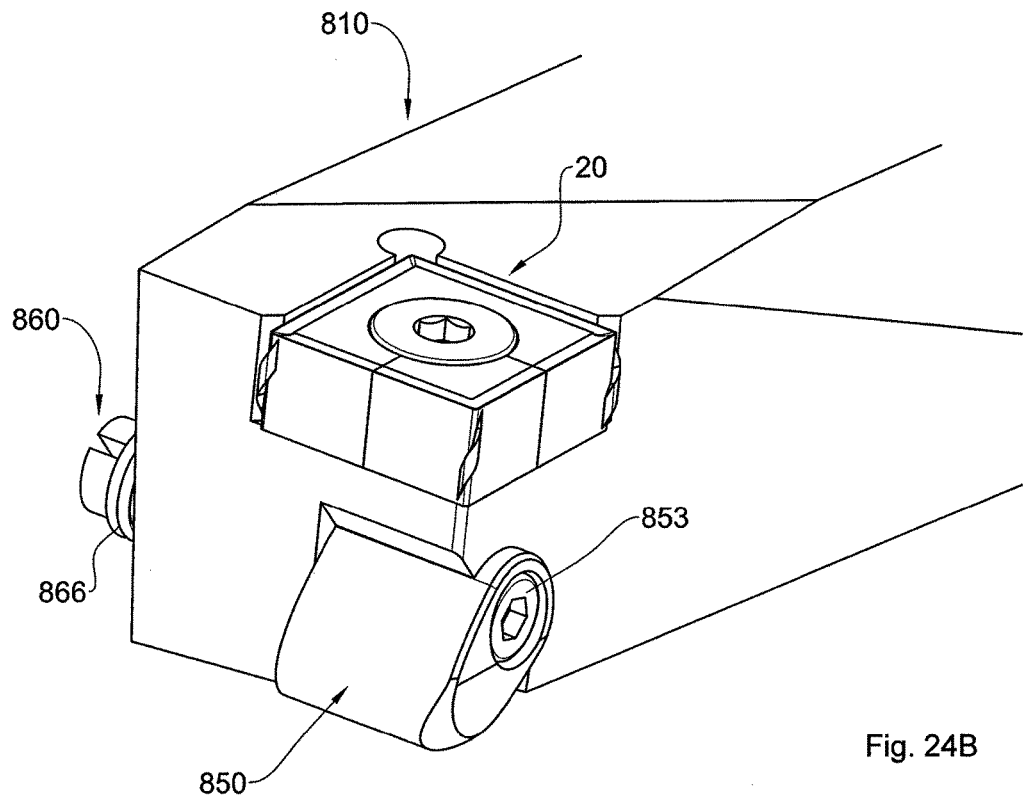
FIG. 24B is a schematic enlarged view of detail V shown in FIG. 24A.
Figure 24C:
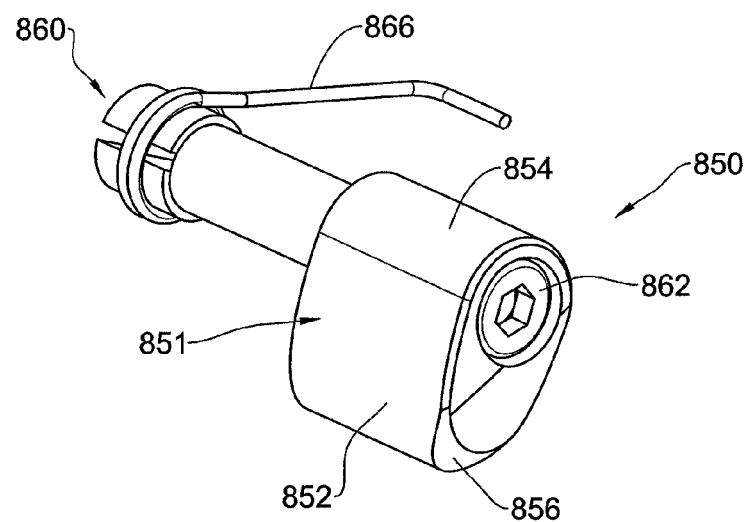
FIG. 24C is a schematic isometric view of a biasing mechanism used in the turning tool shown in FIGS. 24A and 24B.
Figure 24D:
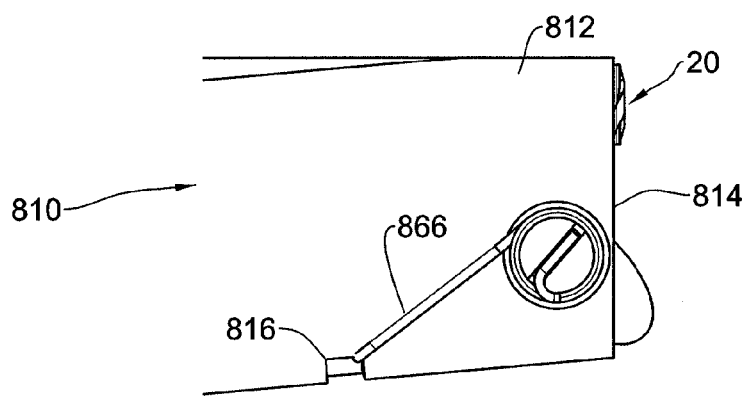
FIGS. 24D to 24G are schematic left side, front, top and right side views of the turning tool shown in FIGS. 24A and 24B.
Figure 24E:
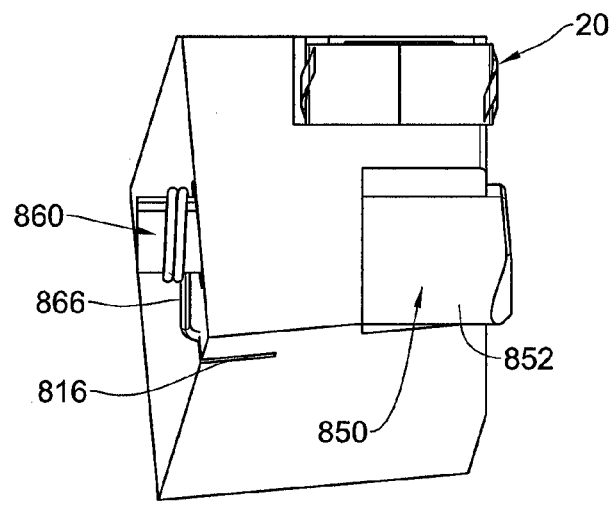
Figure 24F:
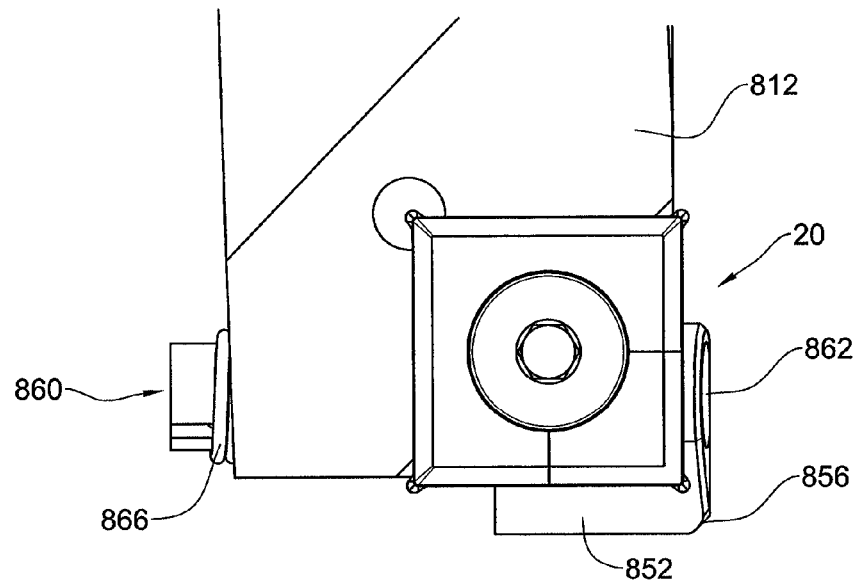
Figure 24G:
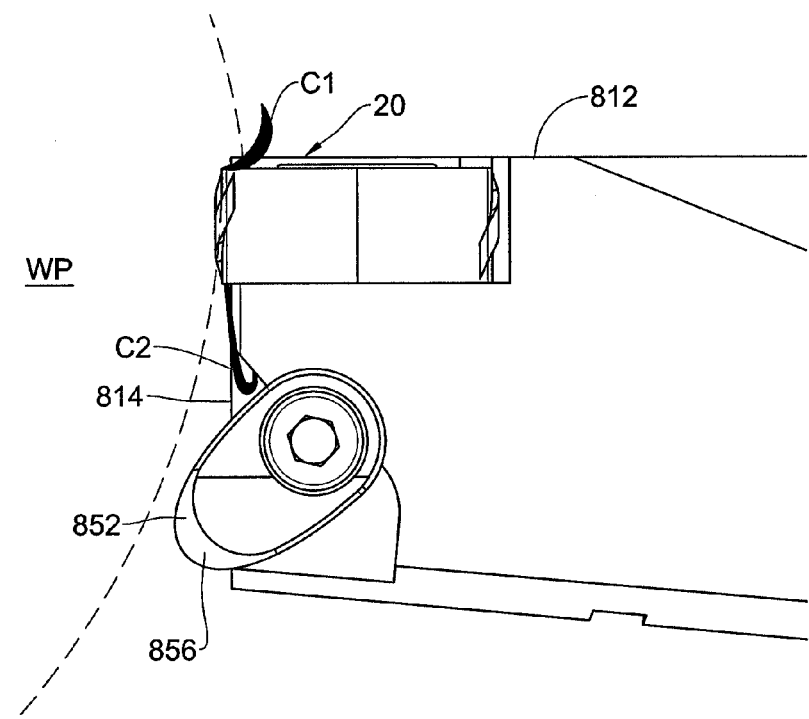

With particular reference being drawn to FIG. 24G, it is noted that during the cutting operation, a front surface 852 of the chip breaker comes in contact with the workpiece to form a space defined between the breaker 850, the workpiece and the front surface 814 of the cutting tool holder 810.

In operation, chips removed from the workpiece by the auxiliary cutting edge 832 spiral downwards towards the chip breaker. Upon encountering the chip breaker, the chips are broken into bits.

However, it is appreciated that the broken bits of the chips are gradually accumulated within the above formed space between the chip breaker and workpiece. Thus, in order to avoid congestion of the chips, the biasing degree of the biasing spring is such that it allows, on the one hand, applying enough pressure on the chips in order to break them, but on the other hand, is loose enough to allow the chip breaker to pivot about the axis into the cutting tool holder in order to allow the accumulated chips to be removed downwardly.

Furthermore, it is appreciated that the revolving workpiece constantly urges the chip bits in a downwards direction, applying pressure thereto. Thus, when enough chips and chip bits are accumulated and enough pressure is applied on the chip breaker by the revolution of the workpiece, the biasing spring of the chip breaker can no longer withstand the pressure, allowing the chip breaker to retreat and the chips to be evacuated.

Turning now to FIGS. 25A through 25H, another example of a cutting insert is shown, generally designated as 920, and formed with a top surface 922T, a bottom surface 922B and a side surface 922S extending therebetween.

The cutting insert 920 is similar to the previously described cutting inserts 20, 20', 20", 120, 220, 320, 420, 520, 620 and 720, and so, similar elements have been allocated similar reference numbers with the addition of 900, e.g. cutting edge 24 of cutting insert 20 is similar to cutting edge 924 of cutting insert 920.

The cutting insert 920 is formed with an additional cutting element 930 along the corner 927 thereof, similar to previously described cutting element 30", with the difference being that the cutting insert 920 is also provided with four secondary cutting elements 930' disposed along the side surface 922S.

Each of the secondary cutting elements 930' has a cutting edge 932' extending between a start point $933_S'$ located on the side surface 922S (and not on the intersection between the side and top surfaces) and an end point $932_E'$ and the bottom surface 922B.

The cutting edge 932' of each of the secondary cutting elements 930' spirals between the start and end points $933_S'$, $932_E'$ similar to the auxiliary cutting edge 932. Specifically, it is observed that the cutting edges 932' mimic the shape of a portion of the cutting edge 932 starting from the side surface 922S.

The cutting insert 920 thus has only two main cutting edges 924 at the opposite corner 927, two corresponding additional cutting elements 930 and two sets of secondary cutting element 930'.

Figure 25A:
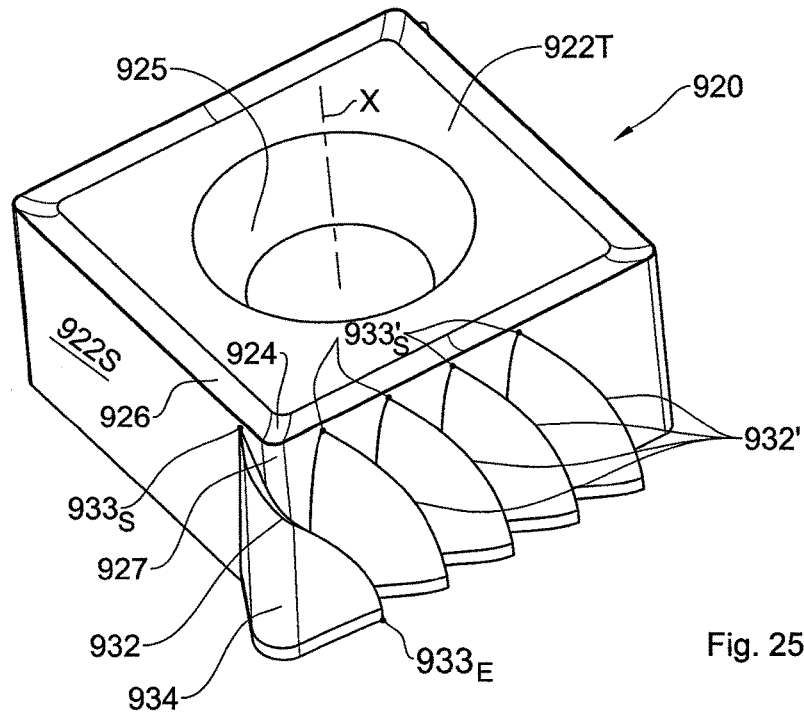
FIGS. 25A and 25B are schematic respective right and left isometric views of a turning insert according to another example of the present application.
Figure 25B:
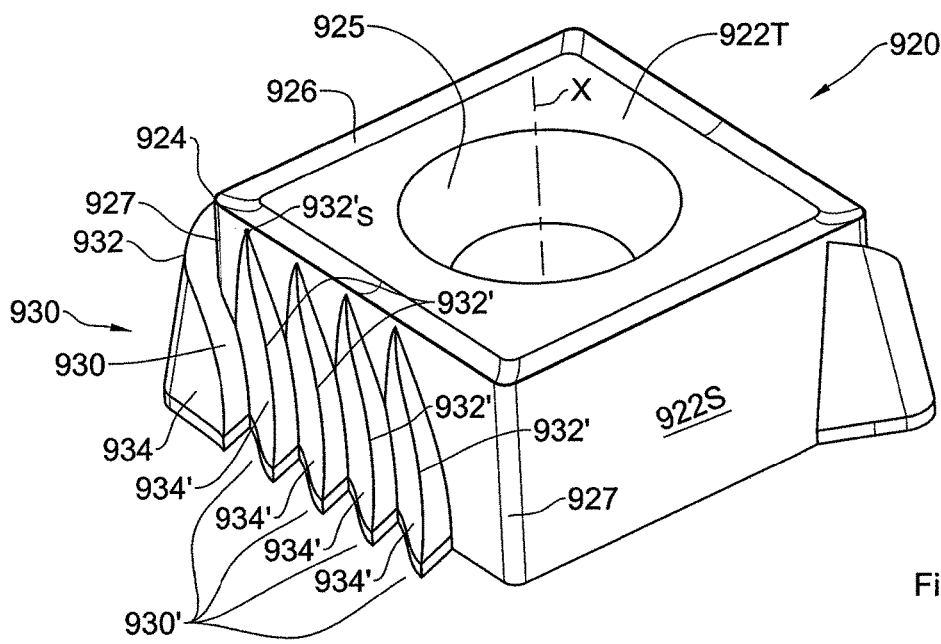
Figure 25C:
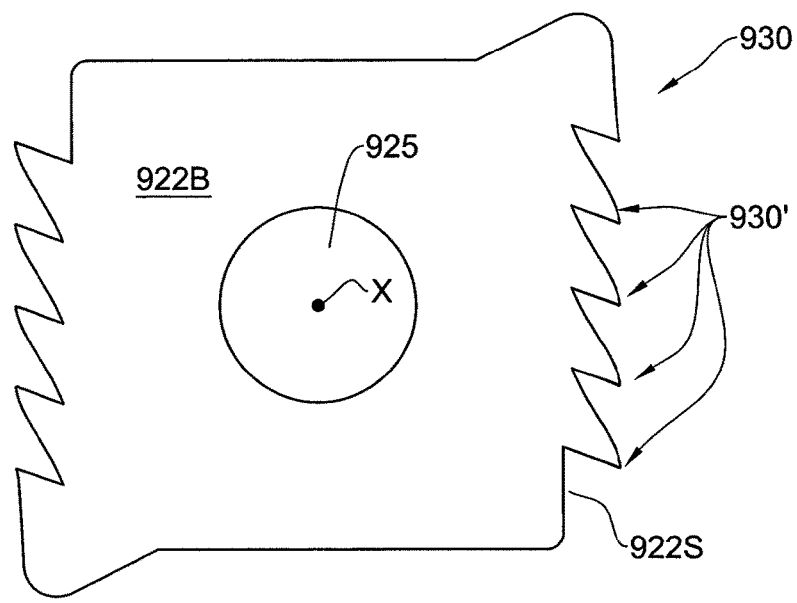
FIGS. 25C and 25D are schematic respective bottom and top views of the turning insert shown in FIGS. 25A and 25B.
Figure 25D:
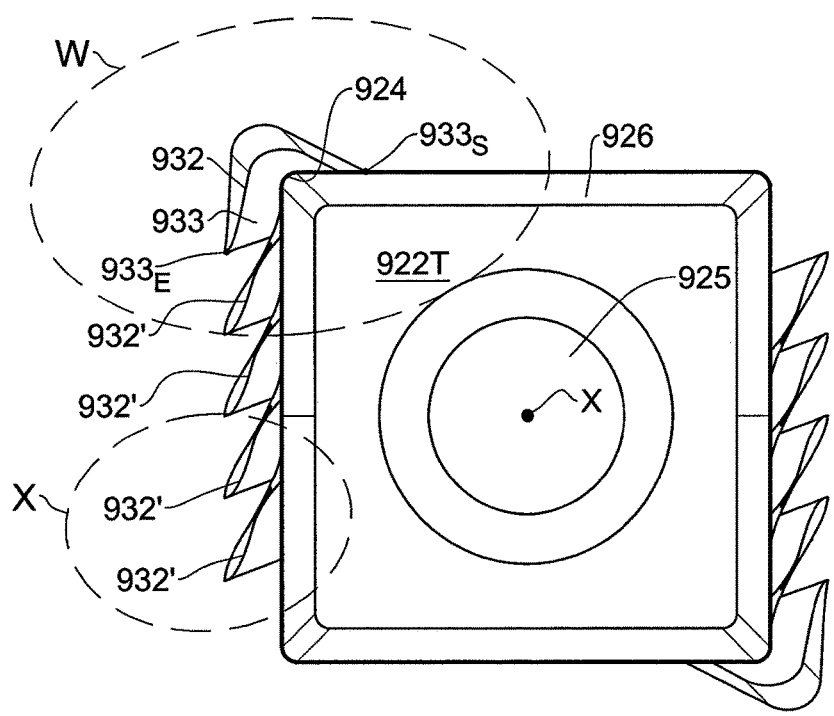
Figure 25E:
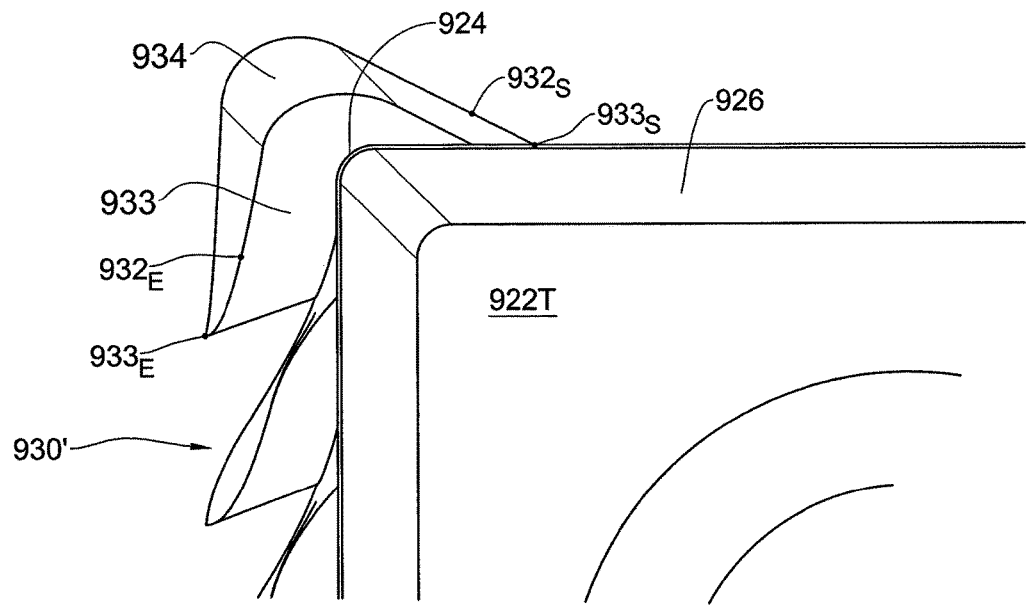
FIGS. 25E and 25F are schematic enlarged views of details W and X shown in FIG. 25D.
Figure 25F:
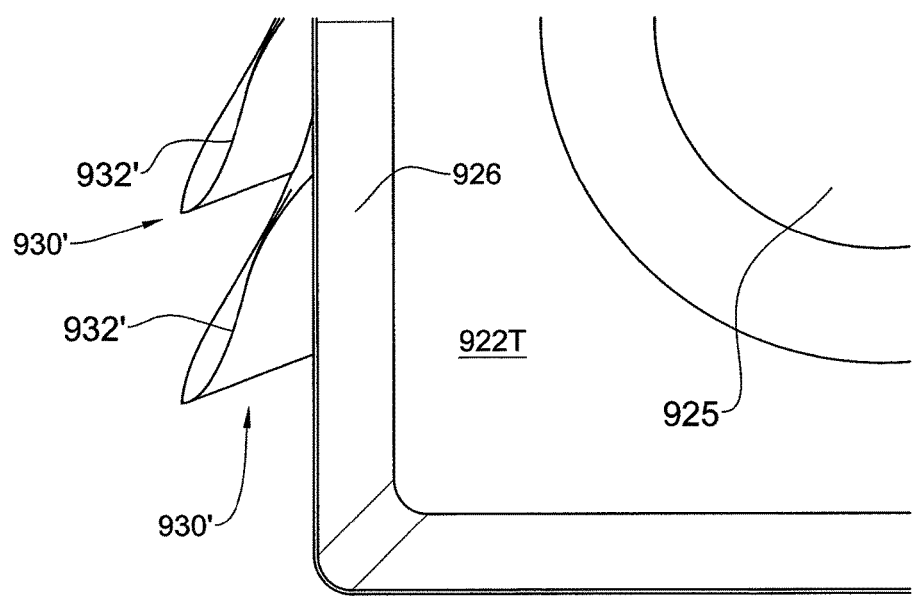
Figure 25G:
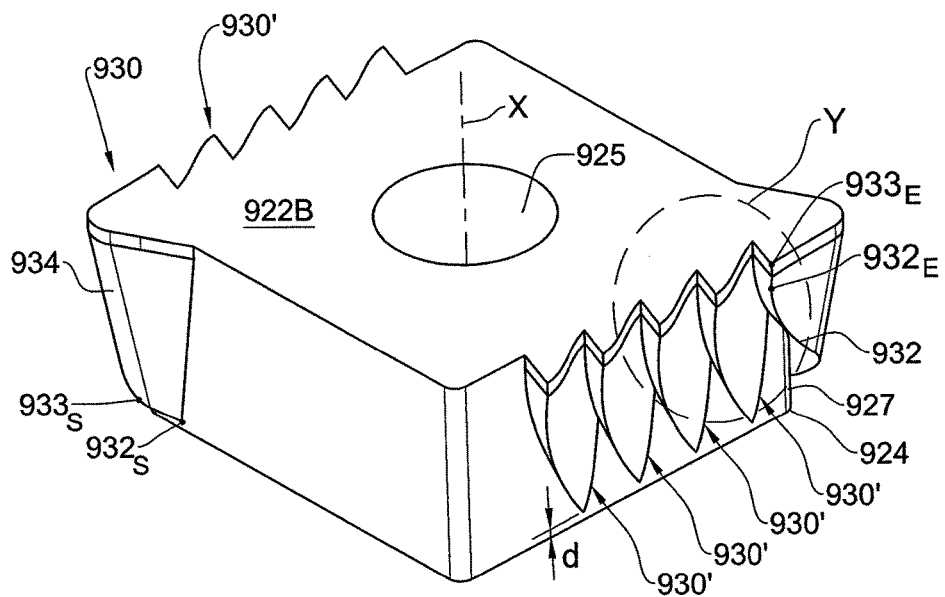
FIG. 25G is a schematic bottom isometric view of the turning insert shown in FIGS. 25A to 25F.
Figure 25H:
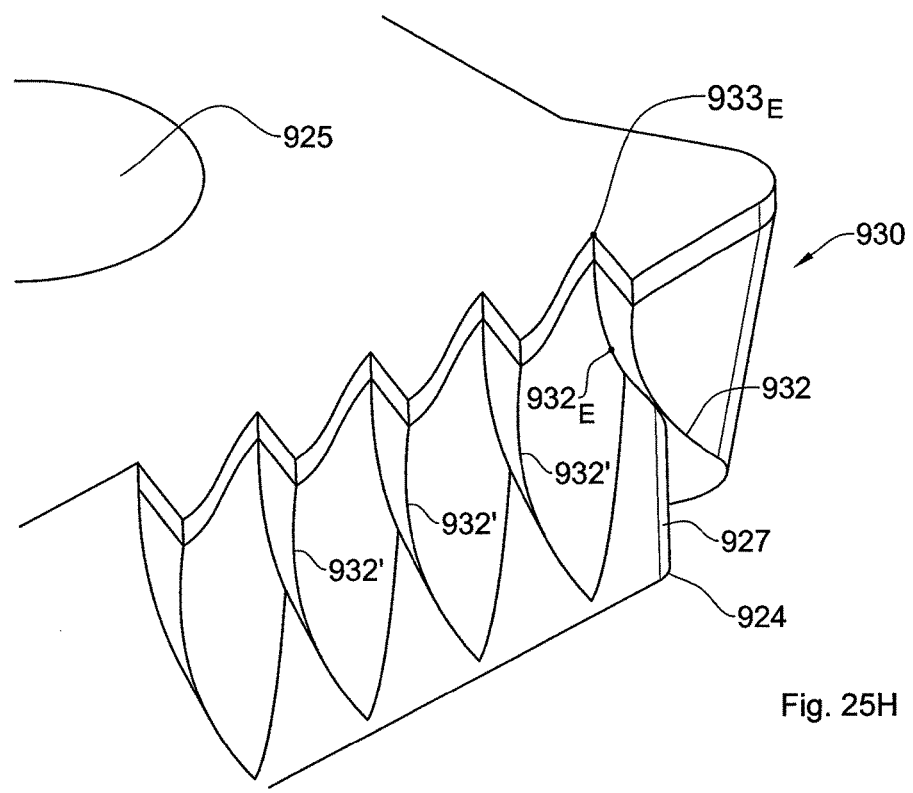
FIG. 25H is a schematic enlarged view of detail Y shown in FIG. 25G.

With particular reference to FIG. 25G, it is observed that the cutting insert 920 is designed to have no undercuts, and can therefore be produced by a press-mold, as shown in FIGS. 26A to 26E.

Turning now to FIGS. 26A to 26E, there is presented a press-mold configured for producing the cutting insert 920, and comprising a male member 980 and a female member 990.

The male member 980 comprises a body 982 having a top surface 982T, a bottom surface 982B and side surfaces 982S extending therebetween, and a bore 985 axially extending between the top and bottom surface 982T, 982B.

Two opposite side surfaces of the male member 980 are formed with projections 983' which mimic the shape of the bottom surface of the cutting insert 920.

Figure 26A:
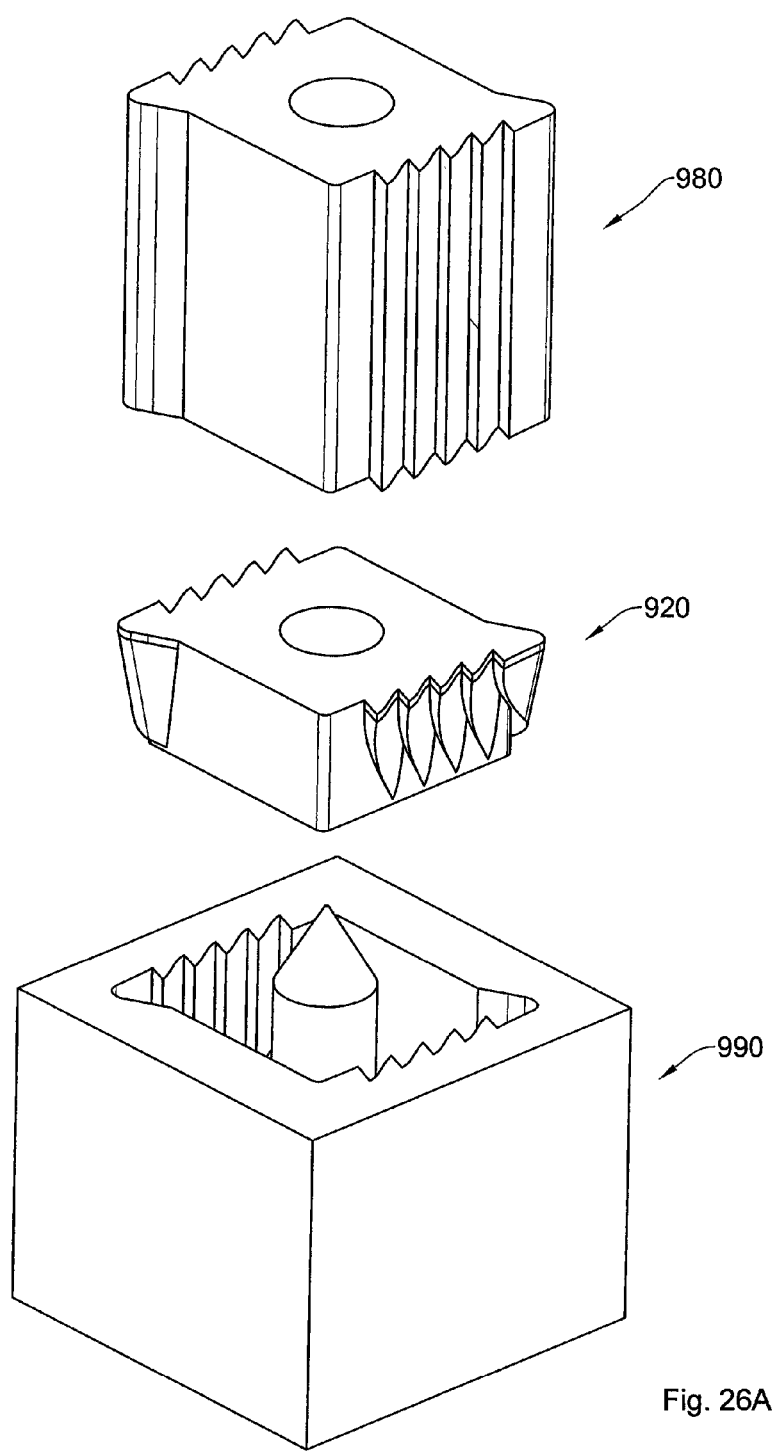
FIG. 26A is a schematic exploded isometric view of a mold used in the manufacture of the turning insert shown in FIGS. 13A to 13H.
Figure 26B:
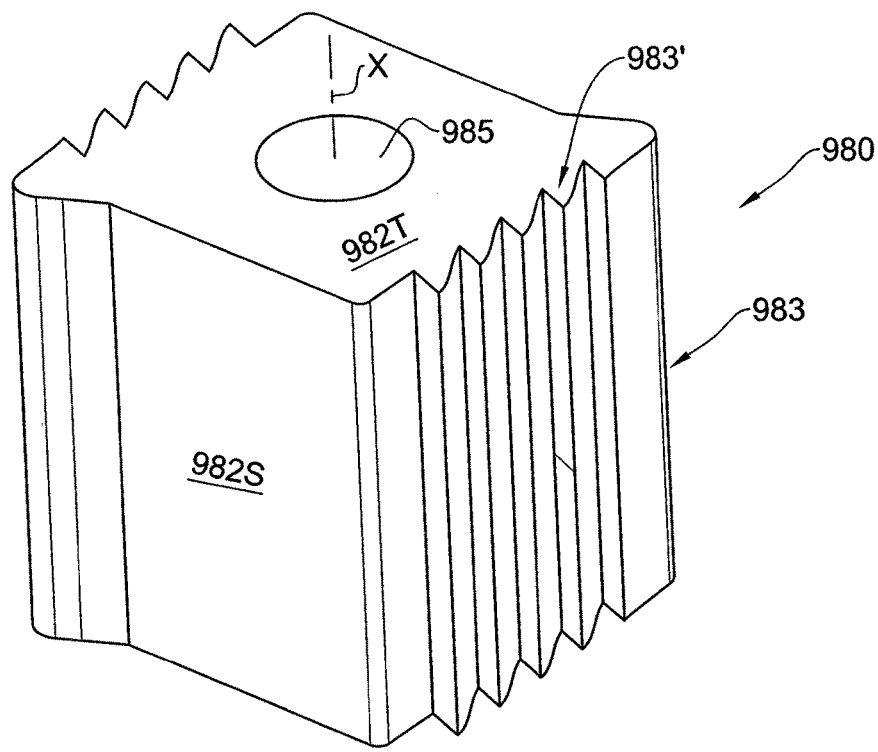
FIGS. 26B and 26C are respective schematic isometric and top views of a male member of the mold shown in FIG. 26A.
Figure 26C:
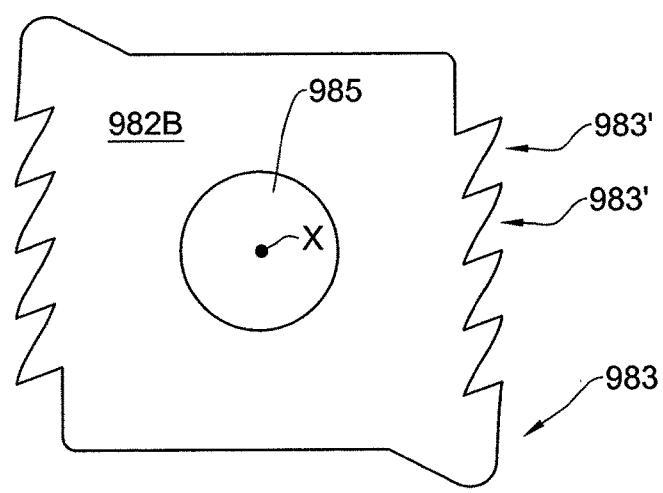
Figure 26D:
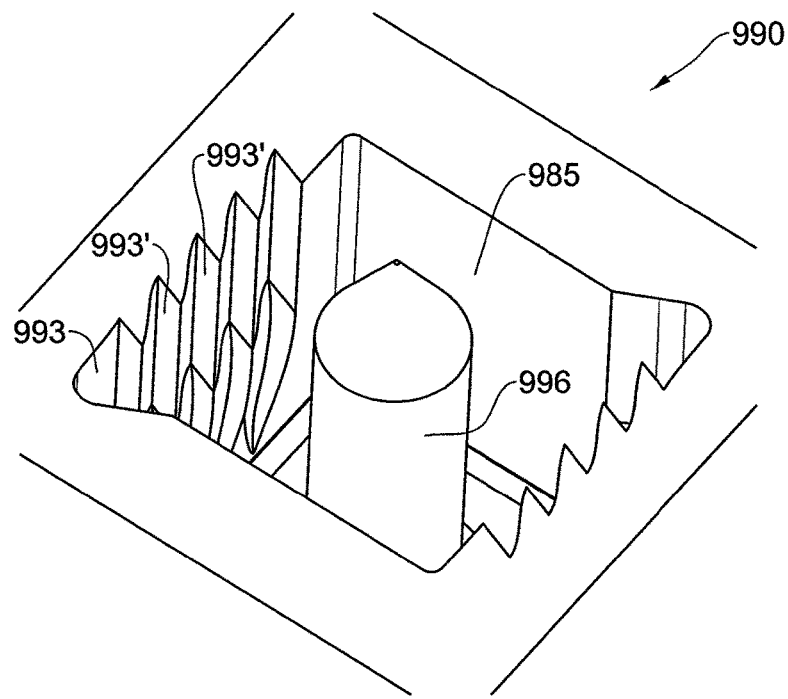
FIGS. 26D and 26E are respective schematic isometric and top views of a female member of the mold shown in FIG. 26A.
Figure 26E:
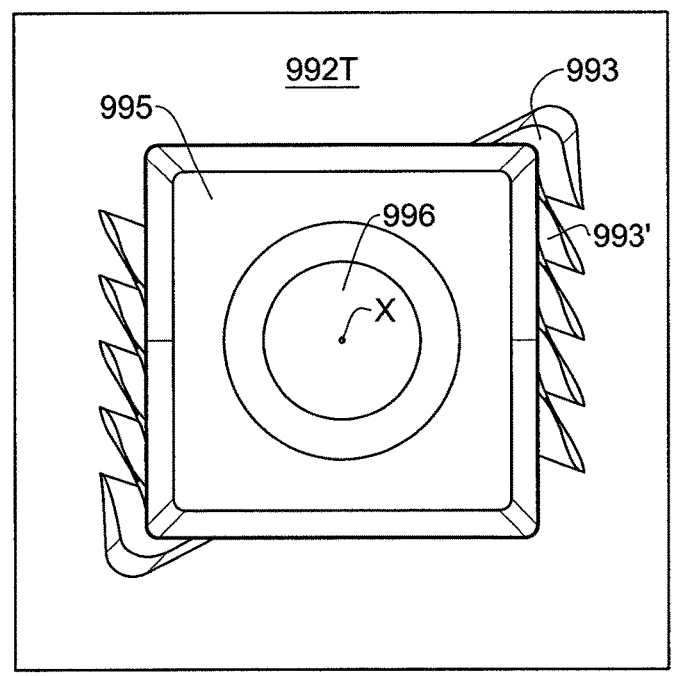

It is observed form FIG. 26C that the male member 980 has no undercuts, allowing the cutting insert 920 to be manufactured using a pressing process.

The female member 990 is formed with a central cavity 995 and a central pole 996 configured for being received within the bore 985 of the male member 980, serving both to form the bore 925 of the cutting insert 920 as well as for alignment of the male and female members 980, 990.

The cavity 995 has a first portion having a shape corresponding to that of the cutting insert 920 and a second portion having a shape corresponding to that of the male member 980, the second portion being closer to a top surface 992T of the female member 990 along the axial direction.

Turning now to FIGS. 27A to 27E, the cutting insert 920 is shown when mounted onto a cutting tool holder 910, positioned thereon at a tilt (both forward and sideways).

Figure 27B:
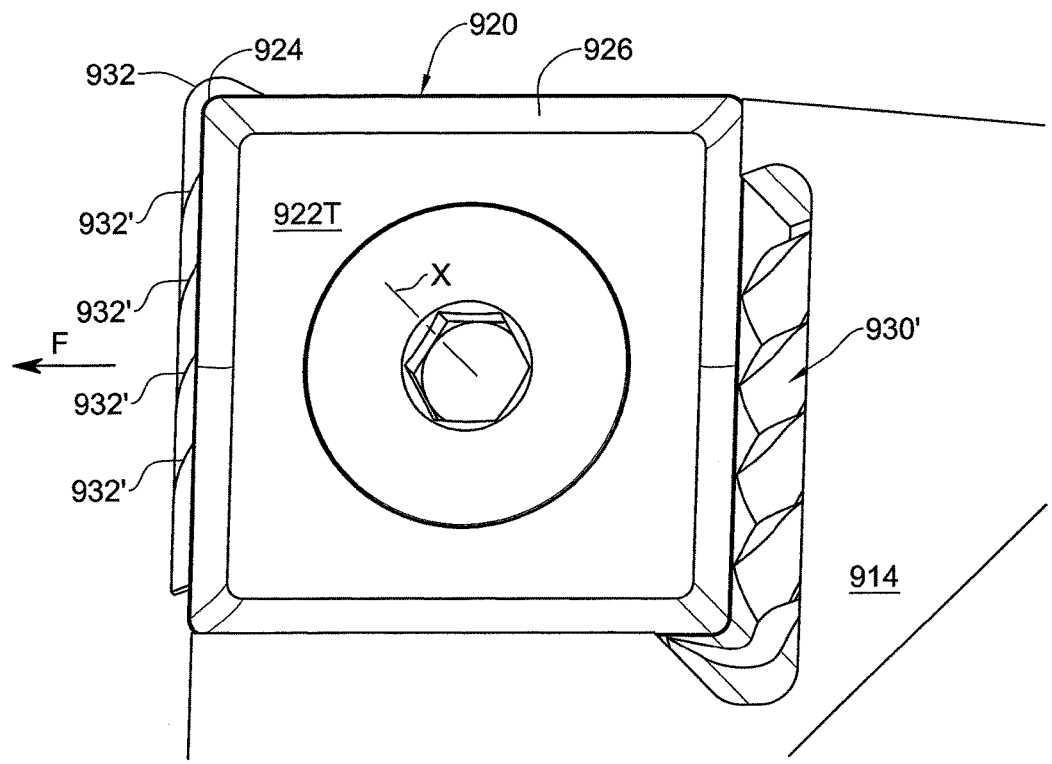
FIG. 27B is a schematic enlarged top view of the turning insert when mounted onto the turning tool holder shown in FIG. 27A.

It is observed that in the top view shown in FIG. 27B, the auxiliary cutting edge 932 and the secondary cutting edges 932' form a combined cutting edge extending parallel to the edge formed between the top surface 922T and the side surface 922S.

Thus, the cutting insert 920 is configured for a cutting operation under a side feed, progressing in the direction of arrow F, thereby removing material from the workpiece along almost the entire side surface of the cutting insert 920.

Figure 27C:
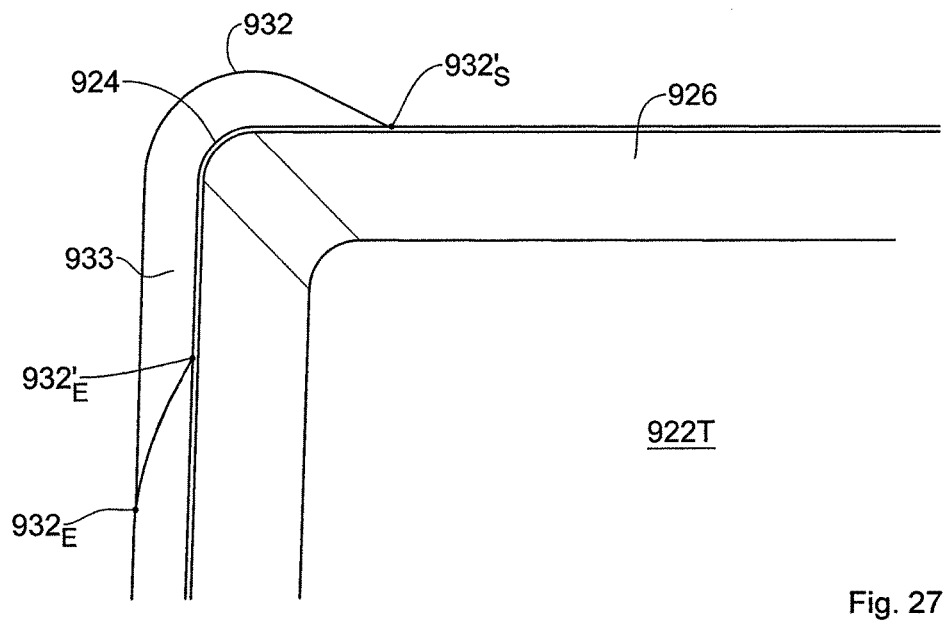
FIG. 27C is a schematic enlarged view of a portion of the turning tool shown in FIG. 27B.
Figure 27D:
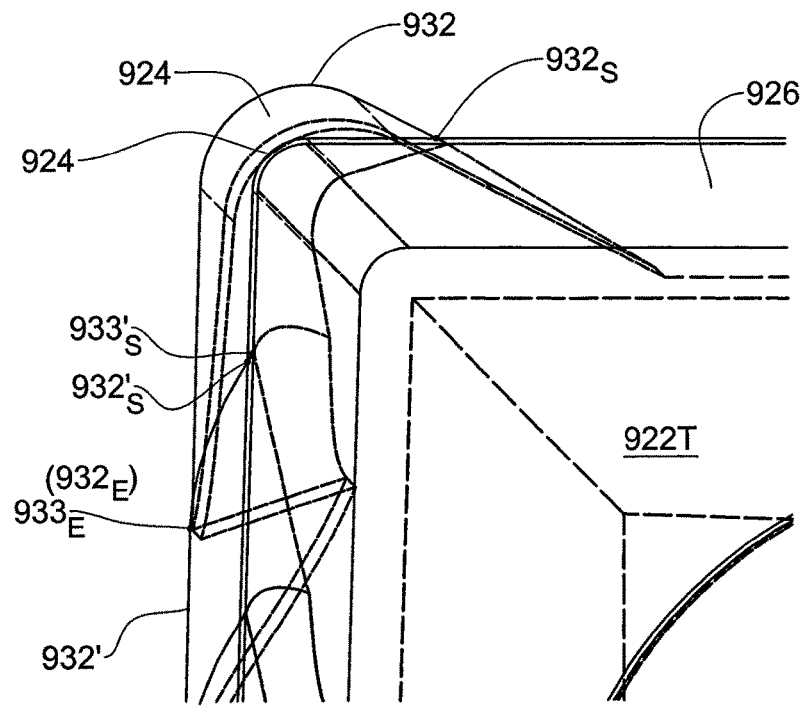
FIG. 27A is a schematic isometric view of a turning tool comprising the turning insert shown in FIGS. 13A to 13H.
Figure 27E:
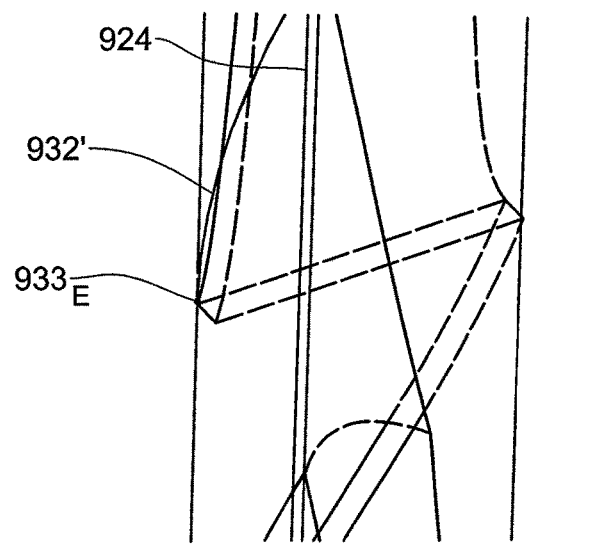
Figure 28A:
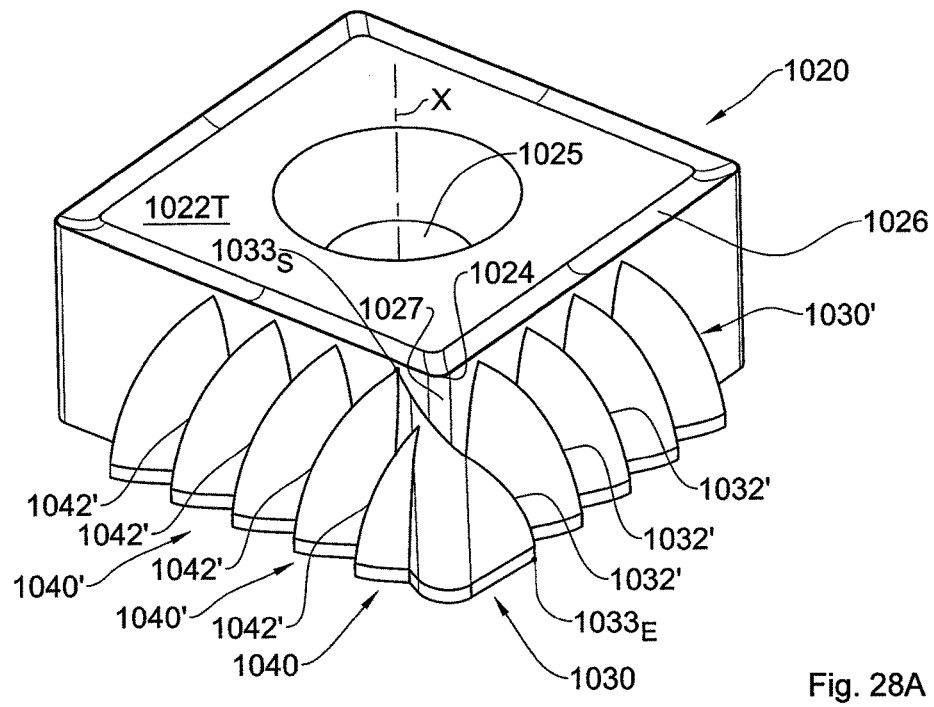
Figure 28B:
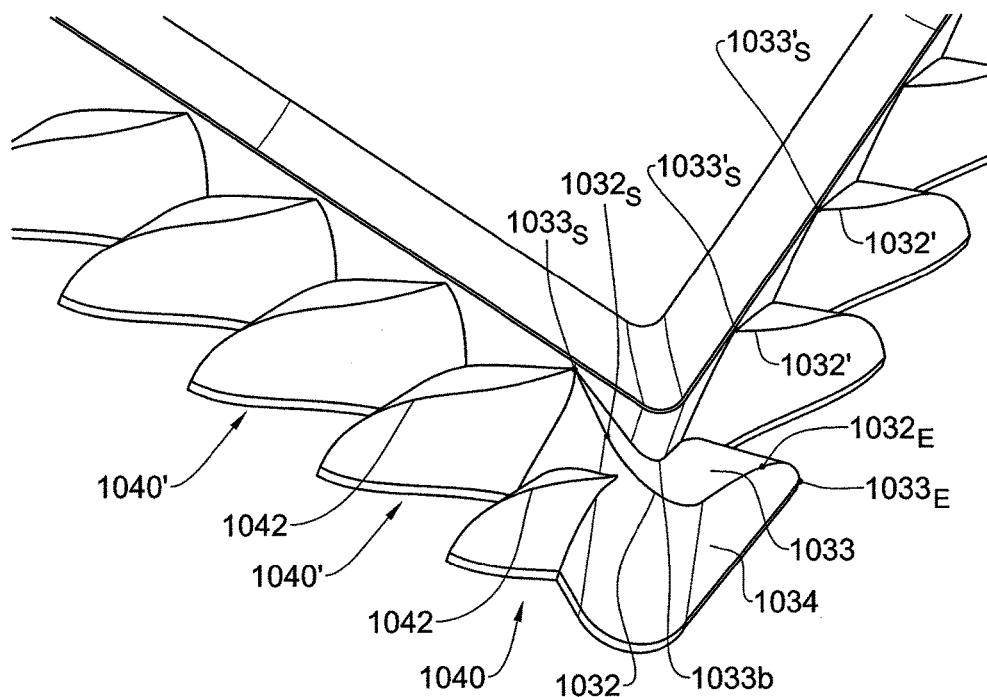
Figure 28C:
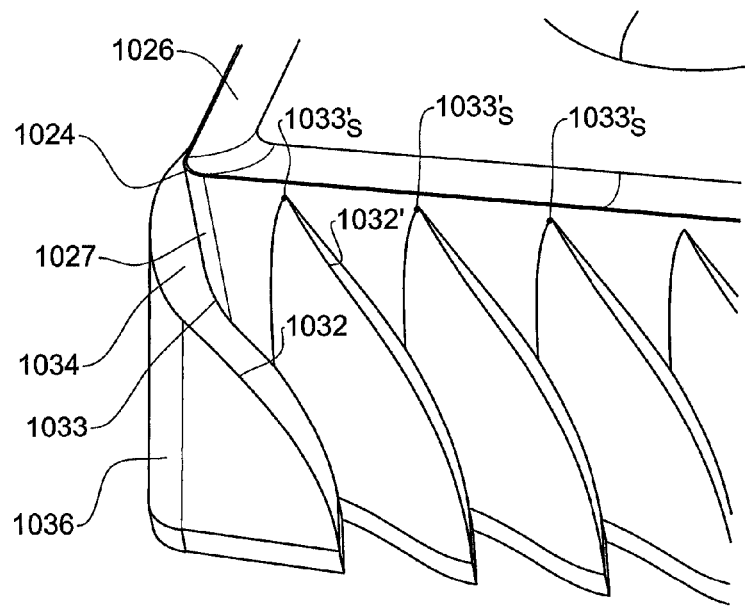
Figure 28D:
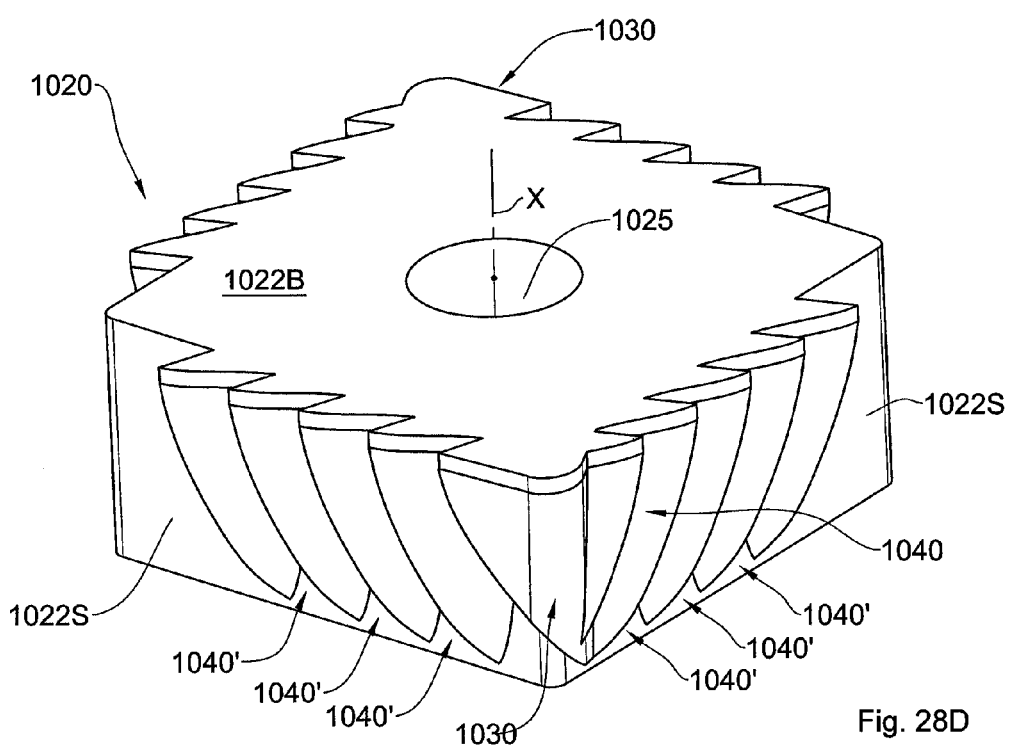
Figure 28E:
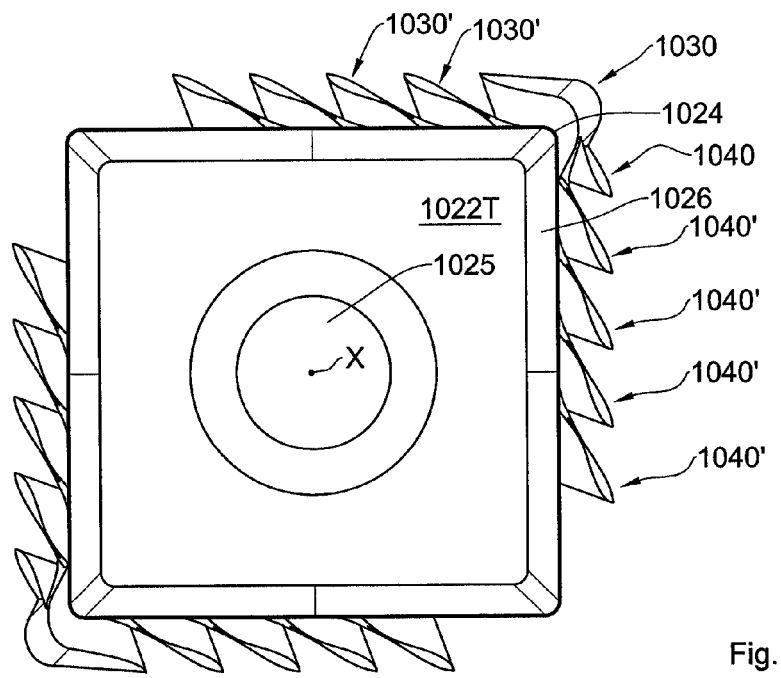
Figure 28F:
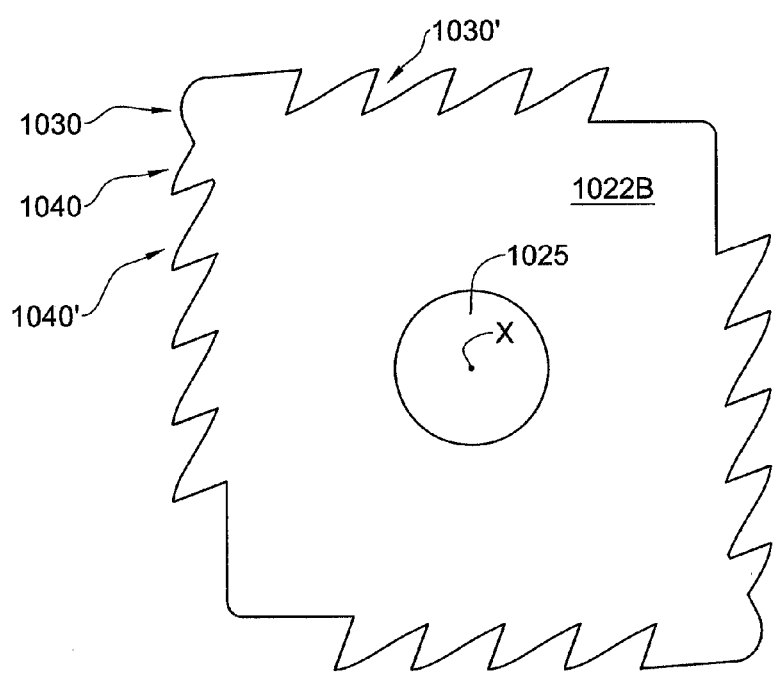
Figure 28G:
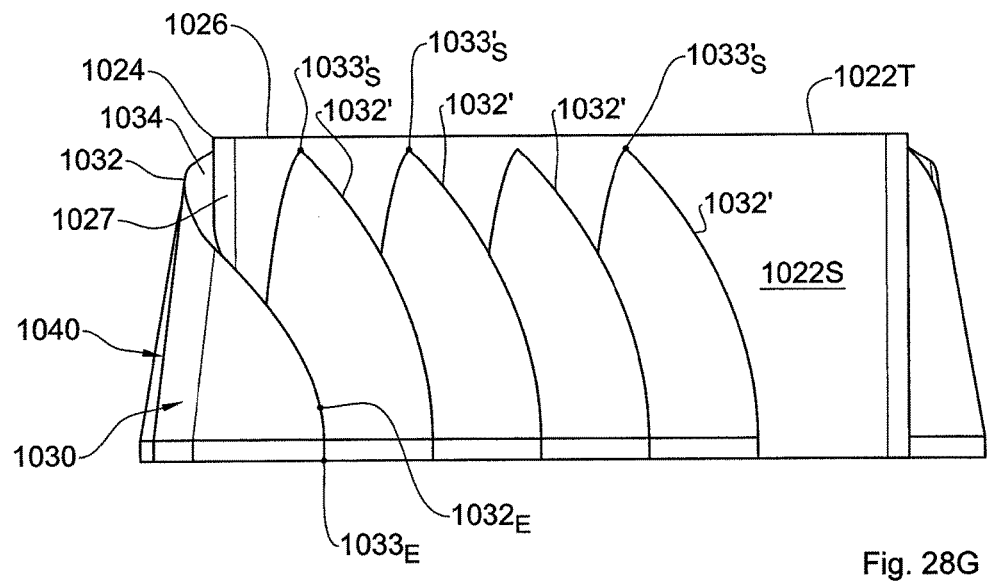
Figure 28H:
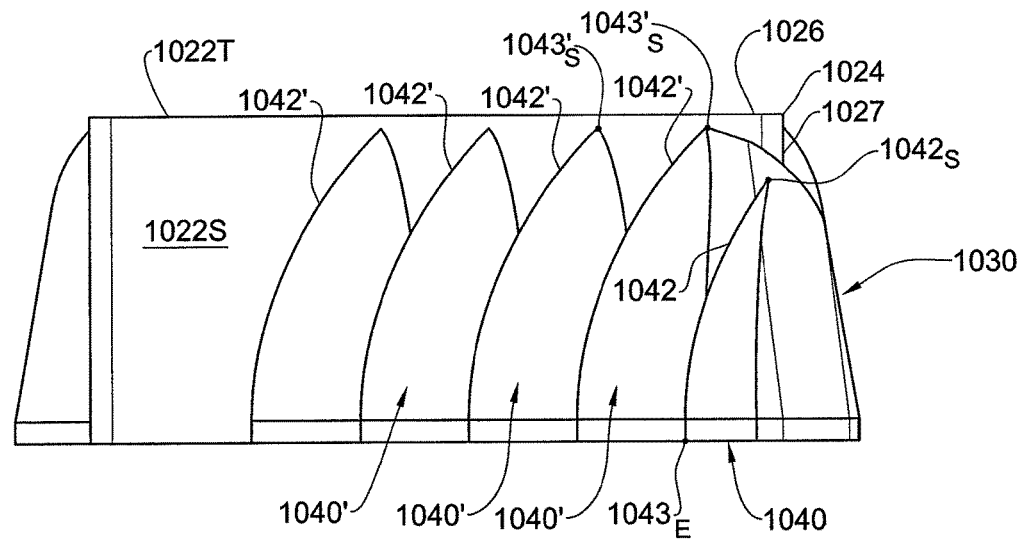
Figure 29A:
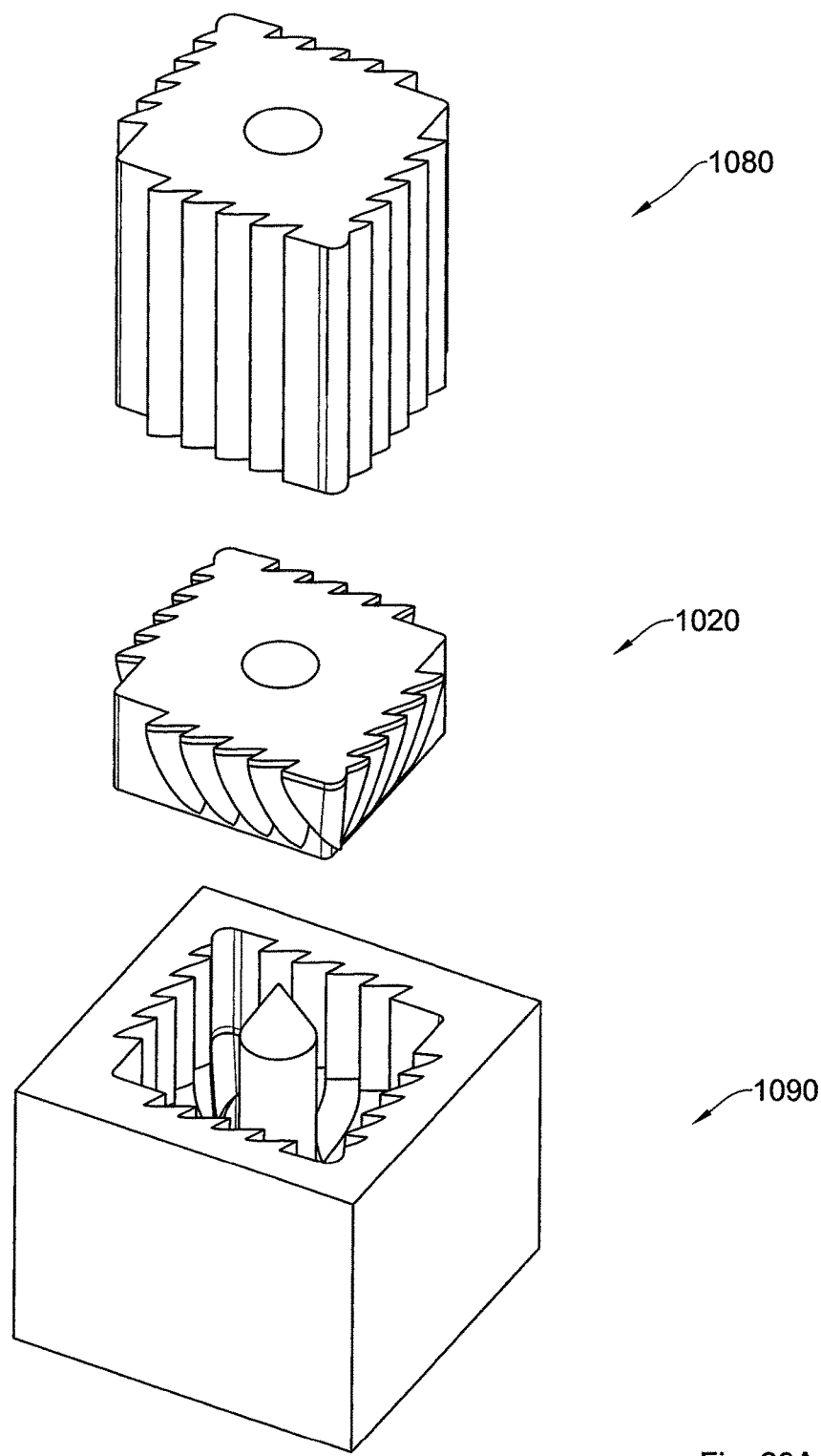
Figure 29B:
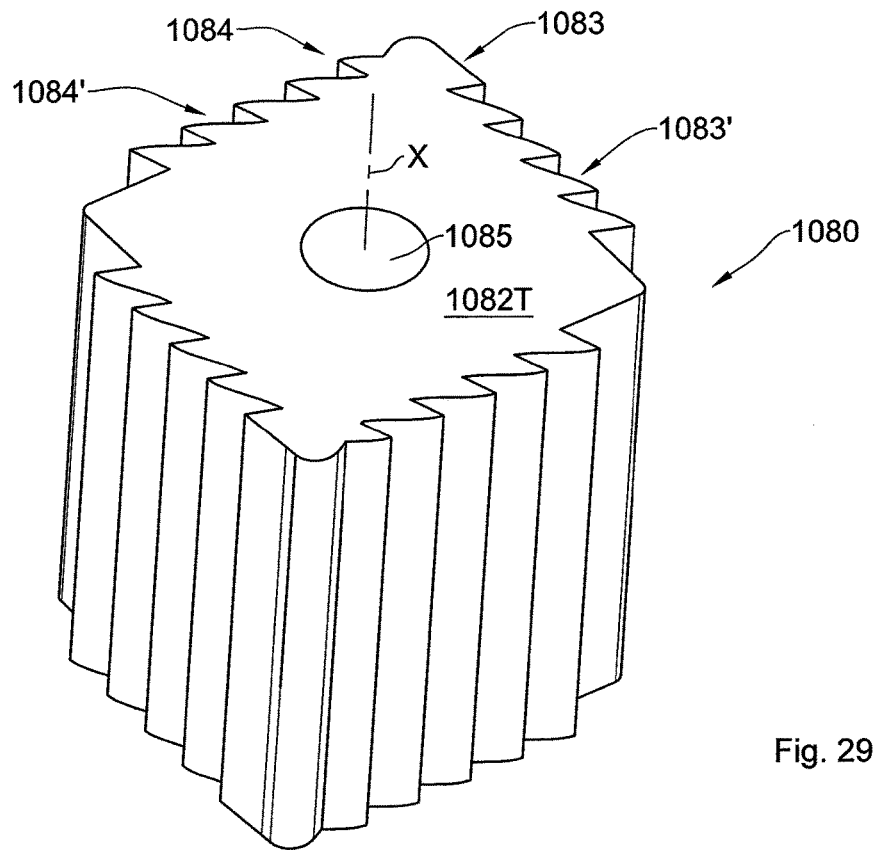
Figure 29C:
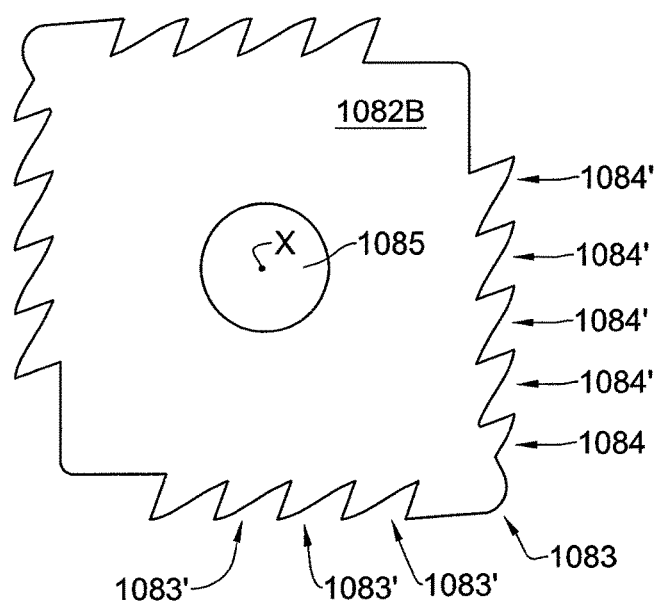
Figure 29D:
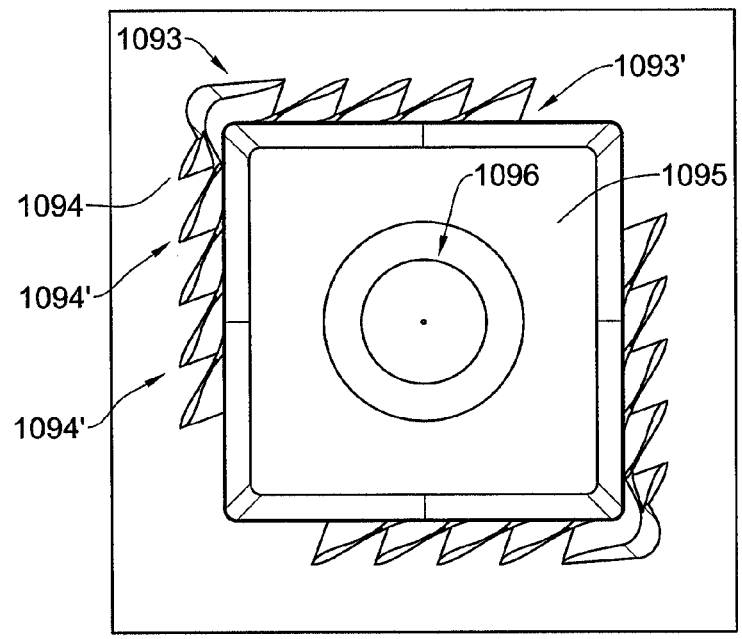
Figure 29E:
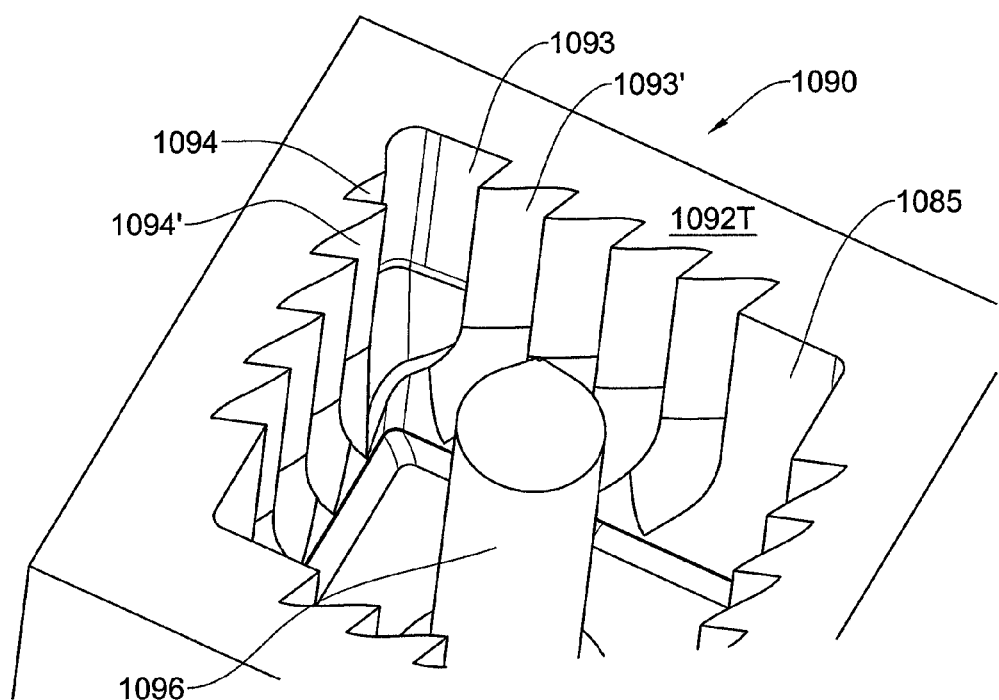

With particular attention drawn to FIGS. 27C to 27E, it is observed that, in the orientation of the cutting insert 920 when mounted onto the cutting tool holder 910, the end point $932_E$ of the auxiliary cutting edge 932 is overlapped by the secondary cutting edge 932' of the neighboring secondary cutting element 930'.

In addition, the end point $932_E'$ of the secondary cutting edge is also overlapped by the secondary cutting edge 932' of the neighboring secondary cutting element 930'. This is true for all secondary cutting elements 930' but the last (the most remote from the cutting corner 927). Under the above design, the cutting edges 930, 930' of the cutting insert mimic a single cutting edge extending along the majority of the side surface 922S.

Turning now to FIGS. 28A to 28H, in which yet another example of a cutting insert is shown, generally designated as 1020. The cutting insert 1020 is generally similar to the previously described cutting insert 920, and so, similar elements have been allocated similar reference numbers with the addition of 1000, e.g. cutting edge 924 of cutting insert 920 is similar to cutting edge 1024 of cutting insert 1020.

However, the cutting insert 1020 comprises a first set of secondary cutting elements on one side surface 1022S and a second set of secondary cutting elements 1040' on the adjacent side surface 1022S, the side surfaces 1022S forming the corner 1027 of the cutting edge 1024.

It is also observed that the additional cutting element 1030 itself is formed with another cutting element 1040 thereon, with a cutting edge 1042 spiraling the opposite direction of the cutting edge 1032 of the additional cutting element 1030.

The above cutting insert 1020, as opposed to the previously described cutting insert 920, is configured for performing a cutting operation in both directions, i.e. front and side, as will be shown with respect to FIGS. 30A to 30E.

Turning now to FIGS. 29A to 29E, a press-mold configured for producing the cutting insert 1020, and comprising a male member 1080 and a female member 1090.

The male member 1080 comprises a body 1082 having a top surface 1082T, a bottom surface 1082B and side surfaces 1082S extending therebetween, and a bore 1085 axially extending between the top and bottom surface 1082T, 1082B.

Two opposite side surfaces of the male member 1080 are formed with projections 1083' which mimic the shape of the bottom surface of the cutting insert 1020.

It is observed form FIG. 26C that the male member 1080 has no undercuts, allowing the cutting insert 1020 to be manufactured using a pressing process.

The female member 1090 is formed with a central cavity 1095 and a central pole 1096 configured for being received within the bore 1085 of the male member 1080, serving both to form the bore 1025 of the cutting insert 1020 as well as for alignment of the male and female members 1080, 1090.

The cavity 1095 has a first portion having a shape corresponding to that of the cutting insert 1020 and a second portion having a shape corresponding to that of the male member 1080, the second portion being closer to a top surface 1092T of the female member 1090 along the axial direction.

Turning now to FIGS. 30A to 30E, the cutting insert 1020 is shown when mounted onto a cutting tool holder 1010, positioned thereon at a tilt (both forward and sideways).

Figure 30A:
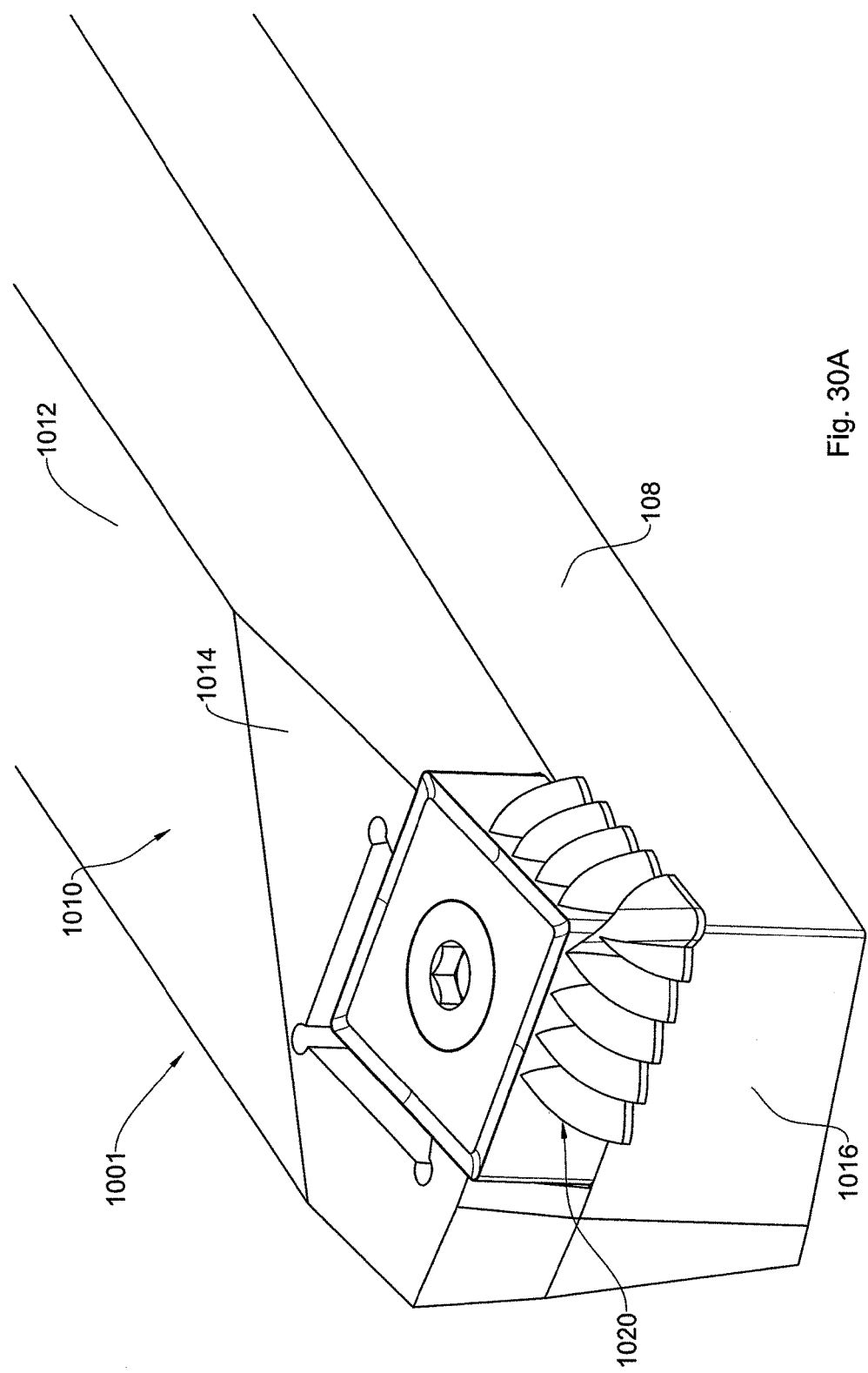
Figure 30B:
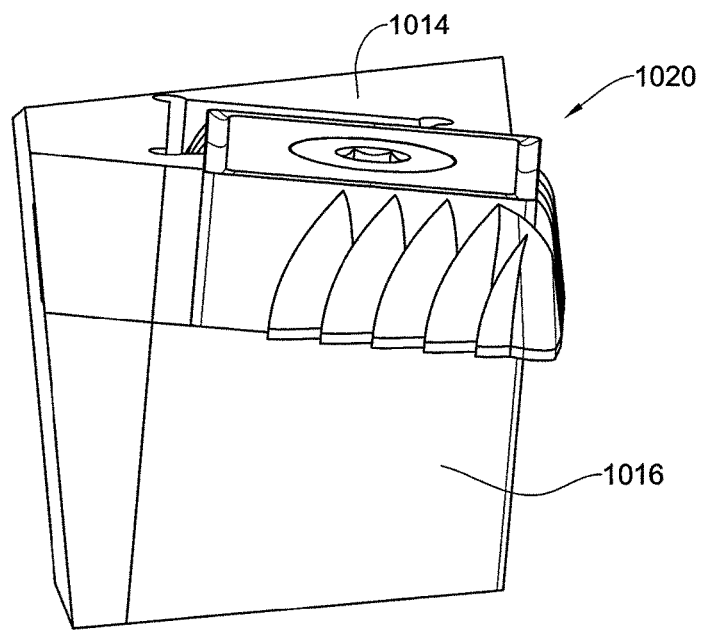
Figure 30C:
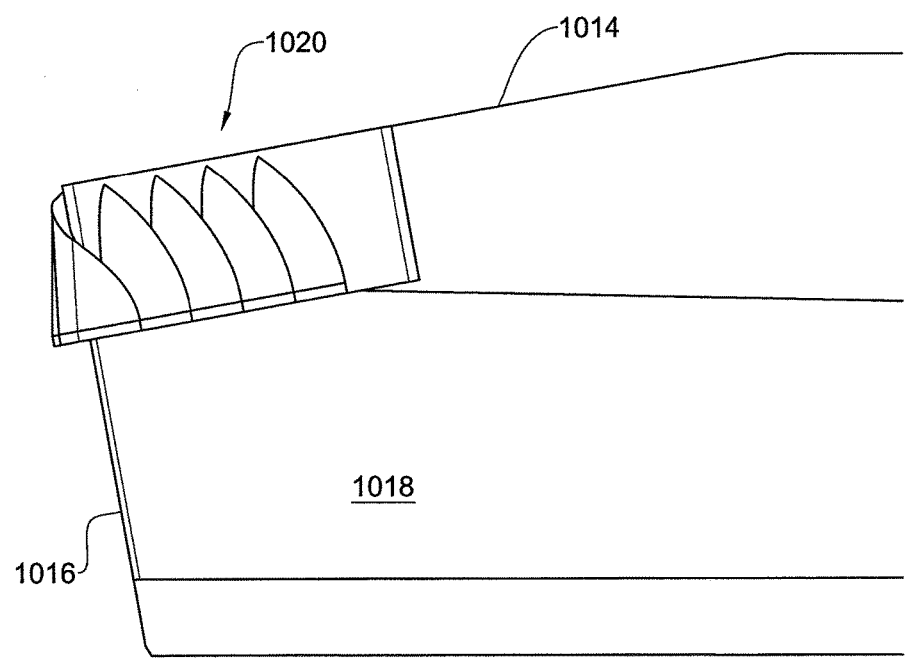
Figure 30D:
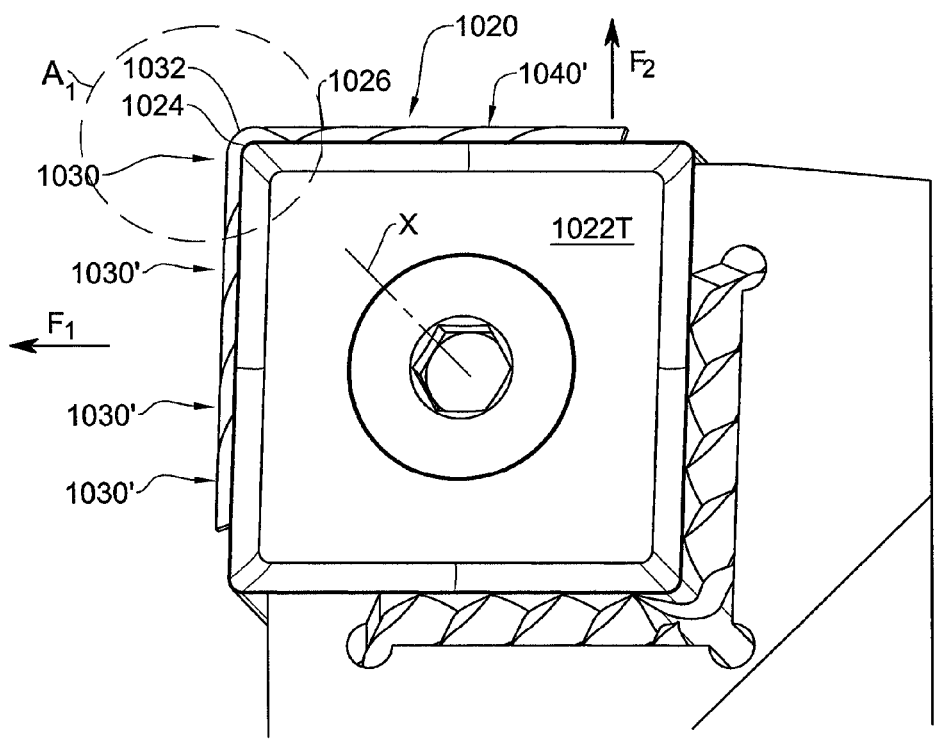
Figure 30E:
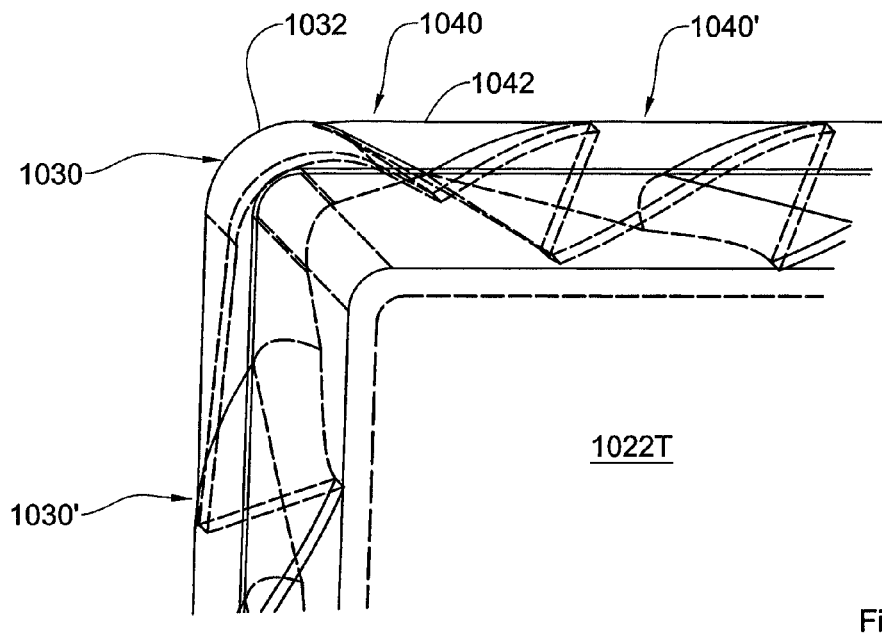

It is observed that in the top view shown in FIG. 30B, the auxiliary cutting edge 1032 and the secondary cutting edges 1032' form a combined cutting edge extending parallel to the edge formed between the top surface 1022T and the side surface 1022S.

Thus, the cutting insert 1020 is configured for a cutting operation under both a side feed and a front feed, progressing in the directions of arrows F1 and F2 respectively, thereby removing material from the workpiece along almost the entire side surface of the cutting insert 1020.

With particular attention drawn to FIGS. 27C to 27E, it is observed that, in the orientation of the cutting insert 1020 when mounted onto the cutting tool holder 1010, the end point $1032_E$ of the auxiliary cutting edge 1032 is overlapped by the secondary cutting edge 1032' of the neighboring secondary cutting element 1030'.

In addition, the end point $1032_E'$ of the secondary cutting edge is also overlapped by the secondary cutting edge 1032' of the neighboring secondary cutting element 1030'. This is true for all secondary cutting elements 1030' but the last (the most remote from the cutting corner 1027). Under the above design, the cutting edges 1030, 1030' of the cutting insert mimic a single cutting edge extending along the majority of the side surface 1022S.

With respect to all previously described cutting inserts, it is appreciated that in the orientation of the cutting insert when mounted onto the cutting tool holder (i.e. in a working position), the start points $\#33_S$ of the cutting auxiliary cutting edges do not come into contact with the workpiece as they are protected by the top surface #22T of the cutting inserts.

Thus, in effect, the chips removed from the workpiece by the cutting insert always have an additional space to flow to, since the effective starting point of the cutting is spaced from the side surface #22S of the cutting insert.

Turning now to FIG. 31, a schematic illustration of a milling insert is shown demonstrating some of the main concepts of the cutting insert of the present application. Similar to previously described turning inserts, the milling insert also comprises a front face FF, a rear face RF and a side face SF. The milling insert is further formed with a main cutting edge MCE at the intersection between the side face SF and the front face FF.

The cutting insert is provided with an auxiliary cutting element having an auxiliary cutting edge ACE having intersection points on the side face (one being visible) and extending between the front face FF and the rear face RF.

However, contrary to the previously described turning insert, the milling insert is configured for being mounted on a revolving tool for removing material from a static workpiece (not shown). As such, the geometry of the milling insert is slightly curved in order to correspond to the circular motion performed by the insert during its revolution together with the milling tool.

Nonetheless, as previously described with respect to the turning insert, the auxiliary cutting edge ACE still extends beyond the main cutting edge MCE so that the auxiliary cutting envelope AE defined by the auxiliary cutting edge ACE extends beyond the main cutting envelope AE.

In accordance with the above design, the auxiliary cutting edge ACE is configured for coming in contact with the workpiece before the main cutting edge MCE.

In principle, contrary to turning inserts, in a milling operation there is no requirement for providing a chip breaker on the cutting insert since the maximal length of a removed chip is equal to 50% of the external diameter of the milling tool. Therefore, although the auxiliary cutting element is not provided with a chip breaker, it does not clog the cutting tool and/or workpiece during the milling operation.

Attention is now drawn to FIGS. 31A to 31I, in which one example of a milling tool is shown, generally designated 1100 and comprising a cutting tool holder 1110 and a plurality of milling inserts 1120.

In principle, the milling insert 1120 is similar to the previously described turning insert 20, with the difference being in the curved geometry of the side face 1122S.

The milling insert comprises a front surface 1122F, an opposite rear surface 1122R and four side surfaces 1122S extending therebetween. Each two adjacent side surfaces 1122S are angled to one another to form therebetween a corner 1127. The milling insert 1120 is further formed with a central bore 1125 defining a central axis X of the milling insert 1120.

The milling insert 1120 is formed with four main cutting edges 1124, each main cutting edge 1124 being defined at the intersection between the front surface 1122F and the corner 1127 formed by the side surfaces 1122S. The main cutting edges 1124 are provided with a rake surface 11126 constituted by a portion of the front surface 1122F, extending along the intersection between the front surface 22F and the side surfaces 1122S.

Each corner 1127 is formed thereon with an additional cutting element 1130, protruding outwardly from the corner 1127 so as to extend beyond the main cutting edge 1124 along a plane perpendicular to the front surface 1122F and bisecting the angle of the corner 1127.

The additional cutting element 1130 extends about the corner 1127, along a direction between the front surface 1122F and the rear surface 1122R, beginning from one side surface and ending at another, so as to fully surround the corner 1127.

The additional cutting element is formed with an auxiliary cutting edge 1132 defined at the intersection between a rake surface 1136 and a relief surface 1134 of the additional cutting element 1130.

The rake surface 1136 extends generally transverse to the side surfaces 1122S and forming an intersection line 1133 therewith. The intersection line has a start point $1133_S$ at one side surface 1122S adjacent the front surface 1122F (but not on the cutting edge 1124 or on the intersection between the front surface 1122F and the side surface 1122S), and an end point $1133_E$ at the neighboring side surface, adjacent the rear surface 1122R (but not on the intersection between the rear surface 1122R and the side surface 1122S). The start point 1133S is located about 0.5 mm from the front surface 1122F along the axial direction of the milling insert 1120.

The intersection line 33 is divided into three segments, 1133a, 1133b and 1133c, the first extending along the first side surface 1122S, the second extending along the corner 1127, and the third extending along the neighboring side surface 1122S. It is observed that in the present example, the segments 33a and 33c are straight, while the middle segment 1133b is curved.

Due to the curved design of the additional cutting element 1130, it is appreciated that the segment 1133a is closer to the front surface 1122F while the segment 1133c is closer to the rear surface 1122R, with the middle segment 1133b extending therebetween.

The relief surface 1134 extends along the direction between the front surface 1122F and the rear surface 1122R, and is curved in order to fully surround the corner 1127. It is observed that, similar to the segments 1133a, 1133b, 1133c of the intersection line, the relief surface is formed with three surface portions—two planar portions at the side surfaces 1122S, and a curved portion at the corner 1127.

The auxiliary cutting edge 1132 of the additional cutting element 1130 extends, at its broadest sense, between a start and an end point which coincide with the start and end points $1133_S$, $1133_E$ of the intersection line 1133. However, contrary to the intersection line 1133 which fully lies on the side surfaces 1122S and corner 1127, the cutting edge 1132 extends beyond these surfaces and projects from the main cutting edge 1124 as can be seen in the top view of FIG. 13C.

Further, as seen in the top view of FIG. 13C, the auxiliary cutting edge is formed with a max-point $1132_M$, which is maximally distant from the main cutting edge 1124 in a top view of the milling insert 1120. In the present example, the symmetric design of the additional cutting element 1130 entails that the max-point $1132_M$ is located on the bisector of the angle of the corner 1127.

It is also observed that the auxiliary cutting edge 1132 is formed as a single curve extending about the corner and along the direction between the top and the rear surface 1122F, 1122R, thereby having a length which highly exceeds the length of the main cutting edge 1124.

In addition, the milling insert 1120 shown in the above example is an indexible milling insert, wherein during each cutting operation, one of the four cutting edges 1124 is configured for coming in contact with a workpiece (not shown). However, the milling insert 1120 is not reversible, i.e. the bottom portion of the milling insert 1120 is formed with not cutting edges.

With reference to FIG. 31E, it is observed that when the milling insert 1120 is mounted into its corresponding pocket of the milling tool holder 1110, the auxiliary cutting element 1130 protrudes beyond the envelope of the cutting edge 1124.

It is further observed in connection with FIGS. 31G to 31I, that during the milling operation, the auxiliary cutting edge 1132, having a cutting envelope $E_O$ first comes into contact with the workpiece. Below a predetermined feed, the arrangement is such that only the auxiliary cutting edge 1132 performs the milling operation. However, above said predetermined feed, both the main cutting edge 1124 and the auxiliary cutting edge 1132 take place in the milling operation, the auxiliary cutting edge 1132 coming in contact with the workpiece before the main cutting edge 1124.

In operation, when a chip is removed from the workpiece by the auxiliary cutting element it is urged towards the rear face 1122R of the milling insert 1120 and is eventually evacuated from the milling tool 1100 via a chip evacuation channel located behind the milling insert 1120. For this purpose, the bottom surface of the seat of the milling tool 1100 can be oriented at a slight angle in order to allow more room for such removed chips to flow into the chip evacuation channel.

Turning now to FIGS. 32A to 32E, another example of a milling insert is shown generally designated as 1220. The milling insert 1220 is generally similar to the previously described milling insert 1120 with the exception of several differences as described below.

The milling insert 1220 is formed with rear projections, each being defined by a slanted surface 1229 of the insert 1220 and a rear surface 1237 of the auxiliary cutting element 1230. The seat of the milling tool 1200 is formed with a corresponding surface 1217 configured for allowing the required space for the rear projection.

In addition, the auxiliary cutting element 1230 is designed such that, when mounted onto the milling tool holder 1210, the projection of the auxiliary cutting edge 1232 is equally in both the radial and the axial direction, i.e. during a milling operation, the same amount of material is removed from the bottom of the workpiece as from the side thereof.

In addition, the auxiliary cutting edge 1232 is slightly longer in comparison with that of the auxiliary cutting edge 1132 of the milling insert 1120, providing for an increased life span of the cutting insert.

Turning now to FIGS. 33A to 33E, yet another example of a milling insert is shown, generally designated 1320, and similar to previously described turning insert 20", in which the cutting edge 1332 surrounds the corner in the opposite direction.

In this case, during a milling operation, chips removed from the workpiece by the auxiliary cutting edge 1332 are not urged downwards as in the previously described milling insert 1120, but rather radially outwards.

Thus, chips are still being evacuated via chip evacuation channel of the milling tool 1300 located behind the milling insert 1320, but reach that channel via the side of the milling tool 1300 and not via the bottom thereof.

Such a milling tool 1300 can be particularly useful for performing deep milling in which the sidewalls are considerably longer/taller than the milling tool, allowing the chips more room for evacuation.

Turning now to FIGS. 34A to 34E, still another example of a milling tool is shown, generally designated as 1400 and comprising a plurality of milling inserts 1420.

Contrary to the previously described milling inserts, the milling inserts 1420 are tangential milling inserts in the sense that the orientation of the milling insert 1420 on the milling tool 1400 is such that the broad side thereof faces in the radial direction. In other words, the front surface 1422T and the rear surface 1422B are of considerably surface area than the side surfaces 1422S. This allows increasing the sustainability of the milling insert 1420 and its resistance to withstanding loads applied thereto during the milling operation.

Similarly to the previously described milling inserts 1120 and 1220, chips removed during a milling operation are pushed downwards and towards the rear of the milling insert 1420 to be evacuated via a chip evacuation channel located behind the milling insert 1420.

Turning now to FIGS. 35A to 35F, in which another example of a milling tool is shown, generally designated as 1500 and comprising a plurality of milling inserts 1520.

Each of the milling inserts 1520 is formed with an auxiliary cutting element 1530 which is essentially similar to the auxiliary cutting element 230 previously described with respect to FIGS. 18A to 18G and is formed with an inner cutting edge 1532i and an outer cutting edge 1532o.

Each of the main cutting edge 1524, inner cutting edge 1532i and outer cutting edge 1532o is configured for removing 0.3 mm of material, providing the milling tool 1500 with the ability to remove 0.9 mm of material from the workpiece in total, making it very suitable for surface milling.

Turning now to FIGS. 36A to 36F, in which still another example of a milling tool is shown generally designated as 1600 and comprising a plurality of milling inserts 1620.

Each of the milling inserts 1620 is formed with a plurality of auxiliary cutting elements 1530 on each of the side surfaces 1622S forming the corner, which is essentially similar to the cutting insert 1020 previously described with respect to FIGS. 28A to 28H.

It is observed that the seat of the cutting tool holder 1610 is formed with a base surface 1612 and chip evacuation flutes 1615 at its side surface configured for forming a continuation of the auxiliary cutting elements 1630. Thus, chips removed from the workpiece during a milling operation and removed via the chip evacuation flutes formed between the auxiliary cutting elements 1630 can progress, uninterruptedly to the chip evacuation flutes 1615 to eventually be evacuated from the milling tool 1600.

FIG. 36G illustrates a mold for the manufacture of the milling insert 1620 described above and comprises a male member 1680 and a female member 1690. It is also observed that the cutting insert 1620 is formed with a straight portion at the rear end thereof allowing it to compensate of deficiency in material placed within the press mold. Respectively, both the male and the female members 1680, 1690 are formed with straight portions at their ends (not conical). Thus, if not enough material placed the female member 1690 of the mold, the male member 1680 is allowed to displace deeper into the female member 1690 without getting stuck and without forming surface contact between the mold members. As a result, the milling insert 1620 may turn out to be slightly thinner than originally planned, but not to a sufficient amount so as to damage its functional characteristics.

Turning now to FIGS. 37A to 37E, yet another example of a milling tool is shown, generally designated 1700 and comprising a milling tool holder 1710 and a plurality of milling inserts 1720.

The milling insert 1720 is generally similar to previously described turning insert 920, and, contrary to the milling insert 1620, is formed with a plurality of auxiliary cutting elements 1730 only on one portion of the side face 1722S of the milling insert 1720.

FIG. 37F shows a press mold for the manufacture of the milling insert 1720 comprising a male member 1780 and a female member 1790 and is essentially similar to the press mold of the milling insert 1620.

Turning now to FIGS. 38A to 38F, still another milling tool is shown generally designated 1800 and comprising a milling tool holder 1810 and a plurality of milling inserts 1820.

The milling insert 1820 is generally similar to previously described milling inserts 1120, 1220 and 1320, with the difference being in the curvature radius of the auxiliary cutting edge 1832 of the auxiliary cutting element. Specifically, the curvature radius is such that allows the milling insert 1820 to remove an almost right-angle corner within the workpiece.

Attention is now drawn to FIG. 39, in which a schematic illustration of a drilling tool is shown demonstrating some of the main concepts of the drilling tool of the present application. The drilling tool also comprises a front face FF, a rear face RF and a side face SF. The drilling tool is further formed with a main cutting edge MCE at the intersection between the side face SF and the front face FF.

It is observed that the geometry of the drilling tool is circular as opposed to the straight/slightly curved geometry of the turning and milling inserts respectively. However, the drilling tool still comprises all the essential features previously described.

Specifically, the drilling tool is provided with an auxiliary cutting element having an auxiliary cutting edge ACE having intersection points on the side face (one being visible) and extending between the front face FF and the rear face RF.

In accordance with the above design, the auxiliary cutting edge ACE is configured for coming in contact with the workpiece before the main cutting edge MCE.

Turning now to FIGS. 39A to 39G, an integral drilling tool is shown being generally designated 2100 and formed with a main cutting portion 2120 having a main edge 2124 and an auxiliary cutting element 2130 formed with an auxiliary cutting edge 2132.

With particular reference to FIG. 39B, it is observed that the auxiliary cutting element 2130 is essentially similar to previously described cutting elements in connection with the turning and milling inserts, with the difference being it extending circularly around the main axis X of the drilling tool 2100. The drilling tool 2100 shown in FIG. 39B is shown one step prior to its final manufacture.

Turning now to FIG. 39C, during a final stage of manufacture of the drilling tool 2100, an auxiliary circular channel is carved at the side face of the drilling tool 2100 so as to form the rake surface 2136 of the auxiliary cutting element 2130. The auxiliary channel provides for additional space for the chips removed from the workpiece to flow into the chip evacuation flute 2116 during a drilling operation.

Attentions is further drawn to FIGS. 40A to 40I showing the drilling tool 2100 when received within a workpiece WP demonstrating various stages of the drilling operation. It is observed that in FIG. 40A, the main cutting edge 2124 still has not reached the corner of the workpiece. In this position, both the main and the auxiliary cutting edges 2124 and 2132 respectively are not in contact with the shown corner of the workpiece WP.

Figure 40A:
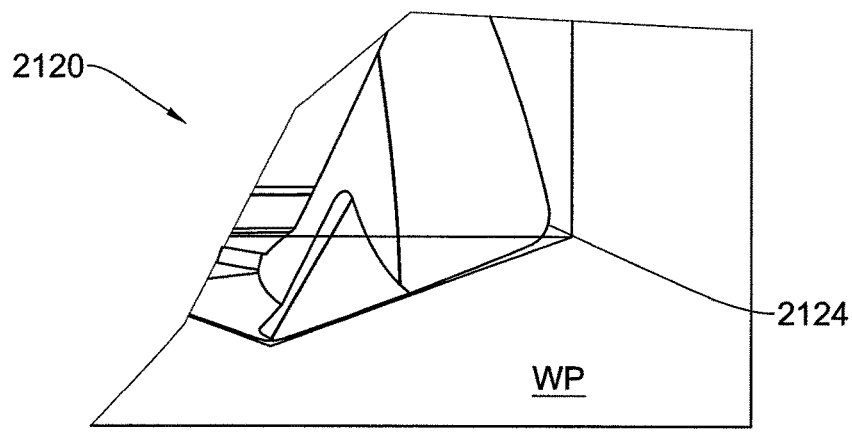
Figure 40B:
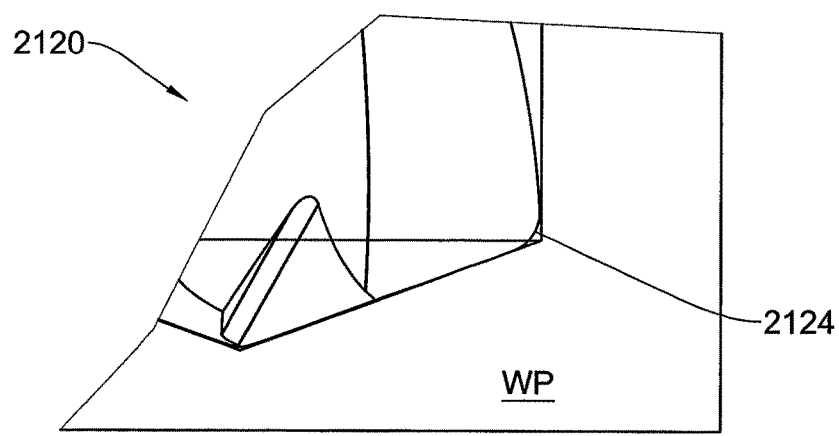
Figure 40C:
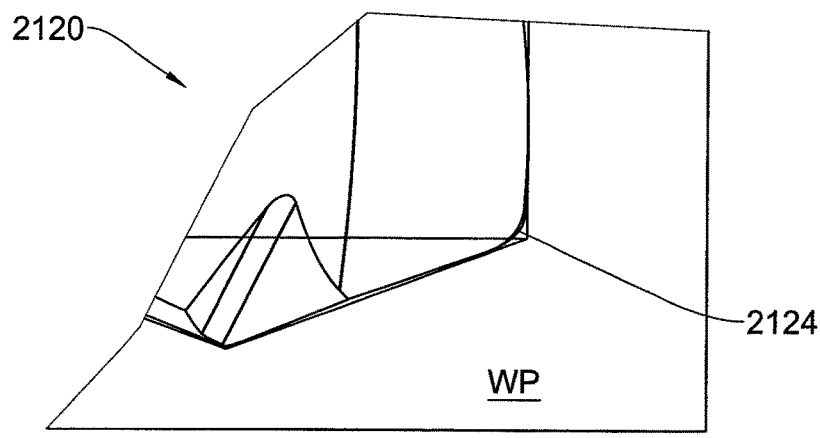
Figure 40D:
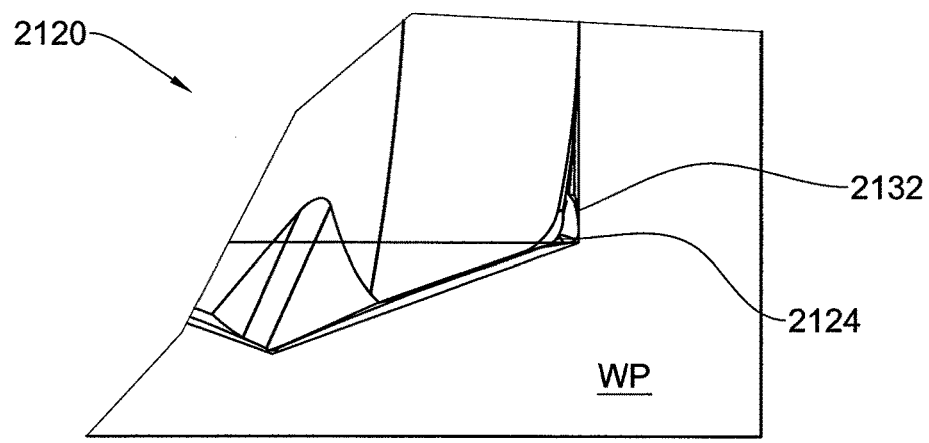
Figure 40E:
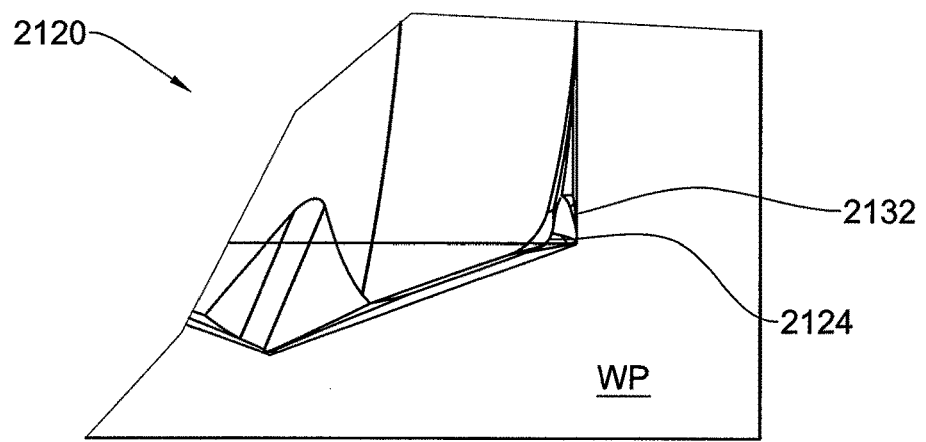
Figure 40F:
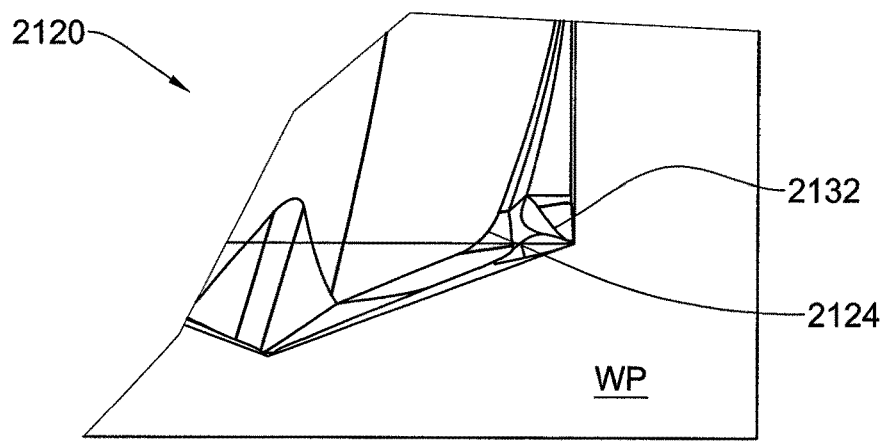

As the drilling tool rotates, the main cutting edge 2124 of radius 1.25 mm removes material from the side/bottom of the workpiece WP as shown in FIG. 40B, leaving therein a filleted corner of a considerable radius.

Thereafter, as shown in FIGS. 40C to 40F, the auxiliary cutting element 2130 begins carving away the remainder of the filleted corner by the auxiliary cutting edge 2132. Chips removed by this operation are urged downwards and backwards and are evacuated through the chip evacuation flute 2116 located behind the auxiliary element 2130.

Figure 40G:
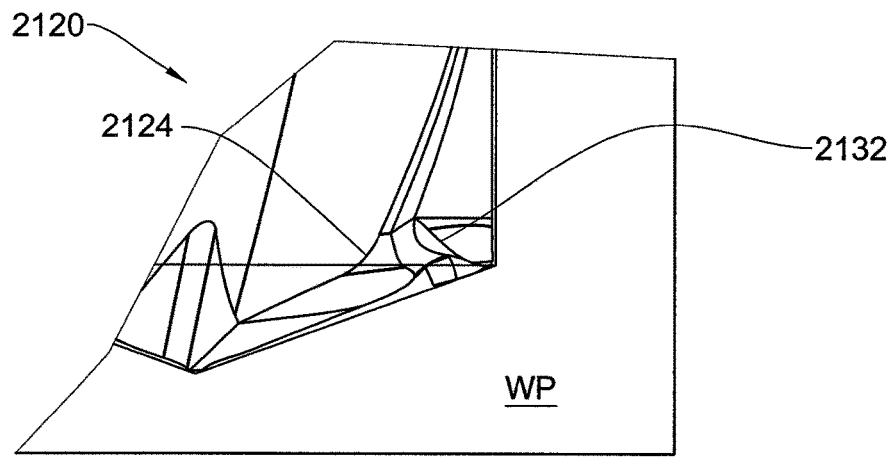
Figure 40H:
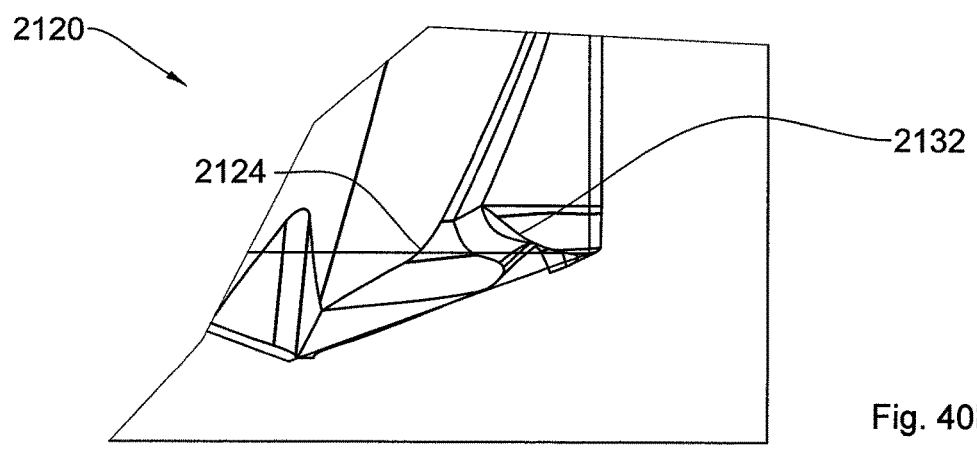
Figure 40I:
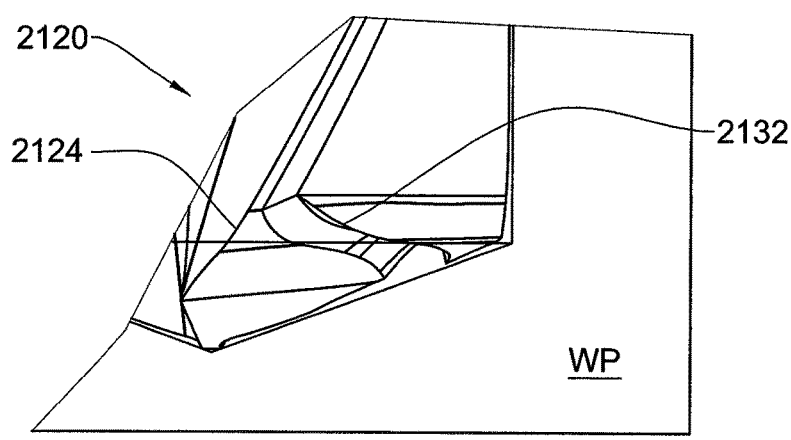

As seen in FIGS. 40G to 40I, when the drilling tool continues revolving in the same direction, the auxiliary cutting edge 2132 removed the remainder of the chips leaving a corner of a considerably smaller radius than 1.25 mm created by the main cutting edge 2124.

It is also observed that when the auxiliary cutting edge 2132 first comes into contact with the workpiece WP, it encounters a considerably large amount of material to be removed and therefore the angle of the rake surface 2136 at the front end of the auxiliary cutting element 2130 is of a greater angle than at the rear end of the auxiliary cutting element 2130. Nonetheless, throughout the entire cutting element 2130, the auxiliary cutting edge 2132 maintains a positive angle allowing it to safely remove material from the workpiece WP.

Turning now to FIGS. 41A to 41E, another example of an integral drilling tool is shown being generally designated 2200 and formed with a main cutting portion 2220 having a main edge 2224 and an auxiliary cutting element 2230 formed with an auxiliary cutting edge 2232.

With particular reference to FIG. 41C, it is observed that the auxiliary cutting element 2230 is essentially similar to previously described drilling tool 2100, with the difference being that the auxiliary cutting element 2230 is configured for urging removed chips in an upwards direction rather than downwards.

Turning now to FIG. 41B, during a final stage of manufacture of the drilling tool 2200, an auxiliary circular channel is carved at the side face of the drilling tool 2200 so as to form the rake surface 2236 of the auxiliary cutting element 2230. The auxiliary channel provides for additional space for the chips removed from the workpiece to flow into the chip evacuation flute 2216 during a drilling operation.

Attentions is further drawn to FIGS. 42A to 42H showing the drilling tool 2200 when received within a workpiece WP demonstrating various stages of the drilling operation.

Figure 42A:
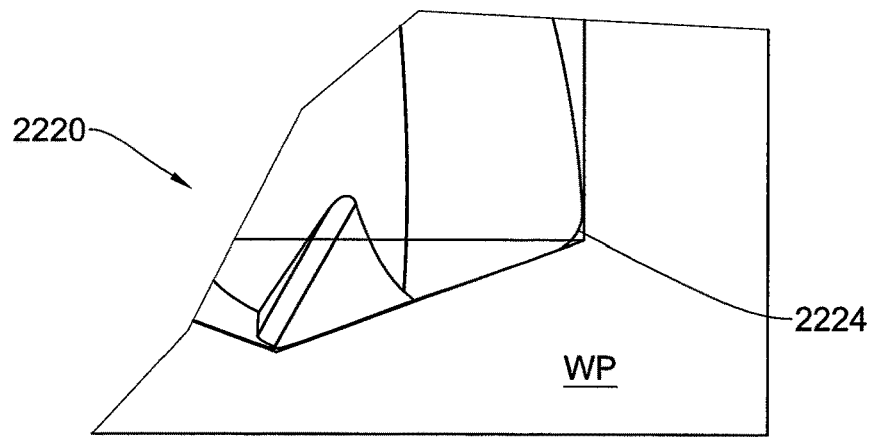

As the drilling tool rotates, the main cutting edge 2224 removes material from the side/bottom of the workpiece WP as shown in FIG. 42A, leaving therein a filleted corner of a considerable radius.

Figure 42B:
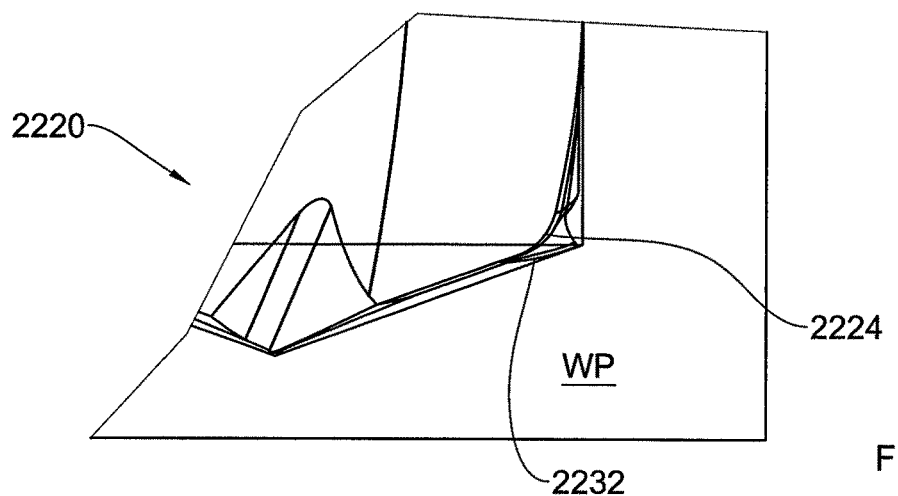
Figure 42C:
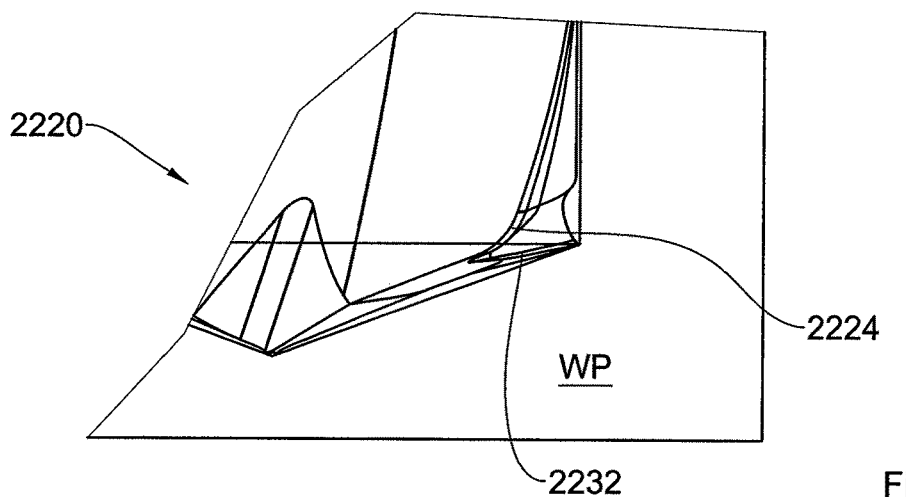
Figure 42D:
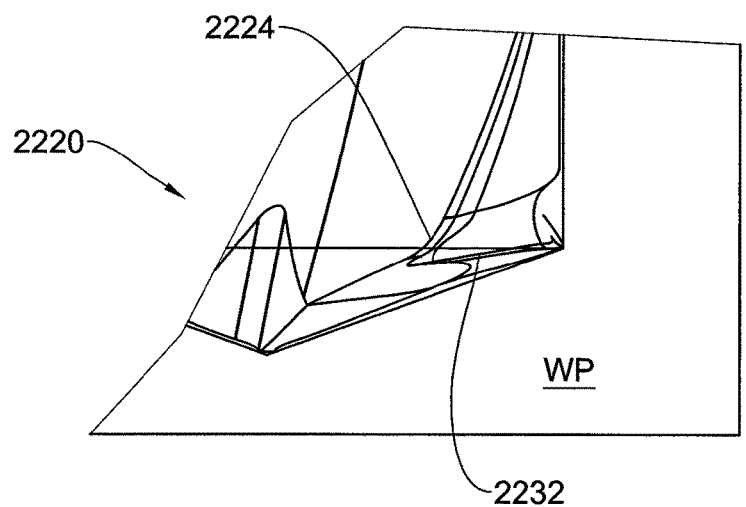
Figure 42E:
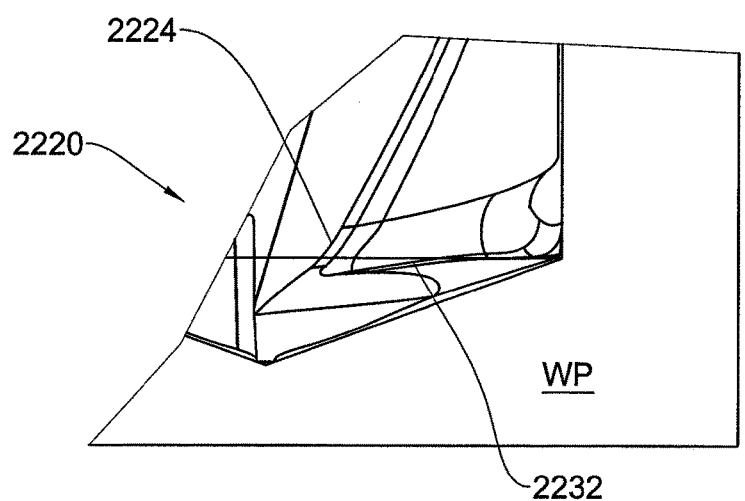
Figure 42F:
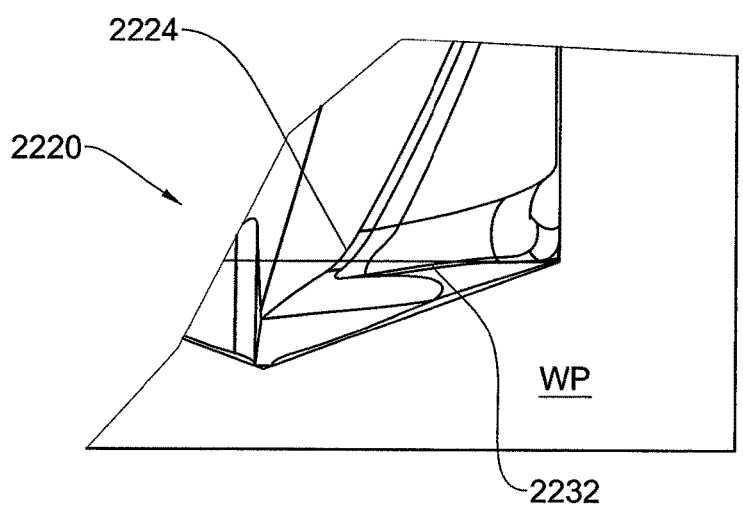
Figure 42G:
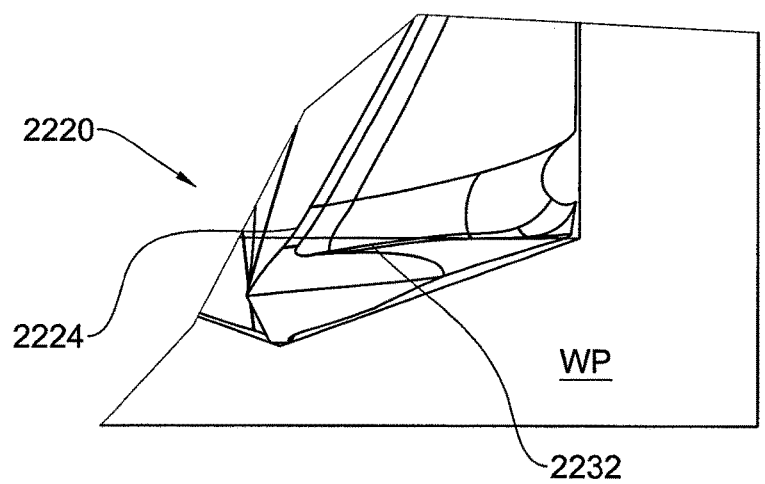
Figure 42H:
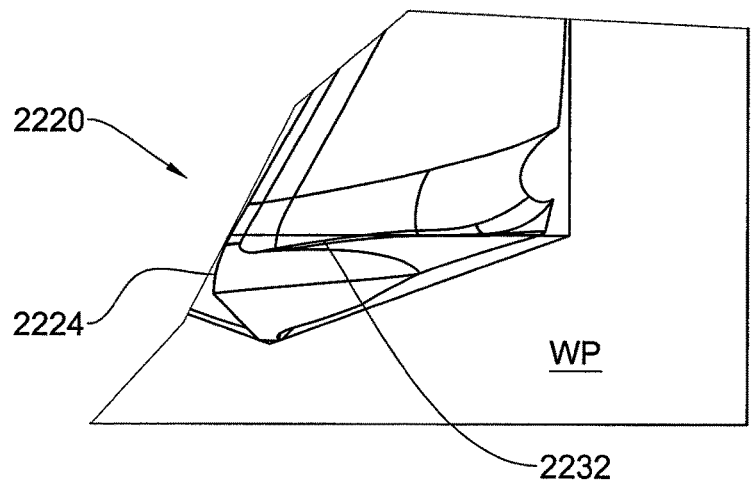

Thereafter, as shown in FIGS. 42B to 42D, the auxiliary cutting element 2230 begins carving away the remainder of the filleted corner by the auxiliary cutting edge 2232. Chips removed by this operation are urged upwards and backwards and are evacuated through the chip evacuation flute 2216 located behind the auxiliary element 2230.

As seen in FIGS. 42E to 42H, when the drilling tool continues revolving in the same direction, the auxiliary cutting edge 2232 removed the remainder of the chips leaving a corner of a considerably smaller radius than that created by the main cutting edge 2224.

It is also observed that when the auxiliary cutting edge 2232 first comes into contact with the workpiece WP, it encounters a considerably large amount of material to be removed and therefore the angle of the rake surface 2236 at the front end of the auxiliary cutting element 2230 is of a greater angle than at the rear end of the auxiliary cutting element 2230. Nonetheless, throughout the entire cutting element 2230, the auxiliary cutting edge 2232 maintains a positive angle allowing it to safely remove material from the workpiece WP.

Attention is now drawn to FIGS. 43A to 64F in which several cutting tools according to one aspect of the subject matter of the present application are described. As will be explained in detail later and based on the above described method of design of a cutting edge with respect to FIGS. 1 to 12B, it is appreciated that the non-standard cutting edges described hereinafter can be designed based on the above described method.

With particular reference to FIGS. 43A to 43E, a rotary cutting tool is shown, generally designated as Y1 and comprising a holder portion Y10 having a central axis X and a cutting section P formed with a front cutting portion Y20, an intermediate cutting portion Y30 and a rear cutting portion Y40.

The cutting tool 1 (as well as further examples) are drills or configured to perform an operation similar to that of a drill. As such, all have a radial cutting edge extending from the central axis X to the periphery of the cutting tool (not indicated). However, since the subject matter of the present application lies in the design of the peripheral cutting area, the radial cutting edge will not be discussed in detail and the tools are to be understood to comprise such a radial cutting edge unless otherwise indicated.

Each of the cutting portions Y20, Y30 and Y40 is formed with a respective cutting edge Y22, Y32, Y42 defined between respective rake surfaces Y24, Y34, Y44 and relief surfaces Y26, Y36, Y46.

The cutting tool Y1 is configured to revolve about the central X and coming in contact with a workpiece WP (not shown) in order to remove material therefrom in order to form therein a recess having an angle θ.

It is observed that the front cutting portion Y20, and in particular the front cutting edge Y22 is divided into three segments:
  Y22a defined between segment Y24a of the rake surface and segment Y26a of the relief surface;

Y22*b* defined between segment Y24*b* of the rake surface and segment Y26*b* of the relief surface; and Y22*c* defined between segment Y24*c* of the rake surface and segment Y26*c* of the relief surface;

The cutting section Y22*a* is configured for removing material from a surface A of the workpiece WP transverse to the central axis X (also referred herein as a bottom surface), the cutting section Y22*c* is configured for removing material from a surface of the workpiece WP coextending with the central axis X (also referred herein as a side surface) and cutting section Y22*b* is an intermediate section configured for forming a fillet of radius R between the surfaces A and B of the workpiece WP.

Material removed from the workpiece by the front cutting portion Y20 is referred herein as a 'primary chip' and is configured for being evacuated from the cutting segment P via evacuation flutes Y16 spirally extending about the central axis X.

The intermediate cutting portion Y30 is a side cutting portion, i.e. the cutting edge Y32 is configured for removing additional material from surface B of the workpiece WP. As will be discussed in detail with reference to FIGS. 2A to 2H, the operation of the cutting edge Y32 is not configured for removing material from the workpiece WP, but rather for parting a portion of the material of the workpiece which will eventually be removed by the rear cutting portion Y40.

In other words, as opposed to the cutting portion Y20, the cutting portion Y30 only forms a generally vertical slit within the material of the workpiece, leaving a splinter-like extension of the material still attached to the workpiece.

The cutting portion Y40 is a bottom cutting portion, i.e. the cutting edge Y42 is configured for removing material from surface A of the workpiece WP. In particular, the cutting edge Y42 is configured for forming another, generally horizontal slit within the material of the workpiece, configured to detach the splinter-like extension from the workpiece, leaving a corner of angle θ as required. The removed extension is referred herein as a 'secondary chip'.

The intermediate cutting portion Y30 and the rear cutting portion Y40 are separated from one another via a chip channel Y50 extending from the relief surface Y26 of the front cutting portion to the trail end of the rear cutting edge Y42. The arrangement is such that the chip channel Y50 is configured for accommodating the secondary chip during rotation of the cutting tool Y1 (while still attached to the workpiece), i.e. providing the required space for the intermediate and rear cutting portions Y30, Y40 to displace about the secondary chip.

The secondary chip is eventually evacuated from the cutting segment P via a chip evacuation flute located behind the cutting segment P, i.e. the chip evacuation flute Y16 located subsequently after the chip evacuation flute Y16 through which the primary chip is evacuated.

It is appreciated that the above described is valid for a situation in which the cutting tool revolves in place, i.e. without axial or lateral feed. When feed is applied, one of the intermediate portion Y30 and the rear portion Y40 may encounter the splinter-like extension at a location below or to the side thereof, thereby not completely detaching it from the workpiece. However, even in this position, the attachment of the splinter-like extension to the workpiece is so frail that friction forces between the cutting tool Y1 and the splinter-like extension (secondary chip) are sufficient for detaching it from the workpiece. It is appreciated that even if the splinter-like extension is not detached from the workpiece, in the next revolution of the cutting tool it will be completely removed.

The successive stages of the cutting operation performed by the cutting tool Y1 will now be discussed in detail with respect to FIGS. 44A to 44H. The cutting tool Y1 is shown from a front view and is shown during a CCW revolution about the central axis (i.e. progressing from left to right in the front view).

At first (FIG. 44A), the front portion Y20 of the cutting tool Y1 encounters the workpiece so that the segments Y22*a*, Y22*b* and Y22*c* of the cutting edge Y22 begin to remove material from the workpiece along the filleted contour thereof. At this point, the workpiece is only in contact with the front cutting portion Y20 while the intermediate and rear cutting portions Y30, Y40 are out of contact with the workpiece, at least not with the region cut by the front cutting portion Y20 (i.e. may be in contact with other regions of the workpiece).

As the cutting tool Y1 continues to revolve (FIG. 44B), the primary chip PC is gradually removed from the workpiece and the intermediate cutting portion Y30 begins approaching the workpiece, though still not in contact therewith.

Figure 44C:
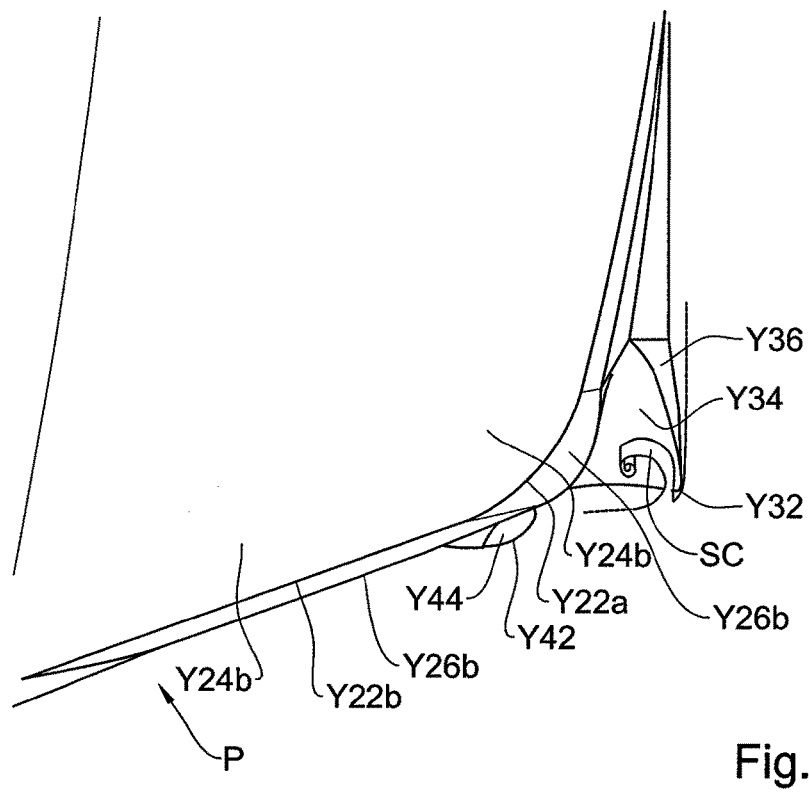
Figure 44D:
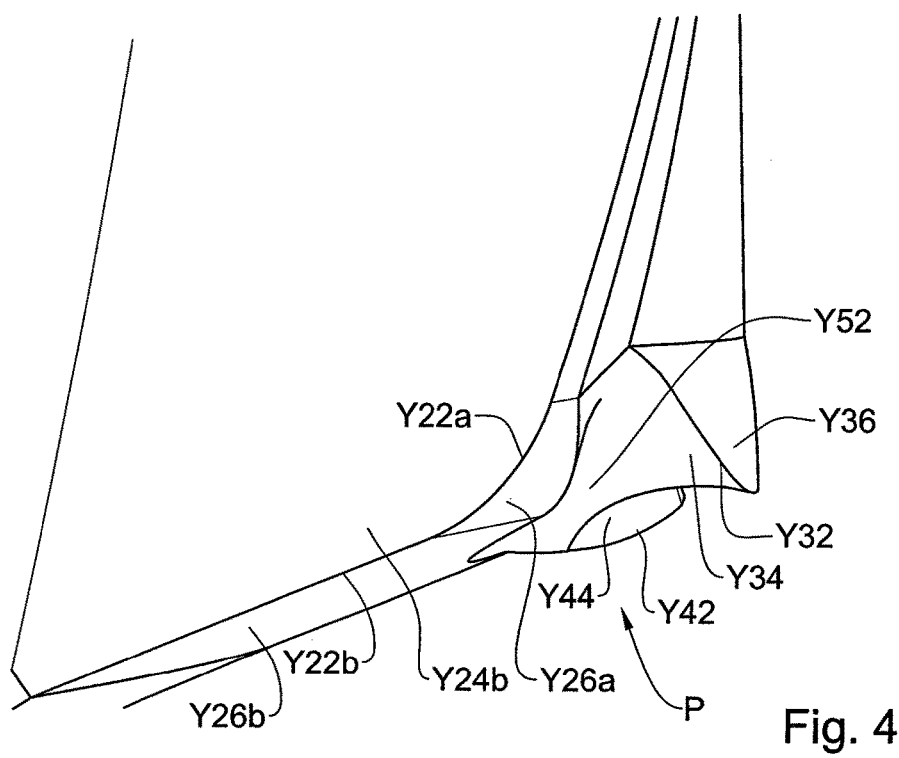
Figure 44E:
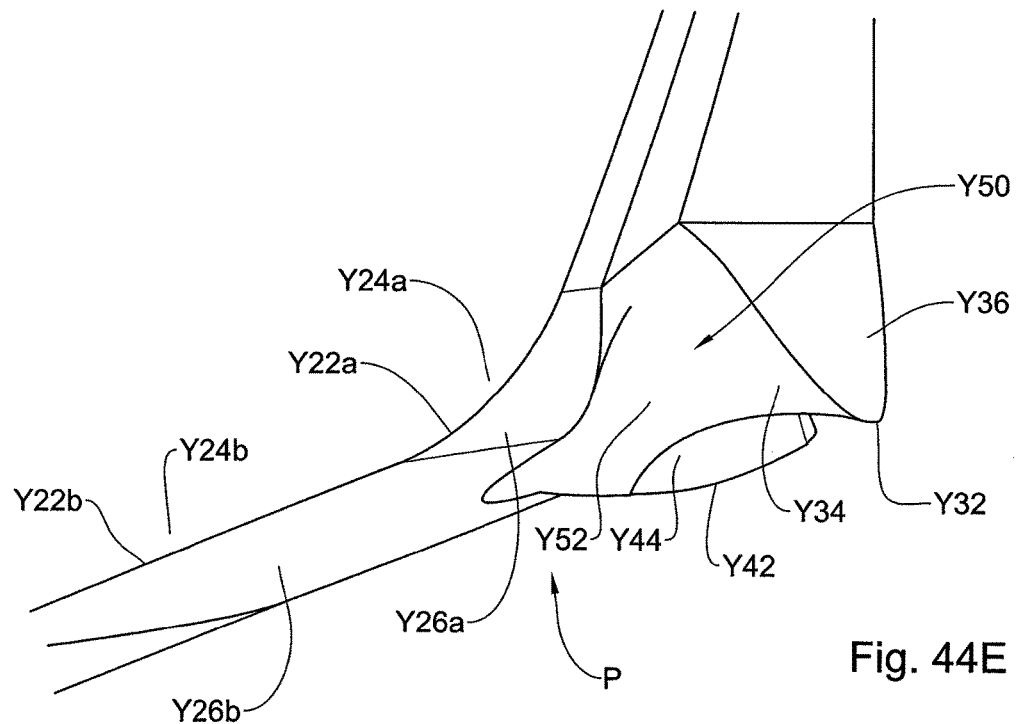

As shown in FIG. 44C, the cutting edge Y32 of the intermediate cutting portion Y30 begins forming a slit t within the workpiece WP, beginning to peel off a secondary chip SC from the workpiece. It is noted that at this point, the secondary chip SC is still attached to the workpiece.

As the cutting tool Y1 continues to revolve (FIGS. 44D, 44E), the intermediate cutting portion Y30 gradually exits the workpiece while the rear cutting portion Y40 approaches the workpiece WP but still not in contact therewith. At this point, the secondary chip SC (not shown) is urged into the chip channel Y50 between the cutting portions Y30, Y40. Specifically, it can also be viewed as follows: since the secondary chip SC is still attached to the workpiece, the cutting tool Y1 simply revolves around it while it remains in place.

Figure 44F:
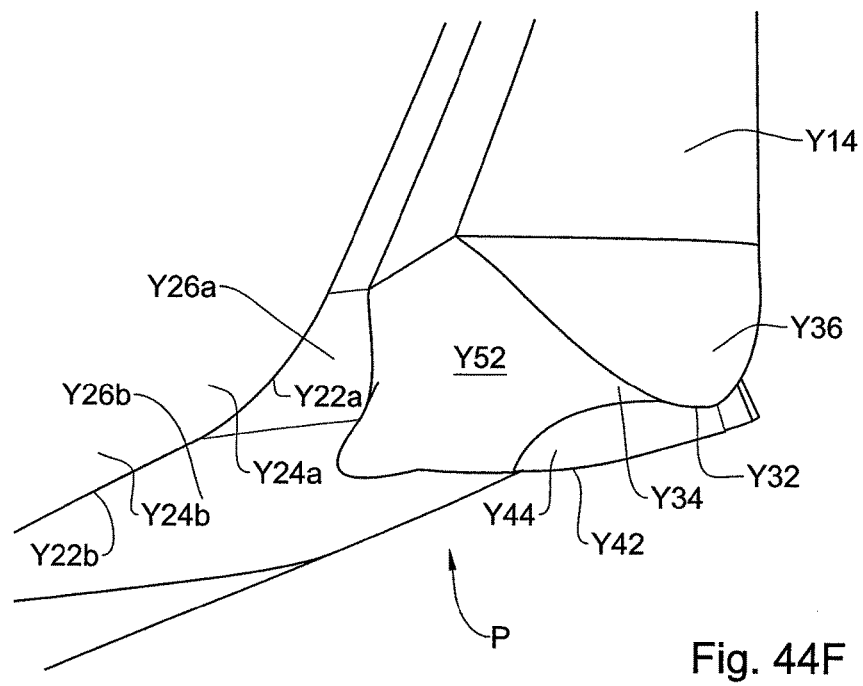
Figure 44G:
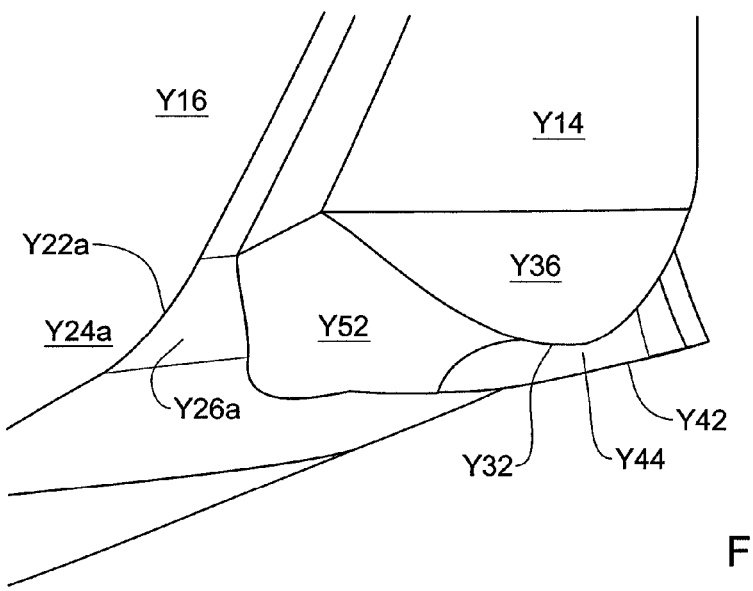
Figure 44H:
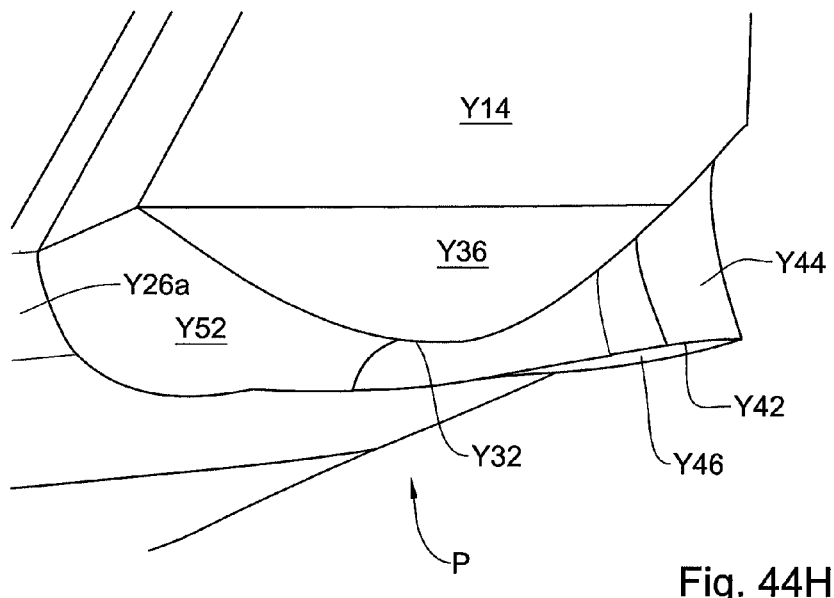

Turning now to FIGS. 44F to 44H, further revolution of the cutting tool Y1 about the central axis X brings the rear cutting portion Y40 and the cutting edge Y42 into contact with the workpiece in order to completely detach the secondary chip SC from the workpiece WP. As a result of revolution of the cutting tool Y1, the secondary chip SC is urged through the chip channel Y50 and from there to the chip evacuation flute Y16 located behind the rear portion Y40.

An additional reference to the stages of operation will be provided with respect to FIGS. 46A to 46H and 48A to 48K.

Turning now to FIGS. 45A to 45D, another example of a cutting tool is shown, generally designated Y1' and comprising a holder portion Y10' having a central axis X and a cutting section P formed with a front cutting portion Y20', an intermediate cutting portion Y30' and a rear cutting portion Y40'.

Similarly to cutting tool Y1, each of the cutting portions Y20', Y30' and Y40' is formed with a respective cutting edge Y22', Y32', Y42' defined between respective rake surfaces Y24', Y34', Y44' and relief surfaces Y26', Y36', Y46'.

Similarly to cutting tool Y1, the front cutting portion Y20', and in particular the front cutting edge Y22' is divided into three segments:

Y22*a*' defined between segment Y24*a*' of the rake surface and segment Y26*a*' of the relief surface;

Y22*b*' defined between segment Y24*b*' of the rake surface and segment Y26*b*' of the relief surface; and Y22*c*' defined between segment Y24*c*' of the rake surface and segment Y26*c*' of the relief surface;

The cutting section Y22a' is configured for removing material from a surface A of the workpiece WP transverse to the central axis X (also referred herein as a bottom surface), the cutting section Y22c' is configured for removing material from a surface of the workpiece WP coextending with the central axis X (also referred herein as a side surface) and cutting section Y22b' is an intermediate section configured for forming a fillet of radius R between the surfaces A and B of the workpiece WP.

However, contrary to the cutting tool Y1, in the cutting tool Y1', the intermediate cutting portion Y30' is configured for removing material from surface A of the workpiece WP. As will be discussed in detail with reference to FIGS. 45A to 45H, the operation of the cutting edge Y32' is not configured for removing material from the workpiece WP, but rather for parting a portion of the material of the workpiece which will eventually be removed by the rear cutting portion Y40'.

In other words, as opposed to the cutting portion Y20', the cutting portion Y30' only forms a generally horizontal slit within the material of the workpiece, leaving a splinter-like extension of the material still attached to the workpiece.

The cutting portion Y40' is a bottom cutting portion, i.e. the cutting edge Y42' is a side cutting portion, i.e. the cutting edge Y42' is configured for removing additional material from surface B of the workpiece WP.

In particular, the cutting edge Y42' is configured for forming another, generally vertical slit within the material of the workpiece, configured to detach the splinter-like extension from the workpiece, leaving a corner of angle θ as required.

The intermediate cutting portion Y30' and the rear cutting portion Y40' are separated from one another via a chip channel Y50' extending from the relief surface Y26' of the front cutting portion to the trail end of the rear cutting edge Y42'. The arrangement is such that the chip channel Y50' is configured for accommodating the secondary chip during rotation of the cutting tool Y1 (while still attached to the workpiece), i.e. providing the required space for the intermediate and rear cutting portions Y30', Y40' to displace about the secondary chip.

The successive stages of the cutting operation performed by the cutting tool Y1' will now be discussed in detail with respect to FIGS. 45A to 45H. The cutting tool Y1' is shown from a front view and is shown during a CCW revolution about the central axis X (i.e. progressing from left to right in the front view).

In principle, the stages of operation of the cutting tool Y1' are similar to the stages previously shown in FIGS. 44A to 44H, with the difference being that following removal of the primary chip PC by the front cutting portion Y20', the secondary chip SC (not shown) is formed by the bottom cutting portion Y30' and then completely removed by the rear, side portion Y40' as explained below:

At first (FIG. 45A), the front portion Y20' of the cutting tool Y1' encounters the workpiece so that the segments Y22a', Y22b' and Y22c' of the cutting edge Y22' begin to remove material from the workpiece along the filleted contour thereof. At this point, the workpiece is only in contact with the front cutting portion Y20' while the intermediate and rear cutting portions Y30', Y40' are out of contact with the workpiece.

As the cutting tool Y1' continues to revolve (FIG. 45B), the primary chip PC is gradually removed from the workpiece and the intermediate cutting portion Y30' begins approaching the workpiece, though still not in contact therewith.

As shown in FIG. 45C, the cutting edge Y32' of the intermediate cutting portion Y30' begins forming a slit t (not shown) within the workpiece WP, beginning to peel off a secondary chip SC from the workpiece. It is noted that at this point, the secondary chip SC is still attached to the workpiece.

As the cutting tool Y1' continues to revolve (FIGS. 45D, 45E), the intermediate cutting portion Y30' gradually exits the workpiece while the rear cutting portion Y40' approaches the workpiece WP but still not in contact therewith. At this point, the secondary chip SC (not shown) is urged into the chip channel Y50' between the cutting portions Y30', Y40'.

Turning now to FIGS. 45F to 45H, further revolution of the cutting tool Y1' about the central axis X brings the rear cutting portion Y40' and the cutting edge Y42' into contact with the workpiece in order to completely detach the secondary chip SC from the workpiece WP. As a result of revolution of the cutting tool Y1', the secondary chip SC is urged through the chip channel Y50' and from there to the chip evacuation flute Y16 located behind the rear portion Y40'.

Turning now to FIG. 45, another example of a cutting tool is shown, generally designated Y1" and being of similar design to cutting tool Y1' previously described. One of the differences between the cutting tool 1" and the cutting tool Y1' lies in the angles of the cutting portions Y30" and Y40".

In particular, the cutting edge Y32" is defined between the rake surface Y34" and the relief surface Y36" defining therebetween an angle α and the cutting edge Y42" is defined between the rake surface Y44" and the relief surface Y46" defining therebetween an angle β. The angles α and β are not constant throughout the cutting portions Y30", Y40" respectively, but rather gradually decrease between a lead end of the cutting edge and a trail end of the cutting edge.

With particular reference to FIGS. 48A to 48K, cross-sectional views of the cutting tool Y1" are shown during operation thereof, denoting the change in the angles α and β at each cross-section during revolution of the cutting tool Y1".

Figure 48A:
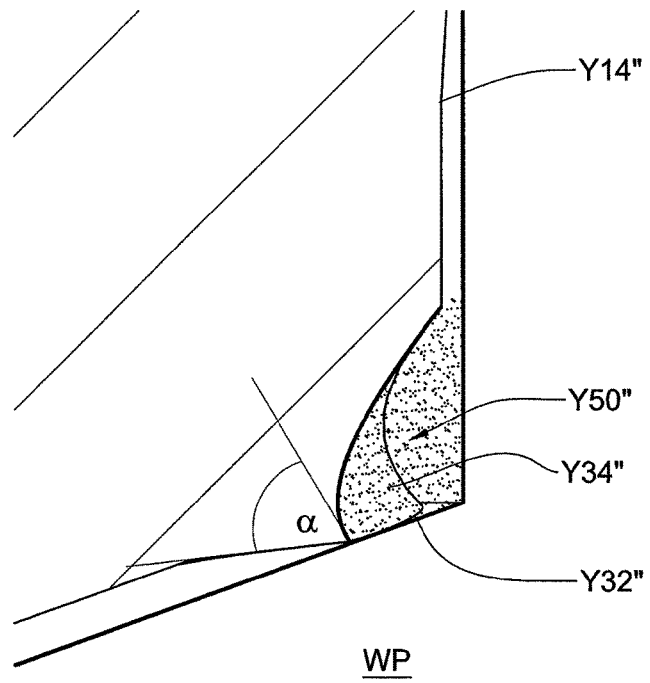
Figure 48B:
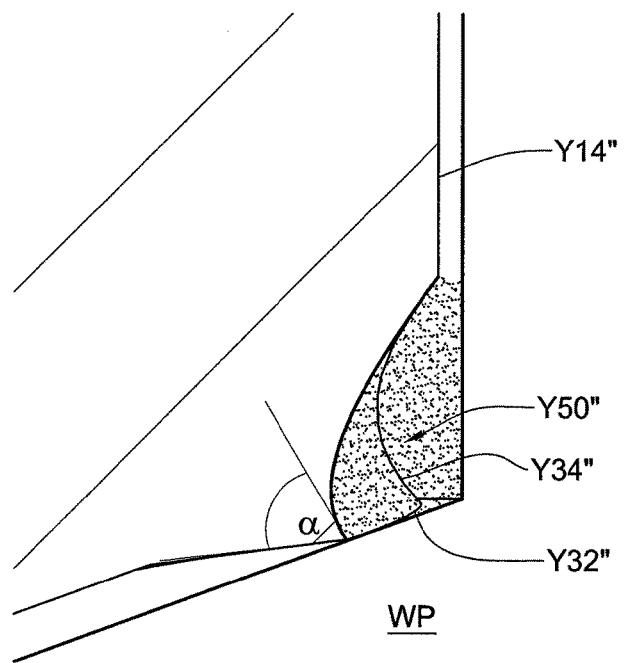
Figure 48C:
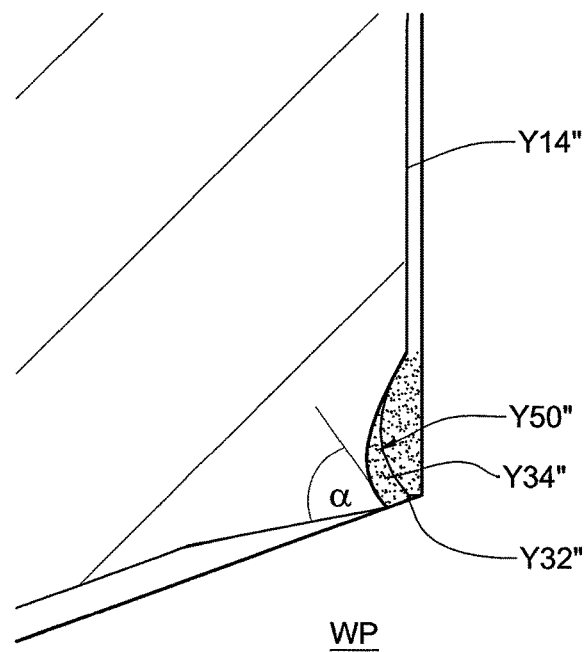
Figure 48D:
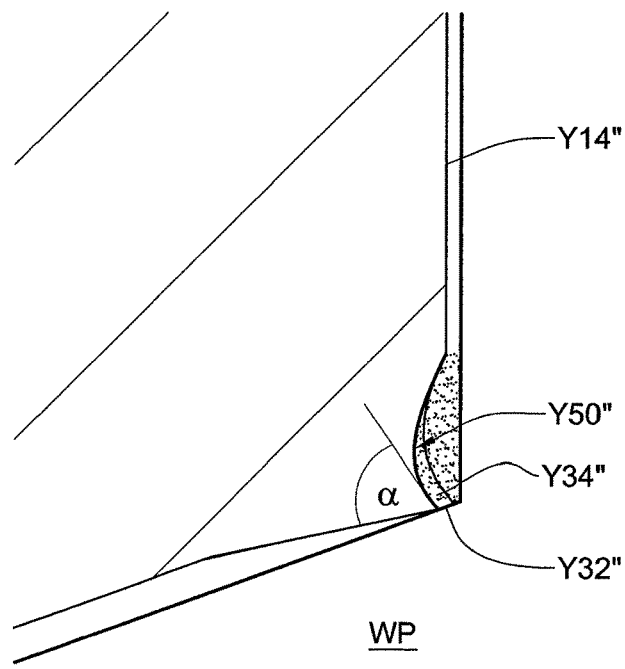
Figure 48E:
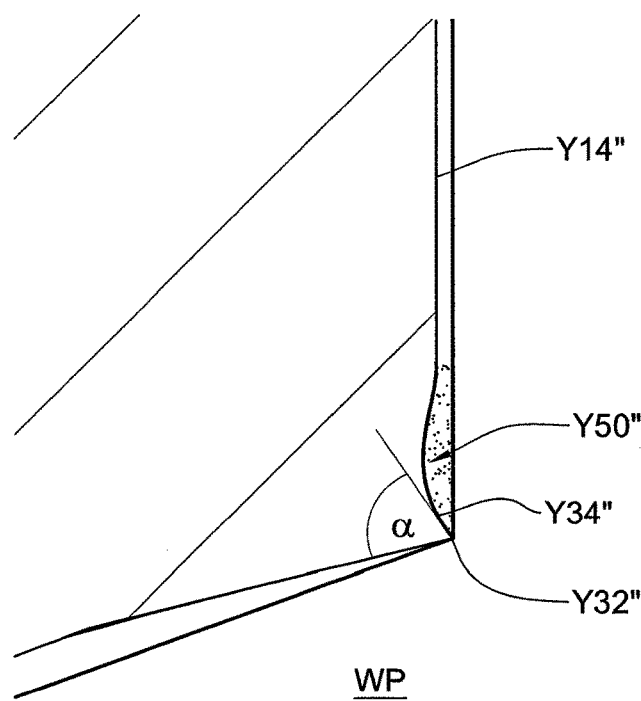
Figure 48F:
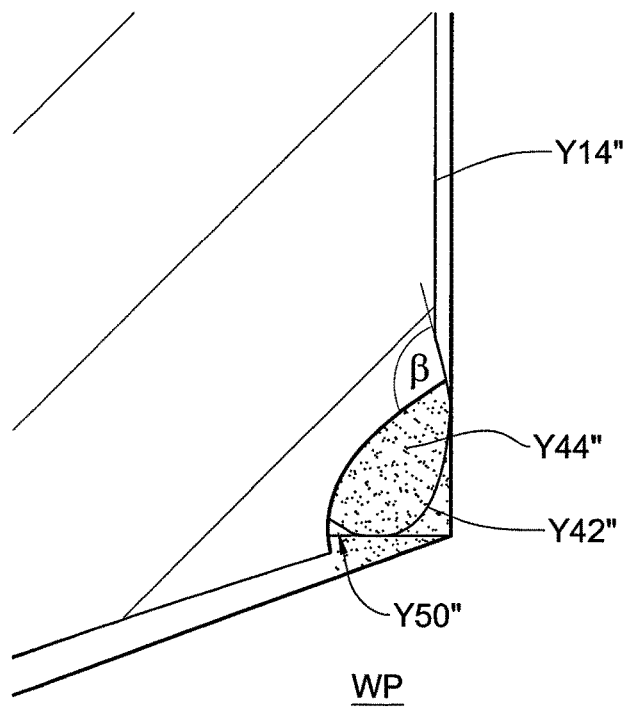
Figure 48G:
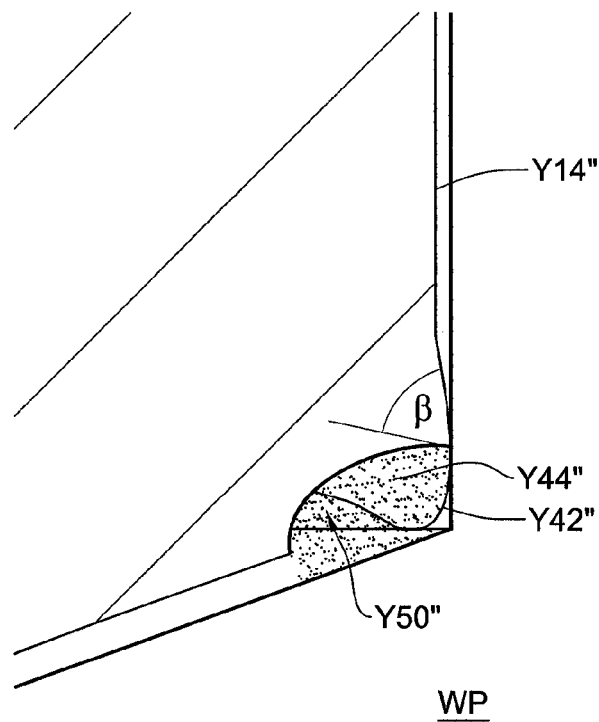
Figure 48H:
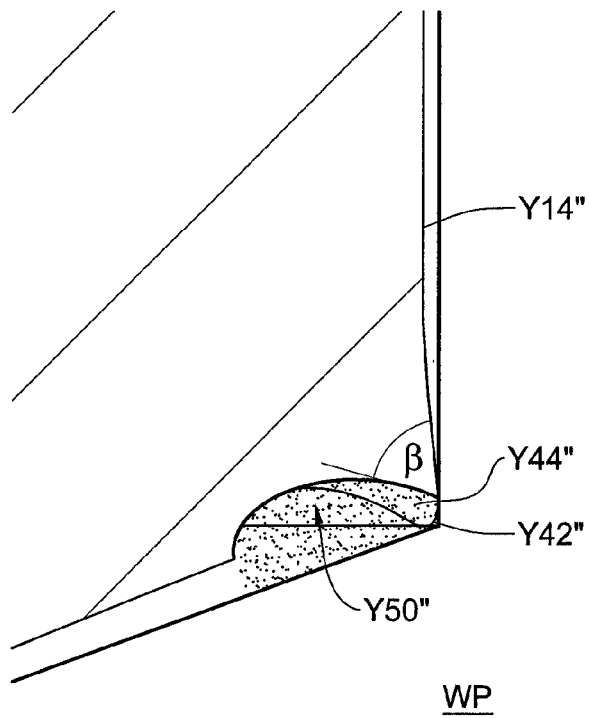
Figure 48I:
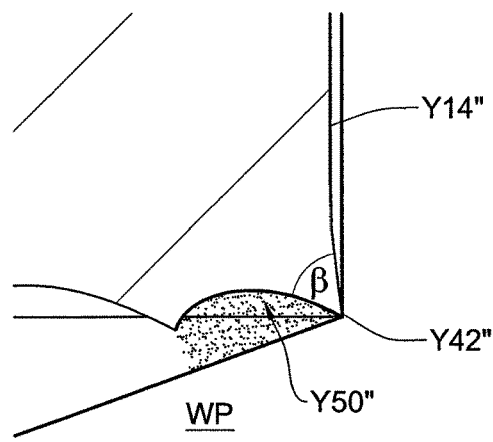
Figure 48J:
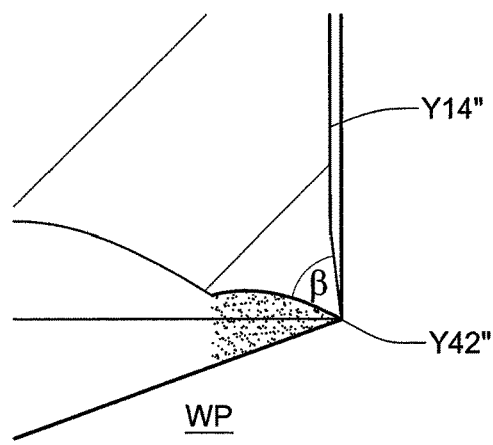
Figure 48K:
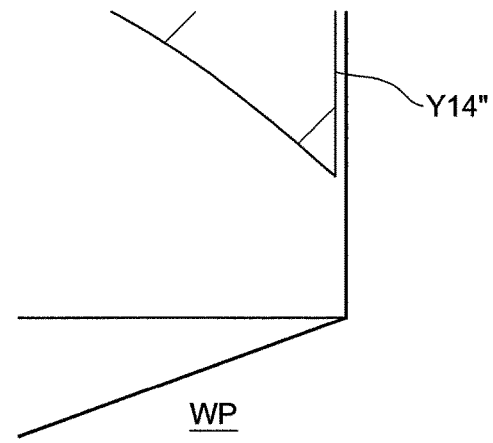

First of all, it is observed from FIGS. 48A to 48E that as the cutting tool Y1" revolves, the angle α gradually decreases from about 75° in FIG. Y6A to about Y60° in FIG. 48E. Similarly, as the cutting tool 1" revolves, the angle β gradually decreases from about 75° in FIG. 48F to about 60° in FIG. 6K.

It is important to note that as the cutting edges Y32" and Y42" penetrate deeper into the material of the workpiece, the removed secondary chip SC increases in volume and is pushed against surfaces A and B of the workpiece respectively. The gradual decrease in the angles α and β, increases, in opposite proportions, the free space (see shaded area) between the cutting portions Y30", Y40" and the side surfaces A and B respectively in which the secondary chip SC can be contained.

In other words, if the angles α and β are constant (as opposed to the present example), the growing chip SC would gradually fill up the space formed between the cutting portions and the surfaces A and B, causing a considerable increase in the loads exerted on the cutting tool. Specifically, the chip SC would be gradually squeezed and grinded between the cutting tool Y1" and the surfaces A and B leading to breakage/fracture and/or quick wear of the tool Y1".

It is also appreciated that the shape of the cutting edges Y32", Y42" is such that at the towards the trail end, the cutting edges Y32", Y42" become more and more tangent to the respective side surfaces A and B of the cutting tool Y1". Thus, even though the angles α and β of the cutting portions Y30", Y40" decreases, i.e. reducing their ability to withstand loads, so decreases the amount of material to be removed (due to the tangent orientation), compensating for the reduction in the angle.

Turning now to FIGS. 49A to 49F, another example of a cutting tool is shown, generally designated as Y101. As opposed to previously disclosed cutting tools Y1, Y1' and Y1", the cutting tool Y101 does not comprise a front cutting portion but only the intermediate portion Y130 and the rear portion Y140.

More particularly, in the cutting tool Y101, there is no cutting portion configured for removing a primary chip PC, and the intermediate portion Y130 and rear portion Y140 continue performing the same function as previously described, i.e. the removal of a secondary chip. It should be noted that although the secondary chip SC is now the first chip to be removed, it is still referred herein as a secondary chip due to the similar method of its removal (i.e. in two stages).

It is also for that reason that the intermediate cutting portion Y130 and rear cutting portion Y140 are still referred herein as 'intermediate' and 'rear' although, in essence, the intermediate cutting portion Y130 is the first to encounter the workpiece.

The cutting tool Y101 further comprises a chip splitter Y160 disposed at the lead end of the intermediate cutting edge Y132 and a chip breaker disposed at the trail end of the rear cutting portion Y140.

The cutting tool Y101 is configured for axial progression (along the central axis X) when moving into the workpiece. Therefore, and due to the fact that cutting tool Y101 does not comprise a front cutting portion, there is a risk that the chip removed from the workpiece by the radial cutting edge (not indicated) will be urged into the chip evacuation channel Y150 and clog it.

As an elegant solution, the chip splitter Y160 disposed at the lead end of the cutting edge Y132 is configured for splitting the chip removed by the radial cutting edge from the chip removed by the cutting edge Y132. As a result, the split chip (removed by the radial cutting edge and split by the splitter Y160) will be urged into the chip evacuation flute Y116, while the secondary chip SC removed by the cutting edges Y132 and Y142 will be urged into the chip channel Y150 as described with reference to previous examples.

The splitter is formed as a pocket formed in the lead end of the cutting edge Y132, thereby, when the chip removed by the radial cutting edge reaches the pocket it is interrupted and a new chip (the secondary chip) begins at the cutting edge Y132. It is appreciated that the size of the pocket of the splitter Y160 is configured for a certain feed, beyond which, the chip removed by the radial cutting edge may remain loosely attached to the workpiece.

In addition, since the cutting tool Y101 only comprises the intermediate and rear cutting portion Y130, Y140, there is a chance that the removed secondary chip SC will become an endless string remaining within the channels Y150 and clogging them up and/or progressing to the next cutting portion.

For this purpose, a chip breaker Y170 is added at the trail end of the rear cutting edge Y142 formed with a rake surface Y174 and a relief surface Y176, defining at the intersection thereof a curved cutting edge 172 configured for curving the secondary chip SC removed by the portions Y130, Y140. During operation of the cutting tool Y101, this curvature serves to break the secondary chip SC into bits and urging these bits to be evacuated from the cutting tool Y101 via the flues Y116.

The curved portion of the cutting edge Y172 also serves for curling of the removed secondary chip SC, throwing it towards the center and reducing its likelihood of entering the chip evacuation channel Y150 of the subsequent cutting portion.

Turning now to FIGS. 50A to 50D, another example of a cutting tool is shown, generally designated as Y201. The cutting tool Y201 is generally similar to the cutting tool Y101 previously described, with the difference being in the dimensions (specifically the width) of the chip channel Y250.

In particular, in the previously described cutting tools Y1, Y1', Y1" and Y101, the intermediate cutting portion and the rear cutting portion each constituted a part of the corner being cut from the workpiece. In other words, the two portions were complementary so that revolution of the cutting tool about its axis without axial displacement would result in the removal of a corner of angle θ from the workpiece.

To the contrary, in the cutting tool Y201, the rear cutting portion Y240 is located axially above the intermediate cutting portion Y230, so that revolution of the cutting tool about its axis without axial displacement would result in a continuous partial secondary chip attached to the bottom surface of the workpiece.

The cutting tool Y201 is configured for revolving about its axis X and displacing axially so that the intermediate cutting portion Y230 forms a spiral slot within the workpiece WP, resulting in a spiral secondary chip SC still being attached to the workpiece. Thereafter, upon further axial displacement, the rear cutting edge Y242 displaces downwards and removes the thread completely.

It is appreciated that the cutting tool Y201 has two intermediate cutting portions Y230 and two rear cutting portions Y240, so that under different feeds, the following configurations are possible:

Under very high feed, the cutting edge Y242 is configured for remove that spiral secondary chip formed directly by the cutting edge Y232 in front of it;

under moderate feed, the cutting edge Y242 is configured for remove that spiral secondary chip formed directly by the other cutting edge Y232; and under low feed, the cutting edge Y242 can be configured for remove that spiral secondary chip previously formed by the other cutting edge Y232 (a revolution before, two revolutions before and even more).

It is appreciated that the cutting tool Y201 has at least the following advantages:

the chip channel Y250 is considerably wider, allowing the secondary chips SC to flow more freely therein, thereby reducing the loads exerted on the cutting tool Y201; and the loads exerted on the rear cutting portion Y240 in its downward displacement are smaller since the secondary chip portion SC removed thereby is not supported by full material of the workpiece but rather by additional portions of the secondary chips SC.

Turning now to FIGS. 51A to 51D, another example of a cutting tool is shown, generally designated as Y201', which is of similar design to that of cutting tool Y201 previously described.

One of the differences between the cutting tool Y201' and the cutting tool Y201 lies in that the cutting tool Y201' comprises a front cutting portion Y220' and an intermediate cutting portion Y230' without a rear cutting portion. In particular, the front cutting portion Y220' is located axially higher than the intermediate cutting portion Y230'.

Whereas in the previous example the threaded portion of the partial secondary chip SC was removed by the rear portion Y240, in the present example, the same is removed by the front cutting portion Y220' lagging behind the intermediate cutting portion Y230.

As shown in FIG. 51D, in cross-section, the secondary chip SC forms splinter-like extensions spirally extending from the side surface of the workpiece which are gradually removed therefrom by the cutting portion Y220'.

It is important to note that in both cases of cutting tools Y201 and Y201', if the hole is a through going hole, the side surface of the workpiece will be generally smooth (without residual material), while, if the hole is not through going (blind bore), a small amount of residual material will remain at the bottom of the bore.

It is appreciated that in this case as well, there remains the advantage of reducing the loads on the front cutting edge Y222', since it is required to remove only spikes (threaded portion of the workpiece) and not whole material. This may considerably reduce wear and heat damage and increase the lifespan of the cutting tool Y201'.

Turning now to FIGS. 52A to 52D, a milling tool is shown generally designated Y301 and comprising, similarly to previously described cutting tools, an intermediate cutting portion Y330 and a rear cutting portion Y340 with a chip channel Y350 formed therebetween. In the present example, as well as in following examples, the cutting tools are formed without a front cutting portion, i.e. without a portion configured for removing a primary chip and forming a filleted, partial corner within the workpiece.

In the present example, the intermediate cutting portion Y330 is configured for side cutting while the rear cutting portion Y340 is configured for bottom cutting. In particular, the cutting portions Y330, Y340 are configured for producing a chamfered corner within the workpiece, i.e. to create a phase of about 45° and having a width of 0.6 mm.

It is appreciated that the angle of the cutting edges Y332, Y342 of the cutting portions Y330, Y340 varies from their respective lead end to their respective trail end. Thus, the intermediate cutting edge Y332 begins removing material in a direction generally parallel to the central axis of the cutting tool Y301 and gradually angles to provide its half of the 45° phase while the rear cutting edge Y342 begins removing material in a direction generally perpendicular to the central axis of the cutting tool Y301 and gradually angles to provide its half of the 45° phase.

With reference to FIGS. 53A to 53E, various stages of the cutting operation are shown. At first (FIGS. 53A, 53B), the intermediate cutting edge Y332 begins removing the secondary chip (not shown), starting from a position nearly parallel to the side surface (i.e. vertical) and slowly developing into a 45° angle towards the bottom surface.

Thereafter (FIGS. 53C to 53E), the rear cutting edge Y342 begins removing material from the bottom surface of the workpiece WP, starting from a position generally parallel to the bottom surface (horizontal) and gradually developing into a full 45° angle towards the side surface.

Turning now to FIGS. 54A and 54B, another example of a milling tool is shown, generally designated as Y301", and is of similar design to the previously described milling tool Y301. The main difference between the milling tool Y301 and the milling tool Y301' lies in the different arrangement of the intermediate and rear portions Y330', Y340'.

In particular, as opposed to the cutting tool Y301, the intermediate cutting portion Y330 is configured for bottom cutting (i.e. removing material from a bottom surface of the workpiece) and the rear cutting portion Y340 is configured for side cutting (i.e. removing material from a side surface of the workpiece).

Attention is now drawn to FIGS. 55A and 55B in which another example of a milling tool is shown, generally designated Y301" and having a design similar to that of milling tool Y301' in the sense that is comprises an intermediate cutting portion Y330" and a rear cutting portion Y340" configured for cutting the side and bottom surfaces of the workpiece WP respectively.

However, the milling tool Y301" also includes a main chip splitter Y360" located at the lead end of the intermediate cutting edge Y332" and a chip breaker Y370" located at the trail end of the rear cutting edge Y342".

In operation, the intermediate cutting edge Y332" begins cutting the side surface of the workpiece, removing material therefrom first leaving a radial contour and gradually straightening to provide a chamfered contour of about 45°. At this point, the secondary chip SC is still attached to the workpiece.

Thereafter, the cutting edge Y342" of the rear cutting portion Y340" begins completing the removal of the secondary chip SC by cutting the bottom surface of the workpiece WP, first leaving a radial contour and gradually straightening to provide a chamfered contour of about 45° meeting the contour left by the intermediate cutting edge Y332" to form a chamfered corner.

The cutting tool Y301" also comprises a safety cutting edge Y392" located just before the chip breaker Y370" configured for making sure that the secondary chip is indeed removed from the workpiece. In particular, in cases of sufficient feed, the secondary chip may not be fully detached from the workpiece and the cutting edge Y392" facilitates its removal.

In addition, in case of wear of the intermediate cutting portion Y330", the rear cutting portion Y340" can serve as an intermediate cutting portion and the safety cutting portion Y390" can serve as a rear cutting portion, thereby changing configuration to one previously described.

In the present example, as previously described with respect to cutting tool Y101 shown in FIGS. 59A to 59E, the chip splitter Y360" is configured to split the chips removed from the workpiece by a radial cutting edge (or at least a portion thereof) from those removed by the intermediate cutting edge Y332" so that the formers will not progress into the chip channel Y350" and clog it.

In addition, also as previously described with respect to cutting tool Y101 shown in FIGS. 59A to 59E, the milling tool Y301" includes a chip breaker Y370" configured for breaking the secondary chip progressing through the chip channel Y350" so that it does not form an endless chip string and/or accidently be urged towards the subsequent cutting portion.

Turning now to FIG. 56, another example of a milling tool is shown, generally designated Y401, also comprising an intermediate cutting portion Y430 with an intermediate cutting edge Y432 and a rear cutting portion Y440 comprising a rear cutting edge Y442.

As opposed to the pervious example, the cutting portions Y430, Y440 of the milling tool Y401 are arranged such that the rear cutting edge Y442 is configured for removing material from both the bottom and the side surfaces of the workpiece, leaving thereafter a chamfered contour while the intermediate cutting edge Y432 is simply configured for vertical cutting. In other words, the rear cutting portion Y440 is formed with the entire chamfered corner remaining within the workpiece after the cutting operation.

One advantage of the above design over the previous examples is that the chip channel Y450 is slightly wider, providing a more convenient progression of the secondary chips SC therethrough, reducing the loads on the milling tool.

Attention is now drawn to FIG. 58, in which yet another example of a milling tool is shown, generally designated as Y501 configured primarily for cutting under lateral feed. As opposed to all previously described examples, the milling tool Y501 comprises a front cutting portion Y520 and an intermediate cutting portion Y530 which is the single cutting portion of the milling tool Y501.

In particular, the intermediate cutting portion Y530 is configured for removing material from the side surface of the workpiece WP to leave therein a chamfered corner and therefore includes the entire chamfer contour required therefor.

However, contrary to previously described examples, the front cutting portion was located on the envelope, in the present example, the cutting portion Y520 is located radially inwards, and is configured to remove material (splinter-like extensions) left one the bottom surface of the workpiece under predetermined feed in a lateral direction.

As in previously described examples, the milling tool Y501 also comprises a chip splitter Y570 configured to split the chips removed from the workpiece by the radial cutting edge from the chips removed by the intermediate cutting portion Y530.

Attentions is now turned to the diagrams shown in FIGS. 58A to 58D and 59A to 59D, in which advantages of the chamfered design of the cutting portion is illustrated. In all illustrations, the following indications are adhered to:
WP—workpiece;
C.T.—cutting tool;
C.E.—cutting edge;
SC—secondary chip; and
C50—secondary chip channel.

Figure 58A:
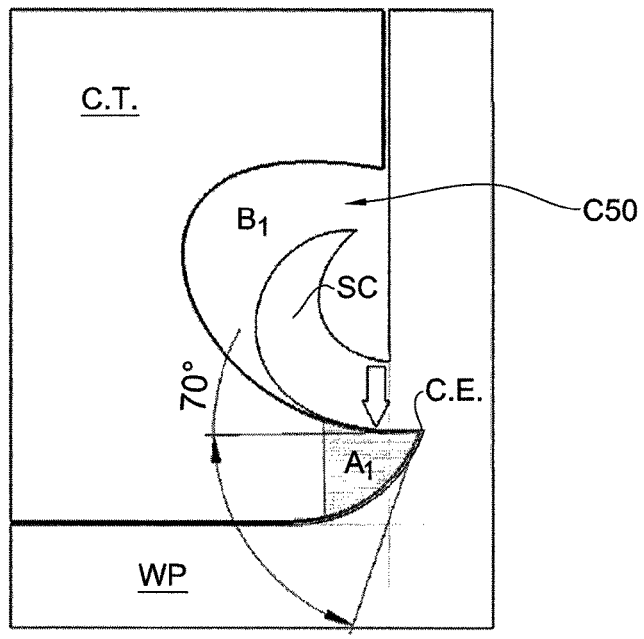

With particular reference to FIG. 58A, a cutting portion is shown having a filleted (circular) contour shape. It is observed that, in this example, the load exerted on the cutting portion is provided from above by the to-be removed material (see arrow), so the volume of the cutting portion which is configured to withstand that load is $A_1$. It is also noted that the space available for the secondary chip to progress into is denoted by $B_1$.

Figure 58B:
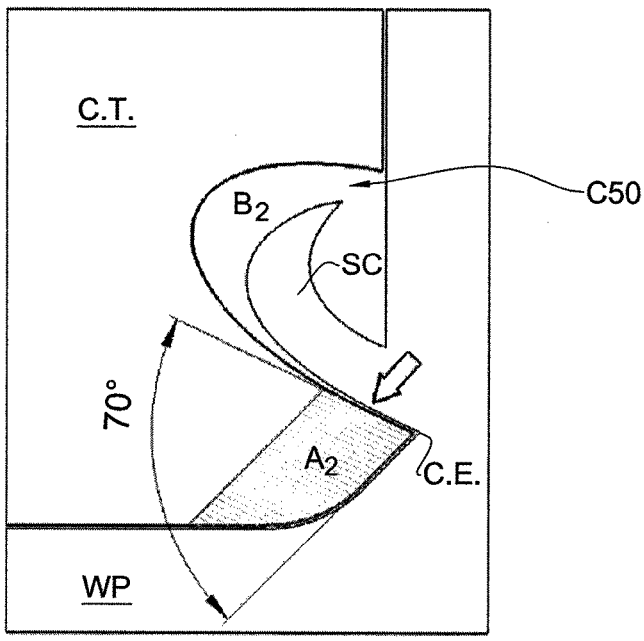

To the contrary, as shown in FIG. 58B, the cutting portion is formed with a chamfered contour so that when the cutting portion penetrates into the material of the workpiece WP, the load exerted thereon is angled to the cutting portion (see arrow) and so the volume configured to withstand that load is $A_2 > A_1$, adding to the robustness and mechanical integrity of the cutting portion.

It is also noted that whereas in both examples the angle of the cutting portion (i.e. angle between rake and relief surface) is set to 70°, due to the chamfered design of the cutting tool of FIG. 58B, the rake surface is angled to the axis of the cutting tool and not perpendicular thereto, thereby providing for the mechanical integrity (against fracture/breakage) without giving up the required 70° angle.

More particularly, the amount of material in the direction in which the load is applied is considerably greater in the example of FIG. 58b than the example of FIG. 58A, contributing to the mechanical integrity.

It is also appreciated that the example shown in FIG. 58B transforms smoothely from as filleted contour to a chamfered contour (the filleted contour is tangent to the chamfer contour), thereby avoiding any sharp corners on order to prevent focus of stresses thereon.

Figure 58C:
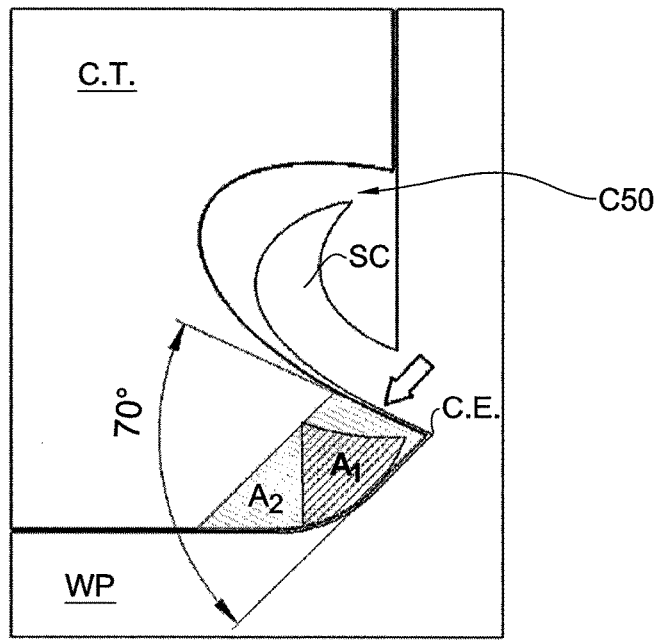
Figure 58D:
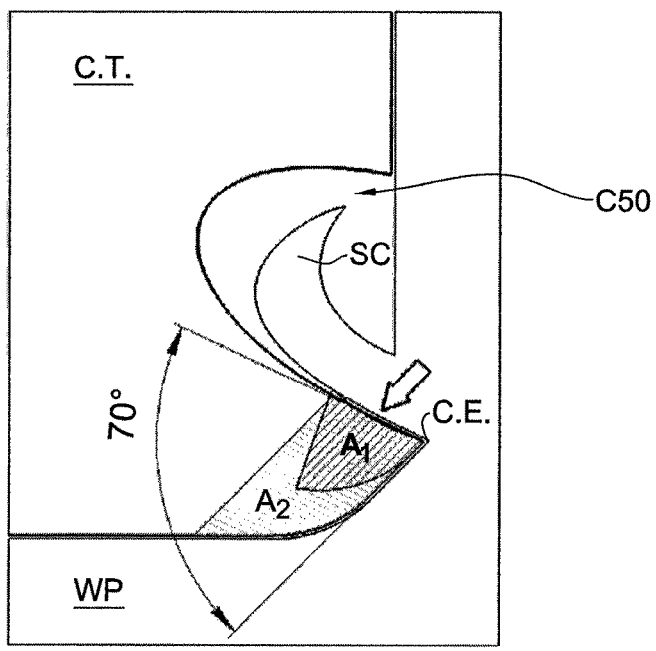

FIGS. 58C and 58D are schematic diagrams of superposition of the diagrams 58A and 58B, demonstrating the difference between the examples shown therein.

With particular reference to FIGS. 59A to 59D, the chamfered example is shown during various stages of operation thereof.

In particular, it is observed that as the cutting portion of the cutting tool C.T. progresses within the material, the secondary chip SC is gradually pressed against the surface of the workpiece WP. However, since the orientation of the rake and relief surfaces of the cutting portion varies constantly (gradually rotating CCW), there is always sufficient space for the secondary chip SC to be urged into.

Figure 59A:
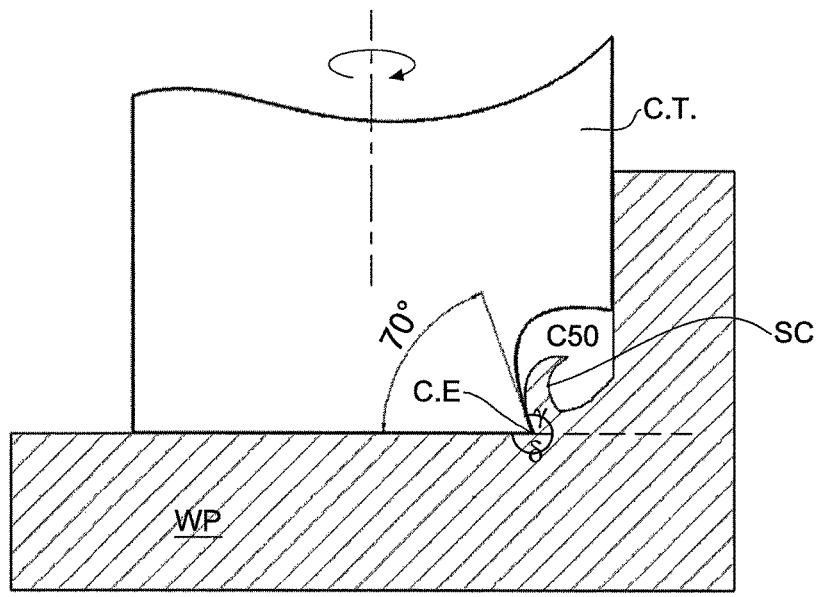
Figure 59B:
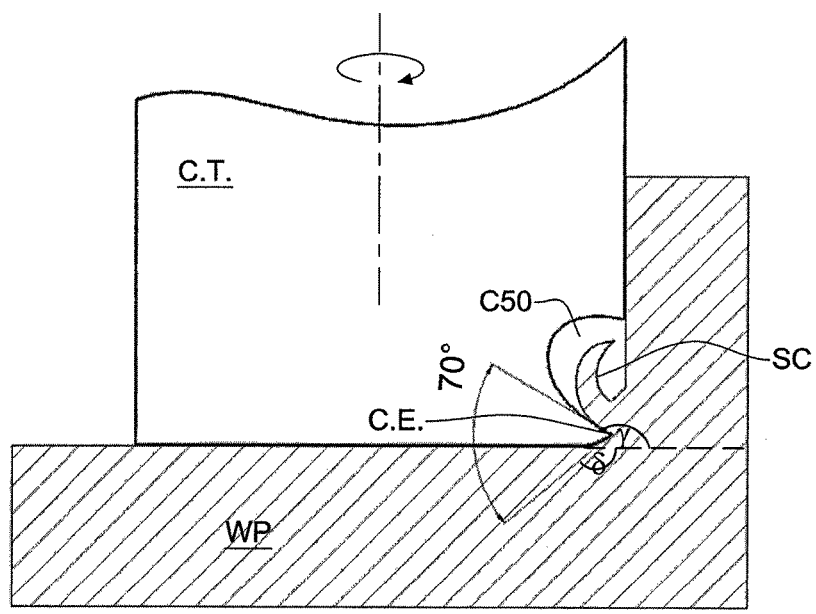

In particular, it is observed that in the position shown in FIG. 59A, the angle of the rake surface with the horizontal reference plane is γ while the angle of the relief surface with that plane is δ.

As the cutting operation progresses, the orientation of the cutting portion changes (rotating CCW) so that the angle of the rake surface with the horizontal reference plane is γ'>γ while the angle of the relief surface with that plane is δ'<δ. It is important to note that the angle between the rake surface and the relief surface is still 70° at this point.

Figure 59C:
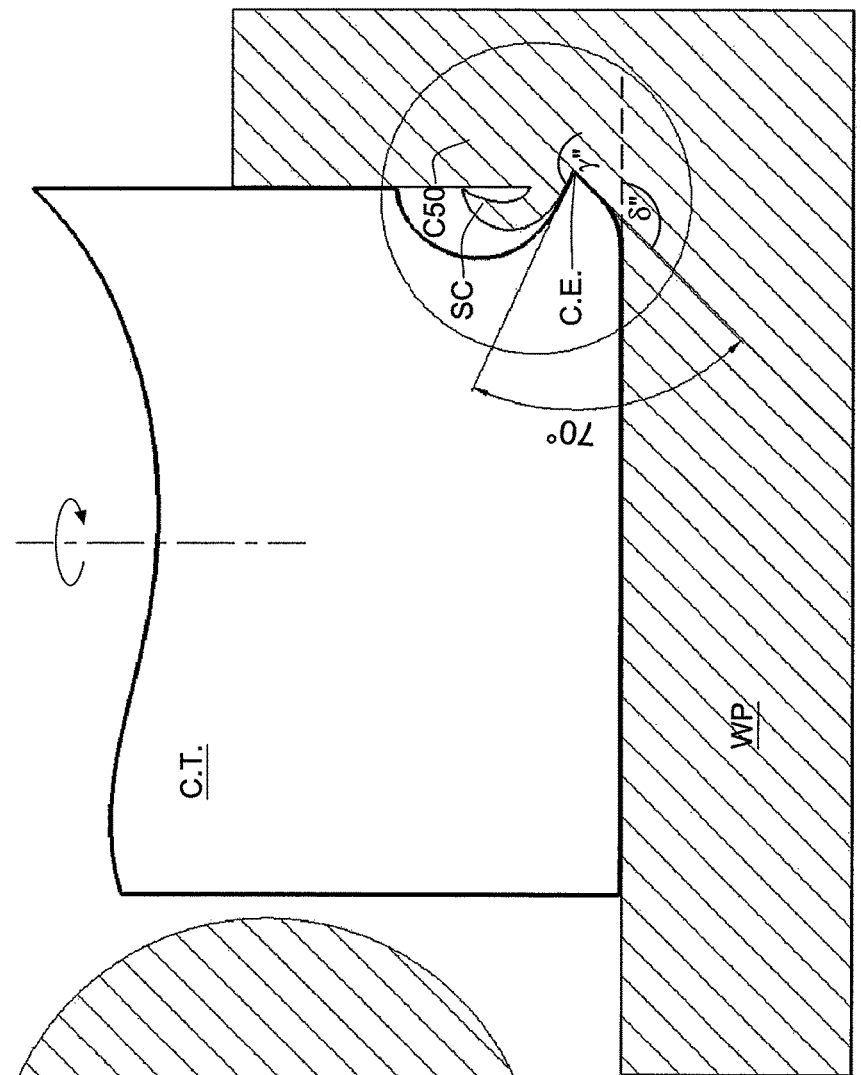
Figure 59D:
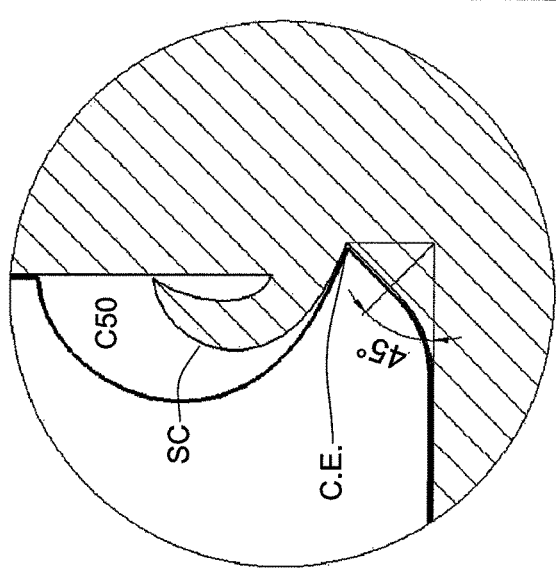

Turning to FIG. 59C, upon further progression, the cutting portions penetrates the workpiece with the chamfered portion thereof while the orientation keeps changing. In the position shown in FIG. 59C, the angle of the rake surface with the horizontal reference plane is γ">γ'>γ while the angle of the relief surface with that plane is δ"<δ'<δ. It is important to note that even in this position, the angle between the rake surface and the relief surface is still 70° as required in view of mechanical integrity of the cutting portion.

Attention is now drawn to FIGS. 60A to 60D, in which another example of a drilling tool is shown, generally designated Y600, and comprising a body portion Y610 and a cutting portion Y620. As in previously described drills, the body portion Y610 comprises spirally extending sections Y614 defining therebetween corresponding spirally extending chip evacuation flutes Y616.

In the present example, the cutting portion Y620 comprises a main cutting edge Y622 having three segments: Y622c extending from the central axis of the drill Y600, Y622c defining the corner of the drill and Y622b extending between Y622a and Y622c. Each of the cutting edges Y622a, Y622b and Y622c is provided with a rake surface Y624a, Y624b, Y624c respectively and a relief surface Y626a, Y626b, Y626c respectively.

The drill Y600 further comprises an auxiliary cutting edge Y632 having a lead end located along the circumference of the drill Y600 located behind the cutting edge Y622. The cutting edge Y632 has a rake surface Y634 and a relief surface Y636.

The arrangement is such that, during operation, the cutting edges Y622 remove material from a workpiece WP (not shown) leaving therein a rounded corner corresponding in shape and size to that of the cutting edge Y622a. Thereafter, the cutting edge Y632 penetrates into the workpiece, forming therein a horizontal slit partially detaching an additional chip of material therefrom.

Following the above, the consecutive cutting edge Y622a comes into contact with the workpiece WP and completely removes the partially removed chip and again, leaving a rounded corner. During revolution of the drill Y600, each cutting edge Y622a removes the partially attached chip formed by the preceding cutting edge Y632 as well as removing additional material to form the rounded corner.

One advantage of the above design as opposed to the design of the previously described drill Y200' is that, due to the minimal axial distance between the cutting edge Y622 and the cutting edge Y632, when the operation of the drill Y600 is halted, a minimal amount of excess material from the workpiece remains between the cutting edge Y632 and the workpiece, thereby minimizing the amount of force required to remove the drill Y600 from the bore.

With particular reference to FIGS. 60C and 60D, the rear end of the cutting element Y630 is pre-formed to have a positive angle α configured for allowing the cutting element Y630 to remove material from the workpiece when the drill Y600 is revolved in the opposite direction (for example, when removing the drill from the bore). In particular, a cutting edge Y682 is formed, having a rake surface Y684 and a relief surface Y686.

A similar example of a drill is shown in FIGS. 61A and 61B, in which the drill, generally designated Y600' also comprises a cutting edge Y622a' and an auxiliary cutting edge Y632'.

However, the difference between the drill Y600 and the drill Y600' lies in the orientation of the auxiliary cutting edge Y632'. In particular, whereas the cutting edge Y632 penetrates the workpiece to generate a horizontal slit, the cutting edge Y632' penetrates the workpiece vertically to form a vertical slit partially detaching a chip from the workpiece.

In other aspects, operation of the drill Y600' is similar, i.e. each cutting edge Y632' is configured for partially removing a chip from the workpiece and each cutting edge Y622a' is configured for removing the partially attached chip removed by the preceding auxiliary cutting edge Y632'.

One advantage of the above described drill lies in the

Turning now to FIGS. 62A and 62B, another example of an endmill is shown generally designated Y700 and comprising a body portion Y710 and three cutting portions Y720. Each cutting portion is provided with a main cutting edge Y722 and an auxiliary cutting element Y730.

In the present example, the cutting portion Y720 comprises a cutting edge Y722 defining the corner formed in the workpiece, and has a rake surface Y724 and a relief surface Y726.

The auxiliary cutting element Y730 has an auxiliary cutting edge Y732 having a lead end located along the circumference of the endmill Y700 located behind the cutting edge Y722. The cutting edge Y732 has a rake surface Y734 and a relief surface Y736.

The arrangement is such that, during operation, the cutting edges Y722 remove material from a workpiece WP (not shown) leaving therein a rounded corner corresponding in shape and size to that of the cutting edge Y722. Thereafter, the cutting edge Y732 penetrates into the workpiece, forming therein a vertical slit partially detaching an additional chip of material therefrom.

Following the above, the consecutive cutting edge Y722 comes into contact with the workpiece WP and completely removes the partially removed chip and again, leaving a rounded corner. During revolution, each cutting edge Y722 removes the partially attached chip formed by the preceding cutting edge Y732 as well as removing additional material to form the rounded corner.

Turning now to FIGS. 63A to 63D, another example of an endmill is shown, generally designated Y700' and comprising a body portion Y710' and three cutting portions Y720'.

The endmill Y700' is similar to the previously described endmill Y700, with the difference being in the design of the auxiliary cutting element 730'. In particular, the cutting edge Y732' of the cutting element Y730 extends along the entire corner of the endmill Y700', beginning from a horizontal orientation at the bottom surface of the endmill Y700' and ending in a vertical orientation at a side surface of the endmill Y700'.

Thus, in operation, the cutting edge Y732' removes material from the workpiece leaving therein a corner of radius r, whereafter, extremities of the cutting edge Y722' operate for removing remaining material from the workpiece. Specifically, the greater the feed of the tool Y700', the greater the portion of the extremities of the cutting edge Y722' which operate to remove material from the workpiece.

Under the above, in the event of higher feed, the loads are distributed between the cutting edge Y722' and the auxiliary cutting edge Y732'. Alternatively, during low feed, the endmill Y700' can achieve a higher revolution speed since a smaller portion of the cutting edge Y722' comes in contact with the workpiece WP.

Turning now to FIGS. 64A to 64F, another example of an endmill is shown, generally designated Y700". As previously described, the endmill Y700" also comprises a body portion Y710" and four cutting portions Y720".

However, as opposed to previously described endmills, the cutting portions Y720" are not identical. Specifically, while the cutting edges Y722" are identical for all the four cutting portions Y720", the auxiliary cutting elements are not. In particular, two cutting portions Y720" comprise a first auxiliary cutting element Y730" while the other two cutting portions Y720" comprise a second auxiliary cutting element Y740".

The first auxiliary cutting element Y730" is formed with a cutting edge Y732" having a rake surface Y734" and a relief surface Y736" and a generally horizontal configuration, configured for forming a horizontal slit in the workpiece to partially detach a chip therefrom.

The second auxiliary cutting element Y740" is formed with a cutting edge Y742" having a rake surface Y744" and a relief surface Y746" and a Yenerally vertical configuration, configured for forming a vertical slit in the workpiece to partially detach a chip therefrom.

The cutting portions Y720" are arranged alternately so that a cutting portion Y720" having a first auxiliary cutting element Y730" is followed by a cutting portion Y720" having a second auxiliary cutting element Y740" and vise versa.

Under the above arrangement, due to the alternating arrangement, the cutting edge Y722" of a portion with a first auxiliary cutting element Y730" is configured for removing the partially attached chip formed by the preceding cutting edge Y742" of a second auxiliary cutting element Y740" and vise versa.

Consequently, when the endmill Y700" is operated without providing feed thereto (i.e. only revolution without displacement), it is configured for eventually leaving the workpiece with a sharp corner (without a radius). Specifically, when revolved in place, the cutting edges Y732" and Y742" form the horizontal and vertical slits respectively, leaving forming the sharp corner, with the cutting edges Y722" not coming into contact with the workpiece. Thus, this tool can be particularly useful for finishing purposes.

It is appreciated that one of the advantages of the endmill Y700" of the present example is its convenient manufacturing. In particular, each of the cutting edges Y722", Y732" and Y742" can easily be manufactured by grinding and/or honing due to the convenient access to each of the cutting edges.

Attention is now drawn to FIGS. 65A to 76C in which several cutting tools according to one aspect of the subject matter of the present application are described. As will be explained in detail later and based on the above described method of design of a cutting edge with respect to FIGS. 1 to 12B, it is appreciated that the non-standard cutting edges described hereinafter can be designed based on the above described method.

With reference to FIGS. 65A to 65D, a milling tool is shown generally designated R1 and comprising a milling tool holder R10 having six milling inserts R20 mounted thereof along the circumference thereof.

As observed from FIGS. 65C and 65D, the milling insert R20 is formed with a first cutting portion R30 having a first cutting edge R32 and a second cutting portion R40 having a second cutting edge R42. Each of the cutting edges R32, R42, is defined at the intersection between corresponding rake and relief surface R34, R36 and R44, R46 respectively.

It is also noted that the intermediate portion R50 constituted by the surface R52 between the cutting portions R30, R40 is produced by grinding as such a surface cannot be produced by simple pressing/mold process.

Each of the cutting edges R32, R42 of the portions R30, R40 is configured for cutting a different part of the removed chip. In particular, during operation of the milling tool R1, the cutting edge R32 first comes into contact with the workpiece creating a vertically incision/slit therein, only partially separating a chip from the workpiece. Thereafter, upon rotation of the milling tool R1, once the cutting edge R32 disengages from the workpiece (not shown), the cutting edge R42 comes into contact with the workpiece and completely separates the chip from the workpiece by making a lateral incision/slit.

It is also noted that the tow cutting portions are designed such that each of the cutting edges R32, R42 is configured for leaving a radial incision within the workpiece, so that together, the cutting insert R20 forms a filleted recess within the workpiece.

It is also observed that an upper portion R38 of the cutting edge R32 located above the radial portion turns inward (having a smaller diameter), thereby allowing to reduce the sheer forces acting on the cutting edge during operation of the milling tool R1 as well as prevent continuous impact on the cutting portion R30.

Attention is now drawn to FIGS. 66A to 66C, in which another example of a milling tool is shown generally designated as R1' which is similar to the milling tool R1 previously described. However, the milling tool R1' differs in that each of the cutting portions R30, R40 also comprises a chip splitter R37, R47 located along the cutting edges R32, R42 respectively.

Specifically, the chip splitter R37 is configured for splitting the chip at the beginning of the cutting edge R32 so that the chip removed by the cutting edges R32, R42 and forming the corner of the workpiece is disconnected from the chip removed from the side wall of the workpiece.

Furthermore, the chip splitter R47 located at the end of the cutting edge R42 serves for splitting the chip after it has been completely separated from the workpiece at the corner, thereby disconnecting if from any further chips formed.

The above design allows preventing chips removed from the side wall from flowing into the corner cutting zone.

Attention is now drawn to FIGS. 67A to 68C, in which still another example of a milling tool is shown, generally designated R1" and a mold for the manufacture of inserts R20" thereof. The milling tool R1" comprises a milling tool holder R10" and a plurality of cutting insert R20" circumferentially mounted thereon.

The cutting insert R20" differs from the previously described cutting inserts R20, R20' by the fact that the first cutting portion R30" is a regular cutting portion and not an elongated cutting portion as previously described. In other words, the cutting portion R30" comprises a standard cutting edge R32" which is generally radial and covers about half the span of the corner.

The cutting insert R20" further comprises a second cutting portion R40" having an elongated cutting edge R42" which has an angled (not radial) configuration, providing additional robustness to the cutting portion R40.

In operation, the standard cutting edge R32" cuts off a portion of a portion of the chip from the workpiece leaving therein a radial recess extending a part of the corner formed in the workpiece. Thereafter, the cutting edge R42" comes into contact with the workpiece, removing therefrom a straight chip leaving a phased portion of the corner. Thus, the recess formed in the corner of the workpiece has a radial half and a straight, inclined half.

Attention is now drawn to FIGS. 68A to 68C, in which a mold R2 for the manufacture of the cutting insert R20" is shown, comprising a cavity part R60 and a pressing part R70, as well as two lateral pieces R80 and R90 configured for forming the central bore of the cutting insert R20".

It is noted that the cutting insert R20" can be manufactured by a mold pressing process (unlike the previously described inserts R20, R20'), making it more economically viable.

It is also noted that the central bore of the cutting insert R20" is noted formed by an integral portion of the cavity part R60 but rather by the two lateral pieces R80 and R90, which is highly irregular.

Turning now to FIGS. 69A to 69C, another example of a milling tool R1''' is shown, comprising a milling tool holder R10''' and milling inserts R20''' mounted circumferentially thereon.

In the present example, the cutting insert R20''' also comprises a regular cutting portion R30''' and an elongated balcony portion R40''', each having a corresponding cutting edge R32''', R42''' respectively.

It is noted that at part of the cutting edge R42''' of the cutting portion R40''' extends beyond a cutting envelope created by the cutting edge R32''' of the cutting portion R30''' during revolution of the milling tool R1'''. The milling tool RV' is configured for side cutting, i.e. advancing sidewards and not downwards.

In addition, it is observed that the cutting portion R40''' extends beyond a rear surface of the cutting insert R20''', thereby allowing extending the cutting edge R42 thereof compared to a similar cutting insert which terminates at the rear surface (the surface mated against the seat of the milling tool holder R10''').

Attention is now drawn to FIGS. 70A to 71 in which another milling tool is shown, generally designated R101 and comprising a milling tool holder R10 and a plurality of milling inserts R120 mounted circumferentially thereon.

In contrast to previously described cutting inserts R20, R20', R20" and R20''', the presently described cutting insert R120 comprises four cutting corners as opposed to two.

Each of the corners comprises a main, regular cutting portion R130 and an elongated cutting portion R140, each having a corresponding cutting edge R132, R142 respectively.

The milling tool R101 is configured for side cutting, i.e. advancing sidewards and not downwards.

With particular reference to FIG. 71, the mold for the manufacture of the milling insert R120 comprises a cavity part R160 and a pressing part R170, the cavity part R160 comprising a central pole R162 configured for producing the central bore 125 of the cutting insert.

Turning now to FIGS. 72A to 72C, a parting tool generally designated R201 is shown comprising a tool holder R210 and a parting insert R220. The parting insert comprising two corners, each having a main cutting portion R230 with a main cutting edge R232, and a secondary cutting portion R240 having a cutting edge R242.

The arrangement is such that the cutting edge R242 of the cutting edge R240 does not extend all along the parting tool R201 but rather only partially extends towards the middle of the parting insert R220.

Thus, in operation, when the parting tool is brought into contact with the workpiece, the secondary cutting portions R240 performing a cutting operations on the flanks of the workpiece, forming a slit therein, while the main cutting edge R232 follows and completely separates the chip from the workpiece. In other words, the arrangement is such that the secondary cutting edges R242 do not cut in the center of the workpiece but only at the sides thereof.

It is also noted that the surface R227 of the parting insert R220 are performed by grinding after the insert R220 has been pressed as these surfaces cannot be formed by pressing (owing to undercut conditions).

It should be noted that during a parting operation (on a revolving workpiece), the diameter of the workpiece WP is gradually reduced. Thus, while at the beginning of the turning operation both cutting edges R232, R242 come into contact with the workpiece, as the parting process progresses, the cutting edge R242 gradually comes out of contact with the workpiece (being now located below it owing to diminishing diameter) and the majority of the parting operation is performed, at that stage, by the main cutting edge R232.

Turning now to FIGS. 73A to 73D, another parting tool is shown generally designated as R300 and comprising a tool holder R310 and a parting insert R320.

The parting insert R320 comprises two main cutting portions R330, extending on two sides of the insert R320. Each of the main cutting portions R330 comprises a first cutting portion R340 with a first cutting edge R342 and a second cutting portion R350 with a second cutting edge R352. Each of the cutting edges R342, R352 is defined between corresponding rake and relief surfaces R344-R346, R354-R356 respectively.

Contrary to the previously described parting tool R200, the parting tool R300 comprises three cutting edges for each cutting side: a standard edge R332, a first parting edge R342 (of the first, top cutting portion) and a second cutting edge R352 (of the second, bottom cutting portion).

As in the parting tool R200, after the parting insert is manufactured within the press-mold, grinding may be required to provide for undercut surfaces which cannot be easily formed in a pressing process of the insert.

In addition, with particular reference being made to FIG. 73C, it is observed that the cutting edged R342, R352 are configured for removing a right-angled corner from the workpiece, each cutting portion R340, R350 contributing its 45° half of removing material from the workpiece WP.

Turning now to FIGS. 74A and 74B, a straight saw tool is shown, generally designated R201' comprising a saw holder R210' and a plurality of saw inserts R220' linearly disposed along the saw holder 210'. The saw inserts R220' are essentially similar to the parting inserts R220 previously described with respect to the parting tool R201, and have similar features, and therefore will not be described here in detail.

With reference to FIGS. 75A and 75B, a circular saw tool is shown, generally designated R201" comprising a saw holder R210" and a plurality of saw inserts R220" linearly disposed along the saw holder R210". The saw inserts R220" are essentially similar to the parting inserts R220 previously described with respect to the parting tool R201, and have similar features, and therefore will not be described here in detail and have similar features.

Turning now to FIGS. 76A to 76C, another turning tool is shown generally designated R401 and comprising a tool holder R410 and two turning inserts R420A and R420B, each having a cutting portion R430A, R430B respectively.

In essence, the cutting tool R401 is similar to the previously described cutting tool 70 previously described in FIGS. 8A to 8D. However, the main concept of the above turning tool R401 lies in the separation of the two complementary cutting portions R430A, R430B between two separate cutting inserts R420A, R420B. In other words, instead of manufacturing a single cutting insert having two cutting portions, each cutting insert R420A, R420B is separately manufactured and can be mounted together to provide the required design of the combined cutting edge.

In particular, it is noted that the cutting inserts R420A, R420B are configured for being mounted onto the same seat R416 of the cutting tool holder R410, one on top of the other. The bottom cutting insert R420B is first mounted onto the seat R416 and thereafter, the top cutting insert R420A is mounted over the cutting insert R420B.

In order to prevent lateral displacement between the cutting inserts R420A, R420B, the bottom insert R420B is formed with positioning protrusions R440 and the top insert 420A is formed with corresponding recesses (not seen) configured for receiving therein the protrusions R440 when mounted as shown in FIG. 76A.

Furthermore, it is noted that both cutting inserts R420A, R420B are configured for being secured onto the cutting tool holder R410 using a single fastening screw R450, passing through the central bores R325A, R325B of the cutting inserts R420A, R420B respectively.

Reverting now to FIG. 76A, it should be understood that manufacturing the combined cutting edge R432A+R432B in a pressing process is highly impractical at best, and impossible at most owing to the undercuts and spaces formed between the cutting portions R430A, R430B.

Therefore, the above concepts provides for a unique way of achieving the desired resulting design of the cutting edge R432A+R432B by manufacturing each of the cutting inserts R420A, R420B separately, in a simple pressing process and only thereafter combining the cutting insert by mutual mounting.

With respect to all of the above described cutting tools—milling, turning and drilling, it is appreciated that the features of these cutting tools as mentioned above may provide the cutting tools with at least one of the following advantages:

Feed—under the same loads, the cutting tool may operate at greater feed and rotation speed F and $Y_R$ respectively, than an equivalent cutting tool without the above mentioned features, and, as such, remove a greater amount of material from the workpiece per time unit t;

Loads—under the same feed and rotation speed F and $Y_R$, the cutting tool may be subjected to lower loads than an equivalent cutting tool without the above mentioned features, thereby providing an increased overall lifespan;

Chip—under the same rotation speed $Y_R$, the cutting tool may be allowed a greater feed F than an equivalent cutting tool without the above features, thus allowing to remove a thicker chip per time unit t for one turn of the cutting tool or workpiece; and Speed—under the same feed F, the cutting tool or the workpiece may be allowed a greater rotation speed $Y_R$ than an equivalent cutting tool without the above features, removing a greater amount of chips per time unit t.

Lifespan—the cutting inserts/tools may be provided with a longer lifespan under the same conditions as a standard cutting insert/tool.

It should further be clear that most principles and features described above with respect to cutting tools and inserts B1, B70, B100, B200, B300, B300', 1, 1', 1'', 1''', 120, 220, 320, 420, 510, 601, 701, 720, 801, 901, 1001, 1100, 1200, 1300, 1400, 1500, 1600, 1700, 180, 2100, 2200, Y1, Y10, Y1', Y10', Y110, Y201, Y201', Y301, Y301', Y300'', Y401, Y501, Y600, Y600', Y600'', Y700, Y700', Y700'', R1, R1', R1'', R1''', R101, R201, R201', R201'', R301 and/or R401 shown in FIGS. 1A to 76C, are not restricted to those cutting tools in connection with which they are described/shown, and may independently be applied, mutatis mutandis, to each other or to any other tools, in any combination considered to be appropriate by a person skilled in the art.

Those skilled in the art to which this invention pertains will readily appreciate that numerous changes, variations, and modification can be made without departing from the scope of the invention, mutatis mutandis.

The invention claimed is:

1. A cutting element for removing material from a workpiece and forming therein an end profile extending along a longitudinal axis, said cutting tool being formed with a cutting portion having a rake surface and a relief surface and a cutting edge defined at the intersection therebetween and comprising a bottom segment and a side segment, the cutting portion being boundable by a bottom reference surface and a side reference surface transverse thereto, so that said bottom segment lies along a maximal length thereof, on said bottom surface and said side segment lies along a maximal length thereof, on said side surface, the cutting edge further comprising an adjoining segment lying outside the bottom and side reference surfaces, said adjoining segment being defined by an intersection between corresponding rake and relief portions of said rake surface and relief surfaces, wherein, for any given normal reference plane oriented perpendicular to said adjoining segment and disposed between a lead end and trail end of the adjoining segment, the intersection between each of the rake portion and the relief portion with said normal reference plane defines a respective rake line and relief line and the angle between these lines is equal to or smaller than a corresponding angle taken along each of a plurality of other normal reference planes disposed between the given normal reference plane and the lead end.

2. A cutting piece comprising a front surface, a rear surface and at least one side surface extending therebetween having a first portion and a second portion angled to one another to form a corner, the cutting insert being formed with a main cutting edge defined at the intersection between said front surface and the corner of the side surface, said cutting insert further comprising an additional cutting element disposed on the corner of the side surface and protruding therefrom, said additional cutting element having an auxiliary cutting edge defining a first intersection point at its point of contact with said first portion, and a second intersection point at its point of contact with said second portion, neither of the intersection points coinciding with said main cutting edge, the auxiliary cutting edge extending along said corner between said first intersection point and said second intersection.

3. A cutting piece according to claim 2, wherein the auxiliary cutting edge is defined at the intersection between an auxiliary rake surface of the additional cutting element outwardly projecting from the side surface and transverse thereto and an auxiliary relief surface extending transverse to the rake surface and away from the main cutting edge.

4. A cutting piece according to claim 3, wherein, in a top view, perpendicular to the front surface and along the side surface, both the auxiliary cutting edge and the intersection line are clearly visible, including the first and the second intersection points.

5. A cutting piece according to claim 4, wherein the cutting edge of the additional cutting element is designed so that any point disposed along the auxiliary cutting edge protrudes from the side surface and is visible in the above top view.

6. A cutting piece according to claim 5, wherein the auxiliary cutting edge fully envelopes the main cutting edge at the corner, from one portion of the side surface to the other.

7. A cutting piece according to claim 6, wherein the first intersection point is located close to the front surface while the second intersection point is located closer to the bottom surface.

8. A cutting piece according to claim 7, wherein the auxiliary cutting edge includes a point, maximally distant from the side surface of the cutting insert and located between said first intersection point and said second intersection point.

9. A cutting piece according to claim 2, wherein the additional cutting element is configured for removing more material from the workpiece than the main cutting edge.

10. A cutting piece according to claim 2, wherein the main cutting edge and the auxiliary cutting edge are configured for being independently sharpened.

11. A cutting piece according to claim 2, wherein said additional cutting element extends beyond a cutting envelope defined by the main cutting edge, thereby providing additional spacing between the workpiece and the cutting.

12. A cutting piece according to claim 2, wherein the cutting insert is formed with several additional cutting elements along the same corner, wherein each of the cutting elements comprises a cutting edge providing a different cutting radii of the angle of the same corner.

13. A cutting tool holder configured for mounting thereon a cutting piece according to claim 2, said cutting tool holder having a front surface formed with an insert seat and a front surface extending transverse to the front surface, wherein said cutting tool holder comprises a dynamic chip breaker protruding from the front surface beneath the cutting insert, said dynamic chip breaker being loosely biased to protrude from the front surface and pivotally displaceable about an axis generally parallel to the front surface.

14. A cutting tool according to claim 13, wherein the dynamic chip breaker is provided with a biasing element configure to provide a loose biasing force which, on the one hand is sufficient for making the breaker come into contact with the workpiece, and on the other hand, is loose enough to allow the breaker to pivot about its axis under pressure exerted thereon by removed chips.

15. A cutting tool configured for removing material from a workpiece in order to form therein a corner of angle θ, said cutting tool comprising a first cutting portion comprising a first rake surface and a first relief surface and defining therebetween a first cutting edge defining a first cutting contour, and a second cutting portion, spaced from the first cutting portion, and comprising a second rake surface and a second relief surface and defining therebetween a second cutting edge defining a second cutting contour, said first cutting edge having a first lead end and a first trail end, said second cutting edge having second lead end and a second trail end, the first lead end being located in front of the lead end of the second lead end so as to come into contact with the workpiece during a cutting operation before the second lead end, wherein the first cutting contour and the second cutting contour together define said angle θ and cooperate to form said corner.

16. A cutting tool according to claim 15, wherein there exists and overlap between the cutting edge of the first cutting portion and the cutting edge of the second cutting portion so that the second lead end is disposed in front of the first trail end.

17. A cutting tool according to claim 15, wherein the second trail end comprises a chip breaker comprising a rake surface and a relief surface defining a cutting edge at an intersection thereof, said chip breaker being positioned to break chips removed from the workpiece by said cutting edges.

18. A cutting tool according to claim 15, wherein the cutting edge of the first cutting portion is configured for removing material from one of: a) a surface extending parallel to the central axis; and b) a surface extending perpendicular to the central axis and the cutting edge of the second cutting portion is configured for removing material from the other of these surfaces.

19. A cutting tool according to claim 18, wherein each cutting segment includes both the first and the second cutting portion, and wherein the cutting segments of the cutting tool alternate so that in one cutting segment the first cutting edge removes material from (a) and the second from (b) and in the subsequent cutting portion the first cutting edge removes material from (b) and the second from (a).

20. A cutting tool according to claim 15, wherein the cutting tool comprises a first cutting insert comprising the first cutting portion and a second cutting insert comprising the second cutting portion, the first and the second cutting insert being configured for mounting one on top of the other to cut the same corner.

21. A cutting tool according to claim 20, wherein the first cutting insert and the second cutting insert are configured for being mounted onto a cutting tool holder using a mutual connecting configuration.

22. A cutting too according to claim 20, wherein the first cutting insert and the second cutting insert, when so mounted, constitute an assembly having a shape which is not suited to be manufactured in a press-mold or a single-axis injection mold.

* * * * *